US006240010B1

(12) United States Patent
Mukai et al.

(10) Patent No.: US 6,240,010 B1
(45) Date of Patent: May 29, 2001

(54) SEMICONDUCTOR MEMORY CELL

(75) Inventors: Mikio Mukai, Kanagawa; Yutaka Hayashi, Ibaraki, both of (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/511,969

(22) Filed: Feb. 23, 2000

(30) Foreign Application Priority Data

Feb. 26, 1999 (JP) ... 11-050050
Mar. 31, 1999 (JP) ... 11-093307
Nov. 30, 1999 (JP) ... 11-340054

(51) Int. Cl.[7] ... G11C 11/36
(52) U.S. Cl. ... 365/175; 365/149
(58) Field of Search ... 365/175, 149, 365/150; 438/257, 258, 266

(56) References Cited

U.S. PATENT DOCUMENTS 5,684,737 * 11/1997 Wang et al. ... 365/175
5,694,355 * 12/1997 Skjaveland et al. ... 365/149
5,838,609 * 11/1998 Kuriyama ... 365/159
5,870,329 * 2/1999 Foss ... 365/149
6,075,720 * 6/2000 Leung et al. ... 365/149

* cited by examiner

*Primary Examiner*—Richard Elms
*Assistant Examiner*—Anh Phung
(74) *Attorney, Agent, or Firm*—Ronald P. Kananen; Rader, Fishman & Grauer

(57) ABSTRACT

Provided is a semiconductor memory cell which requires no refreshing operation for retaining information. The semiconductor memory cell comprises a first transistor $TR_1$ having a first conductivity type, a second transistor $TR_2$ having a second conductivity type and a MIS type diode DT for retaining information, wherein one source/drain region of the first transistor $TR_1$ corresponds to the channel forming region $CH_2$ of the second transistor $TR_2$, one source/drain region of the second transistor $TR_2$ corresponds to the channel forming region $CH_1$ of the first transistor $TR_1$, one end of the MIS type diode DT is formed of an extending portion of the channel forming region $CH_1$ of the first transistor $TR_1$, and the other end of the MIS type diode DT is constituted of an electrode which is formed of an electrically conductive material and connected to a third line having a predetermined potential.

226 Claims, 207 Drawing Sheets

[STEP-120]

[STEP-130]

[STEP-150]

[STEP-160]

[STEP-210] CONTINUED

[STEP-220]

[STEP-230]

[STEP-230] CONTINUED

[STEP−230] CONTINUED

[STEP−240]

[STEP-250]

[STEP-300]

[STEP-310]

[STEP-320]

[STEP-330]

[STEP-350]

[STEP-360]

SEMICONDUCTOR MEMORY CELL

BACKGROUND OF THE INVENTION AND RELATED ART STATEMENT

The present invention relates to a semiconductor memory cell which comprises at least a first transistor for readout, a second transistor for switching and an MIS (Metal-Insulator-Semiconductor) type diode for retaining information and which does not require a so-called refresh operation for retaining information. Otherwise, it relates to a semiconductor memory cell which comprises at least a first transistor for readout, a second transistor for switching, a junction type transistor for current control and an MIS type diode for retaining information and which does not require a so-called refresh operation for retaining information.

As a high-density semiconductor memory cell, conventionally, there is used a dynamic semiconductor memory cell that is called a single-transistor semiconductor memory cell including one transistor and one capacitor as shown in FIG. 210A. In the above semiconductor memory cell, an electric charge stored in the capacitor is required to be large enough to generate a sufficiently large voltage change on a bit line. However, with a decrease in the planar dimensions of the semiconductor memory cell, the capacitor formed in a parallel planar shape decreases in size, which causes the following new problem. When information stored as an electric charge in the capacitor of the semiconductor memory cell is read out, the read-out information is buried in a noise. Or, since the stray capacitance of the bit line in the semiconductor memory cell increases from generation to generation, only a small voltage change is generated on the bit line. As means for solving the above problems, there has been proposed a dynamic semiconductor memory cell having a trench capacitor cell structure as shown in FIG. 210B or a stacked capacitor cell structure. Since, however, the fabrication-related technology has its own limits on the depth of the trench (or groove) or the height of the stack, the capacitance of the capacitor is also limited. For this reason, dynamic semiconductor memory cells having the above structures are said to encounter the above limits unless expensive new materials are introduced for the capacitor as far as the dimensions thereof beyond the deep sub-micron rule (low sub-micron rule) are concerned.

In the planar dimensions smaller than those of the deep sub-micron rule (low sub-micron rule), the transistor constituting the semiconductor memory cell also has problems of deterioration of the drain breakdown voltage and a punchthrough from a drain region to a source region. There is therefore a large risk that current leakage takes place even if the voltage applied to the semiconductor memory cell is still within a predetermined range. When a semiconductor memory cell is made smaller in size, therefore, it is difficult to normally operate the semiconductor memory cell having a conventional transistor structure.

For overcoming the above limit problems of the capacitor, the present Applicant has proposed a semiconductor memory cell comprising two transistors or two transistors physically merged into one unit, as is disclosed in Japanese Patent Application No. 246264/1993 (JP-A-7-99251) corresponding to U.S. Pat. No. 5,428,238. The following explanation is made by referring to Japanese Patent Application No. 246264/1993 (JP-A-7-99251). The semiconductor memory cell shown in FIGS. 15(A) and 15(B) of the above Japanese Patent Application comprises a first semi-conductive region $SC_1$ of a first conductivity type formed in a surface region of a semiconductor substrate or formed on an insulating substrate, a first conductive region $SC_2$ formed in a surface region of the first semi-conductive region $SC_1$ so as to form a rectifier junction together with the first semi-conductive region $SC_1$, a second semi-conductive region $SC_3$ of a second conductivity type formed in a surface region of the first semi-conductive region $SC_1$ and spaced from the first conductive region $SC_2$, a second conductive region $SC_4$ formed in a surface region of the second semi-conductive region $SC_3$ so as to form a rectifier junction together with the second semi-conductive region $SC_3$, and a conductive gate G formed on a barrier layer so as to bridge the first semi-conductive region $SC_1$ and the second conductive region $SC_4$ and so as to bridge the first conductive region $SC_2$ and the second semi-conductive region $SC_3$, the conductive gate G being connected to a first memory-cell-selecting line, the first conductive region $SC_2$ being connected to a write-in information setting line, and the second conductive region $SC_4$ being connected to a second memory-cell-selecting line.

The first semi-conductive region $SC_1$ (functioning as a channel forming region $Ch_2$), the first conductive region $SC_2$ and the second semi-conductive region $SC_3$ (functioning as source/drain regions) and the conductive gate G constitute a switching transistor $TR_2$. On the other hand, the second semi-conductive region $SC_3$ (functioning as a channel forming region $Ch_1$), the first semi-conductive region $SC_1$ and the second conductive region $SC_4$ (functioning as source/drain regions) and the conductive gate G constitute an information storing transistor $TR_1$.

When information is written in the above semiconductor memory cell, the switching transistor $TR_2$ is brought into an on-state. As a result, the information is stored in the channel forming region $Ch_1$ of the information storing transistor $TR_1$ as a potential or as an electric charge. When the information is read out, the threshold voltage of the information storing transistor $TR_1$ seen from the conductive gate G varies, depending upon the potential or the electric charge stored in the channel forming region $Ch_1$ of the information storing transistor $TR_1$. Therefore, when the information is read out, the storage state of the information storing transistor $TR_1$ can be judged from the magnitude of a channel current (including a zero magnitude) by applying a properly selected potential to the conductive gate G. The information is read out by detecting the operation state of the information storing transistor $TR_1$.

That is, when information is read out, the information storing transistor $TR_1$ is brought into an on-state or an off-state, depending upon the information stored therein. Since the second conductive region $SC_4$ is connected to the second line, a current which is large or small depending upon the stored information ("0" or "1") flows in the information storing transistor $TR_1$. In this way, the information stored in the semiconductor memory cell can be read out through the information storing transistor $TR_1$.

Further, the present Applicant in Japanese Patent Application No. 251646/1997 (JP-A-10-154757) has proposed a semiconductor memory cell comprising three transistors such as a transistor $TR_1$ for readout, a transistor $TR_2$ for switching and a junction type transistor $TR_3$ for current control.

In the above semiconductor memory cell, information is stored in the second semi-conductive region $SC_3$. However, the second semiconductor-conductive region $SC_3$ is a floating region, so that the information disappears due to a leak current after a certain period of time. For retaining the information, therefore, there is required an refresh operation every constant period of time.

OBJECT AND SUMMARY OF THE INVENTION

It is therefore a first object of the present invention to provide a memory cell which requires no refresh operation for retaining information, permits reliable writing and read-out of information, has transistor operation stabilized, has a large window (current difference) for reading out information in the memory cell, requires no large-capacitance capacitor unlike a conventional DRAM and permits a decrease in dimensions, or a semiconductor memory cell for a logic, and further to provide a semiconductor memory cell comprising at least two transistors and a diode for retaining information or comprising a memory cell in which these are merged into one unit.

It is a second object of the present invention to provide a memory cell which requires no refresh operation for retaining information, permits reliable writing and readout of information, has transistor operation stabilized, has a large window (current difference) for reading out information in the memory cell, requires no large-capacitance capacitor unlike a conventional DRAM and permits a decrease in dimensions, or a semiconductor memory cell for a logic, and further to provide a semiconductor memory cell comprising at least two transistors, a junction type transistor for current control and a diode for retaining information or a semiconductor memory cell in which these are merged into one unit.

According to a first aspect of the present invention for achieving the above first object, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, wherein:

one source/drain region of the first transistor corresponds to the channel forming region of the second transistor, one source/drain region of the second transistor corresponds to the channel forming region of the first transistor, and one end of the MIS type diode is formed of an extending portion of the channel forming region of the first transistor, the other end of the MIS type diode is formed of an electrode composed of an electrically conductive material, and the electrode is connected to a line having a predetermined potential.

In the present specification, that X “corresponds to” Y refers to a constitution in which X and Y are shared, or in which X has a common region with Y, or in which X and Y are connected to each other. For example, the above expression “one source/drain region of the first transistor corresponds to the channel forming region of the second transistor” refers to a constitution in which one source/drain region of the first transistor and the channel forming region of the second transistor are shared, or in which one source/drain region of the first transistor has a common region with the channel forming region of the second transistor, or a constitution in which one source/drain region of the first transistor is connected to the channel forming region of the second transistor. The term “corresponds to” is used in this sense hereinafter in some cases.

The semi-conductor memory cell according to the first aspect of the present invention preferably has the following constitution. A material is interposed between one end and the other end of the MIS diode, in which material the tunnel transition of carriers is caused depending upon a potential difference between the potential in the channel forming region of the first transistor and the potential in the other end of the MIS type diode. And, binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor. (i) When the potential in the channel forming region of the first transistor is the first potential, the tunnel transition of carriers is caused from the other end to one end of the MIS type diode. As a result, carrier multiplication takes place, holes or electrons are stored in the channel forming region of the first transistor depending upon the conductivity type of one end of the MIS type diode, and the potential in the channel forming region of the first transistor is held nearly at the first potential. (ii) When the potential in the channel forming region of the first transistor is the second potential, carriers having the polarity opposite to that of the above carriers transit from one end to the other end of the MIS type diode. As a result, the potential in the channel forming region of the first transistor is held at the second potential.

The semiconductor memory cell according to the first aspect of the present invention may have the following constitution. The gate of the first transistor and the gate of the second transistor are connected to a word line, the other source/drain region of the first transistor is connected to a bit line, the other source/drain region of the second transistor is connected to a write-in information setting line, and the other end of the MIS type diode is connected to the line having a predetermined potential through a high-resistance element. Otherwise, there may be employed a constitution in which the gate of the first transistor and the gate of the second transistor are connected to a word line, one source/drain region of the first transistor is connected to a bit line, the other source/drain region of the second transistor is connected to a write-in information setting line, and the other end of the MIS type diode is connected to the line having a predetermined potential through a high-resistance element. It is preferred to provide the above high-resistance element under bias conditions where there is a risk of excess current flowing in the MIS type diode. Further, there may be also employed a constitution in which a diode is further provided, the gate of the first transistor and the gate of the second transistor are connected to a word line, one source/drain region of the first transistor is connected to a write-in information setting line through the diode, the other source/drain region of the first transistor is connected to a bit line, the other source/drain region of the second transistor is connected to the write-in information setting line, and the other end of the MIS type diode is connected to the line having a predetermined potential through a high-resistance element. Moreover, there may be also employed a constitution in which a diode is further provided, a write-in information setting line functions as a bit line, the gate of the first transistor and the gate of the second transistor are connected to a word line, one source/drain region of the first transistor is connected to the write-in information setting line through the diode, the other source/drain region of the second transistor is connected to the write-in information setting line, and the other end of the MIS type diode is connected to the line having a predetermined potential through a high-resistance element. The deterioration of characteristics of a wide gap thin film to be described later can be prevented by connecting the other end of the MIS type diode to the line (a third line to be described latter) through the high-resistance element.

In the semiconductor memory cell according to the first aspect of the present invention, the gate of the first transistor and the gate of the second transistor may be formed separately from each other. For decreasing the size of the semiconductor memory cell, however, it is preferred to employ a constitution in which the first transistor and the second transistor have a common gate.

Preferably, a wide gap thin film is formed between the extending portion of channel forming region of the first transistor constituting the MIS type diode and the electrode. That is, the wide gap thin film is preferably composed of a material in which the tunnel transition of carriers is caused depending upon a potential difference between the potential in the channel forming region of the first transistor and the potential in the other end of the MIS type diode.

According to a second aspect of the present invention for achieving the above first object, there is provided a semiconductor memory cell comprising, as a drawing of its principle is shown in FIG. 1, (1) a first transistor for readout, having a second conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, the semiconductor memory cell having;

(a) a semi-conductive first region having a first conductivity type, (b) a semi-conductive second region being in contact with the first region and having a second conductivity type, (c) a third region which is formed in a surface region of the first region to be spaced from the second region and is in contact with the first region so as to form a rectifier junction together with the first region, and (d) a fourth region which is formed in a surface region of the second region to be spaced from the first region and is in contact with the second region so as to form a rectifier junction together with the second region, wherein:

(A-1) one source/drain region of the first transistor is formed of a surface region of the first region which surface region is interposed between the second region and the third region, (A-2) the other source/drain region of the first transistor is formed of the fourth region, (A-3) the channel forming region of the first transistor is formed of a surface region of the second region which surface region is interposed between the surface region of the first region and the fourth region, (A-4) the gate of the first transistor is formed on the channel forming region of the first transistor through an insulation layer, (B-1) one source/drain region of the second transistor is formed of the surface region of the second region which surface region constitutes the channel forming region of the first transistor, (B-2) the other source/drain region of the second transistor is formed of the third region, (B-3) the channel forming-region of the second transistor is formed of the surface region of the first region which surface region constitutes one source/drain region of the first transistor, (B-4) the gate of the second transistor is formed on the channel forming region of the second transistor through an insulation layer, (C-1) one end of the MIS type diode is formed of part of the second region, (C-2) an electrode constituting the other end of the MIS type diode is formed to be opposed to said part of the second region constituting one end of the MIS type diode, through a wide gap thin film, (D) the gate of the first transistor and the gate of the second transistor are connected to a first line for memory cell selection, (E) the third region is connected to a write-in information setting line, (F) the fourth region is connected to a second line, (G) the electrode constituting the other end of the MIS type diode is connected to a third line having a predetermined potential, and (H) the first region is connected to a fourth line.

In drawings, the write-in information setting line is indicated by "WISL".

In the semiconductor memory cell according to the second aspect of the present invention, there may be employed a constitution in which the second line is used as a memory-cell-selecting line (so-called bit line) and a second predetermined potential is applied to the fourth line. Otherwise, there may be employed a constitution in which a second predetermined potential is applied to the second line and the fourth line is used as a memory-cell-selecting line (so-called bit line).

According to a third aspect of the present invention for achieving the above first object, there is provided a semiconductor memory cell comprising, as a drawing of its principle is shown in FIG. 4, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, the semiconductor memory cell having;

(a) a semi-conductive first region having a first conductivity type, (b) a semi-conductive second region being in contact with the first region and having a second conductivity type, (c) a third region which is formed in a surface region of the first region to be spaced from the second region and is in contact with the first region so as to form a rectifier junction together with the first region, (d) a semi-conductive fourth region which is formed in a surface region of the second region to be spaced from the first region and has the first conductivity type, and (e) a semi-conductive MIS-type-diode constituting region which is formed in a surface region of the fourth region and has the second conductivity type, wherein:

(A-1) one source/drain region of the first transistor is formed of a surface region of the first region which surface region is interposed between the second region and the third region, (A-2) the other source/drain region of the first transistor is formed of the fourth region, (A-3) the channel forming region of the first transistor is formed of a surface region of the second region which surface region is interposed between the surface region of the first region and the fourth region, (A-4) the gate of the first transistor is formed on the channel forming region of the first transistor through an insulation layer, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (B-4) the gate of the second transistor is formed on the channel forming region of the second transistor through an insulation layer, (C-1) one end of the MIS type diode is formed of the MIS-type-diode-constituting region, (C-2) an electrode constituting the other end of the MIS type diode is formed to be opposed to the MIS-type-diode-constituting region constituting one end of the MIS type diode, through a wide gap thin film, (D) the gate of the first transistor and the gate of the second transistor are connected to a first line for memory cell selection, (E) the second region is connected to the MIS-type-diode-constituting region, (F) the third region is connected to a write-in information setting line, (G) the fourth region is connected to a second line, (H) the electrode constituting the other end of the MIS type diode is connected to a third line having a predetermined potential, and (I) the first region is connected to a fourth line.

In the semiconductor memory cell according to the third aspect of the present invention, there may be employed a constitution in which the second line is used as a memory-cell-selecting line (so-called bit line) and a second predetermined potential is applied to the fourth line. Otherwise, there may be employed a constitution in which a second predetermined potential is applied to the second line and the fourth line is used as a memory-cell-selecting line (so-called bit line).

In the semiconductor memory cell according to the second or third aspect of the present invention, preferably, the electrode constituting the other end of the MIS type diode is connected to the third line through a high-resistance element for preventing the deterioration of characteristics of the wide gap thin film. Preferably, the electrode constituting the other end of the MIS type diode and the high-resistance element are integrally formed and are composed of a silicon thin layer (for example, polysilicon thin layer) in view of the simplification of a wiring structure. Further, preferably, the silicon thin layer contains an impurity having the first conductivity type.

In the semiconductor memory cell according to the second or third aspect of the present invention, the gate of the first transistor and the gate of the second transistor may be provided separately from each other. For decreasing the semiconductor memory cell in size, however, it is preferred to employ a constitution in which the gate of the first transistor and the gate of the second transistor are formed so as to bridge the first region and the fourth region and so as to bridge the second region and third region through the insulation layer, and are shared by the first transistor and the second transistor.

In the semiconductor memory cell according to the second or third aspect of the present invention, it is preferred to employ a constitution in which the first region and the third region constitute a diode, and the first region is connected to the write-in information setting line through the third region in place of being connected to the fourth line, as a drawing of its principle is shown in FIG. 2 or 5, in view of the simplification of a wiring structure. When it is required to avoid possibility where carriers implanted from the diode may latch up the semiconductor memory cell, it is preferred to employ a constitution in which a majority carrier-diode (which means a Schottky diode or a hetero-junction diode in which majority carriers flow, and used in this sense hereinafter) comprising the diode-constituting region provided in a surface region of the first region and the first region is further provided, and the first region is connected to the write-in information setting line through the diode-constituting region in place of being connected to the fourth line, as a drawing of its principle is shown in FIG. 3 or 6. In this constitution, there may be employed a structure in which the diode-constituting region has a common region with part of the write-in information setting line (in other words, a structure in which the diode-constituting region and part of the write-in information setting line are formed as a common region).

In the semiconductor memory cell according to the second or third aspect of the present invention, preferably, the wide gap thin film is composed of a material in which the tunnel transition of carriers is caused depending upon a potential difference between the potential in the channel forming region of the first transistor and the potential in the other end of the MIS type diode. And, it is preferred to employ the following constitution. Binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor. (i) When the potential in the channel forming region of the first transistor is the first potential, the tunnel transition of carriers is caused from the other end to one end of the MIS type diode. As a result, carrier multiplication takes place, holes or electrons are stored in the channel forming region of the first transistor depending upon the conductivity type of one end of the MIS type diode, and the potential in the channel forming region of the first transistor is held nearly at the first potential. (ii) When the potential in the channel forming region of the first transistor is the second potential, carriers having the polarity opposite to that of the above carriers transit from one end to the other end of the MIS type diode. As a result, the potential in the channel forming region of the first transistor is held at the second potential.

In a preferred embodiment of the semiconductor memory cell according to the second or third aspect of the present invention, it is preferred to form a first high-concentration-impurity-containing layer having the first conductivity type below the second region, since the potential or charge to be stored in the channel forming region of the first transistor can be increased.

In the semiconductor memory cell according to the second or third aspect of the present invention, there may be employed a constitution in which the second region is formed in a surface region of the first region, or the first region is formed in a surface region of the second region. In the former case, it is preferred to form a second high-concentration-impurity-containing layer having the first conductivity type below the first region, since the wiring structure can be simplified. That is, the connection between the first region and the fourth line can be simplified by using the second high-concentration-impurity-containing layer having the first conductivity type as the fourth line.

In the semiconductor memory cell according to the second or third aspect of the present invention, the third region may be composed of a silicide, a metal or a metal compound, while the third region is preferably composed of semiconductor. In the memory cell according to the second aspect of the present invention, the fourth region may be composed of a silicide, a metal or a metal compound, while the fourth region is preferably composed of semiconductor. Further, in the memory cell according to the second or third aspect of the present invention, when a diode-constituting region is provided for forming the majority carrier-diode, the diode-constituting region may be composed of a semiconductor, while the diode-constituting region is preferably composed of a silicide, a metal or a metal compound, and in this case, the third region is preferably composed of semiconductor. The structure in which the third region is connected to the write-in information setting line includes a structure in which the third region has a common region with part of the write-in information setting line (in other words, a structure in which the diode-constituting region and part of the write-in information setting line are formed as a common region). Further, in the memory cell according to the second aspect of the present invention, the structure in which the fourth region is connected to the second line includes a structure in which the fourth region has a common region with part of the second line (in other words, a structure in which the fourth region and part of the second line are formed as a common region).

According to a fourth aspect of the present invention for achieving the above first object, there is provided a semiconductor memory cell having a semiconductor layer having two main surfaces opposed to each other, the main surfaces being a first main surface and a second main surface, the semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) the gate of the first transistor formed on a first insulation layer formed on the first main surface so as to bridge the first region and the fourth region, and (f) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) one end of the MIS type diode is formed of part of the second region, (C-2) an electrode constituting the other end of the MIS type diode is formed to be opposed to said part of the second region constituting one end of the MIS type diode, through a wide gap thin film, (D) the gate of the first transistor and the gate of the second transistor are connected to a first line for memory cell selection, (E) the third region is connected to a write-in information setting line, (F) the fourth region is connected to a second line, (G) the electrode constituting the other end of the MIS type diode is connected to a third line having a predetermined potential, and (H) the first region is connected to a fourth line.

In the semiconductor memory cell according to the fourth aspect of the present invention, there may be employed a constitution in which the second line is used as a memory-cell-selecting line (so-called bit line) and a second predetermined potential is applied to the fourth line. Otherwise, there may be also employed another constitution in which a second predetermined potential is applied to the second line and the fourth line is used as a memory-cell-selecting line (so-called bit line).

In the semiconductor memory cell according to the fourth aspect of the present invention, there may be employed a constitution in which the first region and the third region constitute a diode, and the first region is connected to the write-in information setting line through the third region in place of being connected to the fourth line, whereby the wiring structure can be simplified. In this case, there may be employed a constitution in which the second line is used as a memory-cell-selecting line (so-called bit line) or the write-in information setting line is co-used as a bit line and a second predetermined potential is applied to the second line.

In the semiconductor memory cell according to the forth aspect of the present invention or a memory cell according to any one of the 25th to 29th aspect of the present invention to be described later, when a diode is provided, a wiring structure can be simplified. Further, in the memory cell according to the forth aspect or any one of the 25th to 29th aspect of the present invention, it is not necessary that the gate of the first transistor formed on the first main surface side and the gate of the second transistor formed on the second main surface side should be connected every memory cell. The gates of the first transistors of mutually adjacent semiconductor memory cells in the range of a predetermined number or a predetermined arrangement may be connected to each other, the gates of the second transistors of mutually adjacent semiconductor memory cells in the range of a predetermined number or a predetermined arrangement may be connected to each other, and these are connected to the first line for memory cell selection.

In the semiconductor memory cell according to the fourth aspect of the present invention, when the third region or the fourth region is formed as a conductive region, these regions may be composed of a silicide, a metal or a metal compound. When these regions are to be composed of a silicide, a metal or a metal compound, and when there is to be employed a constitution in which these regions are connected to the lines, these regions may be composed of the same material as the material of the lines (for example, a material such as titanium silicide or TiN for use as a barrier layer or a glue layer). That is, these regions and part of the lines may be formed as a structurally common region.

According to a fifth aspect of the present invention for achieving the above second object, there is provided a semiconductor memory cell comprising, as a drawing of its principle is shown in FIGS. 44, 45A, 45B, 46, 47A, 47B, 48, 49, 50A, 50B, 61, 62A, 62B, 65, 66A, 66B, 67, 68A or 68B, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, wherein:

one source/drain region of the first transistor corresponds to the channel forming region of the second transistor and corresponds to one source/drain region of the junction-field-effect transistor, one source/drain region of the second transistor corresponds to the channel forming region of the first transistor and corresponds to one gate region of the junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

In the semiconductor memory cell according to the fifth aspect of the present invention, there may be employed a constitution in which the gate of the first transistor and the gate of the second transistor are connected to a first line for memory cell selection (for example, word line), the other source/drain region of the first transistor is connected to a second line, the other end of the MIS type diode is connected to a third line corresponding to the above line having a predetermined potential through a high-resistance element, the other gate region of the junction-field-effect transistor is connected to a fourth line, one source/drain region of the first transistor is connected to a fifth line through the junction-field-effect transistor, and the other source/drain region of the second transistor is connected to a write-in information setting line. Under bias conditions where there is a risk of excessive current flowing in the MIS type diode, it is preferred to provide the above high-resistance element. Further, when the other end of the MIS type diode is connected to the above third line having a predetermined potential through the high-resistance element, the property degradation of a wide gap thin film to be described later can be prevented. It is preferred to employ a constitution in which the second line is used as a bit line and a second predetermined potential is applied to the fifth line or a constitution in which the fifth line is used as a bit line and a second predetermined potential is applied to the second line.

There may be also employed another constitution in which one source/drain region of the first transistor is connected to the write-in information setting line through the junction-field-effect transistor and a diode in place of being connected to the fifth line through the junction-field-effect transistor. In this case, it is preferred to employ a constitution in which the second line is used as a bit line or a constitution in which the write-in information setting line is co-used as a bit line and a second predetermined potential is applied to the second line. In explanations to be made hereinafter, when a diode, a pn junction diode to be described later or a majority carrier diode is provided, it is preferred to employ a constitution in which the second line is used as a bit line or a constitution in which the write-in information setting line is co-used as a bit line and a second predetermined potential is applied to the second line.

There may be also employed another constitution in which the other gate region of the junction-field-effect transistor is connected to the write-in information setting line in place of being connected to the fourth line. In this case, there may be employed a constitution in which one source/drain region of the first transistor is connected to the write-in information setting line through the junction-field-effect transistor and a diode in place of being connected to the fifth line through the junction-field-effect transistor.

There may be employed still another constitution in which one source/drain region of the first transistor is connected to the fourth line through the junction-field-effect transistor and a diode in place of being connected to the fifth line through the junction-field-effect transistor.

There may be also employed yet another constitution in which the other gate region of the junction-field-effect transistor is connected to one gate region of the junction-field-effect transistor in place of being connected to the fourth line. In this case, one end of the MIS type diode and the other gate region of the junction-field-effect transistor may be formed as a common region. In these cases, there may be employed a constitution in which one source/drain region of the first transistor is connected to the write-in information setting line through the junction-field-effect transistor and a diode in place of being connected to the fifth line through the junction-field-effect transistor.

According to a sixth aspect of the present invention for achieving the above second object, there is provided a semiconductor memory cell comprising, as a drawing of its principle is shown in FIGS. 92, 93A, 93B, 94, 95A, 95B, 96, 97A, 97B, 104, 105A, 105B, 108, 109A, 109B, 110, 111A, 111B, 112, 113A, 113B, 126, 127A or 127B, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, wherein:

one source/drain region of the first transistor corresponds to the channel forming region of the second transistor, the other source/drain region of the first transistor corresponds to one source/drain region of the junction-field-effect transistor, one source/drain region of the second transistor corresponds to the channel forming region of the first transistor and corresponds to one gate region of the junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

In the semiconductor memory cell according to the sixth aspect of the present invention, there may be employed a constitution in which the gate of the first transistor and the gate of the second transistor are connected to a first line for memory cell selection (for example, word line), the other source/drain region of the first transistor is connected to a second line through the junction-field-effect transistor, the other end of the MIS type diode is connected to a third line corresponding to the above line having a predetermined potential through a high-resistance element, the other gate region of the junction-field-effect transistor is connected to a fourth line, one source/drain region of the first transistor is connected to a fifth line, and the other source/drain region of the second transistor is connected to a write-in information setting line. It is preferred to employ a constitution in which the second line is used as a bit line and a second predetermined potential is applied to the fifth line, or a constitution in which the fifth line is used as a bit line and a second predetermined potential is applied to the second line.

In the above case, there may be also employed a constitution in which one source/drain region of the first transistor is connected to the write-in information setting line through a diode in place of being connected to the fifth line.

There may be employed another constitution in which the other gate region of the junction-field-effect transistor is connected to the write-in information setting line in place of being connected to the fourth line. In this case, there may be employed a constitution in which one source/drain region of the first transistor is connected to the write-in information setting line through a diode in place of being connected to the fifth line.

There may be also employed a constitution in which the other gate region of the junction-field-effect transistor is connected to one gate region of the junction-field-effect transistor in place of being connected to the fourth line. In this case, one end of the MIS type diode and the other gate region of the junction-field-effect transistor can be formed as a common region. In these cases, there may be employed a constitution in which one source/drain region of the first transistor is connected to the write-in information setting line through a diode in place of being connected to the fifth line.

According to a seventh aspect of the present invention for achieving the above second object, there is provided a semiconductor memory cell comprising, as a drawing of its principle is shown in FIGS. 132, 133A or 133B, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, wherein:

one source/drain region of the first transistor corresponds to the channel forming region of the second transistor, the other source/drain region of the first transistor corresponds to one source/drain region of the junction-field-effect transistor, one source/drain region of the second transistor corresponds to the channel forming region of the first transistor, corresponds to one gate region of the junction-field-effect transistor and corresponds to one source/drain region of the third transistor, the other source/drain region of the third transistor corresponds to the other gate region of the junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

In the semiconductor memory cell according to the seventh aspect of the present invention, there may be employed a constitution in which the gate of the first transistor, the gate of the second transistor and the gate of the third transistor are connected to a first line for memory cell selection (for example, word line), the other source/drain region of the first transistor is connected to a second line through the junction-field-effect transistor, the other end of the MIS type diode is connected to a third line corresponding to the above line having a predetermined potential through a high-resistance element, one source/drain region of the first transistor is connected to a fourth line, and the other source/drain region of the second transistor is connected to a write-in information setting line. It is preferred to employ a constitution in which the second line is used as a bit line and a second predetermined potential is applied to the fourth line, or a constitution in which the fourth line is used as a bit line and a second predetermined potential is applied to the second line.

In the above case, there may be employed a constitution in which one source/drain region of the first transistor is connected to the write-in information setting line through a diode in place of being connected to the fourth line.

According to an eighth aspect of the present invention for achieving the above second object, there is provided a semiconductor memory cell comprising, as a drawing of its principle is shown in FIGS. 138, 139A or 139B, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, wherein:

one source/drain region of the first transistor corresponds to the channel forming region of the second transistor, the other source/drain region of the first transistor corresponds to one source/drain region of the junction-field-effect transistor, one source/drain region of the second transistor corresponds to the channel forming region of the first transistor, corresponds to one gate region of the junction-field-effect transistor and corresponds to one source/drain region of the third transistor, the other source/drain region of the third transistor corresponds to the other gate region of the junction-field-effect transistor, and one end of the MIS type diode corresponds to the other source/drain region of the third transistor, the other end of the MIS type diode is formed of an electrode composed of a conductive material, and the electrode is connected to a line having a predetermined potential.

In the semiconductor memory cell according to the eighth aspect of the present invention, there may be employed a constitution in which the gate of the first transistor, the gate of the second transistor and the gate of the third transistor are connected to a first line for memory cell selection (for example, word line), the other source/drain region of the first transistor is connected to a second line through the junction-field-effect transistor, the other end of the MIS type diode is connected to a third line corresponding to the above line having a predetermined potential through a high-resistance element, one source/drain region of the first transistor is connected to a fourth line, and the other source/drain region of the second transistor is connected to a write-in information setting line. It is preferred to employ a constitution in which the second line is used as a bit line and a second predetermined potential is applied to the fourth line or a constitution in which the fourth line is used as a bit line and a second predetermined potential is applied to the second line.

In the above case, there may be employed a constitution in which one source/drain region of the first transistor is connected to the write-in information setting line through a diode in place of being connected to the fourth line.

According to a ninth aspect of the present invention for achieving the above second object, there is provided a semiconductor memory cell comprising, as a drawing of its principle is shown in FIGS. 144, 145A, 145B, 146, 147A, 147B, 156, 157A or 157B, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, wherein:

one source/drain region of the first transistor corresponds to the channel forming region of the second transistor and corresponds to one source/drain region of the first junction-field-effect transistor, the other source/drain region of the first transistor corresponds to one source/drain region of the second junction-field-effect transistor, one source/drain region of the second transistor corresponds to the channel forming region of the first transistor, corresponds to one gate region of the first junction-field-effect transistor and corresponds to one gate region of the second junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

In the semiconductor memory cell according to the ninth aspect of the present invention, there may be employed a constitution in which the gate of the first transistor and the gate of the second transistor are connected to a first line for memory cell selection (for example, word line), the other source/drain region of the first transistor is connected to a second line through the second junction-field-effect transistor, the other end of the MIS type diode is connected to a third line corresponding to the above line having a predetermined potential through a high-resistance element, the other gate region of the second junction-field-effect transistor is connected to a fourth line, one source/drain region of the first transistor is connected to a fifth line through the first junction-field-effect transistor, the other gate region of the first junction-field-effect transistor is connected to a write-in information setting line, and the other source/drain region of the second transistor is connected to the write-in information setting line. There may be employed another constitution in which the other gate region of the second junction-field-effect transistor is connected to one gate region of the second junction-field-effect transistor in place of being connected to the fourth line. In this case, one end of the MIS type diode and the other gate region of the second junction-field-effect transistor can be formed as a common region. In these cases, it is preferred to employ a constitution in which the second line is used as a bit line and a second predetermined potential is applied to the fifth line or a constitution in which the fifth line is used as a bit line and a second predetermined potential is applied to the second line. In these cases, further, there may be employed a constitution in which one source/drain region of the first transistor is connected to the write-in information setting line through the first junction-field-effect transistor and a diode in place of being connected to the fifth line through the first junction-field-effect transistor.

According to a tenth aspect of the present invention for achieving the above second object, there is provided a semiconductor memory cell comprising, as a drawing of its principle is shown in FIGS. 162 to 164, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, wherein:

one source/drain region of the first transistor corresponds to the channel forming region of the second transistor and corresponds to one source/drain region of the first junction-field-effect transistor, the other source/drain region of the first transistor corresponds to one source/drain region of the second junction-field-effect transistor, one source/drain region of the second transistor corresponds to the channel forming region of the first transistor, corresponds to one gate region of the first junction-field-effect transistor, corresponds to one gate region of the second junction-field-effect transistor and corresponds to one source/drain region of the third transistor, the other source/drain region of the third transistor corresponds to the other gate region of the second junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

In the semiconductor memory cell according to the tenth aspect of the present invention, there may be employed a constitution in which the gate of the first transistor, the gate of the second transistor and the gate of the third transistor are connected to a first line for memory cell selection (for example, word line), the other source/drain region of the first transistor is connected to a second line through the second junction-field-effect transistor, the other end of the MIS type diode is connected to a third line corresponding to the above line having a predetermined potential through a high-resistance element, one source/drain region of the first transistor is connected to a fourth line through the first junction-field-effect transistor, the other source/drain region of the second transistor is connected to a write-in information setting line, and the other gate region of the first junction-field-effect transistor is connected to the write-in information setting line. It is preferred to employ a constitution in which the second line is used as a bit line and a second predetermined potential is applied to the fourth line or a constitution in which the fourth line is used as a bit line and a second predetermined potential is applied to the second line.

In the above case, there may be also employed a constitution in which one source/drain region of the first transistor is connected to the write-in information setting line through the first junction-field-effect transistor and a diode in place of being connected to the fourth line through the first junction-field-effect transistor.

According to an eleventh aspect of the present invention for achieving the above second object, there is provided a semiconductor memory cell comprising, as a drawing of its principle is shown in FIGS. 169 to 171, (1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, wherein:

one source/drain region of the first transistor corresponds to the channel forming region of the second transistor and corresponds to one source/drain region of the first junction-field-effect transistor, the other source/drain region of the first transistor corresponds to one source/drain region of the second junction-field-effect transistor, one source/drain region of the second transistor corresponds to channel forming region of the first transistor, corresponds to one gate region of the first junction-field-effect transistor, corresponds to one gate region of the second junction-field-effect transistor and corresponds to one source/drain region of the third transistor, the other source/drain region of the third transistor corresponds to the other gate region of the second junction-field-effect transistor, and one end of the MIS type diode corresponds to the other source/drain region of the third transistor, the other end of the MIS type diode is formed of an electrode composed of a conductive material, and the electrode is connected to a line having a predetermined potential.

In the semiconductor memory cell according to the eleventh aspect of the present invention, there may be employed a constitution in which the gate of the first transistor, the gate of the second transistor and the gate of third transistor are connected to a first line for memory cell selection (for example, word line), the other source/drain region of the first transistor is connected to a second line through the second junction-field-effect transistor, the other end of the MIS type diode is connected to a third line corresponding to the above line having a predetermined potential through a high-resistance element, one source/drain region of the first transistor is connected to a fourth line through the first junction-field-effect transistor, the other source/drain region of the second transistor is connected to a write-in information setting line, and the other gate region of the first junction-field-effect transistor is connected to the write-in information setting line. It is preferred to employ a constitution in which the second line is used as a bit line and a second predetermined potential is applied to the fourth line or a constitution in which the fourth line is used as a bit line and a second predetermined potential is applied to the second line.

In the above case, there may be also employed a constitution in which one source/drain region of the first transistor is connected to the write-in information setting line through the first junction-field-effect transistor and a diode in place of being connected to the fourth line through the first junction-field-effect transistor.

In the semiconductor memory cell according to any one of the fifth to seventh aspects and ninth and tenth aspects of the present invention, there is a material interposed between one end and the other end of the MIS type diode, in which material the tunnel transition of carriers is caused depending upon a potential difference between the potential in the channel forming region of the first transistor and the potential in the other end of the MIS type diode. That is, the MIS type diode comprises the above material, the extending portion of the channel forming region of the first transistor and the electrode. And, it is preferred to employ the following constitution. Binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor. (i) When the potential in the channel forming region of the first transistor is the first potential, the tunnel transition of carriers is caused from the other end to one end of the MIS type diode. As a result, carrier multiplication takes place, holes or electrons are stored in the above extending portion of the channel forming region of the first transistor depending upon the conductivity type of one end of the MIS type diode, and the potential in the channel forming region of the first transistor is held nearly at the first potential. (ii) When the potential in the channel forming region of the first transistor is the second potential, carriers having the polarity opposite to that of the above carriers transit from one end to the other end of the MIS type diode. As a result, the potential in the channel forming region of the first transistor is held at the second potential.

In the semiconductor memory cell according to any one of the eighth aspect and eleventh aspects of the present invention, there is a material interposed between one end and the other end of the MIS type diode, in which material the tunnel transition of carriers is caused depending upon a potential difference between the potential in the other source/drain region of the third transistor and the potential in the other end of the MIS type diode. That is, the MIS type diode comprises the above material, the other source/drain region of the third transistor and the electrode. And, it is preferred to employ the following constitution. Binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor. (i) When the potential in the channel forming region of the first transistor is the first potential, the tunnel transition of carriers is caused from the other end to one end of the MIS type diode. As a result, carrier multiplication takes place, holes or electrons are stored in the other source/drain region of the third transistor depending upon the conductivity type of one end of the MIS type diode, and the potential in the channel forming region of the first transistor is held nearly at the first potential. (ii) When the potential in the channel forming region of the first transistor is the second potential, carriers having the polarity opposite to that of the above carriers transit from one end to the other end of the MIS type diode. As a result, the potential in the channel forming region of the first transistor is held at the second potential.

In the semiconductor memory cell according to any one of the fifth to eleventh aspects of the present invention, preferably, a wide gap thin film is formed between the extending portion of the channel forming region of the first transistor or the other source/drain region of the third transistor constituting the MIS type diode and the electrode. That is, preferably, the wide gap thin film is composed of a material in which the tunnel transition of carriers is caused depending upon a potential difference between the potential in the channel forming region of the first transistor or the other source/drain region of the third transistor and the potential in the other end of the MIS type diode.

In the semiconductor memory cell according to the fifth aspect, sixth aspect or ninth aspect of the present invention, the gate of the first transistor and the gate of the second transistor may be formed separately from each other. For decreasing the size of the semiconductor memory cell, however, it is preferred to employ a constitution in which the first transistor and the second transistor have a common gate. In the semiconductor memory cell according to the seventh, eighth, tenth or eleventh aspect of the present invention, the gate of the first transistor, the gate of the second transistor and the gate of the third transistor may be formed separately from each other. For decreasing the size of the semiconductor memory cell, however, it is preferred to employ a constitution in which the first transistor, the second transistor and the third transistor have a common gate.

According to a twelfth aspect of the present invention for achieving the above second object, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a fourth region which is formed in a surface region of the first region to be spaced from the second region and is in contact with the first region so as to form a rectifier junction together with the first region, and (e) a fifth region which is formed in a surface region of the second region to be spaced from the third region and is in contact with the second region so as to form a rectifier junction together with the second region, wherein:

(A-1) one source/drain region of the first transistor is formed of a portion of a surface region of the second region, (A-2) the other source/drain region of the first transistor is formed of the fourth region, (A-3) the channel forming region of the first transistor is formed of a portion of a surface region of the first region which portion is interposed between said portion of the surface region of the second region and the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the second region which part is interposed between the fifth region and said part of the first region, (C-3) one source/drain region of the junction-field-effect transistor is formed of said portion of the surface region of the second region which portion extends from one end of the channel region of the junction-field-effect transistor and constitutes one source/drain region of the first transistor, (C-4) the other source/drain region of the junction-field-effect transistor is formed of a portion of the second region which portion extends from the other end of the channel region of the junction-field-effect transistor, (D-1) one end of the MIS type diode is formed of part of the first region, (D-2) an electrode constituting the other end of the MIS type diode is formed to be opposed to said part of the first region constituting one end of the MIS type diode, through a wide gap thin film, (E) the gate of the first transistor and the gate of the second transistor are connected to a first line for memory cell selection, (F) the third region is connected to a write-in information setting line, (G) the fourth region is connected to a second line, (H) the electrode constituting the other end of the MIS type diode is connected to a third line having a predetermined potential, and (I) the fifth region is connected to a fourth line.

It is preferred to employ a constitution in which the second region is connected to a fifth line, the second line is used as a bit line and a second predetermined potential is applied to the fifth line, or a constitution in which the second region is connected to a fifth line, the fifth line is used as a bit line and a second predetermined potential is applied to the second line.

In the semiconductor memory cell according to the twelfth aspect of the present invention, there may be employed a constitution in which the second region and the third region constitute a diode and the second region is connected to the write-in information setting line through the third region. When it is required to avoid possibility where carriers implanted from the above diode may latch up the semiconductor memory cell, it is preferred to employ a constitution in which further provided is a diode-constituting-region which is formed in a surface region of the second region and is in contact with the second region so as to form a rectifier junction together with the second region, a majority carrier diode (Schottky diode or hetero-junction diode in which majority carriers flow) comprises the diode-constituting-region and the second region, and the second region is connected to the write-in information setting line through the diode-constituting region. In this case, there may be employed a structure in which the above diode-constituting region has a common region with part of the write-in information setting line (in other words, a structure in which the diode-constituting region and part of the write-in information setting line are formed as a common region).

In the semiconductor memory cell according to the twelfth aspect of the present invention, there may be also employed another constitution in which further provided is a diode-constituting region which is formed in a surface region of the second region and is in contact with the second region so as to form a rectifier junction together with the second region, a diode comprises the diode-constituting region and the second region, and the second region is connected to the fourth line through the diode-constituting region.

In the semiconductor memory cell according to the twelfth aspect of the present invention, there may be also employed still another constitution in which the fifth region is connected to the first region in place of being connected to the fourth region. There may be also employed yet another constitution in which the fifth region is connected to the write-in information setting line in place of being connected to the fourth line. In these cases, there may be employed a constitution in which the second region and the third region constitute a diode and the second region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the second region and is in contact with the second region so as to form a rectifier junction together with the second region, a majority carrier diode comprises the diode-constituting region and the second region, and the second region is connected to the write-in information setting line through the diode-constituting region.

A semiconductor memory cell according to a thirteenth aspect of the present invention for achieving the above second object differs from the semiconductor memory cell according to the twelfth aspect of the present invention in that one end of the MIS type diode is formed of a fifth region. That is, according to the thirteenth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a fourth region which is formed in a surface region of the first region to be spaced from the second region and is in contact with the first region so as to form a rectifier junction together with the first region, and (e) a semi-conductive fifth region which is formed in a surface region of the second region to be spaced from the third region and has the second conductivity type, wherein:

(A-1) one source/drain region of the first transistor is formed of a portion of a surface region of the second region, (A-2) the other source/drain region of the first transistor is formed of the fourth region, (A-3) the channel forming region of the first transistor is formed of a portion of a surface region of the first region which portion is interposed between said portion of the surface region of the second region and the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the second region which part is interposed between the fifth region and said part of the first region, (C-3) one source/drain region of the junction-field-effect transistor is formed of said portion of the surface region of the second region which portion extends from one end of the channel region of the junction-field-effect transistor and constitutes one source/drain region of the first transistor, (C-4) the other source/drain region of the junction-field-effect transistor is formed of a portion of the second region which portion extends from the other end of the channel region of the junction-field-effect transistor, (D-1) one end of the MIS type diode is formed of the fifth region, (D-2) an electrode constituting the other end of the MIS type diode is formed to be opposed to the fifth region constituting one end of the MIS type diode, through a wide gap thin film, (E) the gate of the first transistor and the gate of the second transistor are connected to a first line for memory cell selection, (F) the third region is connected to a write-in information setting line, (G) the fourth region is connected to a second line, (H) the fifth region is connected to the first region, and (I) the electrode constituting the other end of the MIS type diode is connected to a third line having a predetermined potential.

In the semiconductor memory cell according to the thirteenth aspect of the present invention, there may be employed a constitution in which the second region and the third region constitute a diode and the second region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the second region and is in contact with the second region so as to form a rectifier junction together with the second region, a majority carrier diode comprises the diode-constituting region and the second region, and the second region is connected to the write-in information setting line through the diode-constituting region.

A semiconductor memory cell according to a fourteenth aspect of the present invention for achieving the above second object differs from the semiconductor memory cell according to the twelfth aspect of the present invention in that the fifth region is omitted and that the first transistor and the second transistor share a gate. That is, according to the fourteenth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a fourth region which is formed in a surface region of the second region and is in contact with the second region so as to form a rectifier junction together with the second region, and (e) the gate which is formed, through an insulation layer, so as to bridge the first region and the fourth region and so as to bridge the second region and the third region, and is shared by the first transistor and the second transistor, wherein:

(A-1) one source/drain region of the first transistor is formed of a surface region of the first region, (A-2) the other source/drain region of the first transistor is formed of the fourth region, (A-3) the channel forming region of the first transistor is formed of a surface region of the second region which surface region is interposed between the surface region of the first region and the fourth region, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (C-1) the gate regions of the junction-field-effect transistor are formed of the third region and part of the second region which part is opposed to the third region, (C-2) the channel region of the junction-field-effect transistor is formed of part of the first region which part is interposed between the third region and said part of the second region, (C-3) one source/drain region of the junction-field-effect transistor is formed of the surface region of the first region which surface region extends from one end of the channel region of the junction-field-effect transistor and constitutes one source/drain region of the first transistor, (C-4) the other source/drain region of the junction-field-effect transistor is formed of a portion of the first region which portion extends from the other end of the channel region of the junction-field-effect transistor, (D-1) one end of the MIS type diode is formed of part of the second region or an extending portion of the second region, (D-2) an electrode constituting the other end of the MIS type diode is formed to be opposed to said part of the second region or said extending portion of the second region which constitutes one end of the MIS type diode, through a wide gap thin film, (E) the gate is connected to a first line for memory cell selection, (F) the third region is connected to a write-in information setting line, (G) the fourth region is connected to a second line, and (H) the electrode constituting the other end of the MIS type diode is connected to a third line having a predetermined potential.

It is preferred to employ a constitution in which the first region is connected to a fifth line, the second line is used as a bit line and a second predetermined potential is applied to the fifth line, or a constitution in which the first region is connected to a fifth line, the fifth line is used as a bit line and a second predetermined potential is applied to the second line.

In the semiconductor memory cell according to the fourteenth aspect of the present invention, there may be employed a constitution in which the first region and the third region constitute a diode and the first region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to a fifteenth aspect of the present invention for achieving the above second object and the semiconductor memory cell according to the twelfth aspect of the present invention differ from each other in the position of the junction-field-effect transistor for current control. That is, according to the fifteenth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a semi-conductive fourth region which is formed in a surface region of the first region to be spaced from the second region and has the first conductivity type, and (e) a fifth region which is formed in a surface region of the fourth region and is in contact with the fourth region so as to form a rectifier junction together with the fourth region, wherein:

(A-1) one source/drain region of the first transistor is formed of a portion of a surface region of the second region, (A-2) the other source/drain region of the first transistor is formed of a surface region of the fourth region, (A-3) the channel forming region of the first transistor is formed of a portion of a surface region of the first region which portion is interposed between said portion of the surface region of the second region and the surface region of the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the fourth region which part is interposed between the fifth region and said part of the first region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of part of the first region, (D-2) an electrode constituting the other end of the MIS type diode is formed to be opposed to said part of the first region which part constitutes one end of the MIS type diode, through a wide gap thin film, (E) the gate of the first transistor and the gate of the second transistor are connected to a first line for memory cell selection, (F) the third region is connected to a write-in information setting line, (G) said portion of the fourth region which portion constitutes the other source/drain region of the junction-field-effect transistor is connected to a second line, (H) the electrode constituting the other end of the MIS type diode is connected to a third line having a predetermined potential, and (I) the fifth region is connected to a fourth line.

It is preferred to employ a constitution in which the second region is connected to a fifth line, the second line is used as a bit line and a second predetermined potential is applied to the fifth line, or a constitution in which the second region is connected to a fifth line, the fifth line is used as a bit line and a second predetermined potential is applied to the second line.

In the semiconductor memory cell according to the fifteenth aspect of the present invention, there may be employed a constitution in which the second region and the third region constitute a diode and the second region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the second region and is in contact with the second region so as to form a rectifier junction together with the second region, a majority carrier diode comprises the diode-constituting region and the second region, and the second region is connected to the write-in information setting line through the diode-constituting region.

In the semiconductor memory cell according to the fifteenth aspect of the present invention, there may be employed a constitution in which the fifth region is connected to the write-in information setting line in place of being connected to the fourth line or a constitution in which the fifth region is connected to the first region in place of being connected to the fourth line. In these cases, there may be employed a constitution in which the second region and the third region constitute a diode and the second region is connected to the write-in information setting line through the third line. When it is required to avoid possibility where carriers implanted from the above diode may latch up the semiconductor memory cell, it is preferred to employ a constitution in which further provided is a diode-constituting region which is formed in a surface region of the second region and is in contact with the second region so as to form a rectifier junction together with the second region, a majority carrier diode comprises the diode-constituting region and the second region, and the second region is connected to the write-in information setting line through the diode-constituting region.

A semiconductor memory cell according to a sixteenth aspect of the present invention differs from the semiconductor memory cell according to the fifteenth aspect of the present invention in that one end of the MIS type diode is formed of the fifth region. That is, according to the sixteenth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a semi-conductive fourth region which is formed in a surface region of the first region to be spaced from the second region and has the first conductivity type, and (e) a semi-conductive fifth region which is formed in a surface region of the fourth region and has the second conductivity type, wherein:

(A-1) one source/drain region of the first transistor is formed of a portion of a surface region of the second region, (A-2) the other source/drain region of the first transistor is formed of a surface region of the fourth region, (A-3) the channel forming region of the first transistor is formed of a portion of a surface region of the first region which portion is interposed between said portion of the surface region of the second region and the surface region of the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the fourth region which part is interposed between the fifth region and said part of the first region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of the fifth region, (D-2) an electrode constituting the other end of the MIS type diode is formed to be opposed to the fifth region constituting one end of the MIS type diode, through a wide gap thin film, (E) the gate of the first transistor and the gate of the second transistor are connected to a first line for memory cell selection, (F) the third region is connected to a write-in information setting line, (G) said portion of the fourth region which portion constitutes the other source/drain region of the junction-field-effect transistor is connected to a second line, (H) the fifth region is connected to the first region, and (I) the electrode constituting the other end of the MIS type diode is connected to a third line having a predetermined potential.

It is preferred to employ a constitution in which the second region is connected to a fifth line, the second line is used as a bit line and a second predetermined potential is applied to the fifth line, or a constitution in which the second region is connected to a fifth line, the fifth line is used as a bit line and a second predetermined potential is applied to the second line.

In the semiconductor memory cell according to the sixteenth aspect of the present invention, there may be employed a constitution in which the second region and the third region constitute a diode and the second region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the second region and is in contact with the second region so as to form a rectifier junction together with the second region, a majority carrier diode comprises the diode-constituting region and the second region, and the second region is connected to the write-in information setting line through the diode-constituting region.

A semiconductor memory cell according to a seventeenth aspect of the present invention for achieving the above second object differs from the semiconductor memory cell according to the fifteenth aspect of the present invention in that the first transistor and the second transistor share a gate. That is, according to the seventeenth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region and so as to bridge the second region and the third region, and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (C-1) the gate regions of the junction-field-effect transistor are formed of the fifth region and part of the second region which part is opposed to the fifth region, (C-2) the channel region of the junction-field-effect transistor is formed of part of the fourth region which part is interposed between the fifth region and said part of the second region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of part of the second region, (D-2) an electrode constituting the other end of the MIS type diode is formed to be opposed to said part of the second region which part constitutes one end of the MIS type diode, through a wide gap thin film, (E) the gate is connected to a first line for memory cell selection, (F) the third region is connected to a write-in information setting line, (G) said portion of the fourth region which portion constitutes the other source/drain region of the junction-field-effect transistor is connected to a second line, (H) the electrode constituting the other end of the MIS type diode is connected to a third line having a predetermined potential, and (I) the fifth region is connected to a fourth line.

It is preferred to employ a constitution in which the first region is connected to a fifth line, the second line is used as a bit line and a second predetermined potential is applied to the fifth line, or a constitution in which the first region is connected to a fifth line, the fifth line is used as a bit line and a second predetermined potential is applied to the second line.

In the semiconductor memory cell according to the seventeenth aspect of the present invention, there may be employed a constitution in which the first region and the third region constitute a diode and the first region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

Further, there may be employed a constitution in which the fifth region is connected to the write-in information setting line in place of being connected to the fourth line or a constitution in which the fifth region is connected to the second region in place of being connected to the fourth line. In these cases, there may be employed a constitution in which the first region and the third region constitute a diode and the first region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to an eighteenth aspect of the present invention for achieving the above second object differs from the semiconductor memory cell according to the seventeenth aspect of the present invention in that one end of the MIS type diode is formed of the fifth region. That is, according to the eighteenth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region and so as to bridge the second region and the third region, and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (C-1) the gate regions of the junction-field-effect transistor are formed of the fifth region and part of the second region which part is opposed to the fifth region, (C-2) the channel region of the junction-field-effect transistor is formed of part of the fourth region which part is interposed between the fifth region and said part of the second region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of the fifth region, (D-2) an electrode constituting the other end of the MIS type diode is formed to be opposed to the fifth region which constitutes one end of the MIS type diode, through a wide gap thin film, (E) the gate is connected to a first line for memory cell selection, (F) the third region is connected to a write-in information setting line, (G) said portion of the fourth region which portion constitutes the other source/drain region of the junction-field-effect transistor is connected to a second line, (H) the fifth region is connected to the second region, and (I) the electrode constituting the other end of the MIS type diode is connected to a third line having a predetermined potential.

It is preferred to employ a constitution in which the first region is connected to a fifth line, the second line is used as a bit line and a second predetermined potential is applied to the fifth line, or a constitution in which the first region is connected to a fifth line, the fifth line is used as a bit line and a second predetermined potential is applied to the second line.

In the semiconductor memory cell according to the eighteenth aspect of the present invention, there may be employed a constitution in which the first region and the third region constitute a diode and the first region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to a nineteenth aspect of the present invention for achieving the above second object differs from the semiconductor memory cell according to the seventeenth aspect of the present invention in that a third transistor for current control is provide. That is, according to the nineteenth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region, so as to bridge the second region and the third region and so as to bridge the second region and the fifth region, and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the junction-field-effect transistor are formed of the fifth region and part of the second region which part is opposed to the fifth region, (D-2) the channel region of the junction-field-effect transistor is formed of part of the fourth region which part is interposed between the fifth region and said part of the second region, (D-3) one source/drain region of the junction-field-effect transistor is formed of the surface region of the fourth region which surface region extends from one end of the channel region of the junction-field-effect transistor and constitutes the other source/drain region of the first transistor and the channel forming region of the third transistor, (D-4) the other source/drain region of the junction-field-effect transistor is formed of a portion of the fourth region which portion extends from the other end of the channel region of the junction-field-effect transistor, (E-1) one end of the MIS type diode is formed of part of the second region, (E-2) an electrode constituting the other end of the MIS type diode is formed to be opposed to said part of the second region which part constitutes one end of the MIS type diode, through a wide gap thin film, (F) the gate is connected to a first line for memory cell selection, (G) the third region is connected to a write-in information setting line, (H) said portion of the fourth region which portion constitutes the other source/drain region of the junction-field-effect transistor is connected to a second line, and (I) the electrode constituting the other end of the MIS type diode is connected to a third line having a predetermined potential.

It is preferred to employ a constitution in which the first region is connected to a fourth line, the second line is used as a bit line and a second predetermined potential is applied to the fourth line, or a constitution in which the first region is connected to a fourth line, the fourth line is used as a bit line and a second predetermined potential is applied to the second line.

In the semiconductor memory cell according to the nineteenth aspect of the present invention, there may be employed a constitution in which the first region and the third region constitute a diode and the first region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to a twentieth aspect of the present invention for achieving the above second object differs from the semiconductor memory cell according to the nineteenth aspect of the present invention in that one end of the MIS type diode is formed of the fifth region. That is, according to the twentieth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region, so as to bridge the second region and the third region and so as to bridge the second region and the fifth region, and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the junction-field-effect transistor are formed of the fifth region and part of the second region which part is opposed to the fifth region, (D-2) the channel region of the junction-field-effect transistor is formed of part of the fourth region which part is interposed between the fifth region and said part of the second region, (D-3) one source/drain region of the junction-field-effect transistor is formed of the surface region of the fourth region which surface region extends from one end of the channel region of the junction-field-effect transistor and constitutes the other source/drain region of the first transistor and the channel forming region of the third transistor, (D-4) the other source/drain region of the junction-field-effect transistor is formed of a portion of the fourth region which portion extends from the other end of the channel region of the junction-field-effect transistor, (E-1) one end of the MIS type diode is formed of the fifth region, (E-2) an electrode constituting the other end of the MIS type diode is formed to be opposed to the fifth region which constitutes one end of the MIS type diode, through a wide gap thin film, (F) the gate is connected to a first line for memory cell selection, (G) the third region is connected to a write-in information setting line, (H) said portion of the fourth region which portion constitutes the other source/drain region of the junction-field-effect transistor is connected to a second line, and (I) the electrode constituting the other end of the MIS type diode is connected to a third line having a predetermined potential.

It is preferred to employ a constitution in which the first region is connected to a fourth line, the second line is used as a bit line and a second predetermined potential is applied to the fourth line, or a constitution in which the first region is connected to a fourth line, the fourth line is used as a bit line and a second predetermined potential is applied to the second line.

In the semiconductor memory cell according to the twentieth aspect of the present invention, it is preferred to employ a constitution in which a high-concentration-impurity-containing layer having the second conductivity type is formed in the surface region of the fourth region which surface region constitutes the channel forming region of the third transistor.

In the semiconductor memory cell according to the twentieth aspect of the present invention, there may be employed a constitution in which the first region and the third region constitute a diode and the first region is connected to the write-in information setting line through the third region. When it is required to avoid possibility where carriers implanted from the above diode may latch up the semiconductor memory cell, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to a twenty-first aspect of the present invention for achieving the above second object differs from the semiconductor memory cell according to the fourteenth aspect of the present invention in that a second junction-field-effect transistor is provided. That is, according to the twenty-first aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region and so as to bridge the second region and the third region, and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) the gate regions of the first junction-field-effect transistor are formed of the third region and part of the second region which part is opposed to the third region, (C-2) the channel region of the first junction-field-effect transistor is formed of part of the first region which part is interposed between the third region and said part of the second region, (C-3) one source/drain region of the first junction-field-effect transistor is formed of the surface region of the first region which surface region extends from one end of the channel region of the first junction-field-effect transistor and constitutes one source/drain region of the first transistor, (C-4) the other source/drain region of the first junction-field-effect transistor is formed of a portion of the first region which portion extends from the other end of the channel region of the first junction-field-effect transistor, (D-1) the gate regions of the second junction-field-effect transistor are formed of the fifth region and part of the second region which part is opposed to the fifth region, (D-2) the channel region of the second junction-field-effect transistor is formed of part of the fourth region which part is interposed between the fifth region and said part of the second region, (D-3) one source/drain region of the second junction-field-effect transistor is formed of the surface region of the fourth region which surface region extends from one end of the channel region of the second junction-field-effect transistor and constitutes the other source/drain region of the first transistor, (D-4) the other source/drain region of the second junction-field-effect transistor is formed of a portion of the fourth region which portion extends from the other end of the channel region of the second junction-field-effect transistor, (E-1) one end of the MIS type diode is formed of part of the second region, (E-2) an electrode constituting the other end of the MIS type diode is formed to be opposed to said part of the second region which part constitutes one end of the MIS type diode, through a wide gap thin film, (F) the gate is connected to a first line for memory cell selection, (G) the third region is connected to a write-in information setting line, (H) said portion of the fourth region constituting the other source/drain region of the second junction-field-effect transistor is connected to a second line, (I) the electrode constituting the other end of the MIS type diode is connected to a third line having a predetermined potential, and (J) the fifth region is connected to a fourth line.

It is preferred to employ a constitution in which the first region is connected to a fifth line, the second line is used as a bit line and a second predetermined potential is applied to the fifth line, or a constitution in which the first region is connected to a fifth line, the fifth line is used as a bit line and a second predetermined potential is applied to the second line.

In the semiconductor memory cell according to the twenty-first aspect of the present invention, there may be employed a constitution in which the first region and the third region constitute a diode and the first region is connected to the write-in information setting line through the third region. Otherwise, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

In the semiconductor memory cell according to the twenty first aspect of the present invention, there may be further employed a constitution in which the fifth region constituting the other gate region of the second junction-field-effect transistor is connected to the second region constituting one gate region of the second junction-field-effect transistor in place of being connected to the fourth line or a constitution in which the fifth region constituting the other gate region of the second junction-field-effect transistor is connected to the write-in information setting line in place of being connected to the fourth line. In these cases, there may be employed a constitution in which the first region and the third region constitute a diode and the first region is connected to the write-in information setting line through the third region. Otherwise, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to a twenty-second aspect of the present invention for achieving the above second object differs from the semiconductor memory cell according to the twenty-first aspect of the present invention in that one end of the MIS type diode is formed of the fifth region. That is, according to the twenty-second aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region and so as to bridge the second region and the third region, and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) the gate regions of the first junction-field-effect transistor are formed of the third region and part of the second region which part is opposed to the third region, (C-2) the channel region of the first junction-field-effect transistor is formed of part of the first region which part is interposed between the third region and said part of the second region, (C-3) one source/drain region of the first junction-field-effect transistor is formed of the surface region of the first region which surface region extends from one end of the channel region of the first junction-field-effect transistor and constitutes one source/drain region of the first transistor, (C-4) the other source/drain region of the first junction-field-effect transistor is formed of a portion of the first region which portion extends from the other end of the channel region of the first junction-field-effect transistor, (D-1) the gate regions of the second junction-field-effect transistor are formed of the fifth region and part of the second region which part is opposed to the fifth region, (D-2) the channel region of the second junction-field-effect transistor is formed of part of the fourth region which part is interposed between the fifth region and said part of the second region, (D-3) one source/drain region of the second junction-field-effect transistor is formed of the surface region of the fourth region which surface region extends from one end of the channel region of the second junction-field-effect transistor and constitutes the other source/drain region of the first transistor, (D-4) the other source/drain region of the second junction-field-effect transistor is formed of a portion of the fourth region which portion extends from the other end of the channel region of the second junction-field-effect transistor, (E-1) one end of the MIS type diode is formed of the fifth region, (E-2) an electrode constituting the other end of the MIS type diode is formed to be opposed to the fifth region which constitutes one end of the MIS type diode, through a wide gap thin film, (F) the gate is connected to a first line for memory cell selection, (G) the third region is connected to a write-in information setting line, (H) said portion of the fourth region constituting the other source/drain region of the second junction-field-effect transistor is connected to a second line, (I) the fifth region is connected to the second region, and (J) the electrode constituting the other end of the MIS type diode is connected to a third line having a predetermined potential.

It is preferred to employ a constitution in which the first region is connected to a fifth line, the second line is used as a bit line and a second predetermined potential is applied to the fifth line, or a constitution in which the first region is connected to a fifth line, the fifth line is used as a bit line and a second predetermined potential is applied to the second line.

In the semiconductor memory cell according to the twenty-second aspect of the present invention, there may be employed a constitution in which the first region and the third region constitute a diode and the first region is connected to the write-in information setting line through the third region. Otherwise, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to a twenty-third aspect of the present invention for achieving the above second object differs from the semiconductor memory cell according to the twenty-first aspect of the present invention in that a third transistor is provided. That is, according to the twenty-third aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region, so as to bridge the second region and the third region and so as to bridge the second region and the fifth region, and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the first junction-field-effect transistor are formed of the third region and part of the second region which part is opposed to the third region, (D-2) the channel region of the first junction-field-effect transistor is formed of part of the first region which part is interposed between the third region and said part of the second region, (D-3) one source/drain region of the first junction-field-effect transistor is formed of the surface region of the first region which surface region extends from one end of the channel region of the first junction-field-effect transistor and constitutes one source/drain region of the first transistor, (D-4) the other source/drain region of the first junction-field-effect transistor is formed of a portion of the first region which portion extends from the other end of the channel region of the first junction-field-effect transistor, (E-1) the gate regions of the second junction-field-effect transistor are formed of the fifth region and part of the second region which part is opposed to the fifth region, (E-2) the channel region of the second junction-field-effect transistor is formed of part of the fourth region which part is interposed between the fifth region and said part of the second region, (E-3) one source/drain region of the second junction-field-effect transistor is formed of the surface region of the fourth region which surface region extends from one end of the channel region of the second junction-field-effect transistor and constitutes the other source/drain region of the first transistor and the channel forming region of the third transistor, (E-4) the other source/drain region of the second junction-field-effect transistor is formed of a portion of the fourth region which portion extends from the other end of the channel region of the second junction-field-effect transistor, (F-1) one end of the MIS type diode is formed of part of the second region, (F-2) an electrode constituting the other end of the MIS type diode is formed to be opposed to said part of the second region which part constitutes one end of the MIS type diode, through a wide gap thin film, (G) the gate is connected to a first line for memory cell selection, (H) the third region is connected to a write-in information setting line, (I) said portion of the fourth region constituting the other source/drain region of the second junction-field-effect transistor is connected to a second line, and (J) the electrode constituting the other end of the MIS type diode is connected to a third line having a predetermined potential.

It is preferred to employ a constitution in which the first region is connected to a fourth line, the second line is used as a bit line and a second predetermined potential is applied to the fourth line, or a constitution in which the first region is connected to a fourth line, the fourth line is used as a bit line and a second predetermined potential is applied to the second line.

In the semiconductor memory cell according to the twenty-third aspect of the present invention, there may be employed a constitution in which the first region and the third region constitute a diode and the first region is connected to the write-in information setting line through the third region. Otherwise, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

A semiconductor memory cell according to a twenty-fourth aspect of the present invention for achieving the above second object differs from the semiconductor memory cell according to the twenty-third aspect of the present invention in that one end of the MIS type diode is formed of the fifth region. That is, according to the twenty-fourth aspect of the present invention, there is provided a semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region, so as to bridge the second region and the third region and so as to bridge the second region and the fifth region, and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the first junction-field-effect transistor are formed of the third region and part of the second region which part is opposed to the third region, (D-2) the channel region of the first junction-field-effect transistor is formed of part of the first region which part is interposed between the third region and said part of the second region, (D-3) one source/drain region of the first junction-field-effect transistor is formed of the surface region of the first region which surface region extends from one end of the channel region of the first junction-field-effect transistor and constitutes one source/drain region of the first transistor, (D-4) the other source/drain region of the first junction-field-effect transistor is formed of a portion of the first region which portion extends from the other end of the channel region of the first junction-field-effect transistor, (E-1) the gate regions of the second junction-field-effect transistor are formed of the fifth region and part of the second region which part is opposed to the fifth region, (E-2) the channel region of the second junction-field-effect transistor is formed of part of the fourth region which part is interposed between the fifth region and said part of the second region, (E-3) one source/drain region of the second junction-field-effect transistor is formed of the surface region of the fourth region which surface region extends from one end of the channel region of the second junction-field-effect transistor and constitutes the other source/drain region of the first transistor and the channel forming region of the third transistor, (E-4) the other source/drain region of the second junction-field-effect transistor is formed of a portion of the fourth region which portion extends from the other end of the channel region of the second junction-field-effect transistor, (F-1) one end of the MIS type diode is formed of the fifth region, (F-2) an electrode constituting the other end of the MIS type diode is formed to be opposed to the fifth region which constitutes one end of the MIS type diode, through a wide gap thin film, (G) the gate is connected to a first line for memory cell selection, (H) the third region is connected to a write-in information setting line, (I) said portion of the fourth region constituting the other source/drain region of the second junction-field-effect transistor is connected to a second line, (J) the fifth region is connected to the second region, and (K) the electrode constituting the other end of the MIS type diode is connected to a third line having a predetermined potential.

It is preferred to employ a constitution in which the first region is connected to a fourth line, the second line is used as a bit line and a second predetermined potential is applied to the fourth line, or a constitution in which the first region is connected to a fourth line, the fourth line is used as a bit line and a second predetermined potential is applied to the second line.

In the semiconductor memory cell according to the twenty-fourth aspect of the present invention, it is preferred to employ a constitution in which a high-concentration-impurity-containing layer having the second conductivity type is formed in the surface region of the fourth region which surface region constitutes the channel forming region of the third transistor.

In the semiconductor memory cell according to the twenty-fourth aspect of the present invention, there may be employed a constitution in which the first region and the third region constitute a diode and the first region is connected to the write-in information setting line through the third region. Otherwise, it is preferred to employ a constitution in which further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

In the semiconductor memory cell according to any one of the twelfth to twenty-fourth aspects of the present invention and a twenty fifth to a twenty-ninth aspects of the present invention to be described later, preferably, the electrode constituting the other end of the MIS type diode is connected to the third line, having a predetermined potential and corresponding to the above line, through a high-resistance element for preventing the deterioration of characteristics of the wide gap thin film. Preferably, the electrode constituting the other end of the MIS type diode and the high-resistance element are integrally formed and are composed of a silicon thin layer (for example, polysilicon thin layer) in view of the simplification of a wiring structure. Further, preferably, the silicon thin layer contains an impurity having the first conductivity type.

In the semiconductor memory cell according to any one of the twelfth to twenty-fourth aspects of the present invention and the twenty fifth to the twenty-ninth aspects of the present invention to be described later, the wide gap thin film is preferably composed of a material in which the tunnel transition of carriers is caused depending upon a potential difference between the potential in the region constituting one end of the MIS type diode and the potential in the other end of the MIS type diode. In this case, it is preferred to employ the following constitution. Binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor. (i) When the potential in the channel forming region of the first transistor is the first potential, the tunnel transition of carriers is caused from the other end to one end of the MIS type diode. As a result, carrier multiplication takes place, holes or electrons are stored in the region (or part of the region) constituting one end of the MIS type diode depending upon the conductivity type of one end of the MIS type diode, and the potential in the channel forming region of the first transistor is held nearly at the first potential. (ii) When the potential in the channel forming region of the first transistor is the second potential, carriers having the polarity opposite to that of the above carriers transit from one end to the other end of the MIS type diode. As a result, the potential in the channel forming region of the first transistor is held at the second potential.

In a preferred embodiment of the semiconductor memory cell according to any one of the twelfth to twenty-fourth aspects of the present invention, it is preferred to form a first high-concentration-impurity-containing layer having the first conductivity type below the region constituting the channel forming region of the first transistor, since the potential or charge to be stored in the channel forming region of the first transistor can be increased. In the semiconductor memory cell according to any one of the twelfth to twenty-fourth aspects of the present invention, there may be employed a constitution in which a second high-concentration-impurity-containing layer having the first conductivity type, which functions as a line connected to one source/drain region of the first transistor, is formed below the region constituting one source/drain region the first transistor depending upon the arrangement of the regions, since the wiring structure can be simplified.

In the semiconductor memory cell according to any one of the twelfth to twenty-fourth aspects of the present invention, the semi-conductive or conductive region may be composed of a silicide, a metal or a metal compound, while the region is preferably composed of semiconductor. When a diode-constituting region is provided for forming the majority carrier-diode, the diode-constituting region may be composed of a semiconductor, while the diode-constituting region may be composed of a silicide, a metal or a metal compound and in this case, the region, in the surface region of which the diode-constituting region is formed, is preferably composed of semiconductor. The structure in which the third region is connected to the write-in information setting line includes a structure in which the third region has a common region with part of the write-in information setting line (in other words, a structure in which the third line and part of the write-in information setting line are formed as a common region). Further, the structure in which the fourth region is connected to the second line includes a structure in which the fourth region has a common region with part of the second line (in other words, a structure in which the fourth region and part of the second line are formed as a common region).

According to a twenty-fifth aspect of the present invention for achieving the above second object, as a drawing of its principle is shown in FIG. 179A, there is provided a semiconductor memory cell having a semiconductor layer having two main surfaces opposed to each other, the main surfaces being a first main surface and a second main surface, the semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region including the first main surface of the first region to be spaced from the second region and is in contact with the first region so as to form a rectifier junction together with the first region, (f) the gate of the first transistor formed on a first insulation layer formed on the first main surface so as to bridge the first region and the fourth region, and (g) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) the gate regions of the junction-field-effect transistor are formed of the fifth region and the third region which is opposed to the fifth region, (C-2) the channel region of the junction-field-effect transistor is formed of part of the first region which part is interposed between the fifth region and the third region, (C-3) one source/drain region of the junction-field-effect transistor is formed of a portion of the first region which portion extends from one end of the channel region of the junction-field-effect transistor and constitutes one source/drain region of the first transistor and the channel forming region of the second transistor, (C-4) the other source/drain region of the junction-field-effect transistor is formed of a portion of the first region which portion extends from the other end of the channel region of the junction-field-effect transistor, (D-1) one end of the MIS type diode is formed of part of the second region, (D-2) an electrode constituting the other end of the MIS type diode is formed to be opposed to said part of the second region constituting one end of the MIS type diode, through a wide gap thin film, (E) the gate of the first transistor and the gate of the second transistor are connected to a first line for memory cell selection, (F) the third region is connected to a write-in information setting line, (G) the fourth region is connected to a second line, (H) the electrode constituting the other end of the MIS type diode is connected to a third line having a predetermined potential, (I) the fifth region is connected to a fourth line, and (J) said portion of the first region which portion constitutes the other source/drain region of the junction-field-effect transistor is connected to a fifth line.

There may be employed a constitution in which the second line is used as a bit line and a second predetermined potential is applied to the fifth line. Otherwise, there may be also employed another constitution in which a second predetermined potential is applied to the second line and the fifth line is used as a bit line.

There may be employed a constitution in which, as a drawing of its principle is shown in FIG. 179B, the fifth line is connected to the write-in information setting line or the third region in place of being connected to the fourth line, since the wiring structure can be simplified. In this case, there may be employed a constitution in which the second line is used as a bit line or a constitution in which the write-in information setting line is co-used as a bit line and a second predetermined potential is applied to the second line.

In the semiconductor memory cell according to the twenty-fifth aspect of the present invention, the structure in which the third region is connected to the write-in information setting line includes a structure in which the third region has a common region with part of the write-in information setting line. Further, the structure in which the fourth region is connected to the second line includes a structure in which the fourth region has a common region with part of the second line. The structure in which the fifth region is connected to the fourth line includes a structure in which the fifth region has a common region with part of the fourth line. Further, the structure in which the fifth region is connected to the write-in information setting line includes a structure in which the fifth region has a common region with part of the write-in information setting line.

According to a twenty-sixth aspect of the present invention for achieving the above second object, as a drawing of its principle is shown in FIG. 108, there is provided a semiconductor memory cell having a semiconductor layer having two main surfaces opposed to each other, the main surfaces being a first main surface and a second main surface, the semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region of the fourth region and is in contact with the fourth region so as to form a rectifier junction together with the fourth region, (f) the gate of the first transistor formed on a first insulation layer formed on the first main surface so as to bridge the first region and the fourth region, and (g) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) the gate regions of the junction-field-effect transistor are formed of the fifth region and part of the second region which part is opposed to the fifth region, (C-2) the channel region of the junction-field-effect transistor is formed of part of the fourth region which part is interposed between the fifth region and said part of the second region, (C-3) one source/drain region of the junction-field-effect transistor is formed of a portion of the fourth region which portion extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of part of the second region, (D-2) an electrode constituting the other end of the MIS type diode is formed to be opposed to said part of the second region constituting one end of the MIS type diode, through a wide gap thin film, (E) the gate of the first transistor and the gate of the second transistor are connected to a first line for memory cell selection, (F) said portion of the fourth region constituting the other source/drain region of the junction-field-effect transistor is connected to a second line, (G) the electrode constituting the other end of the MIS type diode is connected to a third line having a predetermined potential, (H) the third region is connected to a write-in information setting line, (I) the fifth region is connected to a fourth line, and (J) the first region is connected to a fifth line.

There may be employed a constitution in which the second line is used as a bit line and a second predetermined potential is applied to the fifth line. Otherwise, there may be also employed another constitution in which a second predetermined potential is applied to the second line and the fifth line is used as a bit line.

There may be employed a constitution in which, as a drawing of its principle is shown in FIG. 112, the fifth line is connected to the second region in place of being connected to the fourth line, since the wiring structure can be simplified. In this case, there may be employed a constitution in which the second line is used as a bit line or a constitution in which the write-in information setting line is co-used as a bit line and a second predetermined potential is applied to the second line.

In the semiconductor memory cell according to the twenty-sixth aspect of the present invention, the structure in which the third region is connected to the write-in information setting line includes a structure in which the third region has a common region with part of the write-in information setting line. Further, the structure in which the fifth region is connected to the fourth line includes a structure in which the fifth region has a common region with part of the fourth line.

A semiconductor memory cell according to a twenty-seventh aspect of the present invention for achieving the above second object differs from the semiconductor memory cell according to the twenty-sixth aspect of the present invention in that a sixth region is further formed and a second junction-field-effect transistor is provided, as a drawing of its principle is shown in FIG. 191.

That is, according to the twenty-seventh aspect of the present invention, there is provided a semiconductor memory cell having a semiconductor layer having two main surfaces opposed to each other, the main surfaces being a first main surface and a second main surface, the semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region including the first main surface of the first region to be spaced from the second region and is in contact with the first region so as to form a rectifier junction together with the first region, (f) a sixth region which is formed in a surface region of the fourth region and is in contact with the fourth region so as to form a rectifier junction together with the fourth region, (g) the gate of the first transistor formed on a first insulation layer formed on the first main surface so as to bridge the first region and the fourth region, and (h) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) the gate regions of the first junction-field-effect transistor are formed of the fifth region and the third region which is opposed to the fifth region, (C-2) the channel region of the first junction-field-effect transistor is formed of part of the first region which part is interposed between the fifth region and the third region, (C-3) one source/drain region of the first junction-field-effect transistor is formed of a portion of the first region which portion extends from one end of the channel region of the first junction-field-effect transistor and constitutes one source/drain region of the first transistor and the channel forming region of the second transistor, (C-4) the other source/drain region of the first junction-field-effect transistor is formed of a portion of the first region which portion extends from the other end of the channel region of the first junction-field-effect transistor, (D-1) the gate regions of the second junction-field-effect transistor are formed of the sixth region and part of the second region which part is opposed to the sixth region, (D-2) the channel region of the second junction-field-effect transistor is formed of part of the fourth region which part is interposed between the sixth region and said part of the second region, (D-3) one source/drain region of the second junction-field-effect transistor is formed of a portion of the fourth region which portion extends from one end of the channel region of the second junction-field-effect transistor and constitutes the other source/drain region of the first transistor, (D-4) the other source/drain region of the second junction-field-effect transistor is formed of a portion of the fourth region which portion extends from the other end of the channel region of the second junction-field-effect transistor, (E-1) one end of the MIS type diode is formed of part of the second region, (E-2) an electrode constituting the other end of the MIS type diode is formed to be opposed to said part of the second region constituting one end of the MIS type diode, through a wide gap thin film, (F) the gate of the first transistor and the gate of the second transistor are connected to a first line for memory cell selection, (G) the third region is connected to a write-in information setting line, (H) said portion of the fourth region constituting the other source/drain region of the second junction-field-effect transistor is connected to a second line, (I) the electrode constituting the other end of the MIS type diode is connected to a third line having a predetermined potential, (J) the fifth region and the sixth region are connected to a fourth line, and (K) said portion of the first region constituting the other source/drain region of the first junction-field-effect transistor is connected to a fifth line.

There may be employed a constitution in which the second line is used as a bit line and a second predetermined potential is applied to the fifth line. Otherwise, there may be also employed another constitution in which a second predetermined potential is applied to the second line and the fifth line is used as a bit line.

In the semiconductor memory cell according to the twenty-seventh aspect of the present invention, the fifth region may be connected to the third region (the write-in information setting line) in place of being connected to the fourth line. The sixth region may be connected to the second region in place of being connected to the fourth line. In this case, there may be employed a constitution in which the second line is used as a bit line or a constitution in which the write-in information setting line is co-used as a bit line and a second predetermined potential is applied to the second line.

In the semiconductor memory cell according to the twenty-seventh aspect of the present invention, the structure in which the third region is connected to the write-in information setting line includes a structure in which the third region has a common region with part of the write-in information setting line. Further, the structure in which the fifth region and the sixth region are connected to the fourth line includes a structure in which the fifth region and the sixth region have common regions with part of the fourth line. Further, the structure in which the fifth region is connected to the write-in information setting line includes a structure in which the fifth region has a common region with part of the write-in information setting line.

In a semiconductor memory cell according to a twenty-eighth aspect of the present invention for achieving the above second object, a third transistor for current control, having a second conductivity, is added into a semiconductor memory cell having a structure similar to that of the semiconductor memory cell according to the twenty-sixth aspect of the present invention, as a drawing of its principle is shown in FIG. 138.

That is, according to the twenty-eighth aspect of the present invention, there is provided a semiconductor memory cell having a semiconductor layer having two main surfaces opposed to each other, the main surfaces being a first main surface and a second main surface, the semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region of the fourth region and is in contact with the fourth region so as to form a rectifier junction together with the fourth region, (f) the gate formed on a first insulation layer formed on the first main surface so as to bridge the first region and the fourth region and so as to bridge the second region and the fifth region, and is shared by the first transistor and the third transistor, and (g) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) one source/drain region of the third transistor constitutes the channel forming region of the first transistor, (C-2) the other source/drain region of the third transistor is formed of the fifth region, (C-3) the channel forming region of the third transistor constitutes the other source/drain region of the first transistor, (D-1) the gate regions of the junction-field-effect transistor are formed of the fifth region and part of the second region which part is opposed to the fifth region, (D-2) the channel region of the junction-field-effect transistor is formed of part of the fourth region which part is interposed between the fifth region and said part of the second region, (D-3) one source/drain region of the junction-field-effect transistor is formed of a portion of the fourth region which portion extends from one end of the channel region of the junction-field-effect transistor and constitutes the other source/drain region of the first transistor, (D-4) the other source/drain region of the junction-field-effect transistor is formed of a portion of the fourth region which portion extends from the other end of the channel region of the junction-field-effect transistor, (E-1) one end of the MIS type diode is formed of part of the second region, (E-2) an electrode constituting the other end of the MIS type diode is formed to be opposed to said part of the second region constituting one end of the MIS type diode, through a wide gap thin film, (F) the gate shared by of the first transistor and the third transistor and the gate of the second transistor are connected to a first line for memory cell selection, (G) the third region is connected to a write-in information setting line, (H) said portion of the fourth region constituting the other source/drain region of the junction-field-effect transistor is connected to a second line, (I) the electrode constituting the other end of the MIS type diode is connected to a third line having a predetermined potential, and (J) the first region is connected to a fourth line.

There may be employed a constitution in which the second line is used as a bit line and a second predetermined potential is applied to the fourth line. Otherwise, there may be also employed another constitution in which a second predetermined potential is applied to the second line and the fourth line is used as a bit line.

In the semiconductor memory cell according to the twenty-eighth aspect of the present invention, the structure in which the third region is connected to the write-in information setting line includes a structure in which the third region has a common region with part of the write-in information setting line.

A semiconductor memory cell according to a twenty-ninth aspect of the present invention for achieving the above second object, as a drawing of its principle is shown in FIG. 202, has such a structure that the structure of the semiconductor memory cell according to the twenty-seventh aspect of the present invention is combined with the structure of the semiconductor memory cell according to the twenty-eighth aspect of the present invention. That is, the semiconductor memory cell according to the twenty-ninth aspect of the present invention has a structure that a sixth region is further formed, a second junction-field-effect transistor having a first conductivity type is added and a third transistor for current control, having a second conductivity type, is added into the structure of the semiconductor memory cell according to the twenty-sixth aspect of the present invention.

That is, according to the twenty-ninth aspect of the present invention, there is provided a semiconductor memory cell having a semiconductor layer having two main surfaces opposed to each other, the main surfaces being a first main surface and a second main surface, the semiconductor memory cell comprising;

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region including the first main surface of the first region to be spaced from the second region and is in contact with the first region so as to form a rectifier junction together with the first region, (f) a sixth region which is formed in a surface region of the fourth region and is in contact with the fourth region so as to form a rectifier junction together with the fourth region, (g) the gate formed on a first insulation layer formed on the first main surface so as to bridge the first region and the fourth region and so as to bridge the second region and the fifth region, and is shared by the first transistor and the third transistor, and (h) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) one source/drain region of the third transistor constitutes the channel forming region of the first transistor, (C-2) the other source/drain region of the third transistor is formed of the sixth region, (C-3) the channel forming region of the third transistor constitutes the other source/drain region of the first transistor, (D-1) the gate regions of the first junction-field-effect transistor are formed of the fifth region and the third region which is opposed to the fifth region, (D-2) the channel region of the first junction-field-effect transistor is formed of part of the first region which part is interposed between the fifth region and the third region, (D-3) one source/drain region of the first junction-field-effect transistor is formed of a portion of the first region which portion extends from one end of the channel region of the first junction-field-effect transistor and constitutes one source/drain region of the first transistor and the channel forming region of the second transistor, (D-4) the other source/drain region of the first junction-field-effect transistor is formed of a portion of the first region which portion extends from the other end of the channel region of the first junction-field-effect transistor, (E-1) the gate regions of the second junction-field-effect transistor are formed of the sixth region and part of the second region which part is opposed to the sixth region, (E-2) the channel region of the second junction-field-effect transistor is formed of part of the fourth region which part is interposed between the sixth region and said part of the second region, (E-3) one source/drain region of the second junction-field-effect transistor is formed of a portion of the fourth region which portion extends from one end of the channel region of the second junction-field-effect transistor and constitutes the other source/drain region of the first transistor, (E-4) the other source/drain region of the second junction-field-effect transistor is formed of a portion of the fourth region which portion extends from the other end of the channel region of the second junction-field-effect transistor, (F-1) one end of the MIS type diode is formed of part of the second region, (F-2) an electrode constituting the other end of the MIS type diode is formed to be opposed to said part of the second region constituting one end of the MIS type diode, through a wide gap thin film, (G) the gate shared by of the first transistor and the third transistor and the gate of the second transistor are connected to a first line for memory cell selection, (H) the third region is connected to a write-in information setting line, (I) said portion of the fourth region constituting the other source/drain region of the second junction-field-effect transistor is connected to a second line, (J) the electrode constituting the other end of the MIS type diode is connected to a third line having a predetermined potential, and (K) the fifth region is connected to a fourth line.

There may be employed a constitution in which the first region is connected to a fifth line, the second line is used as a bit line and a second predetermined potential is applied to the fifth line. Otherwise, there may be also employed another constitution in which the first region is connected to a fifth line, a second predetermined potential is applied to the second line and the fifth line is used as a bit line.

There may be employed a constitution in which, as a drawing of its principle is shown in FIG. 205, the fifth region is connected to the third region in place of being connected to the fourth line. In this case, there may be employed a constitution in which the first region is connected to a fifth line, the second line is used as a bit line and a second predetermined potential is applied to the fifth line, or a constitution in which the first region is connected to a fifth line, a second predetermined potential is applied to the second line and the fifth line is used as a bit line.

In the semiconductor memory cell according to the twenty-ninth aspect of the present invention, the structure in which the third region is connected to the write-in information setting line includes a structure in which the third region has a common region with part of the write-in information setting line. Further, the structure in which the fifth region is connected to the fourth line includes a structure in which the fifth region has common regions with part of the fourth line. Further, the structure in which the fifth region is connected to the write-in information setting line includes a structure in which the fifth region has a common region with part of the write-in information setting line.

In the semiconductor memory cell according to the twenty-fifth aspect of the present invention, each of the third region, fourth region and the fifth region may be composed of a silicide, a metal or a metal compound, while each of these regions is preferably composed of semiconductor. In the semiconductor memory cell according to the twenty sixth or twenty-eighth aspect of the present invention, the fourth region is preferably composed of semiconductor, and, while the third region or the fifth region may be composed of a silicide, a metal or a metal compound, each of these regions is preferably composed of semiconductor. In the semiconductor memory cell according to the twenty seventh or twenty-ninth aspect of the present invention, the fourth region is preferably composed of semiconductor, and, while each of the third region, the fifth region and the sixth region may be composed of a silicide, a metal or a metal compound, each of these regions is preferably composed of semiconductor. When these regions are to be composed of a silicide, a metal or a metal compound, and when there is to be employed a constitution in which these regions are connected to the lines, these regions may be composed of the same material as the material of the lines (for example, a material such as titanium silicide or TiN for use as a barrier layer or a glue layer). That is, these regions and part of the lines may be formed as a structurally common region.

In the semiconductor memory cell of the present invention, that the potential in the channel forming region of the first transistor is held "nearly" at the first potential means that there is a case when the potential in the channel forming region of the first transistor is not held at a potential equal to the first potential in the strict sense. That is, in some case, holes or electrons are stored in the channel forming region of the first transistor or the other source/drain region of the third transistor so that the absolute value of the potential held in the channel forming region of the first transistor is higher than the absolute value of the first potential by 0.1 to 0.2 volt. The absolute value of the second potential is smaller than the absolute value of the above predetermined potential by a potential drop in the MIS type diode (including a potential drop in the high-resistance element when the high-resistance element is connected).

The wide gap thin film is composed of a material having energy barrier against the valence band upper end and conduction band lower end of the semiconductive region constituting the extending portion of the first transistor or the other source/drain region of the third transistor which constitutes the MIS type diode. That is, the wide gap thin film is composed of a material having a wide gap as compared with the energy gap of the above semi-conductive region. The wide gap thin film is not necessarily required to be an insulating thin film so long as the above requirement is satisfied. When the above semi-conductive region is formed of silicon (Si), the wide gap thin film can be composed of a semi-conductive material having an energy gap of at least 2.2 eV. That is, the material constituting the wide gap thin film may be a material having an energy gap approximately twice or more the energy gap of the semi-conductive region (Si in the above case) constituting the extending portion of the channel forming region of the first transistor or the other source/drain region of the third transistor. The wide gap thin film may have a multi-layered structure or may have a composition which varies in the thickness direction. The wide gap thin film includes an $SiO_2$ or SiON film having a thickness of 5 nm or less and an SiN film having a thickness of 9 nm or less.

The junction-field-effect transistor (JFET), the first junction-field-effect transistor or the second junction-field-effect transistor in the semiconductor memory cell of the present invention can be formed by (X) optimizing the distance between the facing gate regions of the junction-field-effect transistor, that is, the thickness of the channel region, and (Y) optimizing impurity concentrations of the facing gate regions and the channel region of the junction-field-effect transistor.

It should be noted that if neither the distance between the gate regions (the thickness of the channel region), nor the impurity concentrations of the gate regions and the channel region are optimized, the depletion layer will not be widened, making it impossible to bring the junction-field-effect transistor into an on-state or an off-state. These optimizations need to be carried out by computer simulation or experiments.

The semiconductor memory cell according to any one of the first to third aspects and the fifth to twenty-fourth aspects of the present invention can be formed in a surface region of a semiconductor substrate, formed on an insulating interlayer on a semiconductor substrate, formed in a well formed in a semiconductor substrate, or formed on an electric insulator or an insulating interlayer, and is preferably formed in a well, or formed on an insulator or an insulating interlayer, or has an SOI structure or a TFT structure, for preventing alpha-particle or neutron induced soft error. The insulator or insulating interlayer is formed not only on a semiconductor substrate but also on a glass or quartz substrate. The semiconductor memory cell according to any one of the first aspect (depending upon the structure), the fourth aspect and the twenty fifth to twenty-ninth aspects of the present invention should have a SOI structure.

The channel forming region or the channel region can be formed from a material such as silicon, silicon-germanium (Si—Ge) or GaAs by using a known process. Each gate of the first transistor, the second transistor and the third transistor can be formed of a material such as a metal; GaAs doped with an impurity at a high concentration; silicon, amorphous silicon, polysilicon doped with an impurity; a silicide; or a polyside, by using a known process. An insulating interlayer to cover the first transistor, the second transistor and the third transistor can be formed of a material such as $SiO_2$, $Si_3N_4$, $Al_2O_3$ or GaAlAs by using a known process. Each region can be formed of silicon, amorphous silicon or polysilicon doped with an impurity, a silicide, a two-layer structure having a silicide layer and a semi-conductive layer, silicon-germanium (Si—Ge) or GaAs doped with an impurity at a high concentration by using a known process, depending upon characteristics required. The semi-conductive layer can be formed of a material such as silicon, silicon-germanium or GaAs.

In the semiconductor memory cell of the present invention, each gate of the first transistor and the second transistor is connected to the first line for memory cell selection (for example, word line). It is therefore sufficient to provide one first line for memory cell selection, so that the chip area can be decreased. When the first transistor for readout and the second transistor for switching are merged into one unit, the semiconductor memory cell of the present invention is also beneficial in terms of reduction in the cell area and leakage current.

The semiconductor memory cell, according to any one of the fourth aspect and the twenty fifth to twenty-ninth aspects of the present invention, is also beneficial in terms of reduction in the cell area, since the gate of the first transistor and the gate of the second transistor are faced to each other through the semiconductor layer.

In the semiconductor memory cell of the present invention, one source/drain region of the second transistor (the first or second region) corresponds to the channel forming region of the first transistor. Further, the other source/drain region of the second transistor (the third region) is connected to the write-in information setting line. And, when the on- and off-states of the first transistor and the second transistor can be controlled by properly selecting a potential in the first line for memory cell selection (for example, word line). That is, when the potential in the first line for memory cell selection is set at a potential as high enough to bring the second transistor into an on-state at a write-in time, the second transistor is brought into an on-state, and whereby an electric charge is charged or accumulated in a capacitor formed between the first region and the second region in the second transistor depending upon the potential in the write-in information setting line. As a result, the information is stored in the channel forming region (the first or second region) of the first transistor as a potential difference between the first region and the second region or as an electric charge. When the information is read out, the potential or the electric charge (the information) stored or accumulated in the channel forming region of the first transistor is converted to a potential difference between the channel forming region (the first or second region) and the other source/drain region (the fourth region) in the first transistor, or is converted to an electric charge, and, the threshold voltage of the first transistor seen from the gate of the first transistor varies depending upon the electric charge (information). When the information is read out, therefore, the on/off operation of the first transistor can be controlled by applying a properly selected potential to the gate of the first transistor. That is, the information can be read out by detecting the operation state of the first transistor.

Further, the semiconductor memory cell of the present invention has the MIS type diode. The MIS type diode will be explained with reference to a case where one end of the MIS type diode is formed of an extending portion of the channel forming region of the first transistor. When a proper bias is applied between two ends of the MIS type diode, which proper bias is to cause a potential difference between the potential in the electrode constituting the other end of the MIS type diode and the potential of the band end in the surface of the extending portion (semi-conductive region) of the channel forming region of the first transistor constituting one end of the MIS type diode to be equal to, or higher than, the band gap of a material forming the above semiconductive region, carrier multiplication takes place due to carriers which are tunnel-transited from the electrode and implanted in the surface of the extending portion of the channel forming region of the first transistor, thereby to cause a high-current state. For details, see, for example, Y. Hayashi, "Switching phenomena in thin-insulator metal-insulator-semiconductor diodes", Appl. Phys. Lett. 37(4), Aug. 15, 1980. In other words, high-energy carriers are implanted from the other end to one end of the MIS type diode depending upon the potential or charge (information) of the channel forming region (first region or second region) of the first transistor, and carrier multiplication takes place. And, the channel forming region is supplied with carriers having the same conductivity type (polarity) as that of the channel forming region on the basis of the above carrier multiplication, and as a result, the first potential which is an information potential stored in the channel forming region (first region or second region) of the first transistor remains as a potential close to the first potential which is the original information potential in the channel forming region (first region or second region) of the first transistor, without approaching to the predetermined potential. When the information potential (second potential) in the extending portion of the channel forming region of the first transistor has a level close to the level of the potential in the electrode of the MIS type diode, majority carriers in the extending portion of the channel forming region of the first transistor are transited to the electrode on the basis of the tunnel transition, the potential in the extending portion of the channel forming region of the first transistor approaches to the potential in the electrode and is held at the second potential. Therefore, the semiconductor memory cell of the present invention does not require so-called refreshing operation unlike the case of a DRAM.

Moreover, the memory cell according to any one of the fifth to twenty-ninth aspects of the present invention is provided with the junction-field-effect transistor in addition to the first transistor having the first conductivity type and the second transistor having the second conductivity type. Since the on/off operation of the junction-field-effect transistor is controlled when the information is read out, a large margin can be assured for the current which flows in the source/drain regions of the first transistor. As a result, the number of semiconductor memory cells that can be connected to, for example, the second line is hardly limited. Further, when the third transistor for current control is provided, the on/off operations of the third transistor is controlled when the information is read out. As a result, a remarkably large margin can be consistently assured for the current which flows in the source/drain regions of the first transistor. Therefore, the number of semiconductor memory cells connectable to, for example, the second line becomes further less liable to be limited.

Further, when the diode is provided, it is not required to form a line to be connected to one source/drain region of the first transistor. When the third region is composed of semiconductor having a conductivity type opposite to that of the second or first region, the diode is a pn junction diode. Such a pn junction diode can be formed by properly setting impurity concentrations in the regions constituting the pn junction diode. If a potential to be applied to the regions constituting the pn junction diode or the design of the impurity concentrations of the regions constituting the pn junction diode is not proper, there is possibility that carriers implanted from the diode may latch up the semiconductor memory cell. That is, if a voltage applied to the write-in information setting line is not a low degree of voltage (0.4 volt or lower in a case of a pn junction) at which no large forward current flows in the junction portion of the third region and the first or second region at a write-in time, there is possibility that latch-up takes place. The above problem can be overcome, for example, by a method described above in which the diode-constituting region is formed in a surface region of the first or second region, a material such as a silicide, a metal or a metal compound is used to constitute the diode-constituting region, and the junction between the diode-constituting region and the first or second region is formed as a junction in which majority carrier mainly constitutes a forward current like in a Schottky junction. That is, the diode-constituting region is composed of a silicide layer, a metal layer formed of Mo, Al or the like, or a metal compound layer, and thus, a majority carrier-diode such as a Schottky junction type which is conducted with majority carrier is formed. The diode-constituting region may be composed of a material in common with that constituting the write-in information setting line, such as titanium silicide or TiN used as a barrier layer or a glue layer. That is, the semiconductor memory cell preferably has a configuration in which the diode-constituting region is formed in the surface region of the first or second region and has a common region with part of the write-in information setting line, that is, the diode-constituting region and part of the write-in information setting line are fabricated in common. The configuration in which the diode-constituting region has a common region with part of the write-in information setting line includes a configuration in which the diode-constituting region is composed of a compound formed by reacting a material for a wiring with silicon (Si) in a silicon semiconductor substrate. Otherwise, the material constituting the diode-constituting region can be composed of a materials which make an ISO-type hetero-junction. The term of "ISO-type hetero-junction" means a hetero-junction which is formed between two dissimilar semiconductors having the same conductivity type (see S. M. Sze, "Physics of Semiconductor Devices", 2nd edition, pp. 122, John Wiley & Sons). The ISO-type hetero-junction is formed when the diode-constituting region is composed of semiconductor which is different in the material from the first or second region but has the same conductivity as that of the first or second region.

BRIEF DESCRIPTION OF THE DRAWINGS

FIG. 17B, show schematic partial cross-sectional views of a semiconductor substrate, etc., for explaining the method of manufacturing the semiconductor memory cell of Example 1.

FIG. 18B, show schematic partial cross-sectional views of a semiconductor substrate, etc., for explaining the method of manufacturing the semiconductor memory cell of Example 1.

FIG. 33B, show schematic partial cross-sectional views of a semiconductor substrate, etc., for explaining the method of manufacturing the semiconductor memory cell of Example 3.

FIG. 34B, show schematic partial cross-sectional views of a semiconductor substrate, etc., for explaining the method of manufacturing the semiconductor memory cell of Example 3.

FIG. 35B, show schematic partial cross-sectional views of a semiconductor substrate, etc., for explaining the method of manufacturing the semiconductor memory cell of Example 3.

FIG. 36B, shows a schematic partial cross-sectional view of a semiconductor substrate, etc., for explaining the method of manufacturing the semiconductor memory cell of Example 3.

FIG. 120 shows a schematic partial cross-sectional view of a variant of the semiconductor memory cell of Example 10.

FIG. 121 shows a schematic partial cross-sectional view of a variant of the semiconductor memory cell of Example 10.

FIG. 122 shows a schematic partial cross-sectional view of a variant of the semiconductor memory cell of Example 10.

FIG. 123 shows a schematic partial cross-sectional view of a variant of the semiconductor memory cell of Example 10.

FIG. 124 shows a schematic partial cross-sectional view of a variant of the semiconductor memory cell of Example 10.

FIG. 125 shows a schematic partial cross-sectional view of a variant of the semiconductor memory cell of Example 10.

FIG. 126 shows the principle of a variant of the semiconductor memory cell according to the sixth aspect of the present invention.

FIGS. 127A and 127B show the principles of variants of the semiconductor memory cell according to the sixth aspect of the present invention.

FIG. 128 shows a schematic partial cross-sectional view of a semiconductor memory cell of Example 11.

FIG. 129 shows a schematic partial cross-sectional view of a variant of the semiconductor memory cell of Example 11.

FIG. 130 shows a schematic partial cross-sectional view of a variant of the semiconductor memory cell of Example 11.

FIG. 131 shows a schematic partial cross-sectional view of a variant of the semiconductor memory cell of Example 11.

Figure 132:
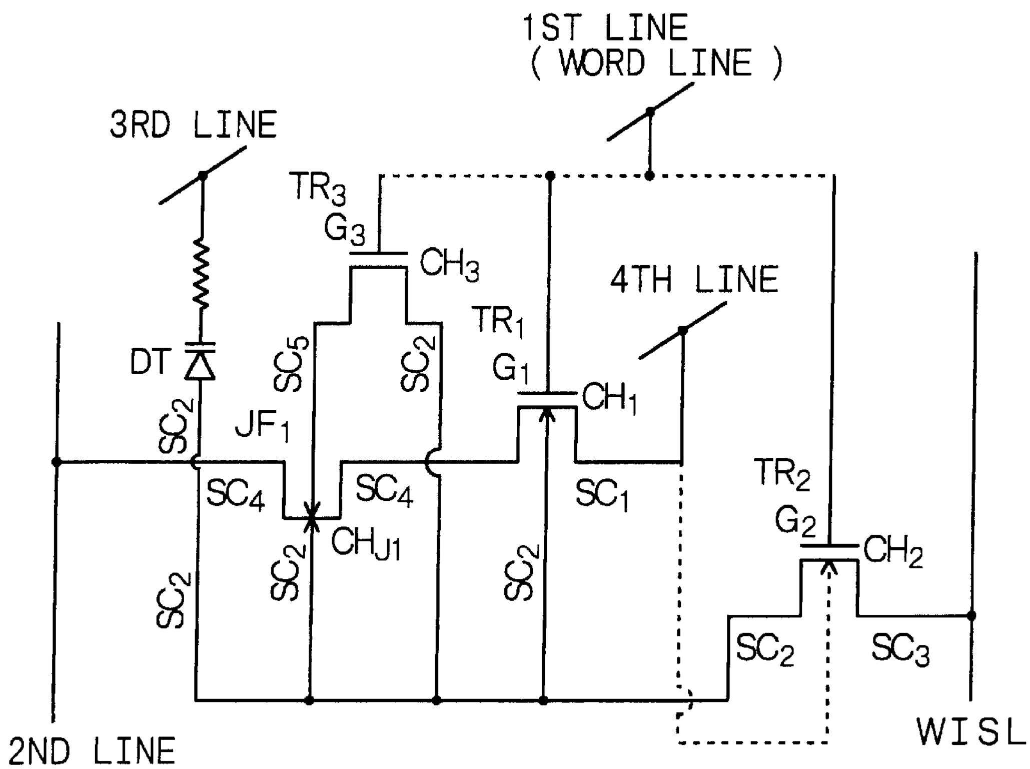

FIG. 132 shows the principle of the semiconductor memory cell according to the seventh aspect of the present invention.

Figure 133A:
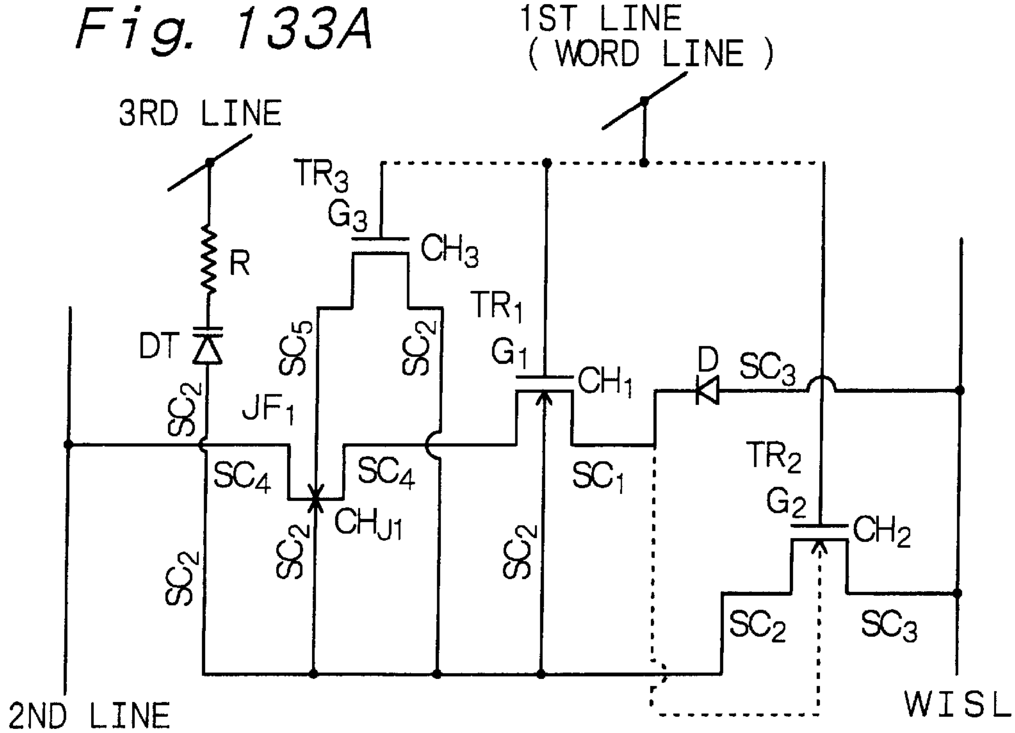
Figure 133B:
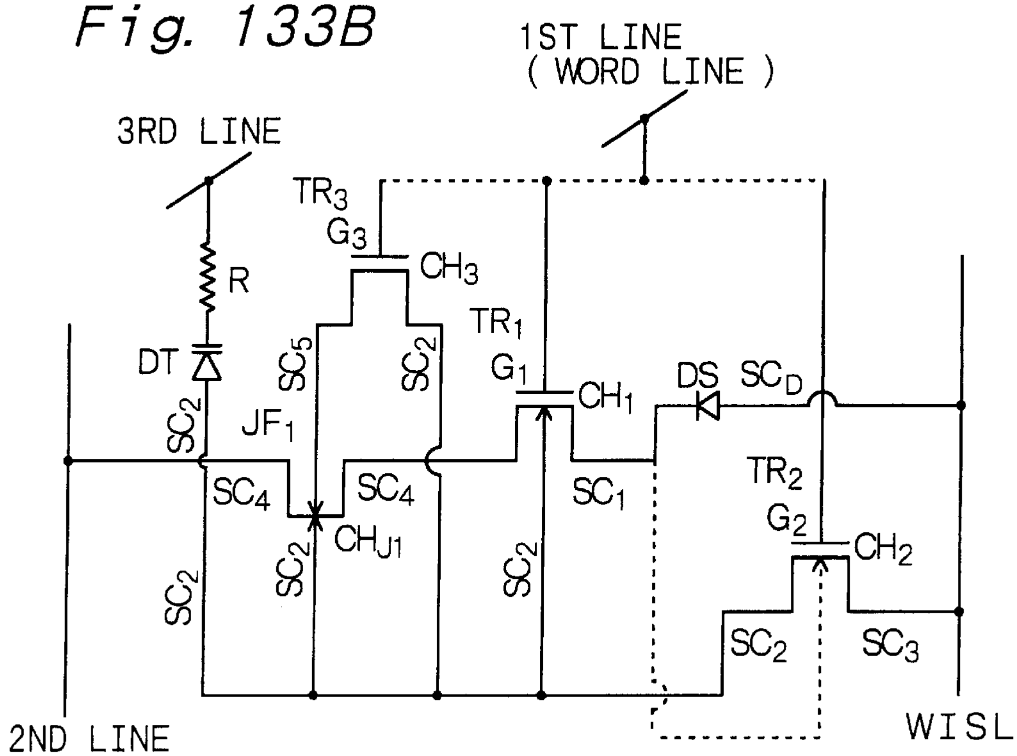

FIGS. 133A and 133B show the principles of variants of the semiconductor memory cell according to the seventh aspect of the present invention.

Figure 134:
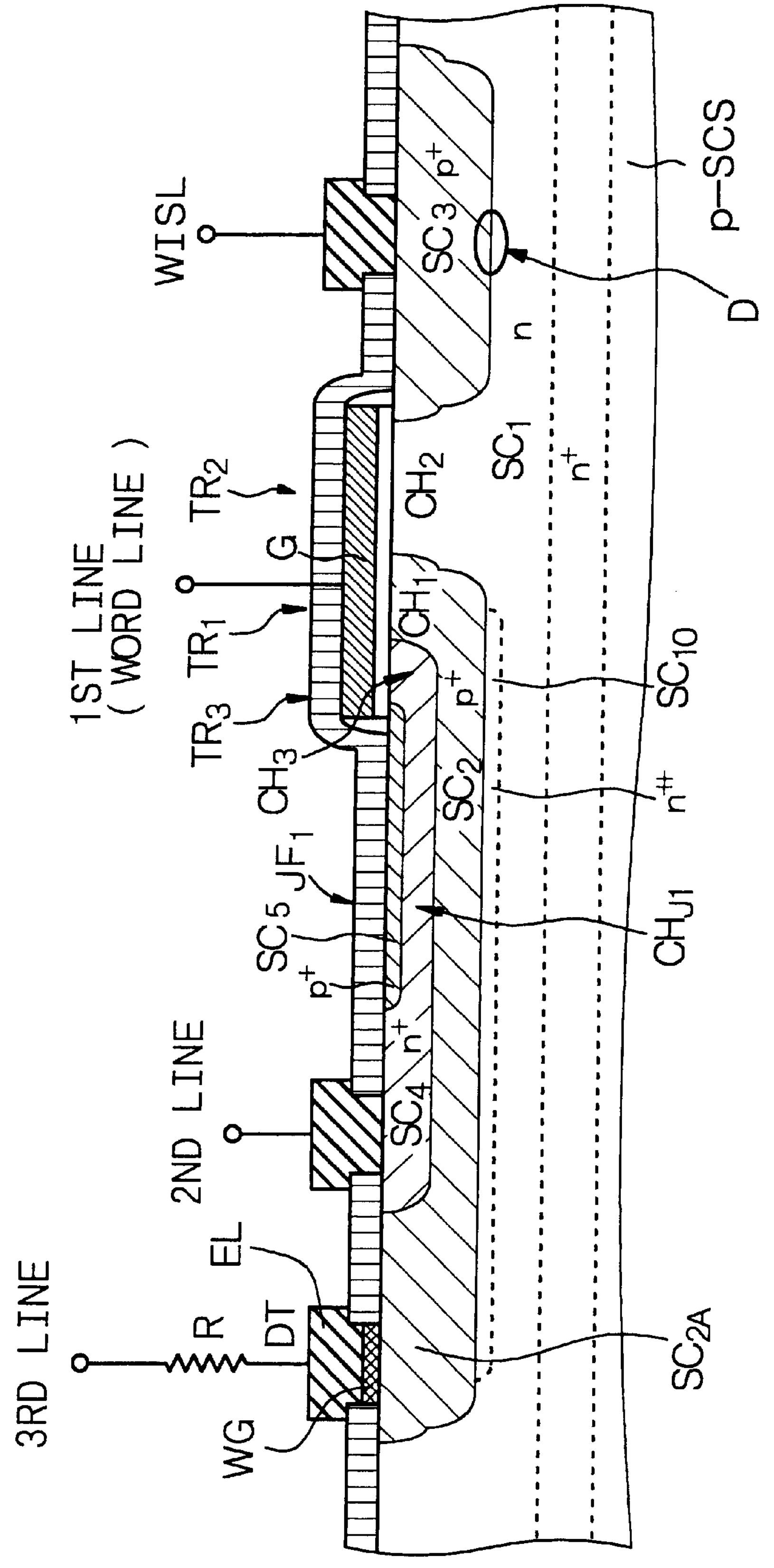

FIG. 134 shows a schematic partial cross-sectional view of a semiconductor memory cell of Example 12.

Figure 135:
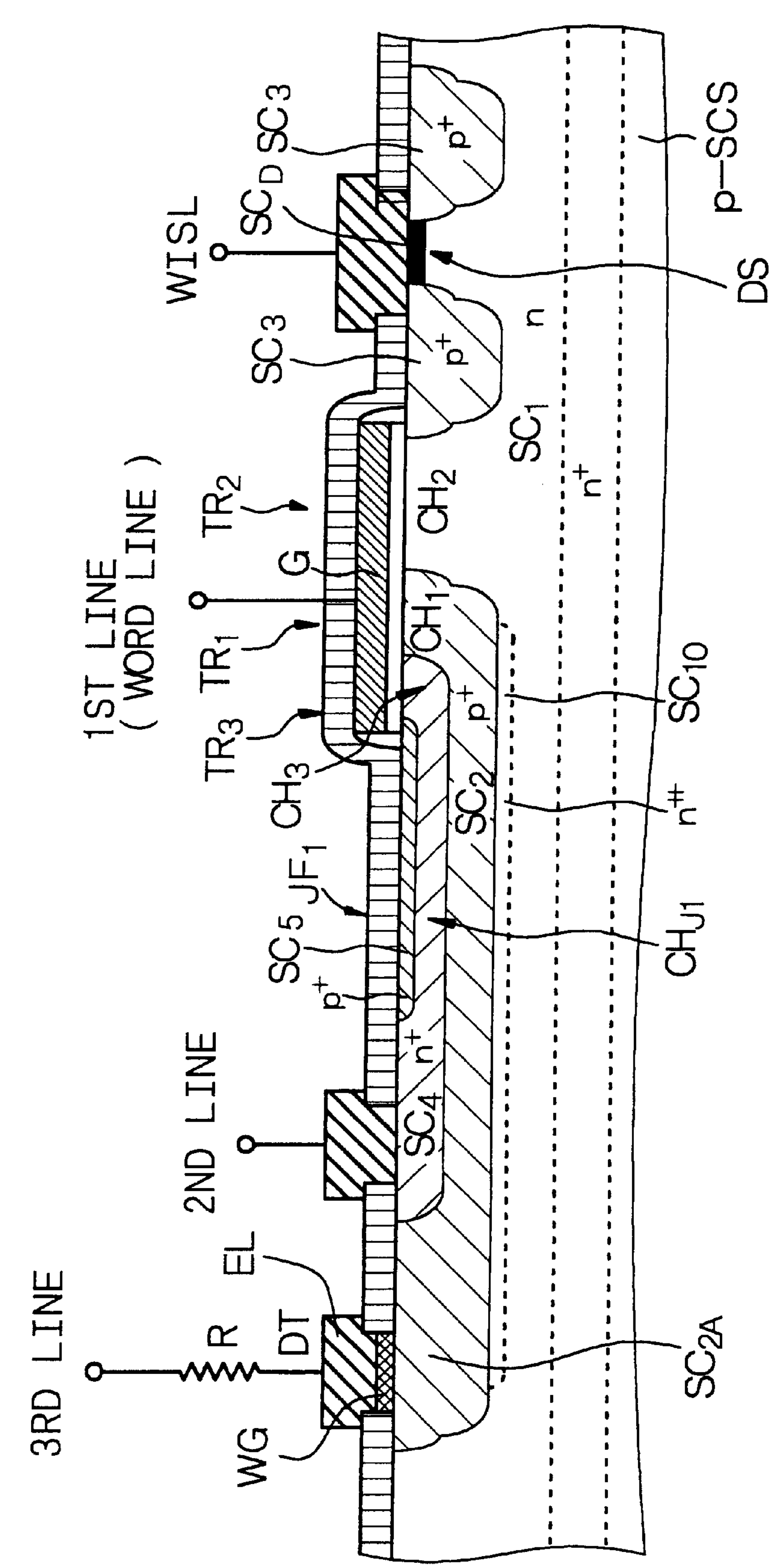

FIG. 135 shows a schematic partial cross-sectional view of a variant of the semiconductor memory cell of Example 12.

Figure 136:
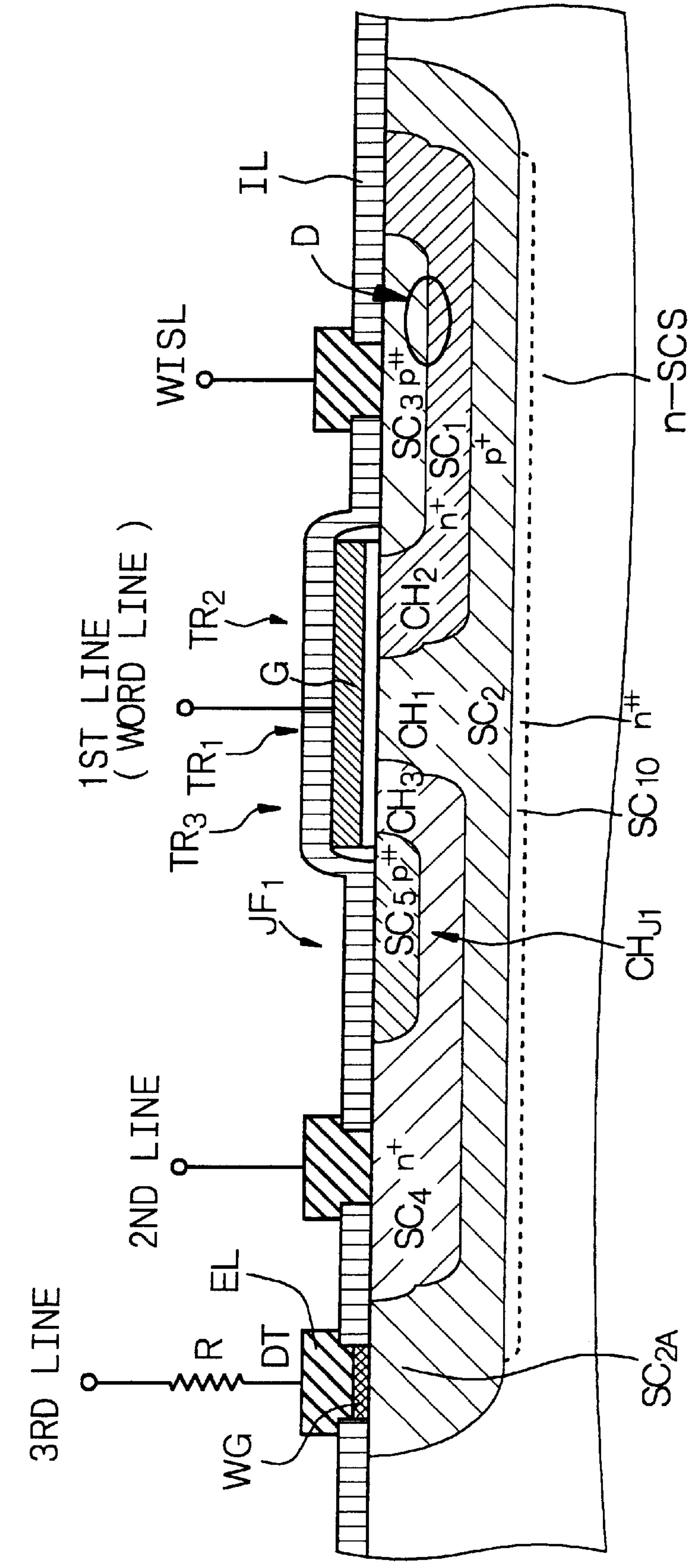

FIG. 136 shows a schematic partial cross-sectional view of a variant of the semiconductor memory cell of Example 12.

Figure 137:
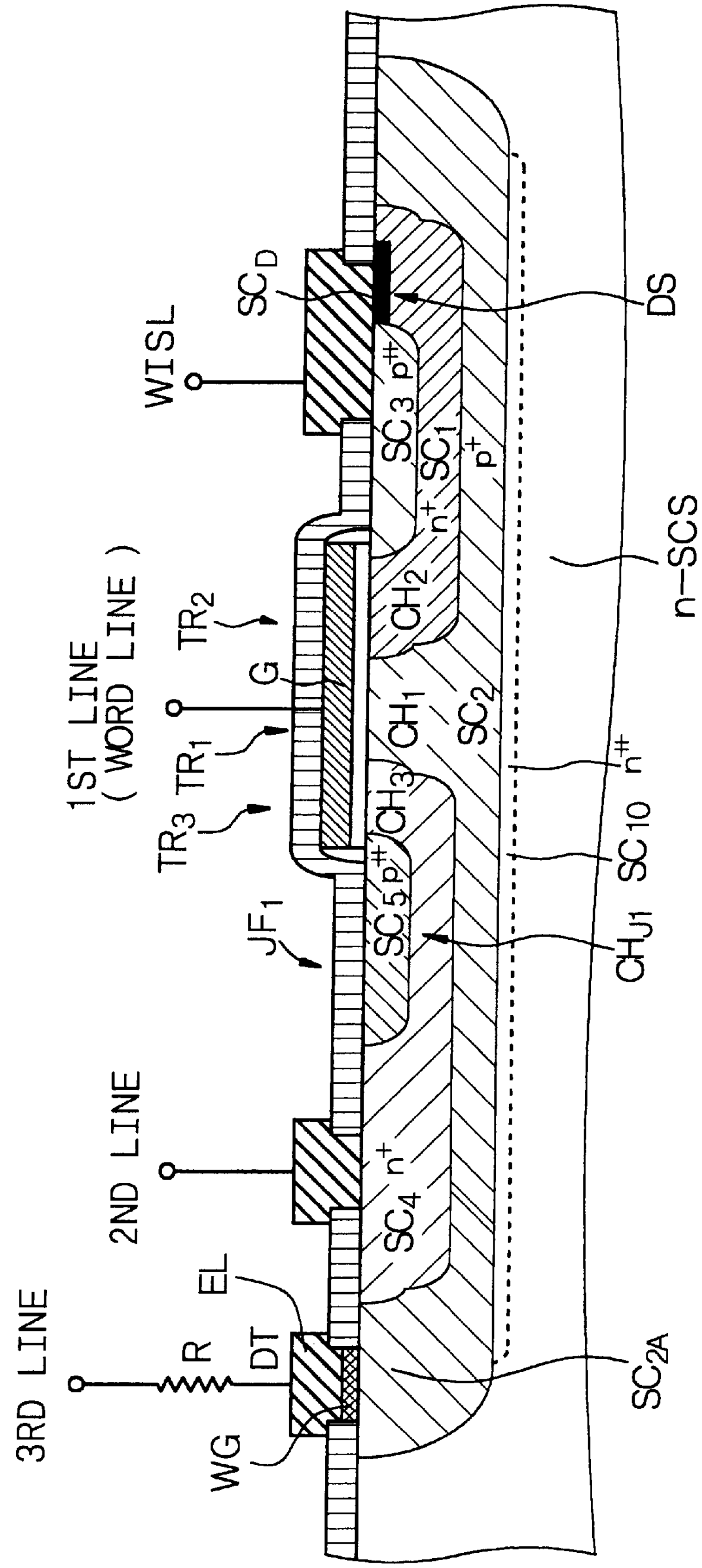

FIG. 137 shows a schematic partial cross-sectional view of a variant of the semiconductor memory cell of Example 12.

Figure 138:
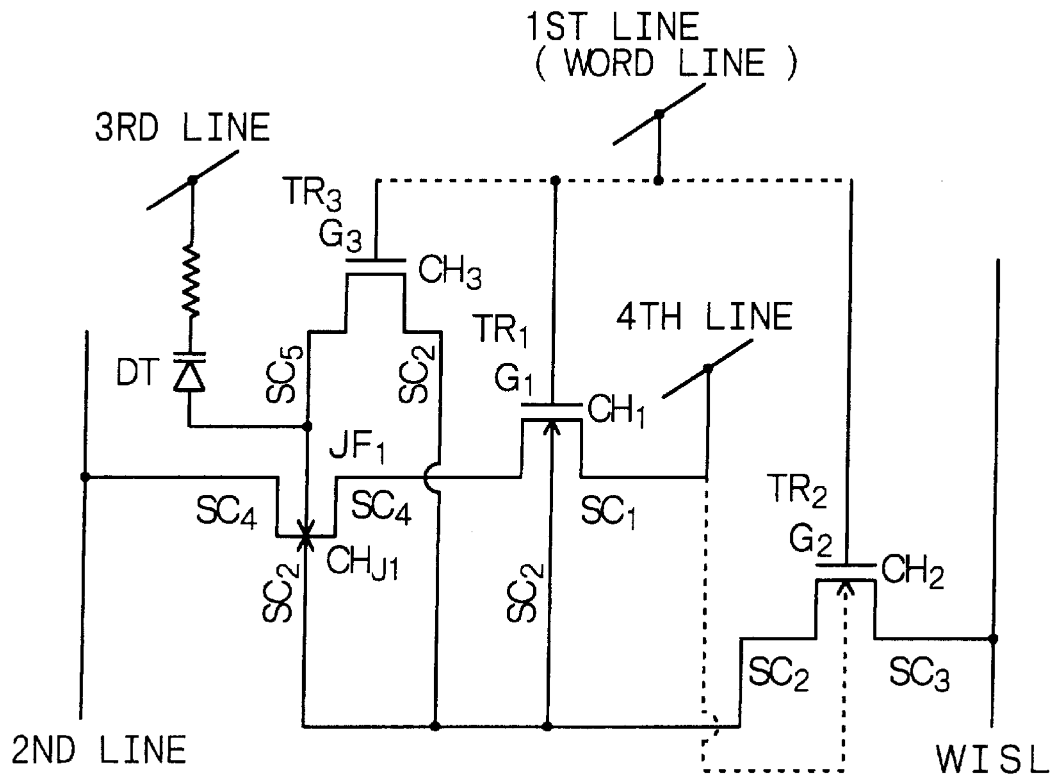

FIG. 138 shows the principle of the semiconductor memory cell according to the eighth aspect of the present invention.

Figure 139A:
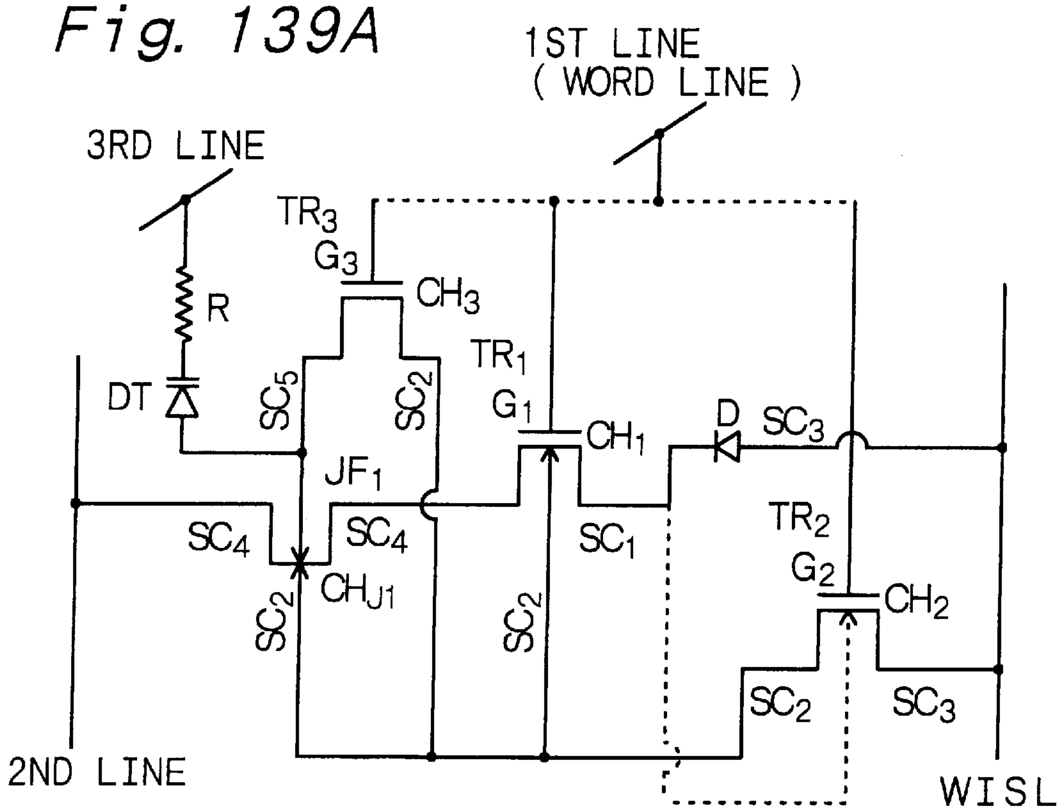
Figure 139B:
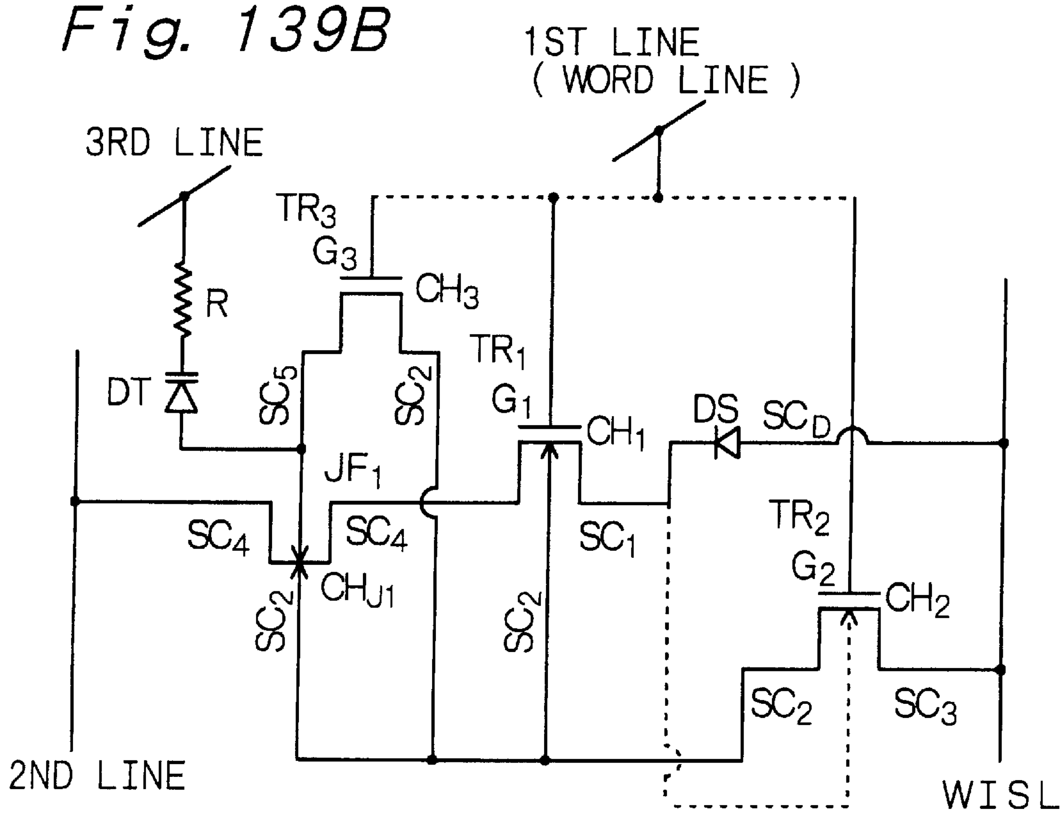

FIGS. 139A and 139B show the principles of variants of the semiconductor memory cell according to the eighth aspect of the present invention.

Figure 140:
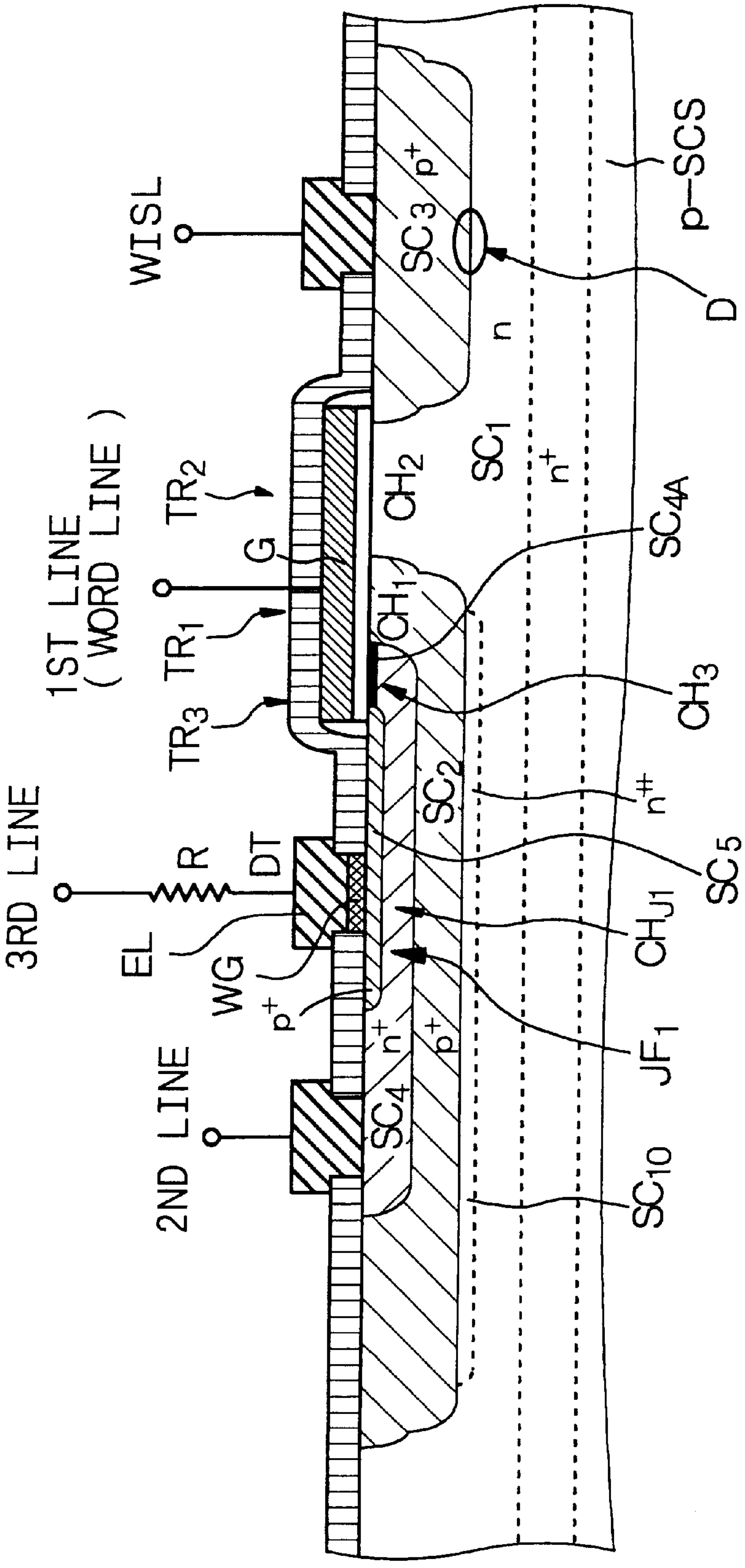

FIG. 140 shows a schematic partial cross-sectional view of a semiconductor memory cell of Example 13.

Figure 141:
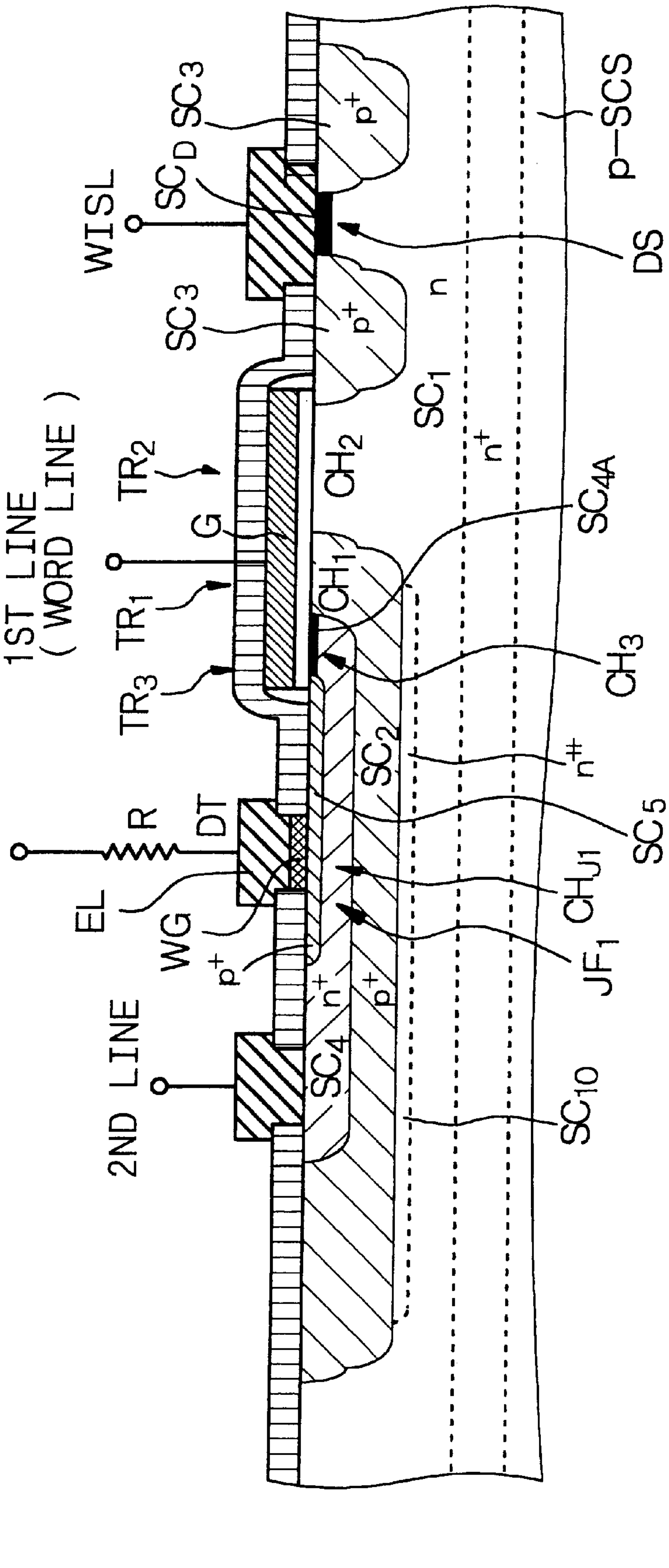

FIG. 141 shows a schematic partial cross-sectional view of a variant of the semiconductor memory cell of Example 13.

Figure 142:
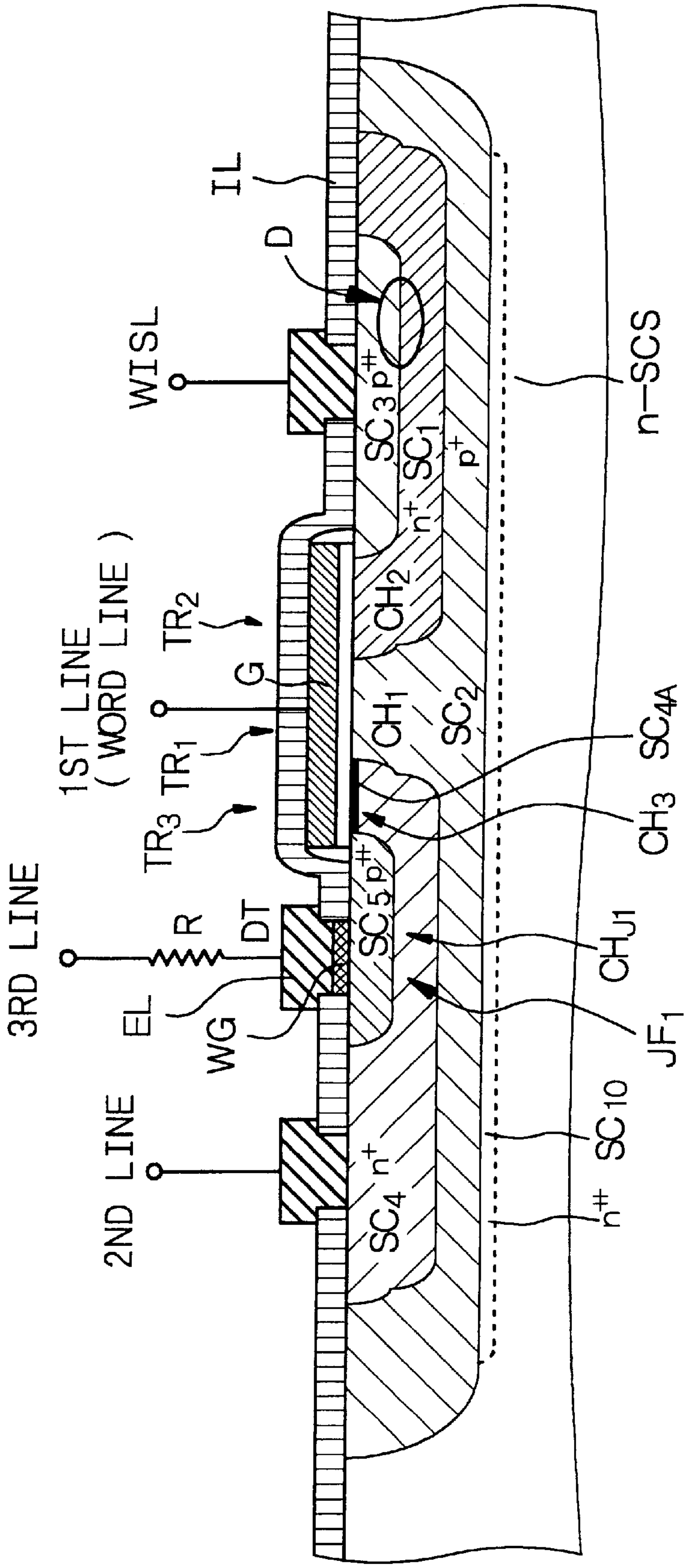

FIG. 142 shows a schematic partial cross-sectional view of a variant of the semiconductor memory cell of Example 13.

Figure 143:
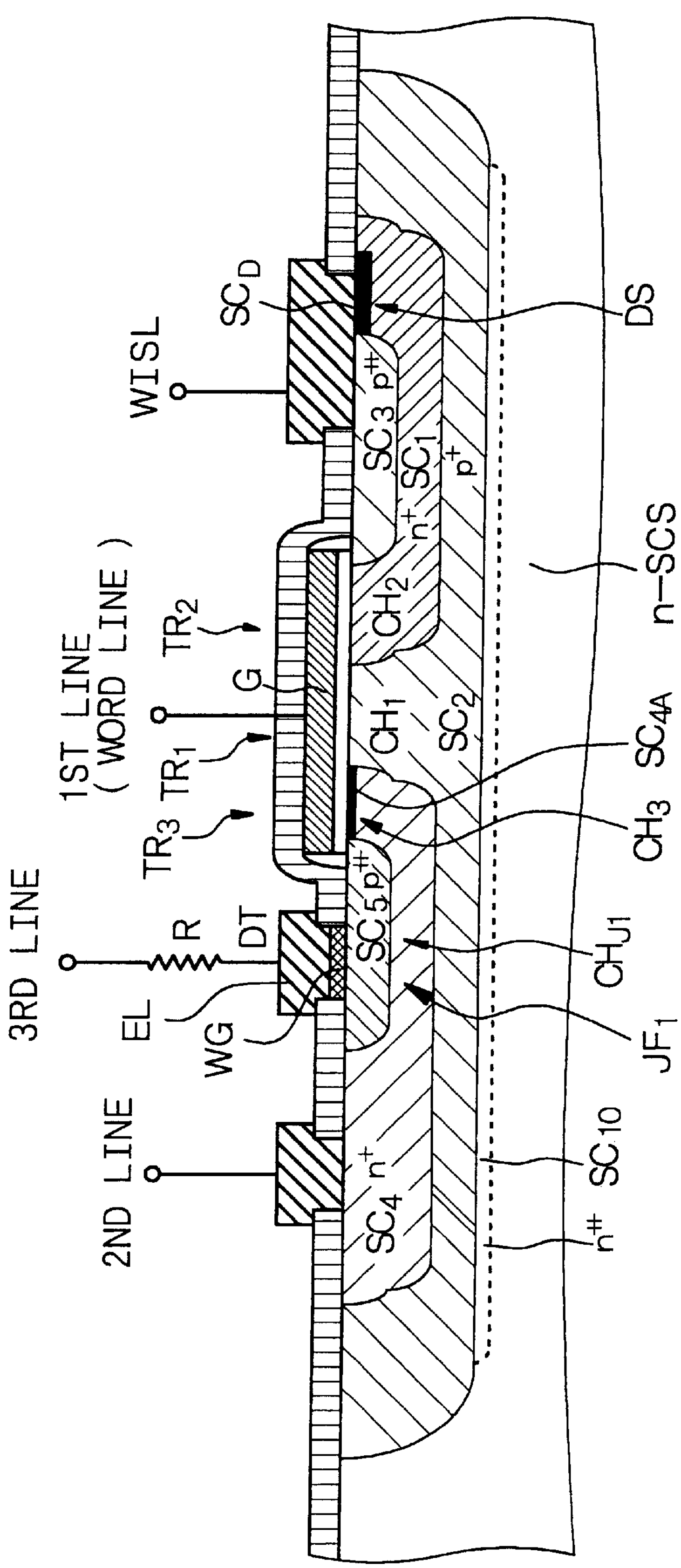

FIG. 143 shows a schematic partial cross-sectional view of a variant of the semiconductor memory cell of Example 13.

Figure 144:
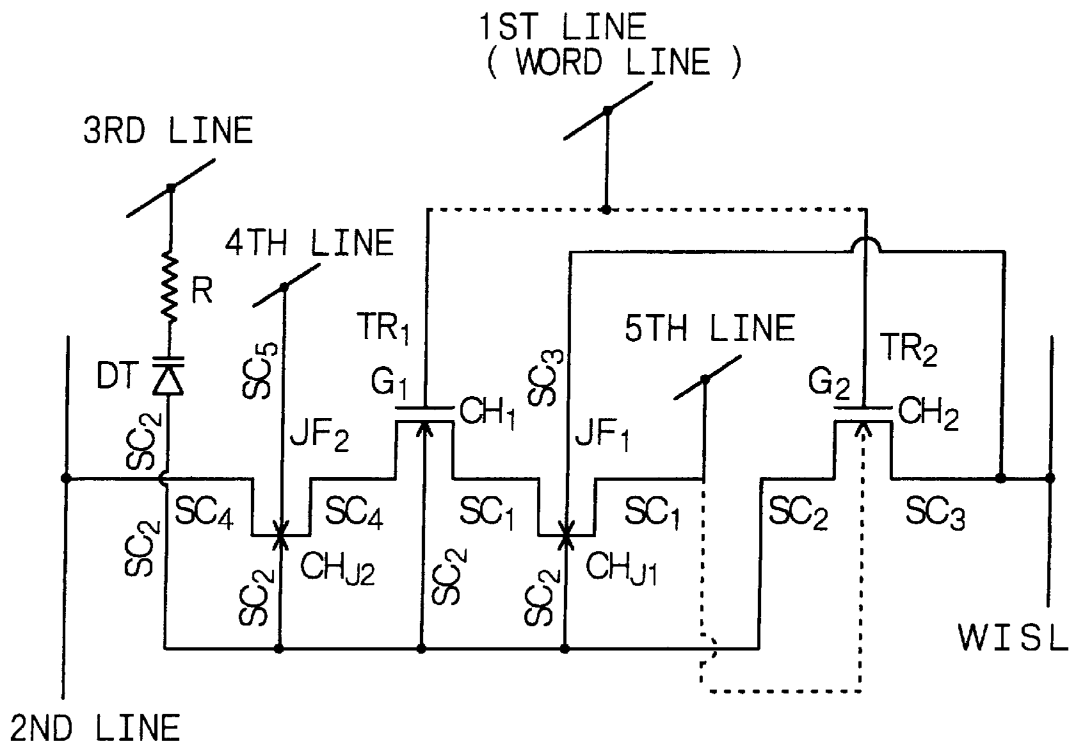

FIG. 144 shows the principle of the semiconductor memory cell according to the ninth aspect of the present invention.

Figure 145A:
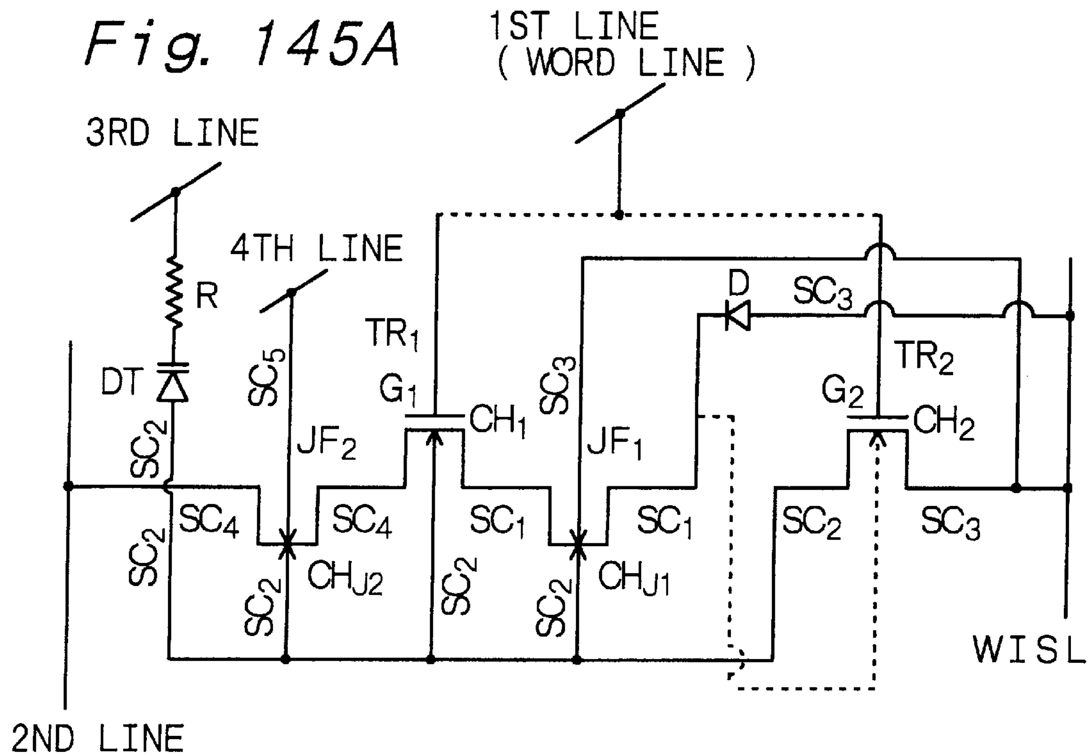
Figure 145B:
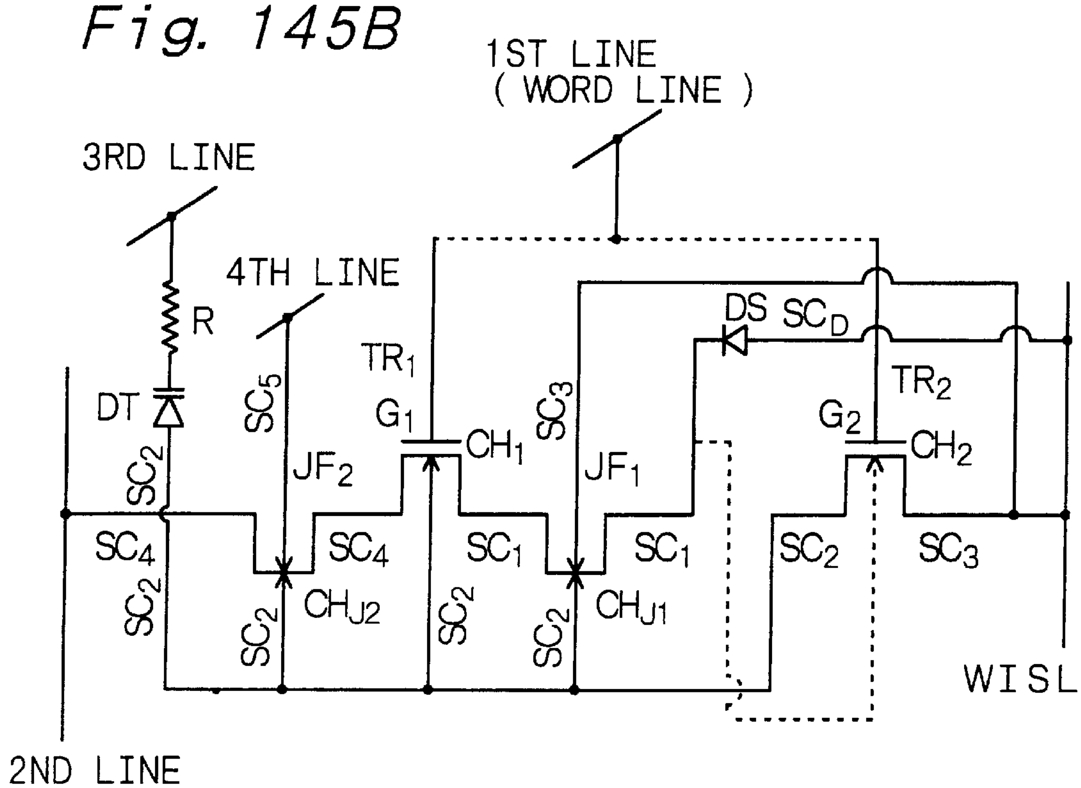

FIGS. 145A and 145B show the principles of variants of the semiconductor memory cell according to the ninth aspect of the present invention.

Figure 146:
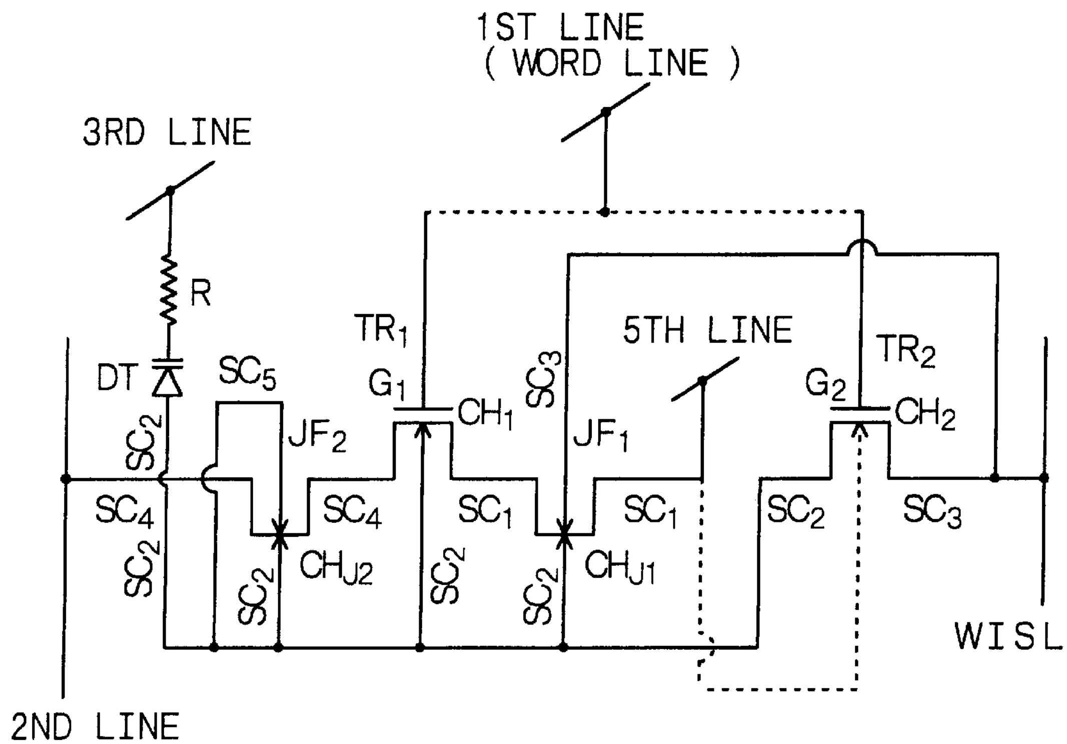

FIG. 146 shows the principle of a variant of the semiconductor memory cell according to the ninth aspect of the present invention.

Figure 147A:
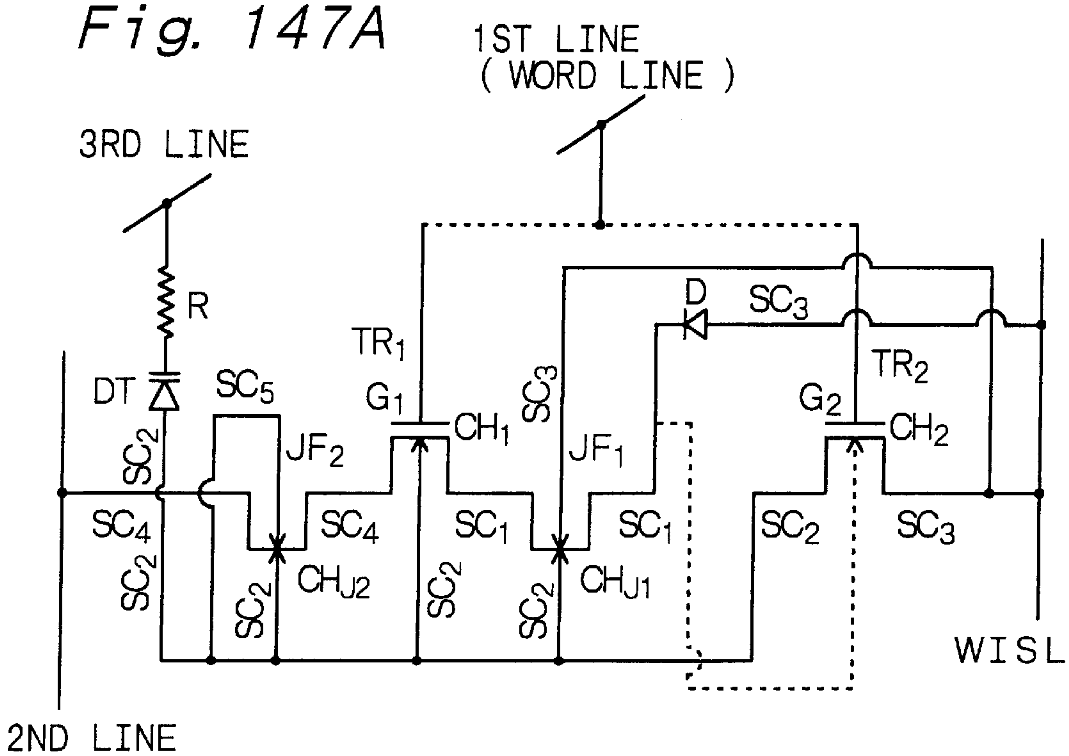
Figure 147B:
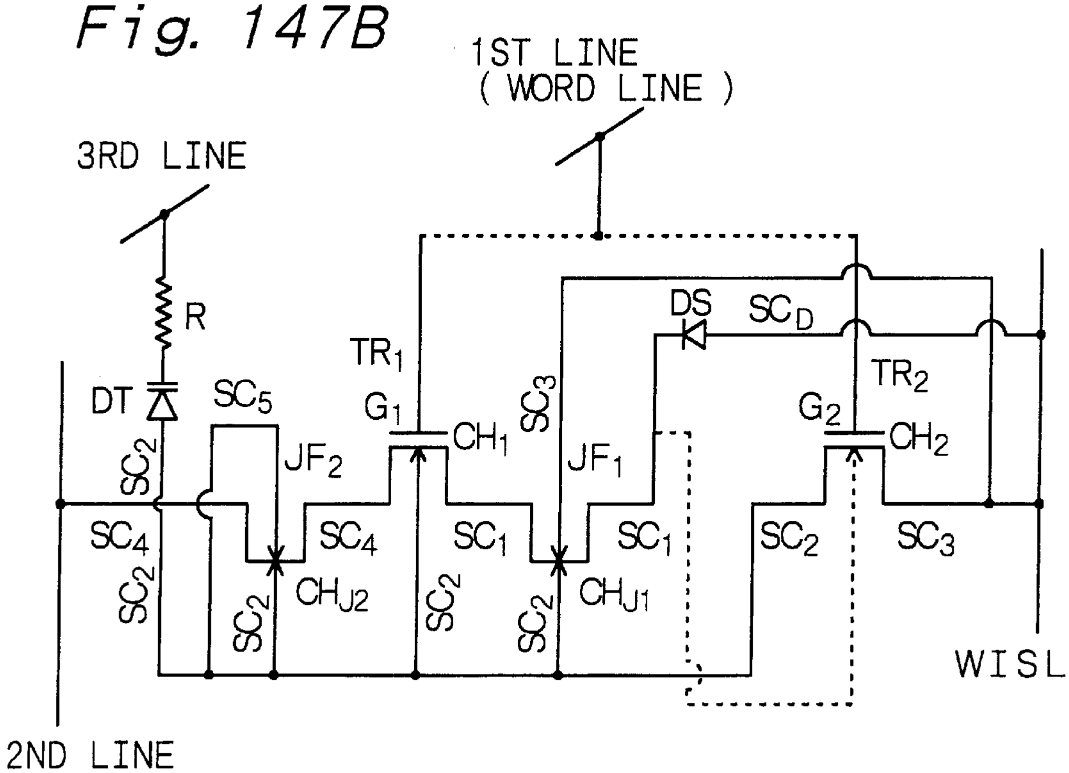

FIGS. 147A and 147B show the principles of variants of the semiconductor memory cell according to the ninth aspect of the present invention.

Figure 148:
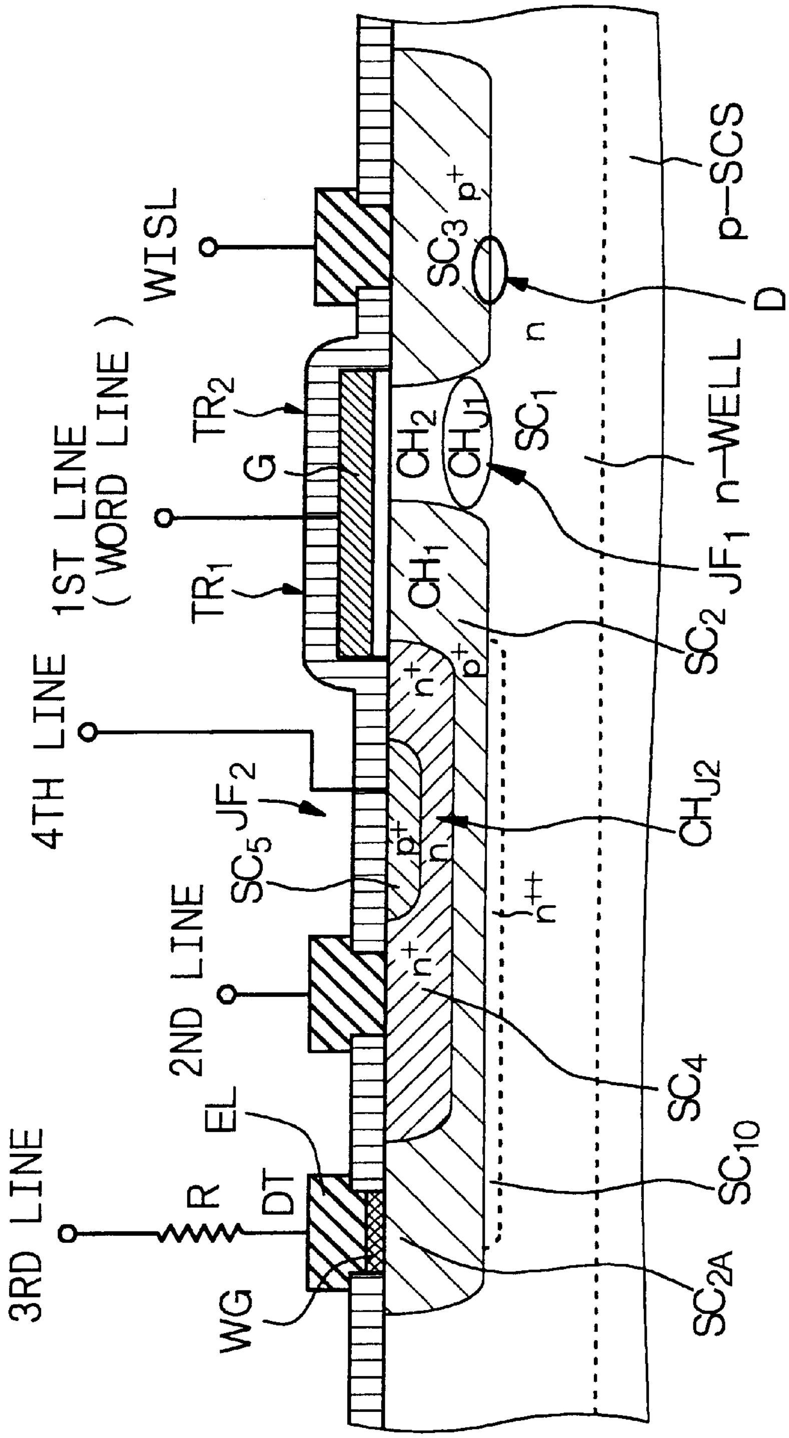

FIG. 148 shows a schematic partial cross-sectional view of a semiconductor memory cell of Example 14.

Figure 149:
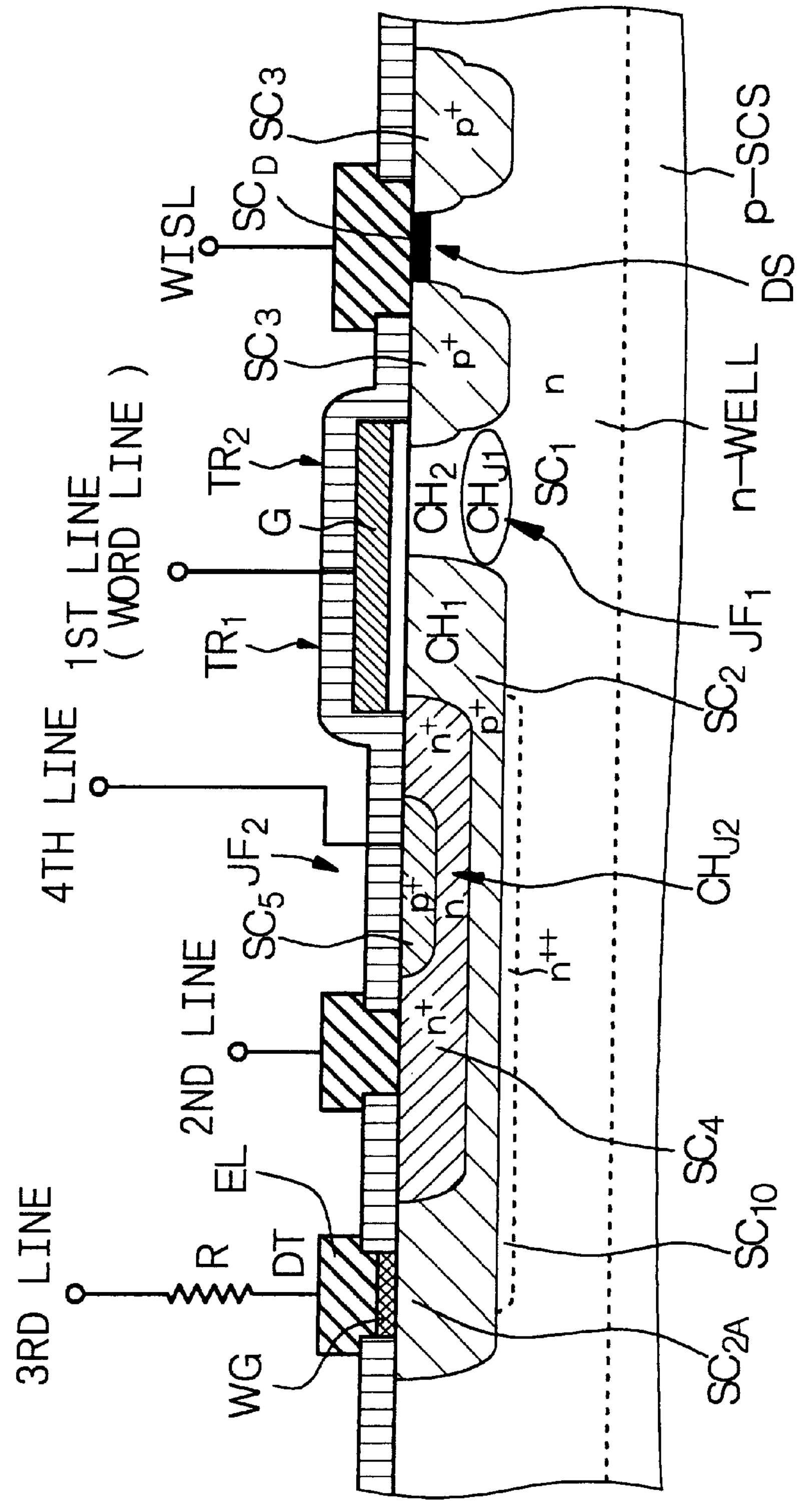

FIG. 149 shows a schematic partial cross-sectional view of a variant of the semiconductor memory cell of Example 14.

Figure 150:
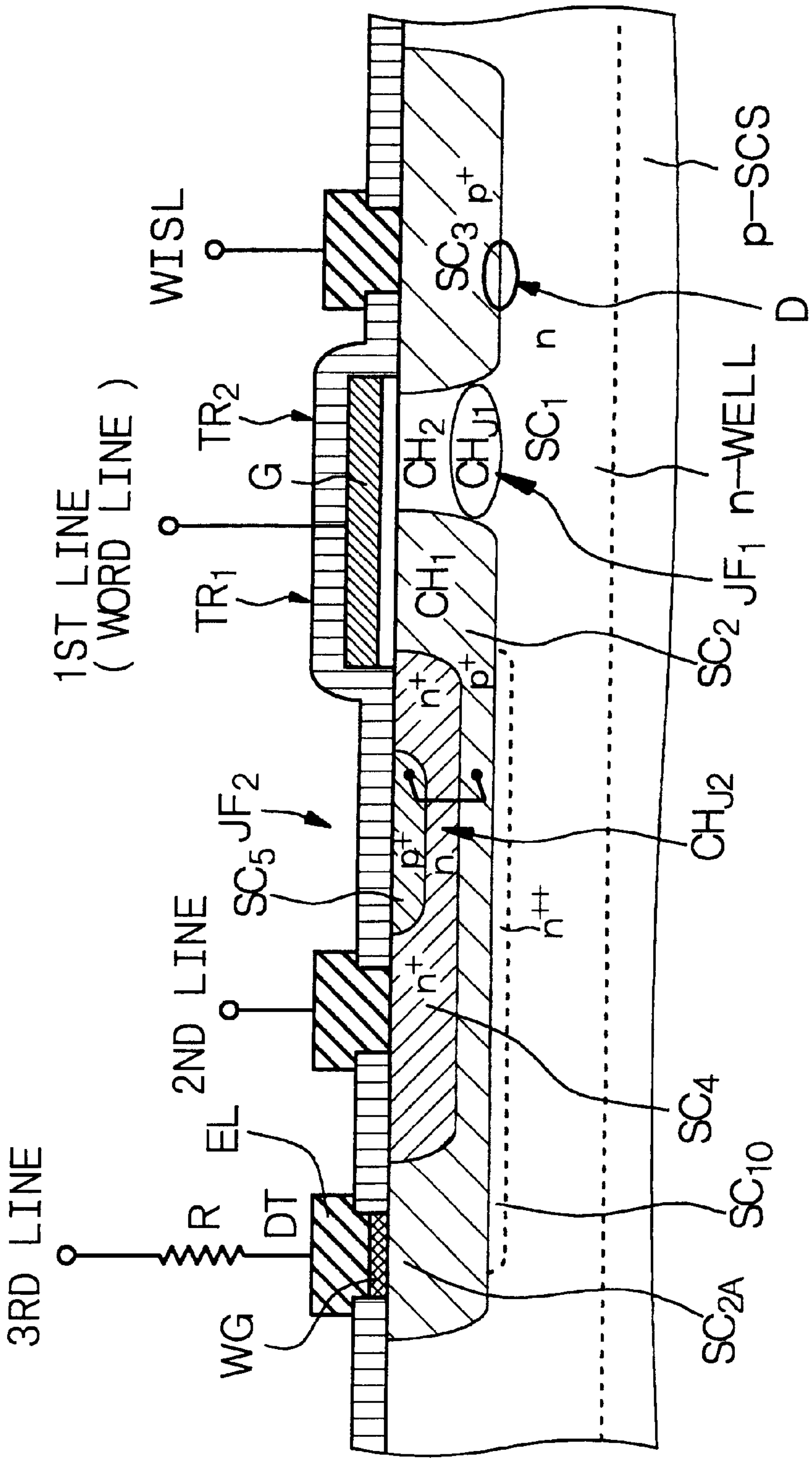

FIG. 150 shows a schematic partial cross-sectional view of a variant of the semiconductor memory cell of Example 14.

Figure 151:
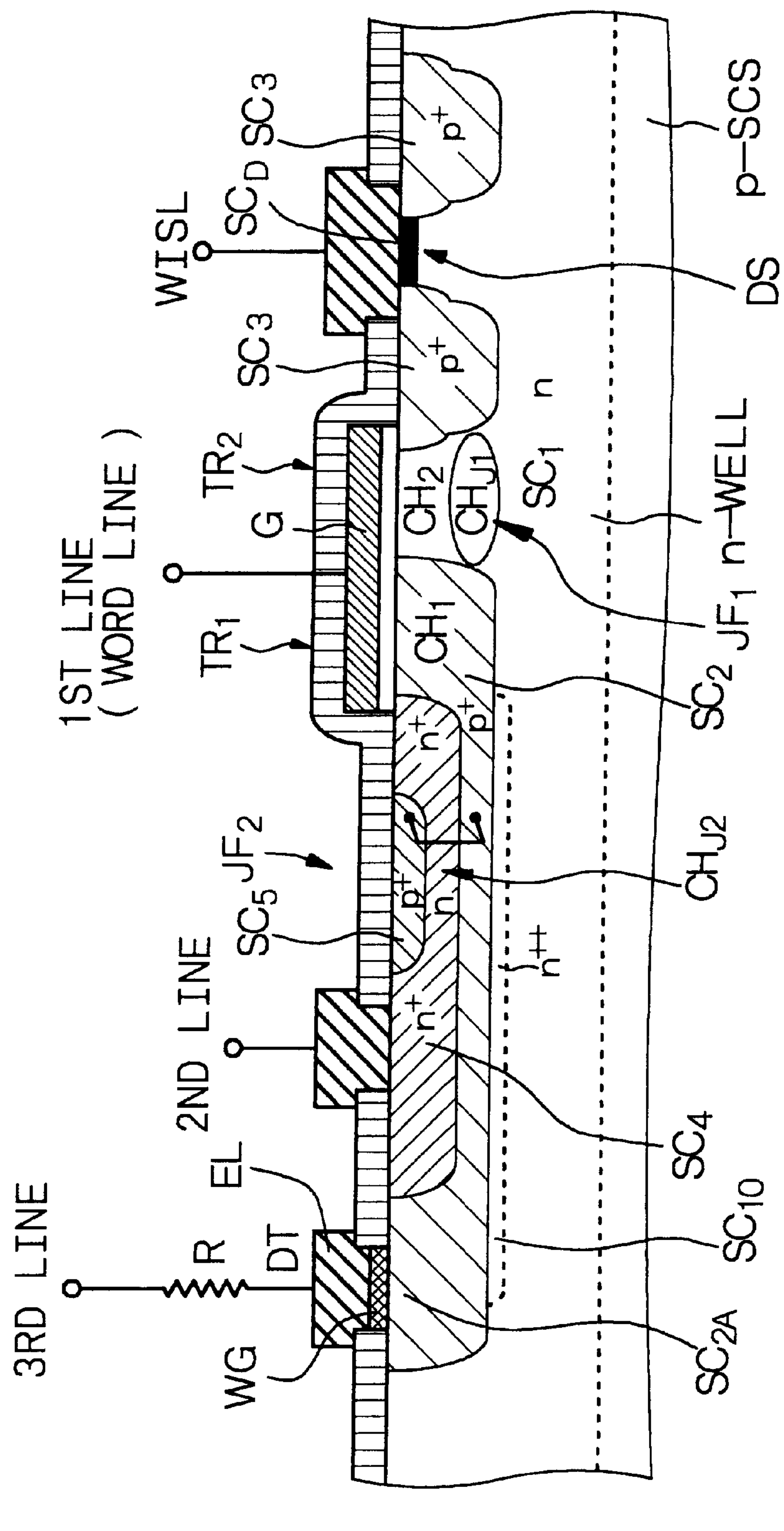

FIG. 151 shows a schematic partial cross-sectional view of a variant of the semiconductor memory cell of Example 14.

Figure 152:
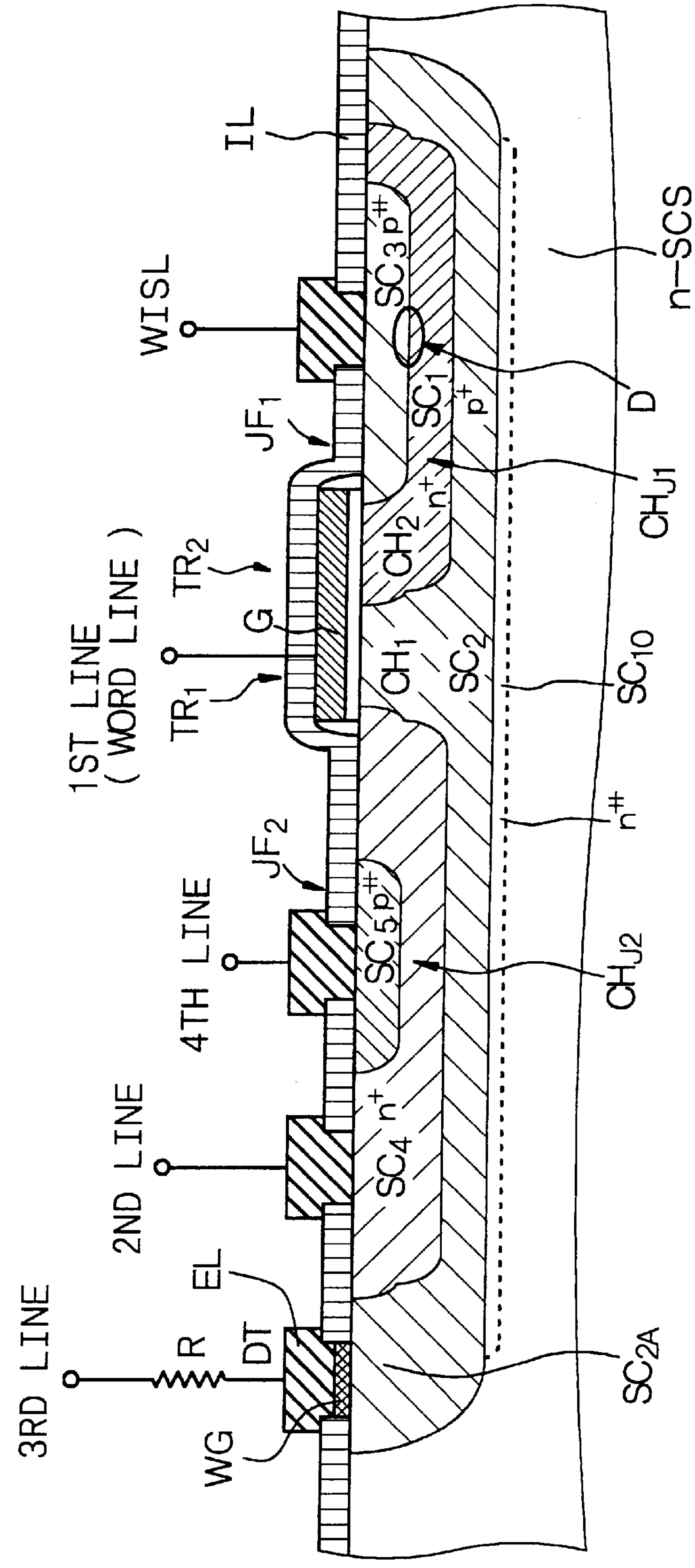

FIG. 152 shows a schematic partial cross-sectional view of a variant of the semiconductor memory cell of Example 14.

Figure 153:
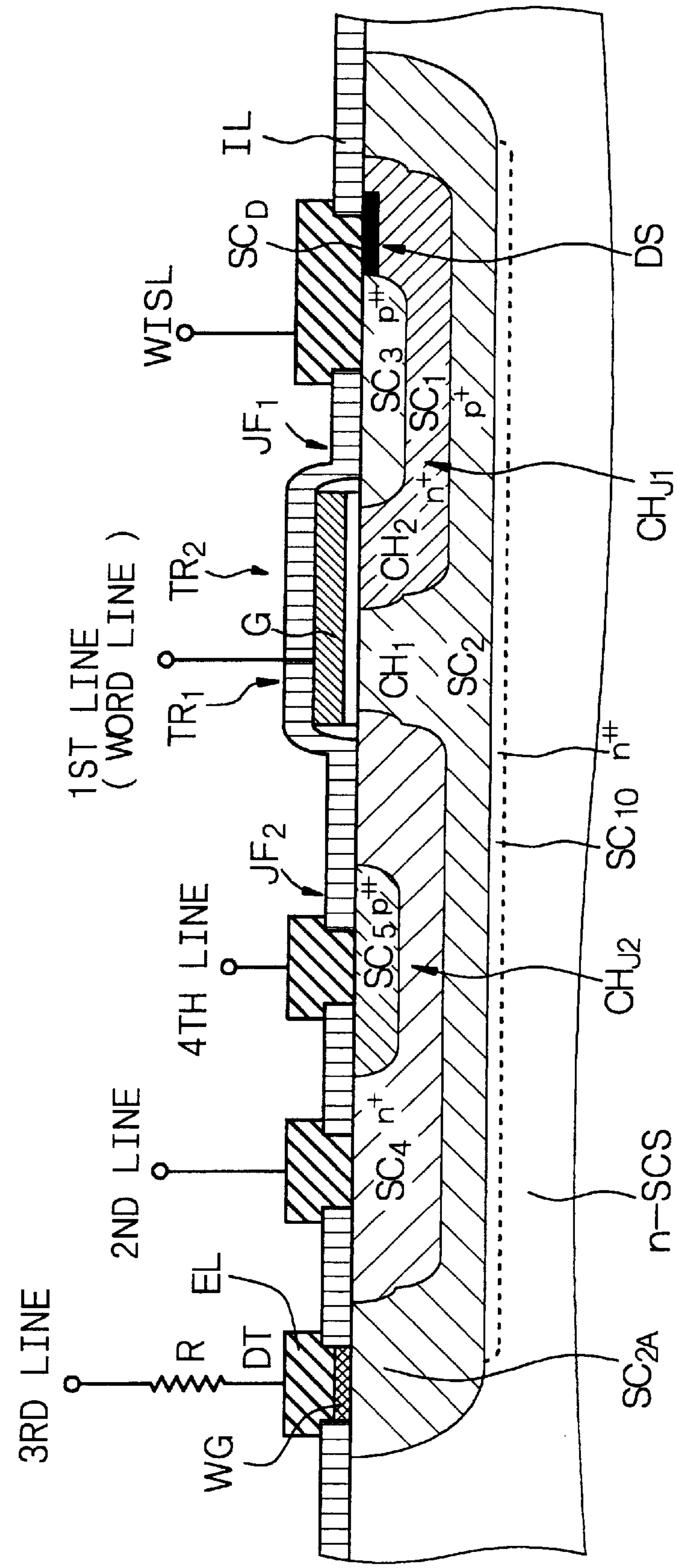

FIG. 153 shows a schematic partial cross-sectional view of a variant of the semiconductor memory cell of Example 14.

Figure 154:
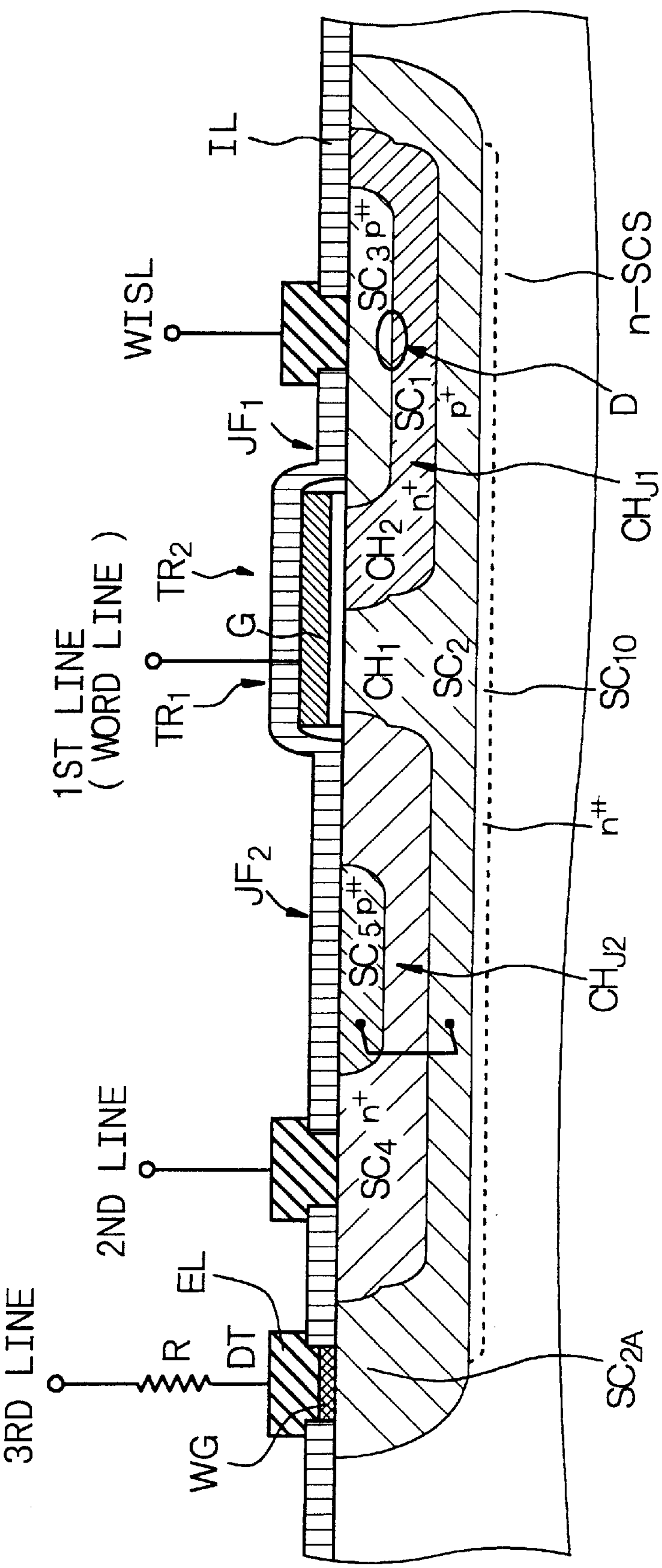

FIG. 154 shows a schematic partial cross-sectional view of a variant of the semiconductor memory cell of Example 14.

Figure 155:
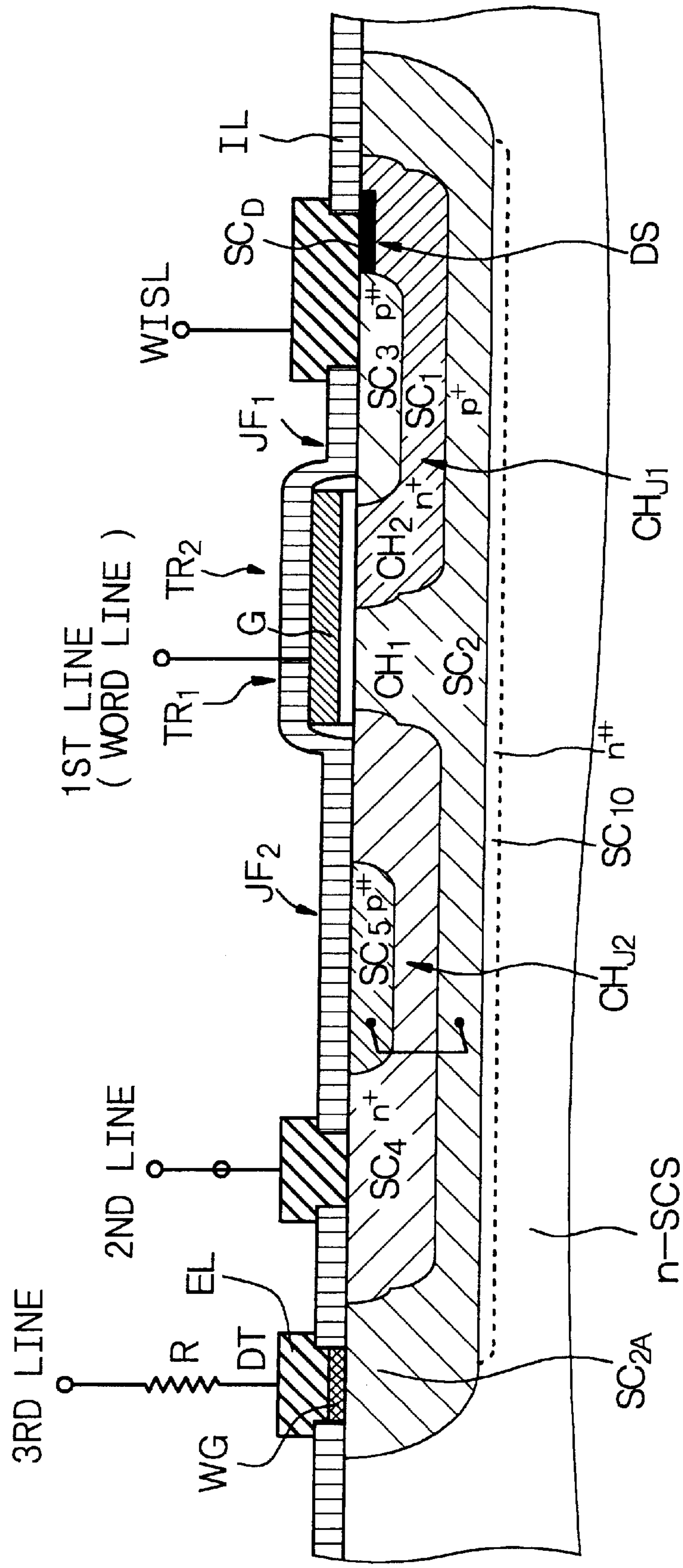

FIG. 155 shows a schematic partial cross-sectional view of a variant of the semiconductor memory cell of Example 14.

Figure 156:
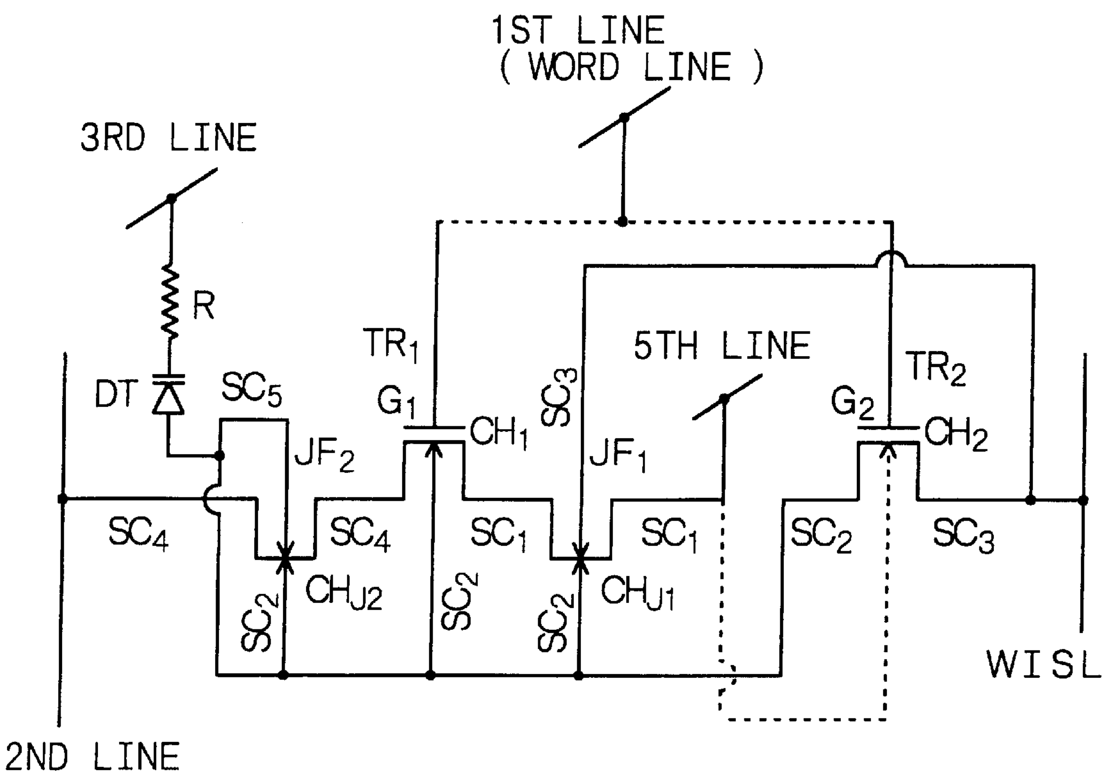

FIG. 156 shows the principle of a variant of the semiconductor memory cell according to the ninth aspect of the present invention.

Figure 157A:
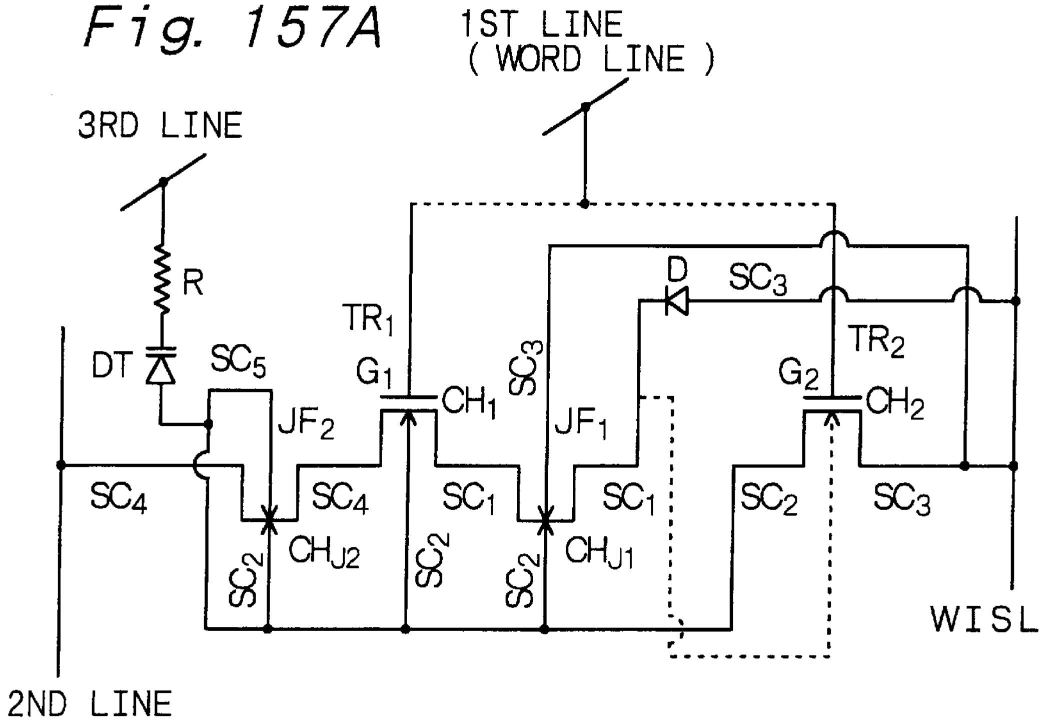
Figure 157B:
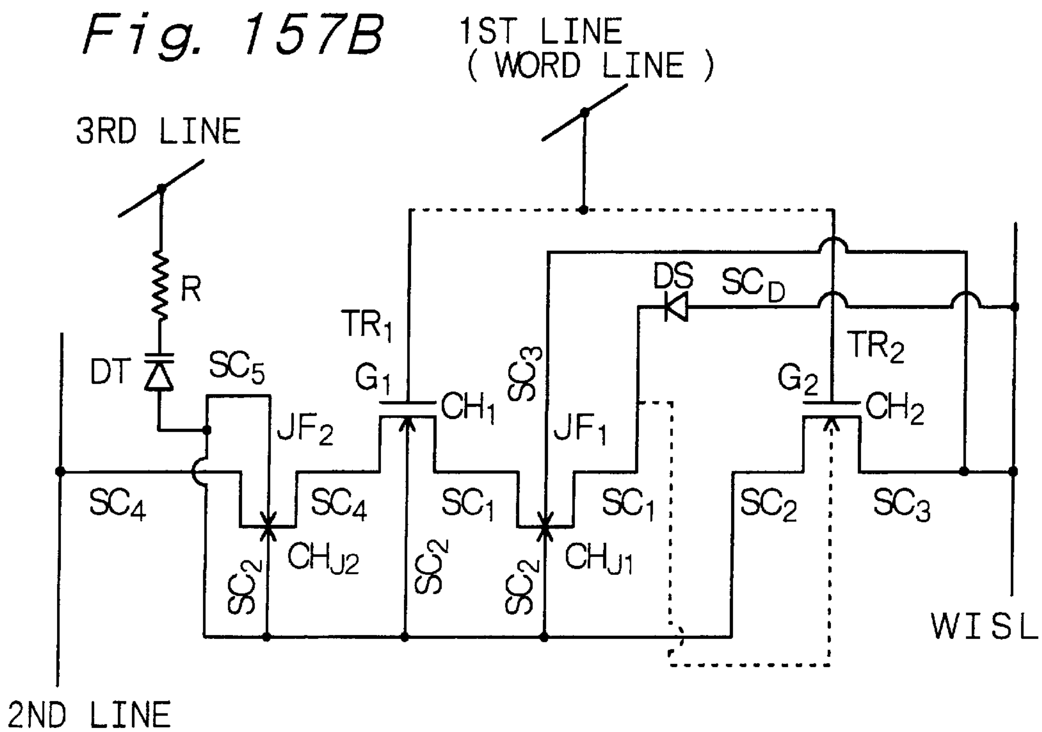

FIGS. 157A and 157B show the principles of variants of the semiconductor memory cell according to the ninth aspect of the present invention.

Figure 158:
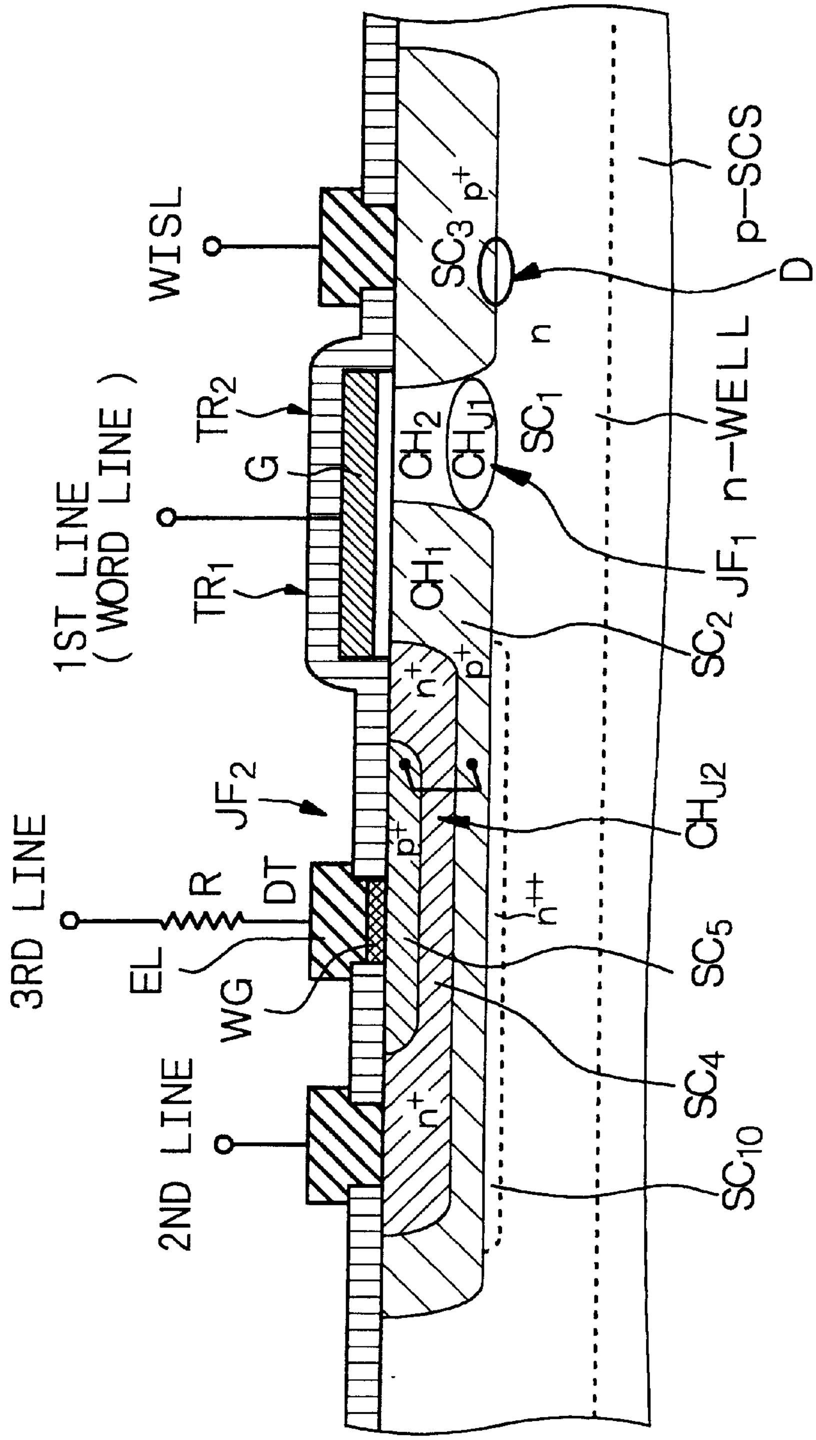

FIG. 158 shows a schematic partial cross-sectional view of a semiconductor memory cell of Example 15.

Figure 159:
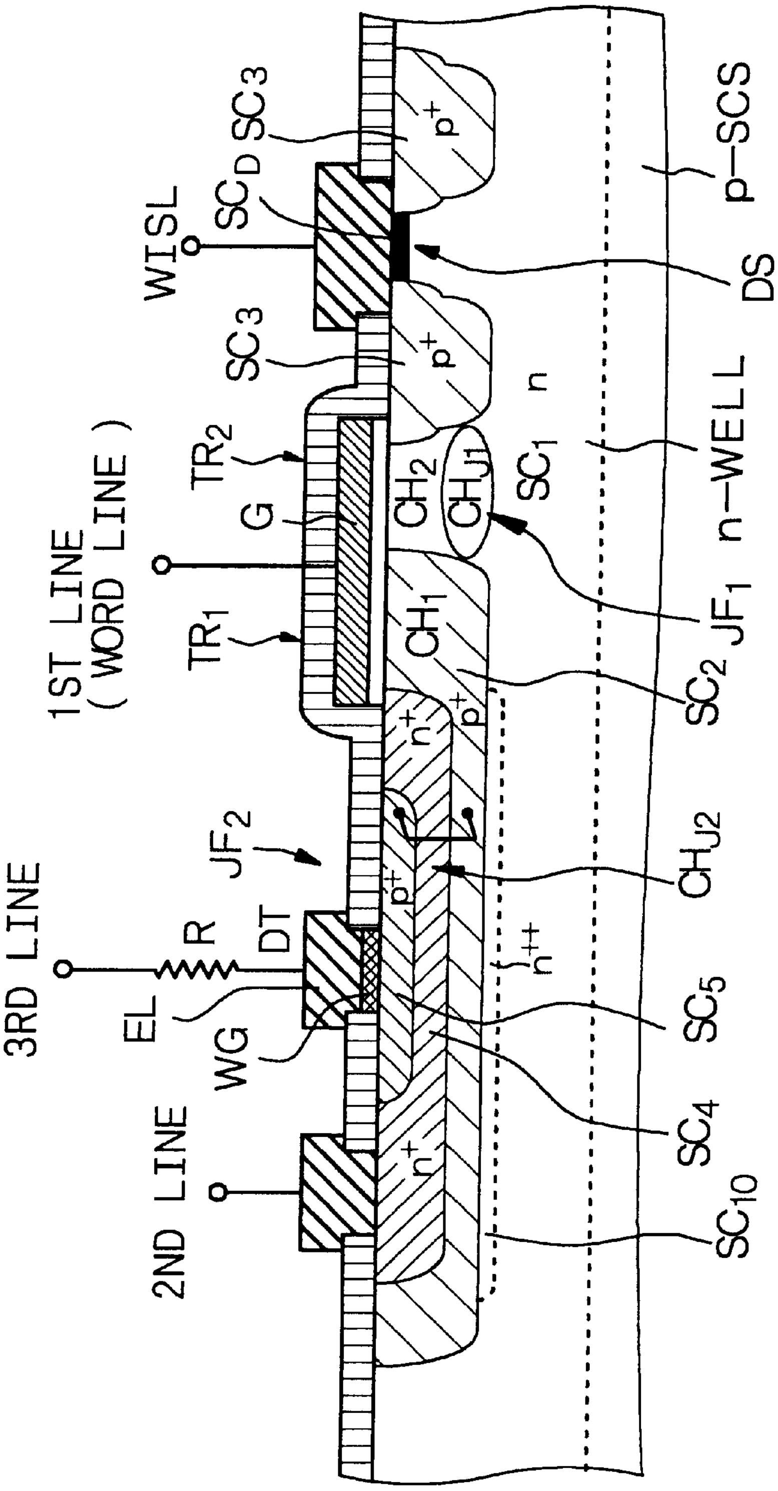

FIG. 159 shows a schematic partial cross-sectional view of a variant of the semiconductor memory cell of Example 15.

Figure 160:
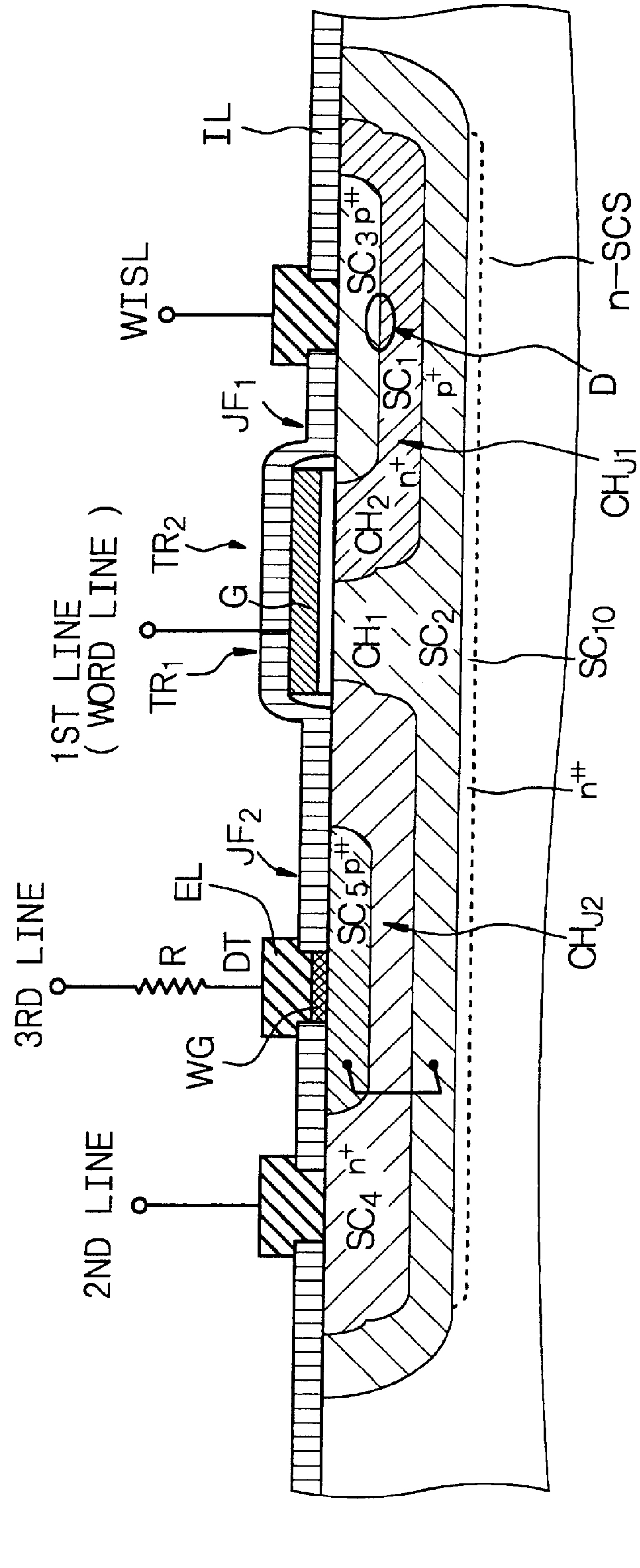

FIG. 160 shows a schematic partial cross-sectional view of a variant of the semiconductor memory cell of Example 15.

Figure 161:
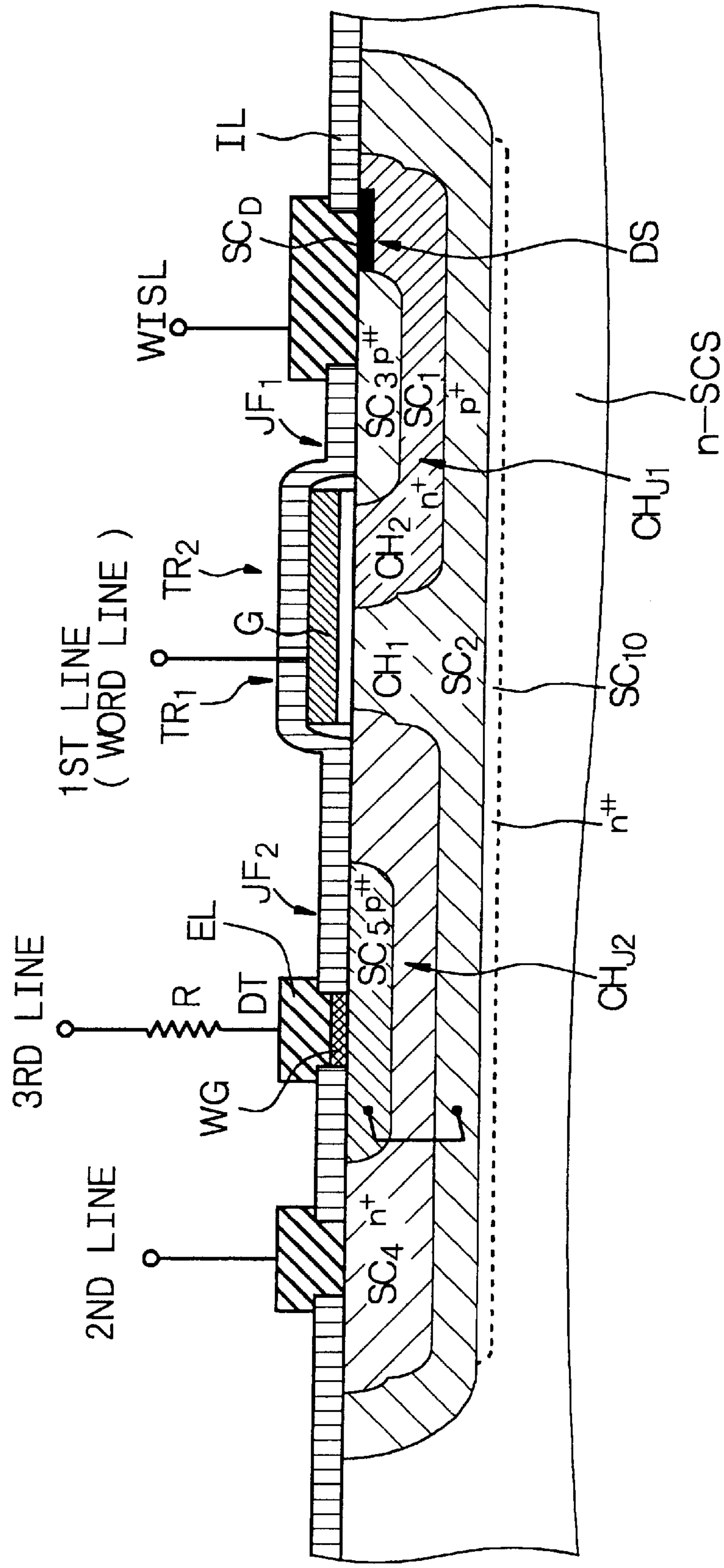

FIG. 161 shows a schematic partial cross-sectional view of a variant of the semiconductor memory cell of Example 15.

Figure 162:
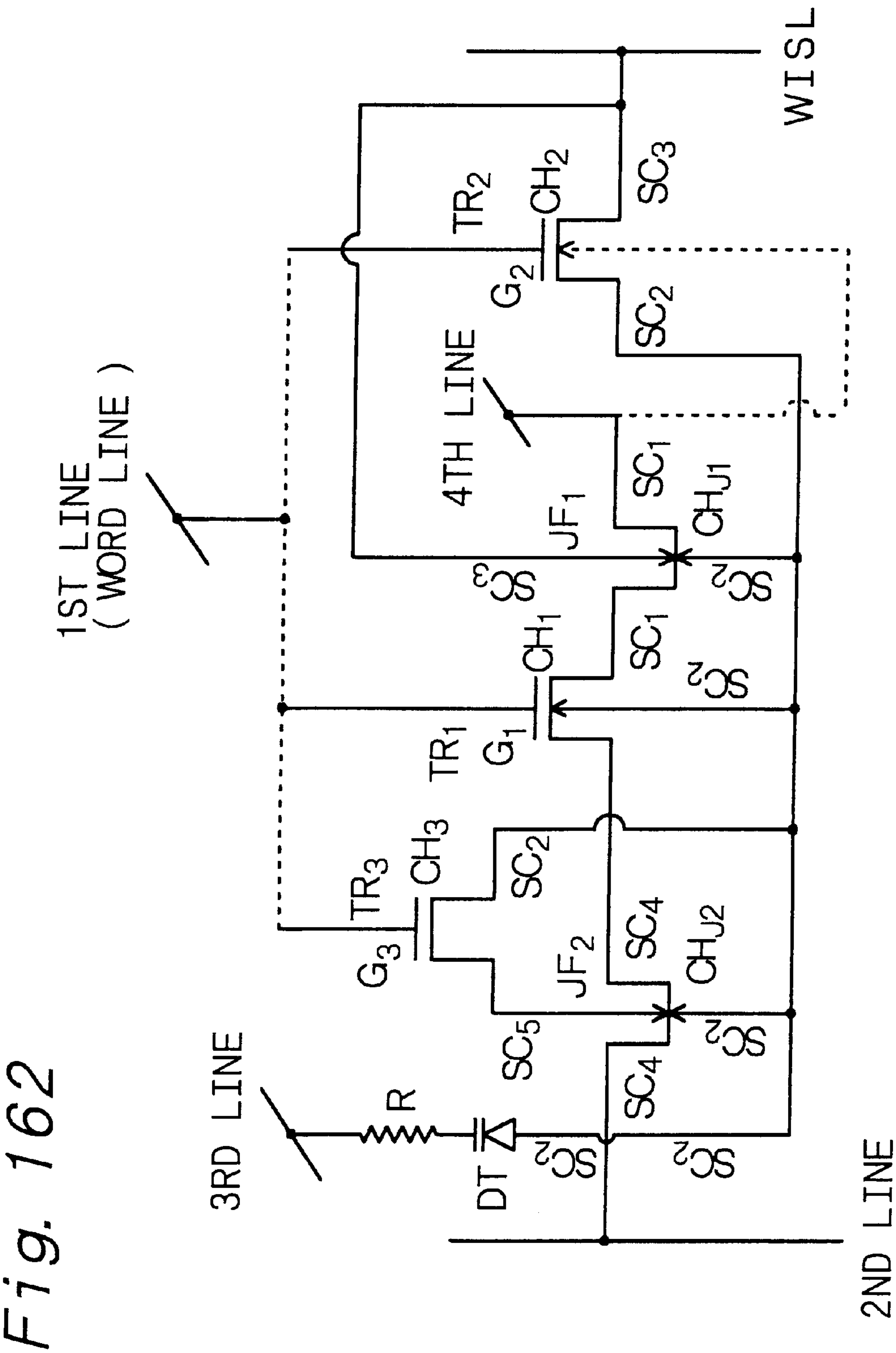

FIG. 162 shows the principle of the semiconductor memory cell according to the tenth aspect of the present invention.

Figure 163:
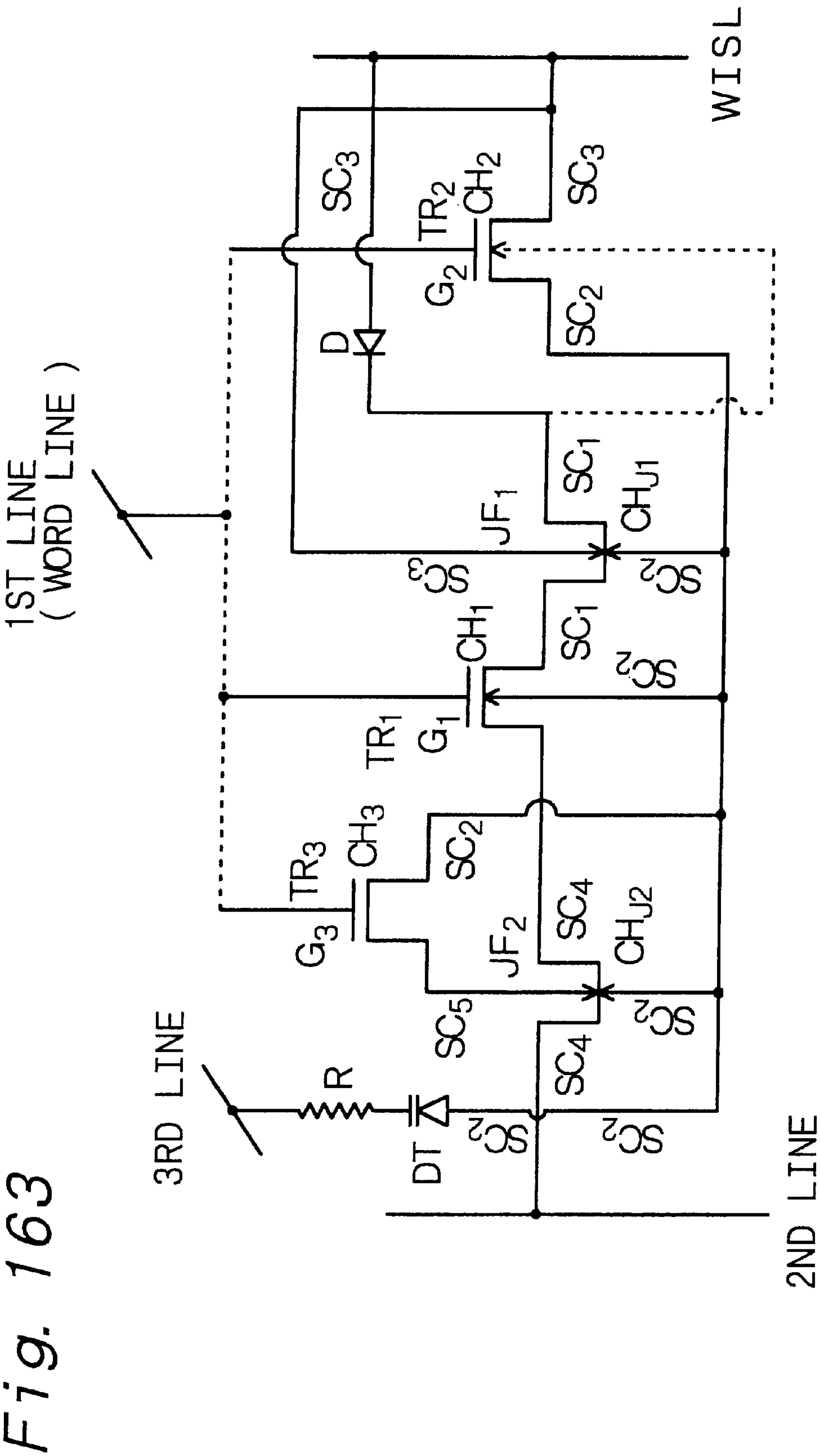

FIG. 163 shows the principle of a variant of the semiconductor memory cell according to the tenth aspect of the present invention.

Figure 164:
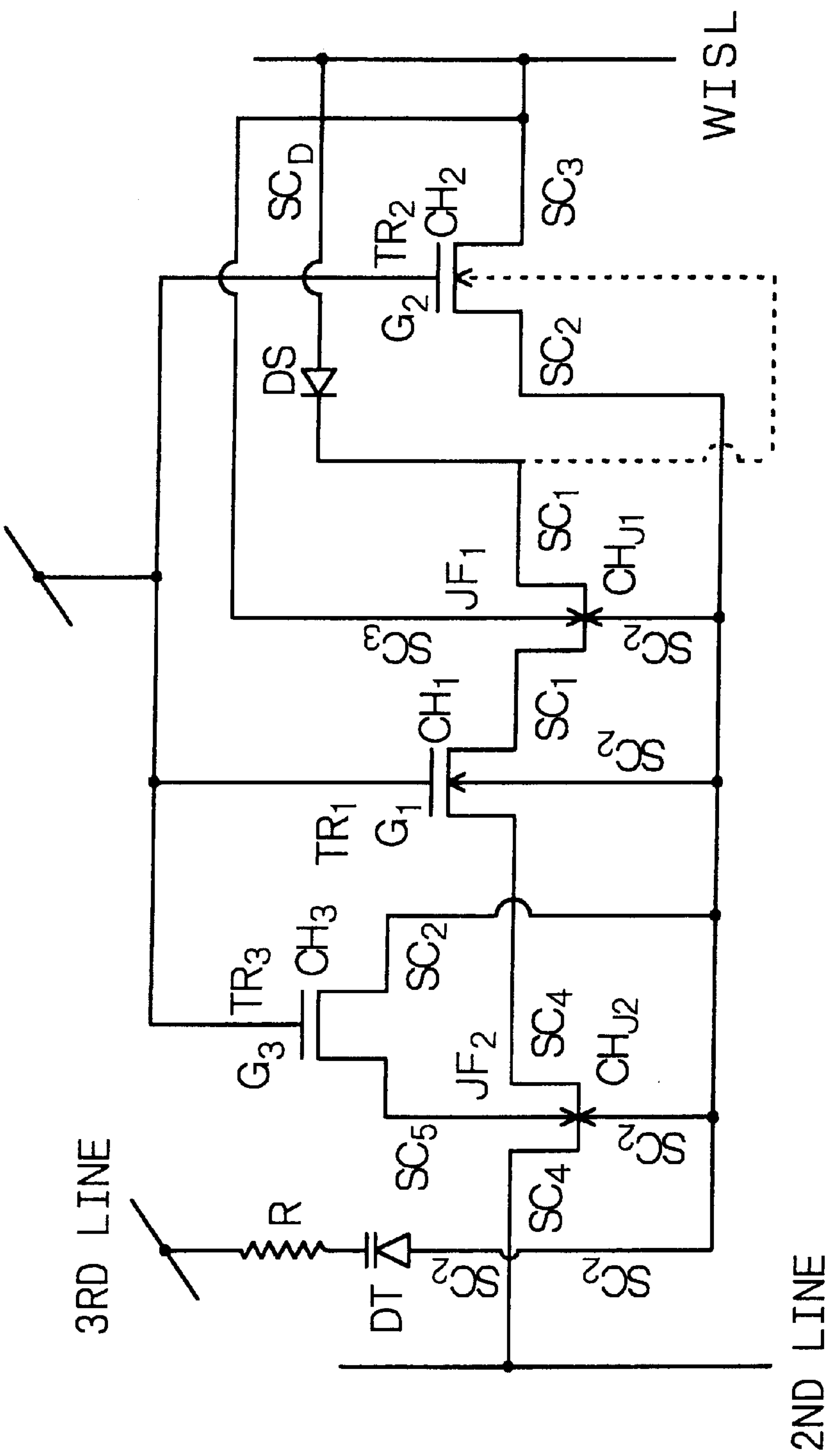

FIG. 164 shows the principle of a variant of the semiconductor memory cell according to the tenth aspect of the present invention.

Figure 165:
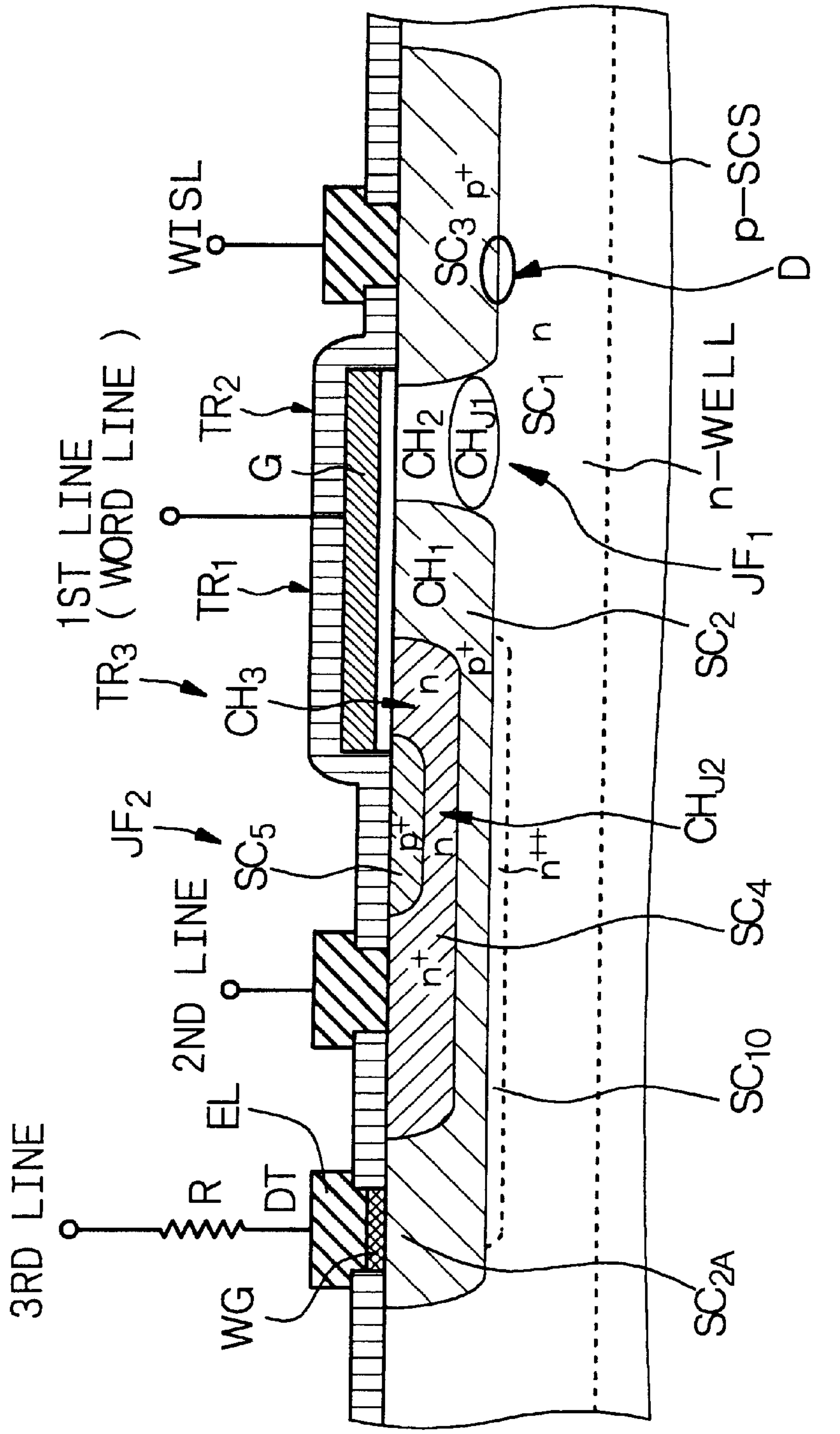

FIG. 165 shows a schematic partial cross-sectional view of a semiconductor memory cell of Example 16.

Figure 166:
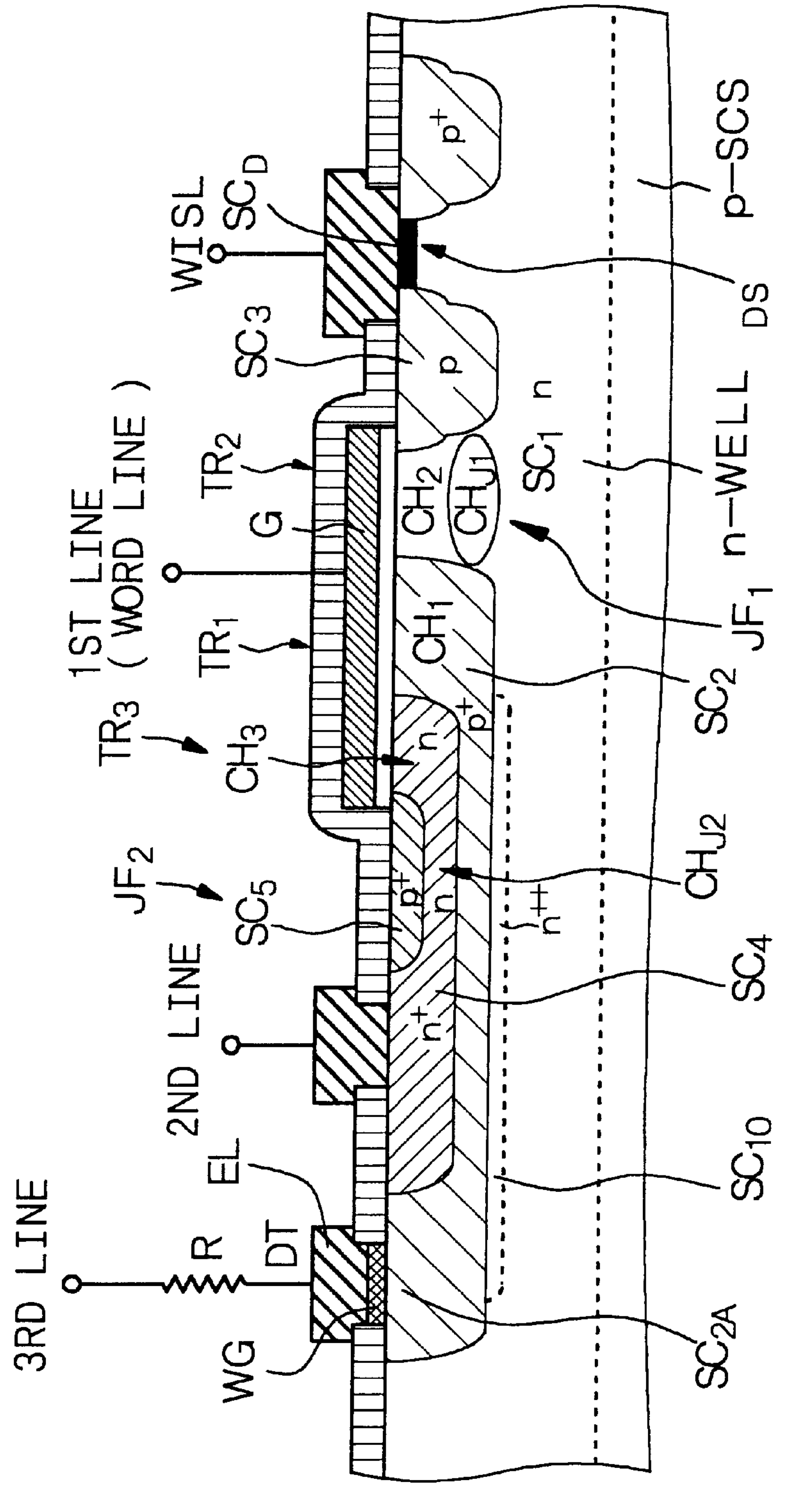

FIG. 166 shows a schematic partial cross-sectional view of a variant of the semiconductor memory cell of Example 16.

Figure 167:
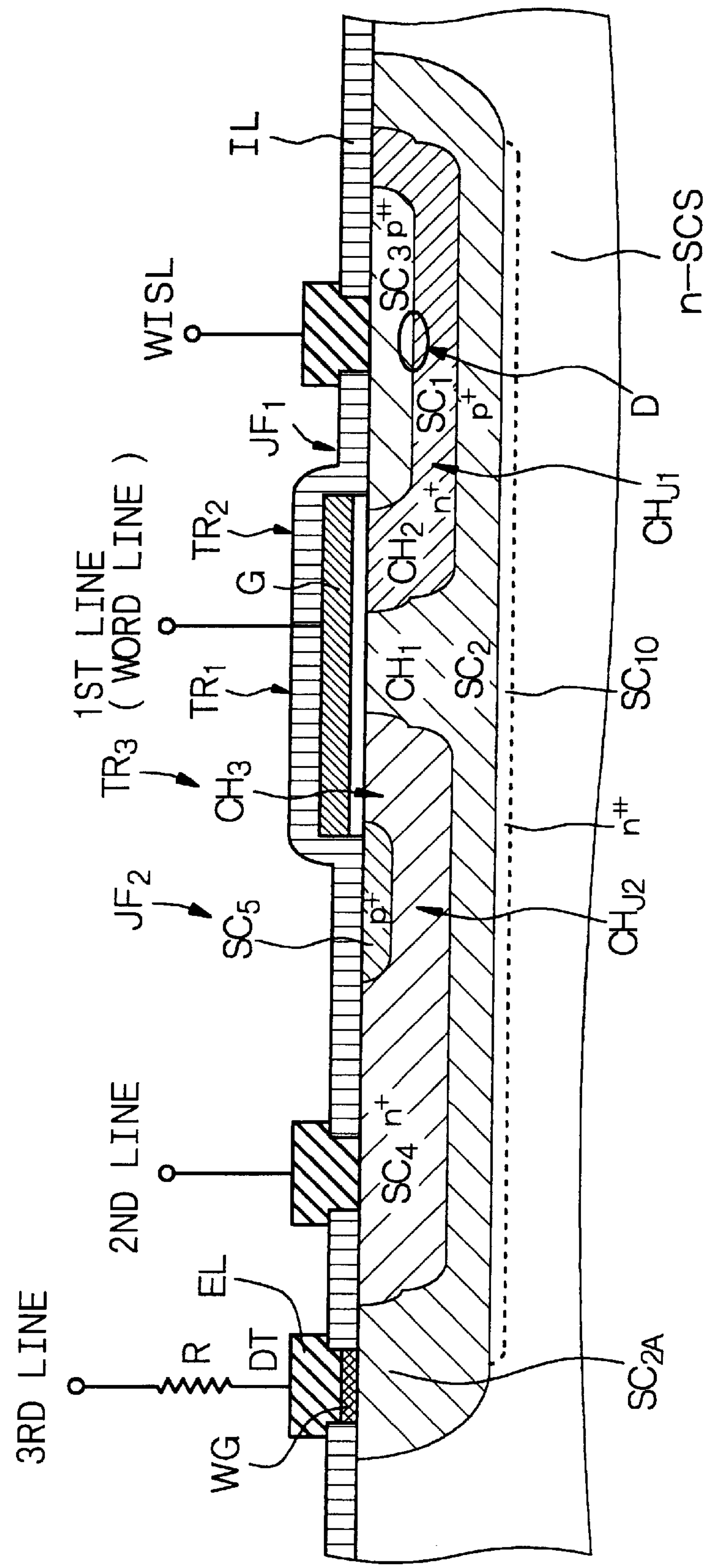

FIG. 167 shows a schematic partial cross-sectional view of a variant of the semiconductor memory cell of Example 16.

Figure 168:
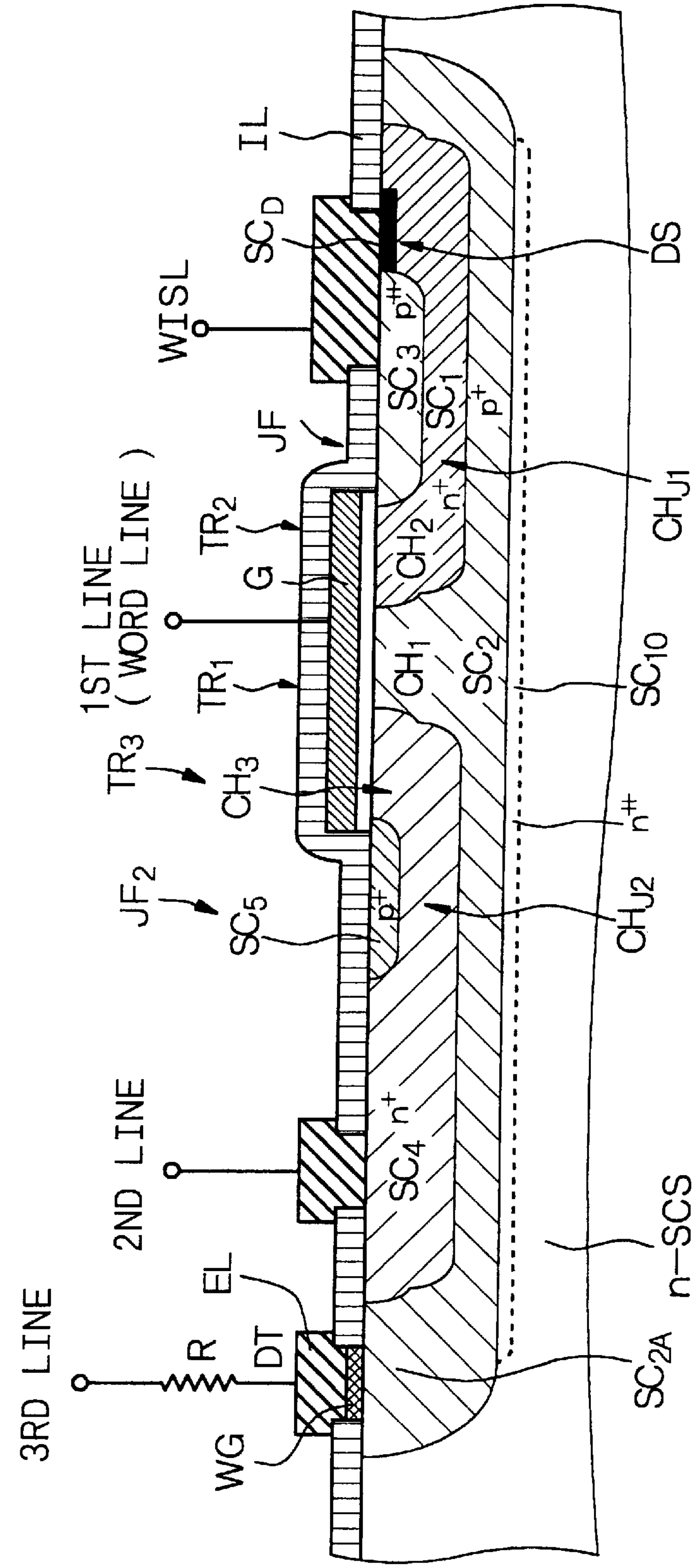

FIG. 168 shows a schematic partial cross-sectional view of a variant of the semiconductor memory cell of Example 16.

Figure 169:
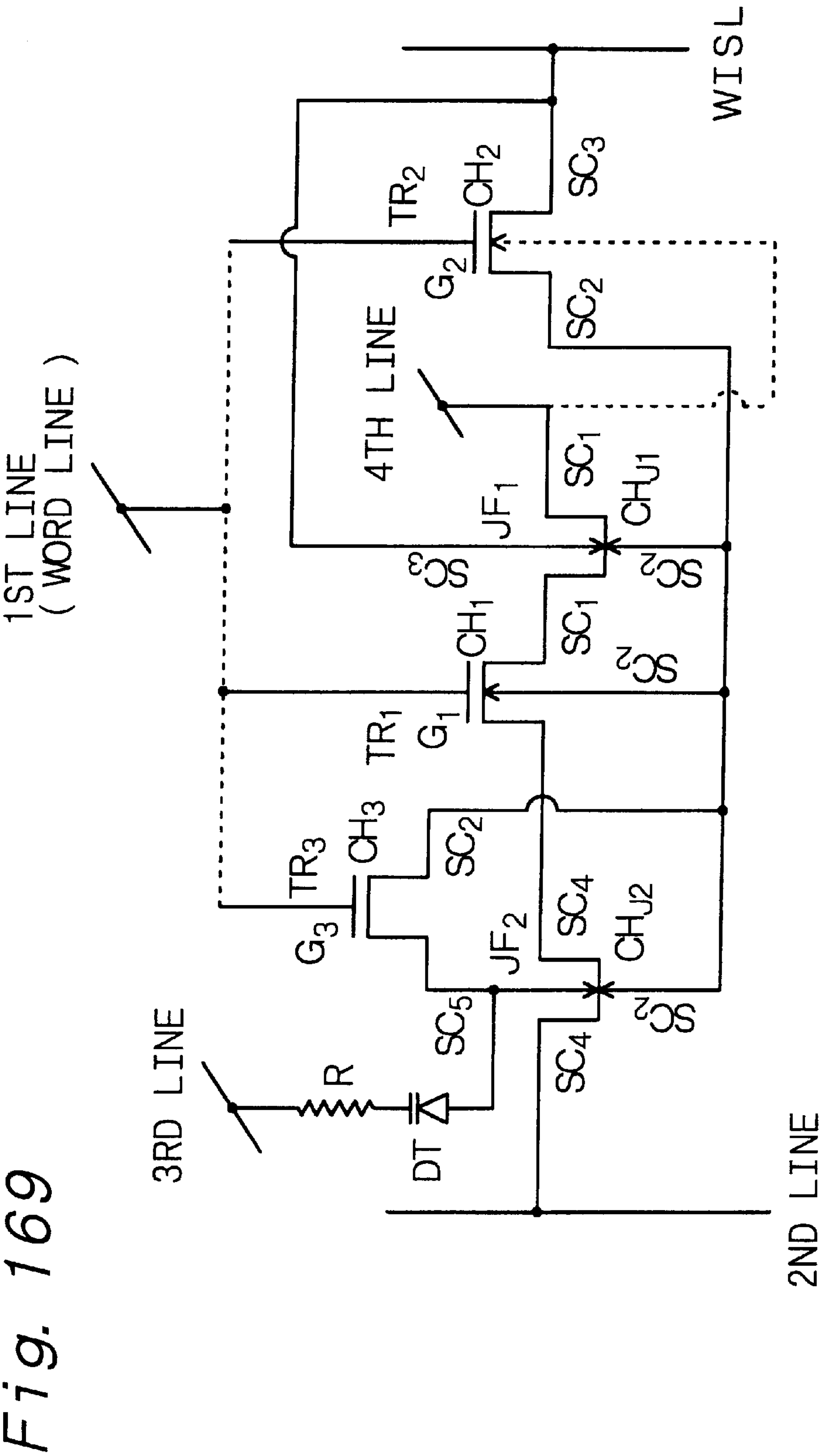

FIG. 169 shows the principle of the semiconductor memory cell according to the eleventh aspect of the present invention.

Figure 170:
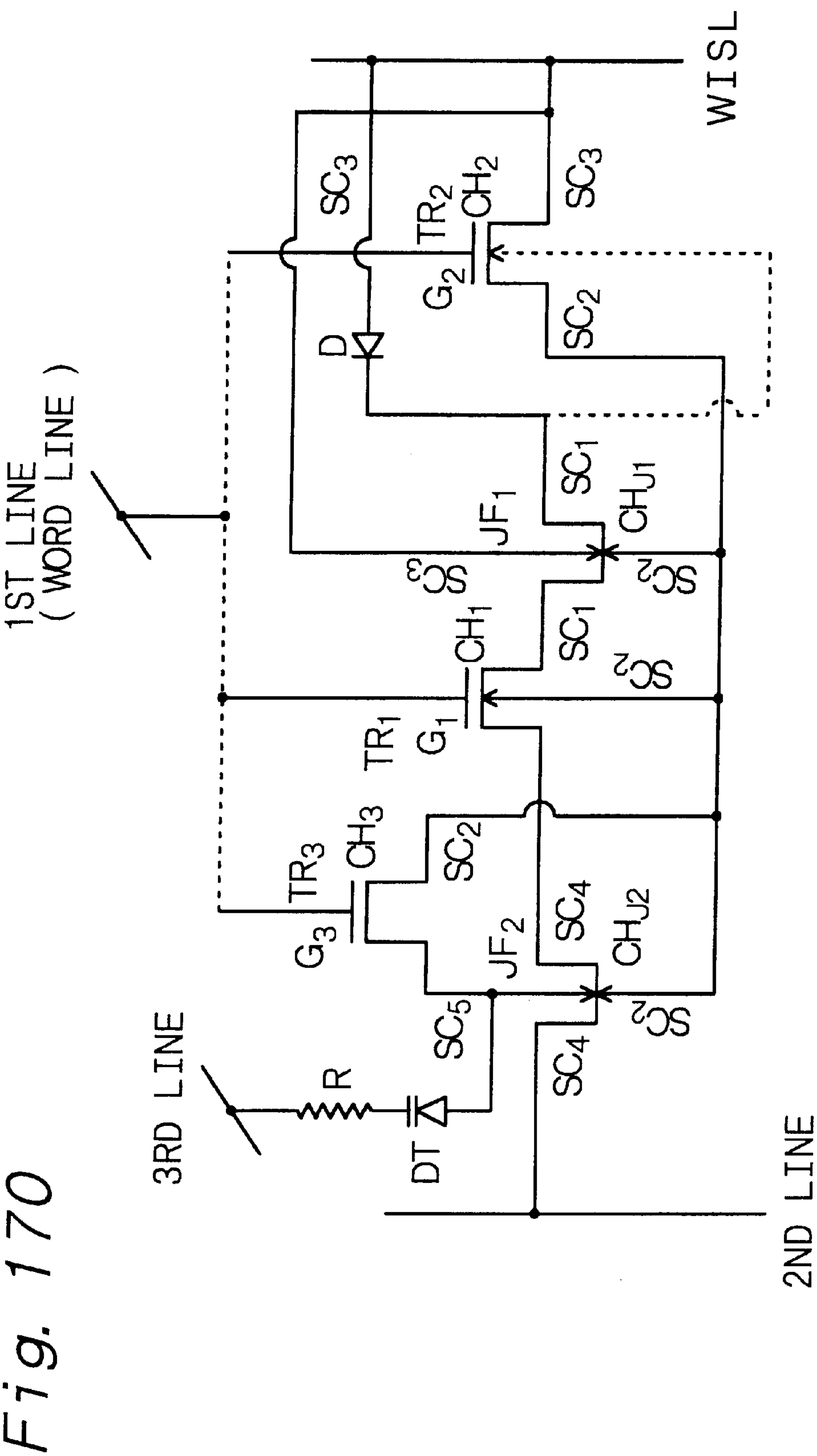

FIG. 170 shows the principle of a variant of the semiconductor memory cell according to the eleventh aspect of the present invention.

Figure 171:
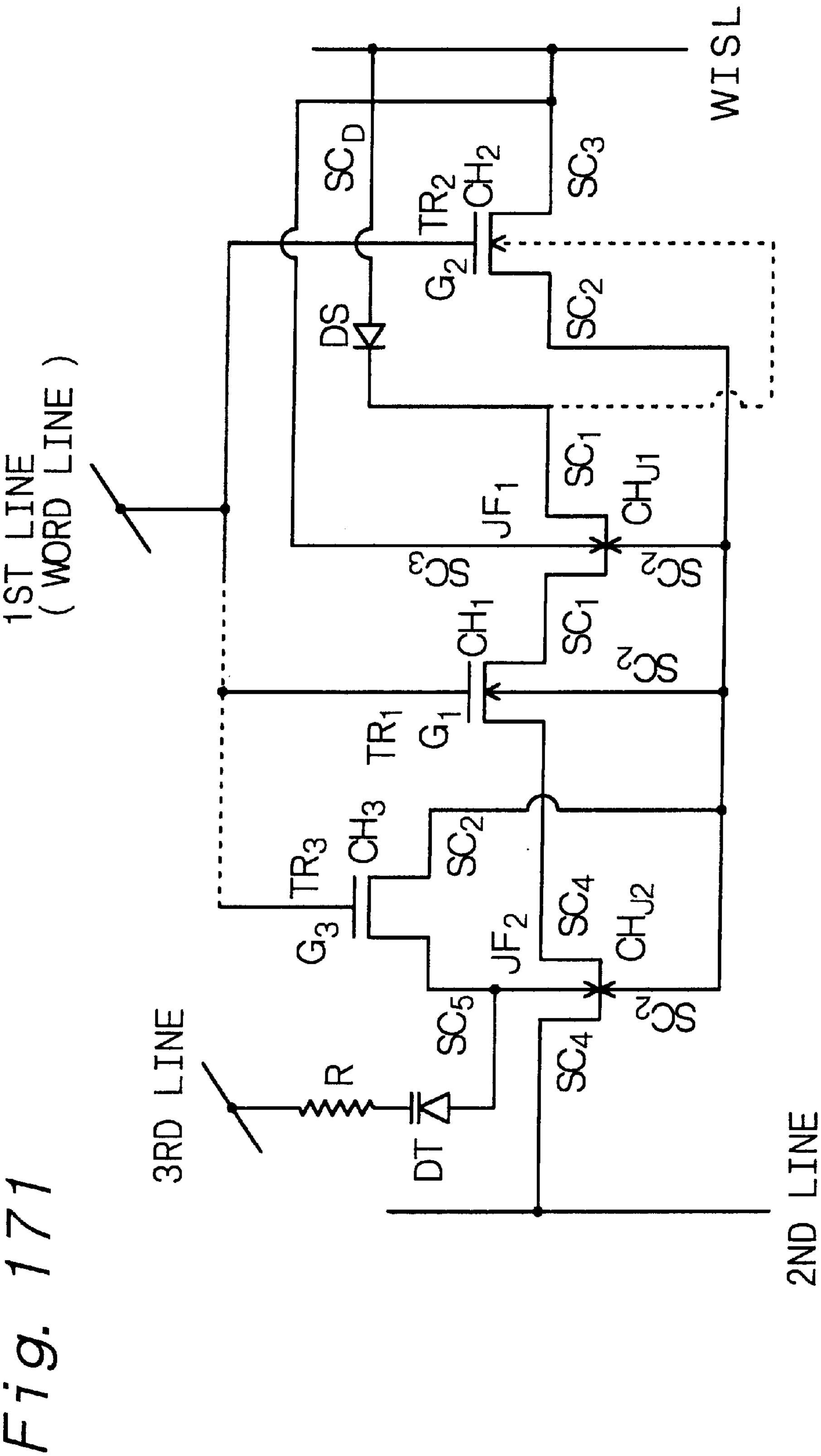

FIG. 171 shows the principle of a variant of the semiconductor memory cell according to the eleventh aspect of the present invention.

Figure 172:
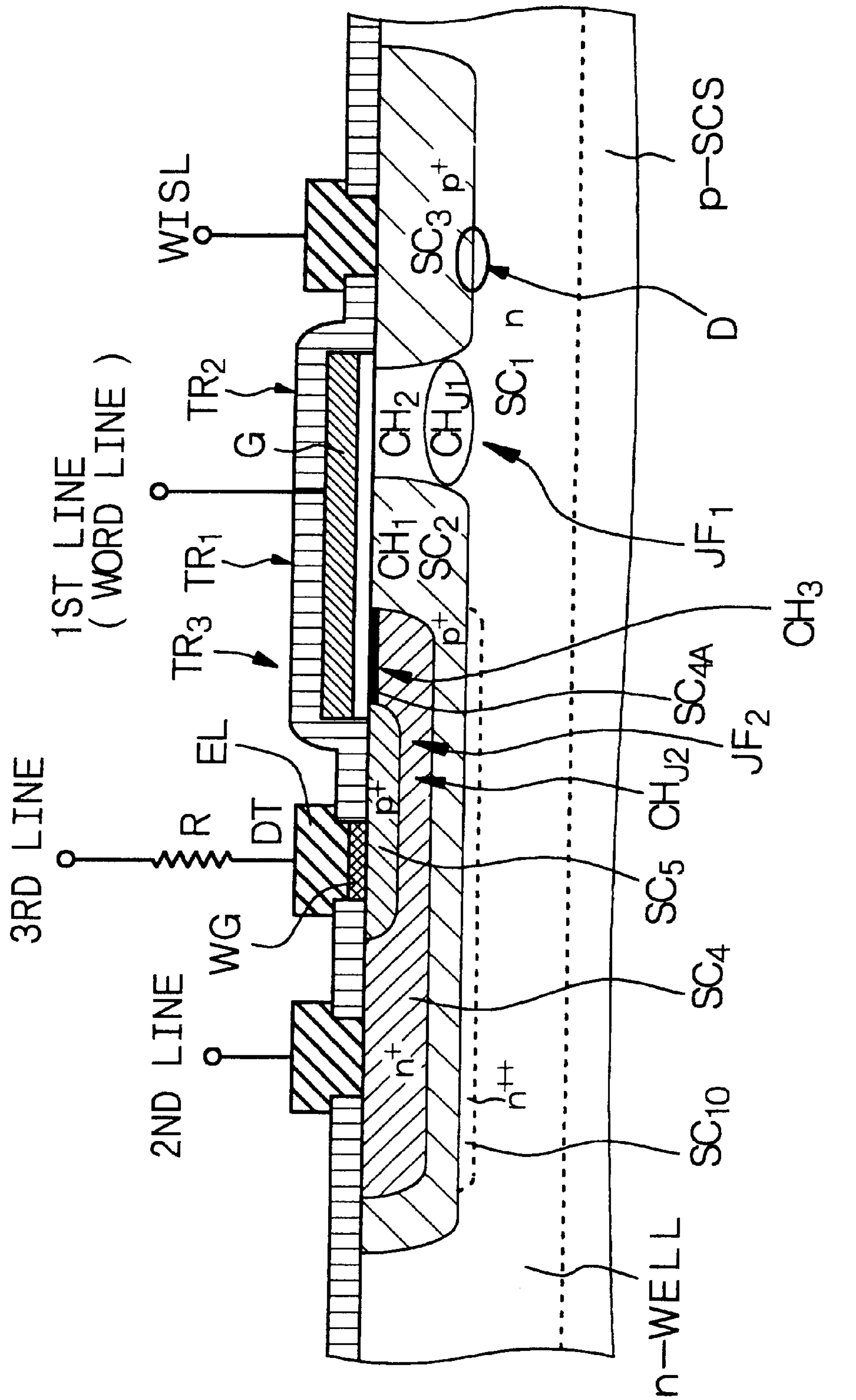

FIG. 172 shows a schematic partial cross-sectional view of a semiconductor memory cell of Example 17.

Figure 173:
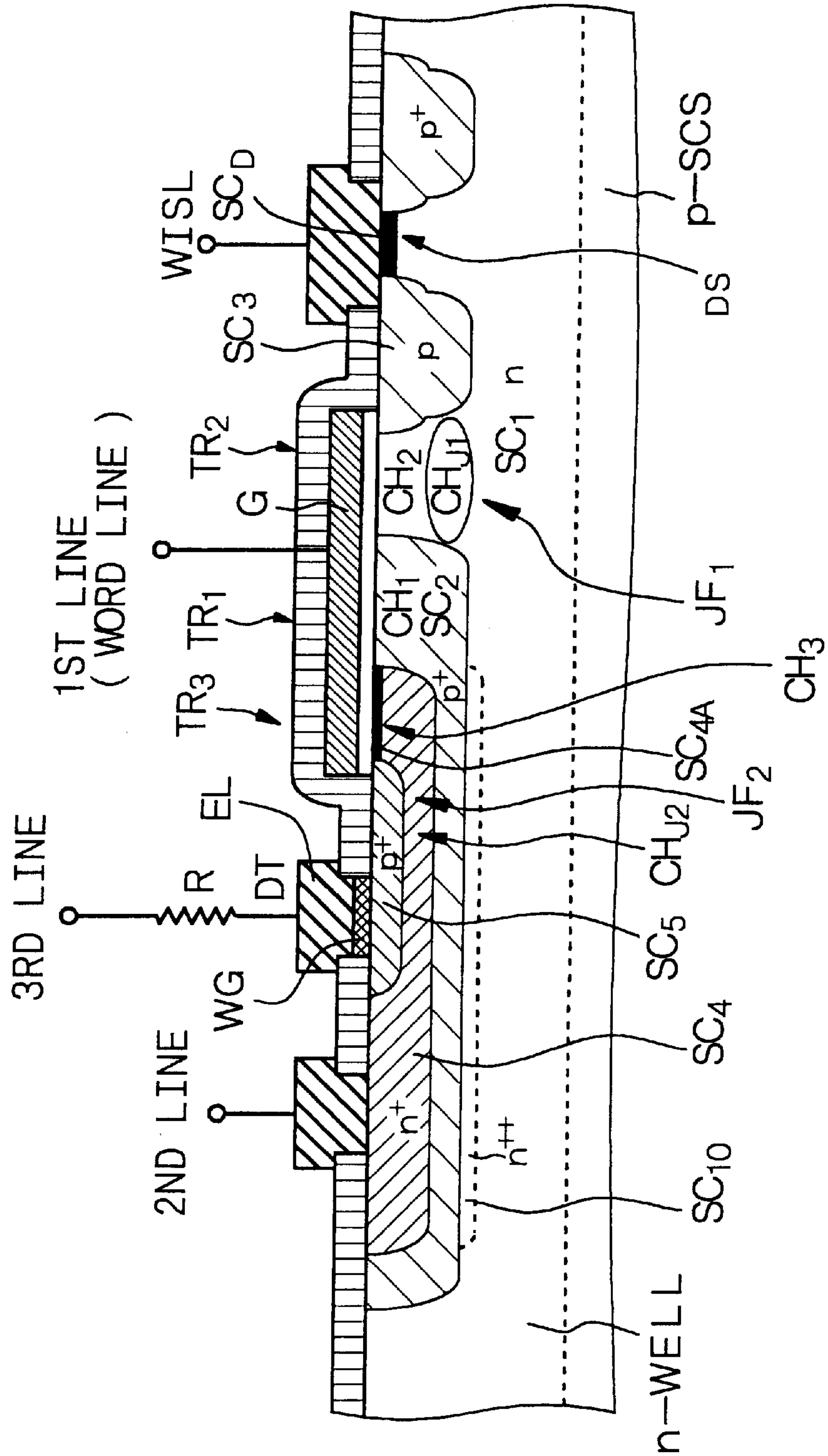

FIG. 173 shows a schematic partial cross-sectional view of a variant of the semiconductor memory cell of Example 17.

Figure 174:
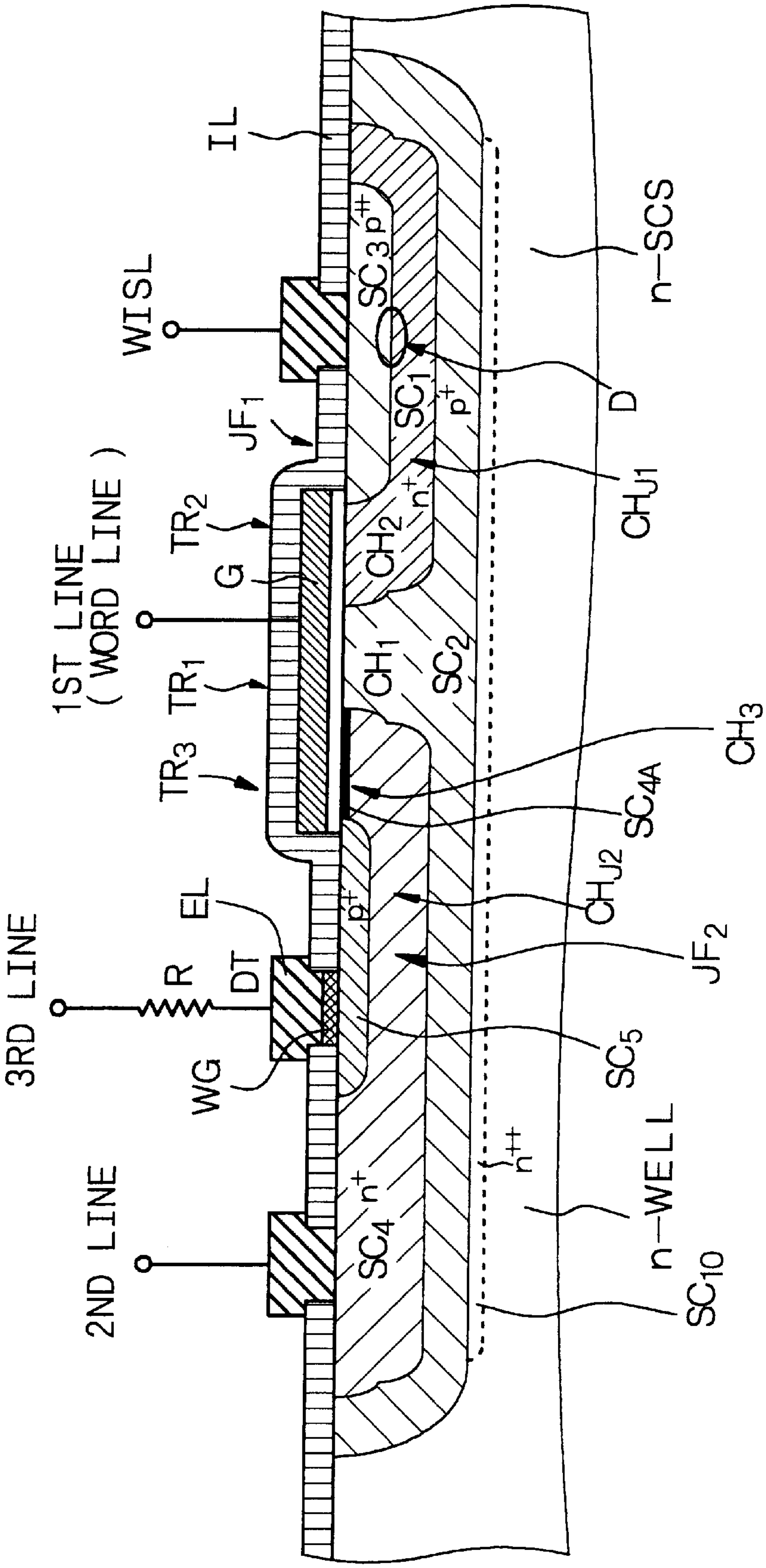

FIG. 174 shows a schematic partial cross-sectional view of a variant of the semiconductor memory cell of Example 17.

Figure 175:
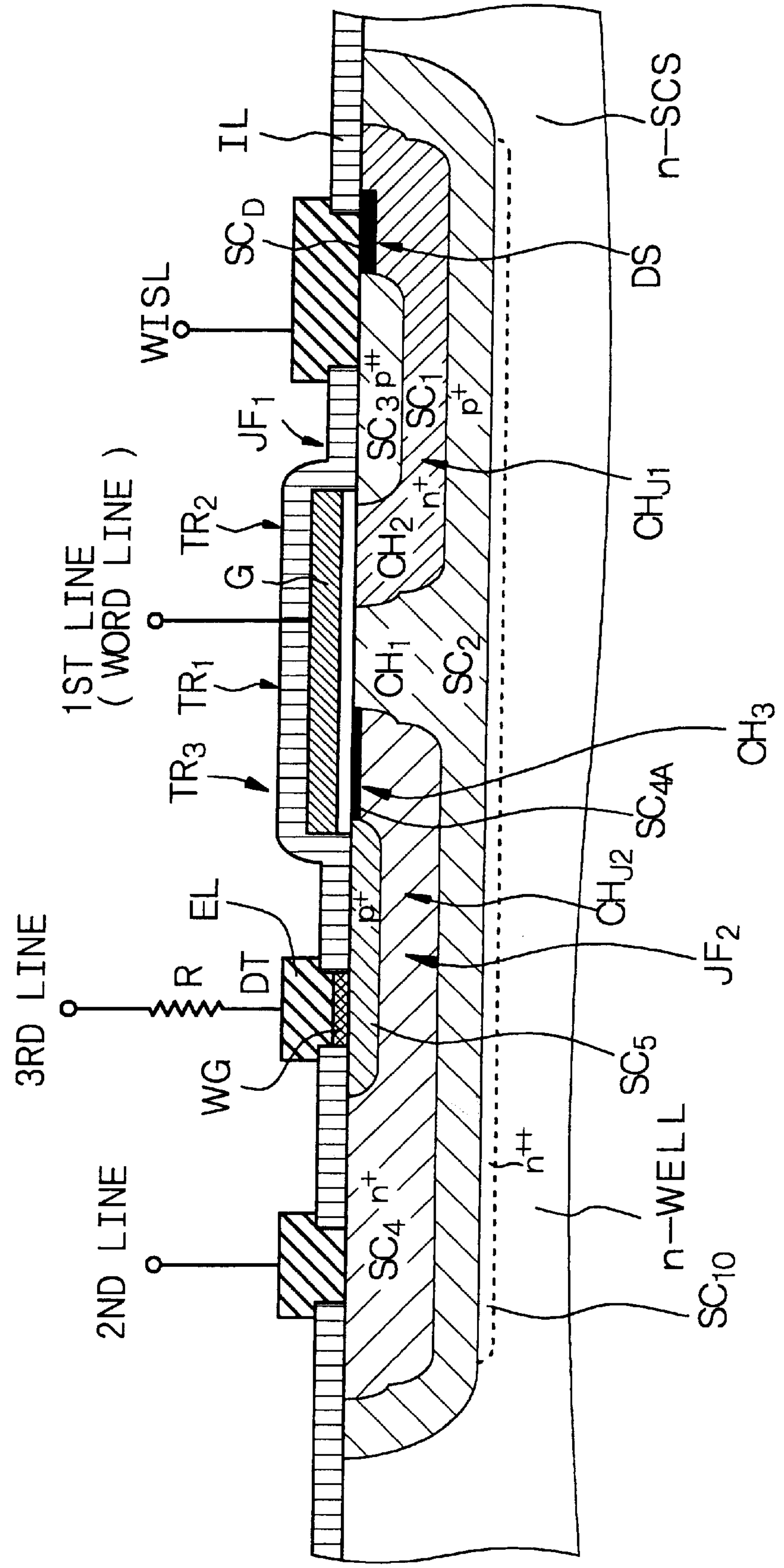

FIG. 175 shows a schematic partial cross-sectional view of a variant of the semiconductor memory cell of Example 17.

Figure 176A:
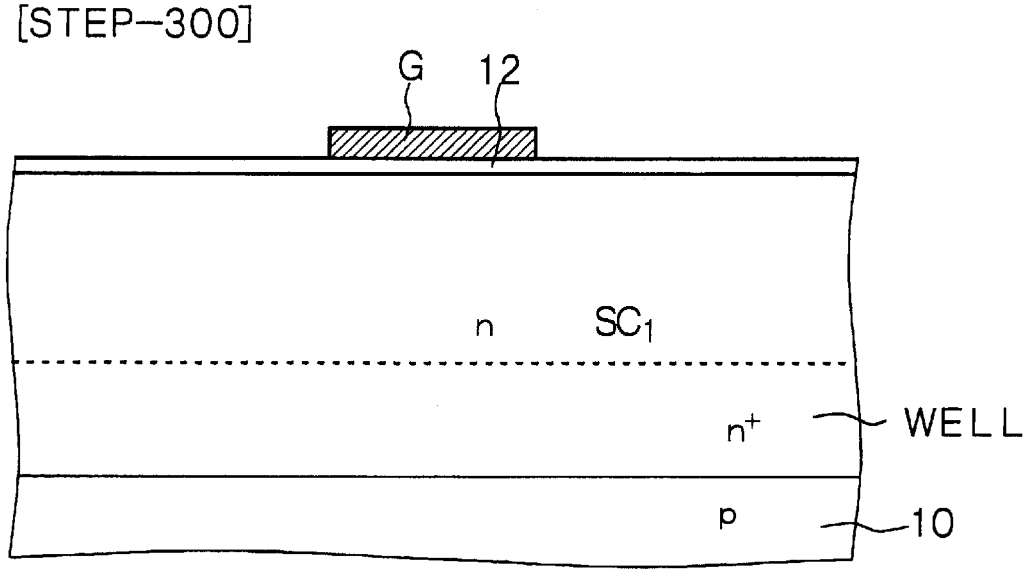
Figure 176B:
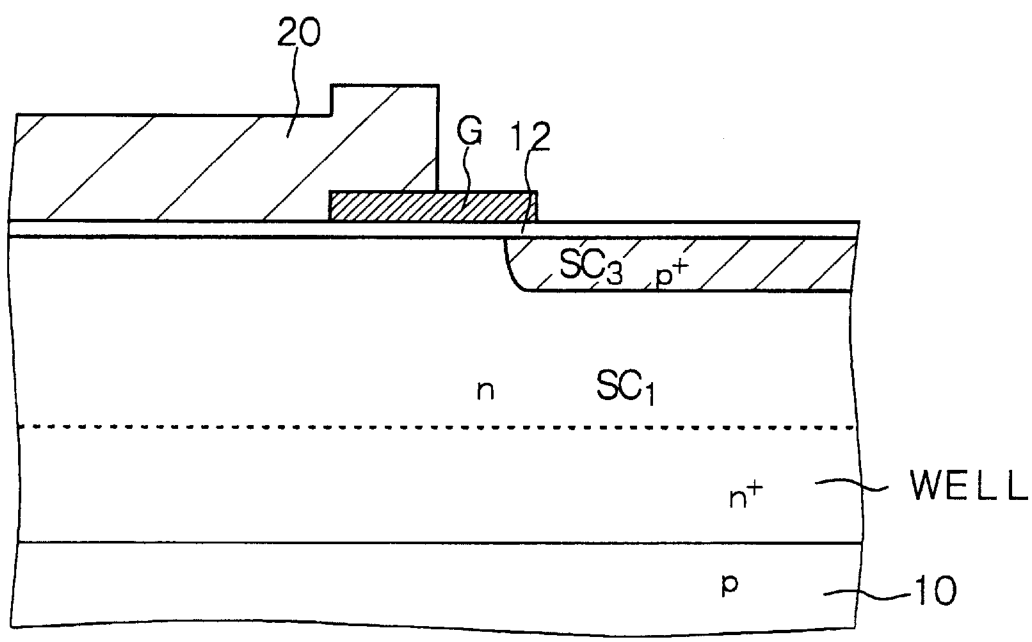

FIGS. 176A and 176B show schematic partial cross-sectional views of a semiconductor substrate, etc., for explaining the method of manufacturing the semiconductor memory cell of Example 7 shown in FIG. 69.

Figure 177A:
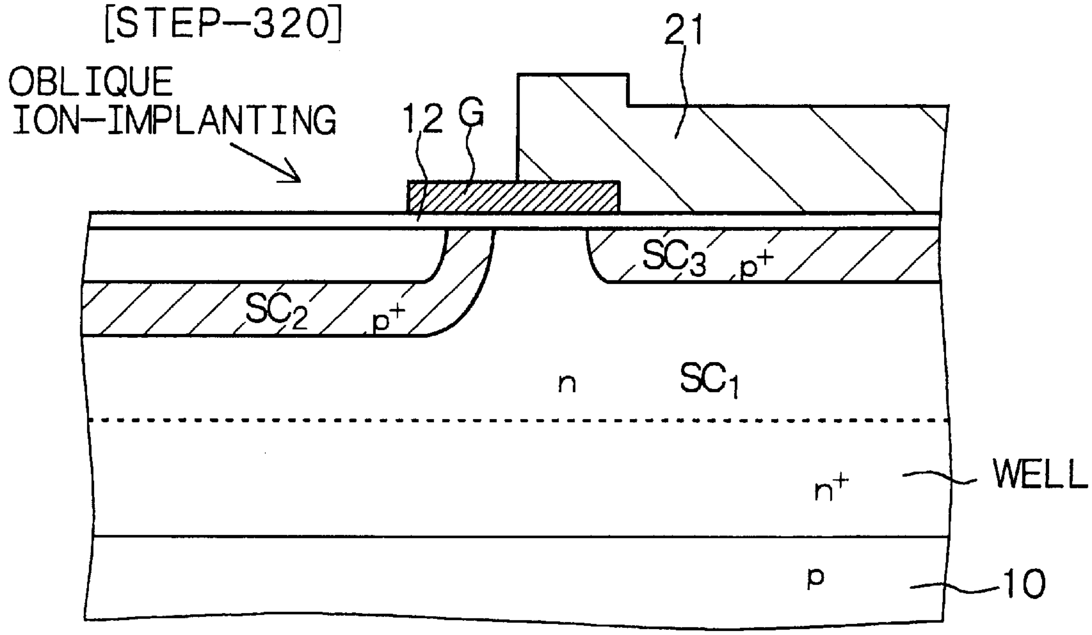
Figure 177B:
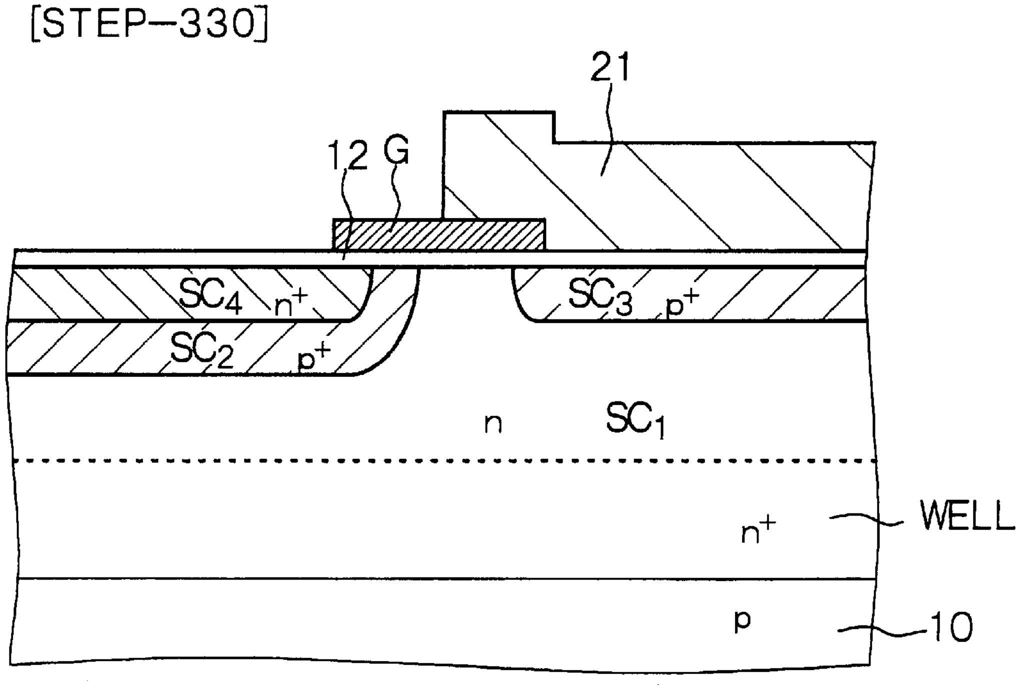

FIGS. 177A and 177B, following FIG. 176B, show schematic partial cross-sectional views of a semiconductor substrate, etc., for explaining the method of manufacturing the semiconductor memory cell of Example 7 shown in FIG. 69.

Figure 178A:
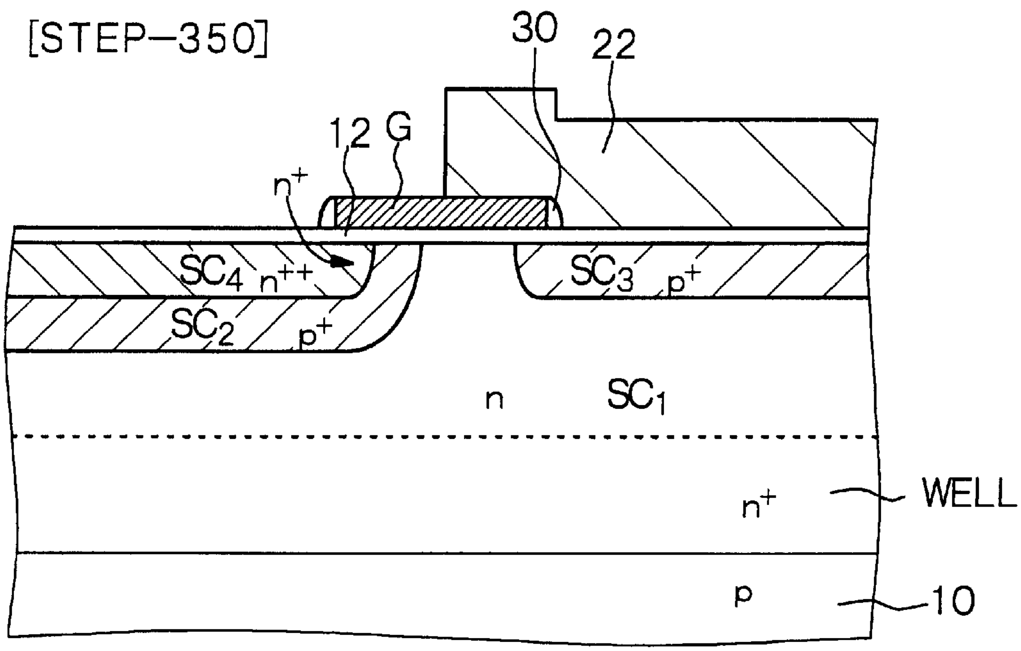
Figure 178B:
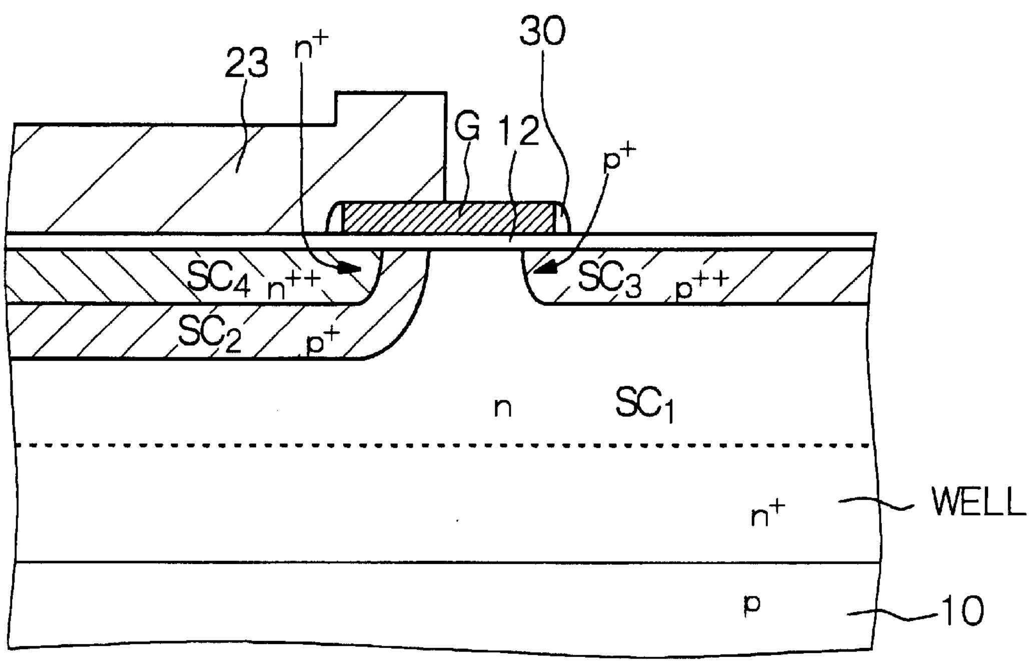

FIGS. 178A and 178B, following FIG. 177B, show schematic partial cross-sectional views of a semiconductor substrate, etc., for explaining the method of manufacturing the semiconductor memory cell of Example 7 shown in FIG. 69.

Figure 179A:
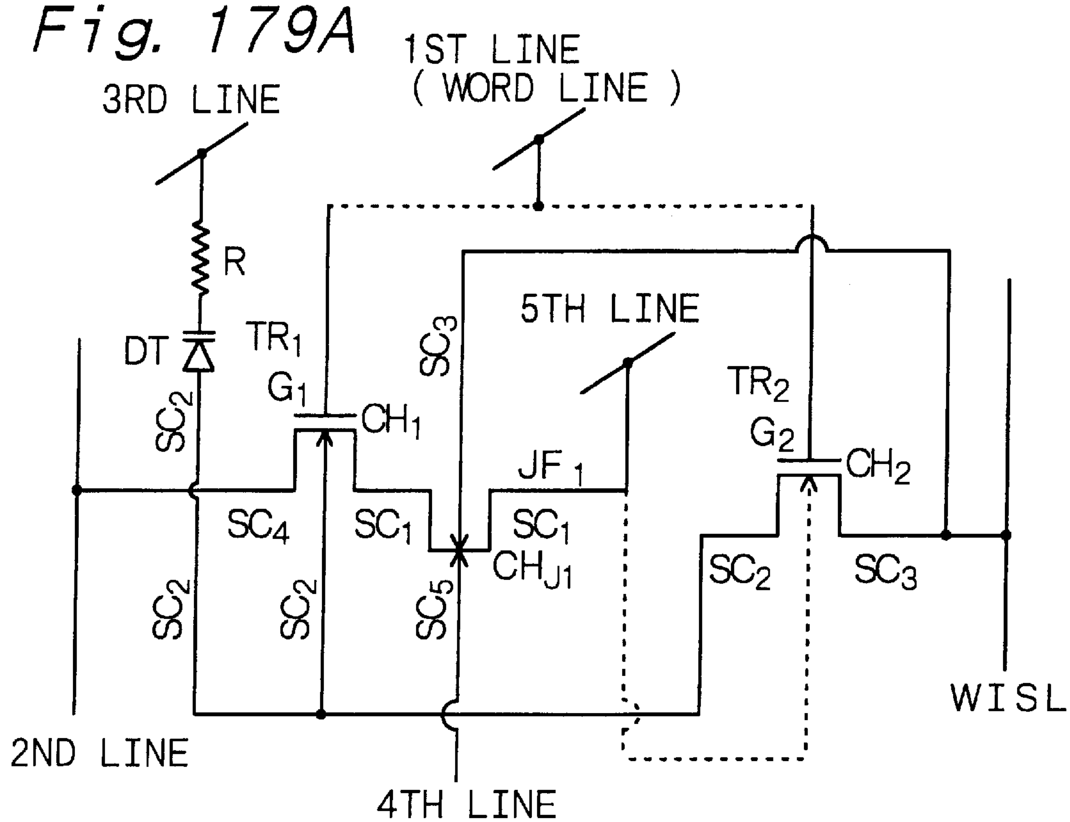
Figure 179B:
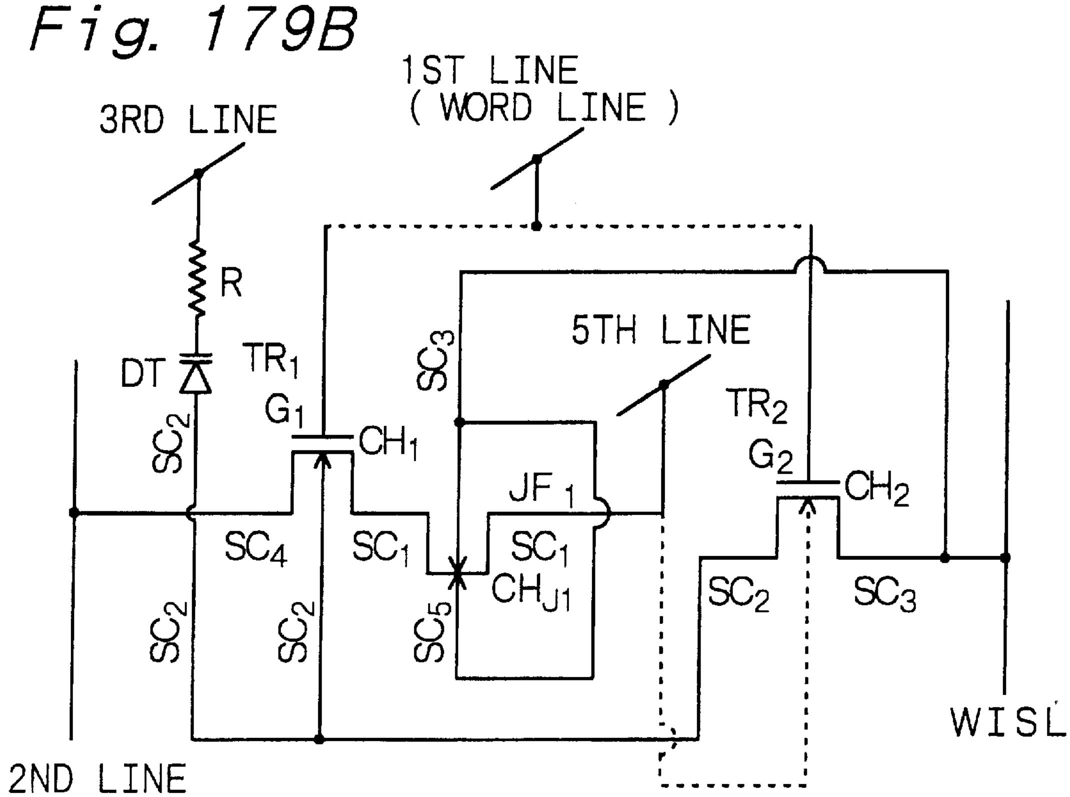

FIGS. 179A and 179B show the principles of the semiconductor memory cells according to the twenty-fifth aspect of the present invention.

Figure 180A:
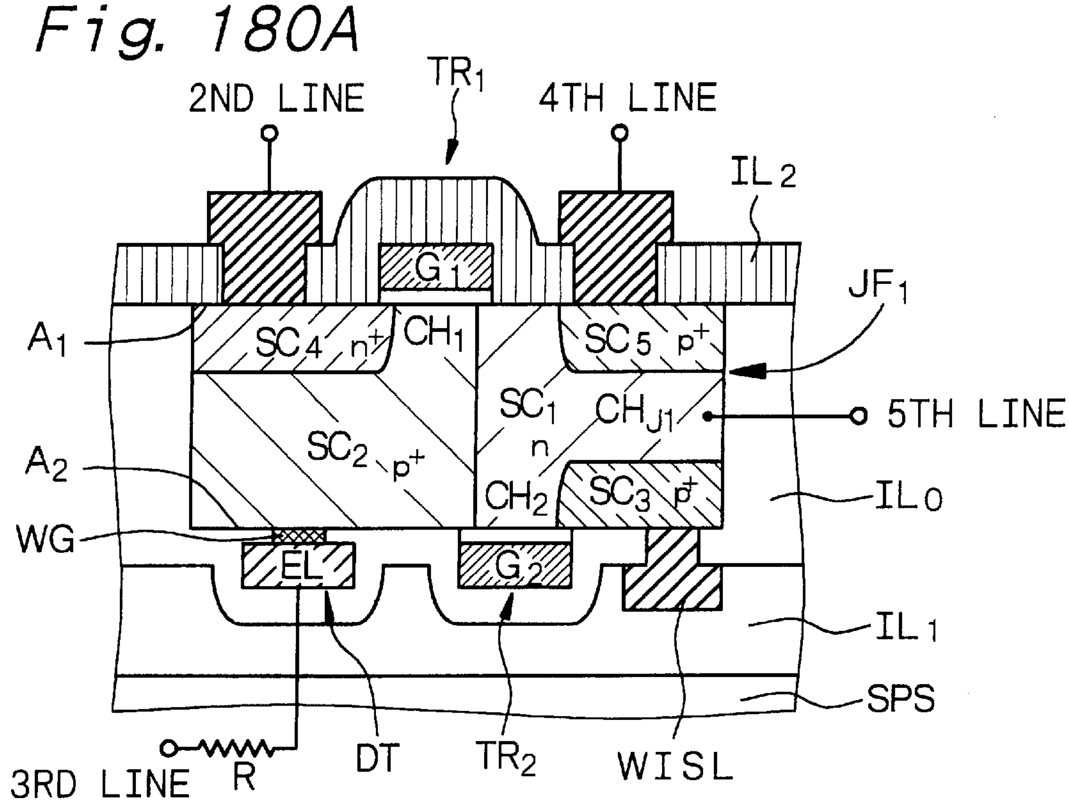
Figure 180B:
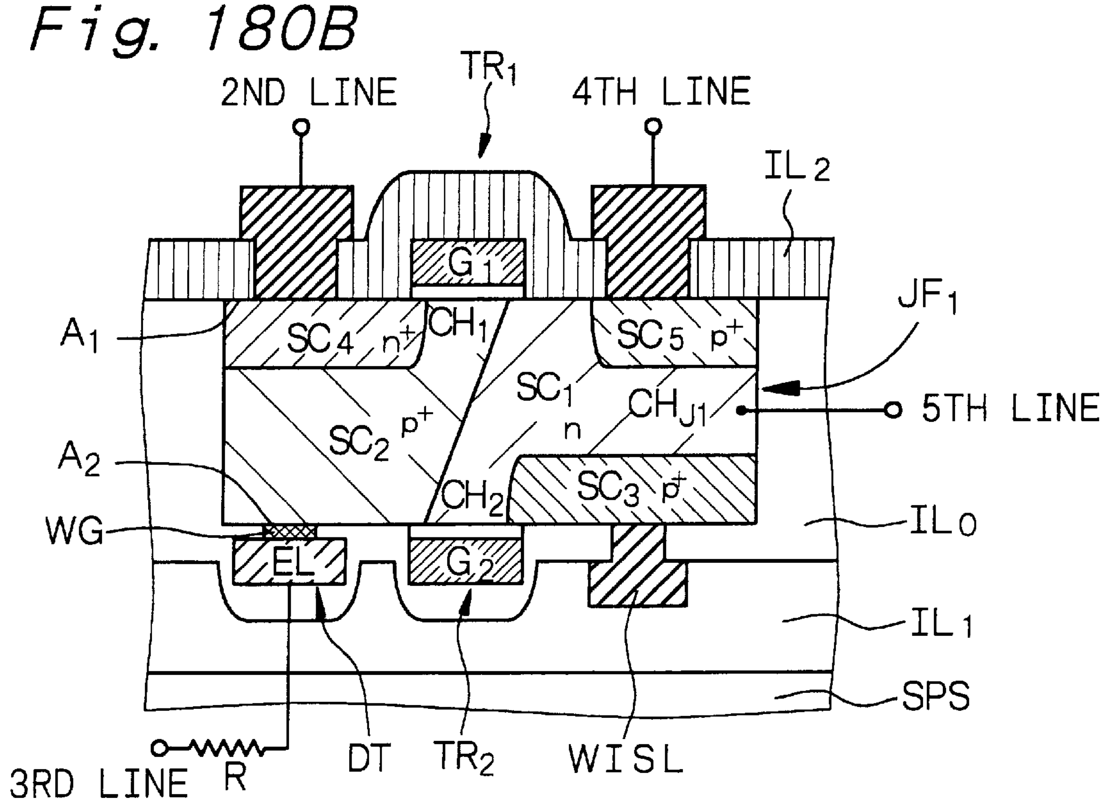

FIGS. 180A and 180B show schematic partial cross-sectional views of the semiconductor memory cells of Example 18.

Figure 181A:
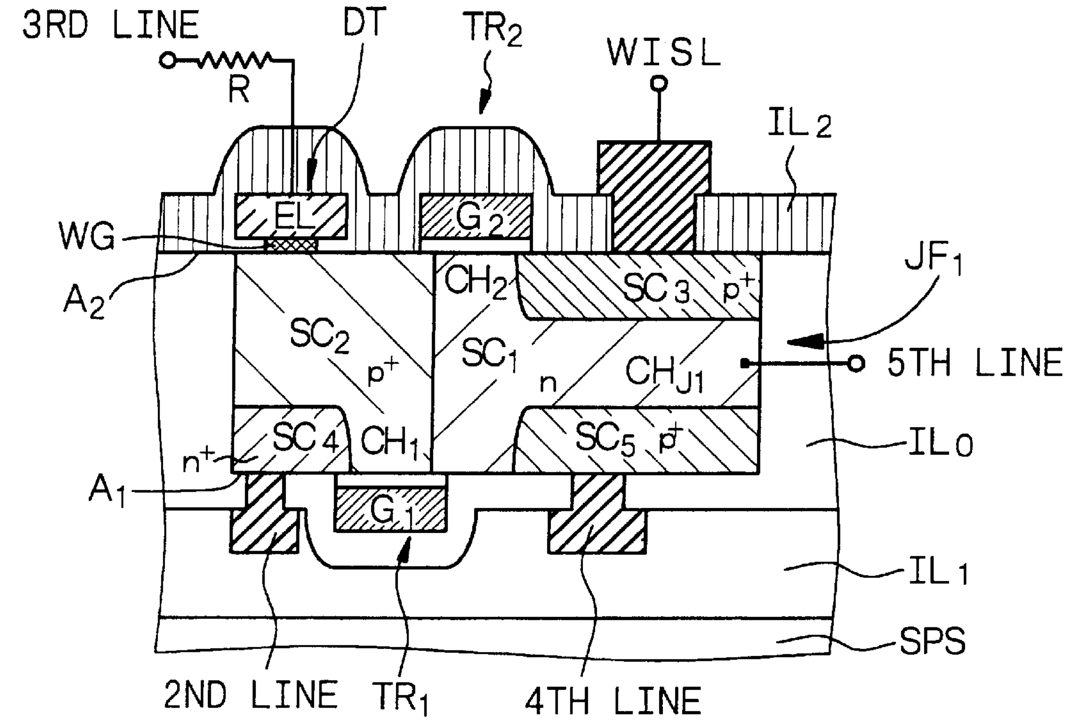
Figure 181B:
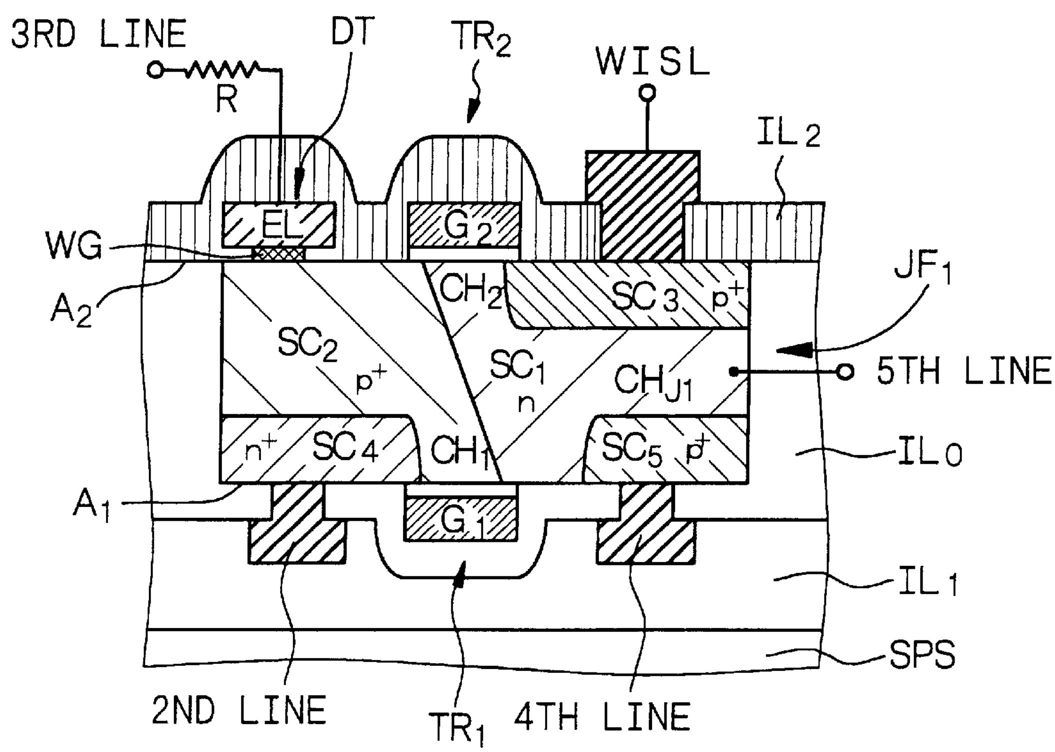

FIGS. 181A and 181B show schematic partial cross-sectional views of variants of the semiconductor memory cell of Example 18.

Figure 182A:
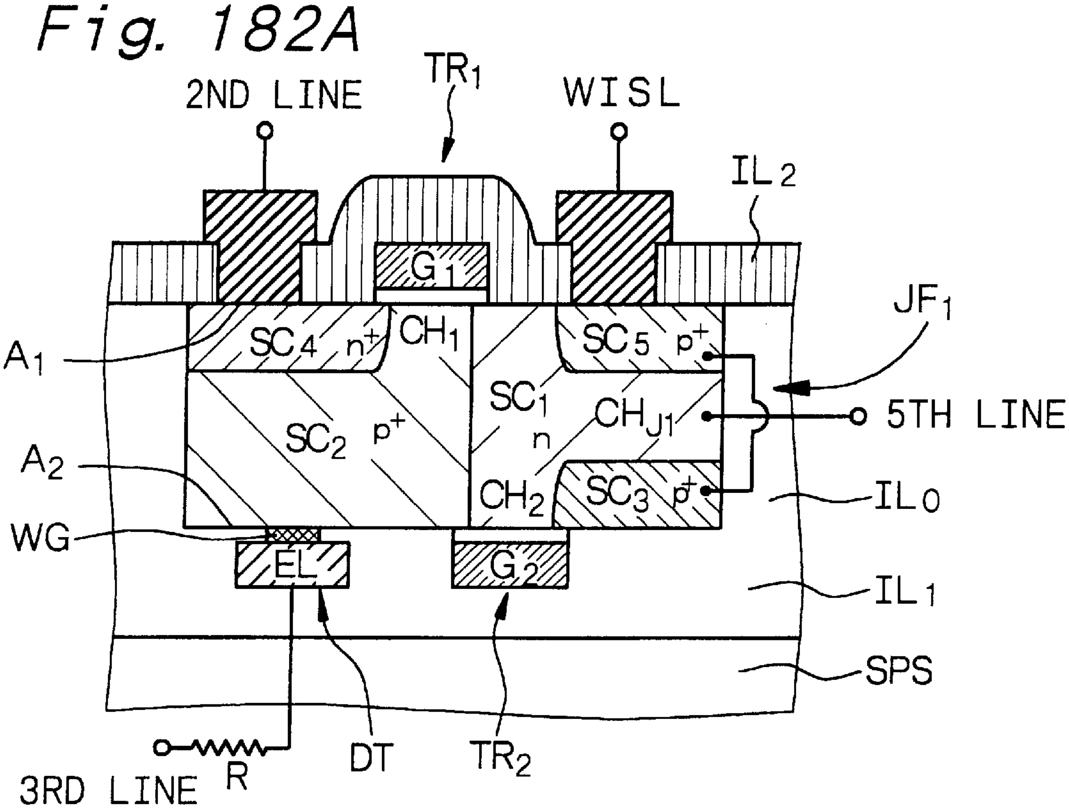
Figure 182B:
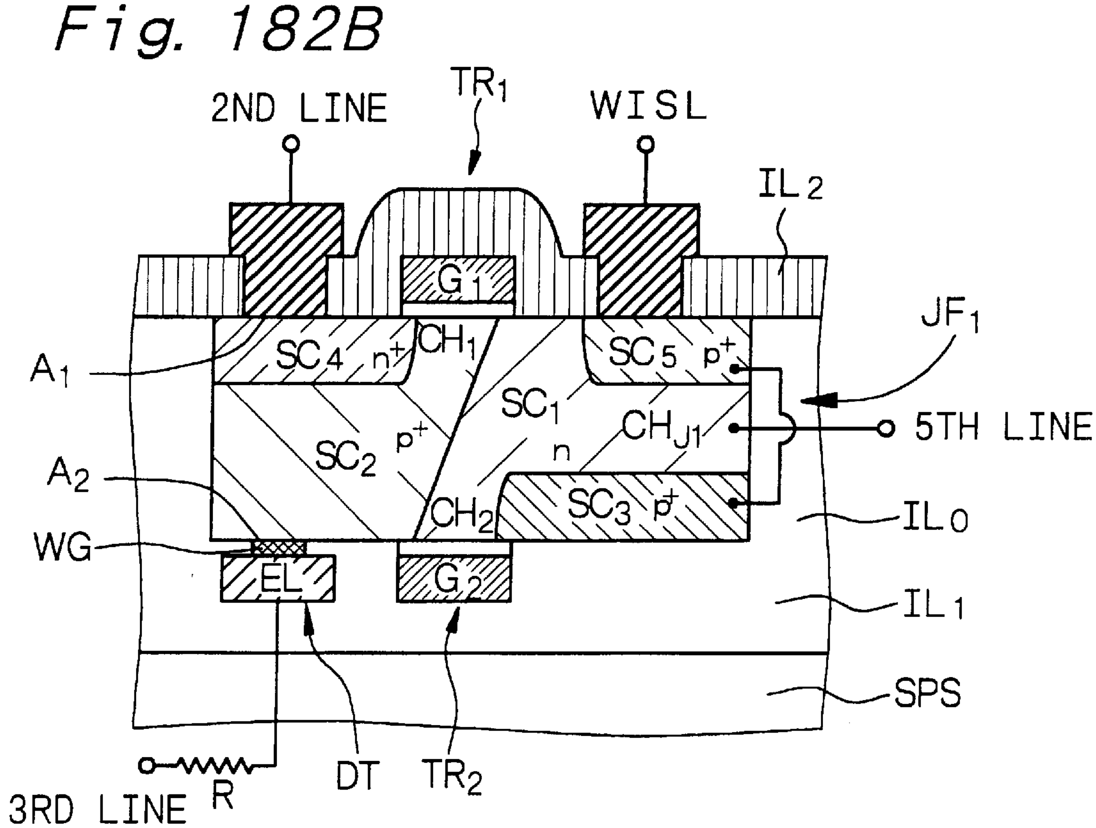

FIGS. 182A and 182B show schematic partial cross-sectional views of variants of the semiconductor memory cell of Example 18.

Figure 183A:
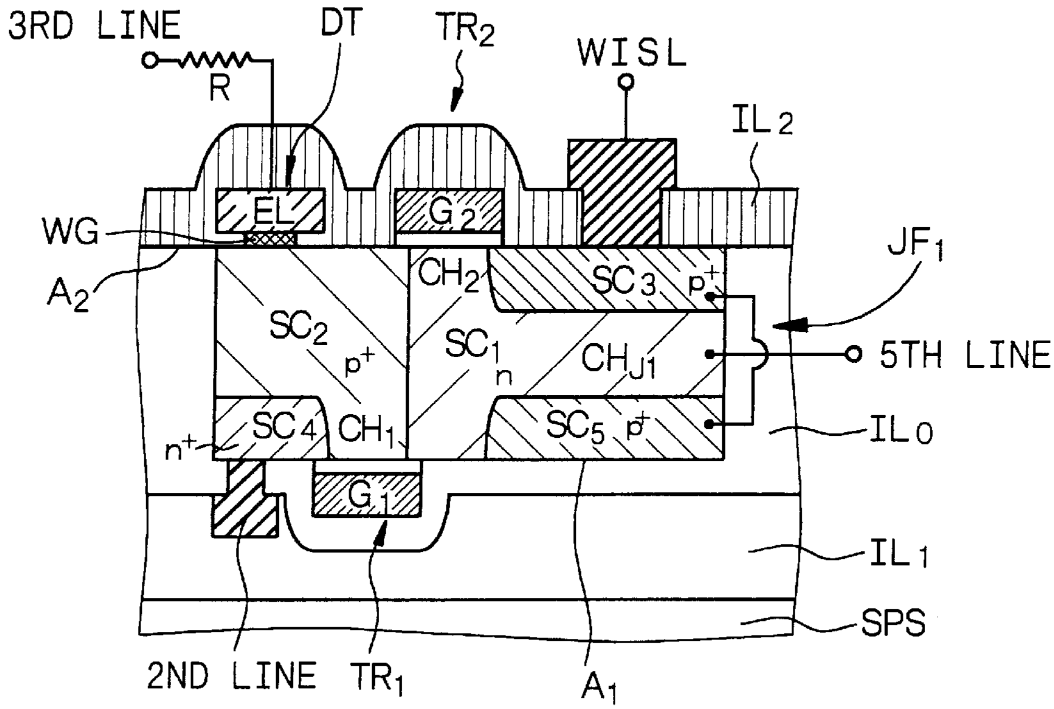
Figure 183B:
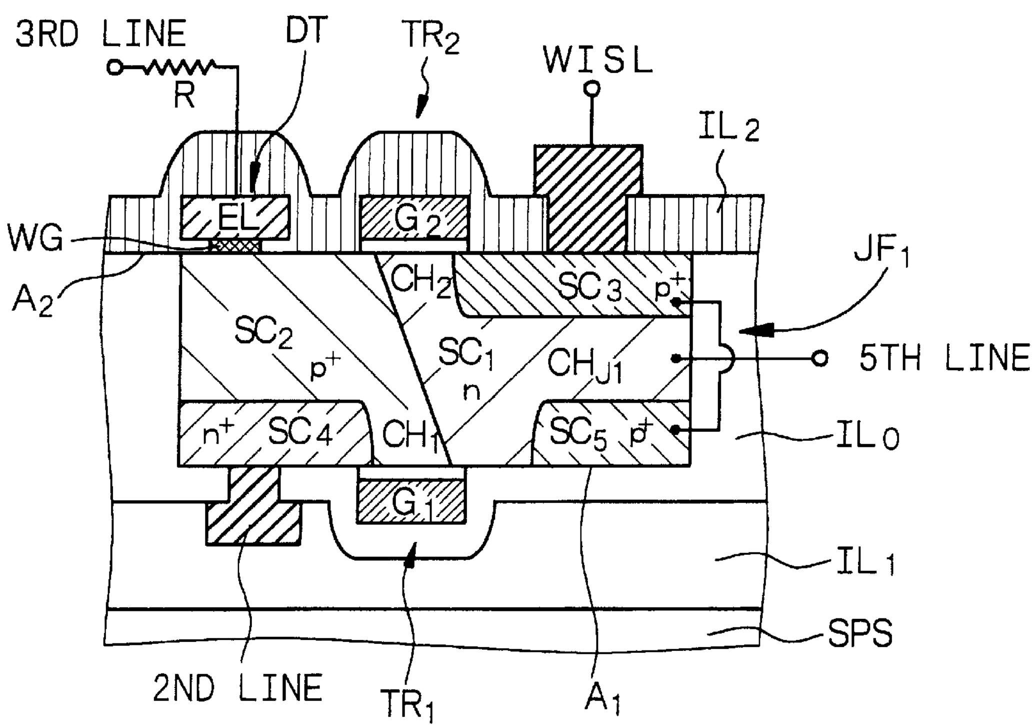

FIGS. 183A and 183B show schematic partial cross-sectional views of variants of the semiconductor memory cell of Example 18.

Figure 184A:
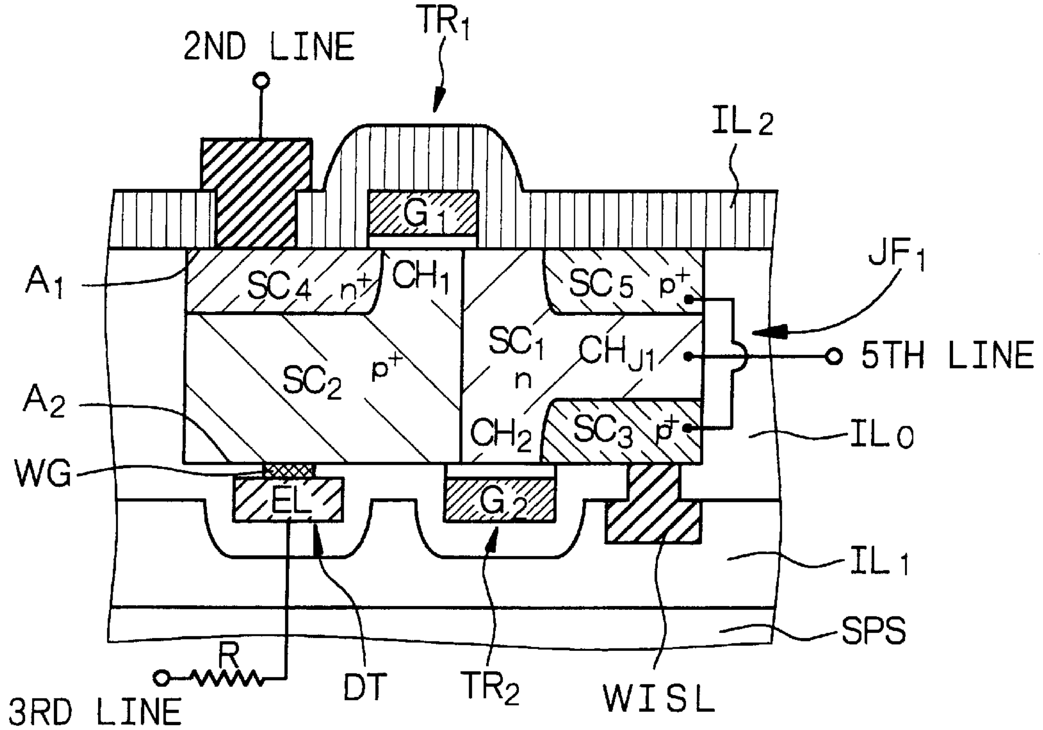
Figure 184B:
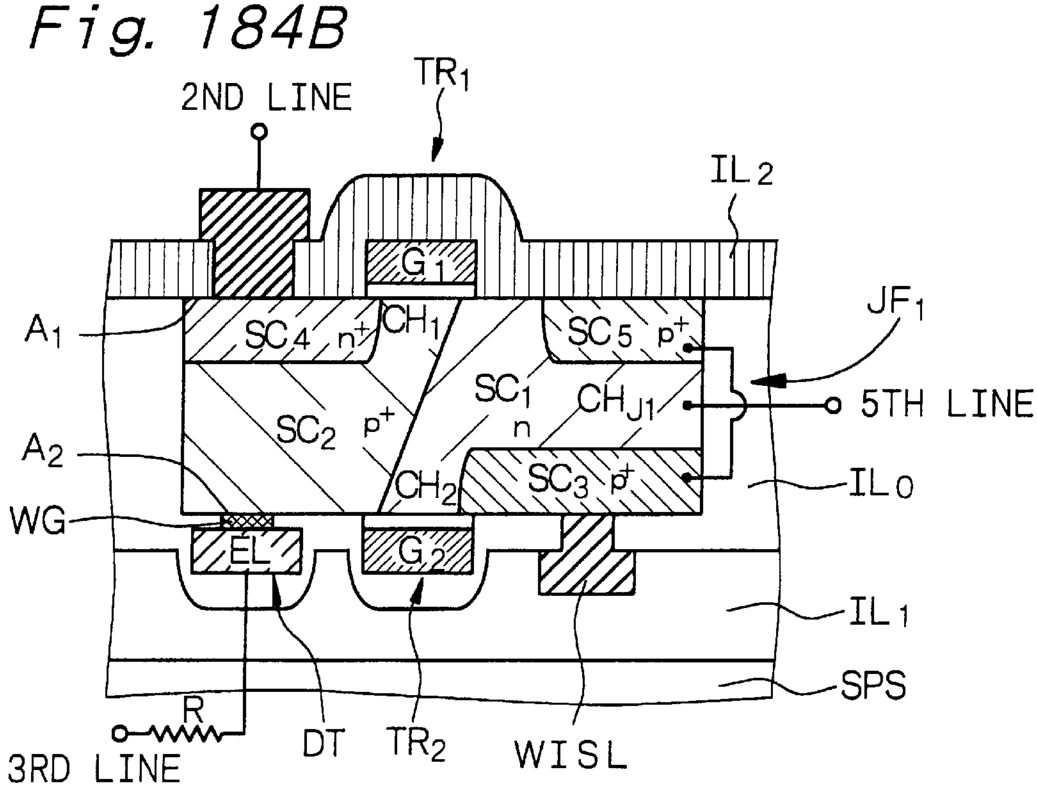

FIGS. 184A and 184B show schematic partial cross-sectional views of variants of the semiconductor memory cell of Example 18.

Figure 185A:
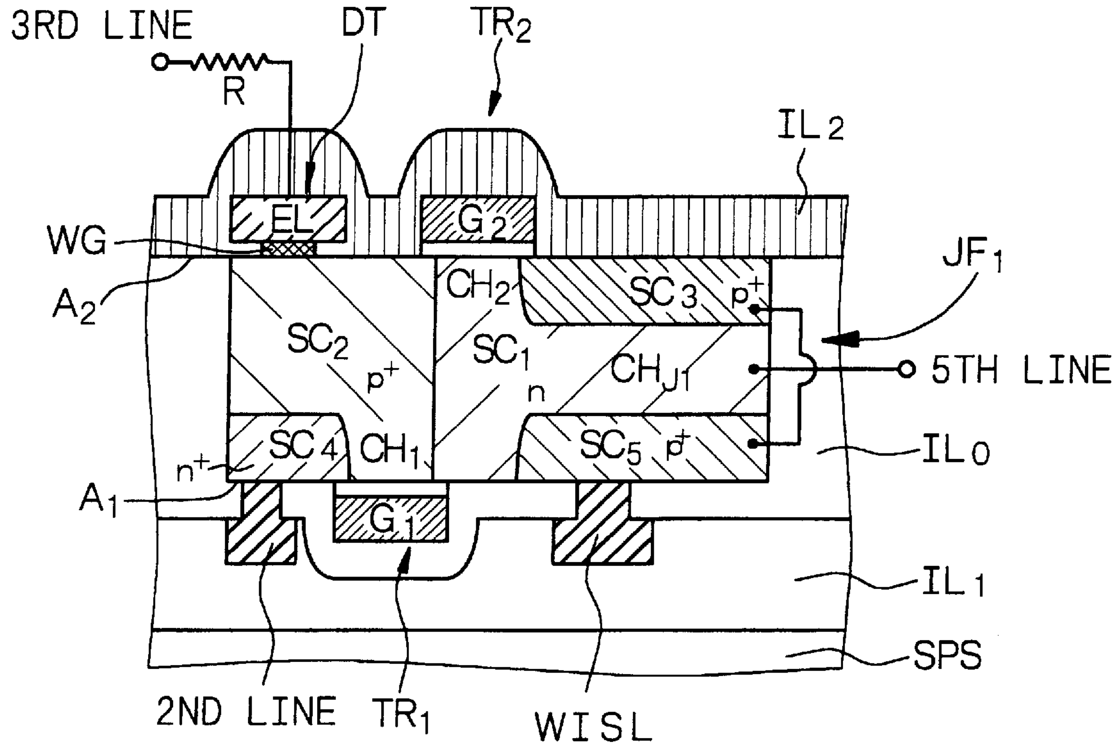
Figure 185B:
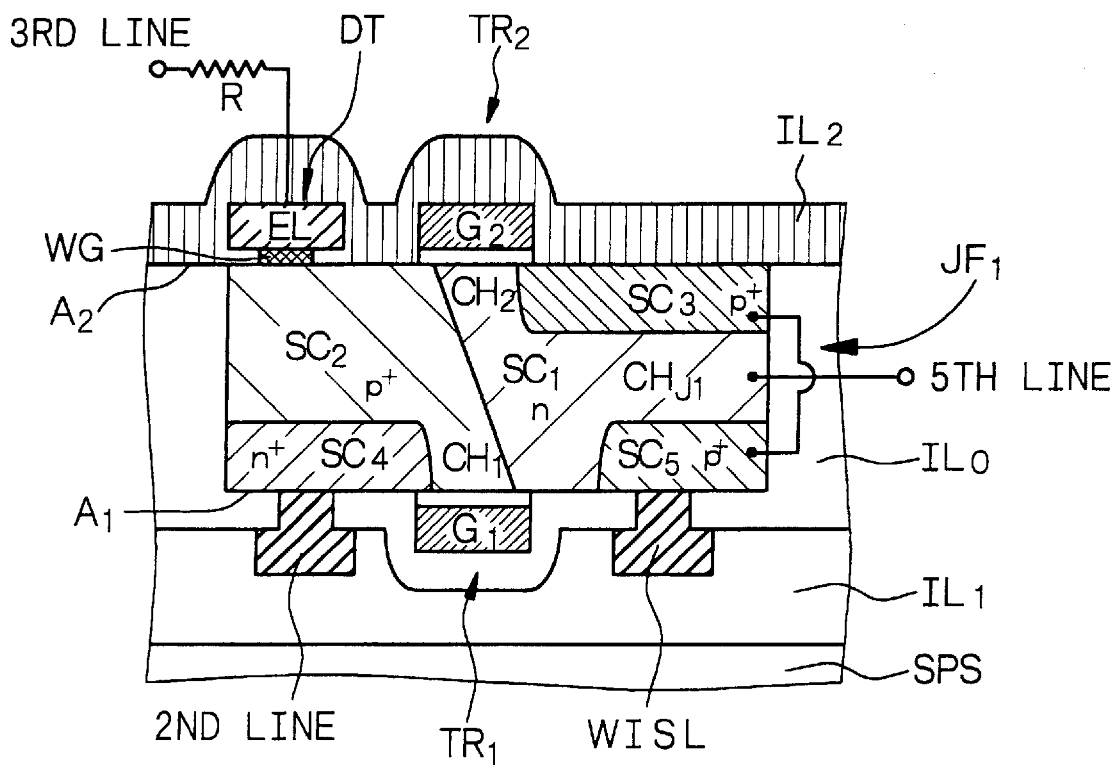

FIGS. 185A and 185B show schematic partial cross-sectional views of variants of the semiconductor memory cell of Example 18.

Figure 186A:
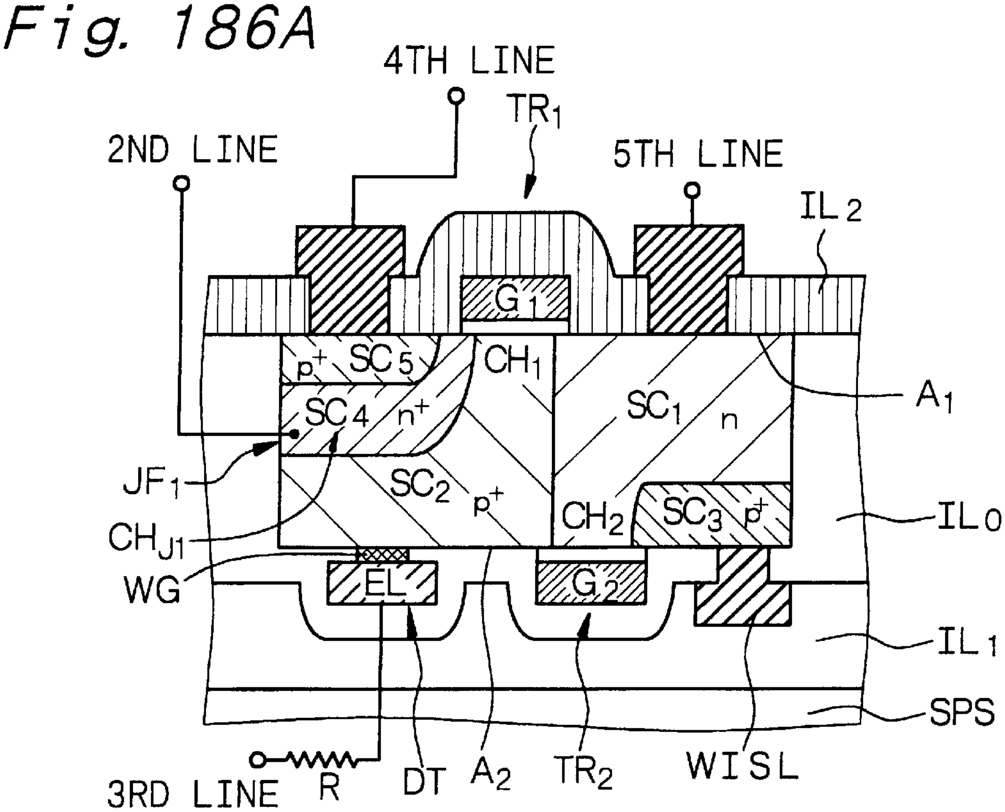
Figure 186B:
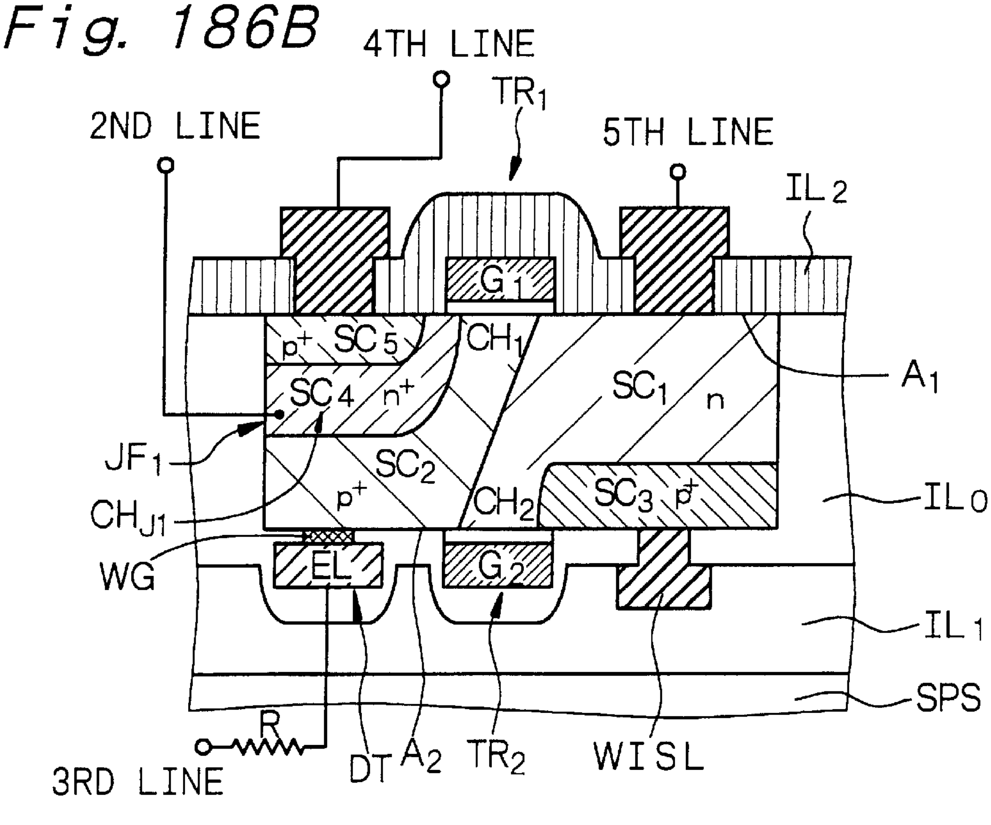

FIGS. 186A and 186B show schematic partial cross-sectional views of the semiconductor memory cells of Example 19.

Figure 187A:
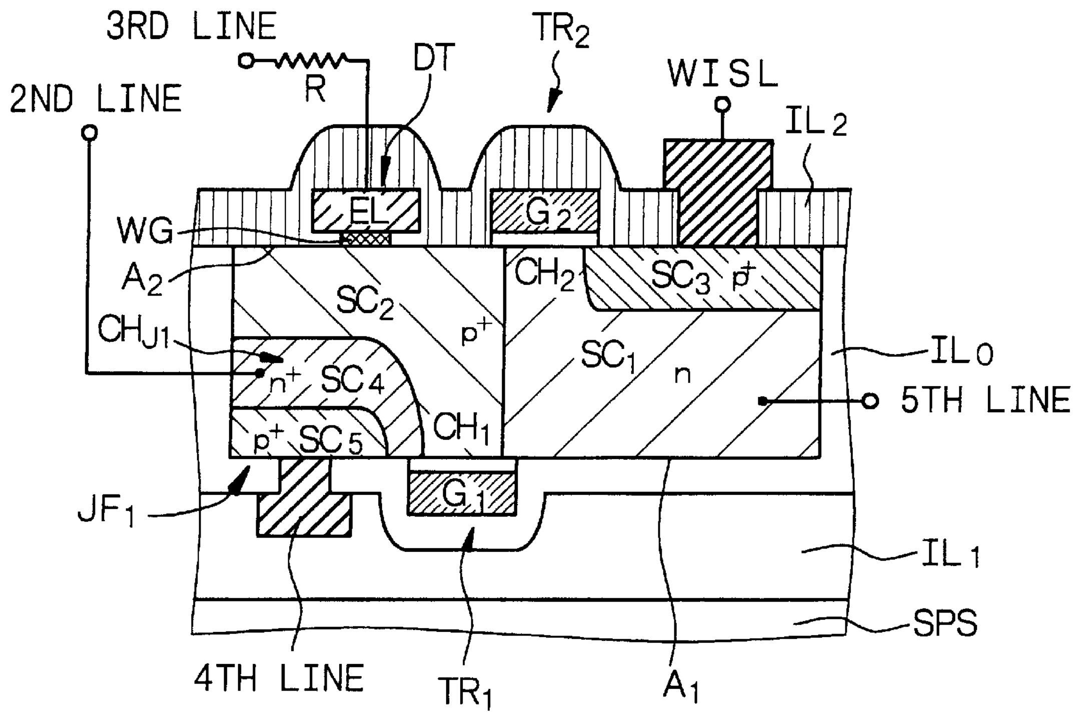
Figure 187B:
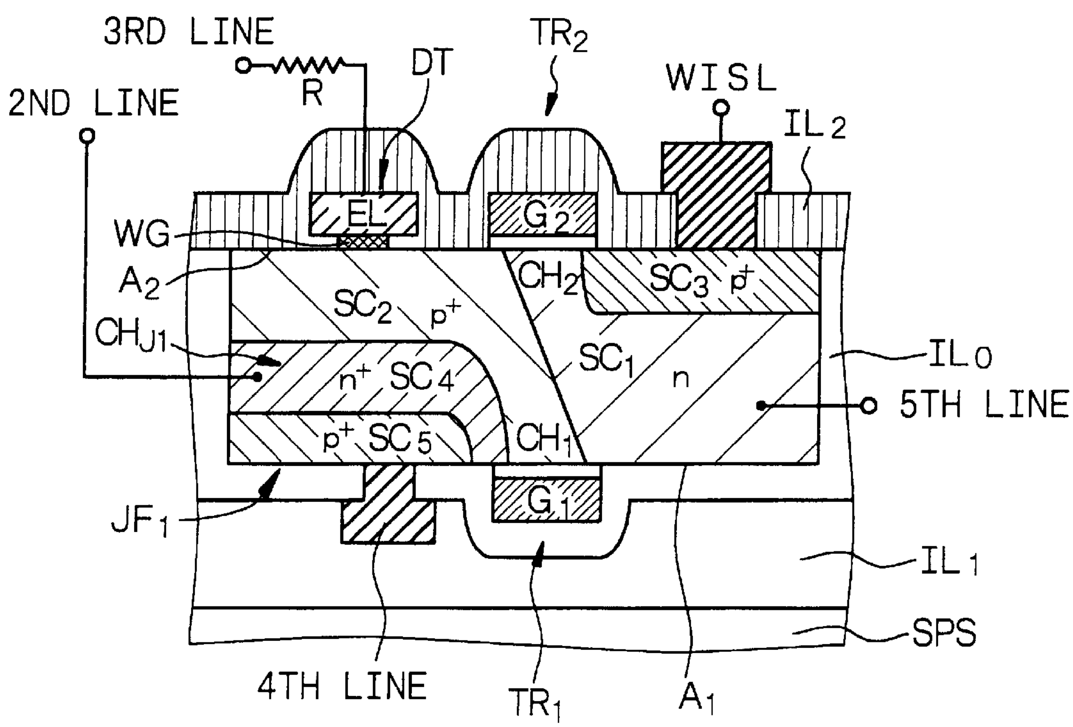

FIGS. 187A and 187B show schematic partial cross-sectional views of variants of the semiconductor memory cell of Example 19.

Figure 188A:
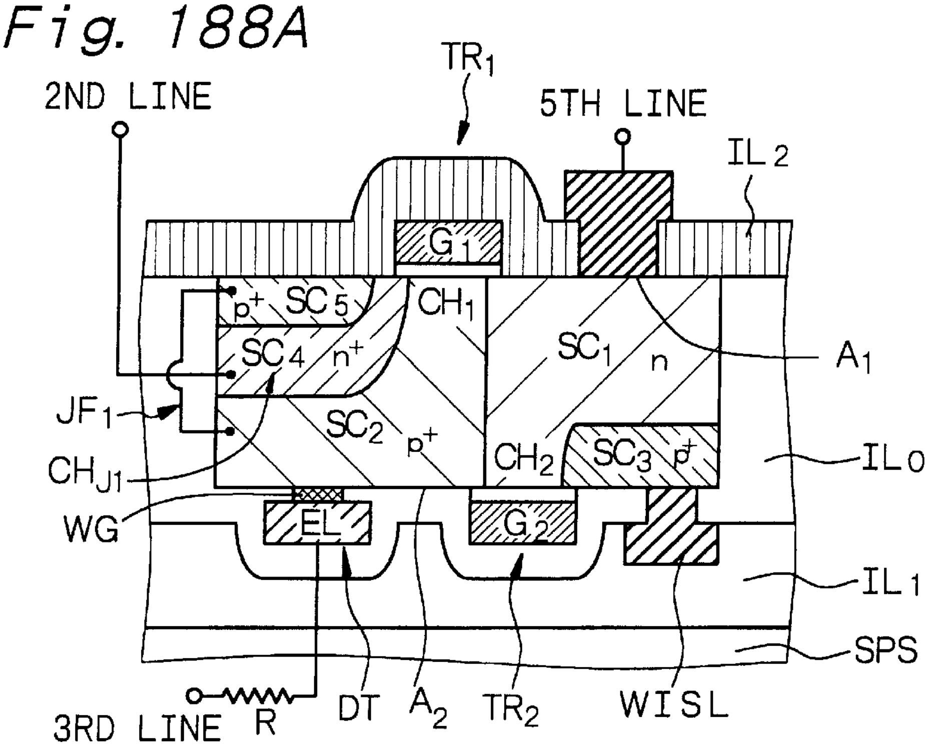
Figure 188B:
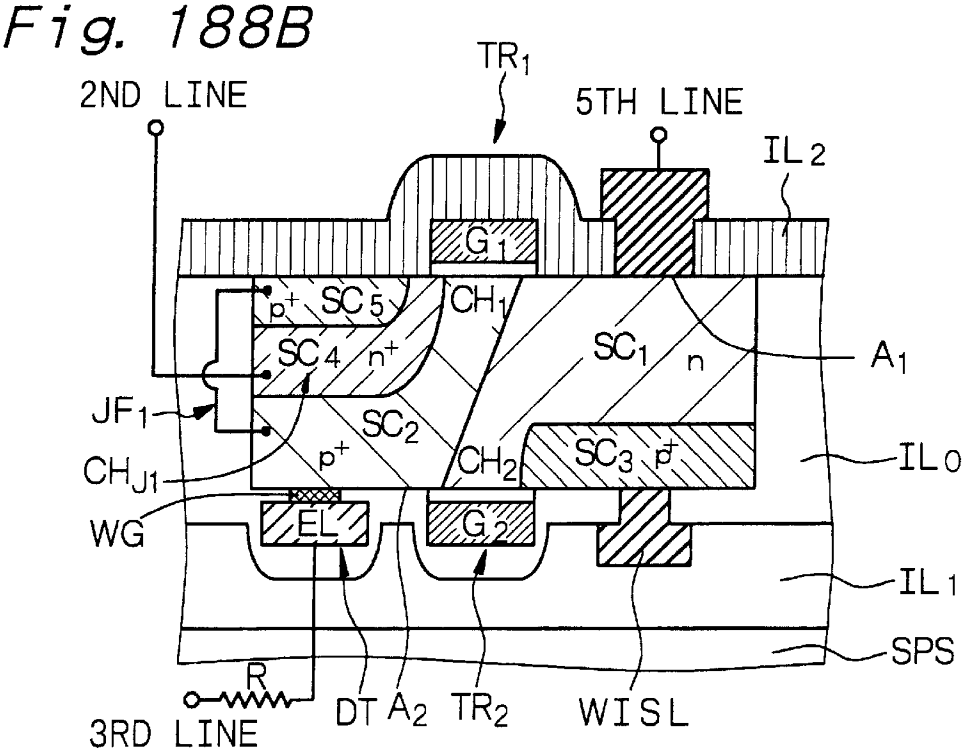

FIGS. 188A and 188B show schematic partial cross-sectional views of variants of the semiconductor memory cell of Example 19.

Figure 189A:
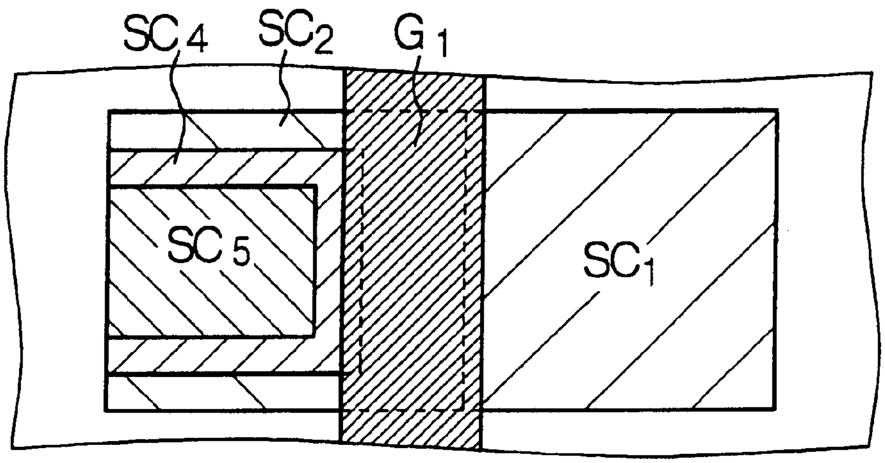
Figure 189B:
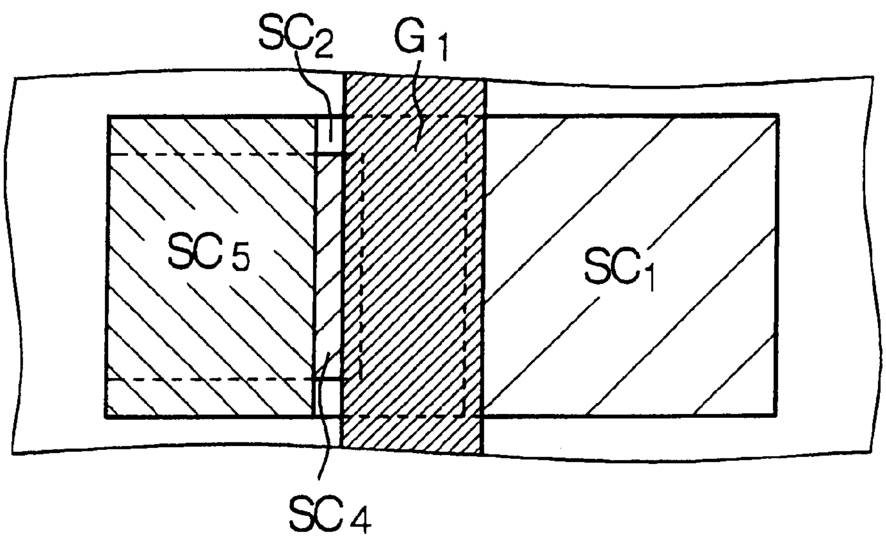

FIG. 189A shows a schematic layout of a gate and regions in the semiconductor memory cell of Example 19, and FIG. 189B shows a schematic layout of a gate and regions in a variant of the semiconductor memory cell of Example 19.

Figure 190A:
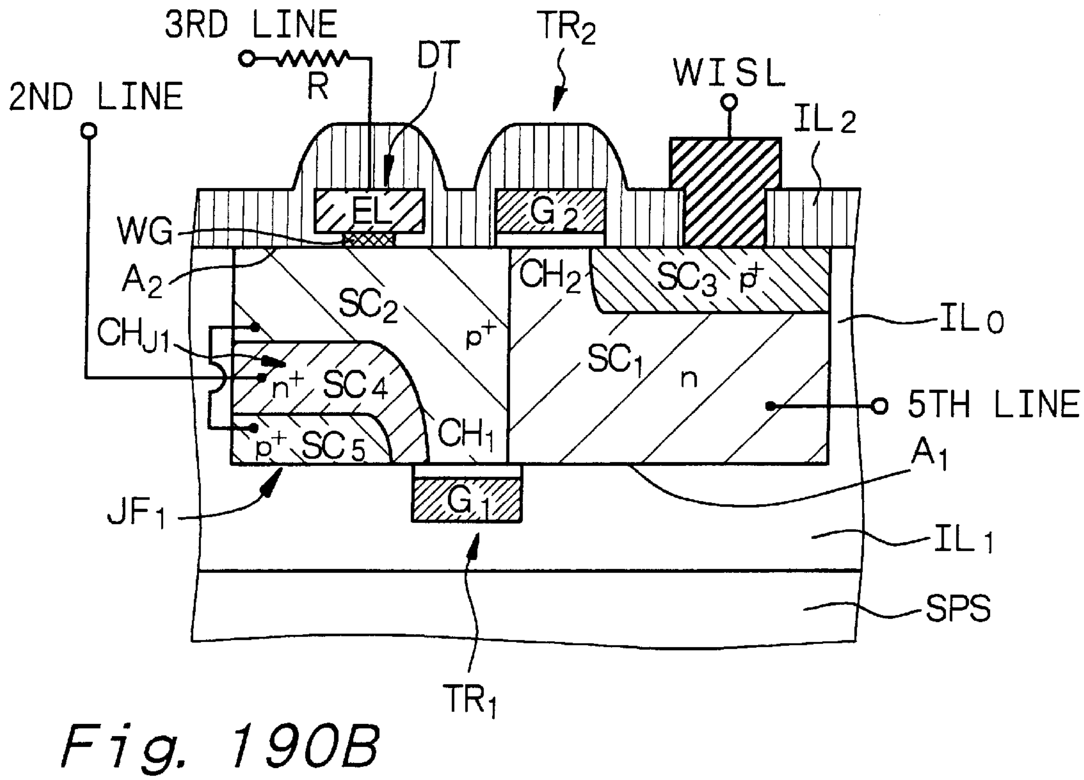
Figure 190B:
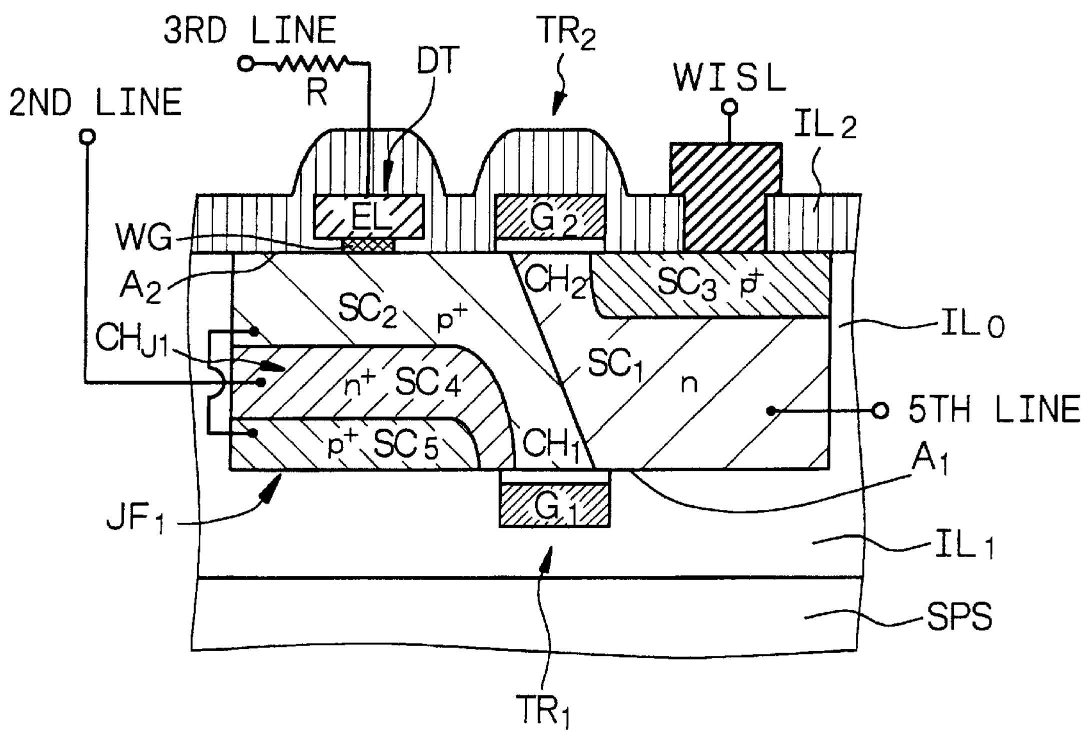

FIGS. 190A and 190B show schematic partial cross-sectional views of variants of the semiconductor memory cell of Example 19.

Figure 191:
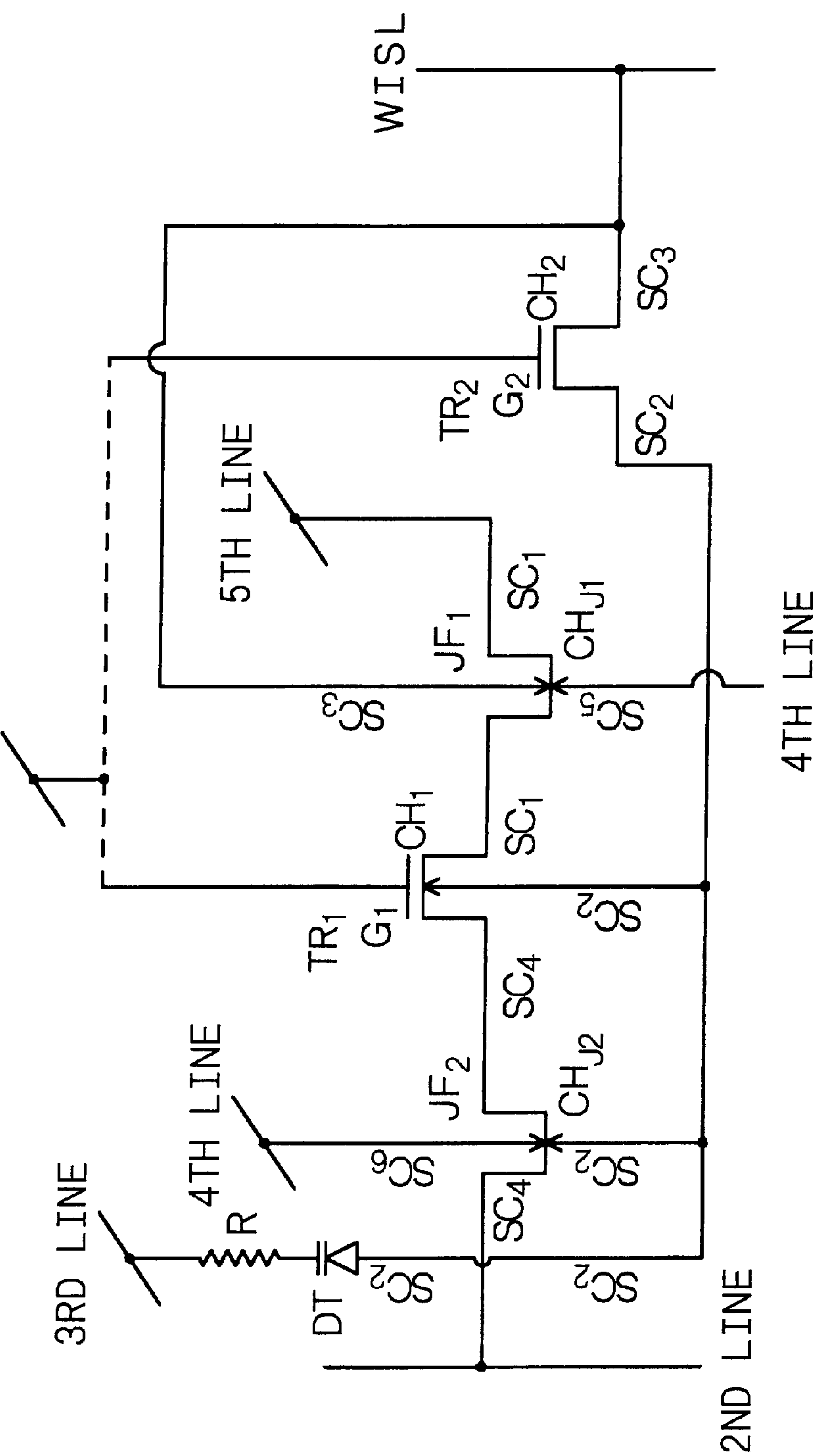

FIG. 191 shows the principle of the semiconductor memory cell according to the twenty-seventh aspect of the present invention.

Figure 192A:
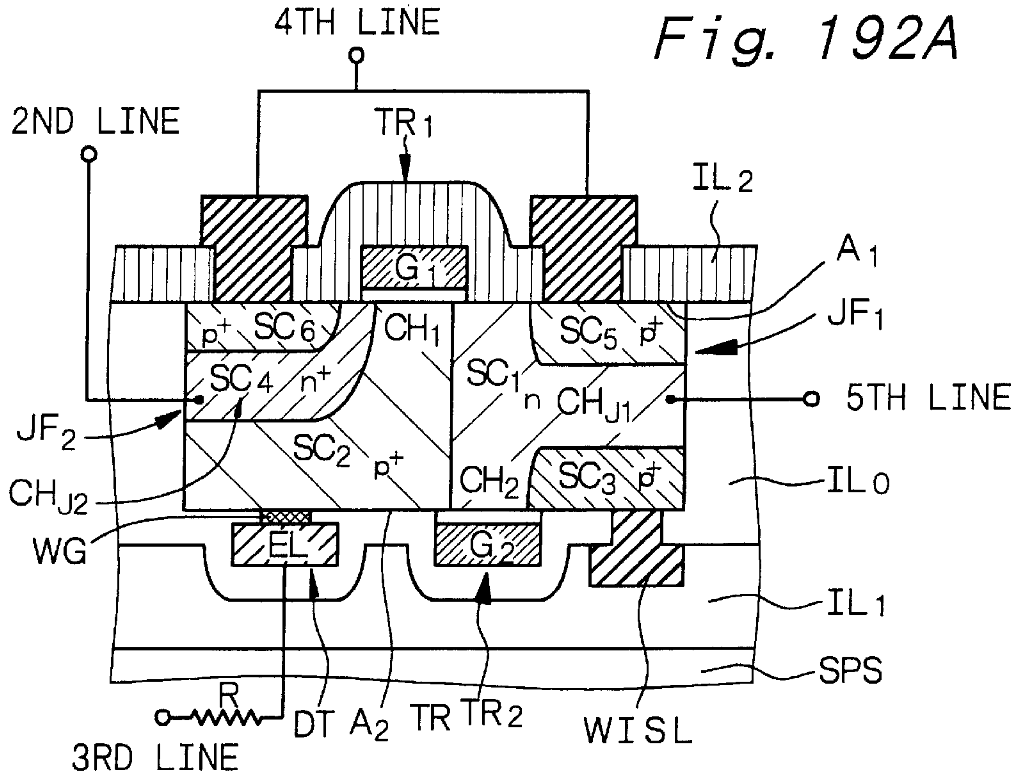
Figure 192B:
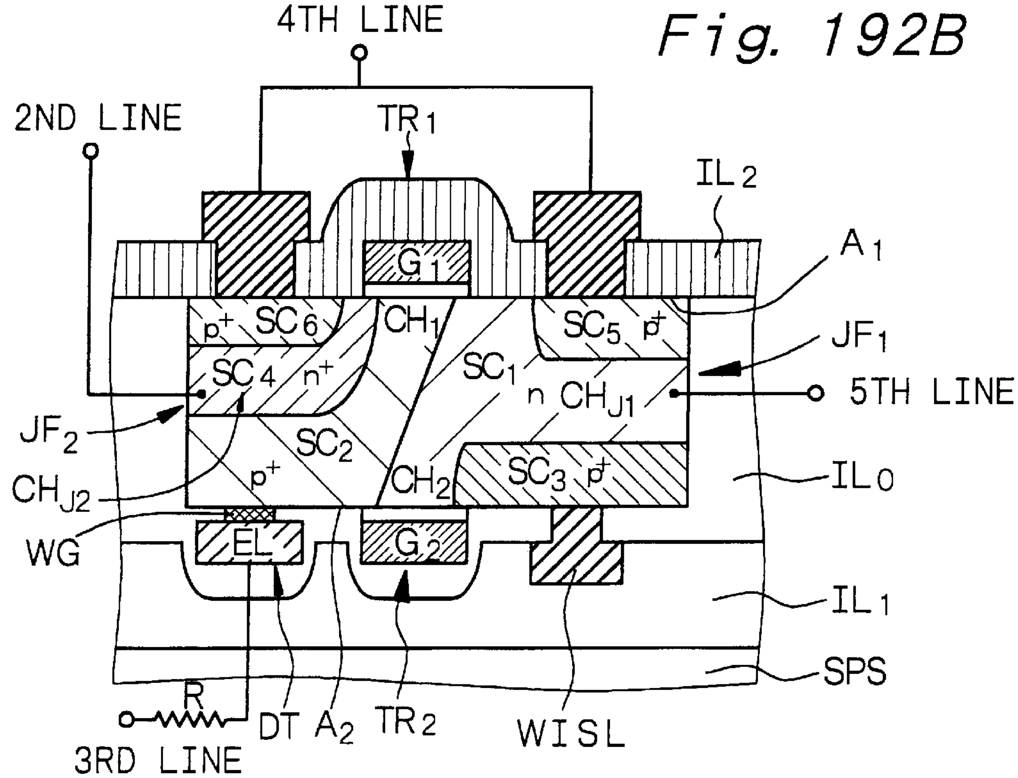

FIGS. 192A and 192B show schematic partial cross-sectional views of the semiconductor memory cells of Example 20.

Figure 193A:
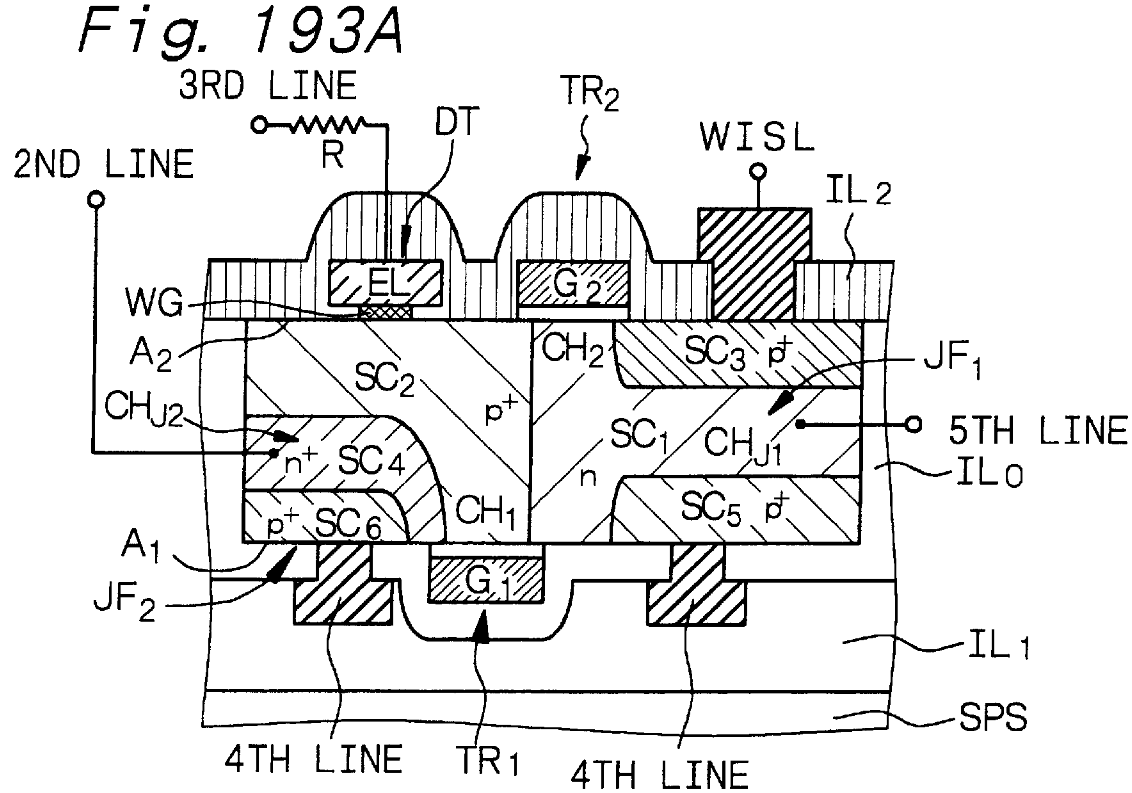
Figure 193B:
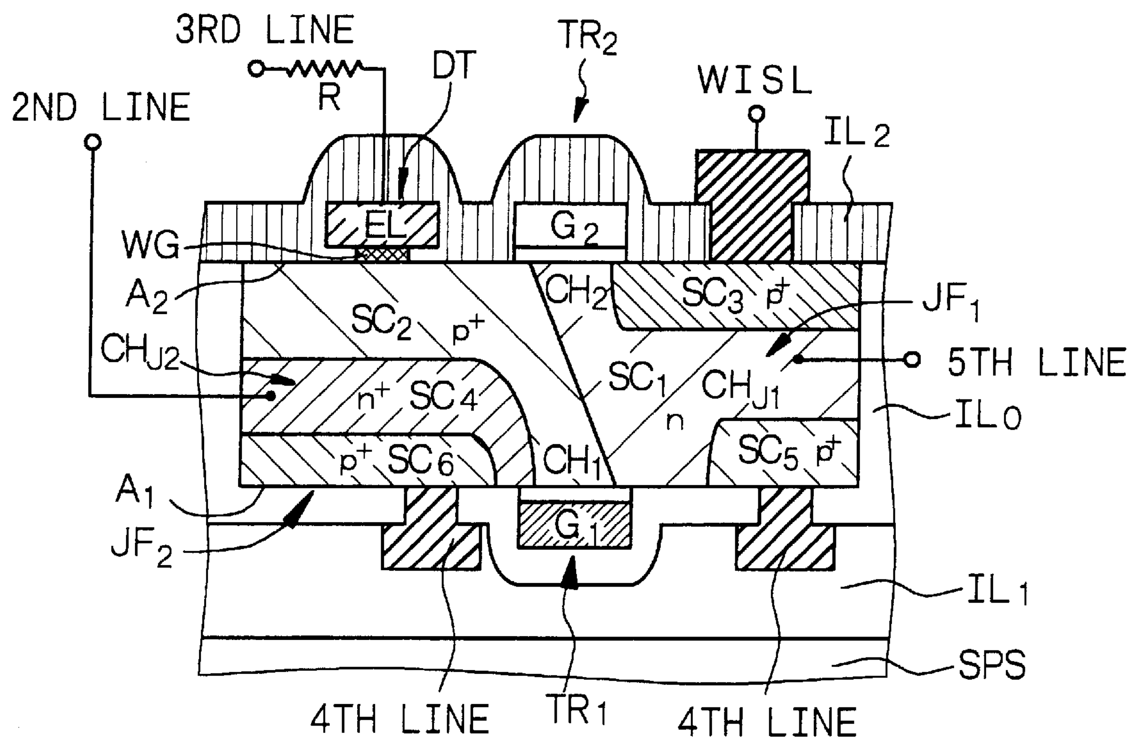

FIGS. 193A and 193B show schematic partial cross-sectional views of variants of the semiconductor memory cell of Example 20.

Figure 194:
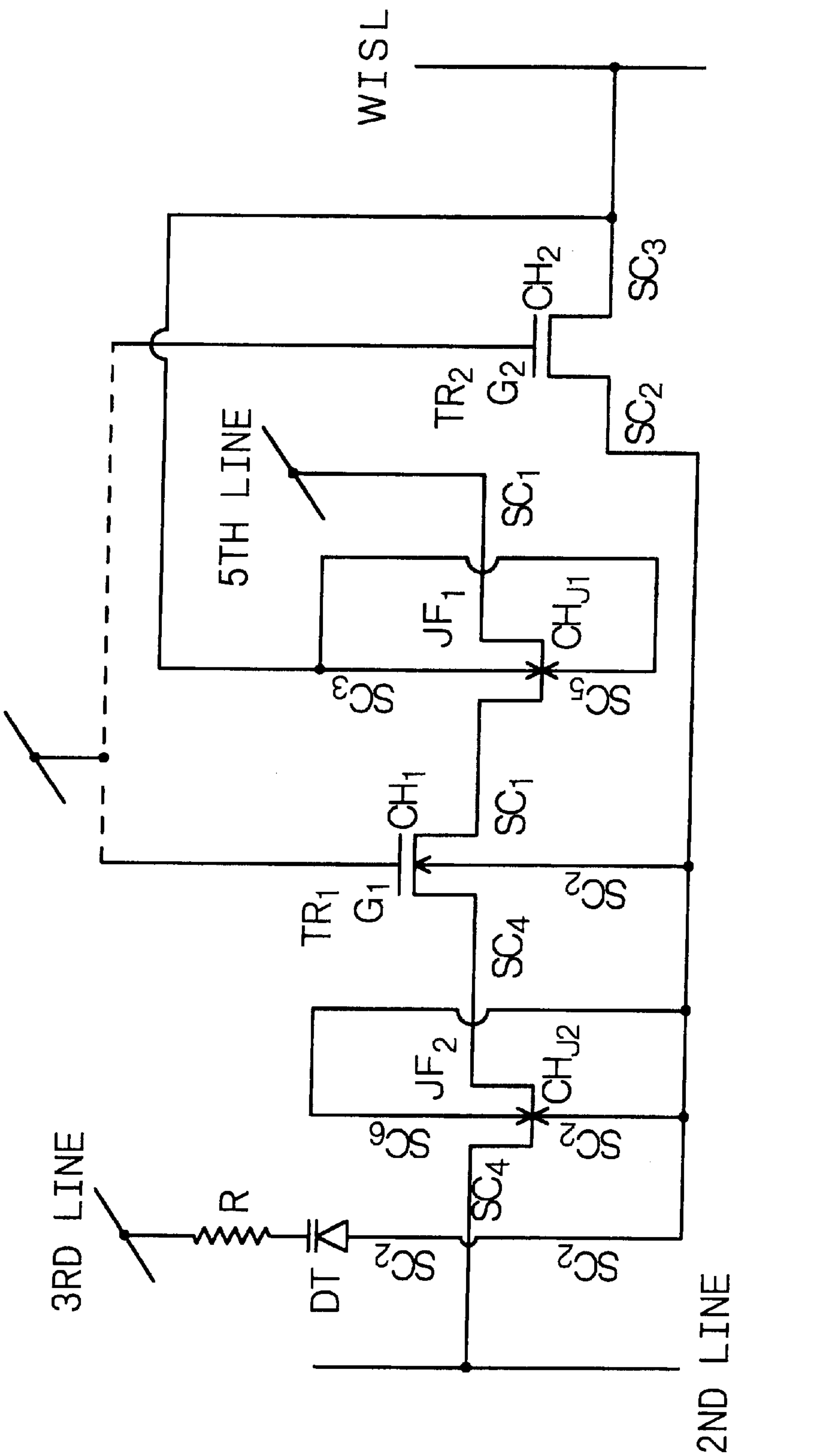

FIG. 194 shows the principle of a variant of the semiconductor memory cell according to the twenty-seventh aspect of the present invention.

Figure 195A:
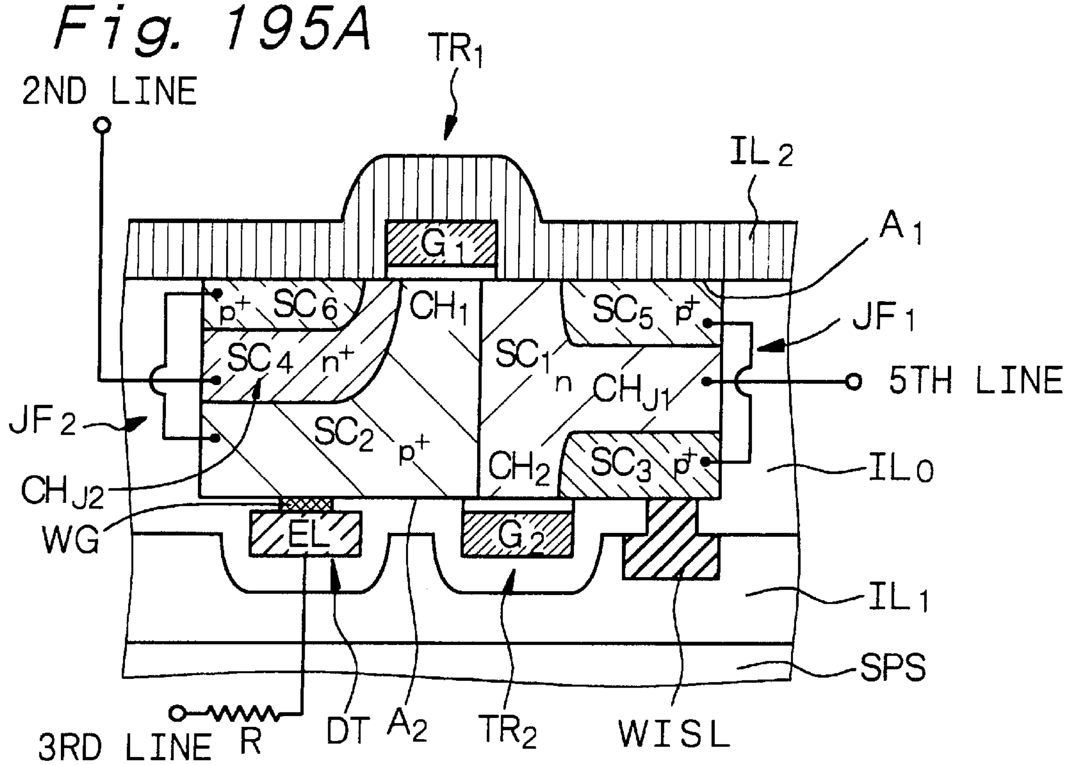
Figure 195B:
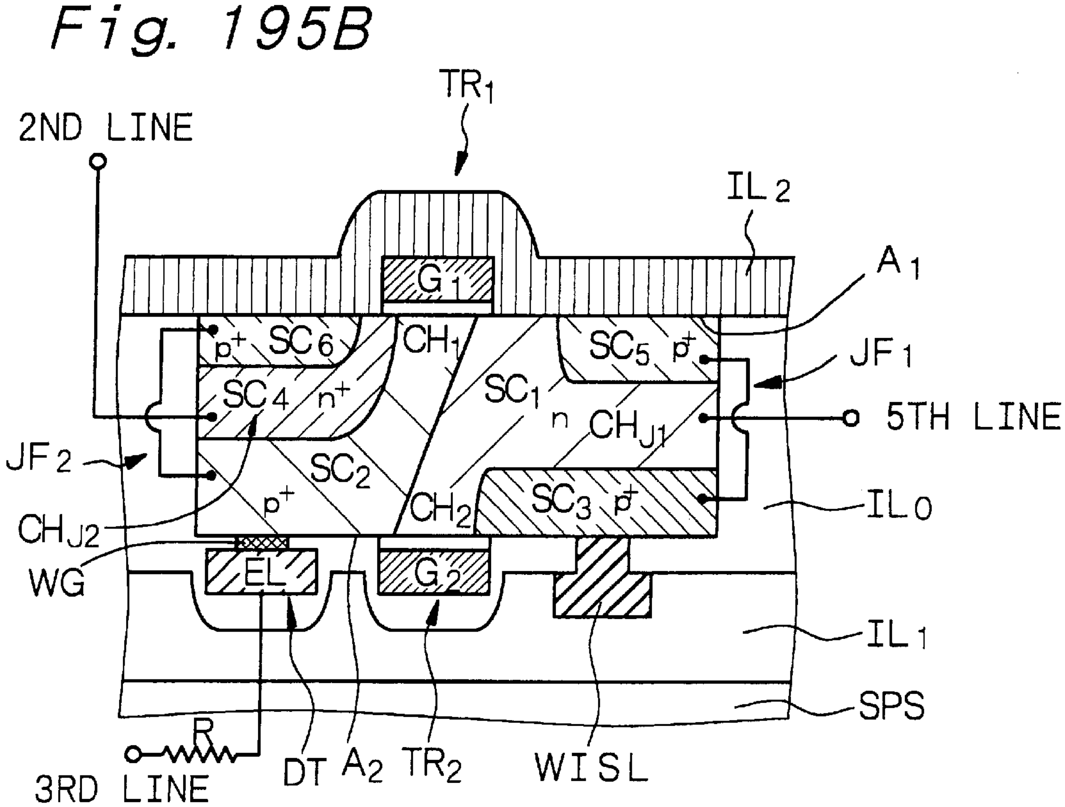

FIGS. 195A and 195B show schematic partial cross-sectional views of variants of the semiconductor memory cell of Example 20.

Figure 196A:
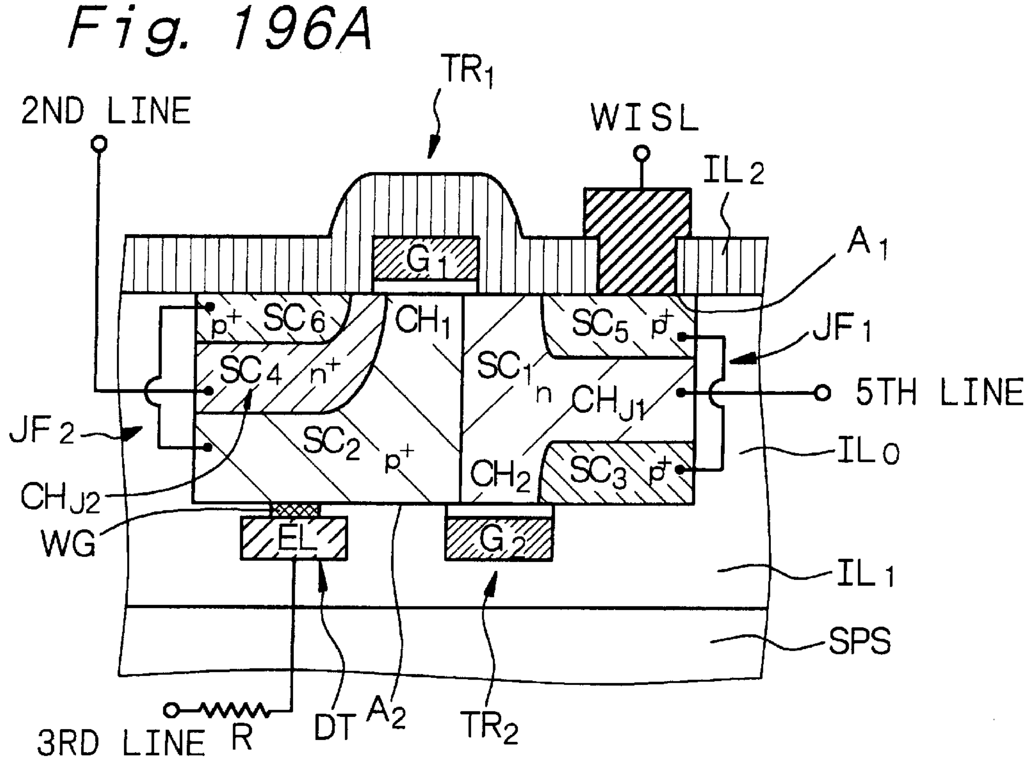
Figure 196B:
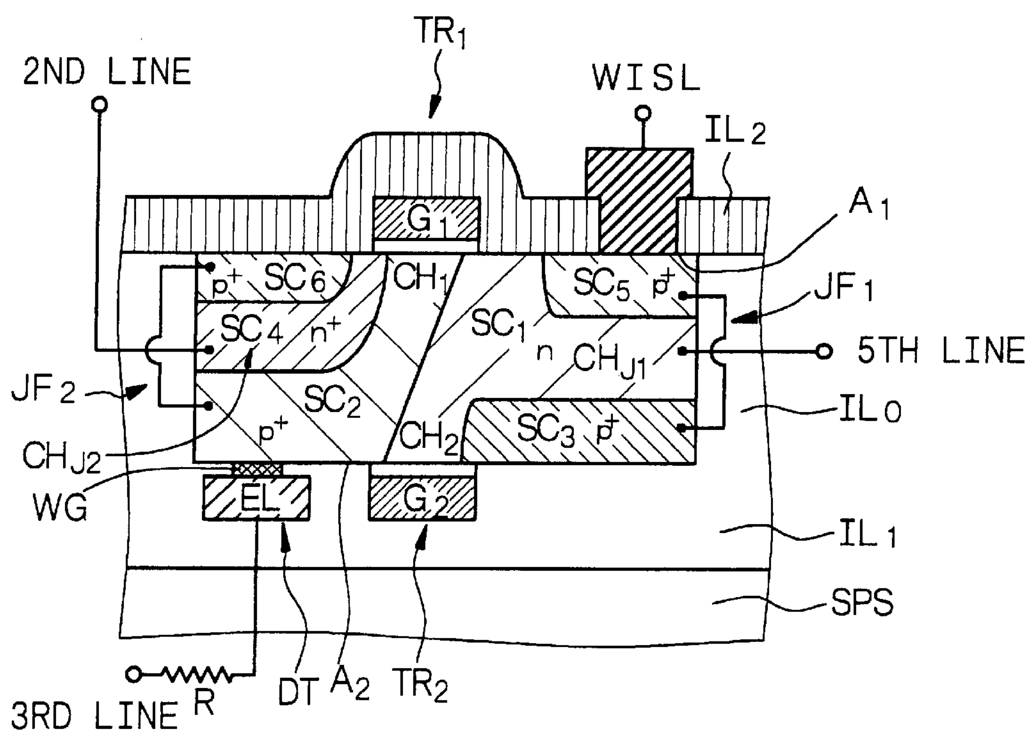

FIGS. 196A and 196B show schematic partial cross-sectional views of variants of the semiconductor memory cell of Example 20.

Figure 197A:
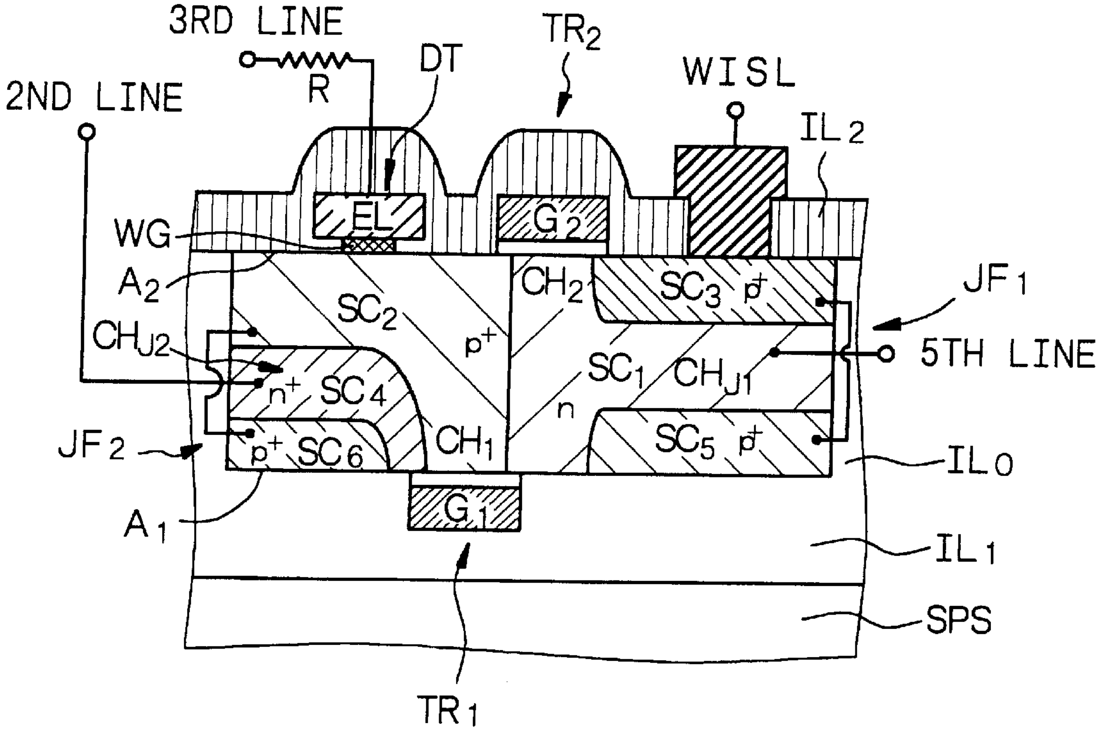
Figure 197B:
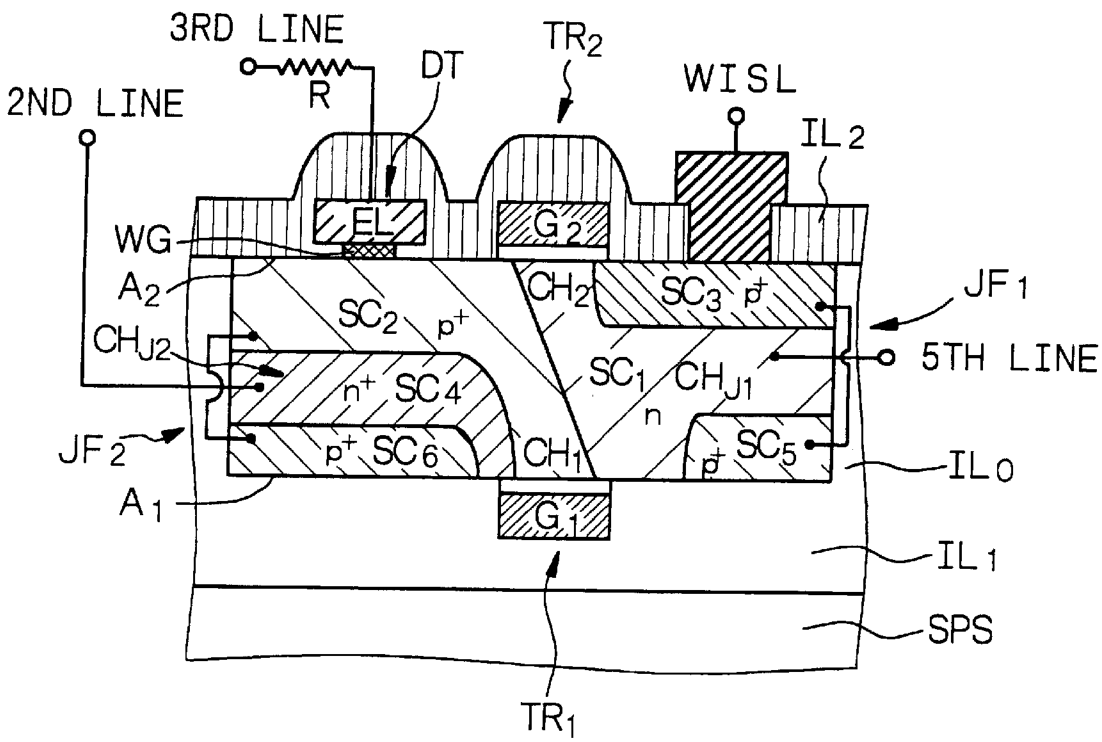

FIGS. 197A and 197B show schematic partial cross-sectional views of variants of the semiconductor memory cell of Example 20.

Figure 198A:
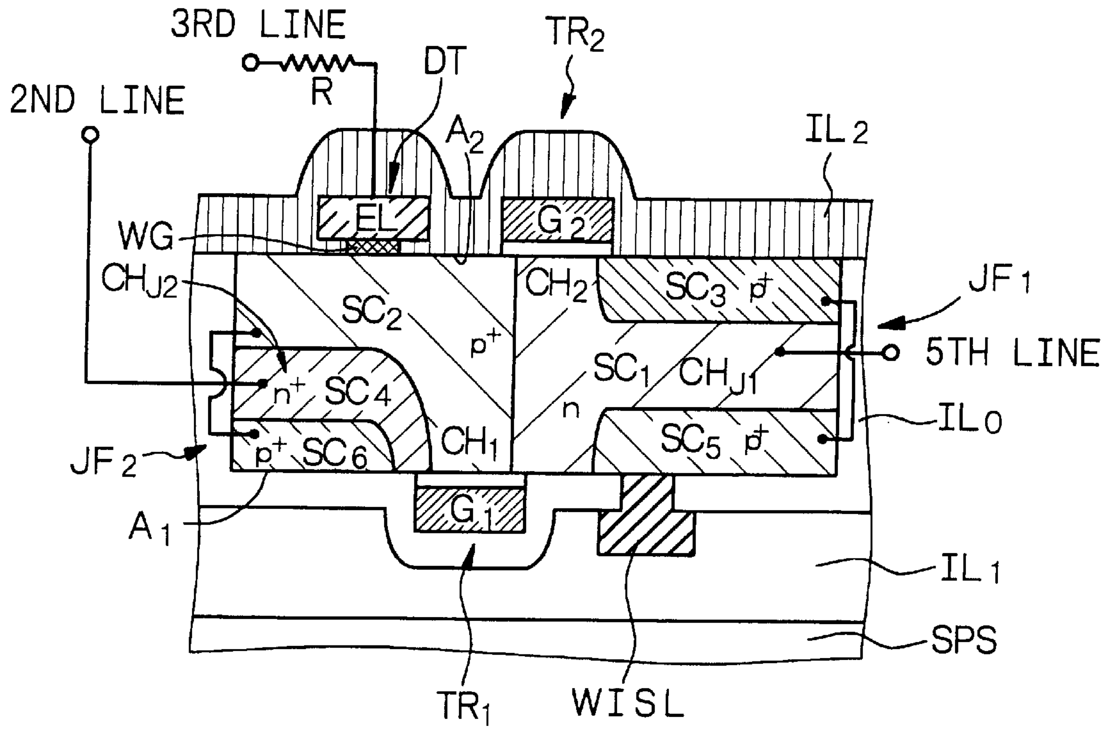
Figure 198B:
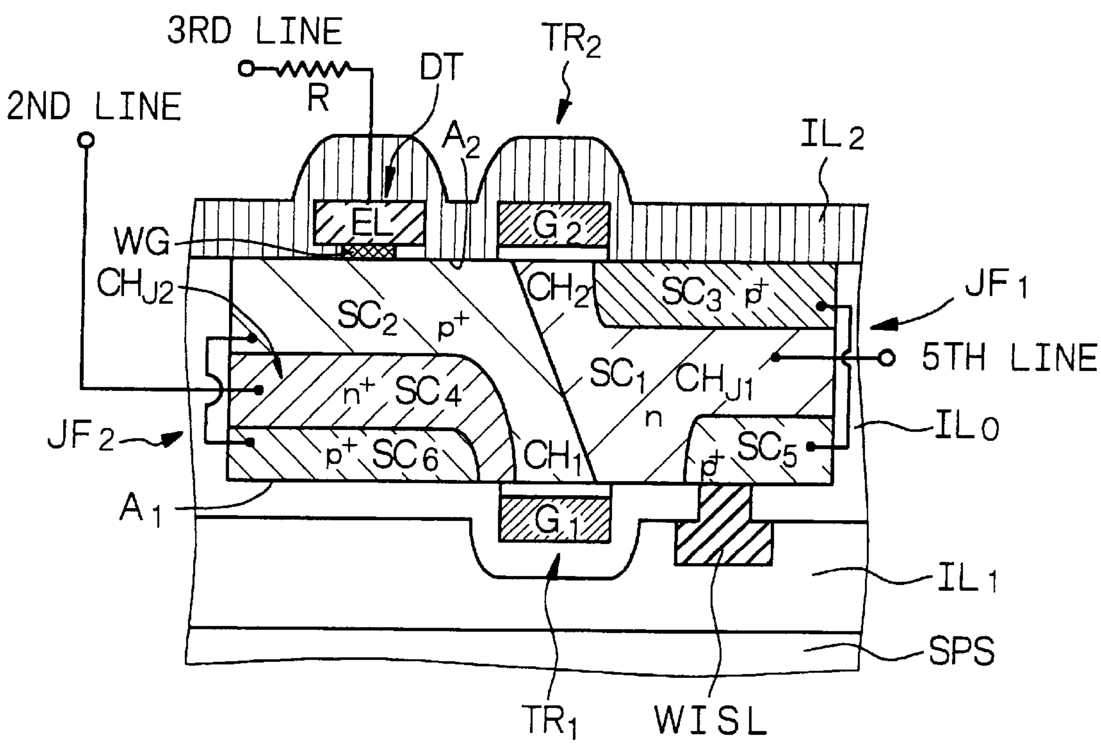

FIGS. 198A and 198B show schematic partial cross-sectional views of variants of the semiconductor memory cell of Example 20.

Figure 199A:
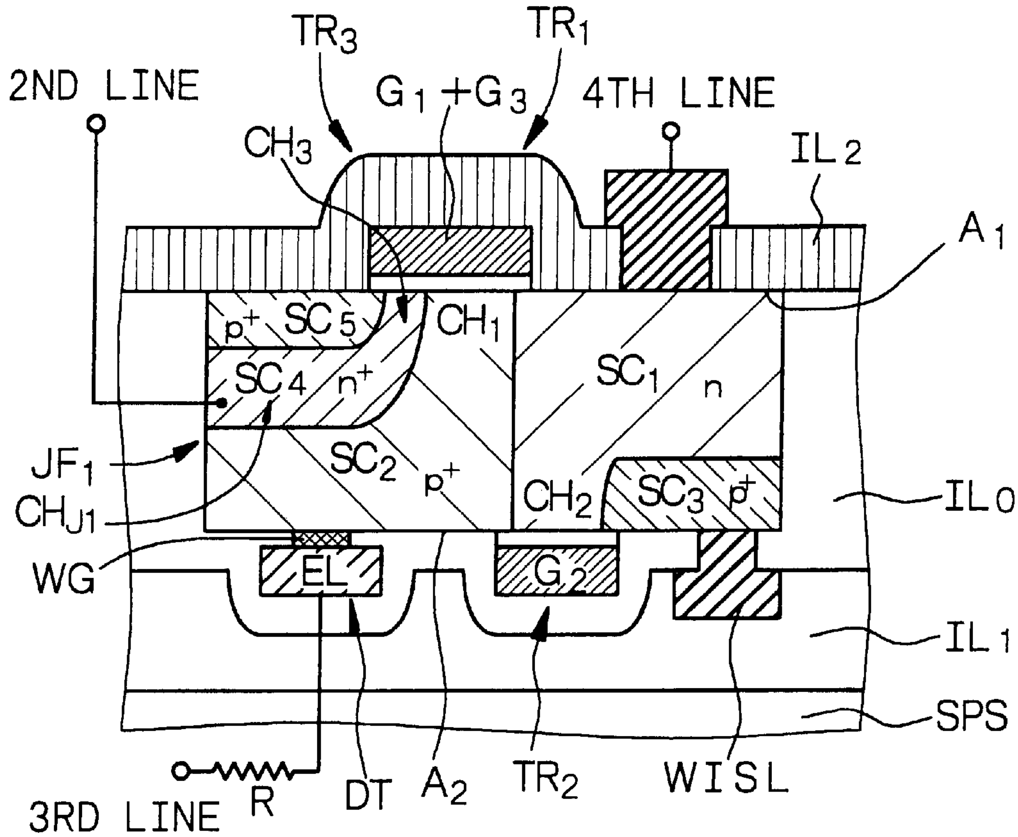
Figure 199B:
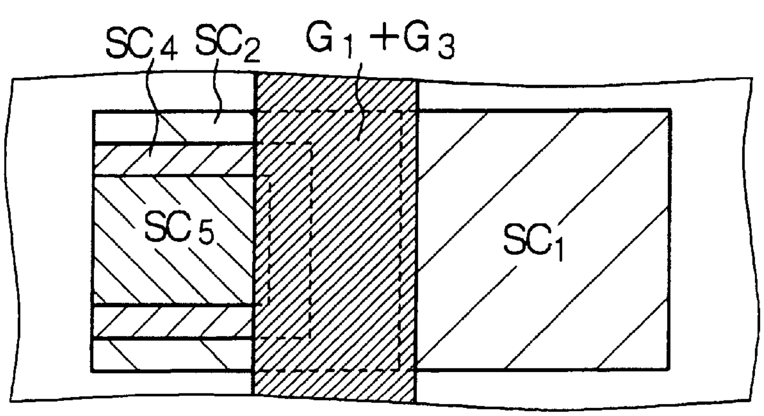

FIG. 199A shows a schematic partial cross-sectional view of a semiconductor memory cell of Example 21, and FIG. 199B shows a schematic layout of gates and regions thereof.

Figure 200:
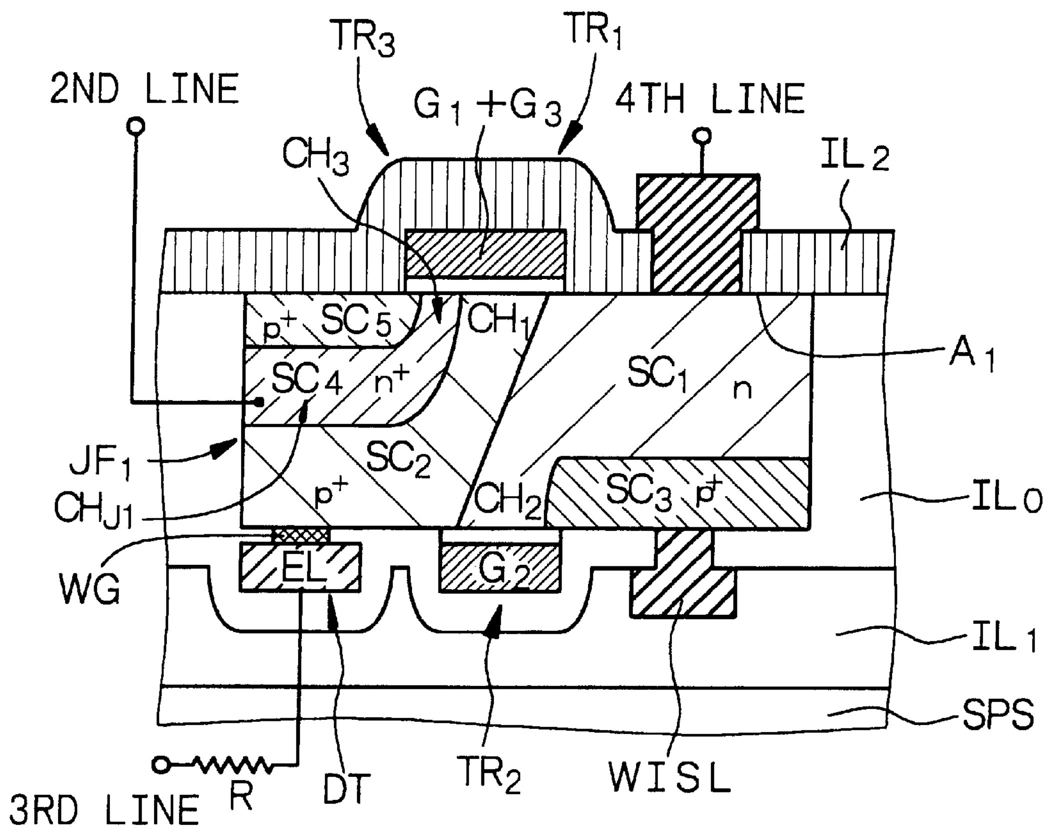

FIG. 200 shows a schematic partial cross-sectional view of a variant of the semiconductor memory cell of Example 21.

Figure 201A:
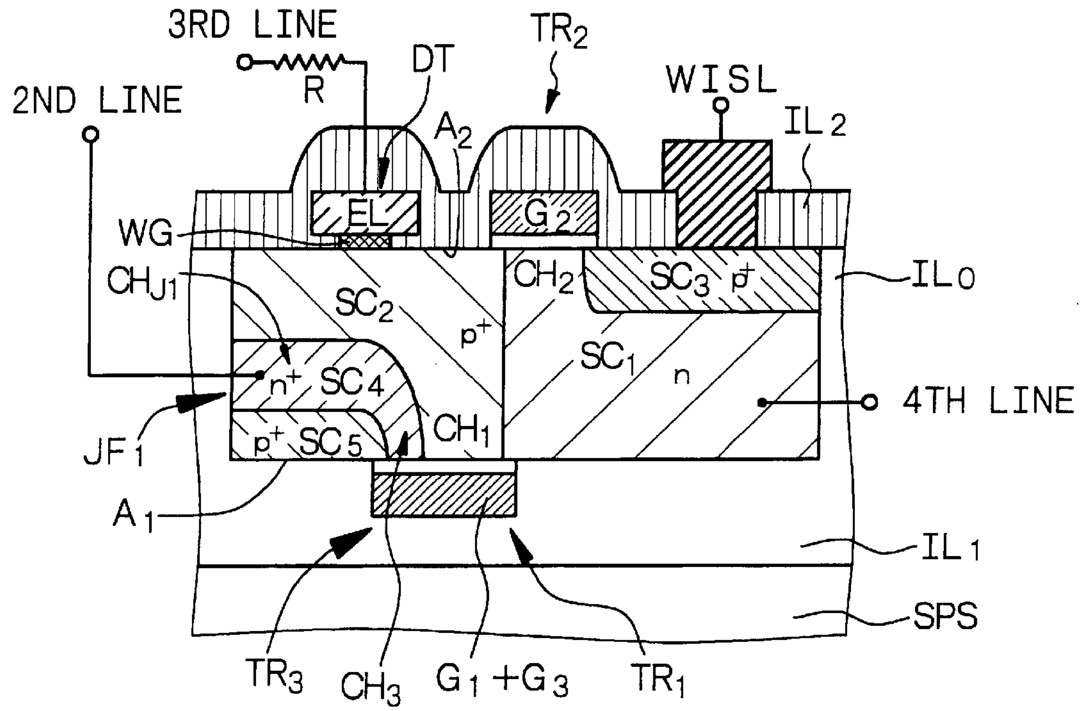
Figure 201B:
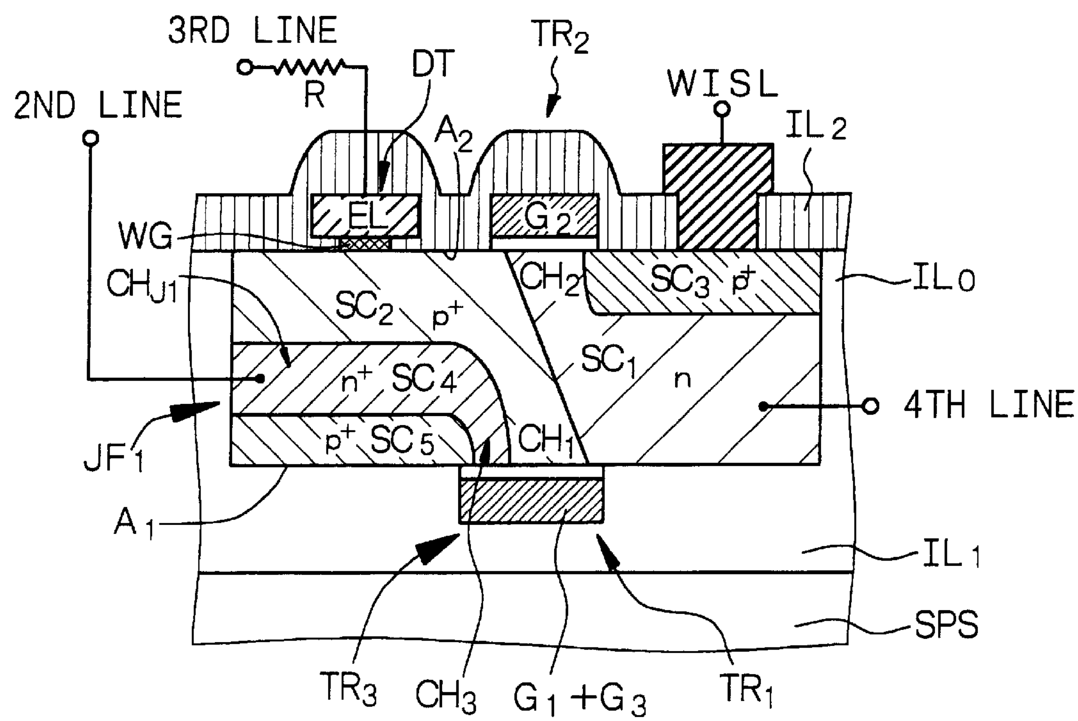

FIGS. 201A and 201B show schematic partial cross-sectional views of variants of the semiconductor memory cell of Example 21.

Figure 202:
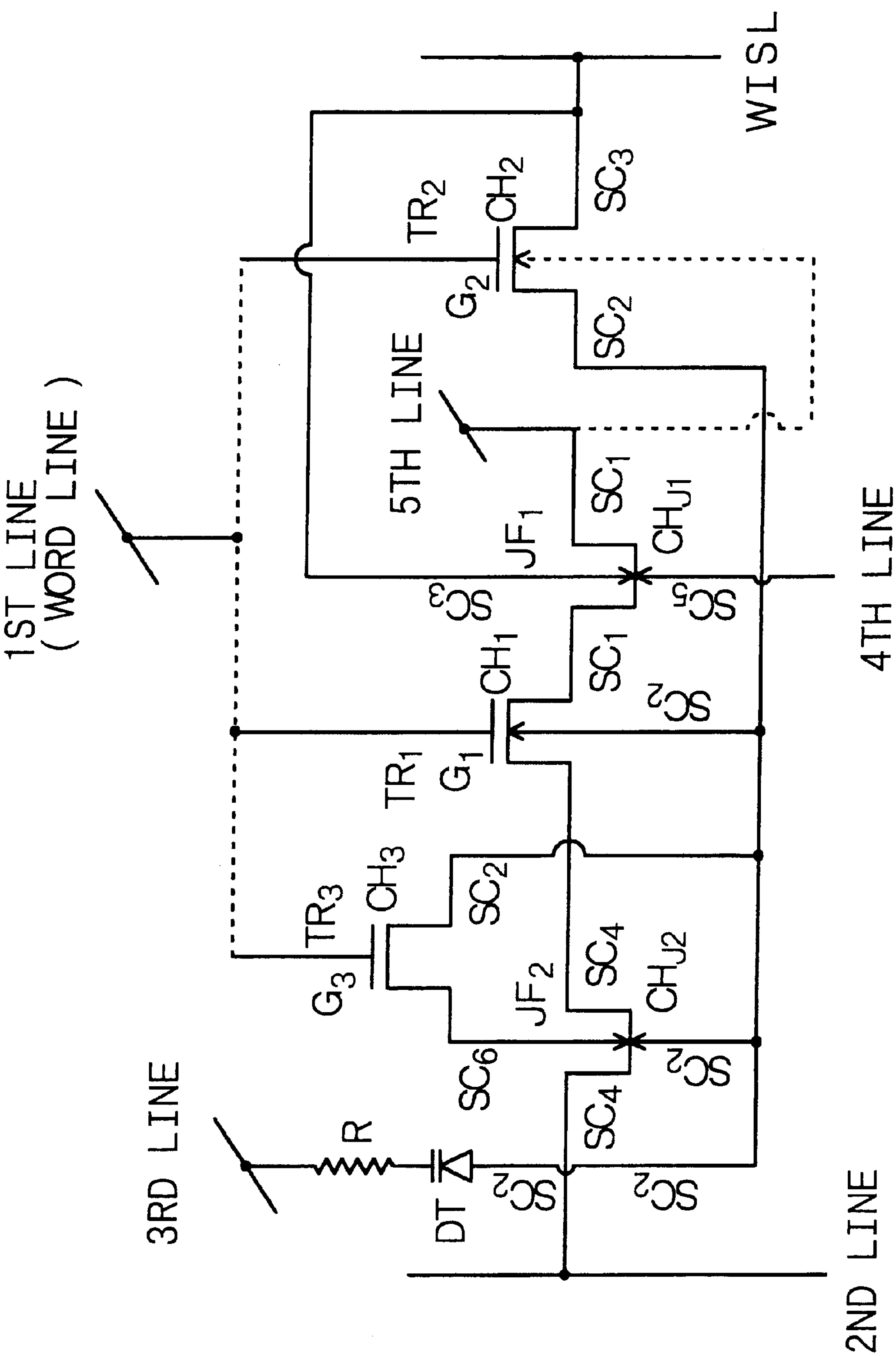

FIG. 202 shows the principle of the semiconductor memory cell according to the twenty-ninth aspect of the present invention.

Figure 203A:
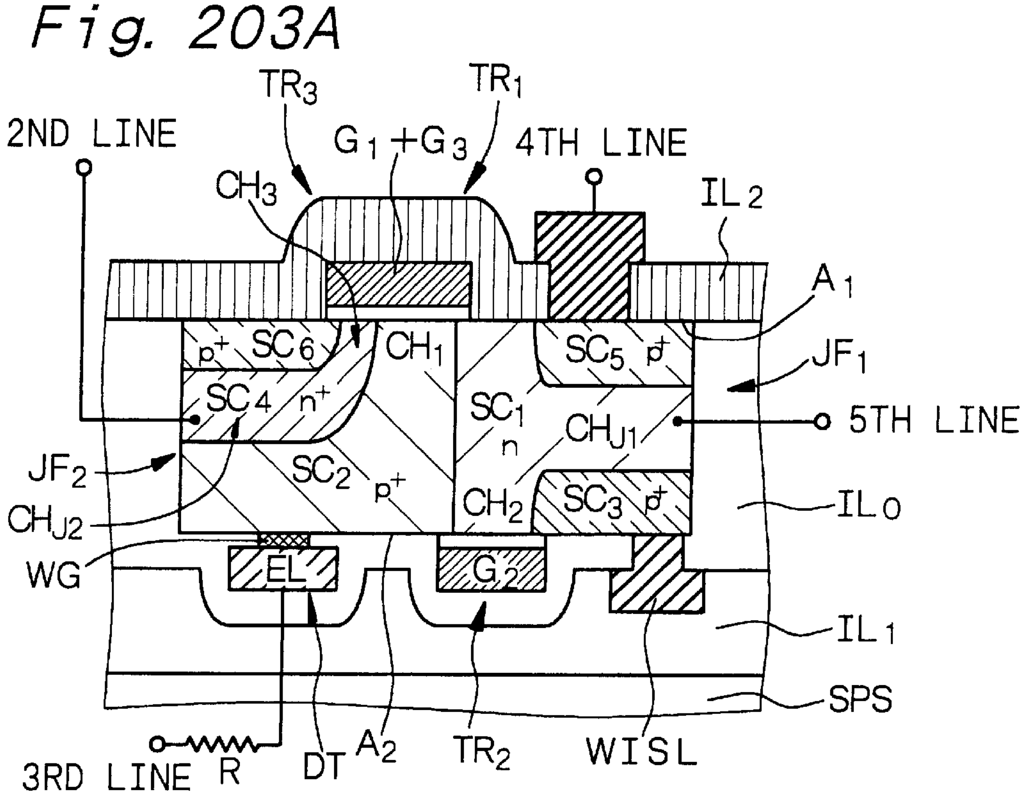
Figure 203B:
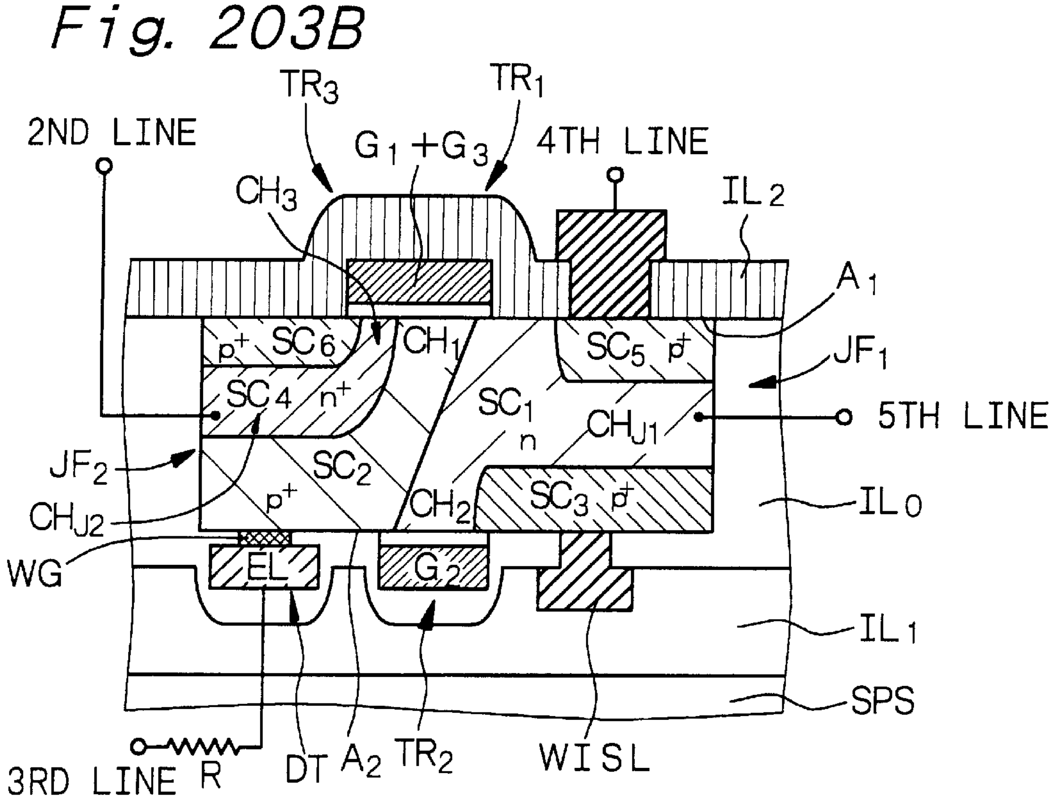

FIGS. 203A and 203B show schematic partial cross-sectional views of the semiconductor memory cells of Example 22.

Figure 204A:
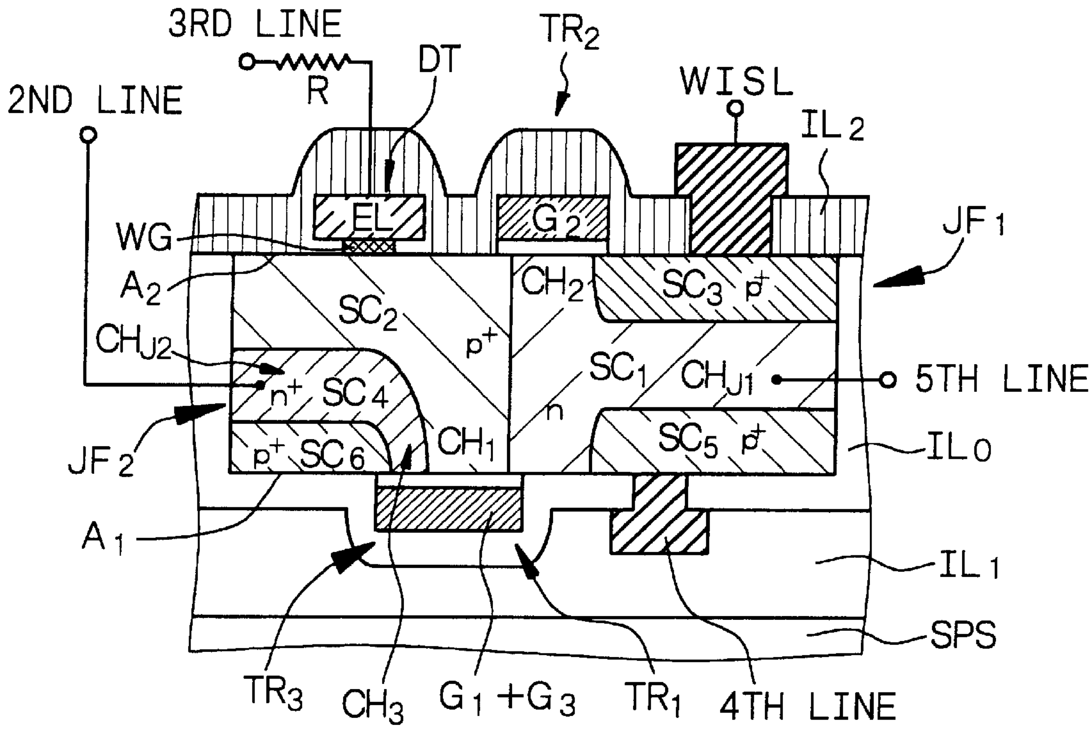
Figure 204B:
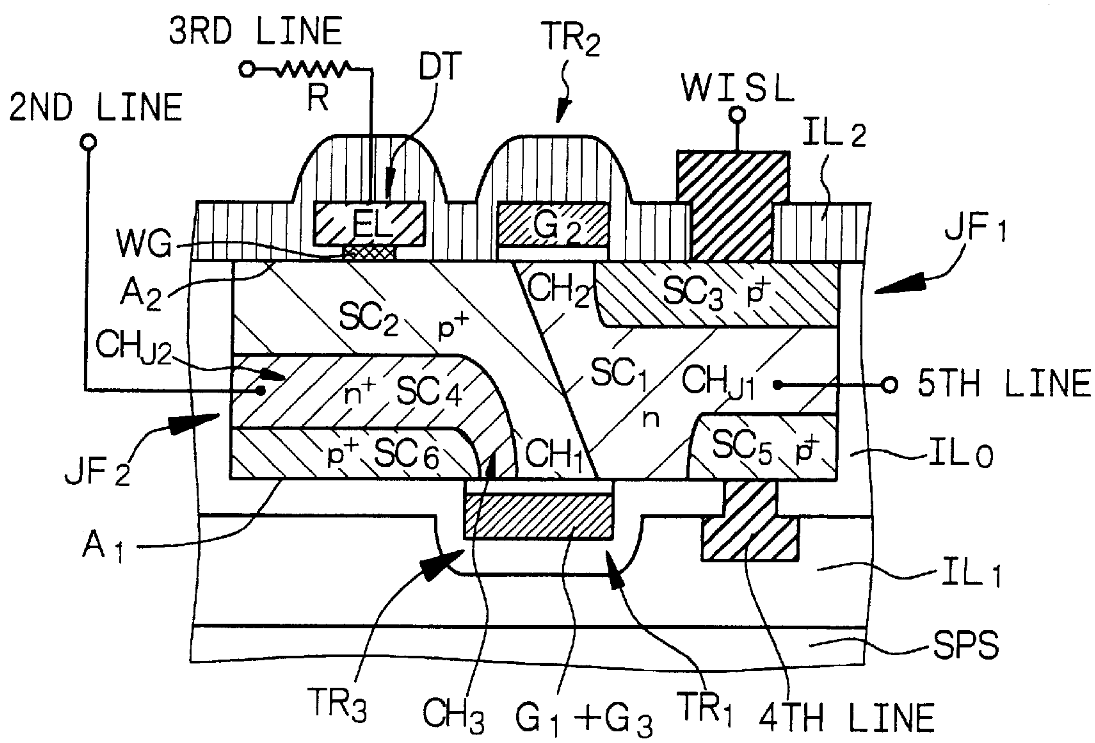

FIGS. 204A and 204B show schematic partial cross-sectional views of variants of the semiconductor memory cell of Example 22.

Figure 205:
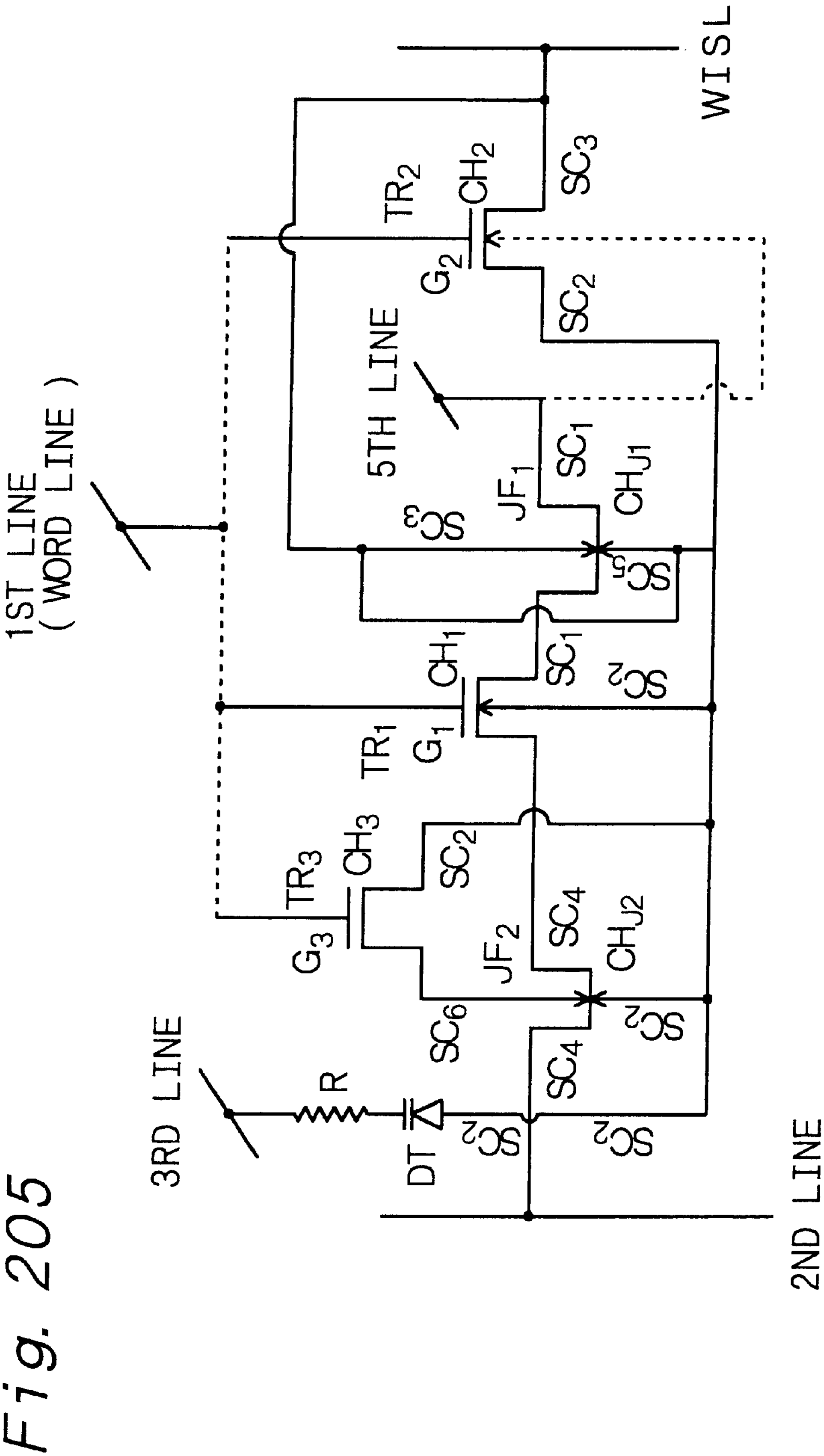

FIG. 205 shows the principle of a variant of the semiconductor memory cell according to the twenty-ninth aspect of the present invention.

Figure 206A:
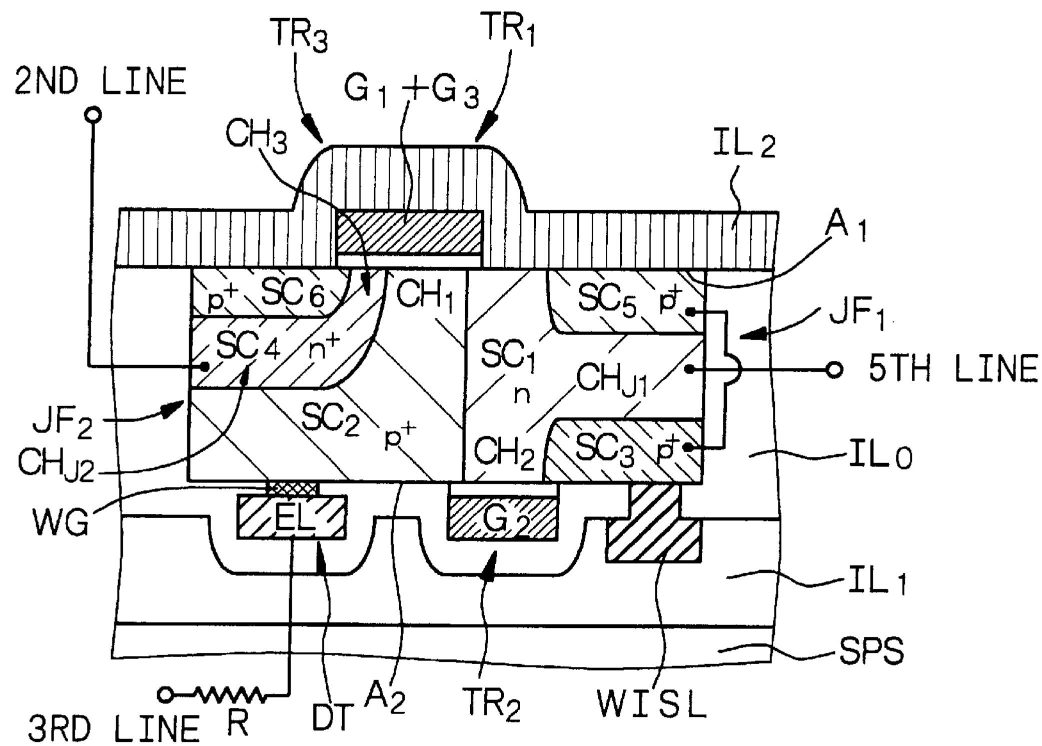
Figure 206B:
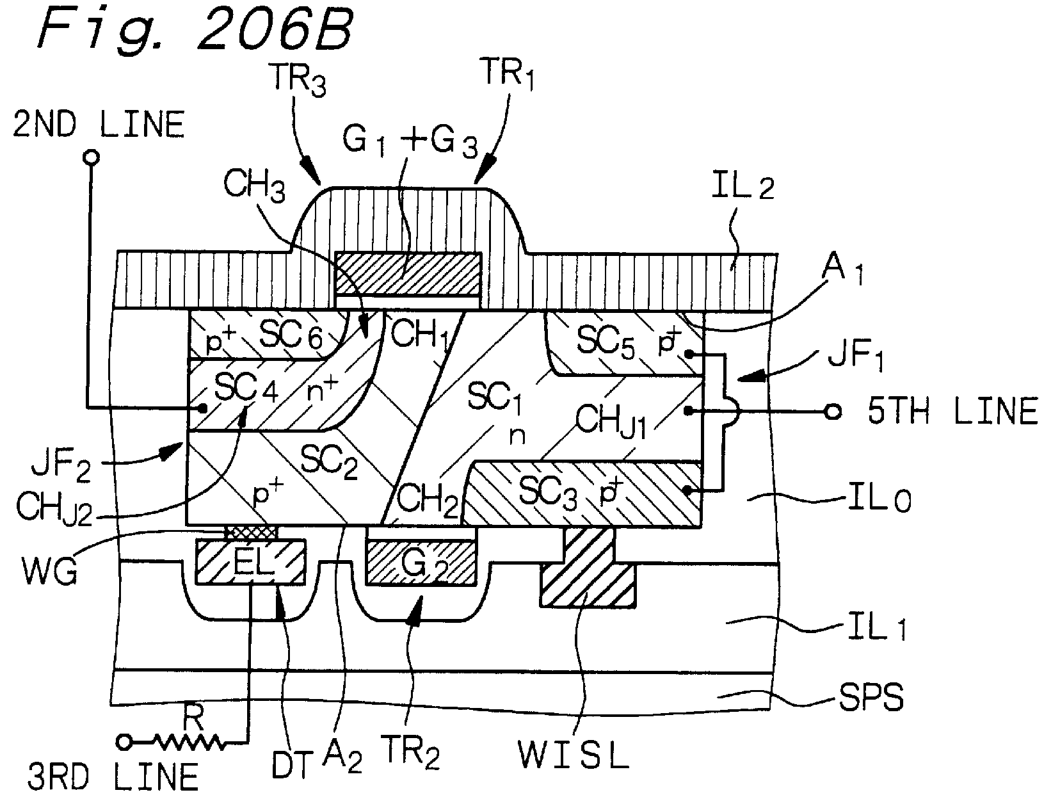

FIGS. 206A and 206B show schematic partial cross-sectional views of variants of the semiconductor memory cell of Example 22.

Figure 207A:
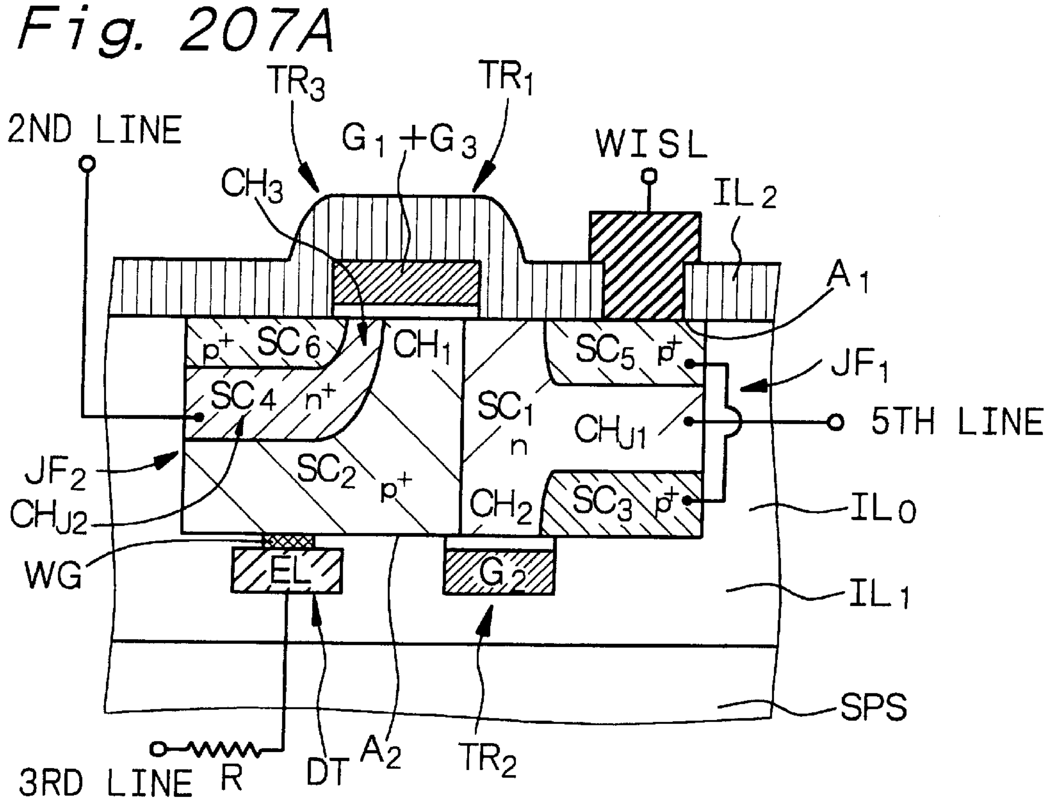
Figure 207B:
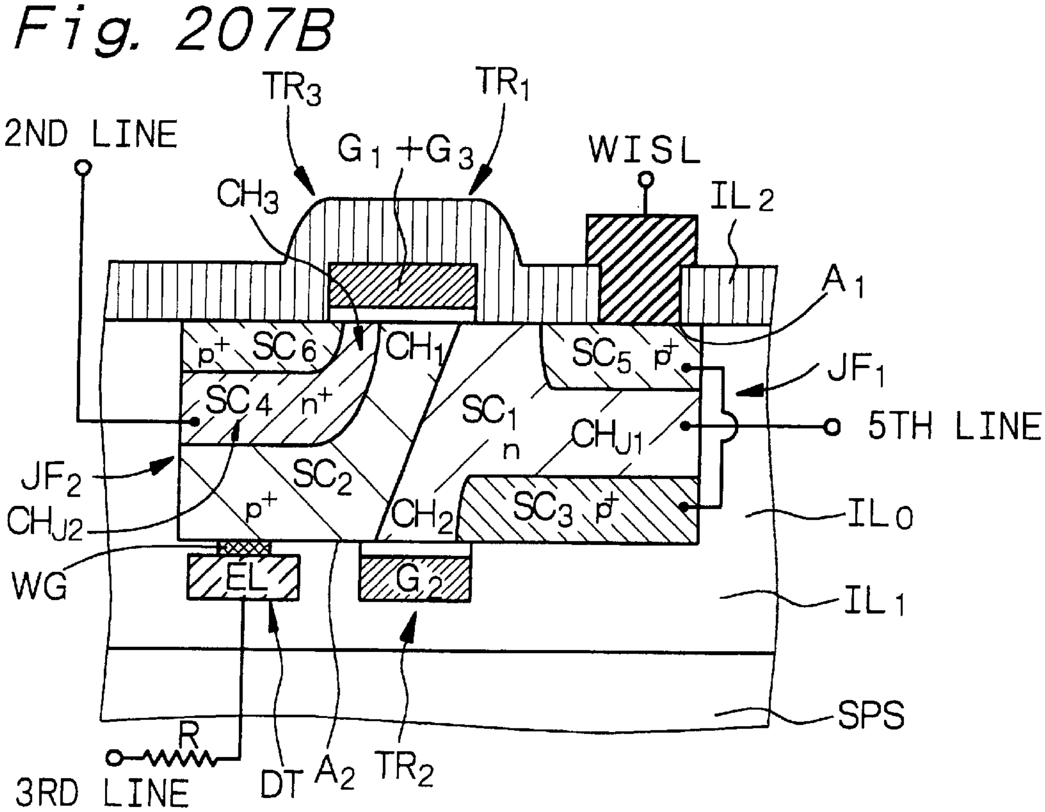

FIGS. 207A and 207B show schematic partial cross-sectional views of variants of the semiconductor memory cell of Example 22.

Figure 208A:
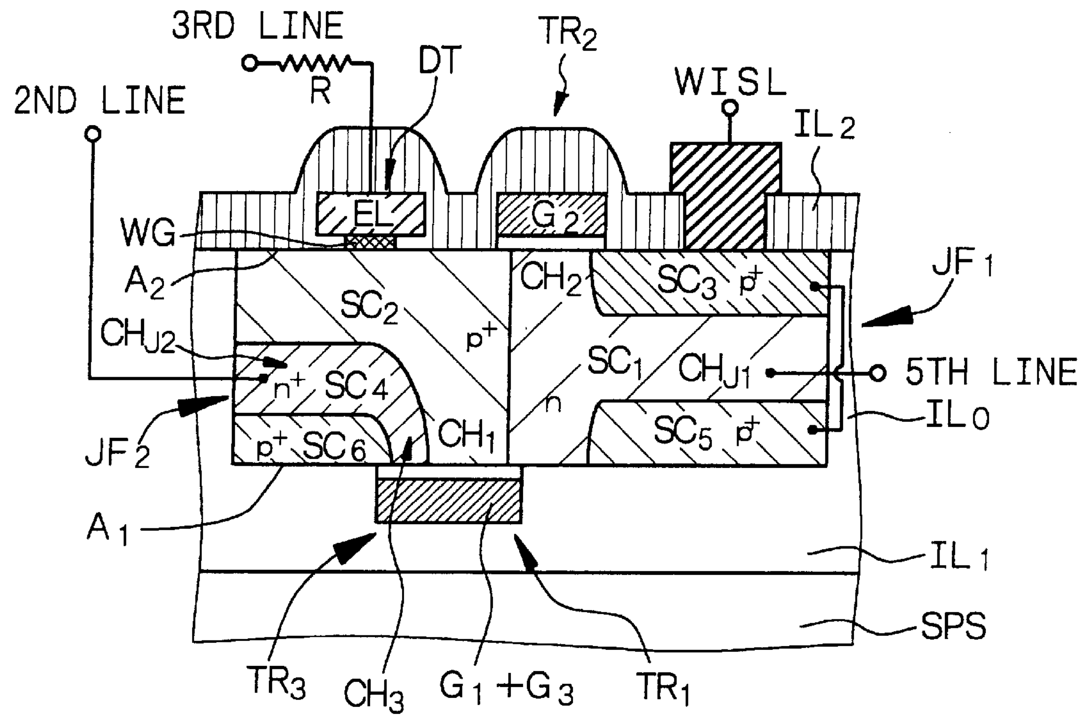
Figure 208B:
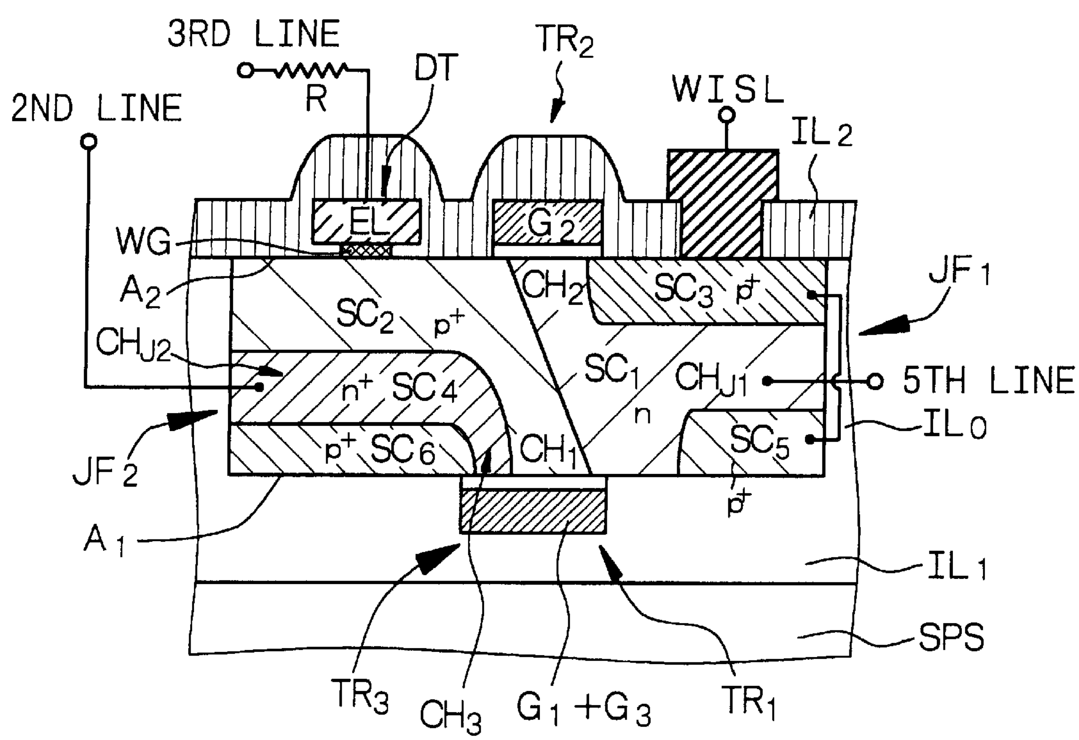

FIGS. 208A and 208B show schematic partial cross-sectional views of variants of the semiconductor memory cell of Example 22.

Figure 209A:
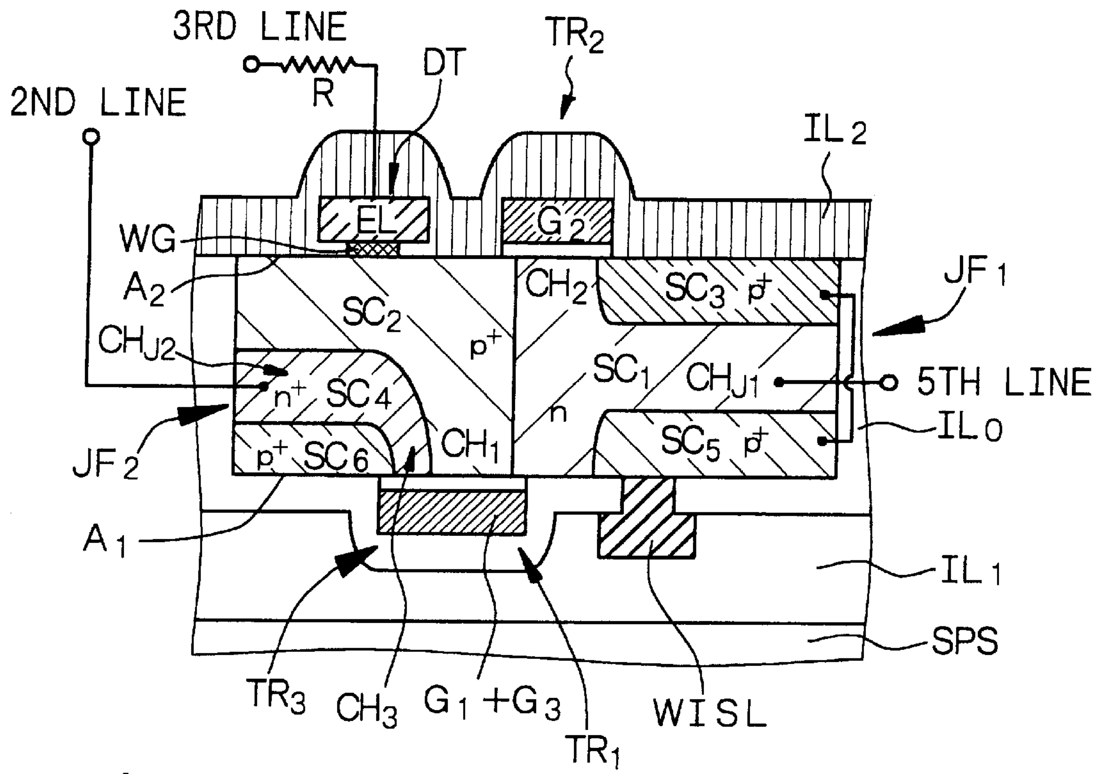
Figure 209B:
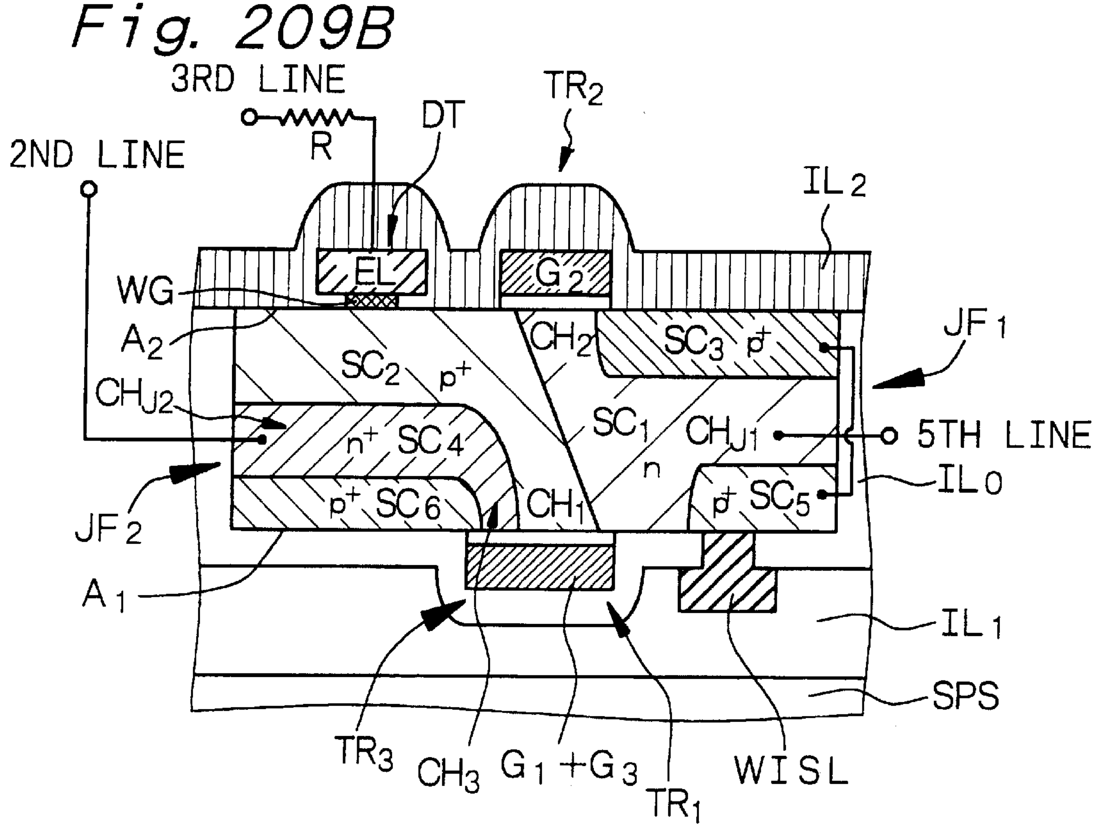

FIGS. 209A and 209B show schematic partial cross-sectional views of variants of the semiconductor memory cell of Example 22.

Figure 210A:
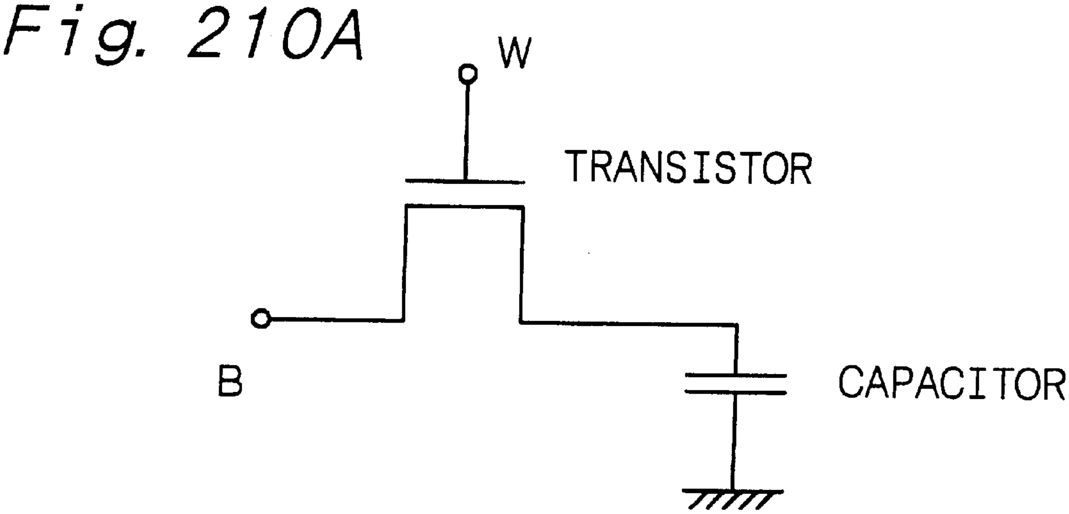
Figure 210B:
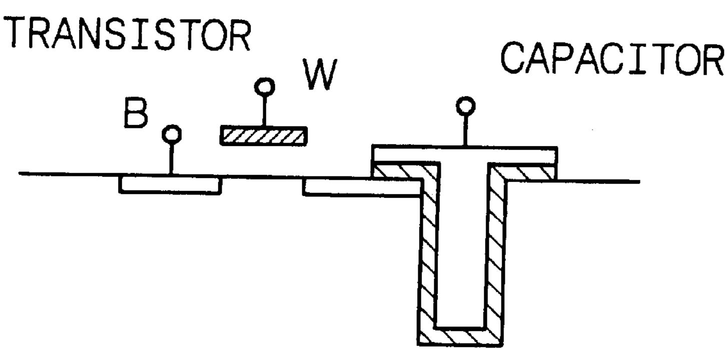

FIG. 210A shows the concept of a conventional single-transistor memory cell, and FIG. 210B shows a cross-sectional view of a conventional memory cell having a trench capacitor cell structure.

DESCRIPTION OF THE PREFERRED EMBODIMENTS

The present invention will be explained more specifically with reference to Examples hereinafter. Schematic partial cross-sectional views of semiconductor memory cells referred to in Examples are those with are prepared by cutting the semiconductor memory cells with a plane perpendicular to the extending direction of gates.

EXAMPLE 1

Figure 1:
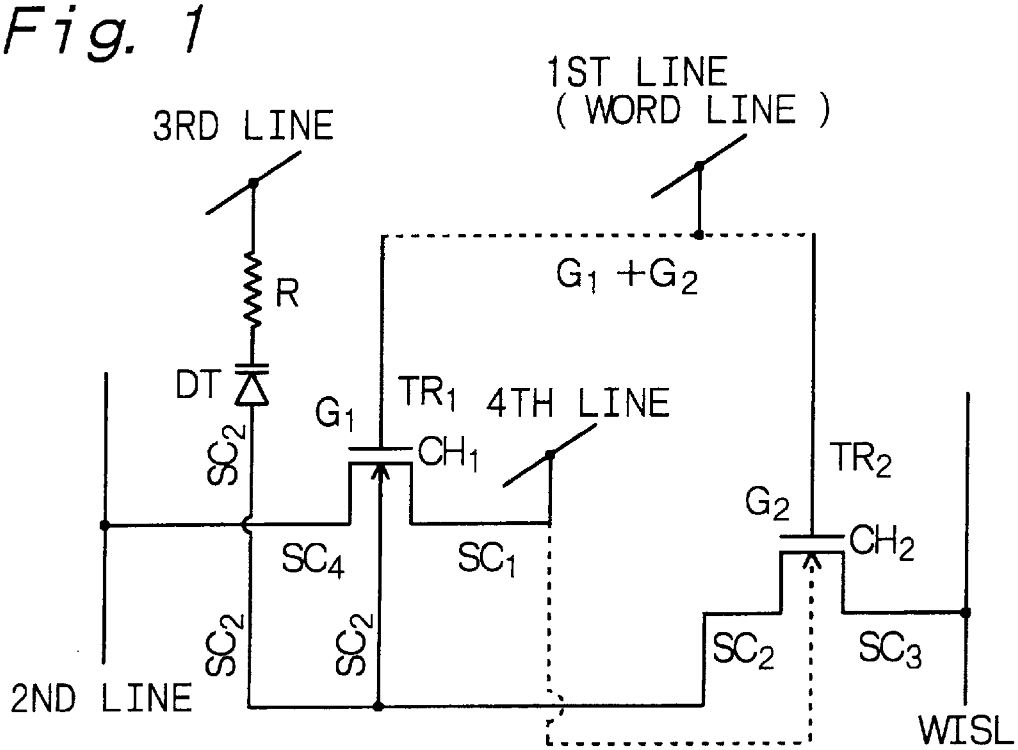
FIG. 1 shows the principle of a semiconductor memory cell according to the second aspect of the present invention.
Figure 7A:
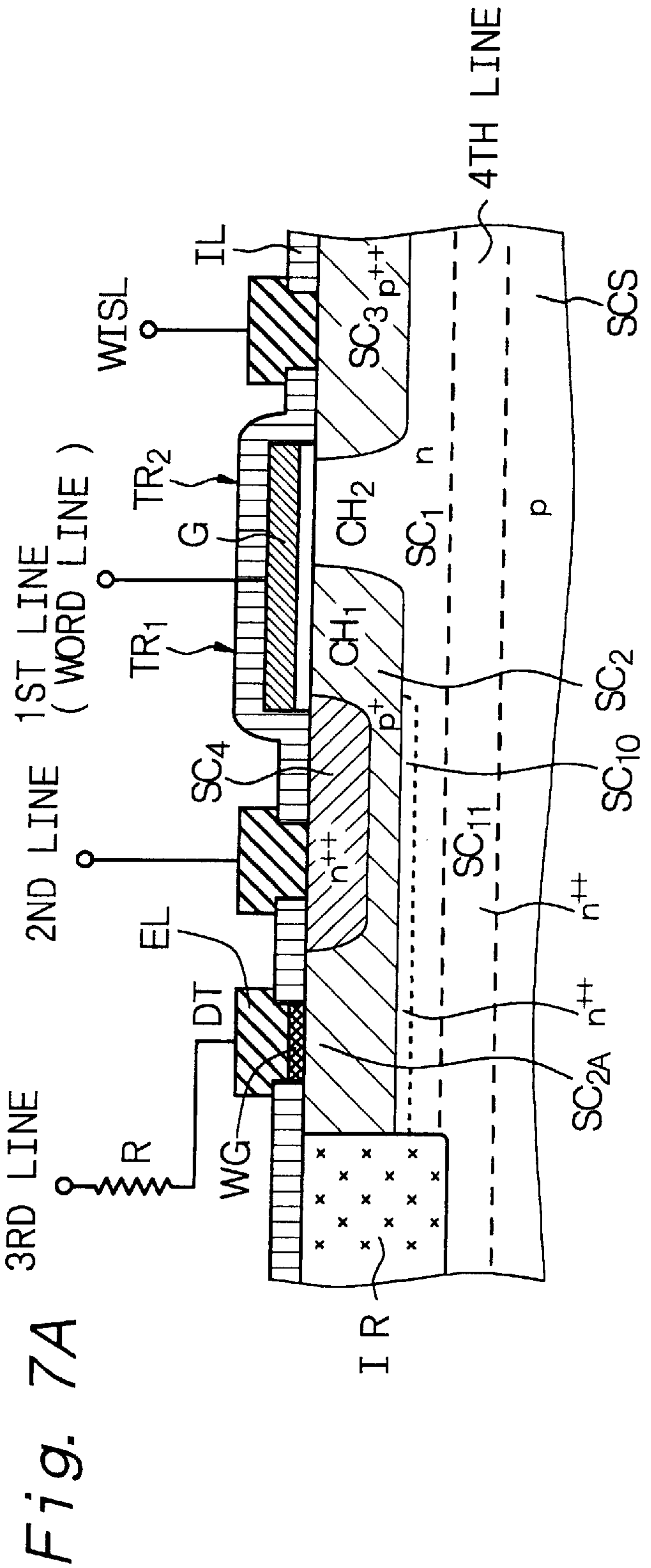
FIG. 7A shows a schematic partial cross-sectional view of a semiconductor memory cell of Example 1 and FIG. 7B shows a schematic layout of regions of the semiconductor memory cell of Example 1.
Figure 7B:
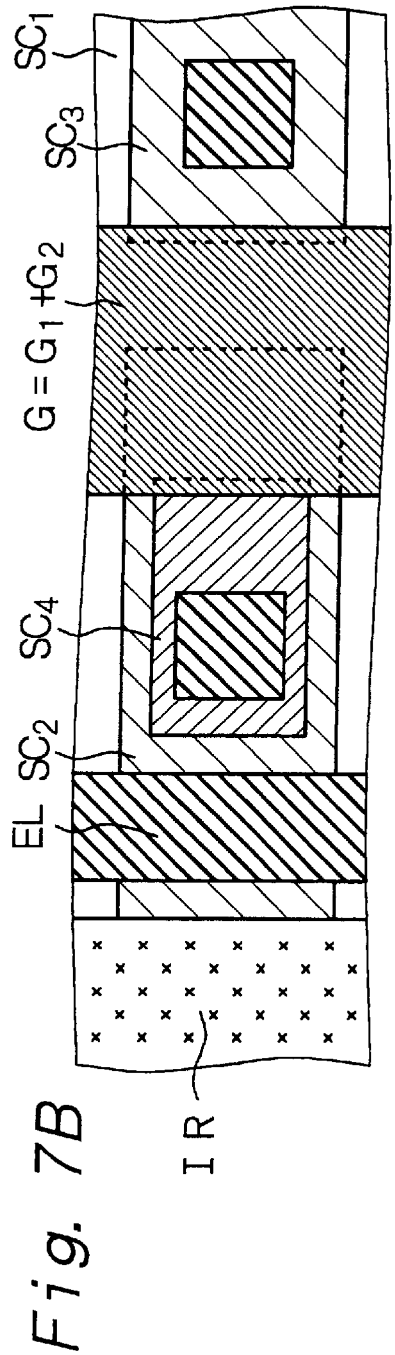

Example 1 is concerned with the semiconductor memory cell according to the first and second aspects of the present invention. FIG. 1 shows the principle of a semiconductor memory cell of Example 1, FIG. 7A shows a schematic partial cross-sectional view thereof, and FIG. 7B shows a schematic layout of regions thereof. In these and other Figures, "SCS" shows a semiconductor substrate, "n-SCS" shows an n-type semiconductor substrate, "p-SCS" shows a p-type semiconductor substrate, "SPS" shows a supporting substrate, "IL", "$IL_1$" and "$IL_2$" show insulating interlayers, "$IL_0$" shows an insulation material layer, and "$IR_2$" shows a device separation region.

The above semiconductor memory cell comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and a gate $G_2$ capacitively coupled with the channel forming region $CH_2$, and (3) an MIS type diode DT for retaining information.

In Example 1, the first transistor $TR_1$ and the second transistor $TR_2$ constitute one merged transistor. That is, the area of the semiconductor memory cell of Example 1 is generally smaller than the area of two transistors.

And, the semiconductor memory cell of Example 1 has;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ to be spaced from the second region $SC_2$ and is in contact with the first region $SC_1$ so as to form a rectifier junction together with the first region $SC_1$, the third region $SC_3$ being a region which is semi-conductive and has the second conductivity type (for example, $p^{++}$-type) or which is conductive and is composed of a silicide, a metal or a metal compound, and (d) a fourth region $SC_4$ which is formed in a surface region of the second region $SC_2$ to be spaced from the first region $SC_1$ and is in contact with the second region $SC_2$ so as to form a rectifier junction together with the second region $SC_2$, the fourth region $SC_4$ being a region which is semi-conductive and has the first conductivity type (for example, $n^{++}$-type) or which is conductive and is composed of a silicide, a metal or a metal compound.

Concerning the first transistor $TR_1$, (A-1) one source/drain region is formed of a surface region of the first region $SC_1$ which surface region is interposed between the second region $SC_2$ and the third region $SC_3$, (A-2) the other source/drain region is formed of the fourth region $SC_4$, (A-3) the channel forming region $CH_1$ is formed of a surface region of the second region $SC_2$ which surface region is interposed between the surface region of the first region $SC_1$ and the fourth region $SC_4$, and (A-4) the gate $G_1$ is formed on the channel forming region $CH_1$ of the first transistor $TR_1$ through an insulation layer.

Concerning the second transistor $TR_2$, (B-1) one source/drain region is formed of the surface region of the second region $SC_2$ which surface region constitutes the channel forming region $CH_1$ of the first transistor $TR_1$, (B-2) the other source/drain region is formed of the third region $SC_3$, (B-3) the channel forming region $CH_2$ is formed of the surface region of the first region $SC_1$ which surface region constitutes one source/drain region of the first transistor $TR_1$, and (B-4) the gate $G_2$ is formed on the channel forming region $CH_2$ of the second transistor $TR_2$ through an insulation layer.

Further, the gate $G_1$ of the first transistor $TR_1$ and the gate $G_2$ of the second transistor $TR_2$ are formed on the insulation layer so as to bridge the first region $SC_1$ and the fourth region $SC_4$ and so as to bridge the second region $SC_2$ and the third region $SC_3$. The above gate $G_1$ gate $G_2$ are shared by the first transistor $TR_1$ and the second transistor $TR_2$, and the shared gate is referred to as "gate G".

Concerning the MIS type diode DT, (C-1) one end thereof is formed of part $SC_{2A}$ of the second region $SC_2$ which part is an extending portion of the channel forming region $CH_1$ of the first transistor $TR_1$, and (C-2) an electrode constituting the other end thereof is formed so as to be opposed to said part $SC_{2A}$ of the second region $SC_2$ constituting one end of the MIS type diode DT through a wide gap thin film WG, and is composed of a conductive material.

The wide gap thin film WG can be composed of a material in which the tunnel transition of carriers is caused depending upon a potential difference between the potential in the channel forming region $CH_1$ of the first transistor $TR_1$ and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller. In Examples to be described later, the wide gap thin films WG can be constituted as described above.

The electrode EL constituting the other end of the MIS type diode is connected to a third line through a high-resistance element R having a resistance of approximately $10^9$ to $10^{12}\Omega$. Specifically, the electrode EL constituting the other end of the MIS type diode DT and the high-resistance element are integrally formed and are composed of a poly-silicon thin layer containing an impurity having the first conductivity type. In Examples to be described later, the electrodes EL and the high-resistance elements R can be constituted as described above.

In the semiconductor memory cell of Example 1, further, the gate $G_1$ of the first transistor $TR_1$ and the gate $G_2$ of the second transistor $TR_2$ are connected to a first line (word line) for memory cell selection. Further, the third region $SC_3$ is connected to a write-in information setting line WISL, the fourth region $SC_4$ is connected to a second line (for example, bit line for memory cell selection), the electrode EL constituting the other end of the MIS type diode DT is connected to the third line having a predetermined potential, and the first region $SC_1$ is connected to a fourth line having a predetermined second potential.

In another embodiment, the gate $G_1$ of the first transistor $TR_1$ and the gate $G_2$ of the second transistor $TR_2$ are connected to the first line (word line), the other source/drain region of the first transistor $TR_1$ is connected to the second line (for example, bit line), the other source/drain region of the second transistor $TR_2$ is connected to the write-in information setting line WISL, and the other end of the MIS type diode DT is connected to the line (third line) having a predetermined potential through the high-resistance element R.

In the semiconductor memory cell of Example 1, the second region $SC_2$ is formed in a surface region of the first region $SC_1$. Further, a second high-concentration-impurity-containing layer $SC_{11}$ having the first conductivity type (for example, $n^{++}$-type) is formed below the first region $SC_1$, and the second high-concentration-impurity-containing layer $SC_{11}$ works as the fourth line. Furthermore, a first high-concentration-impurity-containing layer $SC_{10}$ having the first conductivity type (for example, $n^{++}$-type) is formed below the second region $SC_2$. The semiconductor memory cell is formed in a well structure having a first conductivity type (for example, n-type).

In the semiconductor memory cell of Example 1 shown in FIGS. 7A and 7B, there may be employed a constitution in which a second predetermined potential is applied to the second line to which the fourth region $SC_4$ is connected, and the fourth line to which the first region $SC_1$ is used as a line (bit line) for memory cell selection.

Figure 2:
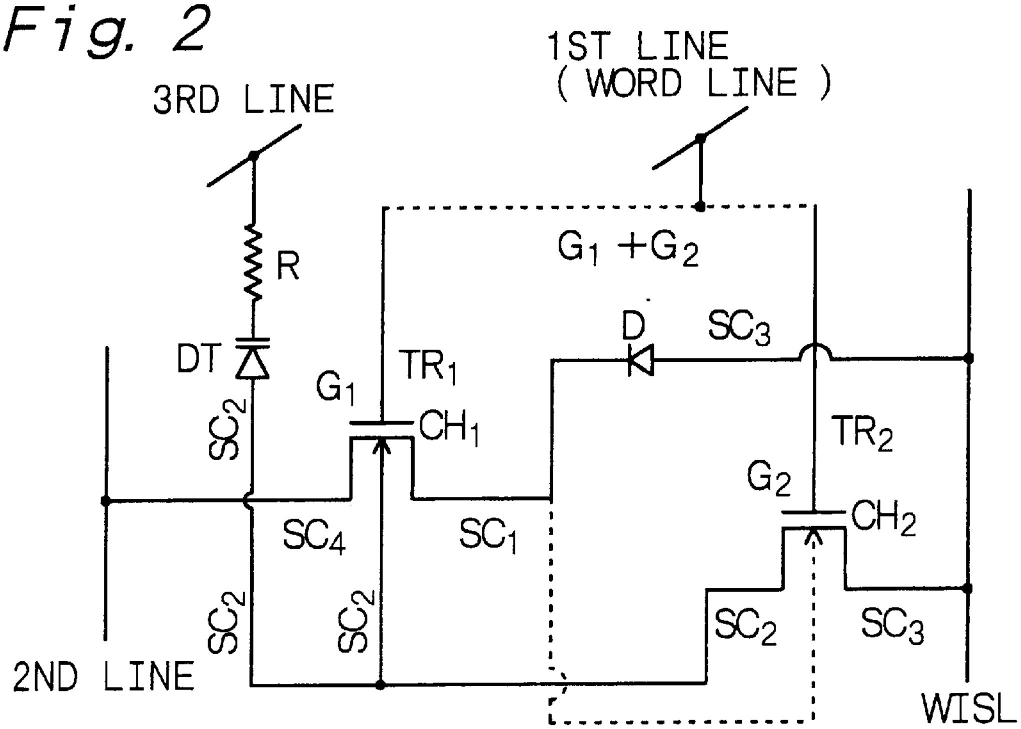
FIG. 2 shows the principle of a variant of the semiconductor memory cell according to the second aspect of the present invention.

In the semiconductor memory cell of Example 1, the third region $SC_3$ is formed of a semiconductor, and the impurity concentrations of the first region $SC_1$ and the third region $SC_3$ are properly controlled to constitute a pn junction diode D formed of the first region $SC_1$ and the third region $SC_3$. In this case, as shown in the drawing of the principle of FIG. 2, there can be employed a constitution in which the fourth line is omitted and the first region $SC_1$ is connected to the write-in information setting line WISL through the third region $SC_3$, so that the wiring structure can be simplified. The pn junction diode can be formed by bringing the impurity concentrations of the first region $SC_1$ and the third region $SC_3$ into proper values. This can be similarly applied in Examples to be described later. In the semiconductor memory cell of the above constitution, the gate $G_1$ of the first transistor $TR_1$ and the gate $G_2$ of the second transistor $TR_2$ are connected to the first line (word line), one source/drain region of the first transistor $TR_1$ is connected to the write-in information setting line WISL through the pn junction diode D, the other source/drain region of the first transistor $TR_1$ is connected to the second line (which works, for example, as a bit line), the other source/drain region of the second transistor $TR_2$ is connected to the write-in information setting line WISL and the other end of the MIS type diode DT is connected to the line (third line) having a predetermined potential through the high-resistance element R.

Further, there may be employed a constitution in which a pn junction diode D is formed with the first region $SC_1$ and the third region $SC_3$, a second predetermined potential is applied to the second line to which the fourth region $SC_4$ is connected, and the first region $SC_1$ is connected to the write-in information setting line WISL (which works as a bit line as well) through the third region $SC_3$.

Figure 3:
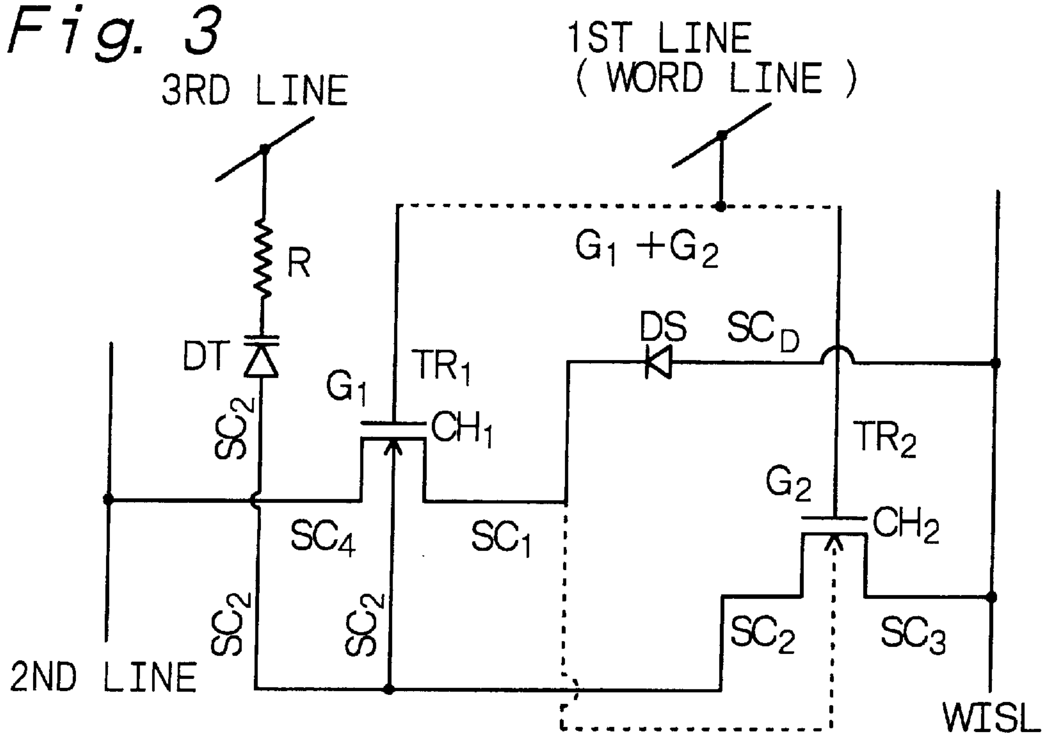
FIG. 3 shows the principle of the semiconductor memory cell according to another variant of the second aspect of the present invention.
Figure 8A:
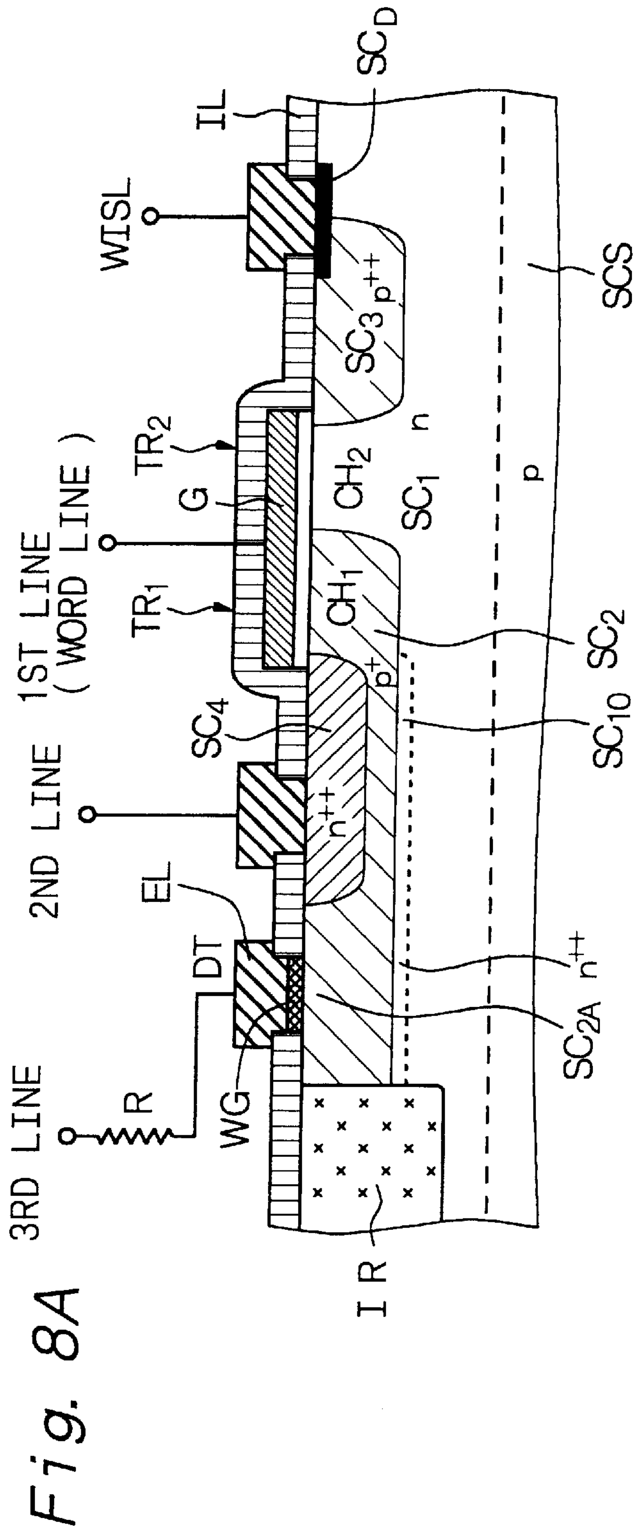
FIG. 8A shows a schematic partial cross-sectional view of a variant of the semiconductor memory cell of Example 1.
Figure 8B:
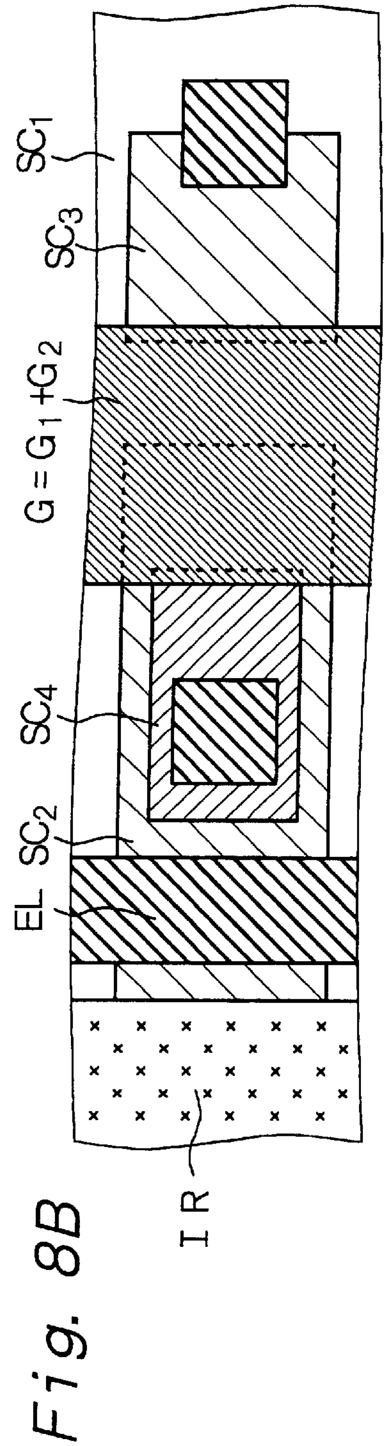
FIG. 8B shows a schematic layout of regions thereof.

FIG. 3 shows the principle of a semiconductor memory cell which is a variant of the semiconductor memory cell of Example 1. Further, FIG. 8A shows a schematic partial cross-sectional view of the variant, and FIG. 8B shows a schematic layout of regions of the variant. In the semiconductor memory cell as the variant, a diode-constituting region $SC_D$ is formed, for example, of titanium silicide or TiN and is provided in a surface region of the first region $SC_1$. And, the first region $SC_1$ and the diode-constituting region $SC_D$ constitute a majority carrier diode DS. In the above constitution, the fourth line can be omitted, and the first region $SC_1$ can be connected to the write-in information setting line WISL through the diode-constituting region $SC_D$, so that the structure of wiring can be simplified. In the semiconductor memory cell of the above constitution, the gate $G_1$ of the first transistor $TR_1$ and the gate $G_2$ of the second transistor $TR_2$ are connected to the first line (word line), one source/drain region of the first transistor $TR_1$ is connected to the write-in information setting line WISL through the majority carrier diode DS, the other source/drain region of the first transistor $TR_1$ is connected to the second line (bit line), the other source/drain region of the second transistor $TR_2$ is connected to the write-in information setting line WISL, and the other end of the MIS type diode DT is connected to the line (third line) having a predetermined potential through the high-resistance element R. There may employed a constitution in which a second predetermined potential is applied to the second line and the write-in information setting line WISL is used as a bit line as well.

FIGS. 9 to 12 show other variants of the semiconductor memory cell of Example 1.

Figure 9A:
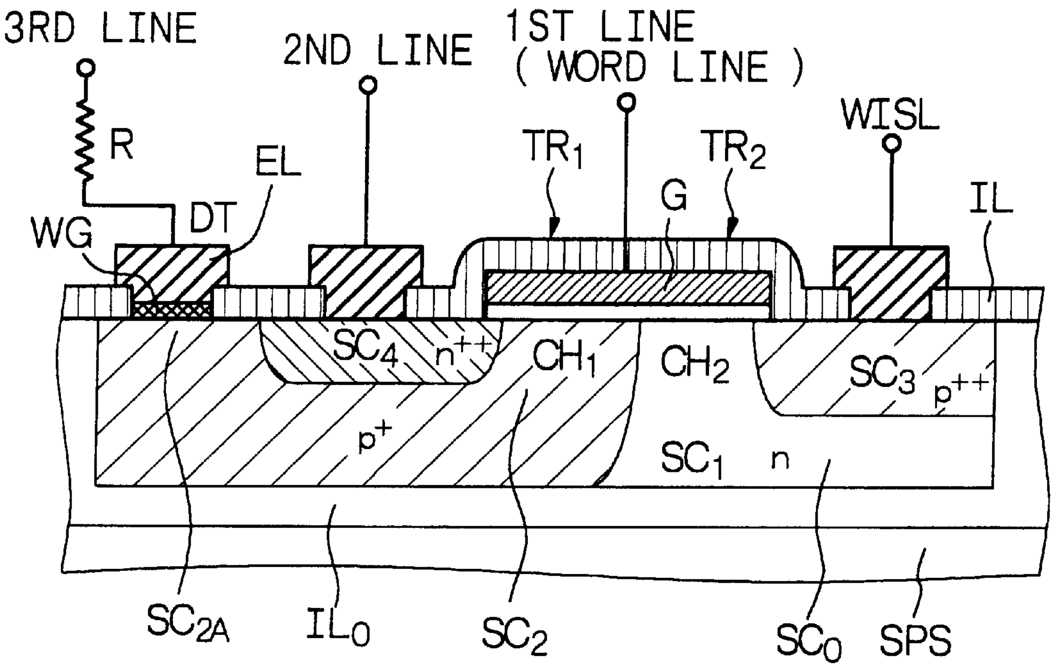
FIGS. 9A and 9B show schematic partial cross-sectional views of variants of the semiconductor memory cell of Example 1.
Figure 9B:
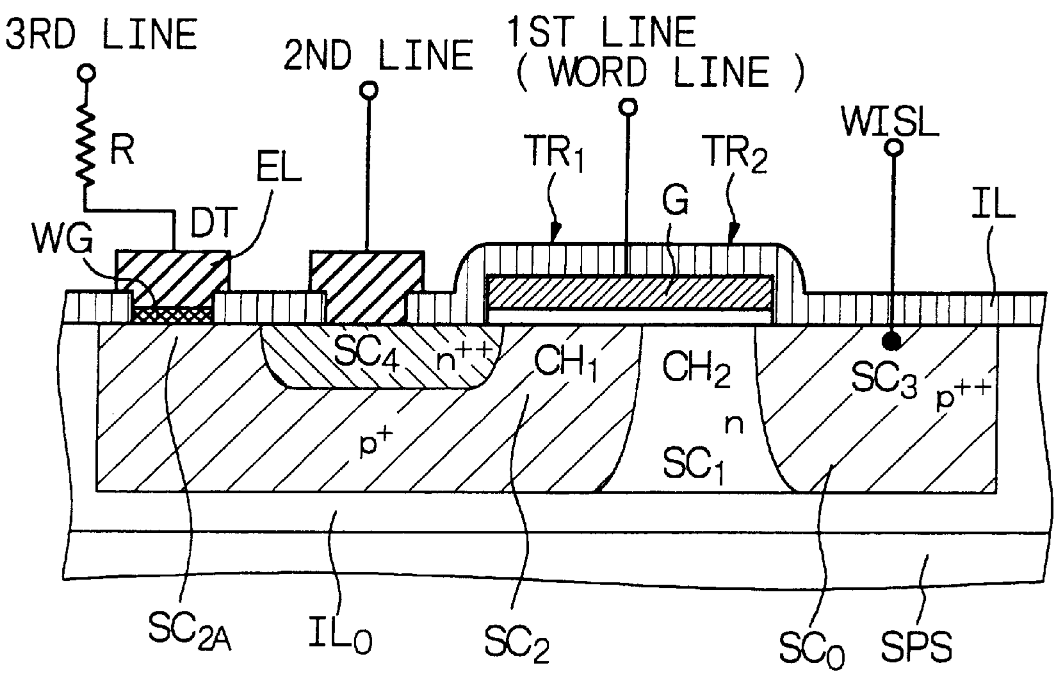

In the variants shown in FIGS. 9A and 9B, a semiconductor memory cell structured as shown in FIGS. 7A and 7B is formed in a semiconductor layer $SC_0$ surrounded by an insulation material layer $IL_0$ on a supporting substrate SPS. The semiconductor memory cell shown in FIG. 9A and the semiconductor memory cell shown in FIG. 9B differ from each other in degrees in which third regions $SC_3$ extend downwardly. When the semiconductor memory cell structured as shown in FIG. 9B is employed, an electrode from a side portion of the third region $SC_3$ to the write-in information setting line WISL can be taken out. In any other points, the semiconductor memory cells shown in FIGS. 9A and 9B are substantially structurally the same as the semiconductor memory cell shown in FIGS. 7A and 7B. In the variant shown in FIG. 10, a semiconductor memory cell structured as shown in FIGS. 8A and 8B is formed in a semiconductor layer $SC_0$ surrounded by an insulation material layer $IL_0$ on a supporting substrate SPS. In any other points, the semiconductor memory cell shown in FIG. 10 is substantially structurally the same as the semiconductor memory cell shown in FIGS. 8A and 8B.

Figure 10:
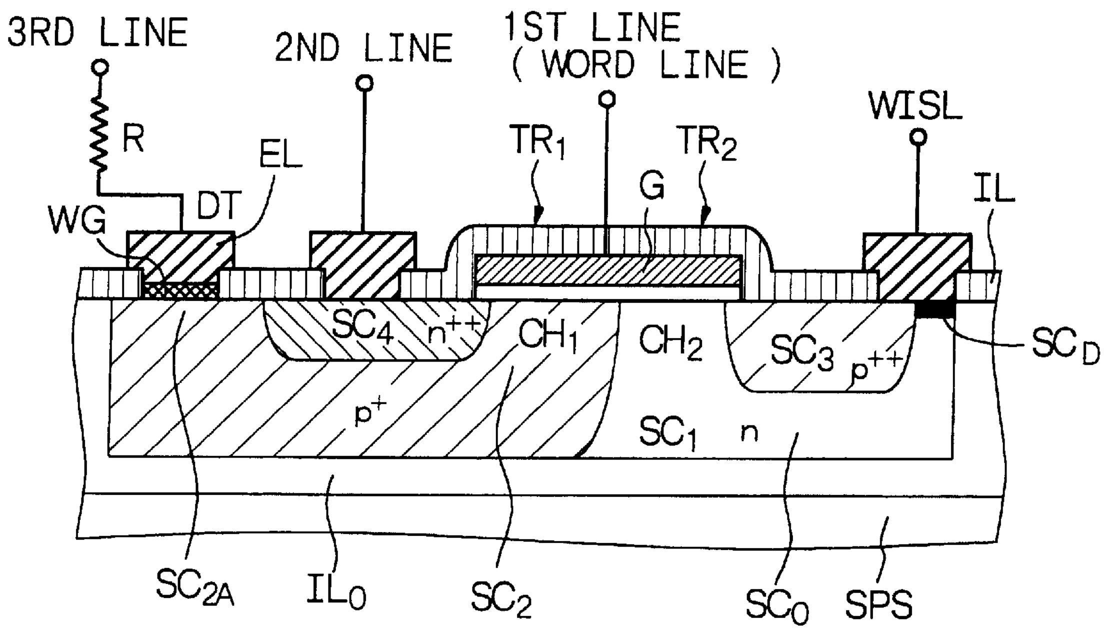
FIG. 10 shows a schematic partial cross-sectional view of another variant of the semiconductor memory cell of Example 1.

The semiconductor memory cells shown in FIGS. 9A, 9B and 10 can be manufactured by a so-called substrate bonding method in which a convex portion is formed in a semiconductor substrate, an insulator (insulation material layer) is formed on the entire surface, then, the insulator (insulation material layer) and a supporting substrate are bonded to each other, and the semiconductor substrate is ground and polished from its reverse surface side. Otherwise, an insulator (insulating interlayer) can be formed according to an SIMOX method in which, for example, a silicon semiconductor substrate is ion-implanted with oxygen and then heat-treated, and a semiconductor memory cell is formed in a silicon layer remaining thereon. That is, these semiconductor memory cells have a so-called SOI structure. There may be employed another method in which, for example, an amorphous silicon layer or a polysilicon layer is formed on an insulator (insulation material layer) by a CVD method, then, a silicon layer is formed from the amorphous or polysilicon layer by a known single crystallization method such as a zone melting crystallization method using laser beam or electron beam or a lateral solid phase crystal growth method in which a crystal is grown through an opening formed in the insulator (insulation material layer), and the semiconductor memory cell is formed in the silicon layer. Otherwise, there may be employed still another method in which, for example, a polysilicon layer or an amorphous silicon layer is formed on an insulator (insulation material layer) formed on a supporting substrate and the semiconductor memory cell is formed in the polysilicon layer or the amorphous silicon layer. That is, these semiconductor memory cells have a so-called TFT structure. In Examples to be described later, SOI structures and TFT structures can be similarly manufactured as described above.

Figure 11A:
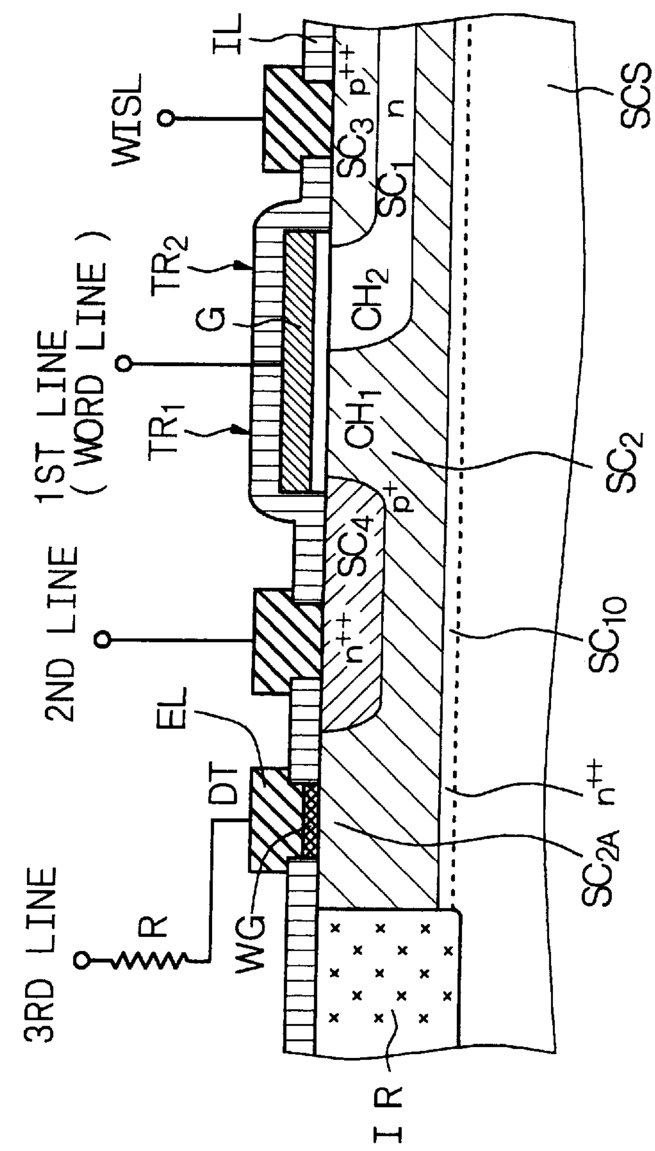
FIG. 11A show a schematic partial cross-sectional view of another variant of the semiconductor memory cell of Example 1.
Figure 11B:
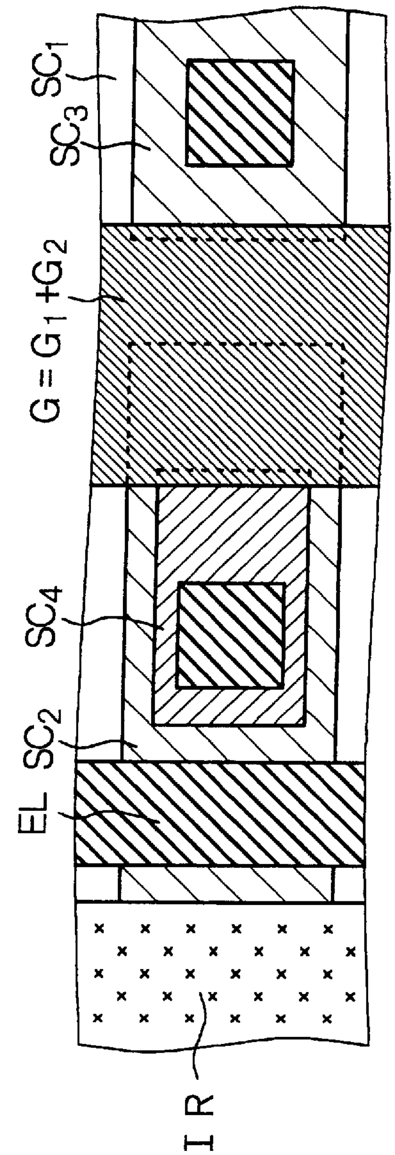
FIG. 11B shows a schematic layout of regions thereof.
Figure 12A:
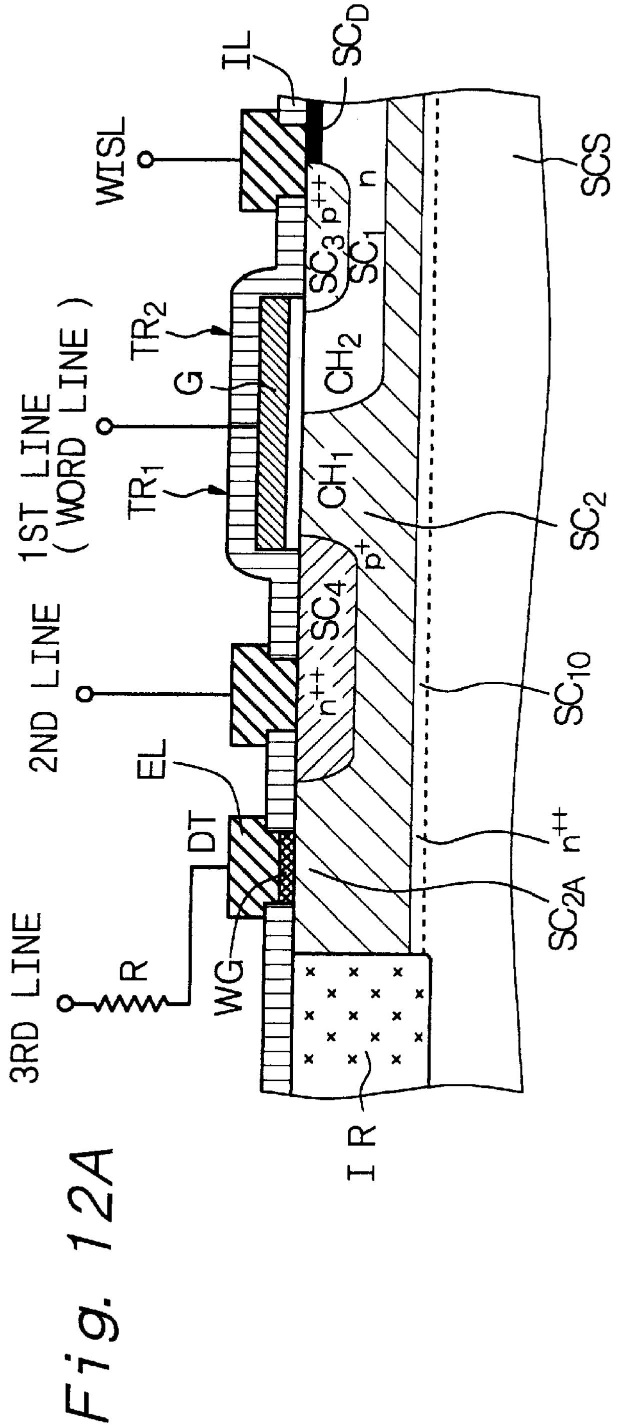
FIG. 12A shows a schematic partial cross-sectional view of another variant of the semiconductor memory cell of Example 1.
Figure 12B:
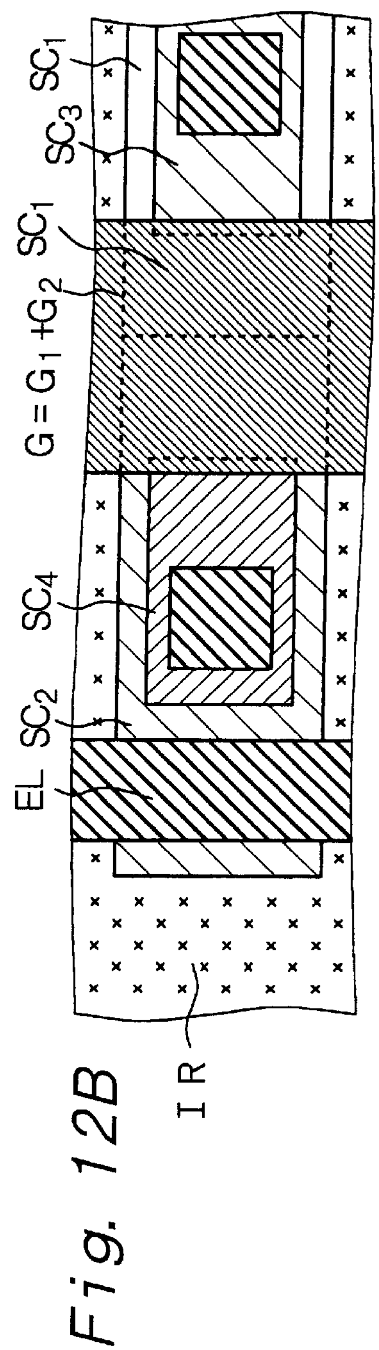
FIG. 12B shows a schematic layout of regions thereof.

A semiconductor memory cell shown in FIGS. 11A and 11B is a variant of the semiconductor memory cell shown in FIGS. 7A and 7B. A semiconductor memory cell shown in FIGS. 12A and 12B is a variant of the semiconductor memory cell shown in FIGS. 8A and 8B. In the semiconductor memory cells shown in FIGS. 11A and 11B and FIGS. 12A and 12B (for their principles, see FIGS. 1 and 3, respectively), the first region $SC_1$ is formed in a surface region of the second region $SC_2$. In any other points, the semiconductor memory cells shown in FIGS. 11A and 11B and FIGS. 12A and 12B are substantially structurally the same as the semiconductor memory cells shown in FIGS. 7A and 7B and FIGS. 8A and 8B.

In the variants of the semiconductor memory cell of Example 1, shown in FIGS. 9A and 9B and FIGS. 11A and 11B, there may be employed a constitution in which the second line to which the fourth region $SC_4$ is connected is used as a bit line for memory cell selection and a second predetermined potential is applied to the fourth line to which the first region $SC_1$ is connected, or a constitution in which a second predetermined potential is applied to the second line and the fourth line is used as a bit line for memory cell selection. In the variants of the semiconductor memory cell of Example 1, shown in FIGS. 10 and FIGS. 12A and 12B, there may be employed a constitution in which the second line to which the fourth region $SC_4$ is connected is used as a bit line for memory cell selection, or a constitution in which a second predetermined potential is applied to the second line and the write-in information setting line WISL is used as a bit line as well.

Figure 13A:
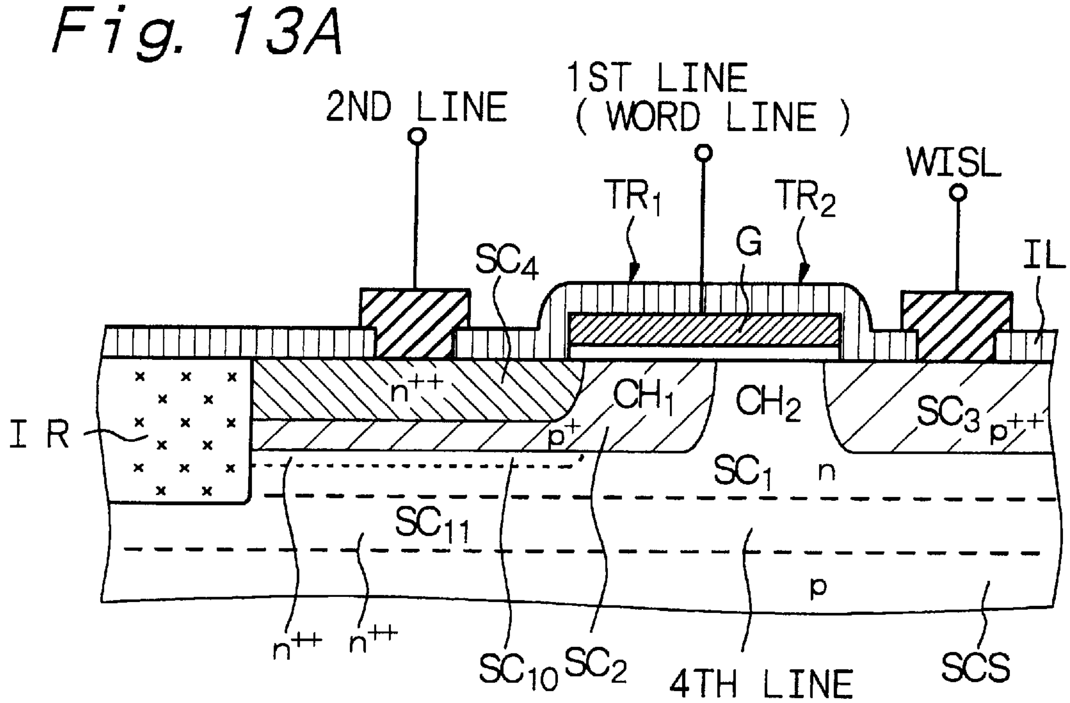
FIG. 13A shows a schematic partial cross-sectional view of another variant of the semiconductor memory cell of Example 1.
Figure 13B:
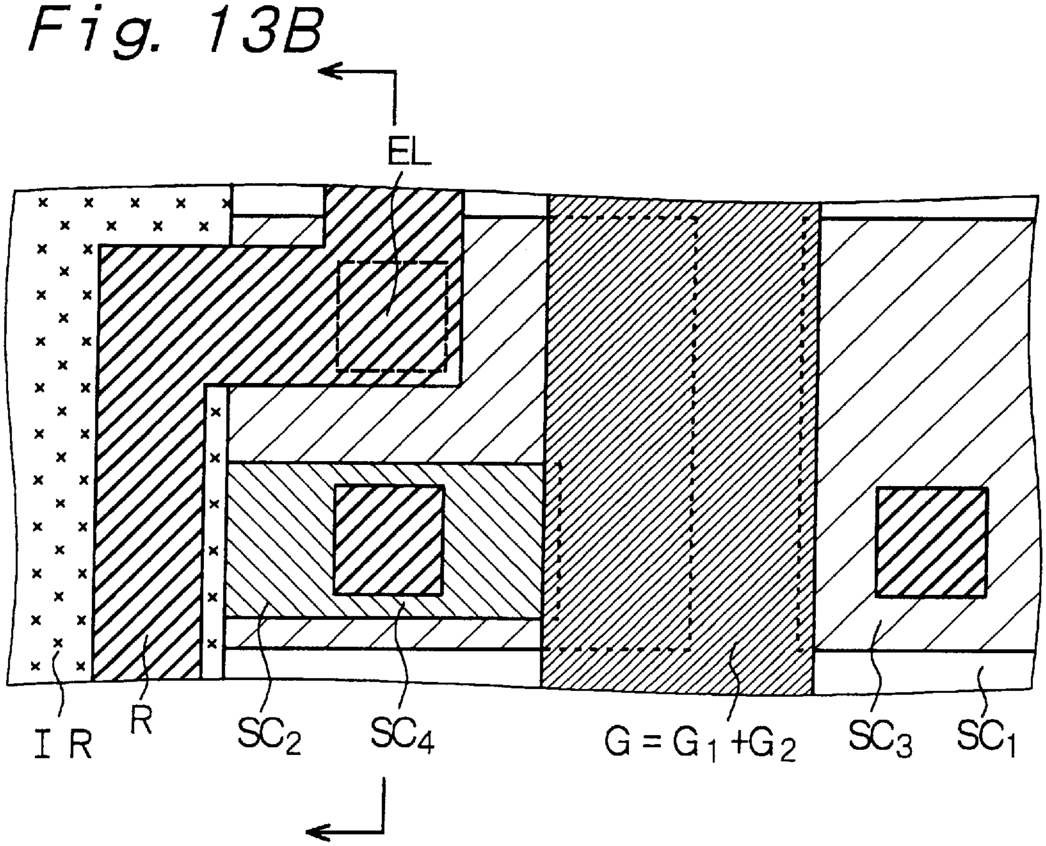
FIG. 13B shows a schematic layout of regions thereof.
Figure 14:
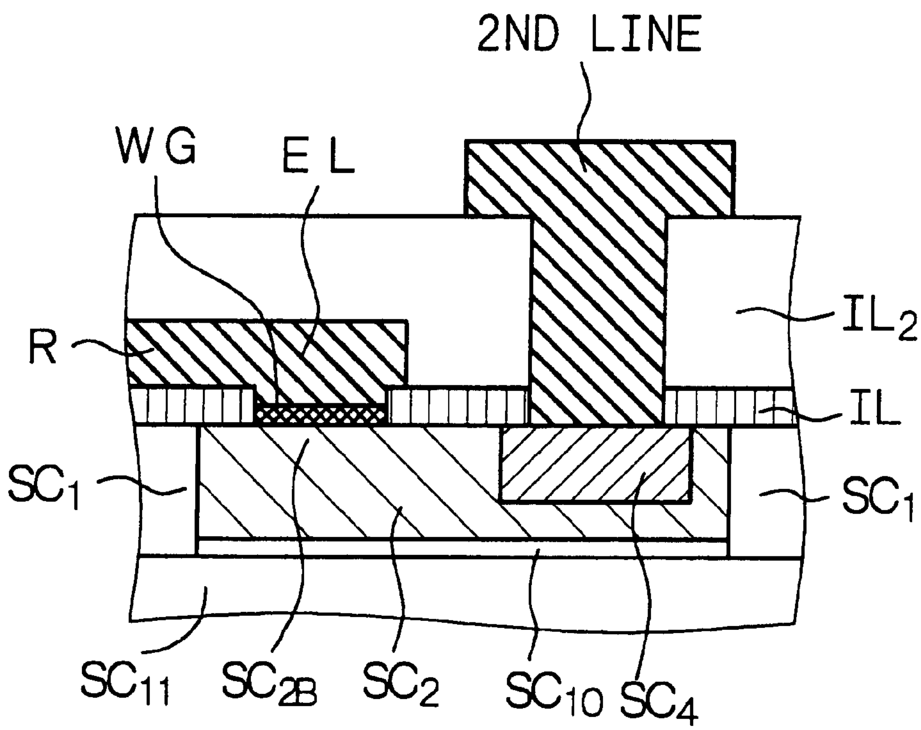
FIG. 14 shows another schematic partial cross-sectional view of the variant of the semiconductor memory cell of Example 1, shown in FIGS. 13A and 13B.

For example, the semiconductor memory cell of Example 1 shown in FIGS. 7A and 7B may be structurally modified as shown in FIGS. 13A, 13B and 14. FIG. 13A shows a schematic partial cross-sectional view of a semiconductor memory cell, FIG. 13B is a schematic layout of regions thereof, and FIG. 14 shows a schematic partial cross-sectional view thereof taken along an arrow in FIG. 13B. In the semiconductor memory cell, a portion of the second region $SC_2$ extends up to a surface of the semiconductor substrate beside the fourth region $SC_4$. The extending portion $SC_{2B}$ of the second region $SC_2$ corresponds to one end of the MIS type diode DT. An electrode EL constituting the other end of the MIS type diode DT is formed on the extending portion $SC_{2B}$ of the second region $SC_2$ through a wide gap thin film WG. Further, a high-resistance element R integrally extends from the electrode EL. The electrode EL and the high-resistance element R are formed of a polysilicon thin film containing an impurity having the first conductivity type (for example, n-type). The second line (bit line) is formed on a second insulating interlayer $IL_2$, and extends in the direction perpendicular to the paper surface of FIG. 14. The structure of the second region $SC_2$ shown in FIGS. 13A, 13B and 14 can be applied to the various variants explained in Example 1.

Figure 15:
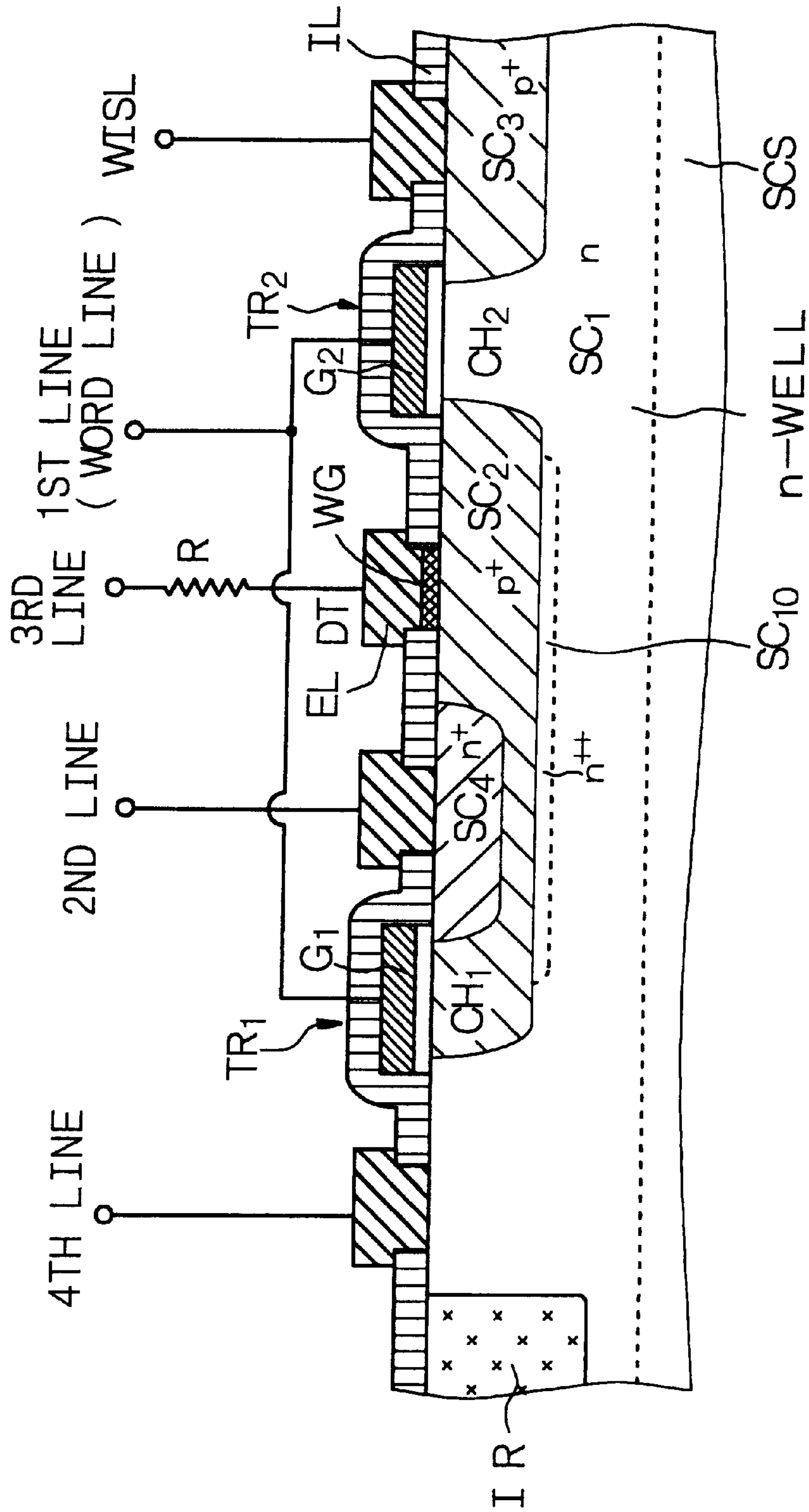
FIG. 15 shows a schematic partial cross-sectional view of another variant of the semiconductor memory cell according to the first aspect of the present invention.
Figure 16:
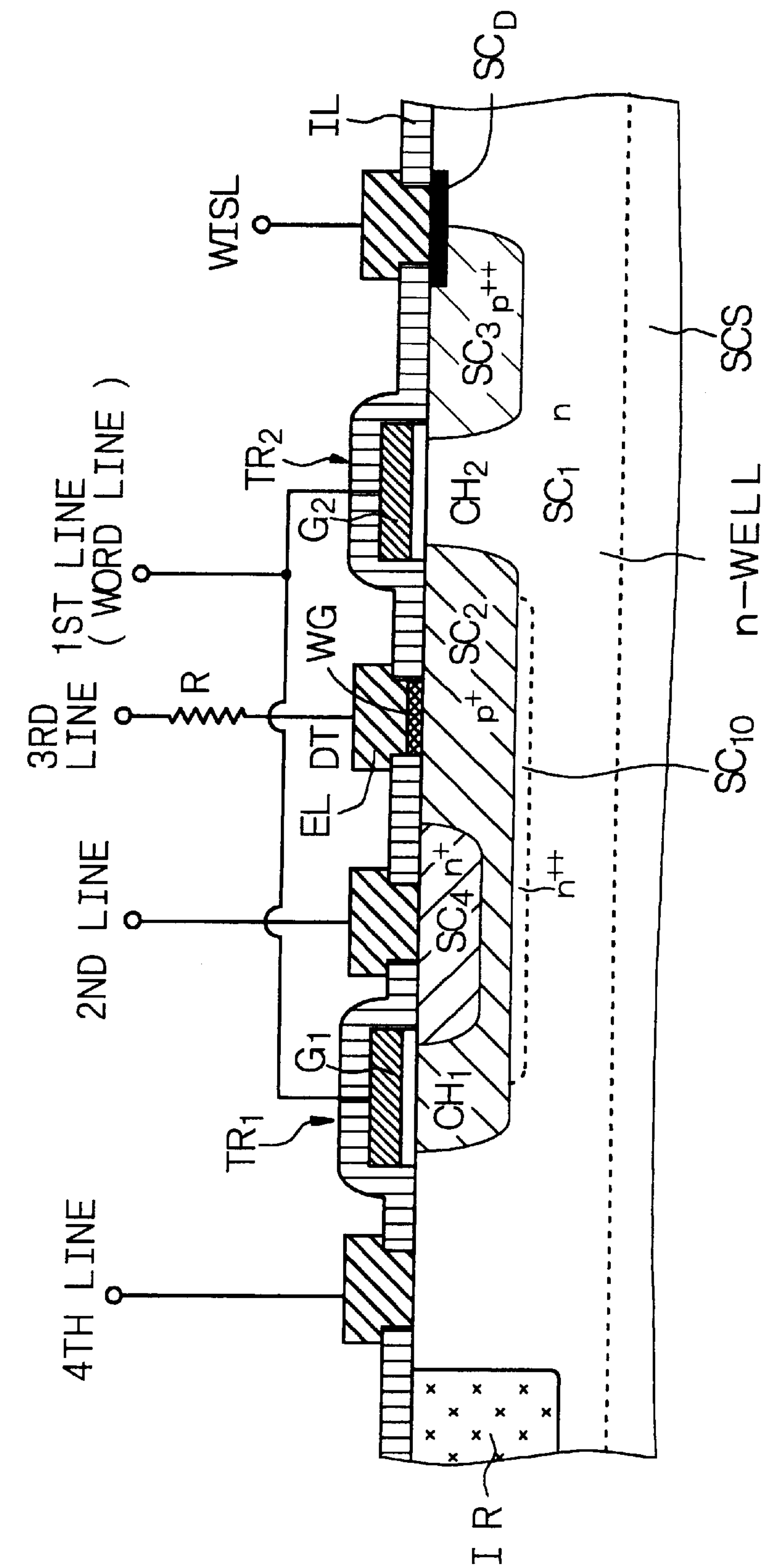
FIG. 16 shows a schematic partial cross-sectional view of another variant of the semiconductor memory cell according to the first aspect of the present invention.

The semiconductor memory cell according to the first aspect of the present invention, explained with reference to FIGS. 7A and 7B and FIGS. 8A and 8B, can be modified to semiconductor memory cells whose schematic partial cross-sectional views are shown in FIGS. 15 and 16. In the semiconductor memory cells shown in FIGS. 15 and 16, the gate $G_1$ of the first transistor $TR_1$ and the gate $G_2$ of the second transistor $TR_2$ are separately formed. Except for the above point, the semiconductor memory cells shown in FIGS. 15 and 16 are substantially structurally the same as those of the semiconductor memory cells shown FIGS. 7A and 7B and FIGS. 8A and 8B.

The process for manufacturing the semiconductor memory cell of Example 1 shown in FIGS. 7A and 7B will be explained with reference to FIGS. 17A, 17B, 18A, 18B, 19A and 19B hereinafter. The semiconductor memory cell of Example 2 to be described later can be also manufactured substantially by the same process.

[Step-100]

First, a device separation region (not shown), a well of the first conductivity type (for example, n-type well), the first region $SC_1$ of an n-type semiconductor, a second high-concentration-impurity-containing layer $SC_{11}$ having the first conductivity type (for example, $n^{++}$-type) (not shown) and a gate insulation layer 12 corresponding to the insulation layer are formed in a p-type silicon semiconductor substrate 10 according to known methods. Then, the gate G ($G_1$+$G_2$) is formed. For example, the gate G is composed of a polysilicon containing an impurity or polyside structure or a polymetal structure. In this manner, a structure shown in FIG. 17A can be obtained. The n-type first region $SC_1$ had an impurity concentration of $1.0\times10^{17}/cm^3$, and the gate G ($G_1$+$G_2$) had a length of 0.28 $\mu$m.

[Step-110]

Figure 17A:
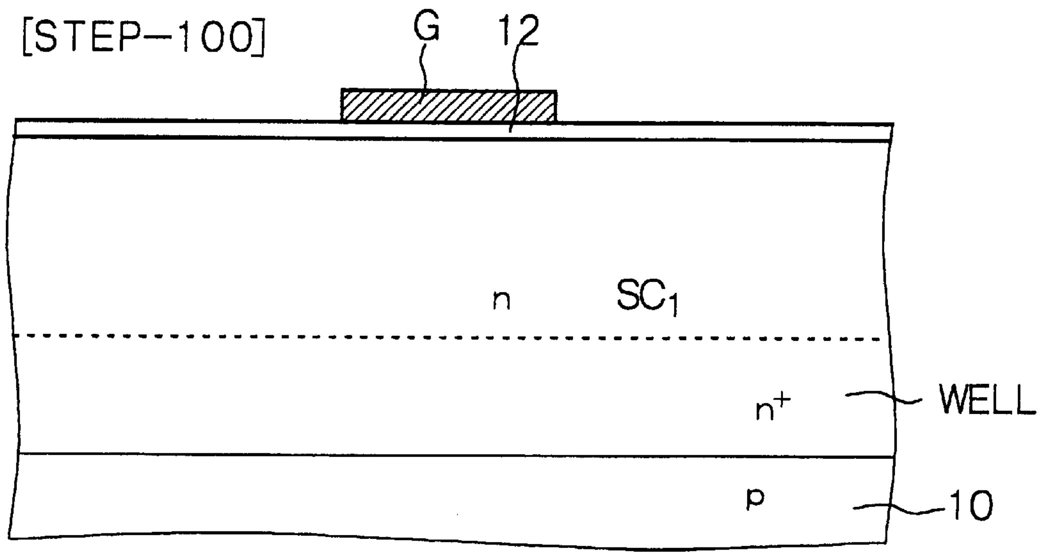
FIGS. 17A and 17B show schematic partial cross-sectional views of a semiconductor substrate, etc., for explaining the method of manufacturing the semiconductor memory cell of Example 1.
Figure 17B:
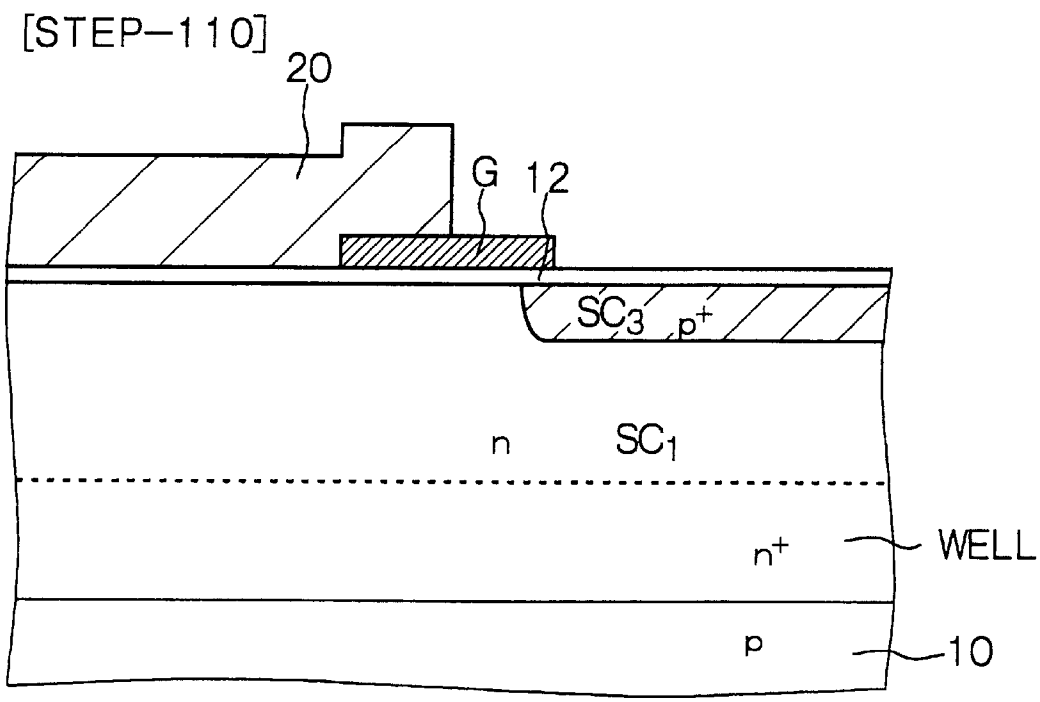

An ion-implanting mask 20 is formed from a resist material, then, ion-implantation with an impurity of the second conductivity type (for example, p-type) is carried out, and the semi-conductive third region $SC_3$ having the second conductivity type is formed in a surface region of the first region $SC_1$ (see FIG. 17B). The ion-implantation is carried out under conditions shown in the following Table 1.

TABLE 1

| Ion species | $BF_2$ |
|---|---|
| Acceleration energy | 20 keV |
| Dosage | $1\times10^{13}/cm^2$ |
| Ion incidence angle | 7 degrees |

[Step-120]

Then, the ion-implanting mask 20 is removed, an ion-implanting mask 21 is formed from a resist material, and then, ion-implantation with an impurity having the second conductivity type (for example, p-type) is carried out by an oblique ion-implanting method, to form the semi-conductive second region $SC_2$ having the second conductivity type (for example, $p^+$-type) which is in contact with the first region $SC_1$ (specifically, which is formed in a surface region of the first region $SC_1$) and which is spaced from the third region $SC_3$. When the ion-implantation is carried out by an oblique ion-implanting method, the second region $SC_2$ is formed to reach below the gate G ($G_1$+$G_2$) (see FIG. 18A). The ion-implantation was carried out twice under conditions shown in the following Table 2, and the ion incidence angle during one ion-implantation differed from that during the other ion-implantation. Particularly, when the ion incidence angle during the first ion-implantation is set at 60 degrees, the impurity concentration of the semi-conductive second region $SC_2$ below the gate G ($G_1$+$G_2$) can be highly accurately controlled.

TABLE 2

| Ion species | Boron |
|---|---|
| First ion-implantation | |
| Acceleration energy | 10 kev |
| Dosage | $3.4\times10^{13}/cm^2$ |
| Ion incidence angle | 60 degrees |
| Second ion-implantation | |
| Acceleration energy | 30 kev |
| Dosage | $2.1\times10^{13}/cm^2$ |
| Ion incidence angle | 10 degrees |

[Step-130]

Figure 18A:
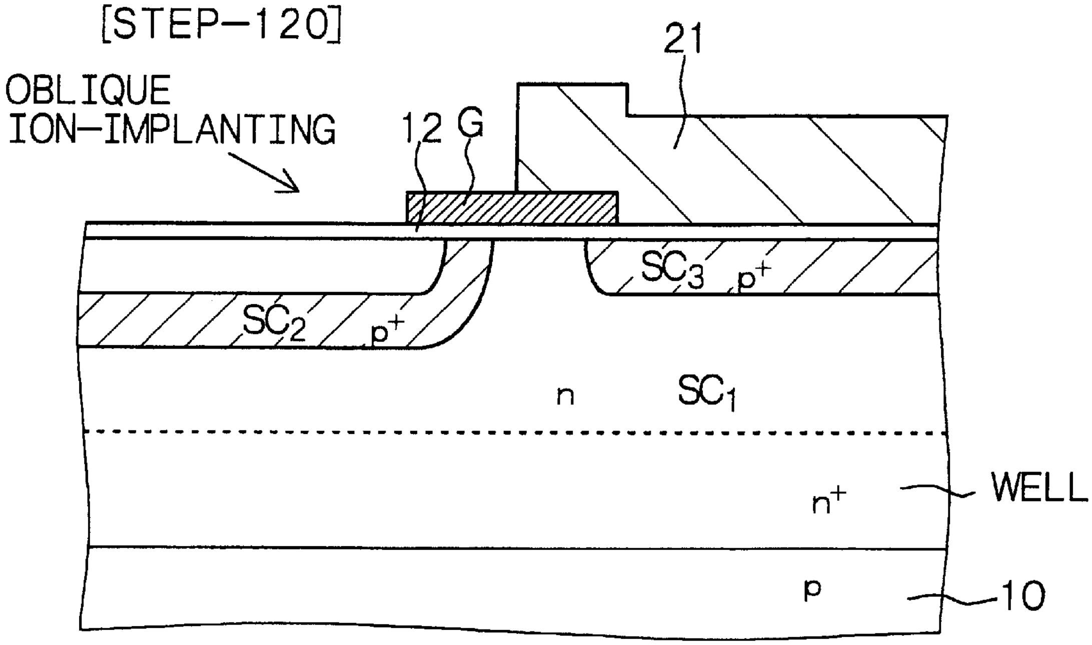
FIGS. 18A and 18B, following
Figure 18B:
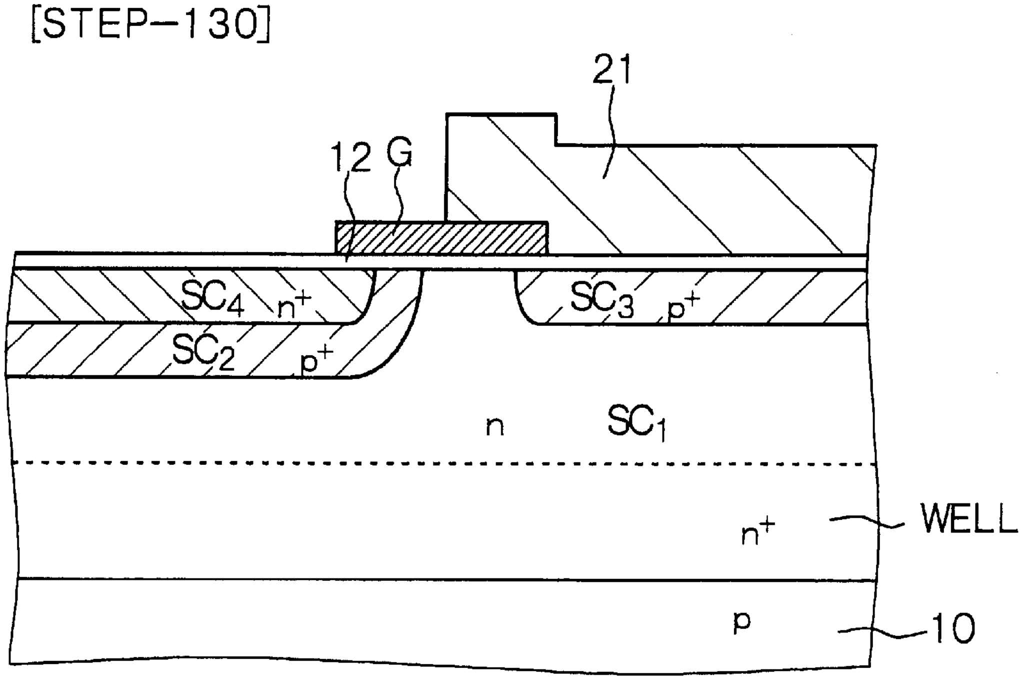

Then, ion-implantation with an impurity having the first conductivity type (for example, n-type) is carried out, to form the fourth region $SC_4$ which is formed in a surface region of the second region $SC_2$ and which is in contact so as to form a rectifier junction together with the second region $SC_2$ (see FIG. 18B). The ion-implantation is carried out under conditions shown in the following Table 3.

TABLE 3

| Ion species | Arsenic |
|---|---|
| Acceleration enerqy | 25 kev |
| Dosage | $1 \times 10^{13}/cm^2$ |
| Ion incidence angle | 7 degrees |

[Step-140]

Then, the ion-implanting mask 21 is removed, an $SiO_2$ layer is formed on the entire surface by a CVD method, and the $SiO_2$ layer is etched back to form a side-wall 30 on the side wall of the gate G ($G_1$+$G_2$).

[Step-150]

Figure 19A:
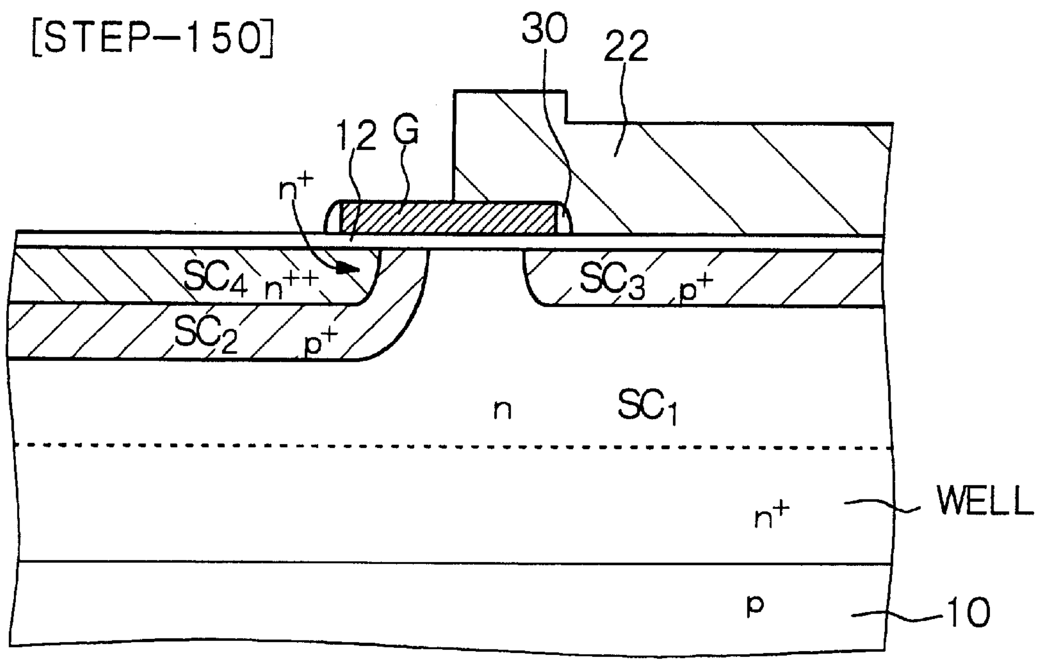
FIGS. 19A and 19B, following
Figure 19B:
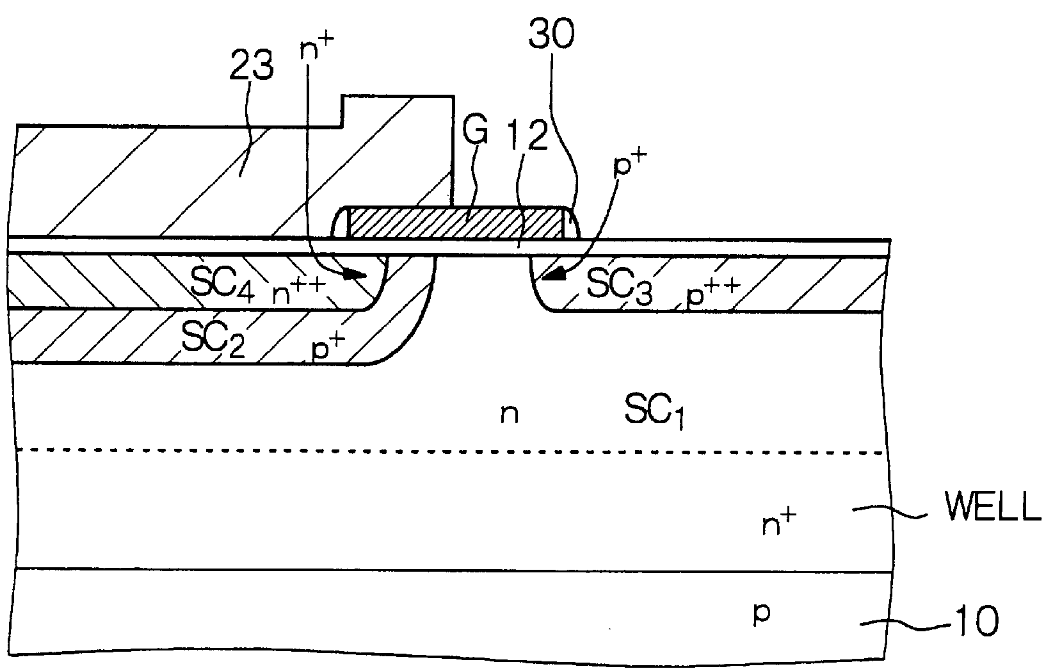

Then, an ion-implanting mask 22 is formed from a resist material, and then ion-implantation with an impurity having the first conductivity type (for example, n-type) is carried out so that the impurity concentration of the fourth region $SC_4$ is increased up to approximately $10^{18}$ to $10^{20}$ $cm^{-3}$, to decrease the resistance of the fourth region $SC_4$ (see FIG. 19A). The ion-implantation is carried out under conditions shown in the following Table 4.

TABLE 4

| Ion species | Arsenic |
|---|---|
| Acceleration energy | 30 kev |
| Dosage | $5 \times 10^{15}/cm^2$ |
| Ion incidence angle | 7 degrees |

[Step-160]

Then, the ion-implanting mask 22 is removed, and an ion-implanting mask 23 is formed from a resist material. Then, ion-implantation with an impurity having the second conductivity type (for example, p-type) is carried out so that the impurity concentration of the third region $SC_3$ is increased up to approximately $10^{18}$ to $10^{20}$ $cm^{-3}$, to decrease the resistance of the third region $SC_3$ (see FIG. 19B). The ion-implantation is carried out under conditions shown in the following Table 5.

TABLE 5

| Ion species | $BF_2$ |
|---|---|
| Acceleration energy | 30 kev |
| Dosage | $3 \times 10^{15}/cm^2$ |
| Ion incidence angle | 7 degrees |

Under the above ion-implantation conditions, the second region $SC_2$ and the third region $SC_3$ had the following impurity concentrations.

TABLE 6

| | |
|---|---|
| Second region $SC_2$ | $1.5 \times 10^{18}/cm^3$ |
| Third reqion $SC_3$ | $2.1 \times 10^{19}/cm^3$ |

[Step-170]

Then, an insulating interlayer is formed on the entire surface, and then, the insulating interlayer is patterned using a patterned resist material as a mask, to expose part of the second region $SC_2$. A silicon oxide layer ($SiO_2$ layer) as a wide gap thin film WG is formed on the surface of the exposed second region $SC_2$. Then, a polysilicon thin layer containing an impurity having the first conductivity type (for example, n-type) is formed on the entire surface, and then the polysilicon thin layer is patterned to form the electrode EL which constitutes the other end of a MIS type diode connected to the wide gap thin film WG and also to form the high-resistance element R extending from the electrode EL.

[Step-180]

Then, the write-in information setting line WISL, the second line (for example, bit line), the fourth line, etc., are formed according to known methods.

The steps of manufacturing the semiconductor memory cell shall not be limited to the above process. For example, [Step-110] may be omitted. [Step-120], [Step-130] and [Step-150] may be carried out in any order. The formation of the gate and the formation of the device separation region may be carried out after [Step-170]. The above-described ion-implantation conditions are given for explanation purposes and may be modified as required.

For forming a majority carrier diode DS of a Schottky junction type, for example, a diode-constituting region $SC_D$ composed, for example, of a titanium silicide layer is formed in a surface region of the first region $SC_1$. The above titanium silicide layer can be formed, for example, by the following method. That is, an insulating interlayer is formed on the entire surface, and the insulating interlayer in a region of the silicon semiconductor substrate 10 is removed, the region being a region where the titanium silicide layer is to be formed. Then, a titanium layer is formed on the insulating interlayer including the exposed surface of the silicon semiconductor substrate 10 by a sputtering method. Then, the titanium layer and the silicon semiconductor substrate are allowed to react by a first annealing treatment, to form the titanium silicide layer on the surface of the silicon semiconductor substrate. Then, an unreacted titanium layer on the insulating interlayer is removed, for example, with an ammonium hydrogen peroxide aqueous solution (mixture of $NH_4OH$, $H_2O_2$ and $H_2O$), and then a second annealing treatment is carried out, whereby a stabilized titanium silicide layer can be formed. The material for forming the majority carrier diode DS is not limited to titanium silicide, and it can be selected from materials such as cobalt silicide and tungsten silicide. In Examples to be described later, the diode-constituting regions $SC_D$ can be similarly formed as described above.

The method for forming the majority carrier diode DS or the method for forming conductive regions on surface regions of various regions are not limited to the above-described methods. For example, when the write-in information setting line WISL is formed, for example, a barrier layer or a glue layer of titanium silicide or TiN is formed. The barrier layer or the glue layer is also formed on the surface of the first region $SC_1$, whereby the diode-constituting region $SC_D$ which is a common region with part of the write-in information setting line WISL (more specifically, part of the barrier layer or the glue layer) can be formed in a surface of the first region $SC_1$. Conductive regions can be similarly formed in surface regions of various regions as described above. In Examples to be described later, majority carrier diodes DS or conductive regions can be similarly formed on surface regions of various regions as described above.

The variants of the semiconductor memory cell of Example 1 can be also manufactured substantially by the above method. Further, a semiconductor memory cell of Example 2 to be described later can be also manufactured substantially by the above method except for the formation of MIS-type-diode constituting regions $SC_{DT}$. When a MIS-type-diode constituting region $SC_{DT}$ (to be described later)

having the second conductivity type (for example, $p^+$-type) is formed in the form of a buried plug, it can be formed in [Step-170] by a method in which the insulating interlayer is formed, then, a MIS-type-diode constituting region $SC_{DT}$ is formed by ion implantation using a patterned resist material as a mask, and then the MIS type diode DT is formed.

EXAMPLE 2

Figure 4:
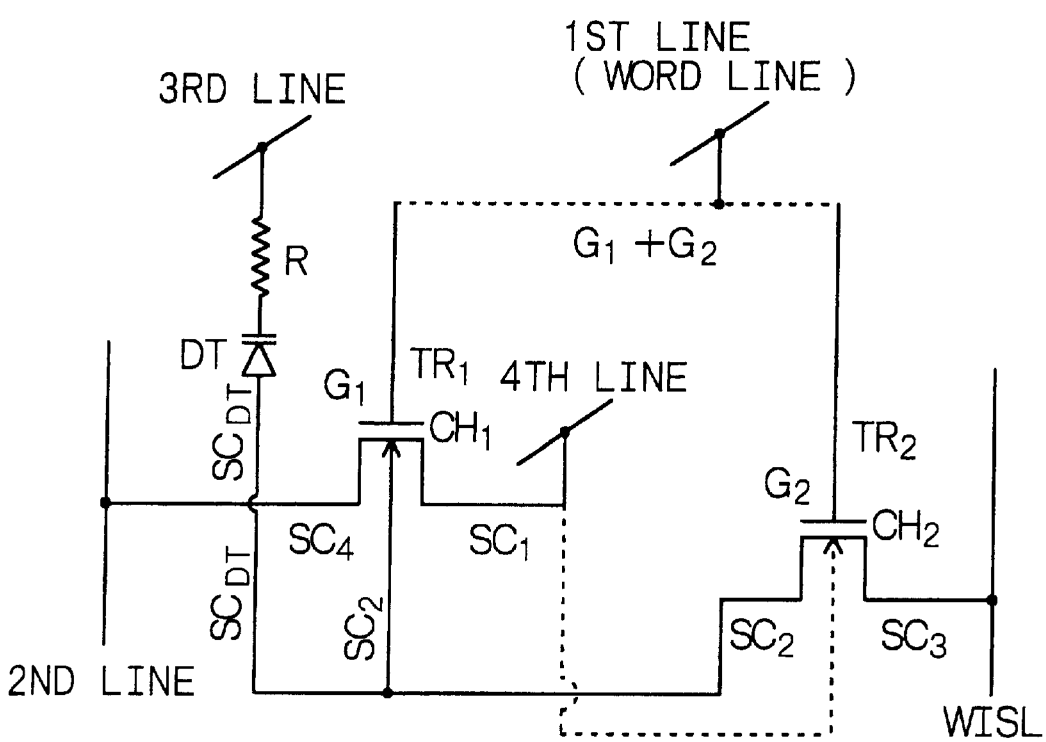
FIG. 4 shows the principle of a semiconductor memory cell according to the third aspect of the present invention.
Figure 20A:
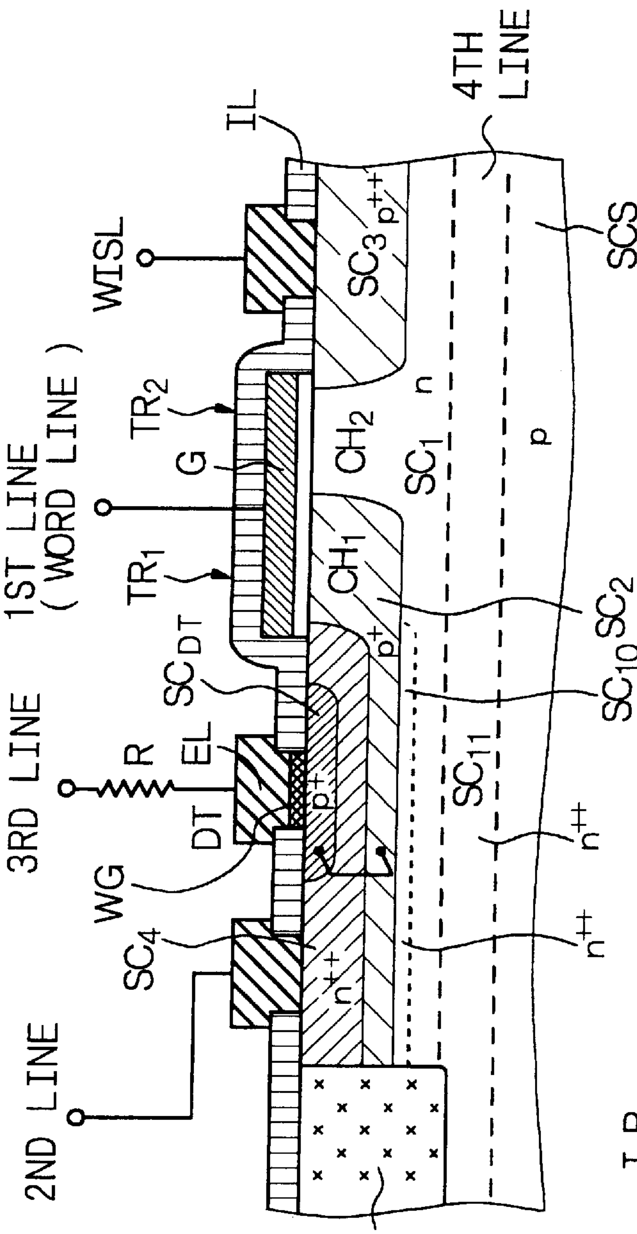
FIG. 20A shows a schematic partial cross-sectional view of a semiconductor memory cell of Example 2.
Figure 20B:
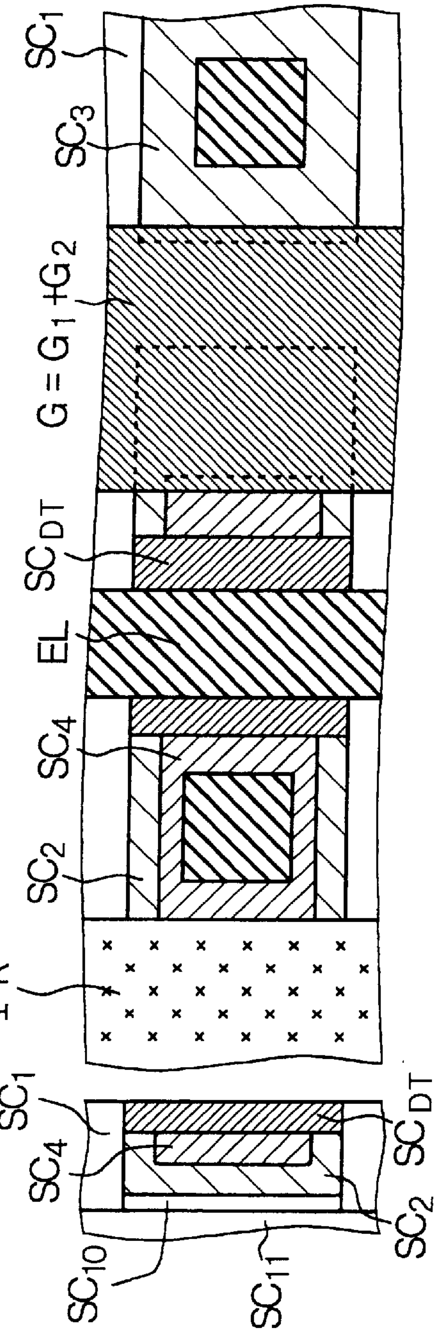
FIG. 20B shows a schematic layout of regions thereof and another schematic partial cross-sectional view of the regions thereof taken along some plane perpendicular to the cross section shown in FIG. 20A.

Example 2 is concerned with the semiconductor memory cell according to the first and third aspects of the present invention. FIG. 4 shows the principle of the semiconductor memory cell of Example 2, FIG. 20A shows a partial cross-sectional view thereof, and FIG. 20B shows a schematic layout of regions thereof and a cross-sectional view taken by cutting regions including a MIS-type-diode constituting region $SC_{DT}$ with a vertical plane.

The semiconductor memory cell comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and a gate $G_2$ capacitively coupled with the channel forming region $CH_2$, and (3) an MIS type diode DT for retaining information.

In Example 2, similarly, the first transistor $TR_1$ and the second transistor $TR_2$ constitute one merged transistor. That is, the area of the semiconductor memory cell of Example 2 is generally smaller than the area of two transistors.

The semiconductor memory cell of Example 2 has;

(a) a semi-conductive first region $SC_1$ having a first conductivity type (for example, n-type), (b) a semi-conductive second region $SC_2$ being in contact with the first region $SC_1$ and having a second conductivity type (for example, $p^+$-type), (c) a third region $SC_3$ which is formed in a surface region of the first region $SC_1$ to be spaced from the second region $SC_2$ and is in contact with the first region $SC_1$ so as to form a rectifier junction together with the first region $SC_1$, the third region $SC_3$ being a region which is semi-conductive and has the second conductivity type (for example, $p^{++}$-type) or which is conductive and is formed of a silicide, a metal or a metal compound, (d) a semi-conductive fourth region $SC_4$ which is formed in a surface region of the second region $SC_2$ to be spaced from the first region $SC_1$ and has the first conductivity type (for example, $n^{++}$-type), and (e) a semi-conductive MIS-type-diode constituting region $SC_{DT}$ which is formed in a surface region of the fourth region $SC_4$ and has the second conductivity type (for example, $p^+$-type).

Concerning the first transistor $TR_1$, (A-1) one source/drain region is formed of a surface region of the first region $SC_1$ which surface region is interposed between the second region $SC_2$ and the third region $SC_3$, (A-2) the other source/drain region is formed of the fourth region $SC_4$, (A-3) the channel forming region $CH_1$ is formed of a surface region of the second region $SC_2$ which surface region is interposed between the surface region of the first region $SC_1$ and the fourth region $SC_4$, and (A-4) the gate $G_1$ is formed on the channel forming region $CH_1$ of the first transistor $TR_1$ through an insulation layer.

Concerning the second transistor $TR_2$, (B-1) one source/drain region is formed of the surface region of the second region $SC_2$ which surface region constitutes the channel forming region $CH_1$ of the first transistor $TR_1$, (B-2) the other source/drain region is formed of the third region $SC_3$, (B-3) the channel forming region $CH_2$ is formed of the surface region of the first region $SC_1$ which surface region constitutes one source/drain region of the first transistor $TR_1$, and (B-4) the gate $G_2$ is formed on the channel forming region $CH_2$ of the second transistor $TR_2$ through an insulation layer.

The gate $G_1$ of the first transistor $TR_1$ and the gate $G_2$ of the second transistor $TR_2$ are formed on the insulation layer so as to bridge the first region $SC_1$ and the fourth region $SC_4$ and so as to bridge the second region $SC_2$ and the third region $SC_3$, and are shared by the first transistor $TR_1$ and the second transistor $TR_2$.

Further, concerning the MIS type diode DT, (C-1) one end thereof is formed of the MIS-type-diode constituting region $SC_{DT}$ which corresponds to an extending portion of the channel forming region $CH_1$ of the first transistor $TR_1$, and (C-2) an electrode EL constituting the other end thereof is formed to be opposed to the MIS-type-diode constituting region $SC_{DT}$ constituting one end of the MIS type diode DT, through a wide gap thin film.

Further, in the semiconductor memory cell of Example 2, the gate $G_1$ of the first transistor $TR_1$ and the gate $G_2$ of the second transistor $TR_2$ are connected to a first line (word line) for memory cell selection. The second region $SC_2$ is connected to the MIS-type-diode constituting region $SC_{DT}$, the third region $SC_3$ is connected to a write-in information setting line WISL, and the fourth region $SC_4$ is connected to a second line (for example, bit line for memory cell selection). Further, the electrode EL constituting the other end of the MIS type diode DT is connected to a third line having a predetermined potential. Furthermore, the first region $SC_1$ is connected to a fourth line.

In another embodiment, the gate $G_1$ of the first transistor $TR_1$ and the gate $G_2$ of the second transistor $TR_2$ are connected to the first line (word line), the other source/drain region of the first transistor $TR_1$ is connected to the second line (bit line), the other source/drain region of the second transistor $TR_2$ is connected to the write-in information setting line WISL, and the other end of the MIS type diode DT is connected to the line (third line) having a predetermined potential through the high-resistance element R.

In the semiconductor memory cell of Example 2, the second region $SC_2$ is formed in the surface region of the first region $SC_1$ as well. Further, a second high-concentration-impurity-containing layer $SC_{11}$ having the first conductivity type (for example, $n^{++}$-type) is formed below the first region $SC_1$, and the second high-concentration-impurity-containing layer $SC_{11}$ works as the fourth line. Furthermore, a first high-concentration-impurity-containing layer $SC_{10}$ having the first conductivity type (for example, $n^{++}$-type) is formed below the second region $SC_2$. The semiconductor memory cell is formed in a well structure having the first conductivity type (for example, n-type).

The MIS-type-diode constituting region $SC_{DT}$ and the second region $SC_2$ can be connected by forming a structure, for example, as shown in FIG. 20B, in which a portion of the second region $SC_2$ extends up to a vicinity of the surface of the semiconductor substrate and the MIS-type-diode constituting region $SC_{DT}$ and the extending part of the second region $SC_2$ are brought into contact with each other outside the fourth region $SC_4$. When the semiconductor memory cell is structured as described above, the wiring structure of the semiconductor memory cell can be simplified.

Figure 21:
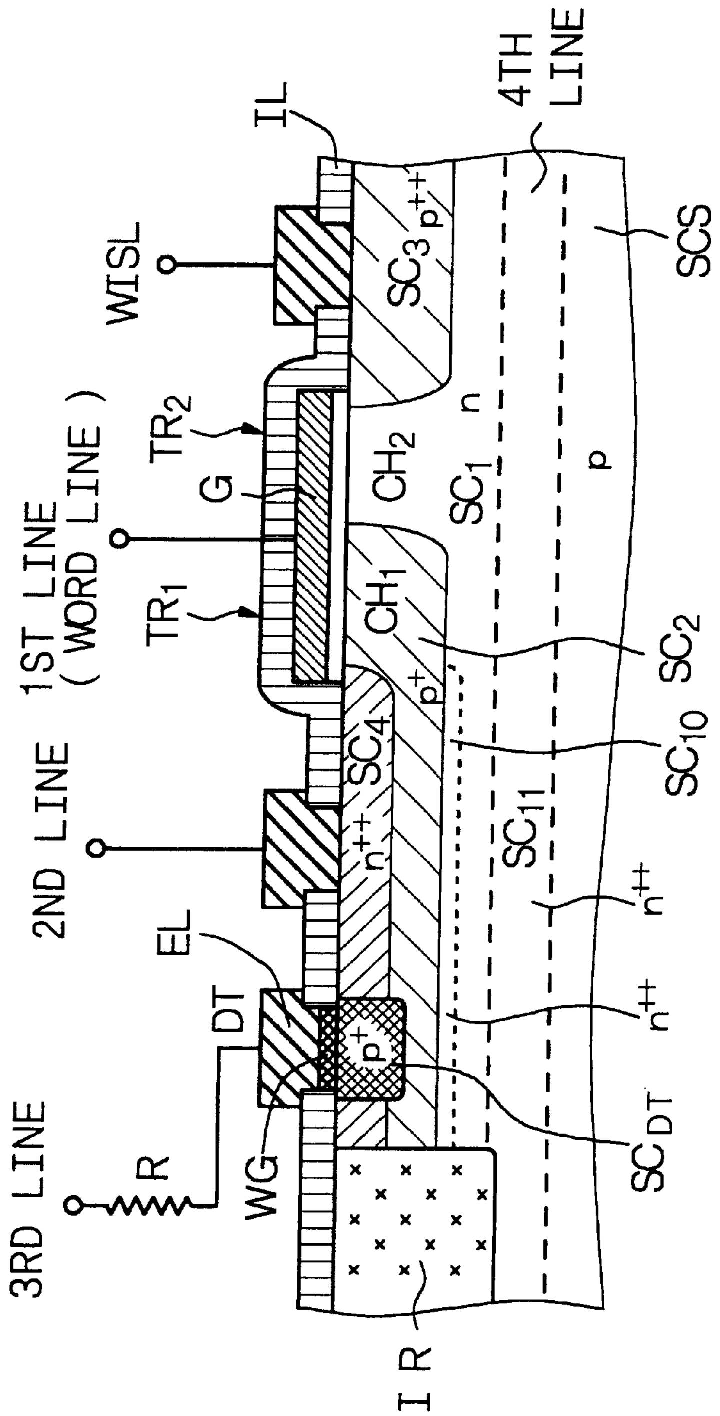
FIG. 21 shows a schematic partial cross-sectional view of a variant of the semiconductor memory cell of Example 2.

In a semiconductor memory cell whose schematic partial cross-sectional view is shown in FIG. 21, the MIS-type-diode constituting region $SC_{DT}$ having the second conductivity type (for example, $p^+$-type) is formed in the form of a buried plug, and the MIS-type-diode constituting region $SC_{DT}$ penetrates through the fourth region $SC_4$ until it reaches the second region $SC_2$. When the semiconductor memory cell is structured as described above, the MIS-type-diode constituting region $SC_{DT}$ and the second region $SC_2$ can be also connected. Except for this point, the semiconductor memory cell shown in FIG. 21 is substantially structurally the same as the semiconductor memory cell shown in FIGS. 20A and 20B.

In the semiconductor memory cell shown in FIGS. 20A and 20B or FIG. 21, there may be employed another constitution in which the a second predetermined potential is applied to the second line to which the fourth region $SC_4$ is connected, and the fourth line to which the first region $SC_1$ is connected is used as a line (bit line) for memory cell selection.

Figure 5:
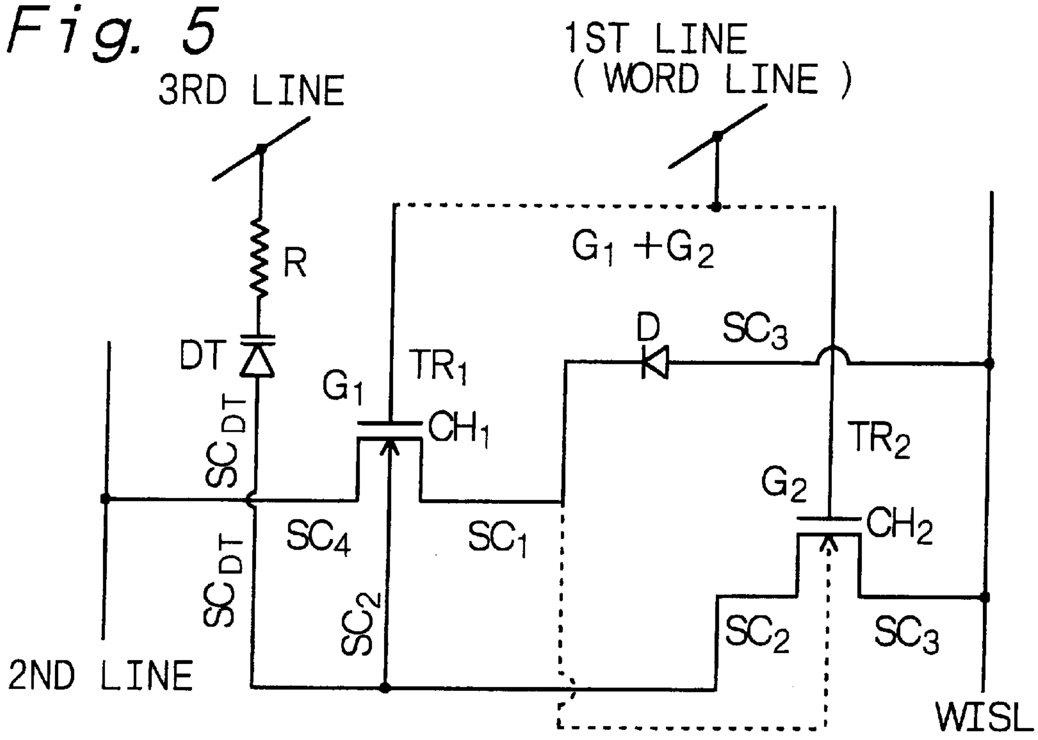
FIG. 5 shows the principle of a variant of the semiconductor memory cell according to the third aspect of the present invention.

In the semiconductor memory cell of Example 2, the third region $SC_3$ is formed of semiconductor, and the impurity concentrations of the first region $SC_1$ and the third region $SC_3$ are properly controlled so that the first region $SC_1$ and the third region $SC_3$ constitute a pn junction diode D, whereby there can be employed a constitution in which the fourth line is omitted and the first region $SC_1$ is connected to the write-in information setting line WISL through the third region $SC_3$ as FIG. 5 shows the principle thereof. In this case, the wiring structure of the semiconductor memory cell can be simplified. In the so-constituted semiconductor memory cell, the gate $G_1$ of the first transistor $TR_1$ and the gate $G_2$ of the second transistor $TR_2$ are connected to the first line (word line), one source/drain region of the first transistor $TR_1$ is connected to the write-in information setting line WISL through the pn junction diode D, the other source/drain region of the first transistor $TR_1$ is connected to the second line (for example, bit line), the other source/drain region of the second transistor $TR_2$ is connected to the write-in information setting line WISL, and the other end of the MIS type diode DT is connected to the line (third line) having a predetermined potential through the high-resistance element R. There may be employed another constitution in which a second predetermined potential is applied to the second line to which the fourth region $SC_4$ is connected and the fourth line to which the first region $SC_1$ is connected is used as a line (bit line) for memory cell selection.

Figure 6:
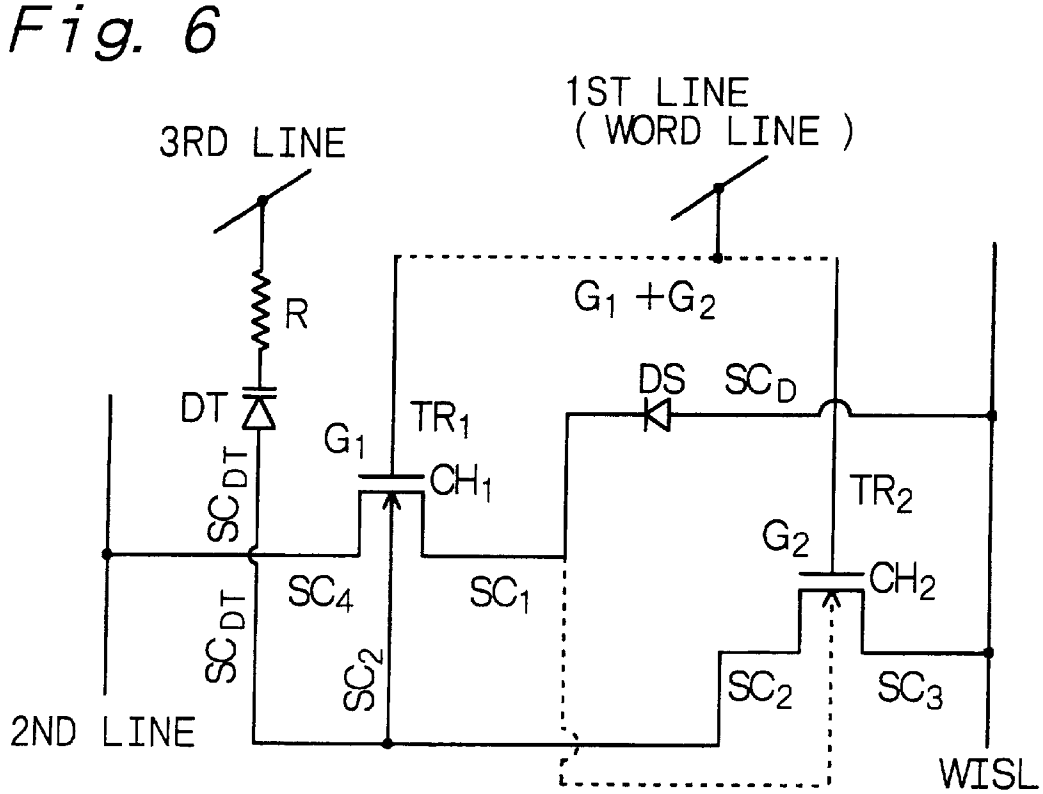
FIG. 6 shows the principle of another variant of the semiconductor memory cell according to the third aspect of the present invention.
Figure 22A:
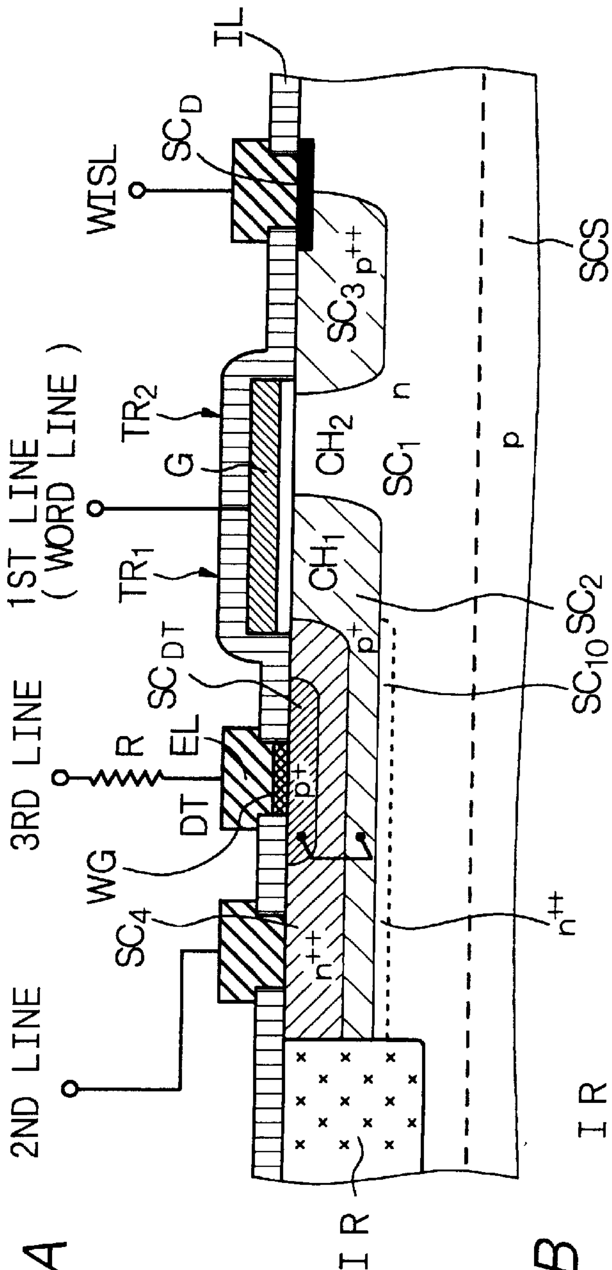
FIG. 22A shows a schematic partial cross-sectional view of a variant of the semiconductor memory cell of Example 2.
Figure 22B:
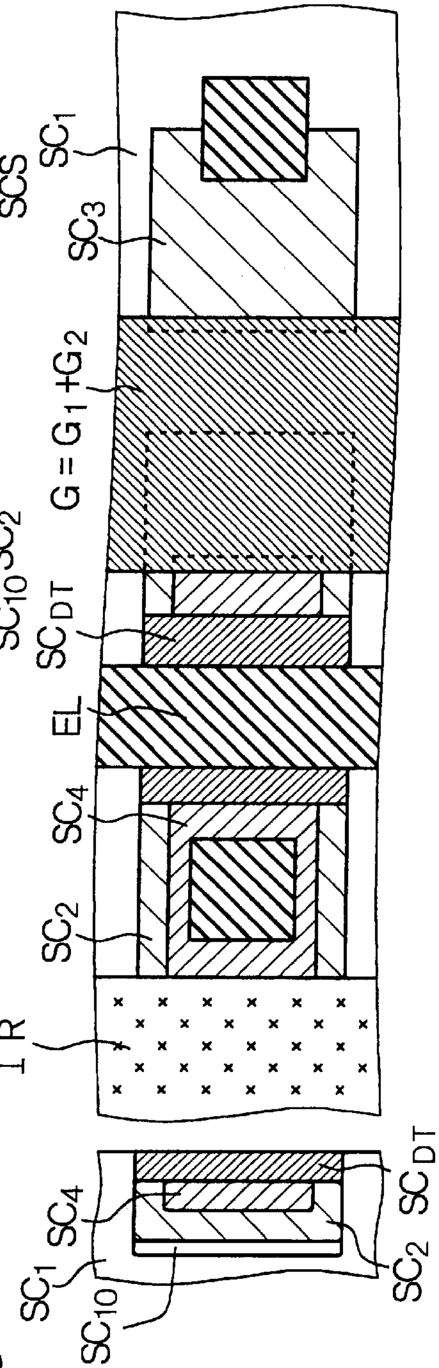
FIG. 22B shows a schematic layout of regions of thereof and another schematic partial cross-sectional view of the regions thereof taken along some plane perpendicular to the cross section shown in FIG. 22A.
Figure 23:
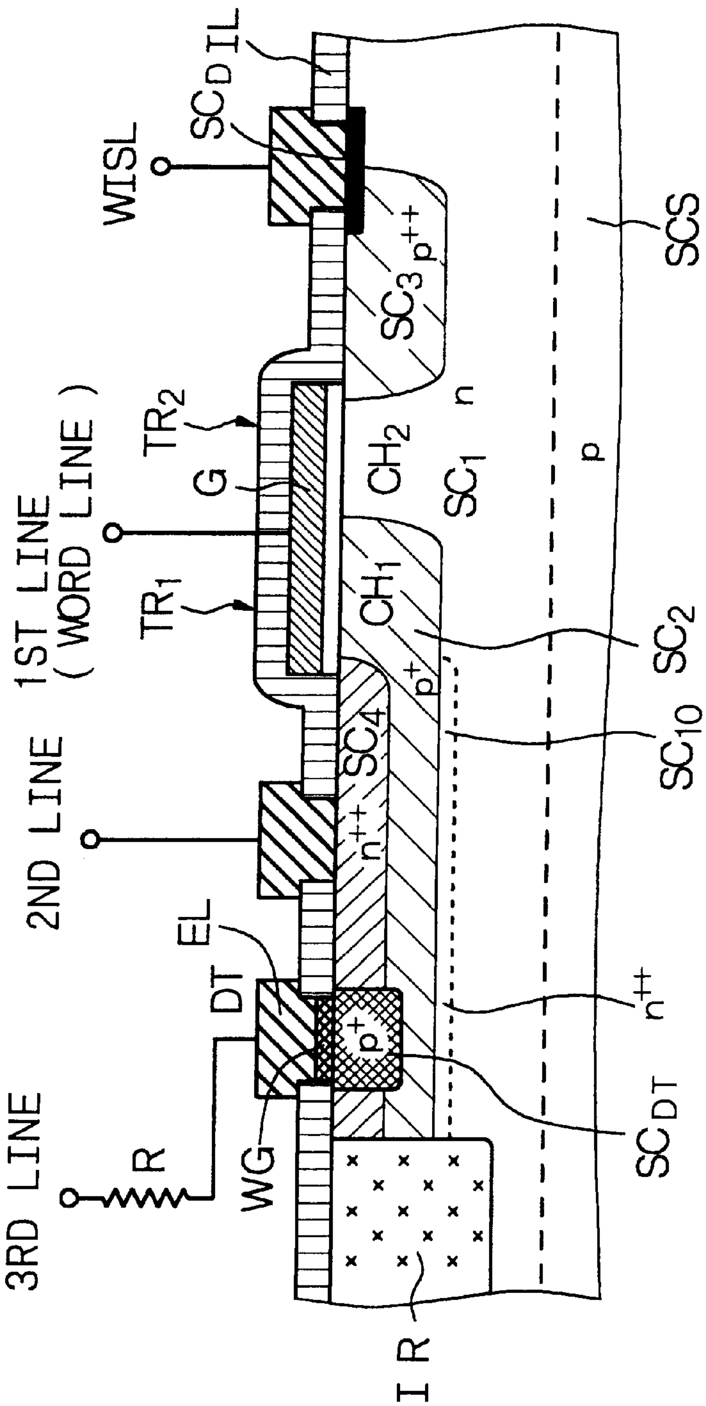
FIG. 23 shows a schematic partial cross-sectional view of another variant of the semiconductor memory cell of Example 2.

FIG. 6 shows the principle of a variant of the semiconductor memory cell of Example 2. Further, FIG. 22A shows a schematic partial cross-sectional view of the variant, and FIG. 22B shows a schematic layout of regions thereof and a schematic cross-sectional view taken by cutting the regions including a MIS-type-diode constituting region $SC_{DT}$ with a vertical plane. The semiconductor memory cell shown in FIGS. 22A and 22B is a variant of the semiconductor memory cell shown in FIGS. 20A and 20B. Further, FIG. 23 shows a variant of the semiconductor memory cell shown in FIG. 21. In these semiconductor memory cells, a diode-constituting region $SC_D$ is formed in a surface region of the first region $SC_1$ and the diode-constituting region $SC_D$ is composed, for example, of titanium silicide, TiN and the like. The first region $SC_1$ and the diode-constituting region $SC_D$ constitute a majority carrier diode DS. In the above constitution, the fourth line can be omitted, and the first region $SC_1$ can be connected to the write-in information setting line WISL through the diode-constituting region $SC_D$, so that the wiring structure can be simplified. In the so-constituted semiconductor memory cell, the gate $G_1$ of the first transistor $TR_1$ and the gate $G_2$ of the second transistor $TR_2$ are connected to the first line (word line), one source/drain region of the first transistor $TR_1$ is connected to the write-in information setting line WISL through the majority carrier diode DS, the other source/drain region of the first transistor $TR_1$ is connected to the second line corresponding to the bit line, the other source/drain region of the second transistor $TR_2$ is connected to the write-in information setting line WISL, and the other end of the MIS type diode DT is connected to the line (third line) having a predetermined potential through the high-resistance element R. There may be employed another constitution in which a second predetermined potential is applied to the second line to which the fourth region $SC_4$ is connected and the write-in information setting line WISL is used as a bit line as well.

FIGS. 24A, 24B, 25A, 25B, 26A, 26B, 27, 28, 29 and 30 show other variants of the semiconductor memory cell of Example 2.

Figure 24A:
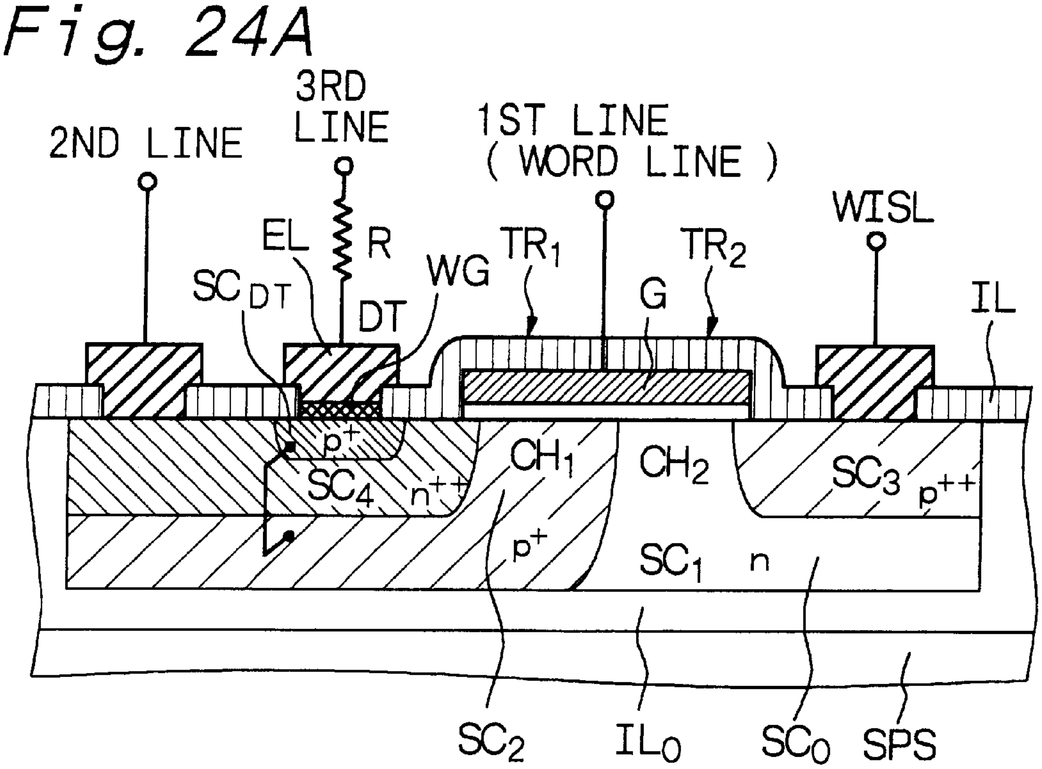
FIGS. 24A and 24B show schematic partial cross-sectional views of variants of the semiconductor memory cell of Example 2.
Figure 24B:
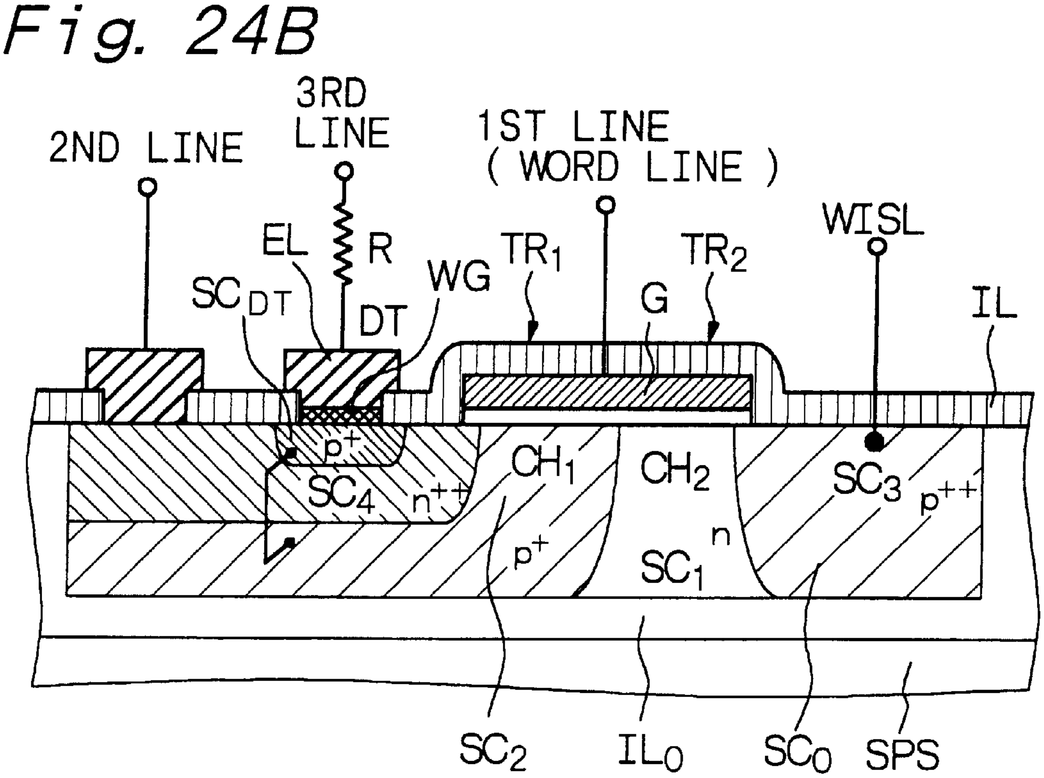
Figure 25A:
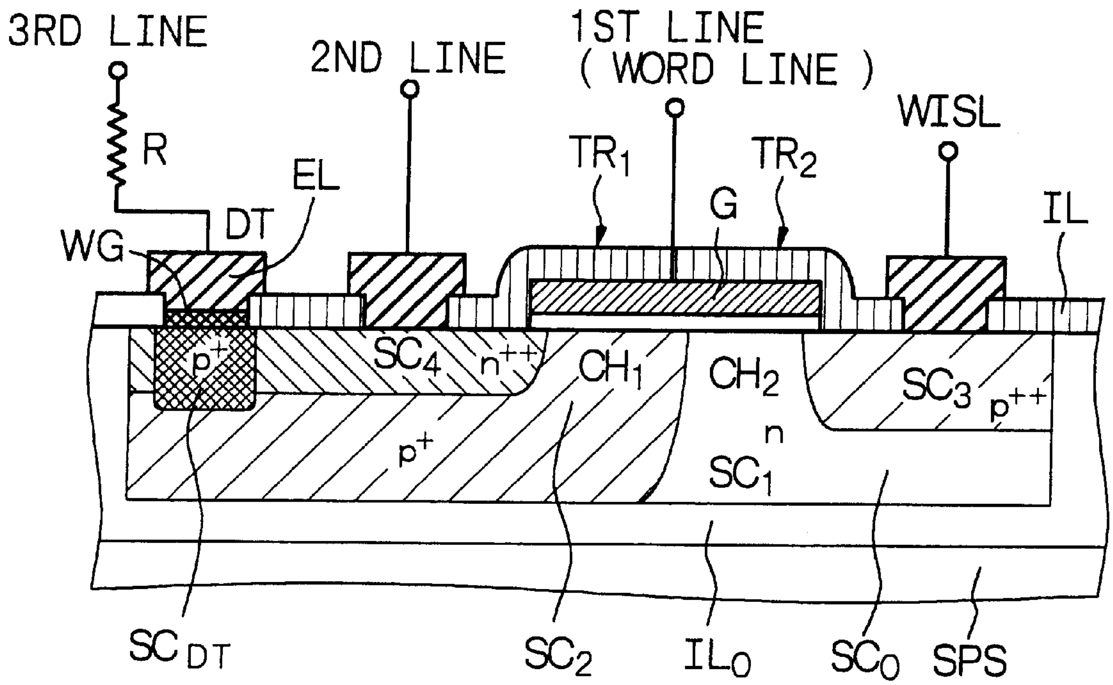
FIGS. 25A and 25B show schematic partial cross-sectional views of variants of the semiconductor memory cell of Example 2.
Figure 25B:
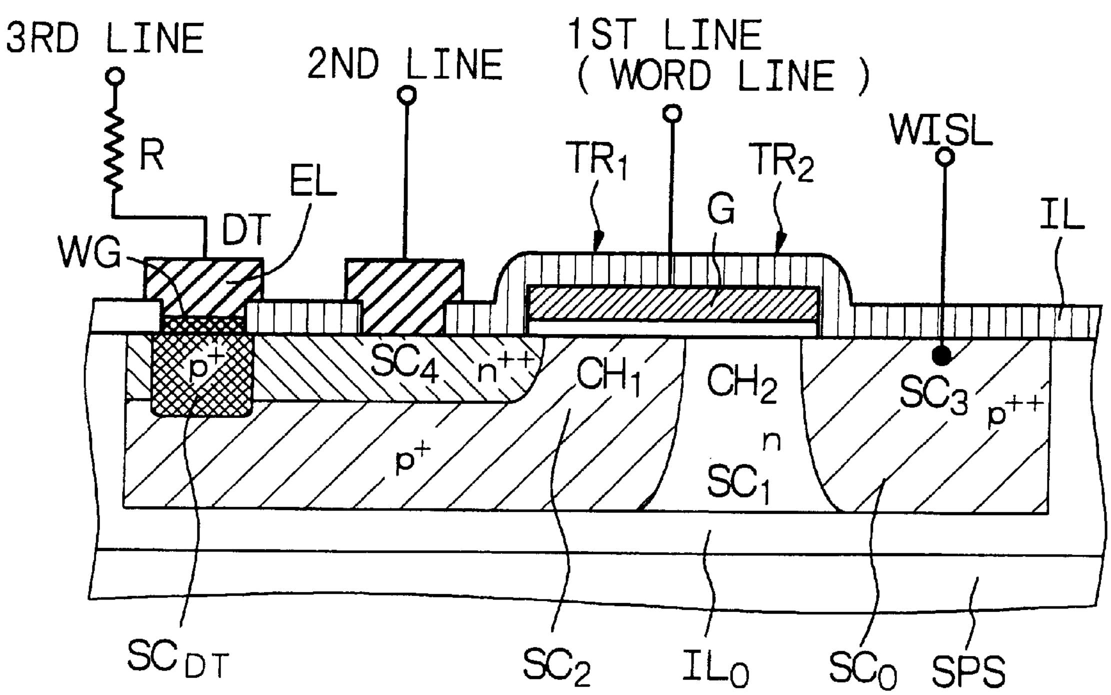

In the variants shown in FIGS. 24A and 24B, a semiconductor memory cell having the structure shown in FIGS. 20A and 20B is formed in a semiconductor layer $SC_0$ surrounded by an insulation material layer $IL_0$ on a supporting substrate SPS. In the variants shown in FIGS. 25A and 25B, a semiconductor memory cell having the structure shown in FIG. 21 is formed in a semiconductor layer $SC_0$ surrounded by an insulation material layer $IL_0$ on a supporting substrate SPS. The difference between the semiconductor memory cells shown in FIGS. 24A and 25A and the semiconductor memory cells shown in FIGS. 24B and 25B is how far the third region $SC_3$ extends downwardly. In the semiconductor memory cells having structures shown in FIGS. 24B and 25B, an electrode from a side of the third region $SC_3$ to the write-in information setting line WISL can be taken. These semiconductor memory cells are substantially structurally the same as the semiconductor memory cell shown in FIGS. 20A and 20B or FIG. 21 in other points.

Figure 26A:
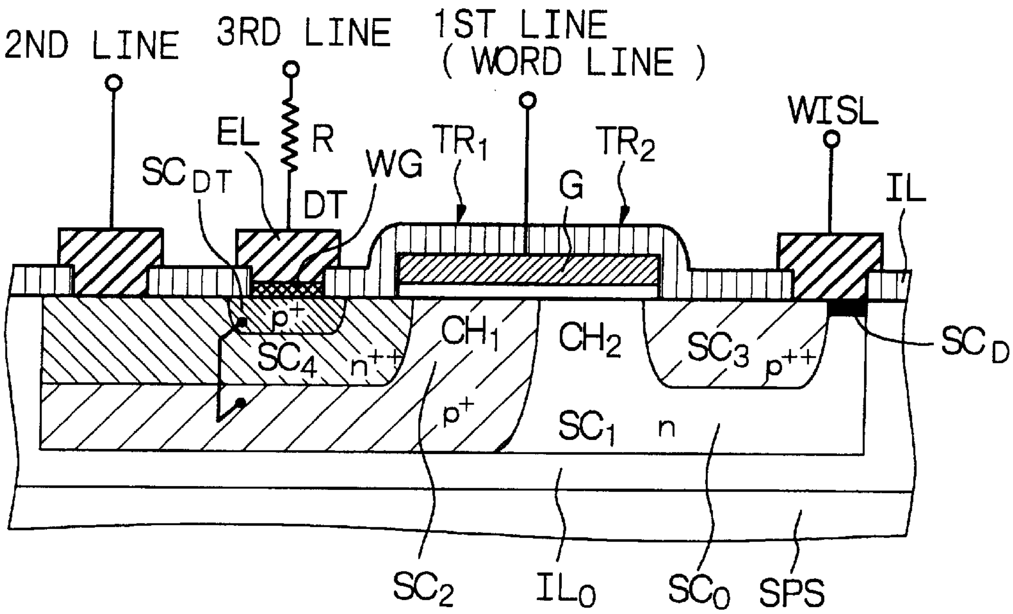
FIGS. 26A and 26B show schematic partial cross-sectional views of variants of the semiconductor memory cell of Example 2.
Figure 26B:
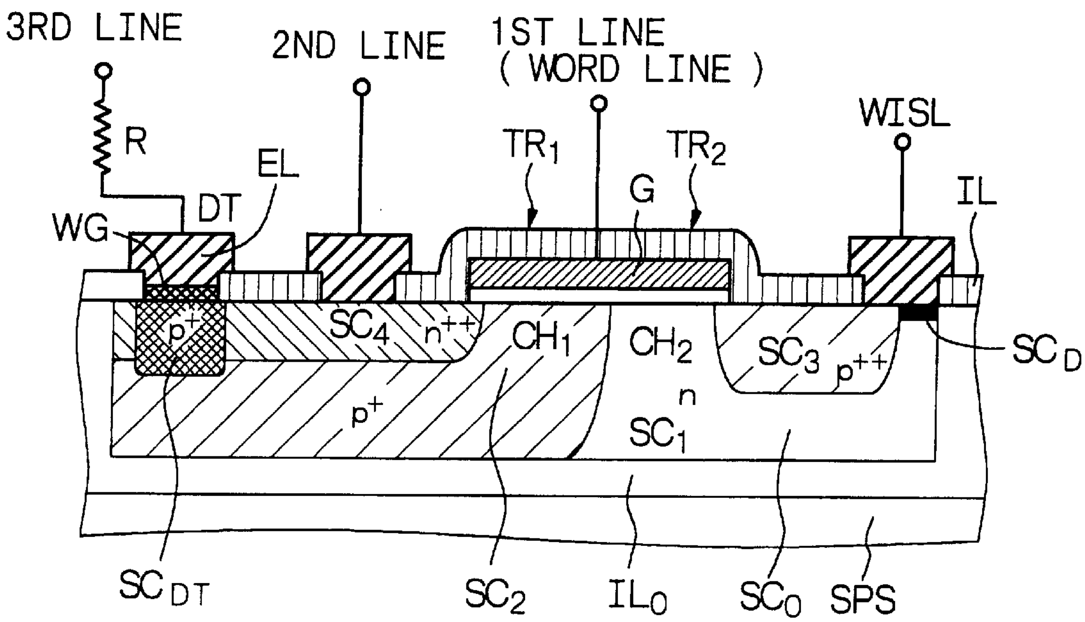

In the variants shown in FIGS. 26A and 26B (see the showing of the principle in FIG. 6A), a semiconductor memory cell having the structure shown in FIGS. 22A and 22B and FIG. 23 is formed in a semiconductor layer $SC_0$ surrounded by an insulation layer material $IL_0$ on a supporting substrate SPS. These semiconductor memory cells in FIGS. 26A and 26B are substantially structurally the same as the semiconductor memory cell shown in FIGS. 22A and 22B and FIG. 23 in other points.

The semiconductor memory cells shown in FIGS. 24A, 24B, 25A, 25B, 26A and 26B can be manufactured according to the already explained method of manufacturing an SOI structure or TFT structure.

Figure 27:
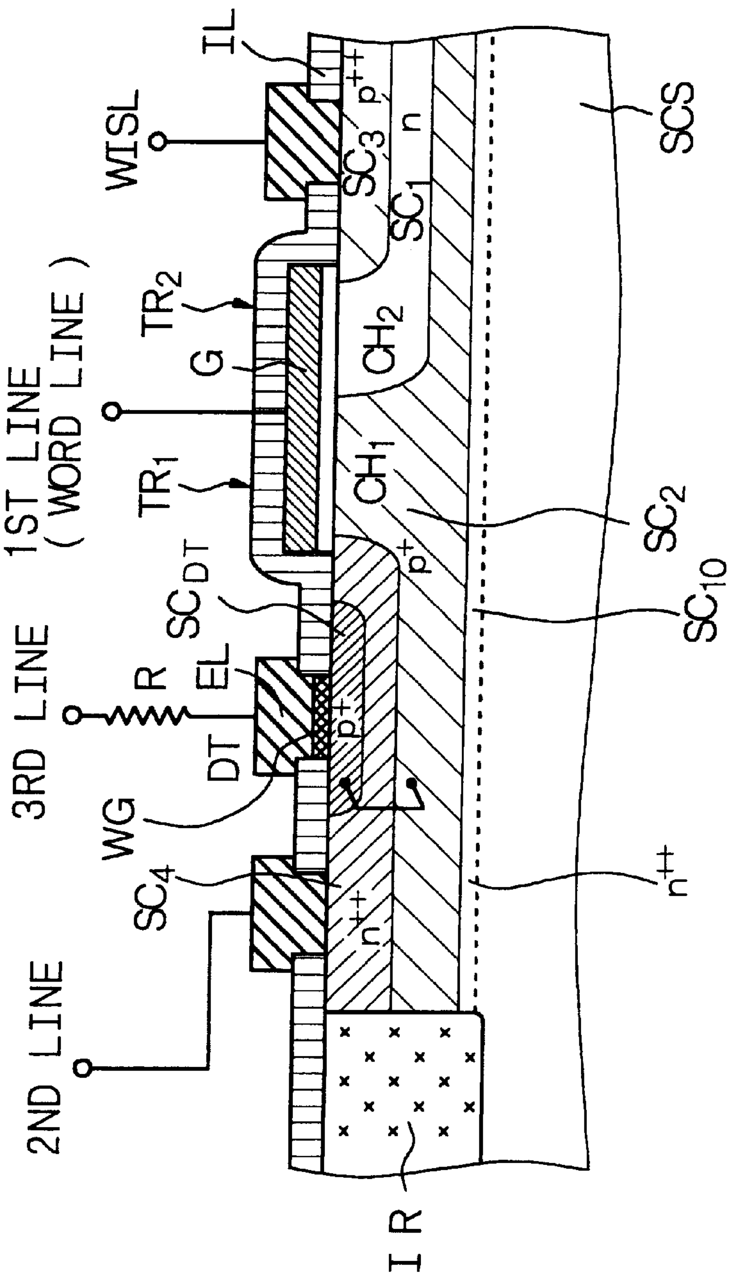
FIG. 27 shows a schematic partial cross-sectional view of another variant of the semiconductor memory cell of Example 2.
Figure 28:
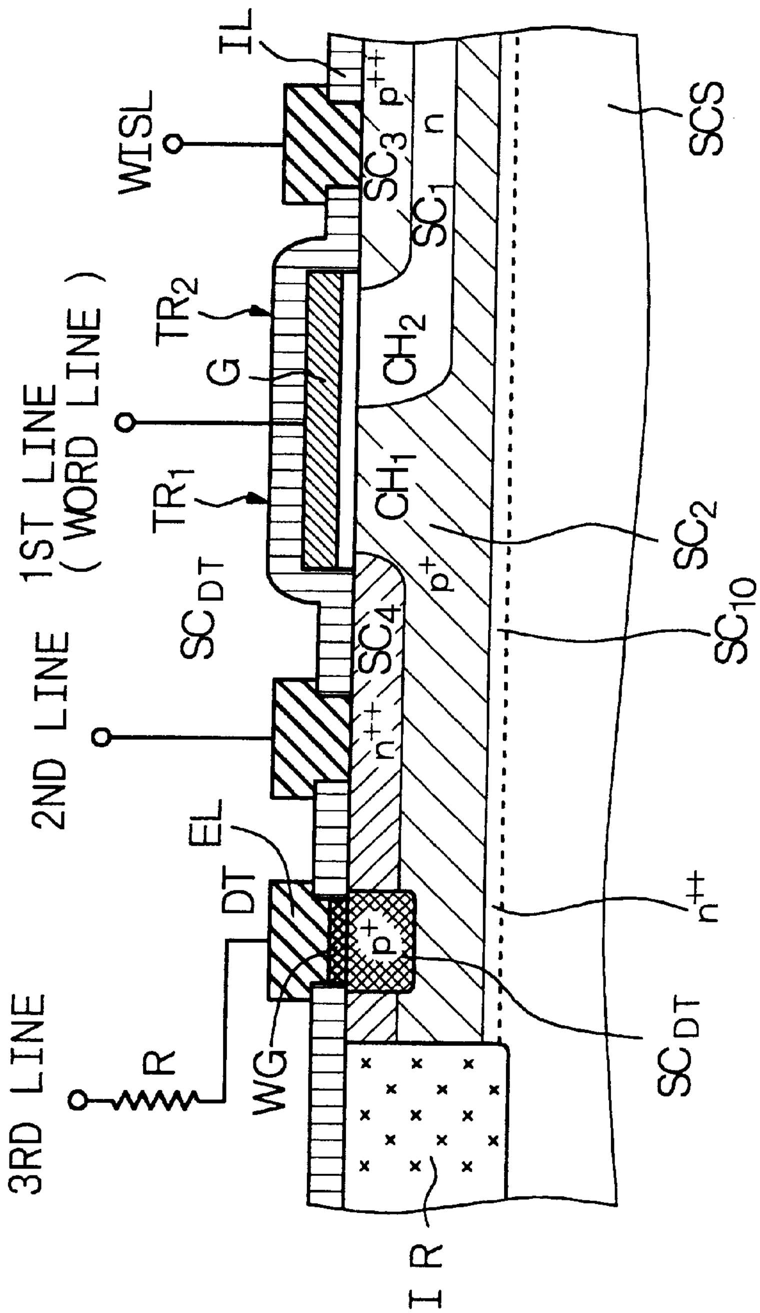
FIG. 28 shows a schematic partial cross-sectional view of another variant of the semiconductor memory cell of Example 2.

A semiconductor memory cell shown in FIG. 27 is a variant of the semiconductor memory cell shown in FIGS. 20A and 20B, a semiconductor memory cell shown in FIG.

Figure 29:
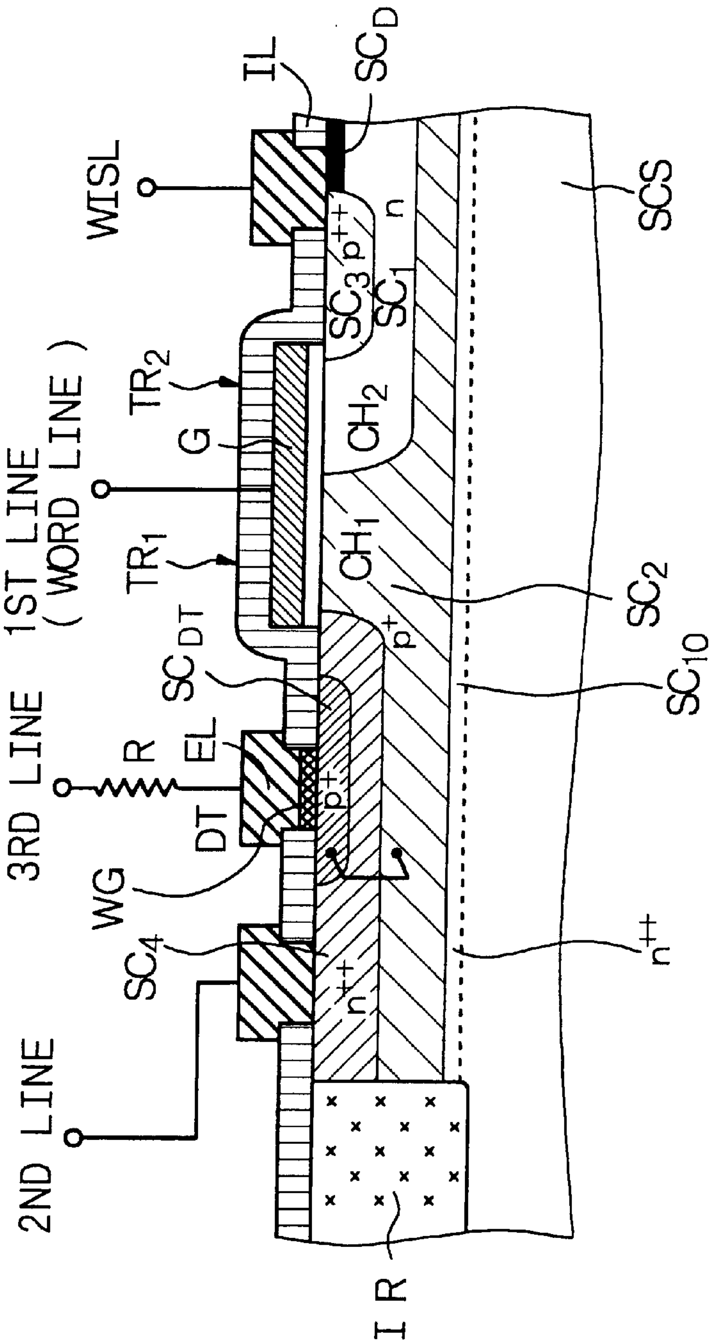
FIG. 29 shows a schematic partial cross-sectional view of another variant of the semiconductor memory cell of Example 2.
Figure 30:
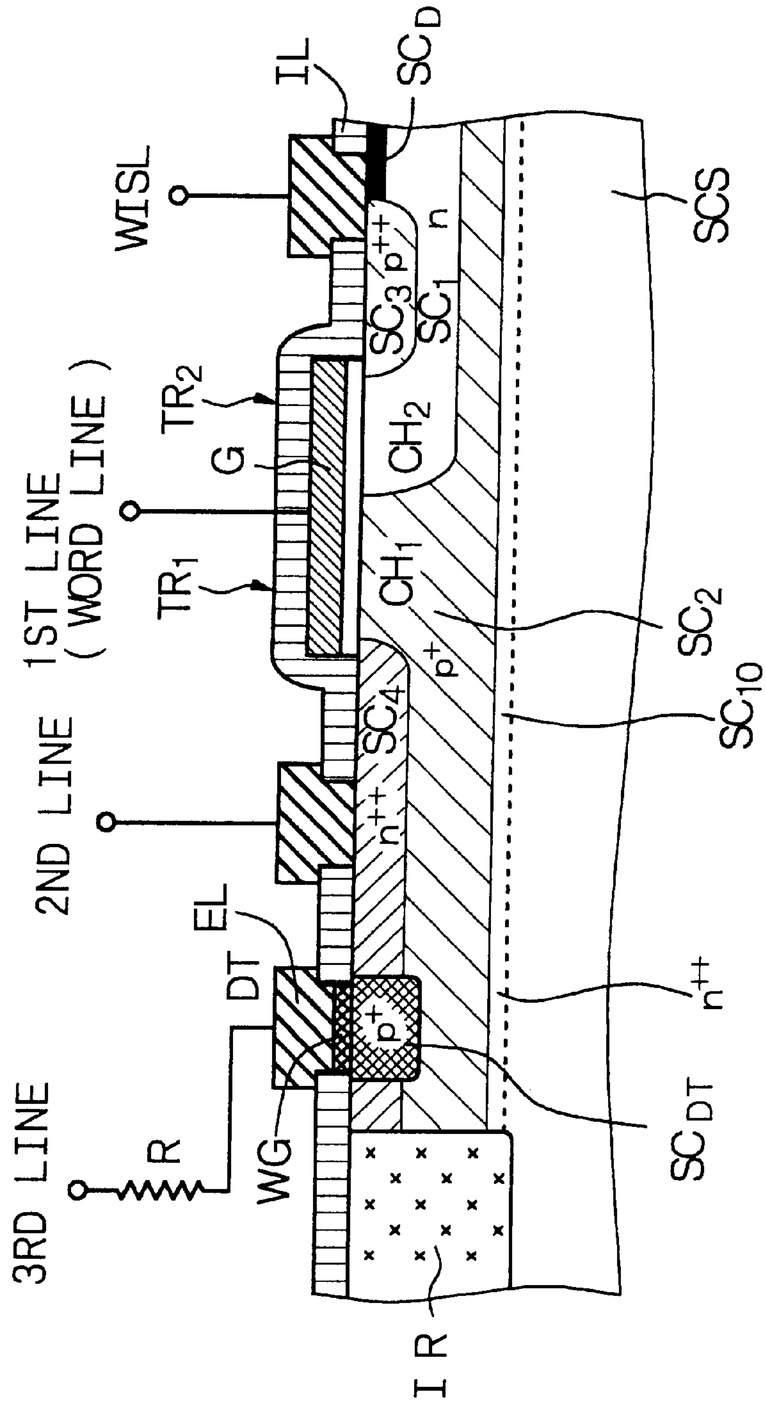
FIG. 30 shows a schematic partial cross-sectional view of another variant of the semiconductor memory cell of Example 2.

28 is a variant of the semiconductor memory cell shown in FIG. 21, a semiconductor memory cell shown in FIG. 29 is a variant of the semiconductor memory cell shown in FIGS. 22A and 22B, and a semiconductor memory cell shown in FIG. 30 is a variant of the semiconductor memory cell shown in FIG. 23. In the semiconductor memory cells shown in FIGS. 27 to 30, the first region $SC_1$ is formed in a surface region of the second region $SC_2$. Except for this point, the semiconductor memory cells shown in FIGS. 27 to 30 are substantially structurally the same as those shown in FIGS. 20A and 20B, FIG. 21, FIGS. 22A and 22B and FIG. 23, respectively.

In the above-explained variants of the semiconductor memory cell of Example 2, shown in FIGS. 24A, 24B, 25A, 25B, 27 and 28, there may be employed a constitution in which the second line to which the fourth region $SC_4$ is connected is used as a bit line and a second predetermined potential is applied to the fourth line to which the first region $SC_1$ is connected. Further, there may be employed another constitution in which a second predetermined potential is applied to the second line to which the fourth region $SC_4$ is connected and the fourth line to which the first region $SC_1$ is connected is used as a bit line for memory cell selection. Further, in the variants of the semiconductor memory cell of Example 2, shown in FIGS. 26A, 26B, 29 and 30, there may be employed a constitution in which the second line to which the fourth region $SC_4$ is connected is used as a bit line, or a constitution in which a second predetermined potential is applied to the second line and the write-in information setting line WISL is used as a bit line as well.

EXAMPLE 3

Example 3 is concerned with the semiconductor memory cells according to the first and fourth aspects of the present invention. As is shown in the principle drawing of FIG. 1 and the schematic partial cross-sectional view of FIG. 31A, the semiconductor memory cell of Example 3 comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and a gate $G_2$ capacitively coupled with the channel forming region $CH_2$, and (3) an MIS type diode for retaining information.

Figure 31A:
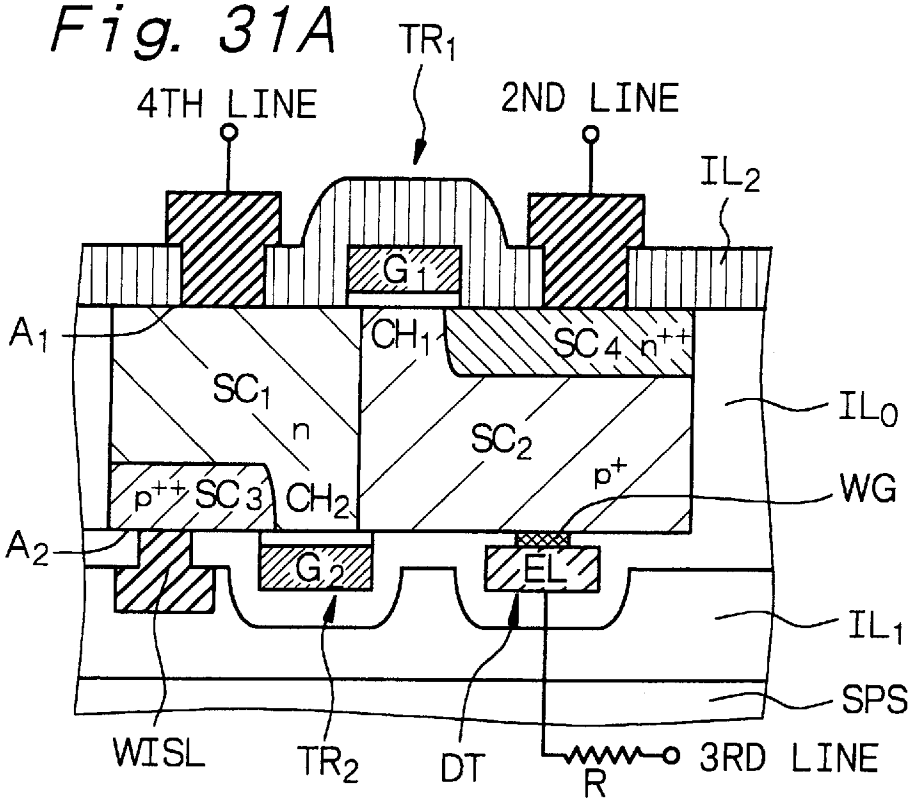
FIGS. 31A and 31B show schematic partial cross-sectional views of the semiconductor memory cells of Example 3.

In the semiconductor memory cell of Example 3 shown in FIG. 31A, the gate $G_1$ of the first transistor $TR_1$ and the gate $G_2$ of the second transistor $TR_2$ are respectively formed on a first main surface $A_1$ and a second main surface $A_2$ which are opposite to each other thorough a semiconductor layer, and positions of these gates are deviated to some extent with regard to the perpendicular direction. Further, the semiconductor memory cell has a so-called SOI structure in which it is surrounded by an insulation material layer $IL_0$ formed on a supporting substrate SPS. In the semiconductor memory cell of Example 3 shown in FIG. 31A, the supporting substrate SPS, an insulating interlayer $IL_1$, the gate $G_2$ of the second transistor $TR_2$ and the gate $G_1$ of the first transistor $TR_1$ are arranged in this order from below.

Further, the semiconductor memory cell of Example 3 has;

(a) a semi-conductive first region $SC_1$ which is formed in the semiconductor layer to extend over from the first main surface $A_1$ to the second main surface $A_2$ and has a first conductivity type (for example, n-type), (b) a semi-conductive second region $SC_2$ which is formed in the semiconductor layer to extend over from the first main surface $A_1$ to the second main surface $A_2$, is in contact with the first region $SC_1$ and has a second conductivity type (for example, $p^+$-type), (c) a third region $SC_3$ which is formed in a surface region including the second main surface $A_2$ of the first region $SC_1$ to be spaced from the second region $SC_2$ and is in contact with the first region $SC_1$ so as to form a rectifier junction together with the first region $SC_1$, the third region $SC_3$ being a region which is semi-conductive and has the second conductivity type (for example, $p^{++}$-type) opposite to the first conductivity type or which is conductive and is formed of a silicide, a metal or a metal compound, (d) a fourth region $SC_4$ which is formed in a surface region including the first main surface $A_1$ of the second region $SC_2$ to be spaced from the first region $SC_1$ and is in contact with the second region $SC_2$ so as to form a rectifier junction together with the second region $SC_2$, the fourth region $SC_4$ being a region which is semi-conductive and has the first conductivity type (for example, $n^{++}$-type) or which is conductive and is formed of a silicide, a metal or a metal compound, (e) the gate $G_1$ of the first transistor $TR_1$ formed on a first insulation layer formed on the first main surface $A_1$ so as to bridge the first region $SC_1$ and the fourth region $SC_4$, and (f) the gate $G_2$ of the second transistor $TR_2$ formed on a second insulation layer formed on the second main surface $A_2$ so as to bridge the second region $SC_2$ and the third region $SC_3$.

Concerning the first transistor $TR_1$, (A-1) one source/drain region is formed of a surface region including the first main surface $A_1$ of the first region $SC_1$, (A-2) the other source/drain region is formed of the fourth region $SC_4$, and (A-3) the channel forming region $CH_1$ is formed of a surface region including the first main surface $A_1$ of the second region $SC_2$, which surface region is interposed between the surface region including the first main surface $A_1$ of the first region $SC_1$ and the fourth region $SC_4$.

Concerning the second transistor $TR_2$, (B-1) one source/drain region is formed of a surface region including the second main surface $A_2$ of the second region $SC_2$, (B-2) the other source/drain region is formed of the third region $SC_3$, and (B-3) the channel forming region $CH_2$ is formed of a surface region including the second main surface $A_2$ of the first region $SC_1$, which surface region is interposed between the surface region including the second main surface $A_2$ of the second region $SC_2$ and the third region $SC_3$.

Further, concerning the MIS type diode DT, (C-1) one end thereof is formed of part of the second region $SC_2$, and (C-2) an electrode EL constituting the other end thereof is formed to be opposed to said part of the second region $SC_2$ constituting one end of the MIS type diode DT through a wide gap thin film WG, and is composed of a conductive material.

Figure 31B:
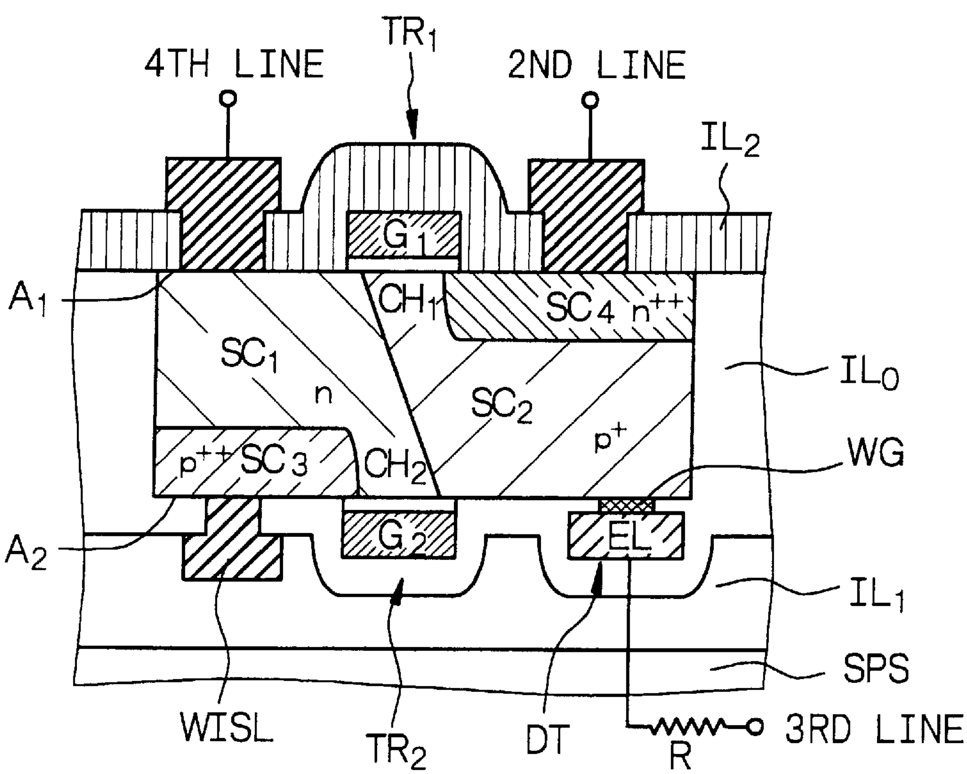

In the examples shown in FIGS. 31A and 31B, the MIS type diode DT is formed on the second main surface $A_2$ side, while it may be formed on the first main surface $A_1$ side. In semiconductor memory cells to be explained hereinafter, the MIS type diode DT may be formed on any main surface side.

The gate $G_1$ of the first transistor $TR_1$ and the gate $G_2$ of the second transistor $TR_2$ are connected to a first line (for example, word line) for memory cell selection, the third region $SC_3$ is connected to a write-in information setting line WISL, the fourth region $SC_4$ is connected to a second line (for example, bit line), the electrode EL constituting the other end of the MIS type diode is connected to a third line having a predetermined potential, and the first region $SC_1$ is connected to a fourth line. The first region $SC_1$ is connected to the fourth line having a second predetermined potential. There may be employed a constitution in which a second predetermined potential is applied to the second line to which the fourth region $SC_4$ is connected and the fourth line to which the first region $SC_1$ is connected is used as a line (bit line) for memory cell selection.

Figure 32A:
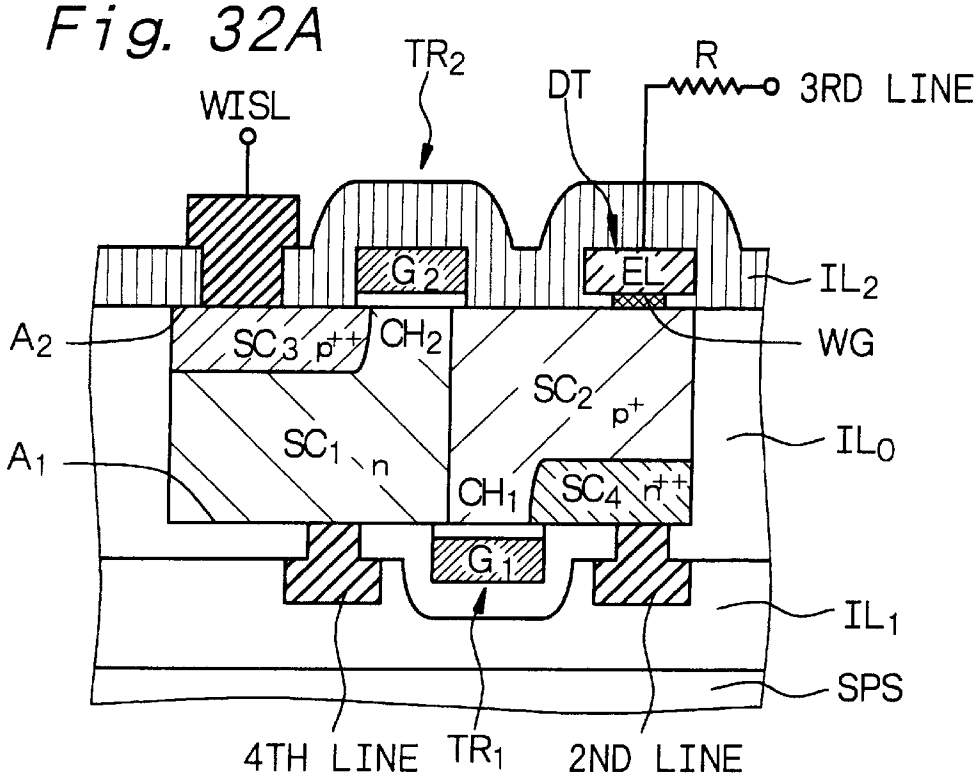
FIGS. 32A and 32B show schematic partial cross-sectional views of variants of the semiconductor memory cell of Example 3.
Figure 32B:
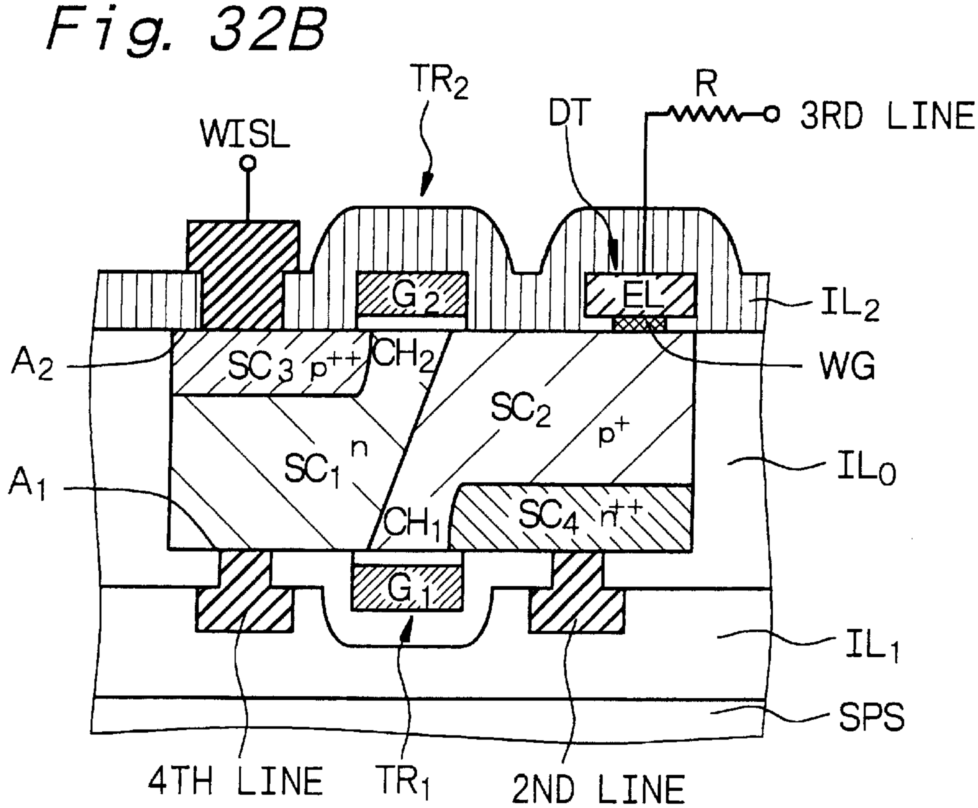
Figure 33A:
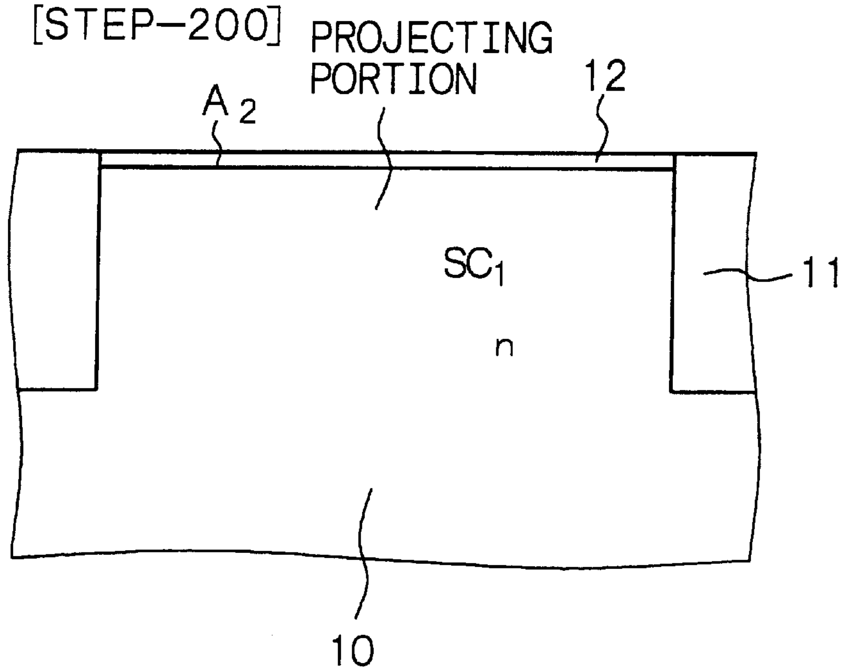
FIGS. 33A and 33B show schematic partial cross-sectional views of a semiconductor substrate, etc., for explaining the method of manufacturing the semiconductor memory cell of Example 3.
Figure 33B:
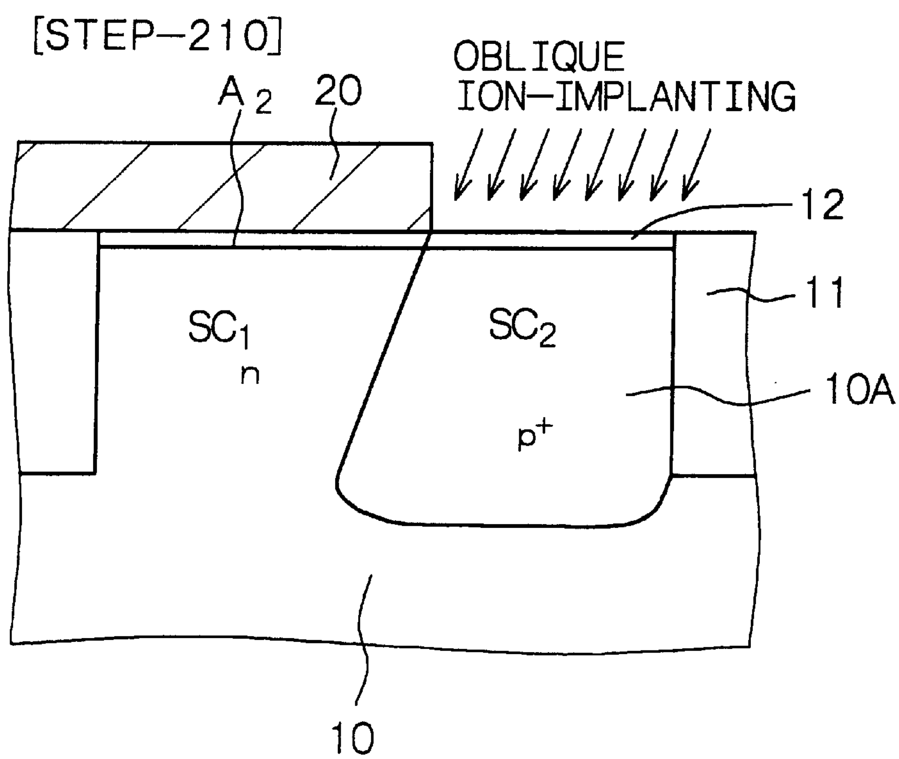
Figure 34A:
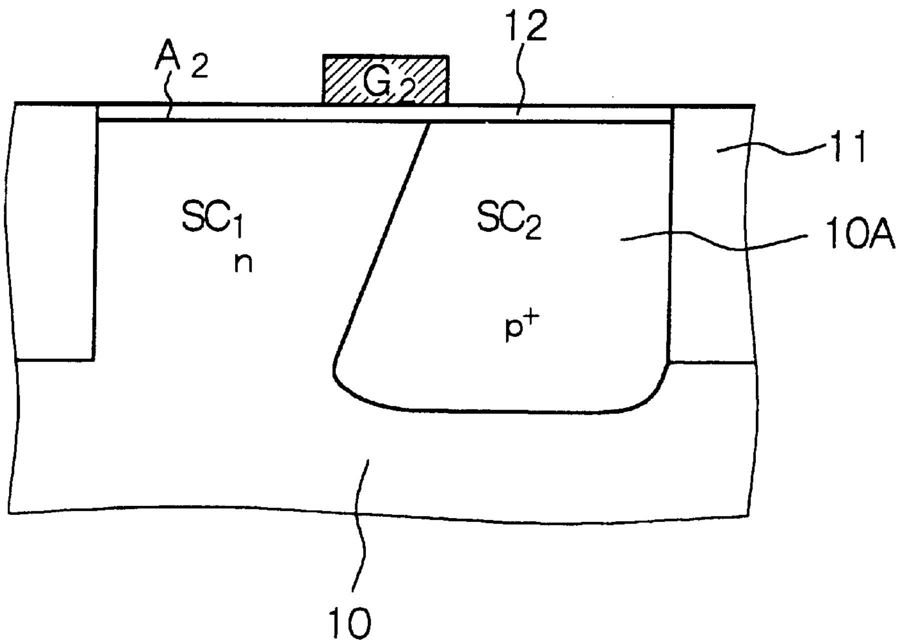
FIGS. 34A and 34B, following
Figure 34B:
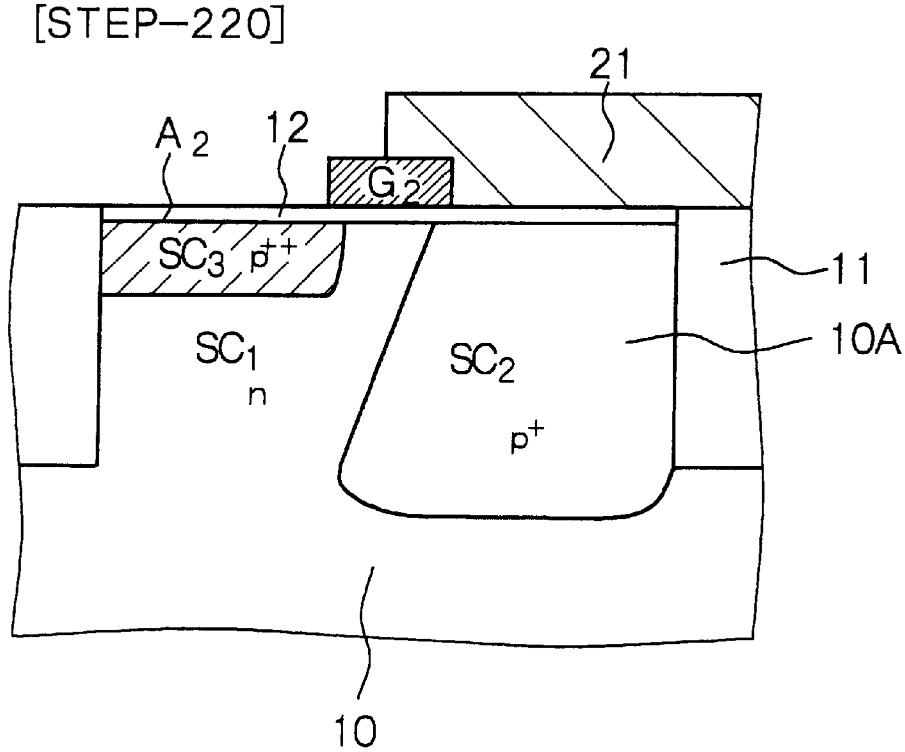

FIG. 31B and FIGS. 32A and 32B show schematic partial cross-sectional views of variants of the semiconductor memory cell of Example 3. In the variant shown in FIG. 31B, the positions of the gate $G_1$ of the first transistor $TR_1$ and the gate $G_2$ of the second transistor $TR_2$ are nearly aligned with regard to the perpendicular direction, differing from their positional relationship in FIG. 31A. In the above-constituted structure, the area of the semiconductor memory cell can be decreased. In the variants shown in FIGS. 32A and 32B, the supporting substrate SPS, the insulating interlayer $IL_1$, the gate $G_1$ of the first transistor $TR_1$ and the second transistor $TR_2$ are formed in this order from below. The positional relationship of these regions with regard to the perpendicular direction is reverse to the positional relationship of the regions of the semiconductor memory cell shown in FIGS. 31A and 31B. In the variant shown in FIG. 32B, the gate $G_1$ of the first transistor $TR_1$ and the gate $G_2$ of the second transistor $TR_2$ are nearly aligned with regard to the perpendicular direction, differing from their positional relationship in FIG. 32A.

The process for manufacturing the semiconductor memory cell of Example 3 shown in FIG. 31B will be explained hereinafter, with reference to FIGS. 33A, 33B, 34A, 34B, 35A, 35B, 36A, 36B and 37 showing schematic partial cross-sectional views of a supporting substrate and the like.

[Step-200]

First, a silicon semiconductor substrate 10 is etched to form a projecting portion of the silicon semiconductor substrate 10, in which projecting portion the semiconductor memory cell is to be formed. Then, a concave portion of the silicon semiconductor substrate 10 is buried with an insulation material layer 11 ($IL_0$), to form a state where the surface of projecting portion of the silicon semiconductor substrate 10 (semiconductor substrate SCS) is exposed. The insulation material layer 11 corresponds to a device separation region. Then, the semi-conductive first region $SC_1$ having the first conductivity type (for example, n-type) is formed in the projecting portion of the silicon semiconductor substrate 10. The formation of the first region $SC_1$ and the formation of the projecting portion of the silicon semiconductor substrate may be reversed. Then, a silicon oxide layer 12 (corresponding to a second insulation layer) having a thickness, for example, of approximately 10 nm is formed on the surface of projecting portion of the silicon semiconductor substrate 10 according to a known silicon oxide layer forming method. This state is shown in the schematic partial cross-sectional view of FIG. 33A. The surface of projecting portion of the silicon semiconductor substrate 10 corresponds to the second main surface $A_2$. The projection portion of the silicon semiconductor substrate 10 may have a thickness of 0.3 to 0.4 $\mu$m.

[Step-210]

Then, the second region $SC_2$ having the second conductivity type (for example, $p^+$-type) is formed by an oblique ion implanting method using a resist 20 as a mask. In this manner, there can be obtained the first region $SC_1$ which is formed in a semiconductor layer 10A (corresponding to the projecting portion of the silicon semiconductor substrate 10) to extend over from a first main surface (to be described later) to the second main surface $A_2$ and has the first conductivity type (for example, n-type), and the semi-conductive second region $SC_2$ which is formed in the semiconductor layer 10A to extend over from the first main surface to the second main surface $A_2$, is in contact with the first region $SC_1$ and has the second conductivity type (for example, $p^+$-type) (see FIG. 33B). Then, the gate $G_2$ of the second transistor $TR_2$, which is composed, for example, of polysilicon containing an impurity or has a polyside or polymetal structure, is formed. This state is shown in the schematic partial cross-sectional view of FIG. 34A.

[Step-220]

Then, with a resist 21 as a mask, ion implantation is carried out, and then oblique ion implantation is carried out, to form the third region $SC_3$ in a surface region including the second main surface $A_2$ of the first region $SC_1$, which third region $SC_3$ is a $p^{++}$-type semi-conductive region spaced from the second region $SC_2$ and is in contact with the first region $SC_1$ so as to form a rectifier junction together with the first region $SC_1$. This state is shown in the schematic partial cross-sectional view of FIG. 34B.

[Step-230]

Then, an insulating interlayer is formed on the entire surface, and the insulating interlayer is patterned using a patterned resist material as a mask, to expose part of the second region $SC_2$. A silicon oxide layer ($SiO_2$ layer) which is a wide gap thin film WG is formed on the exposed surface of the second region $SC_2$. Then, a polysilicon thin layer containing an impurity having the first conductivity type (for example, n-type) is formed on the entire surface, and the polysilicon layer is patterned, whereby the electrode EL constituting the other end of the MIS type diode connected to the wide gap thin film WG is formed and the high-resistance element R extending from the above electrode EL is also formed. Then, an insulating interlayer 13A is formed on the entire surface, an opening portion is formed in the insulating interlayer 13A above the third region $SC_3$, a wiring material layer is formed on the entire surface of the insulating interlayer 13A including the inside of the opening portion, and then the wiring material layer is patterned, to form the write-in information setting line WISL connected to the third region $SC_3$. The ion implanting method is not necessarily required for forming the third region $SC_3$.

Figure 35A:
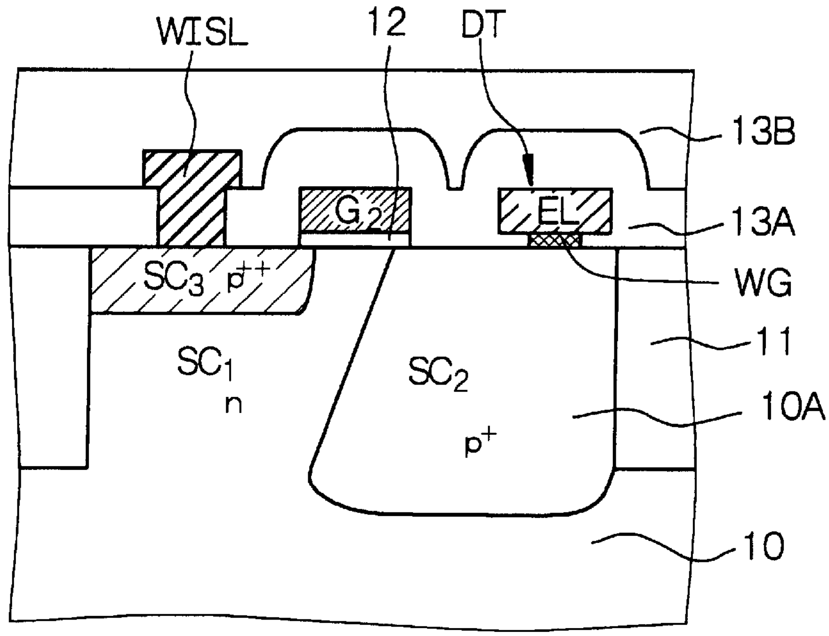
FIGS. 35A and 35B, following
Figure 35B:
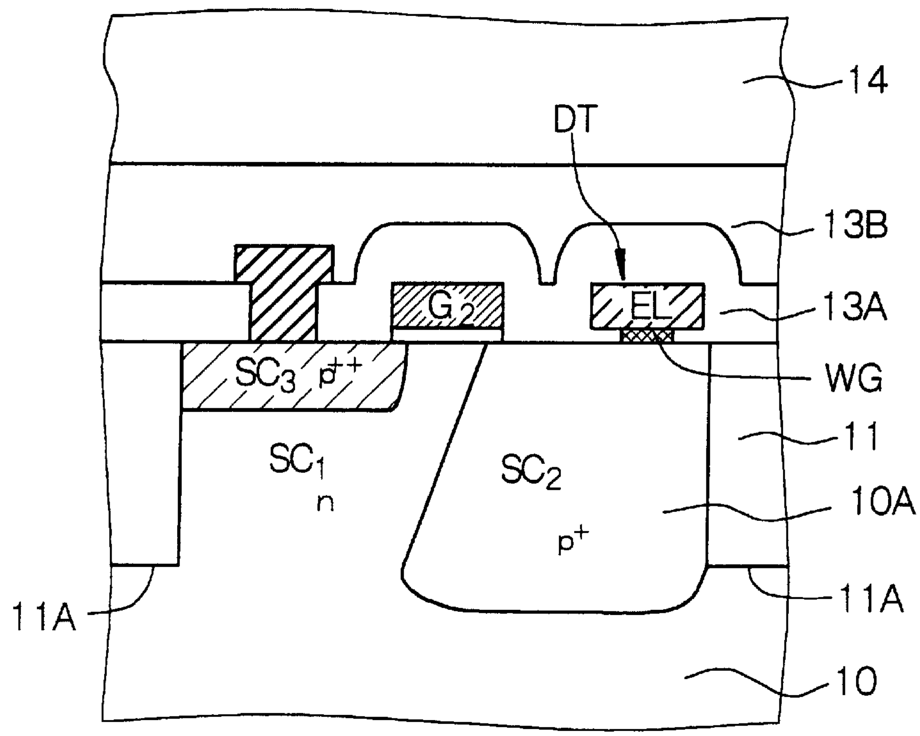

When the write-in information setting line WISL is formed, a barrier layer or a glue layer composed, for example, titanium silicide or TiN is formed, and the above barrier layer or the glue layer is also formed on the surface of the first region $SC_1$ exposed in the bottom of the opening portion. In this manner, the conductive third region $SC_3$ which is a common region with part of the write-in information setting line WISL (more specifically, part of the barrier layer or the glue layer) can be formed in the surface region of the first region $SC_1$. Then, as shown in FIG. 35A, an insulating interlayer 13B is formed on the entire surface, for example, from $SiO_2$ according to a CVD method, and the surface of the insulating interlayer 13B is flattened by polishing. And, the surface of the insulating interlayer 13B and a supporting substrate 14 are bonded (see FIG. 35B), and then the silicon semiconductor substrate 10 is ground and polished from its reverse surface, to expose a bottom 11A of the insulation material layer 11 (see FIG. 36A). The semiconductor layer 10A corresponding to the projecting portion of the silicon semiconductor substrate 10 is retained in the insulation material layer 11. The surface of the semiconductor layer 10A corresponds to the first main surface $A_1$.

[Step-240]

Figure 36A:
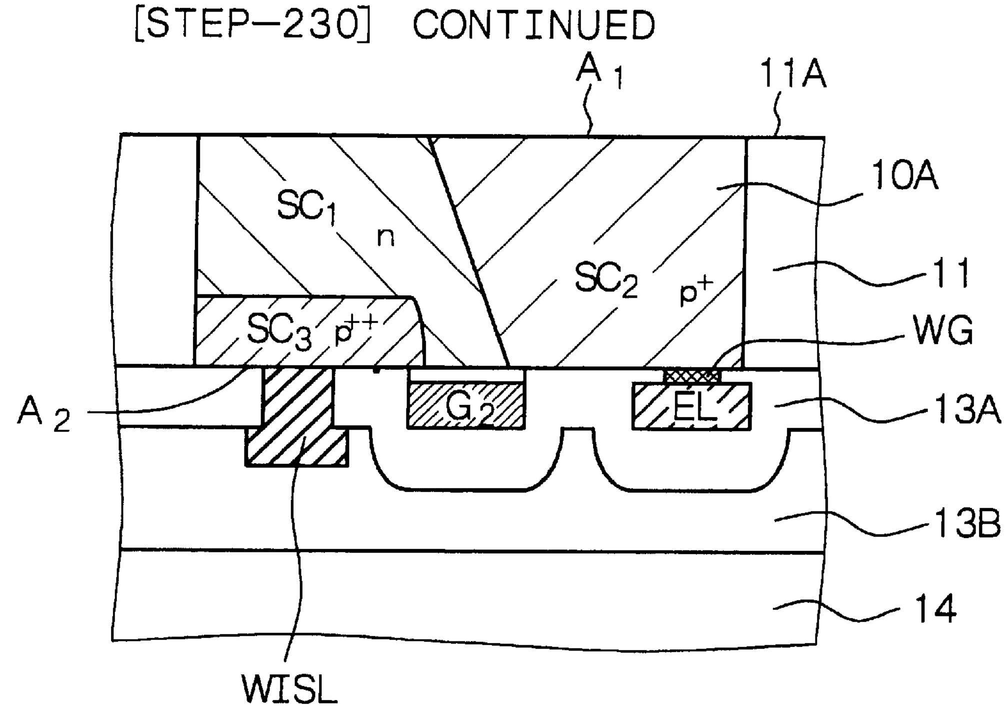
FIGS. 36A and 36B, following
Figure 36B:
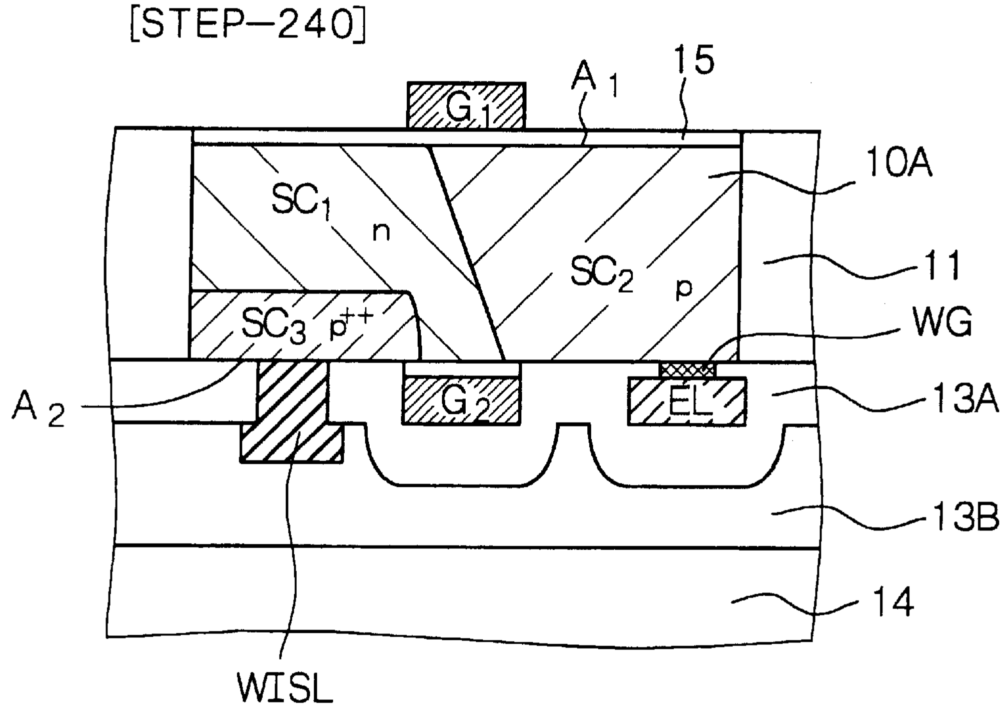

Then, for example, a silicon oxide layer (corresponding to the first insulation layer) having a thickness of approximately 10 nm is formed on the surface of the semiconductor layer 10A according to a known silicon oxide forming method, and the gate $G_1$ of the first transistor $TR_1$, which is composed, for example, of polysilicon containing an impurity or has a polyside or polymetal structure, is formed according to a known method (see FIG. 36B). The gate $G_1$ of the first transistor $TR_1$ and the gate $G_2$ of the second transistor $TR_2$ are formed so as to have the semiconductor layer 10A therebetween, and these are nearly aligned in positional relationship with regard to the perpendicular direction.

[Step-250]

Figure 37:
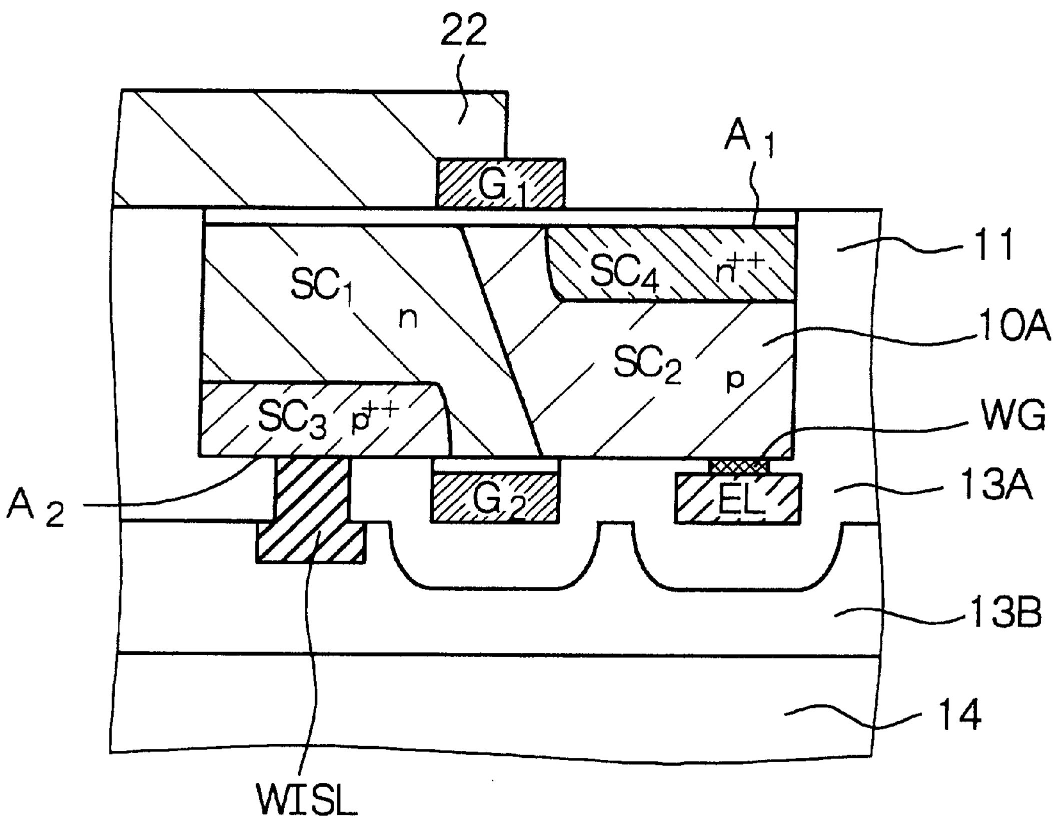
FIG. 37, following

Then, with a resist 22 as a mask, ion implantation is carried out, and then oblique ion implantation is carried out, to form the fourth region $SC_4$ which is an $n^{++}$-type semiconductive region (see FIG. 37).

[Step-260]

Then, an insulating interlayer is formed on the entire surface, opening portions are formed in the insulating interlayer above the fourth region $SC_4$ and in the insulating interlayer above the first region $SC_1$ positioned on the first main surface $A_1$, and a wiring material layer is formed on the insulating interlayer including the insides of the opening portions. Then, the wiring material layer is patterned to form the second line and the fourth line. In this manner, the semiconductor memory cell structured as shown in FIG. 31B is completed. The ion implantation method is not necessarily required for forming the fourth region $SC_4$. When the second line is formed, a barrier layer or a glue layer composed for example, of titanium silicide or TiN is formed and the barrier layer or the glue layer is also formed on the surface of the second region $SC_2$. In this manner, the conductive fourth region $SC_4$ which is a common region with part of the second line (more specifically, part of the barrier layer or the glue layer) can be formed on the surface of the second region $SC_2$, whereby there can be formed a structure in which the conductive region is a common region with part of the line. A structure in which the conductive region is composed of a compound formed by a reaction between the wiring material and silicon of the silicon semiconductor substrate is also included in the structure in which the conductive region is a common region with part of the line.

The process for manufacturing the semiconductor memory cell of Example 3 is not limited to the above process. For example, the second region $SC_2$ can be formed after the formation of the silicon oxide layer having a thickness, for example, of approximately 10 nm on the surface of the semiconductor layer 10A in [Step-240] instead of forming it in [Step-210]. The order of formation of the regions by ion implantation is dependent upon steps, while the regions can be formed essentially in any order. In the above-explained ion implanting methods, it is required to optimize conditions of ion implantation of an impurity by means of computer simulation or an experiment for optimizing impurity concentrations of the regions.

EXAMPLE 4

Figure 38A:
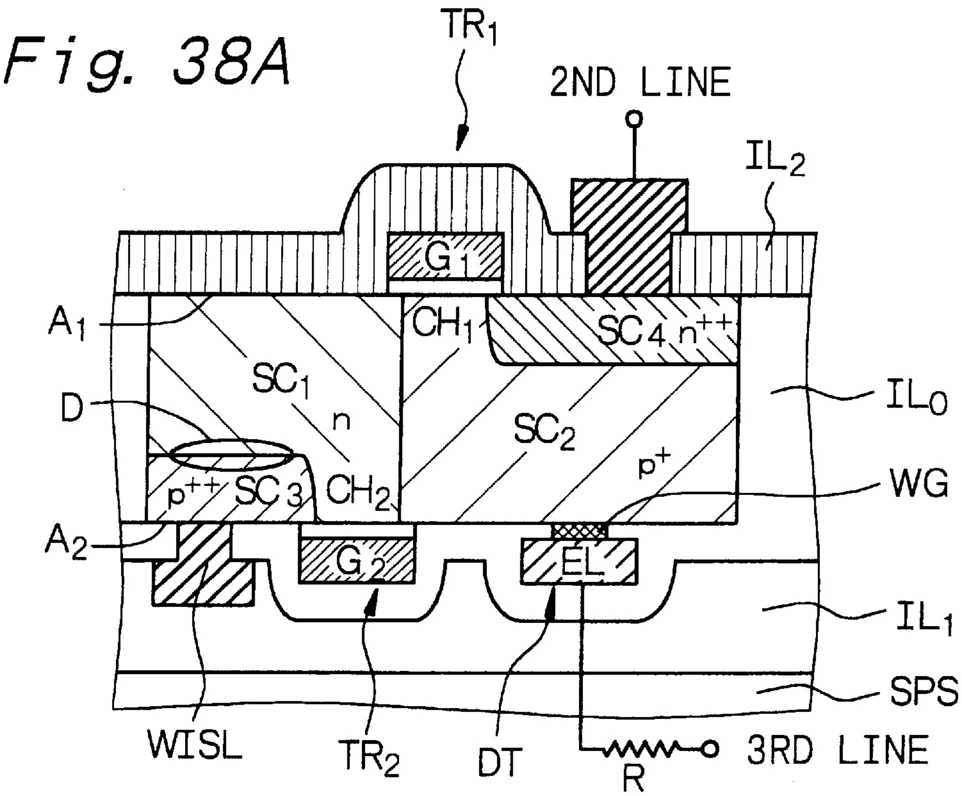
FIGS. 38A and 38B show schematic partial cross-sectional views of the semiconductor memory cells of Example 4.

The semiconductor memory cell of Example 4 is a variant of the semiconductor memory cell of Example 3. As is shown in the principle drawing of FIG. 2 and the schematic partial cross-sectional view of FIG. 38A, the first region $SC_1$ and the third region $SC_3$ constitute a diode D of the semiconductor memory cell of Example 3. When diode D is provided, unlike the semiconductor memory cell of Example 3, the fourth line is no longer necessary, and the first region $SC_1$ is connected to the write-in information setting line WISL through the third region $SC_3$ in place of being connected to the fourth line, so that the wiring structure can be simplified. The pn junction diode D can be formed by adjusting the impurity concentrations of the first region $SC_1$ and the third region $SC_3$ to proper values. When the pn junction is formed of the third region $SC_3$ and the first region $SC_1$ in the semiconductor memory cell of Example 4, improper setting of potential in the third region $SC_3$ or improper designing of the relationship between the impurity concentrations of the third region $SC_3$ and the counterpart of the first region $SC_1$ may cause a latch-up during the reading of information. For avoiding the above latch-up, the voltage to be applied to the write-in information setting line WISL is required to be a voltage (for example, 0.4 volt or less) at which no high forward current flows in the junction of the third region $SC_3$ and the first region $SC_1$ (the diode D). If the third region $SC_3$ is composed of a silicide, a metal or the like so that a Schottky junction is formed between the third region $SC_3$ and the first region $SC_1$, and that majority carrier mainly constitutes a forward current, the latch-up can be avoided, and the limitation to the voltage to be applied to the write-in information setting line WISL is substantially removed. The fourth region $SC_4$ is connected to the second line (for example, bit line) for memory cell selection. There may be employed a constitution in which a second predetermined potential is applied to the second line to which the fourth region $SC_4$ is connected and the write-in information setting line WISL to which the first region $SC_1$ is connected is used as a bit line as well.

Figure 38B:
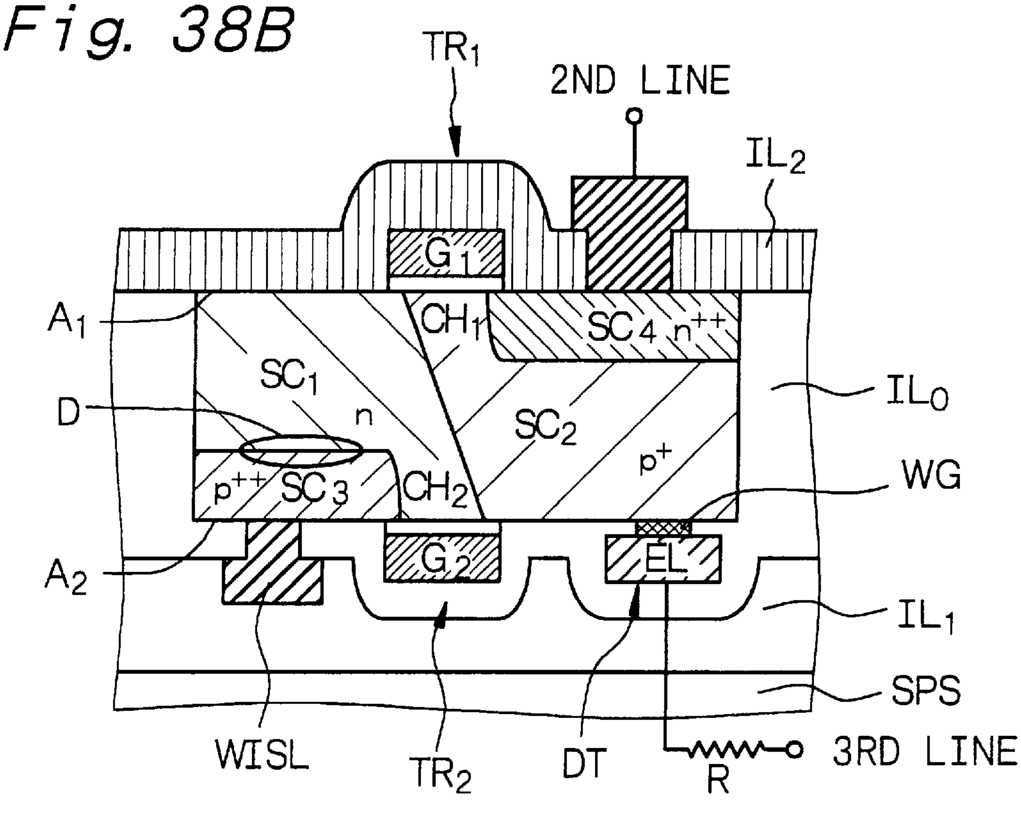
Figure 39A:
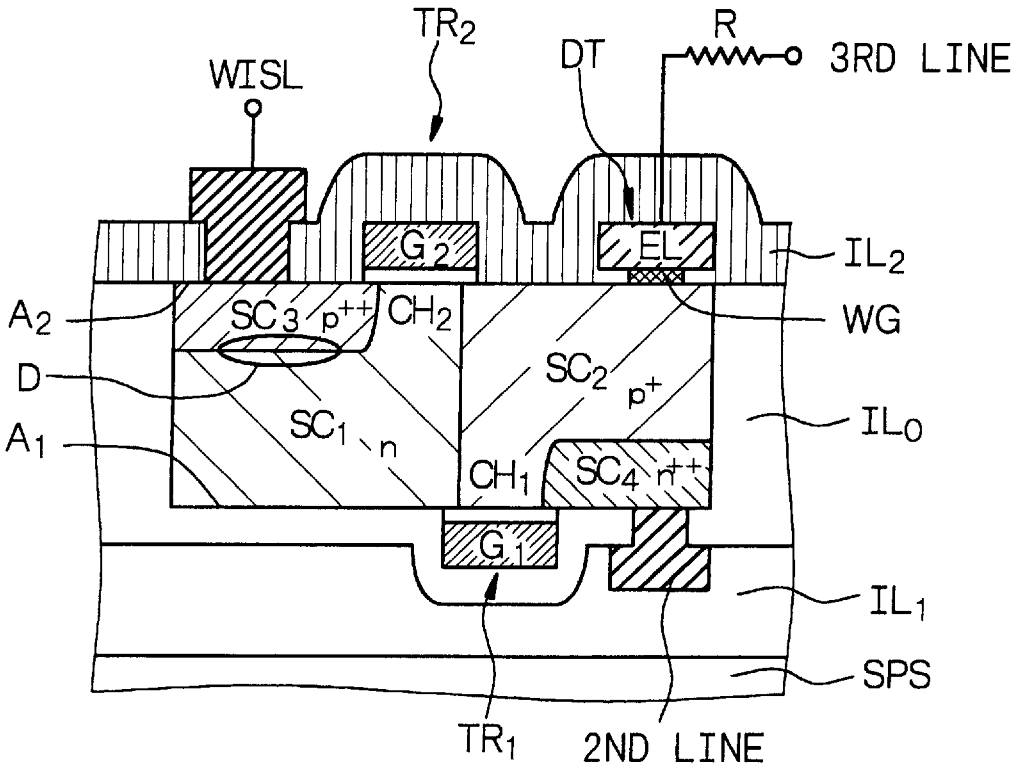
FIGS. 39A and 39B show schematic partial cross-sectional views of variants of the semiconductor memory cell of Example 4.
Figure 39B:
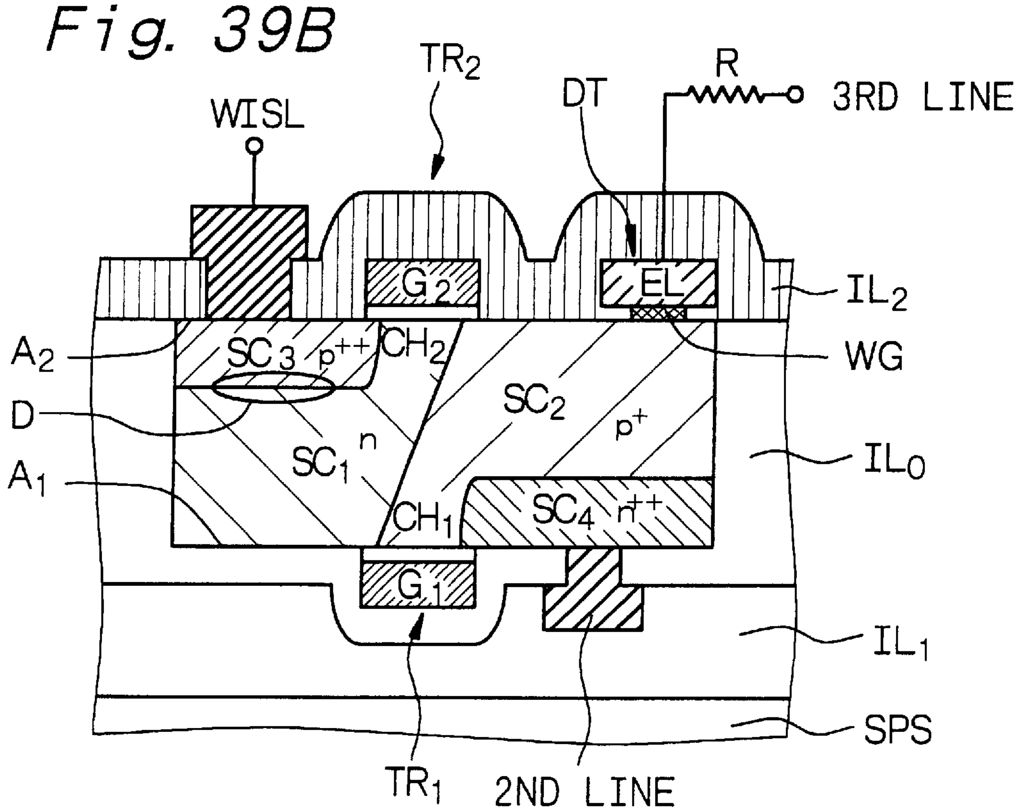

FIGS. 38B, 39A and 39B show schematic partial cross-sectional views of variants of the semiconductor memory cell of Example 4. In the variant shown in FIG. 38B, the gate $G_1$ of the first transistor $TR_1$ and the gate $G_2$ of the second transistor $TR_2$ are nearly aligned with regard to the perpendicular direction, differing from their positional relationship in FIG. 38A. In the above-constituted structure, the area of the semiconductor memory cell can be decreased. In the variants shown in FIGS. 39A and 39B, the supporting substrate SPS, the insulating interlayer $IL_1$, the gate $G_1$ of the first transistor $TR_1$ and the gate $G_2$ of the second transistor $TR_2$ are formed in this order from below. The positional relationship of these regions with regard to the perpendicular direction is reverse to the positional relationship of the regions of the semiconductor memory cell shown in FIGS. 38A and 38B. In the variant shown in FIG. 39B, the gate $G_1$ of the first transistor $TR_1$ and the gate $G_2$ of the second transistor $TR_2$ are nearly aligned with regard to the perpendicular direction, differing from their positional relationship in FIG. 39A.

Figure 40:
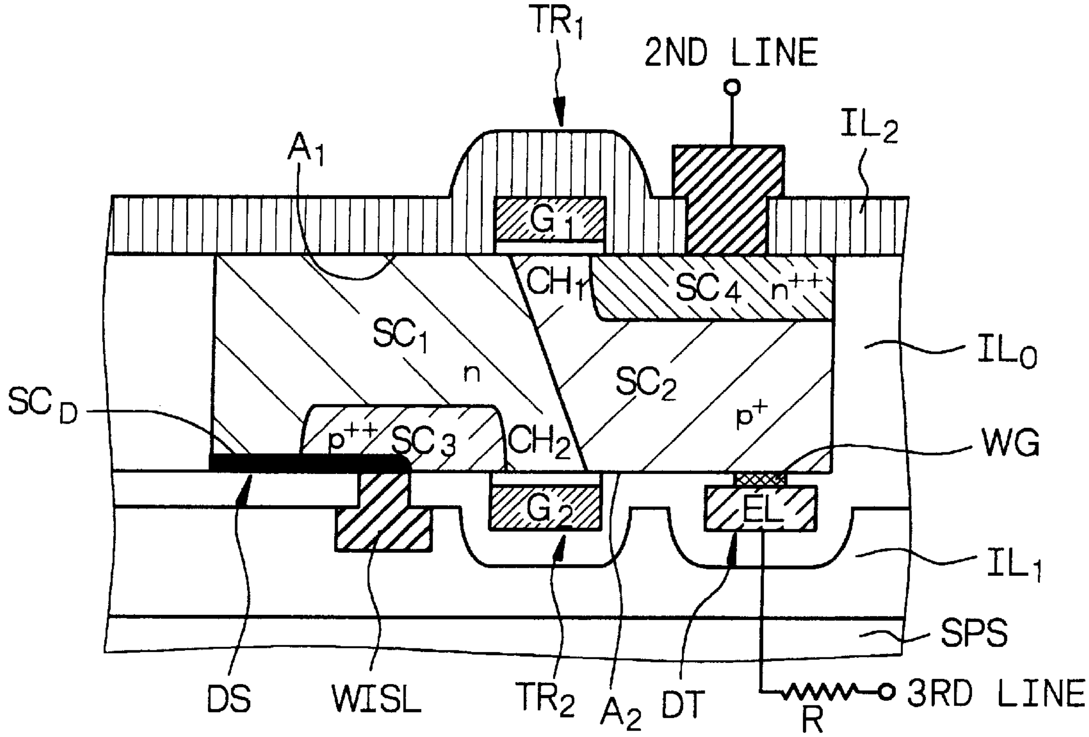
FIG. 40 shows a schematic partial cross-sectional view of a variant of the semiconductor memory cell of Example 4.

As shown in the principle drawing of FIG. 3, the diode can be formed of a Schottky junction. That is, as is shown in the schematic partial cross-sectional view of FIG. 40, the diode may be a majority carrier diode DS formed of a diode-constituting region $SC_D$ of a silicide or a metal such as Mo or Al and the first region $SC_1$. FIG. 40 shows a variant of the semiconductor memory cell of Example 4 shown in FIG. 38B.

Figure 41A:
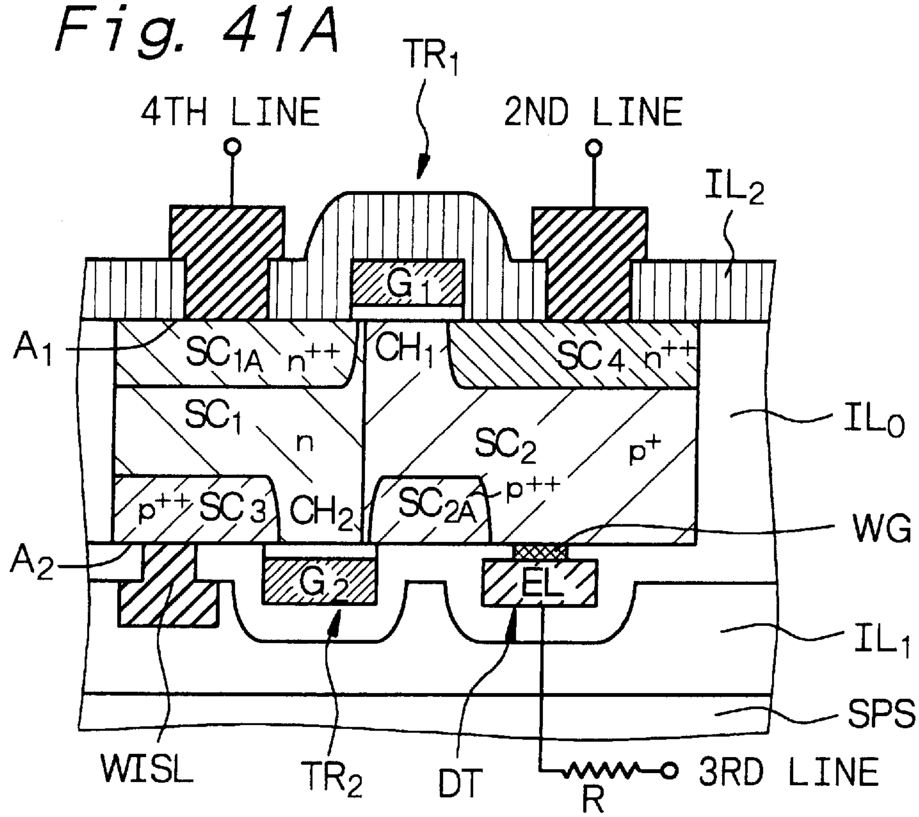
FIGS. 41A and 41B show schematic partial cross-sectional views of variants of the semiconductor memory cell of Example 4.
Figure 41B:
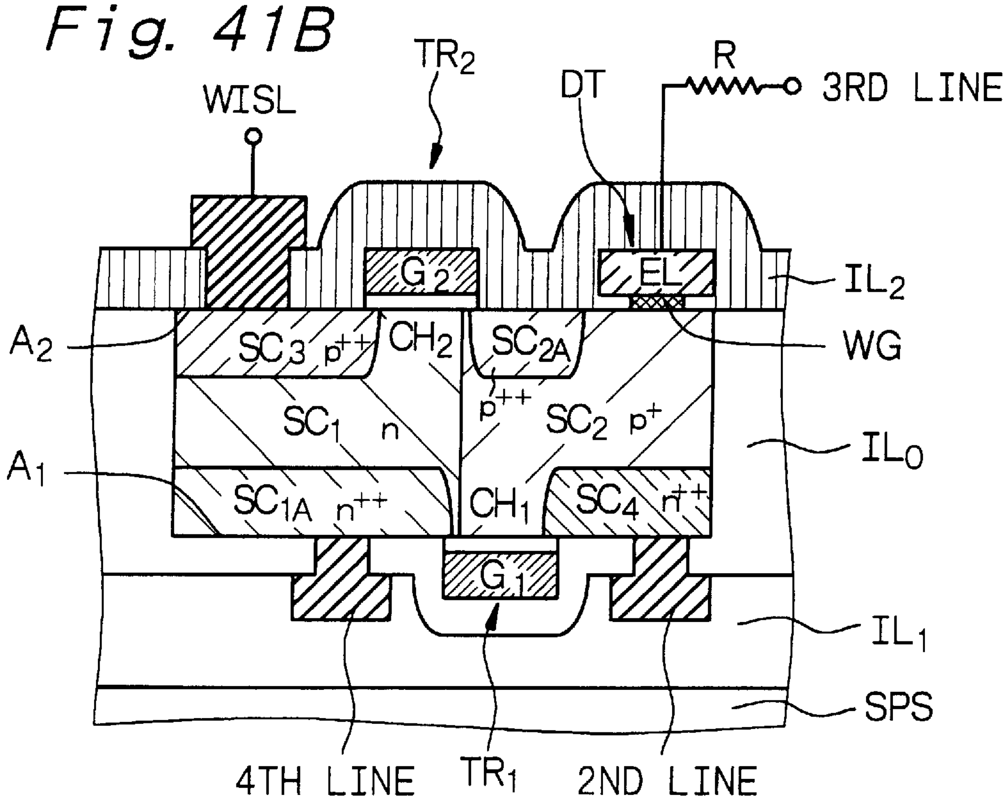

In the semiconductor memory cell explained in Example 3, there may be employed a constitution in which the surface region including the first main surface $A_1$ of the first region $SC_1$ constituting the other source/drain region of the first transistor $TR_1$ is formed of a region $SC_{1A}$ containing a high concentration of an impurity having the first conductivity type (for example, $n^{++}$-type impurity), and the surface region including the second main surface $A_2$ of the second region $SC_2$ constituting the other source/drain region of the second transistor $TR_2$ is formed of a region $SC_{2A}$ containing a high concentration of an impurity having the second conductivity type (for example, $p^{++}$-type impurity). FIGS. 41A and 41B show variants obtained by structurally modifying the semiconductor memory cells shown in FIGS. 31A and 31B as explained above.

Figure 42A:
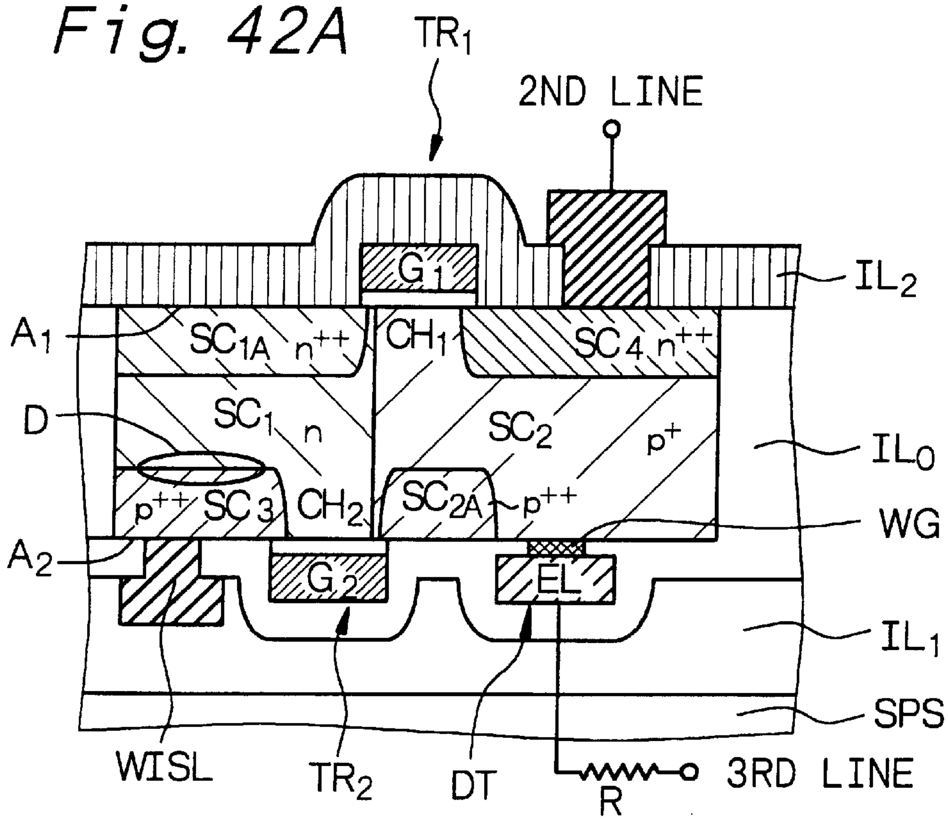
FIGS. 42A and 42B show schematic partial cross-sectional views of variants of the semiconductor memory cell of Example 4.
Figure 42B:
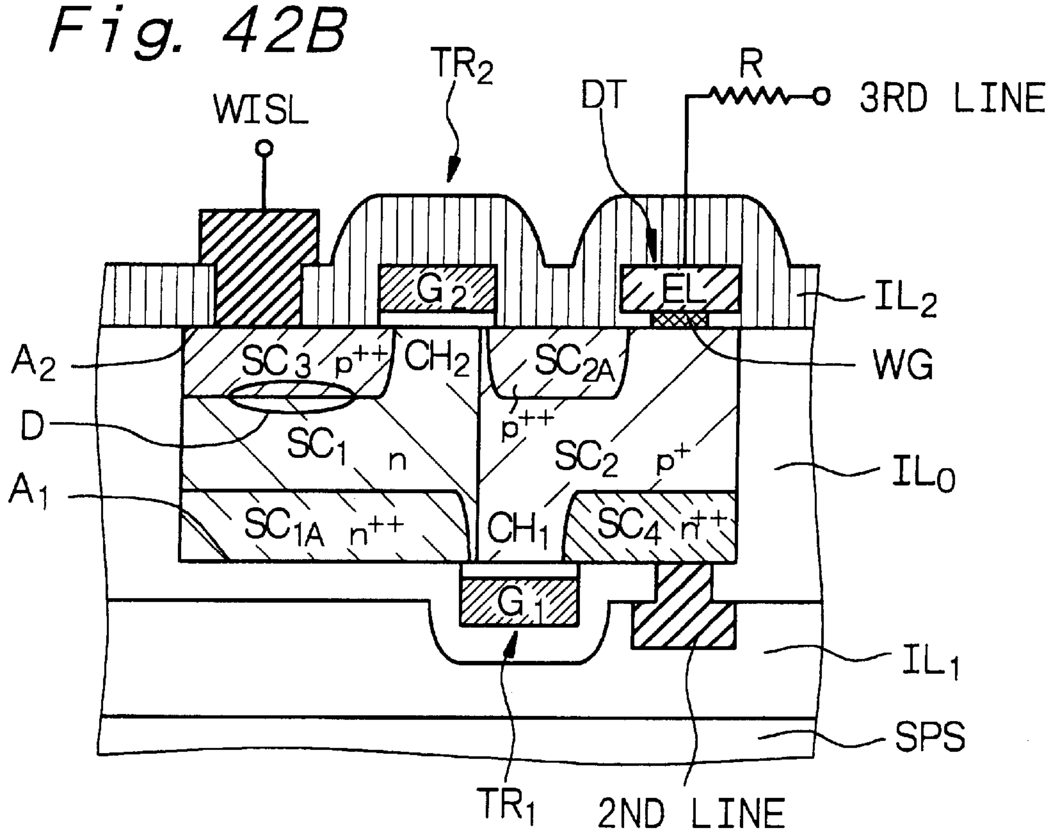

Further, in the semiconductor memory cell explained in Example 4, there may be employed a constitution in which the surface region including the first main surface $A_1$ of the first region $SC_1$ constituting the other source/drain region of the first transistor $TR_1$ is formed of a region $SC_{1A}$ containing a high concentration of an impurity having the first conductivity type (for example, $n^{++}$-type impurity) and the surface region including the second main surface $A_2$ of the second region $SC_2$ constituting the other source/drain region of the second transistor $TR_2$ is formed of a region $SC_{2A}$ containing a high concentration of an impurity having the second conductivity type (for example, $p^{++}$-type impurity). FIGS. 42A and 42B show variants obtained by structurally modifying the semiconductor memory cells shown in FIGS. 38A and 39A as explained above.

Figure 43A:
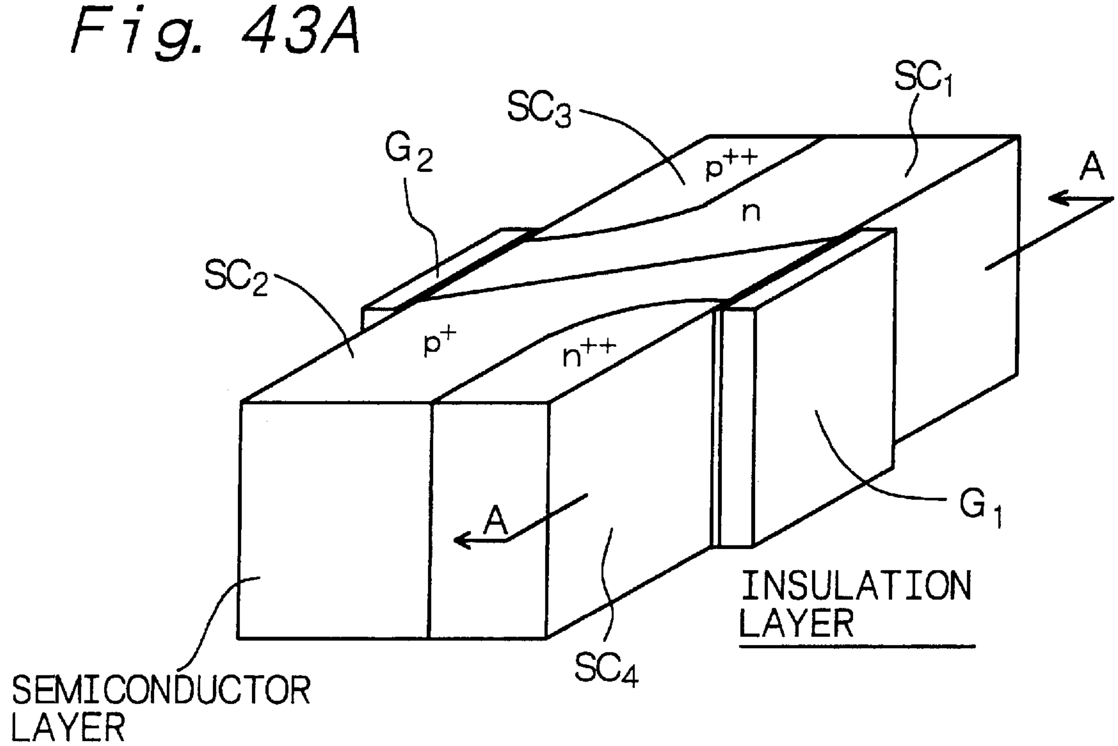
FIGS. 43A and 43B show schematic views of embodiments in which the semiconductor memory cells of Example 4 are applied to a side gate type semiconductor memory cell.
Figure 43B:
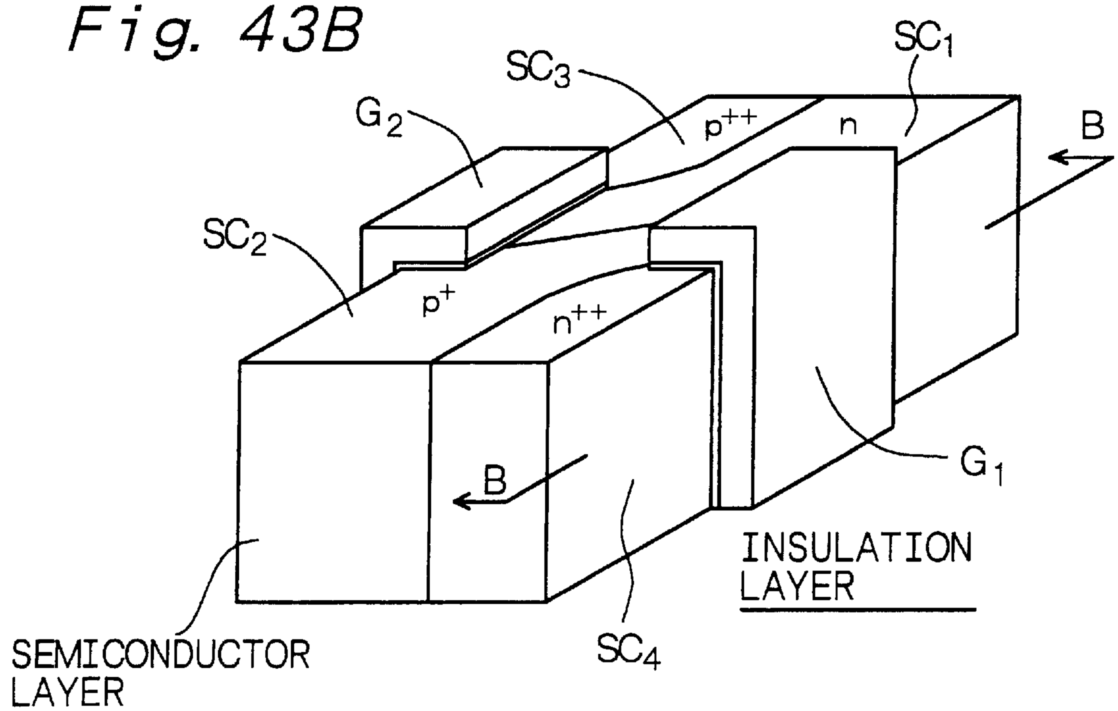

The semiconductor memory cell according to the fourth aspect of the present invention can be applied to a so-called side gate type semiconductor memory cell. For example, FIGS. 43A and 43B show schematic perspective views of examples in which the semiconductor memory cell explained in Example 3 is applied to a side gate type semiconductor memory cell. Showing of the MIS type diode is omitted. In the semiconductor memory cell of the above type, the first region $SC_1$, the second region $SC_2$, the third region $SC_3$ and the fourth region $SC_4$ are formed in a nearly cuboidal semiconductor layer protruded from an insulation layer, as is shown in FIG. 43A. Further, the gate $G_1$ and the gate $G_2$ are formed in portions of side surfaces of the cuboidal semiconductor layer. As shown in the schematic perspective view of FIG. 43B, the gate $G_1$ and the gate $G_2$ may be formed in the form of a letter "L", in which these extend from portions on side surfaces of the semiconductor layer of the cuboid to portions on the top surface thereof. The layout of regions found by cutting the semiconductor memory cell along arrows A—A in FIG. 43A or along arrows B—B in FIG. 43B is as shown in FIG. 31B. In FIGS. 43A and 43B, the regions and gates alone are shown, and showing of wiring lines is omitted.

In principle, the semiconductor memory cell of Example 4 can be manufactured by the method explained with regard to the semiconductor memory cell of Example 3, and detailed explanations of the method of producing the same are therefore omitted. In the method of manufacturing a semiconductor memory cell, explained in Example 3, the semiconductor memory cell having a so-called SOI structure is manufactured from a so-called bonded substrate obtained by forming a projecting portion in the semiconductor substrate, then, forming the insulator (insulation layer) on the entire surface, bonding the insulator and the supporting substrate to each other, and grinding and polishing the semiconductor substrate from its reverse surface. Alternatively, a semiconductor memory cell having a so-called TFT structure can be also manufactured instead. That is, the gate is formed on an insulator (insulation layer), then, for example, an amorphous silicon layer or a polysilicon layer is formed on the entire surface by a CVD method, then, a silicon layer is formed from the amorphous or polysilicon layer by a known single crystallization method such as a zone melting crystallization method using laser beam or electron beam or a lateral solid phase crystal growth method in which a crystal is grown through an opening formed in the insulator (insulation layer) and the silicon layer is used as the semiconductor layer to manufacture the semiconductor memory cell. Otherwise, the gate is formed on the supporting substrate, and then, for example, a polysilicon layer or an amorphous silicon layer is formed on the entire surface and used as a semiconductor layer to manufacture the semiconductor memory cell.

EXAMPLE 5

Figure 45A:
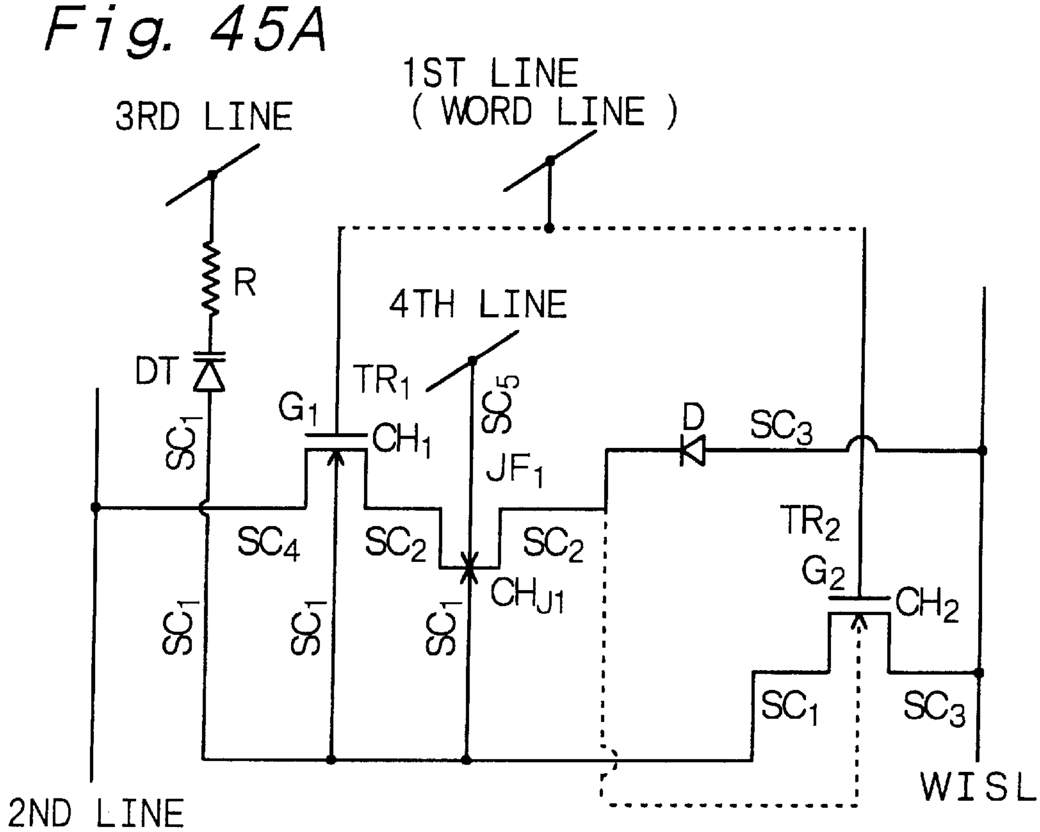
FIGS. 45A and 45B show the principles of variants of the semiconductor memory cell according to the fifth aspect of the present invention.

Example 5 is concerned with the semiconductor memory cell according to the fifth and twelfth aspects of the present invention. As is shown in the principle drawing of FIG. 45A, the semiconductor memory cell of Example 5 comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information.

In the above semiconductor memory cell, one source/drain region of the first transistor $TR_1$ corresponds to the channel forming region $CH_2$ of the second transistor $TR_2$ and corresponds to one source/drain region of the junction-field-effect transistor $JF_1$, one source/drain region of the second transistor $TR_2$ corresponds to the channel forming region $CH_1$ of the first transistor $TR_1$ and corresponds to one gate region of the junction-field-effect transistor $JF_1$, and one end of the MIS type diode DT is formed of an extending portion of the channel forming region $CH_1$ of the first transistor $TR_1$, the other end of the MIS type diode DT is formed of an electrode composed of a conductive material, and the electrode is connected to the line (third line) having a predetermined potential. In Example 5, the first transistor $TR_1$ and the second transistor $TR_2$ are substantially separately formed transistors.

Further, the gate $G_1$ of the first transistor $TR_1$ and the gate $G_2$ of the second transistor $TR_2$ are connected to a first line (for example, word line) for memory cell selection, the other source/drain region of the first transistor $TR_1$ is connected to a second line, the other gate region of the junction-field-effect transistor $JF_1$ is connected to a fourth line, one source/drain region of the first transistor $TR_1$ is connected to a write-in information setting line WISL through the junction-field-effect transistor $JF_1$ and a diode D, the other source/drain region of the second transistor $TR_2$ is connected to the write-in information setting line WISL, and the other end of the MIS type diode DT is connected to a third line (corresponding to the above line having a predetermined potential) through a high-resistance element R. It is preferred to employ a constitution in which the second line is used as a bit line, or a constitution in which the write-in information setting line WISL is used as a bit line as well and a second predetermined potential is applied to the second line.

A wide gap thin film WG is formed between the extending portion of the channel forming region $CH_1$ of the first transistor $TR_1$ which extending portion constitutes the MIS type diode DT and the electrode EL. This will also apply in the semiconductor memory cell to be explained below.

Figure 51:
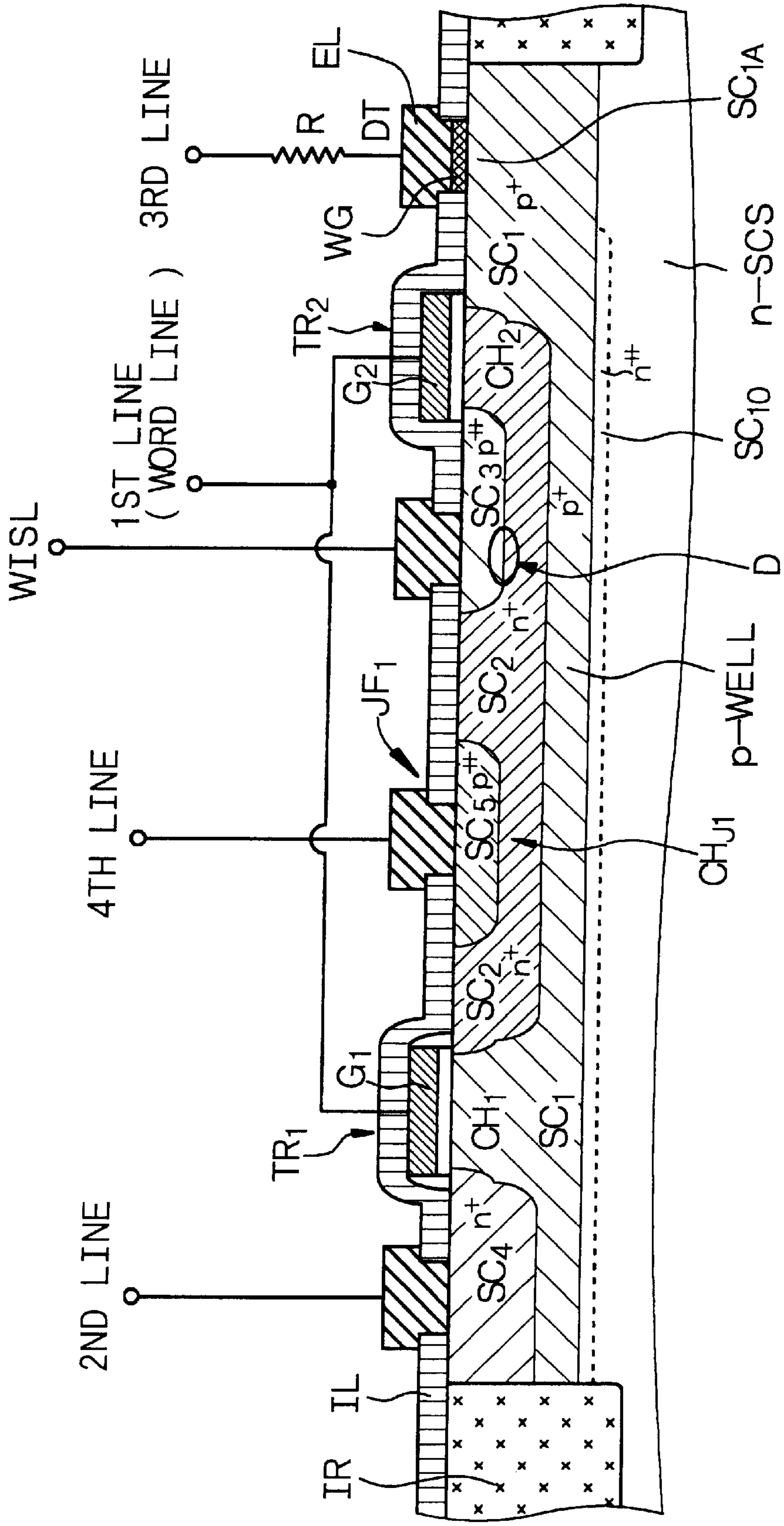
FIG. 51 shows a schematic partial cross-sectional view of the semiconductor memory cell of Example 5.

As is shown in the partial cross-sectional view of the FIG. 51, the semiconductor memory cell of Example 5 comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information, and the above semiconductor memory cell has;

(a) a semi-conductive first region $SC_1$ having a second conductivity type (for example, $p^+$-type), (b) a semi-conductive second region $SC_2$ which is formed in a surface region of the first region $SC_1$ and has a first conductivity type (for example, $n^+$-type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$-type) or which is formed of a silicide, a metal or a metal compound and is conductive, (d) a fourth region $SC_4$ which is formed in a surface region of the first region $SC_1$ to be spaced from the second region $SC_2$ and is in contact with the first region $SC_1$ so as to form a rectifier junction together with the first region $SC_1$, the fourth region $SC_4$ being a region which is semi-conductive and has the first conductivity type (for example, $n^+$-type) or which is formed of a silicide, a metal or a metal compound and is conductive, and (e) a fifth region $SC_5$ which is formed in a surface region of the second region $SC_2$ to be spaced from the third region $SC_3$ and is in contact with the second region $SC_2$ so as to form a rectifier junction together with the second region $SC_2$, the fifth region $SC_5$ being a region which is semi-conductive and has the second conductivity type (for example, $p^{++}$-type) or which is formed of a silicide, a metal or a metal compound and is conductive.

Concerning the first transistor $TR_1$, (A-1) one source/drain region is formed of a portion of a surface region of the second region $SC_2$, (A-2) the other source/drain region is formed of the fourth region $SC_4$, (A-3) the channel forming region $CH_1$ is formed of a portion of a surface region of the first region $SC_1$ which portion is interposed between said portion of the surface region of the second region $SC_2$ and the fourth region $SC_4$, and (A-4) the gate $G_1$ is formed on the channel forming region $CH_1$ of the first transistor $TR_1$ through an insulation layer.

Concerning the second transistor $TR_2$, (B-1) one source/drain region is formed of other portion of the surface region of the first region $SC_1$, (B-2) the other source/drain region is formed of the third region $SC_3$, (B-3) the channel forming region $CH_2$ is formed of other portion of the surface region of the second region $SC_2$ which other portion is interposed between said other portion of the surface region of the first region $SC_1$ and the third region $SC_3$, and (B-4) the gate $G_2$ is formed on the channel forming region $CH_2$ of the second transistor $TR_2$ through an insulation layer.

Concerning the junction-field-effect transistor $JF_1$, (C-1) the gate regions are formed of the fifth region $SC_5$ and a part of the first region $SC_1$ which part is opposed to the fifth region $SC_5$, (C-2) the channel region $CH_{J1}$ is formed of part of the second region $SC_2$ which part is interposed between the fifth region $SC_5$ and said part of the first region $SC_1$, (C-3) one source/drain region is formed of said portion of the surface region of the second region $SC_2$ which portion extends from one end of the channel region $CH_{J1}$ of the junction-field-effect transistor $JF_1$ and constitutes one source/drain region of the first transistor $TR_1$, and (C-4) the other source/drain region is formed of a portion of the second region $SC_2$ which portion extends from the other end of the channel region $CH_{J1}$ of the junction-field-effect transistor $JF_1$.

Concerning the MIS type diode DT, (D-1) one end thereof is formed of part $SC_{1A}$ of the first region $SC_1$, and (D-2) an electrode constituting the other end thereof is formed to be opposed to said part $SC_{1A}$ of the first region $SC_1$ constituting one end of the MIS type diode DT, through a wide gap thin film WG.

The wide gap thin film WG can be composed of a material in which the tunnel transition of carriers is caused depending upon a potential difference between the potential in the first region $SC_1$ (the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through the high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (E) the gate $G_1$ of the first transistor $TR_1$ and the gate $G_2$ of the second transistor $TR_2$ are connected to the first line (for example, word line) for memory cell selection, (F) the third region $SC_3$ is connected to the write-in information setting line WISL, (G) the fourth region $SC_4$ is connected to the second line, (H) the electrode EL constituting the other end of the MIS type diode DT is connected to the third line having a predetermined potential, and (I) the fifth region $SC_5$ is connected to the fourth line.

In the semiconductor memory cell of Example 5, the second region $SC_2$ and the third region $SC_3$ constitute a pn junction diode D, and the second region $SC_2$ is connected to the write-in information setting line WISL through the third region $SC_3$. The above pn junction diode D can be formed by adjusting the impurity concentrations of the second region $SC_2$ and the third region $SC_3$ to proper values. It is preferred to employ a constitution in which the second line is used as a bit line, or a constitution in which the write-in information setting line WISL is used as a bit line as well and a second predetermined potential is applied to the second line.

The junction-field-effect transistor $JF_1$ is formed by (X) optimizing the distance between the facing gate regions (the fifth region $SC_5$ and the part of the first region $SC_1$ which part is opposed to the fifth region $SC_5$), that is, the thickness of the channel region $CH_{J1}$, and (Y) optimizing the impurity concentration of each of the facing gate regions (the fifth region $SC_5$ and the part of the first region $SC_1$ which part is opposed to the fifth region $SC_5$) and the impurity concentration of the channel region $CH_{J1}$.

In Example 5, the semiconductor memory cell (specifically, the first region $SC_1$) is formed in a well structure which is formed, for example, in an n-type semiconductor substrate and has the second conductivity type (for example, p-type).

In the semiconductor memory cell of Example 5, when a first high-concentration-impurity-containing layer $SC_{10}$ having the first conductivity type (for example, $n^{++}$-type) is formed below the first region $SC_1$, the potential or charge to be stored in the channel forming region $CH_1$ of the first transistor $TR_1$ for readout can be increased.

Figure 52:
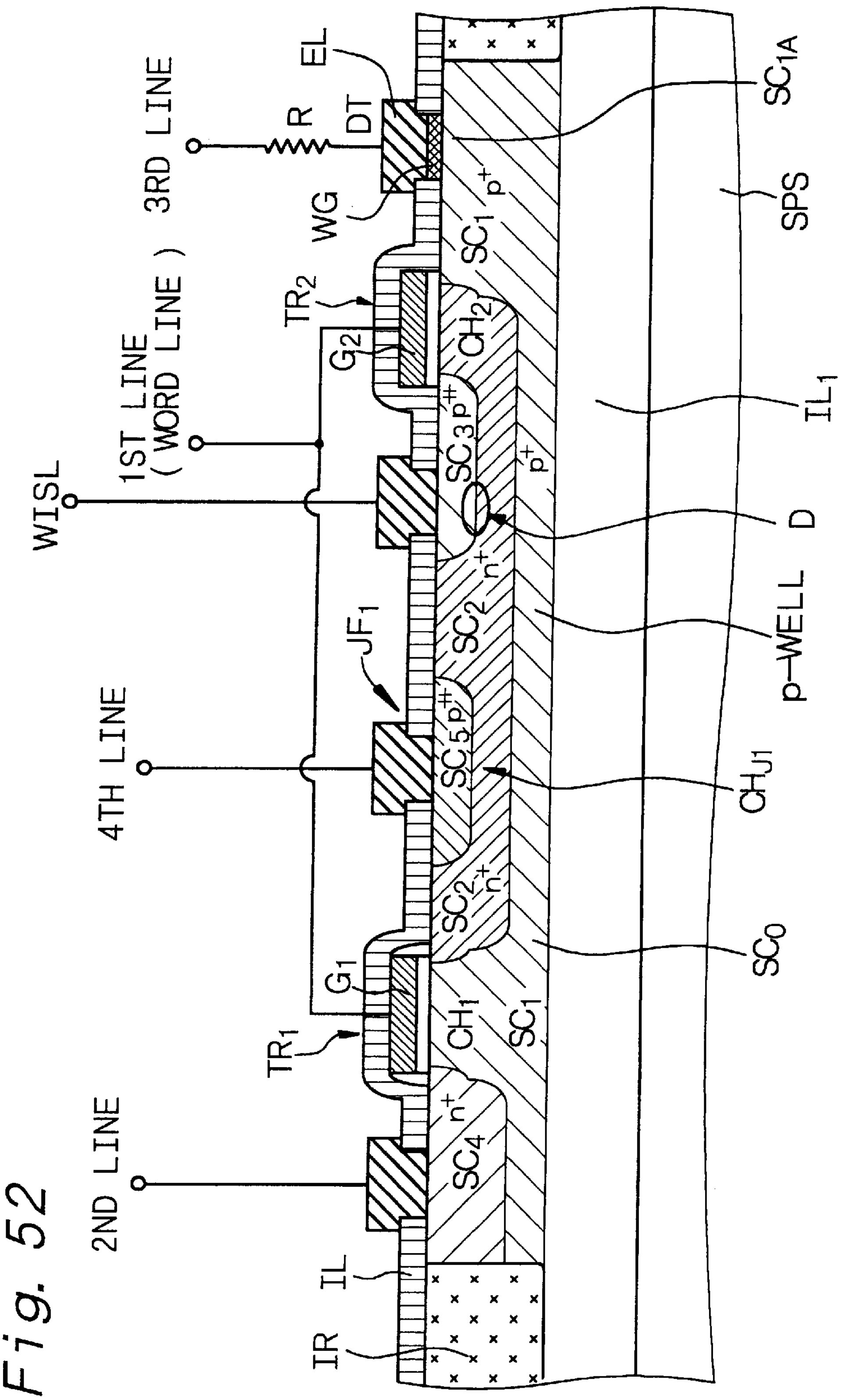
FIG. 52 shows a schematic partial cross-sectional view of a variant of the semiconductor memory cell of Example 5.

FIG. 52 shows a variant of the semiconductor memory cell of Example 5 shown in FIG. 51. In this variant, a semiconductor memory cell structured as shown in FIG. 51 is formed in a semiconductor layer $SC_0$ formed on an insulating interlayer $IL_1$ on a supporting substrate SPS. The semiconductor memory cell having the above structure can be manufactured according to the already explained method of forming an SOI structure or a TFT structure.

Figure 44:
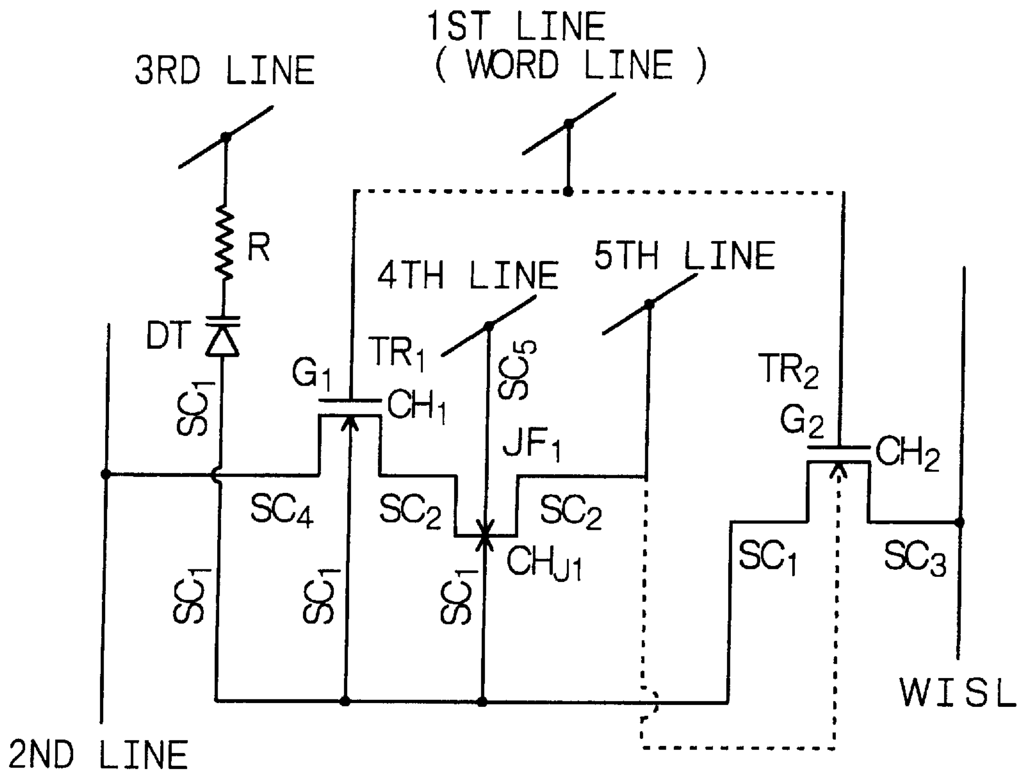
FIG. 44 shows the principle of a semiconductor memory cell according to the fifth aspect of the present invention.

In the semiconductor memory cell shown in FIG. 51, as is shown in the principle drawing of FIG. 44, there may be employed an embodiment in which the formation of the pn junction diode D is omitted and the second region $SC_2$ corresponding to one source/drain region of the first transistor $TR_1$ is connected to a fifth line (not shown in FIG. 51). In the above embodiment, it is preferred to employ a constitution in which the second line is used as a bit line and a second predetermined potential is applied to the fifth line, or a constitution in which the fifth line is used as a bit line and a second predetermined potential is applied to the second line.

Further, FIGS. 53 to 60 show variants of the semiconductor memory cell of Example 5 shown in FIG. 51.

Figure 45B:
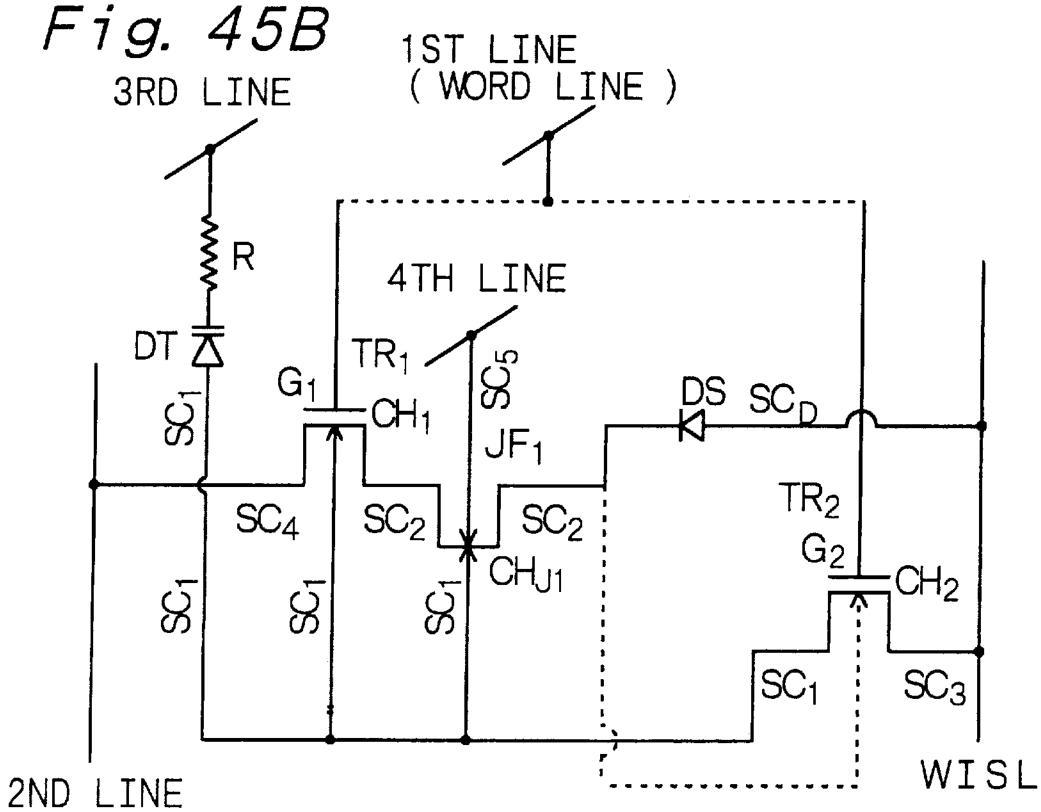
Figure 53:
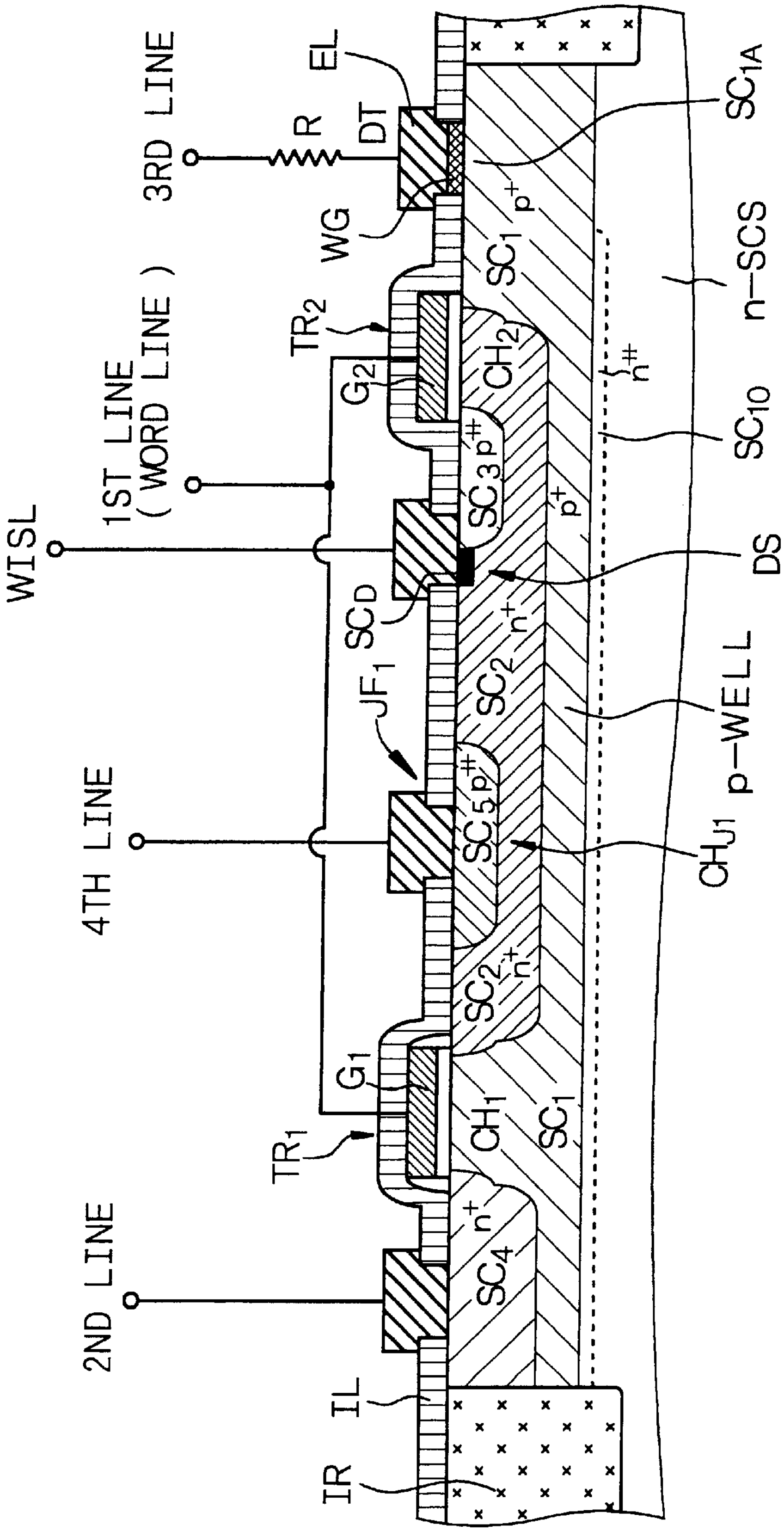
FIG. 53 shows a schematic partial cross-sectional view of a variant of the semiconductor memory cell of Example 5.

The semiconductor memory cell shown in the principle drawing of FIG. 45B and the schematic partial cross-sectional view of FIG. 53 further has a diode-constituting region $SC_D$ which is formed in a surface region of the second region $SC_2$ and is in contact with the second region $SC_2$ to form a rectifier junction together with the second region $SC_2$, and the diode-constituting region $SC_D$ and the second region $SC_2$ constitute a majority carrier diode DS of a Schottky junction type. One source/drain region of the first transistor $TR_1$ is connected to the write-in information setting line WISL through the junction-field-effect transistor $JF_1$ and the majority carrier diode DS of a Schottky junction type in place of being connected to the fifth line through the junction-field-effect transistor $JF_1$. That is, the second region $SC_2$ is connected to the write-in information setting line WISL through the diode-constituting region $SC_D$. In the semiconductor memory cell shown in FIG. 53, the diode-constituting region $SC_D$ is formed adjacently to the third region $SC_3$, while the position of the diode-constituting region $SC_D$ shall not be limited thereto.

Figure 46:
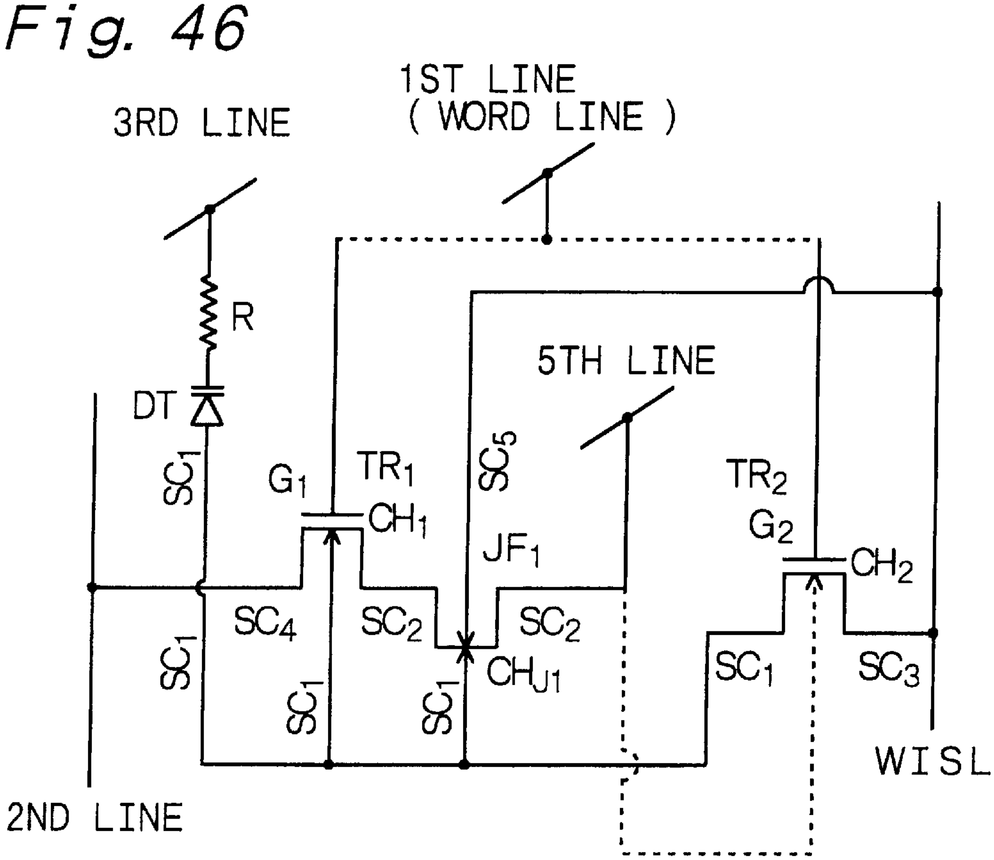
FIG. 46 shows the principle of a variant of the semiconductor memory cell according to the fifth aspect of the present invention.
Figure 47A:
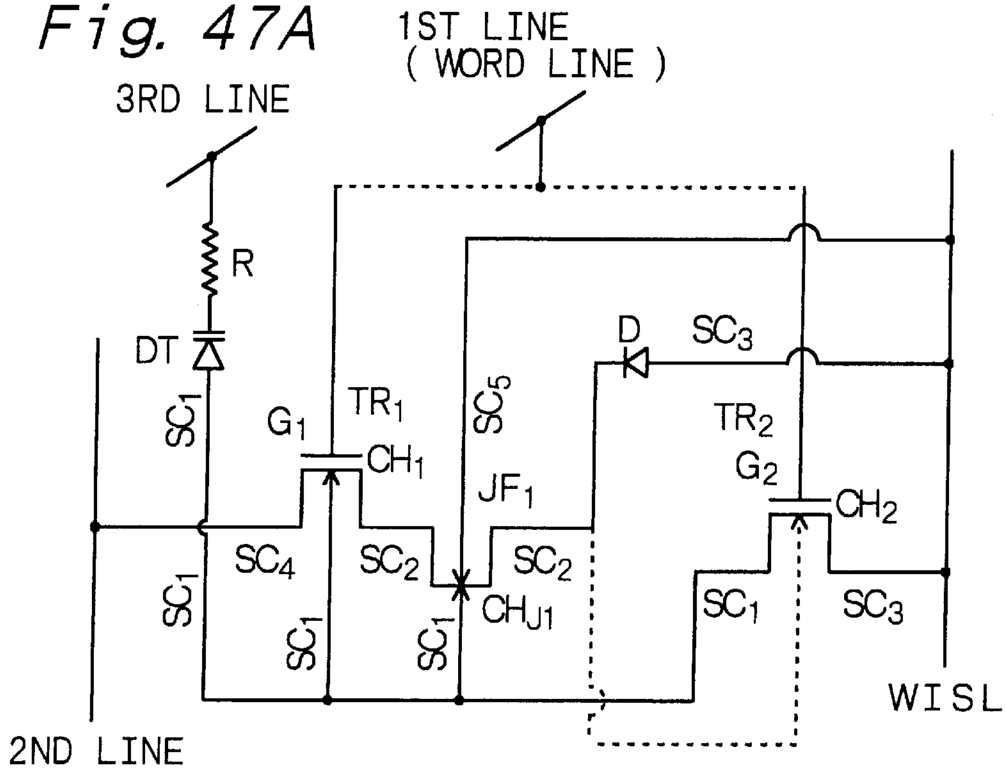
FIGS. 47A and 47B show the principles of variants of the semiconductor memory cell according to the fifth aspect of the present invention.
Figure 47B:
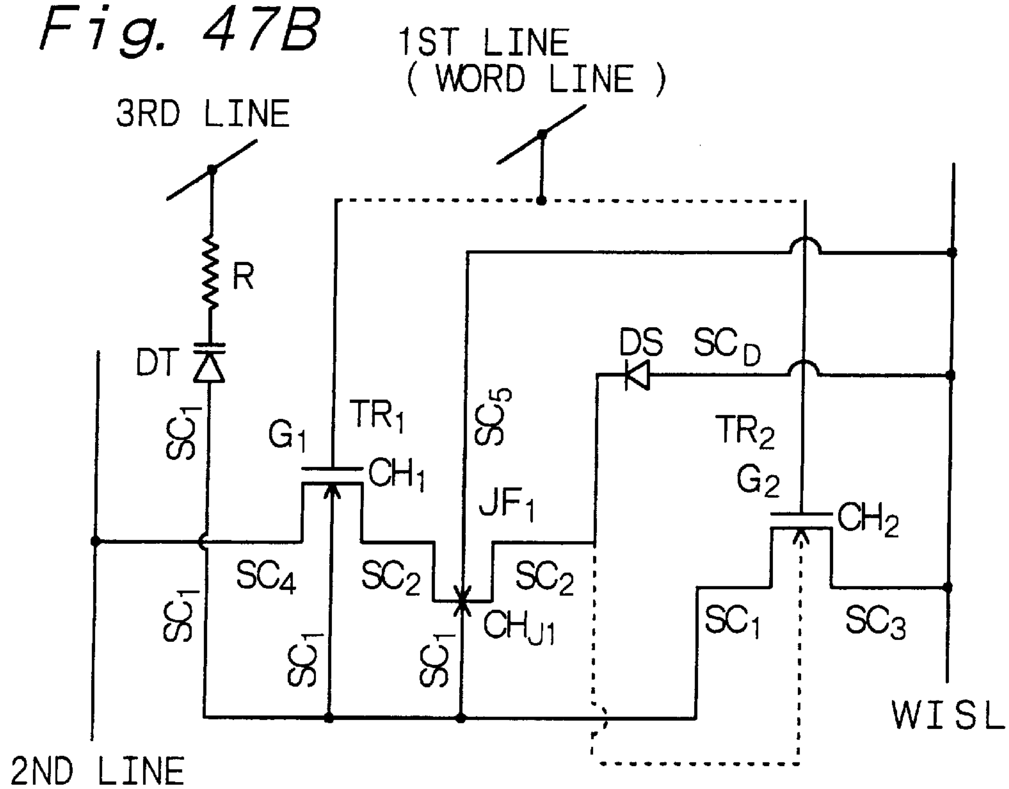
Figure 54:
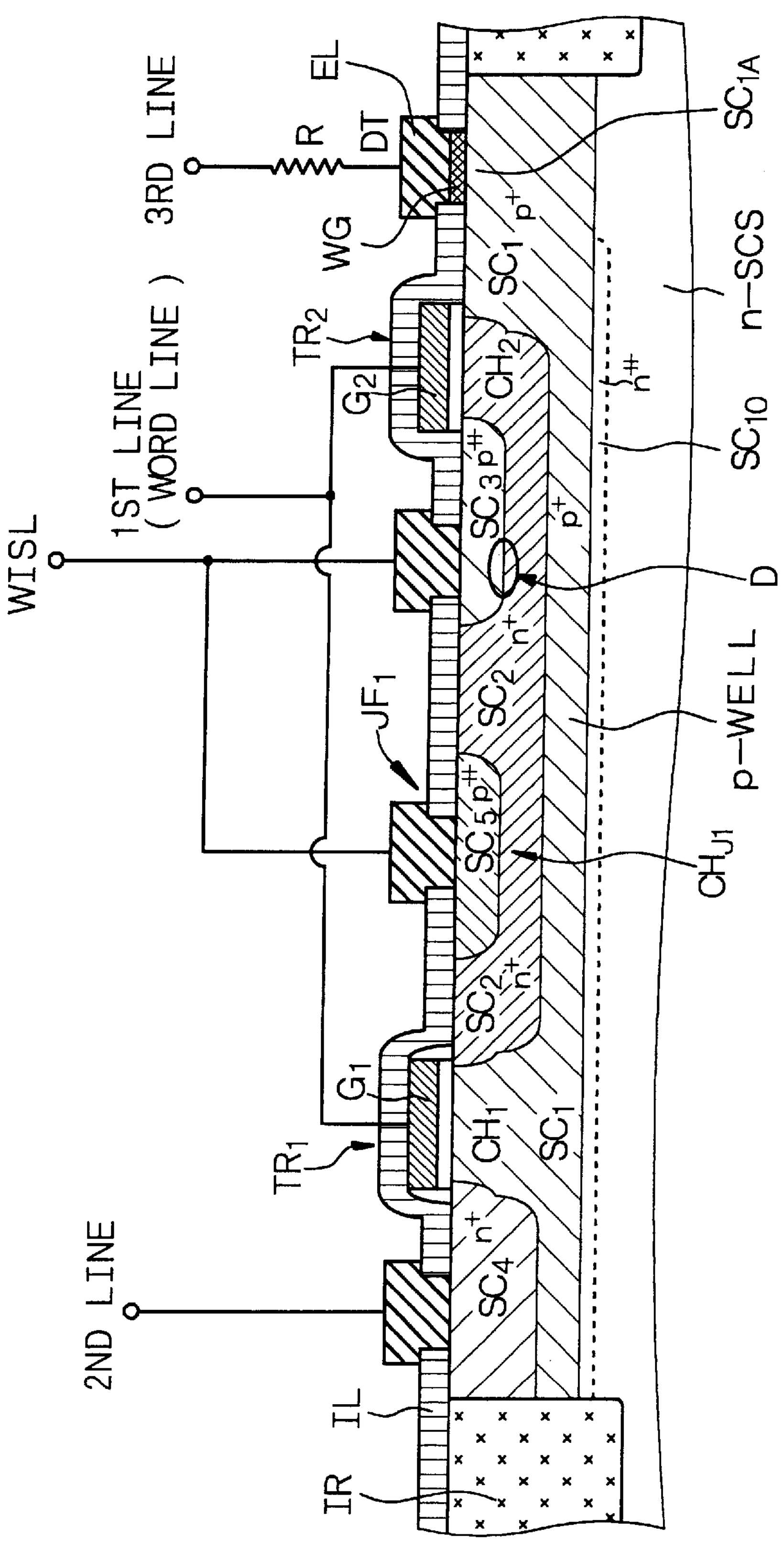
FIG. 54 shows a schematic partial cross-sectional view of a variant of the semiconductor memory cell of Example 5.
Figure 55:
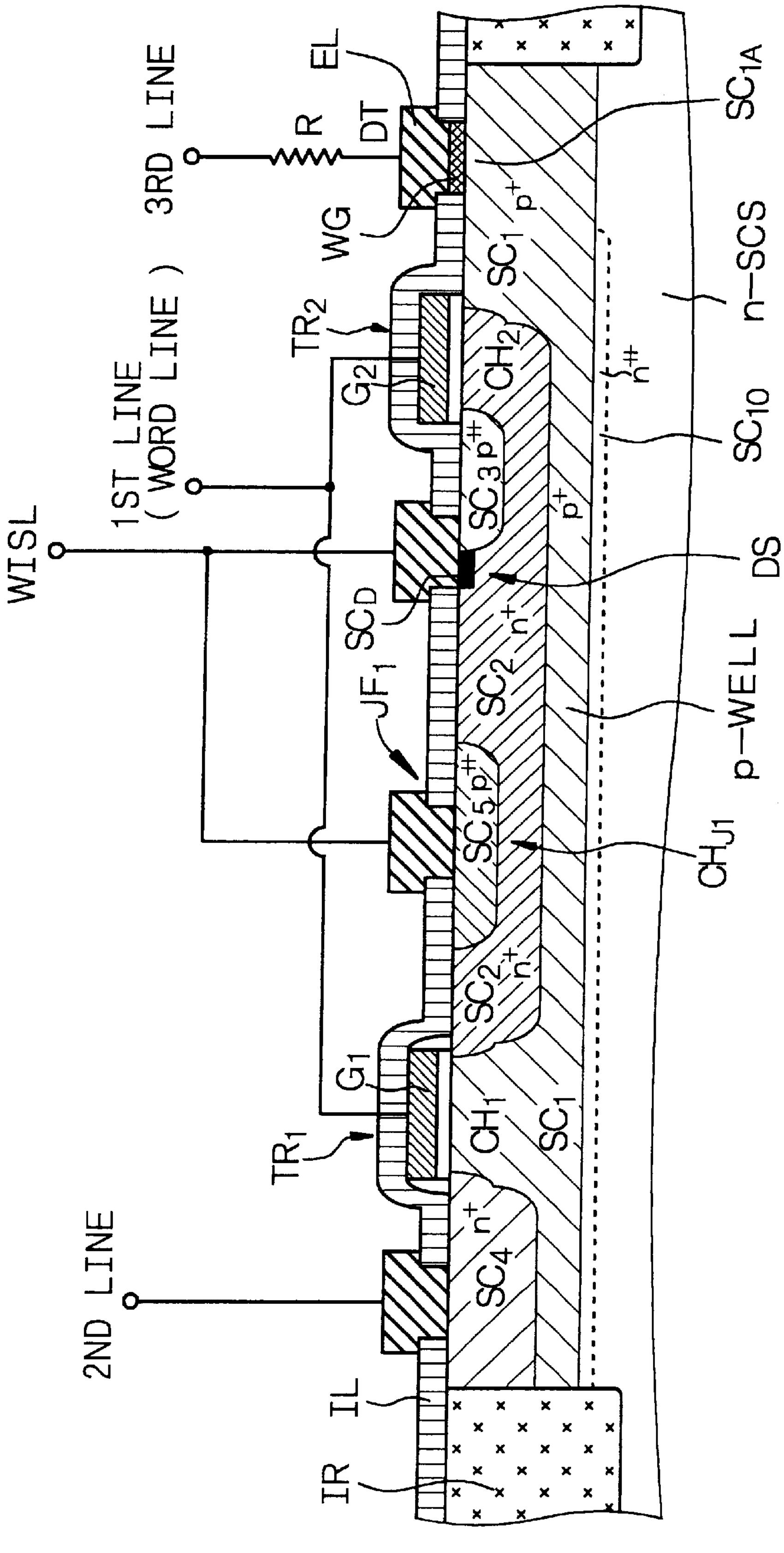
FIG. 55 shows a schematic partial cross-sectional view of a variant of the semiconductor memory cell of Example 5.
Figure 56:
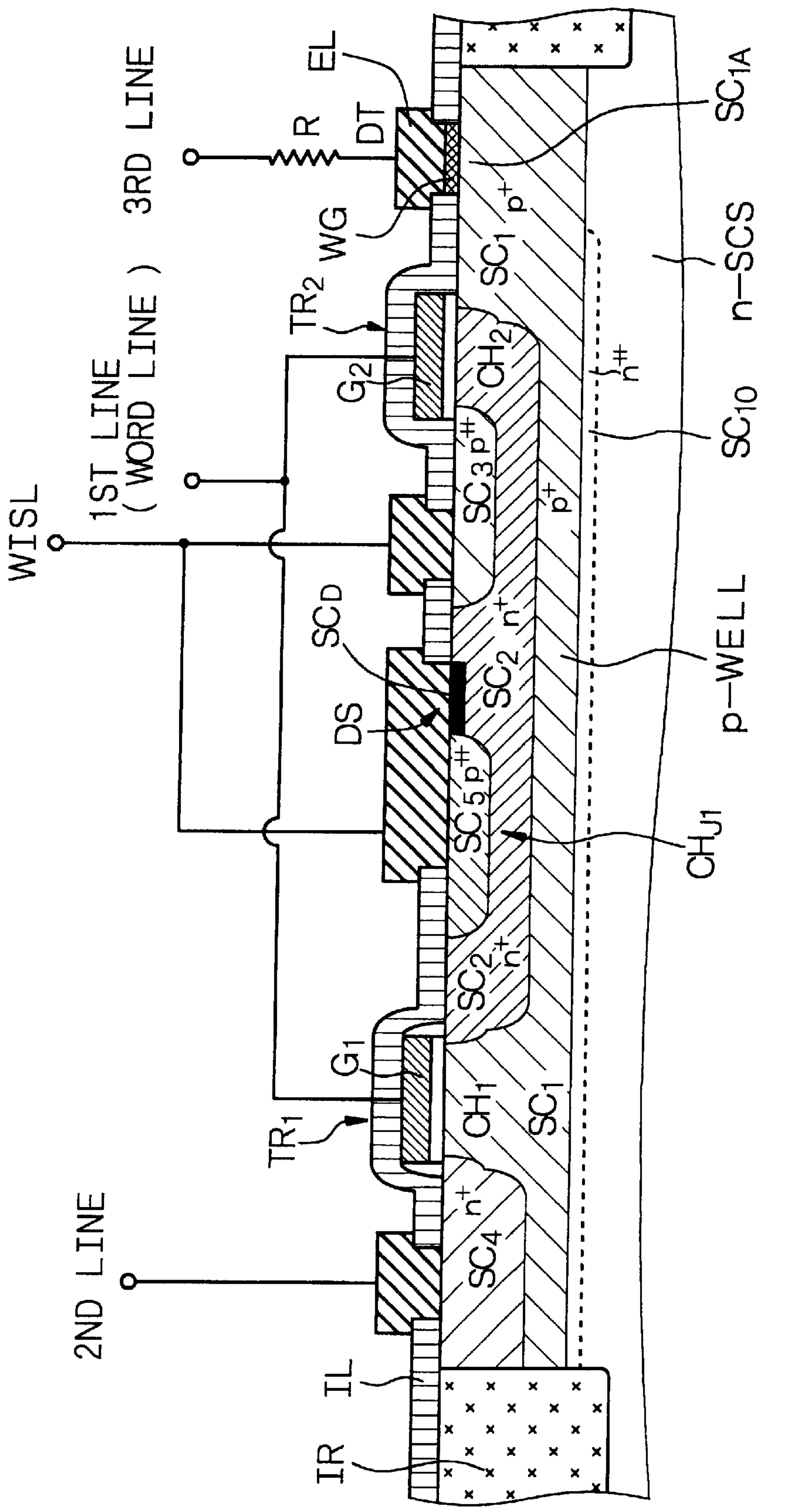
FIG. 56 shows a schematic partial cross-sectional view of a variant of the semiconductor memory cell of Example 5.

As shown in the principle drawings of FIG. 46 and FIGS. 47A and 47B, the other gate region of the junction-field-effect transistor $JF_1$ may be connected to the write-in information setting line WISL in place of being connected to the fourth line. That is, as is shown in the schematic partial cross-sectional views of FIGS. 54, 55 and 56, the fifth region $SC_5$ may be connected to the write-in information setting line WISL in place of being connected to the fourth line. The semiconductor memory cell shown in FIG. 54 is a variant of the semiconductor memory cell shown in FIG. 51, and the semiconductor memory cells shown in FIGS. 55 and 56 are variants of the semiconductor memory cell shown in FIG. 53. The semiconductor memory cells shown in FIGS. 55 and 56 have the same constitutions except that the diode-constituting regions $SC_D$ are formed in different positions.

Figure 48:
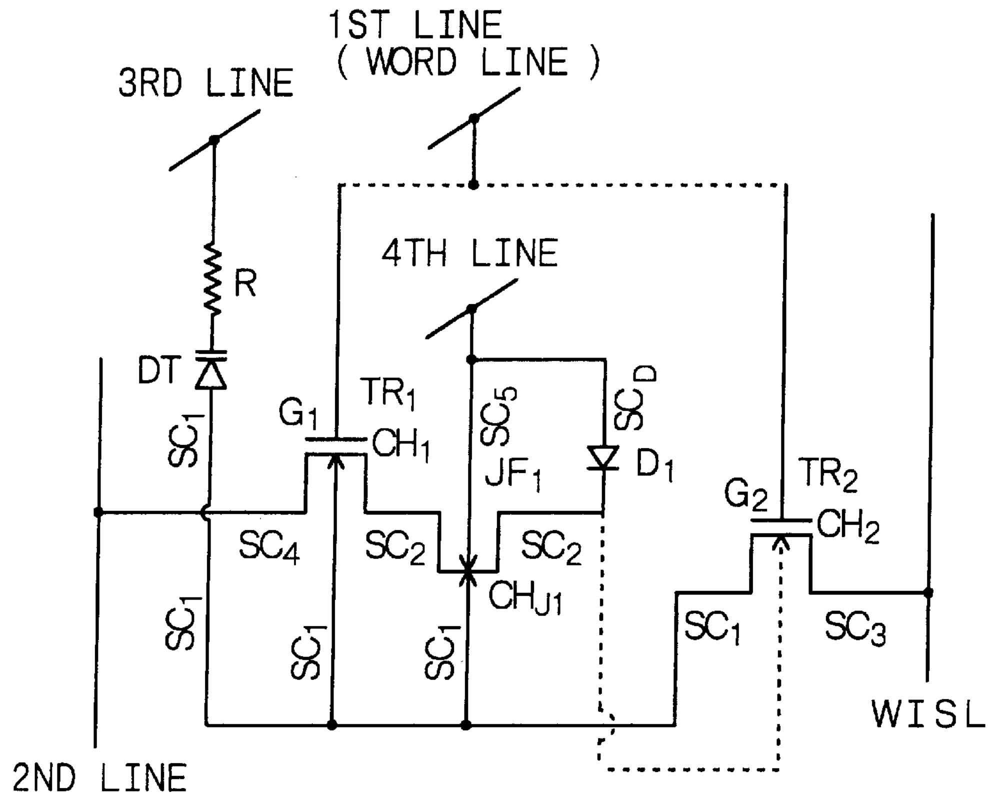
FIG. 48 shows the principle of a variant of the semiconductor memory cell according to the fifth aspect of the present invention.
Figure 57:
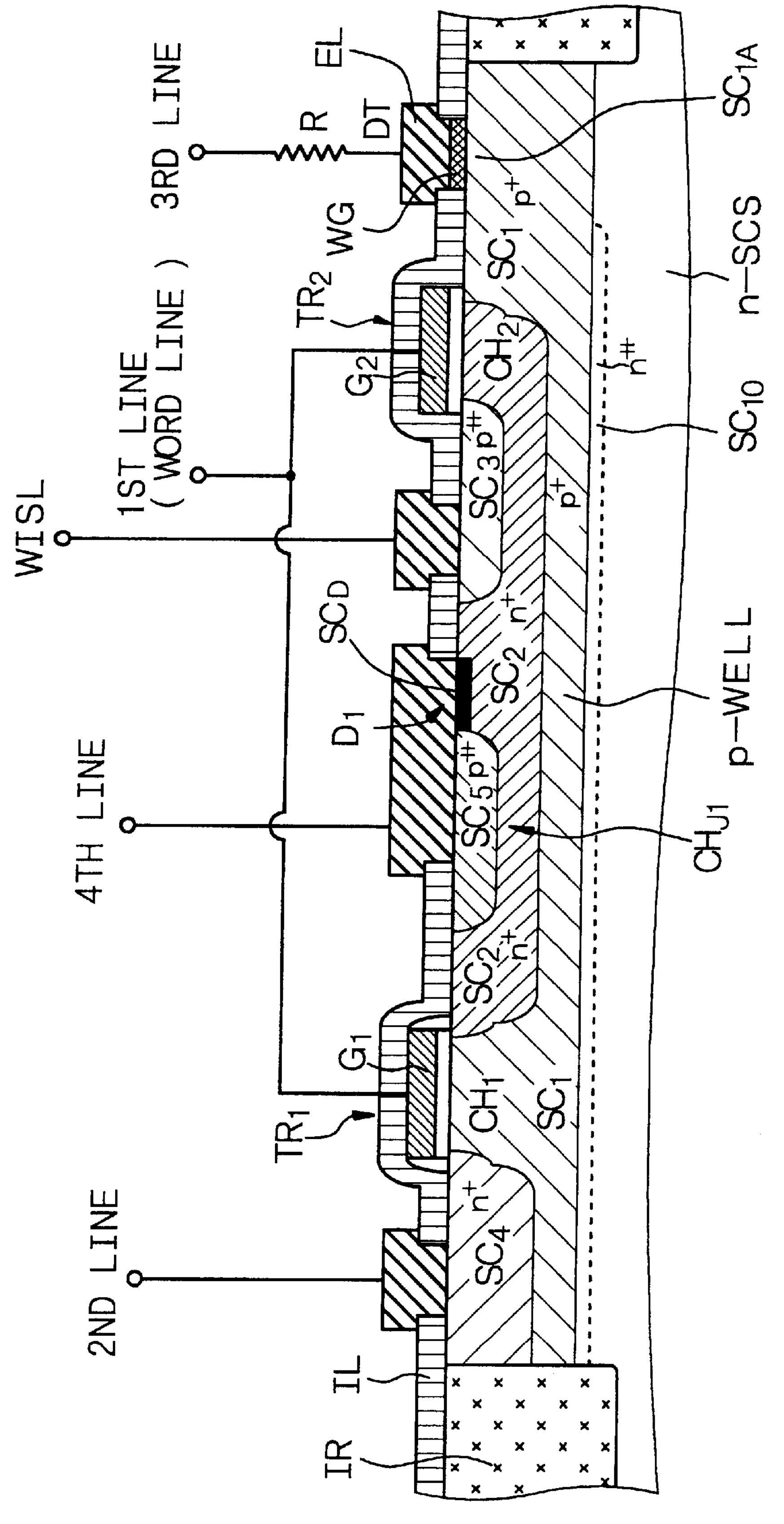
FIG. 57 shows a schematic partial cross-sectional view of a variant of the semiconductor memory cell of Example 5.

In the semiconductor memory cell shown in the principle drawing of FIG. 48 and the schematic partial cross-sectional view of FIG. 57, one source/drain region of the first transistor $TR_1$ is connected to the fourth line through the junction-field-effect transistor $JF_1$ and a diode $D_1$ in place of being connected to the fifth line through the junction-field-effect transistor $JF_1$. That is, the semiconductor memory cell further has a diode-constituting region $SC_D$ which is formed in a surface region of the second region $SC_2$ and is in contact with the second region $SC_2$ to form a rectifier junction together with the second region $SC_2$. The diode-constituting region $SC_D$ and the second region $SC_2$ constitute the diode $D_1$, and the second region $SC_2$ is connected to the fourth line through the diode-constituting region $SC_D$. In this case, it is preferred to employ a constitution in which the second line is used as a bit line. The diode-constituting region $SC_D$ is formed preferably adjacently to the fifth region $SC_5$, since the structure of the semiconductor memory cell can be simplified.

Figure 49:
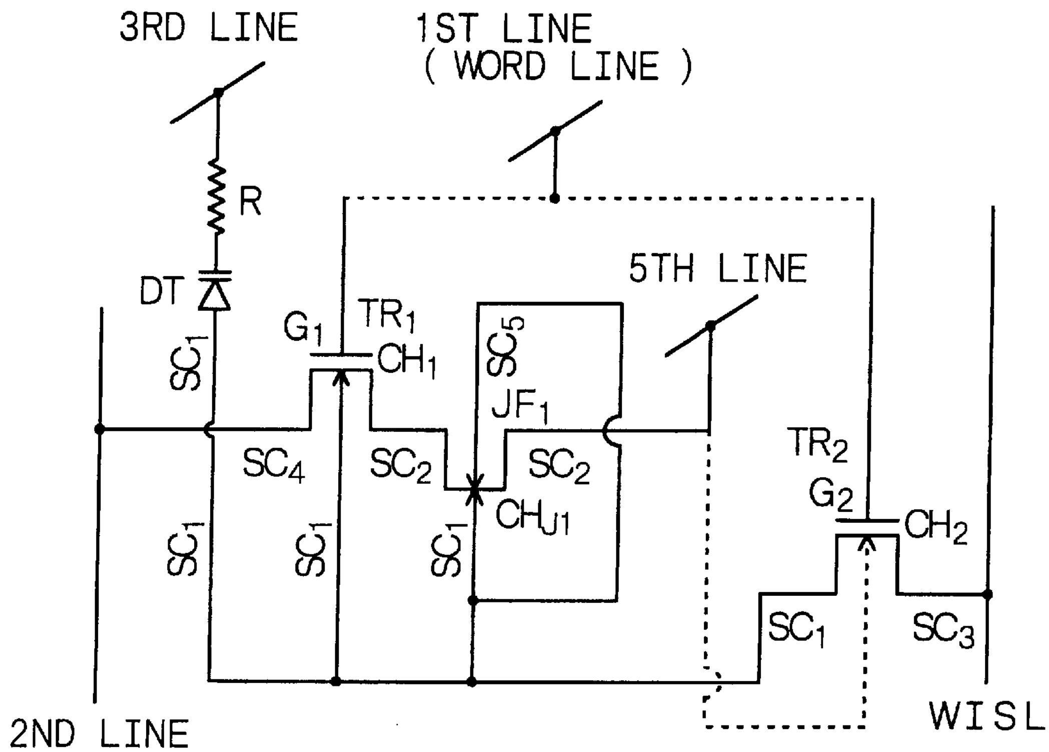
FIG. 49 shows the principle of a variant of the semiconductor memory cell according to the fifth aspect of the present invention.
Figure 50A:
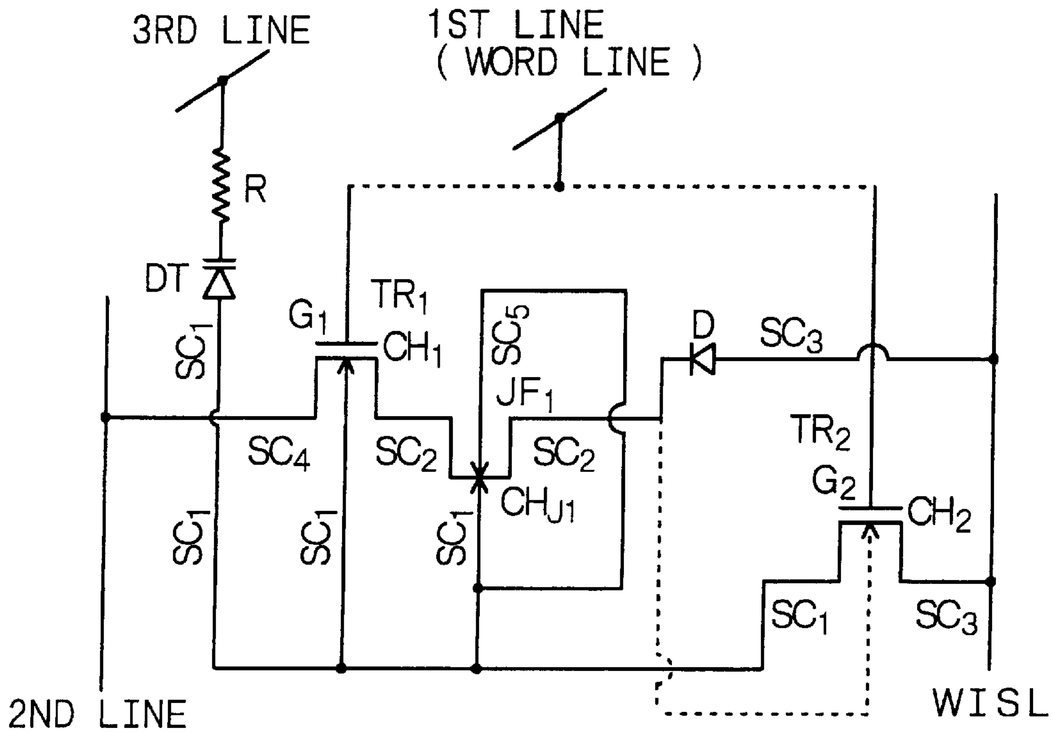
FIGS. 50A and 50B show the principles of variants of the semiconductor memory cell according to the fifth aspect of the present invention.
Figure 58:
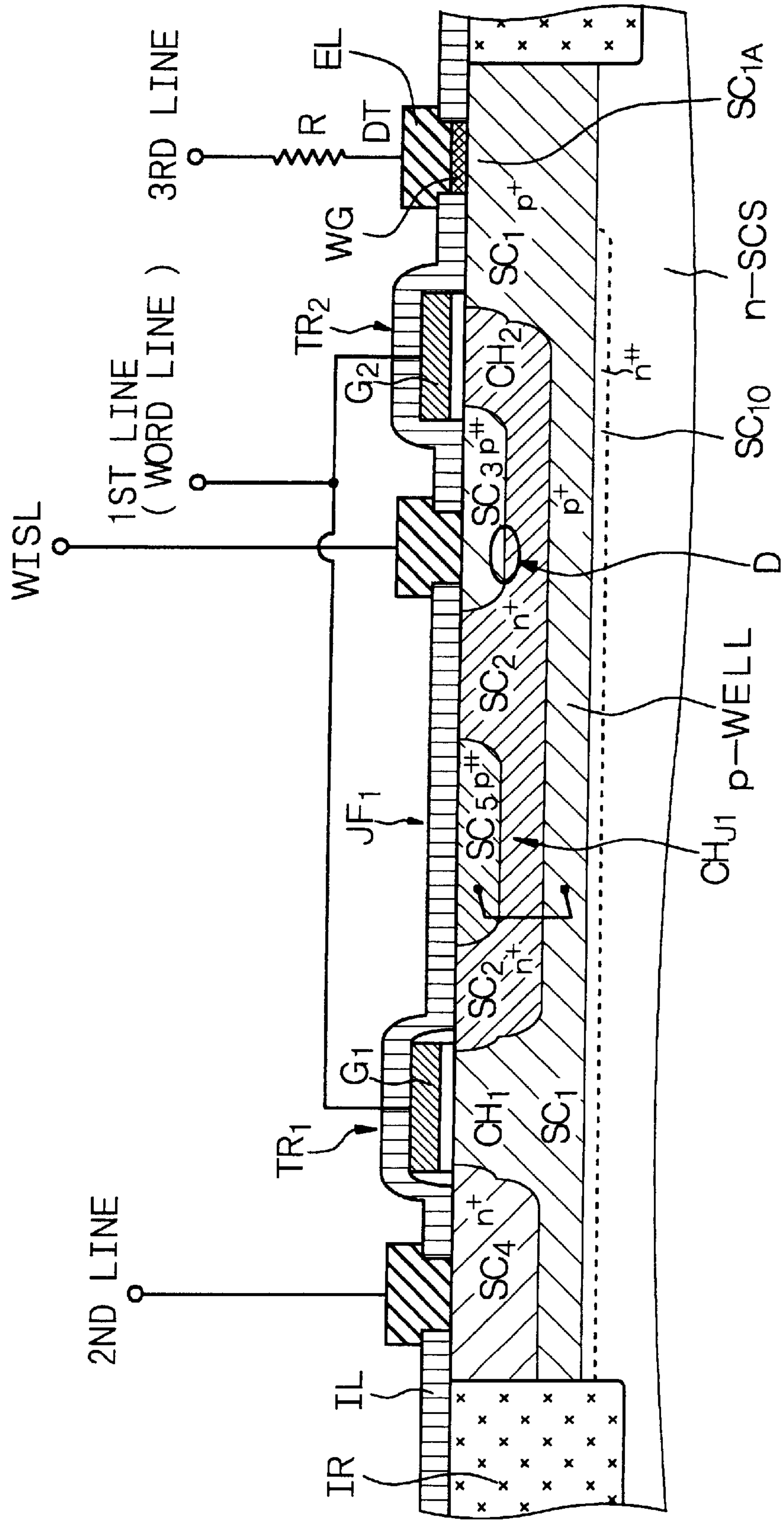
FIG. 58 shows a schematic partial cross-sectional view of a variant of the semiconductor memory cell of Example 5.

In the semiconductor memory cell shown in the principle drawing of FIG. 50A and the schematic partial cross-sectional view of FIG. 58, the other gate region of the junction-field-effect transistor $JF_1$ is connected to one gate region of the junction-field-effect transistor $JF_1$ in place of being connected to the fourth line. That is, the fifth region $SC_5$ is connected to the first region $SC_1$ in place of being connected to the fourth line. Further, the second region $SC_2$ and the third region $SC_3$ constitute a pn junction diode D, and the second region $SC_2$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line. As is shown in the principle drawing of FIG. 49, there may be employed a constitution in which the pn junction diode D is omitted and the second region $SC_2$ corresponding to one source/drain region of the first transistor $TR_1$ is connected to a fifth line (not shown in FIG. 58). In this case, it is preferred to employ a constitution in which the second line is used as a bit line and a second predetermined potential is applied to the fifth line, or a constitution in which the fifth line is used as a bit line and a second predetermined potential is applied to the second line.

Figure 59:
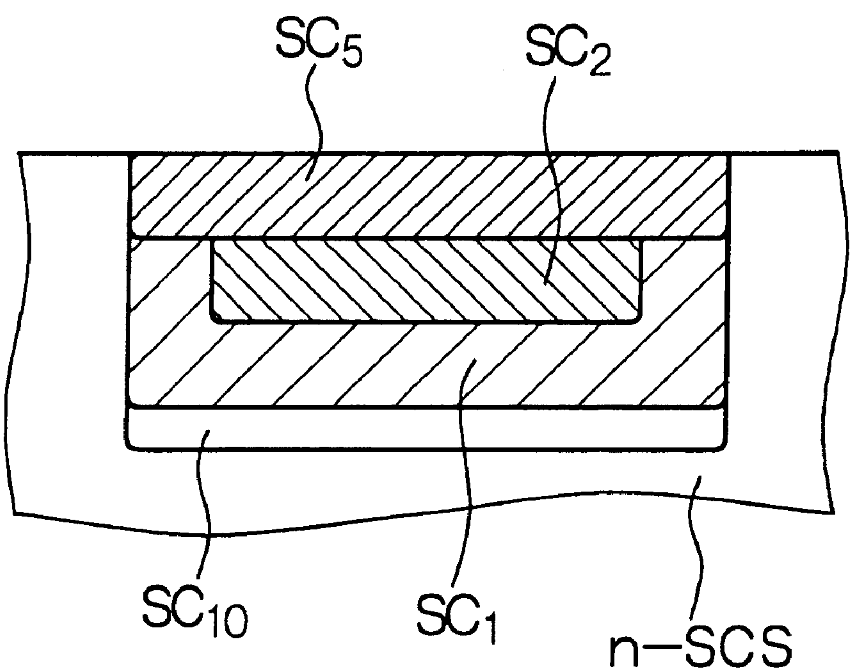
FIG. 59 shows another schematic partial cross-sectional view of the variant shown in FIG. 58, prepared by cutting the variant with a different plane.

As is shown in the schematic partial cross-sectional view of FIG. 59 obtained by cutting the semiconductor memory cell with a vertical plane in parallel with the direction in which the gate extends, the fifth region $SC_5$ and the first region $SC_1$ can be connected, for example, by forming a structure in which a portion of the first region $SC_1$ extends up to a vicinity of the surface of the semiconductor substrate and the fifth region $SC_5$ and the extending portion of the first region $SC_1$ are brought into contact with each other outside the second region $SC_2$. When the semiconductor memory cell is structured as described above, the wiring structure of the semiconductor memory cell can be simplified.

Figure 50B:
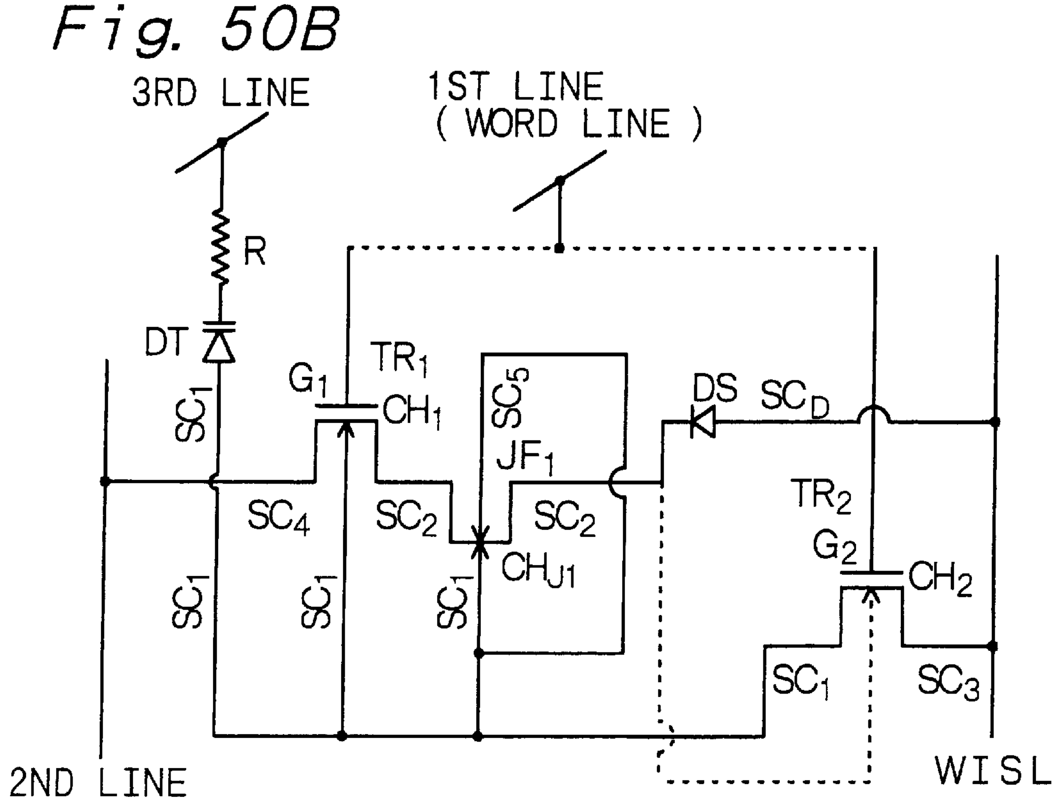
Figure 60:
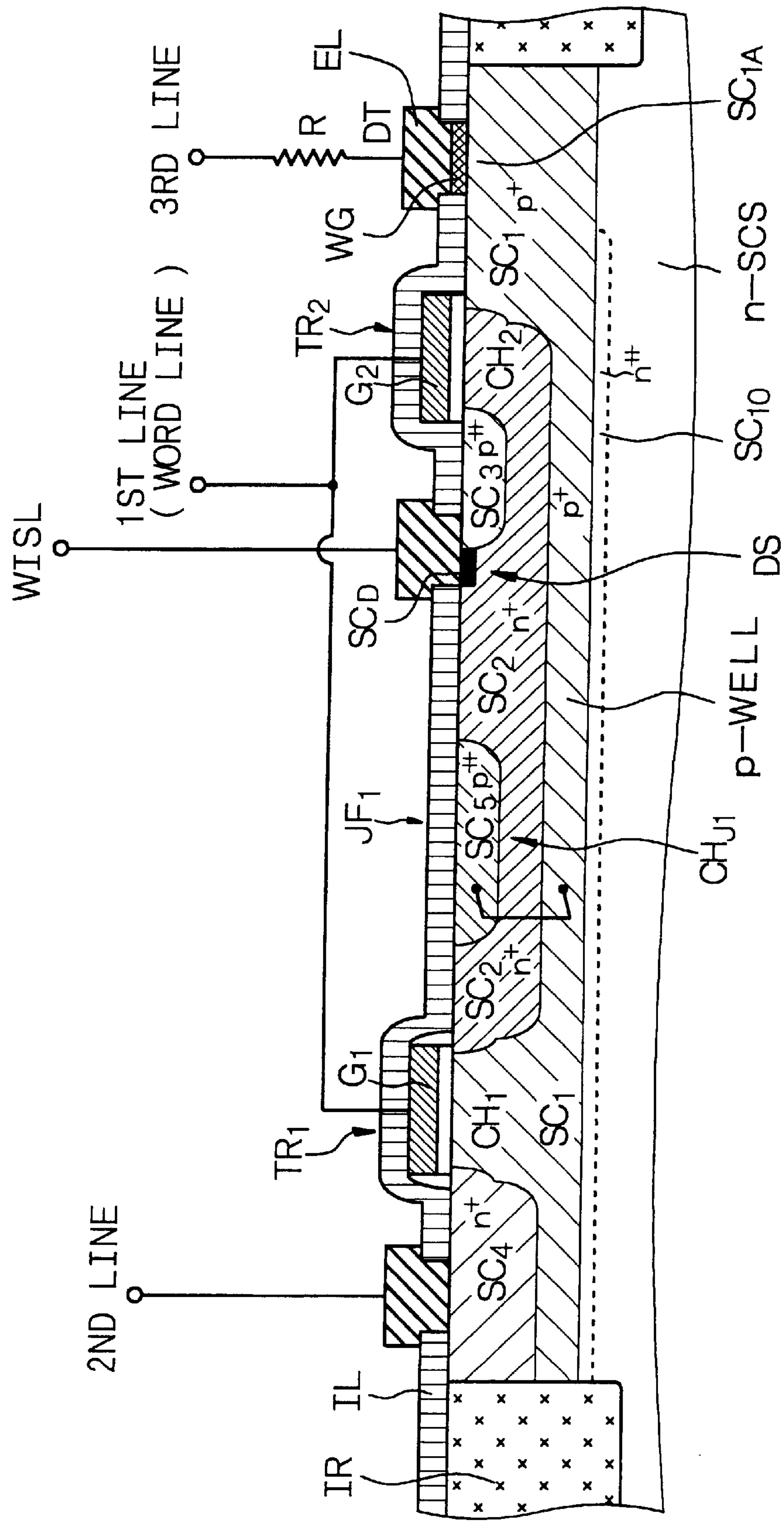
FIG. 60 shows a schematic partial cross-sectional view of a variant of the semiconductor memory cell of Example 5.

In the semiconductor memory cell shown in the principle drawing of FIG. 50B and the schematic partial cross-sectional view of FIG. 60, the fifth region $SC_5$ is also connected to the first region $SC_1$ in place of being connected to the fourth line. Further, it has a diode-constituting region $SC_D$ which is formed in a surface region of the second region $SC_2$ and is in contact with the second region $SC_2$ to form a rectifier junction together with the second region $SC_2$, the diode-constituting region $SC_D$ and the second region $SC_2$ constitute a majority carrier diode DS of a Schottky junction type, and the second region $SC_2$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

EXAMPLE 6

Figure 62A:
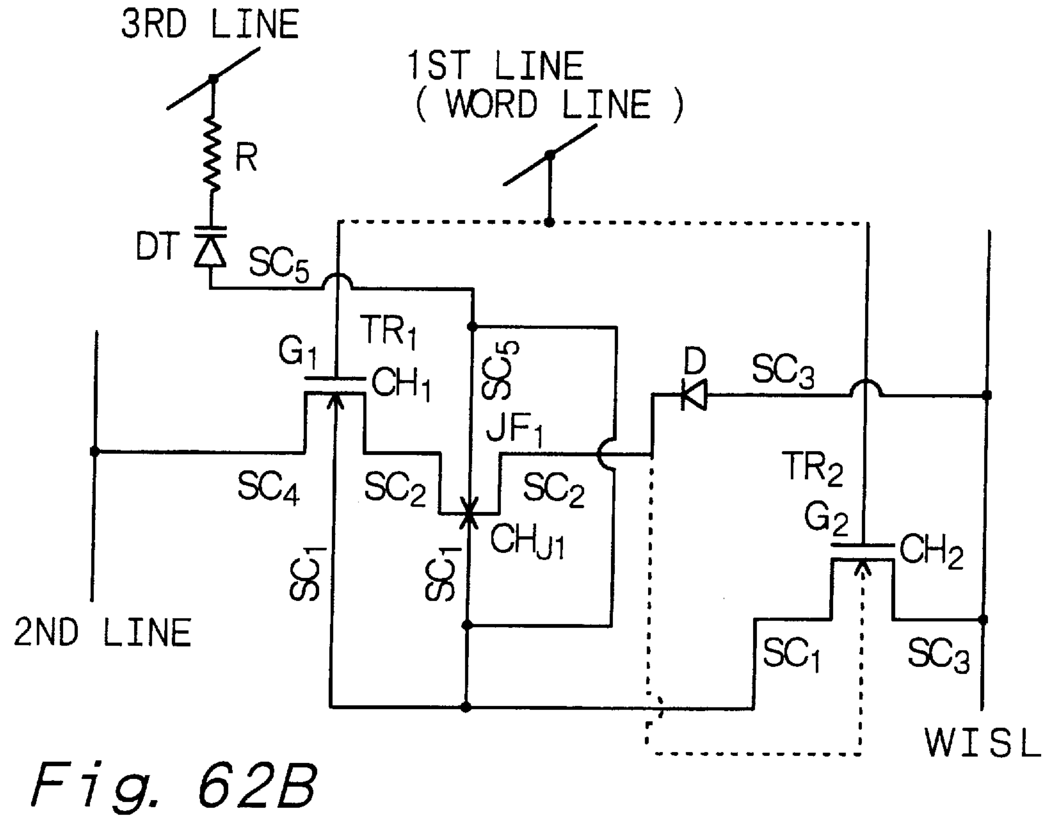
FIGS. 62A and 62B show the principles of variants of the semiconductor memory cell according to the fifth aspect of the present invention.

Example 6 is concerned with the semiconductor memory cell according to the fifth and thirteenth aspects of the present invention. FIG. 62A shows the principle of the semiconductor memory cell of Example 6. In the semiconductor memory cell of Example 6, the other gate region of the junction-field-effect transistor $JF_1$ is connected to one gate region of the junction-field-effect transistor $JF_1$ in place of being connected to the fourth line. More specifically, one end of the MIS type diode DT and the other gate region of the junction-field-effect transistor $JF_1$ are formed as a common region. The fifth region $SC_5$ constituting the other gate region of the junction-field-effect transistor $JF_1$ corresponds to an extending portion of the channel forming region $CH_1$ of the first transistor $TR_1$.

Figure 63:
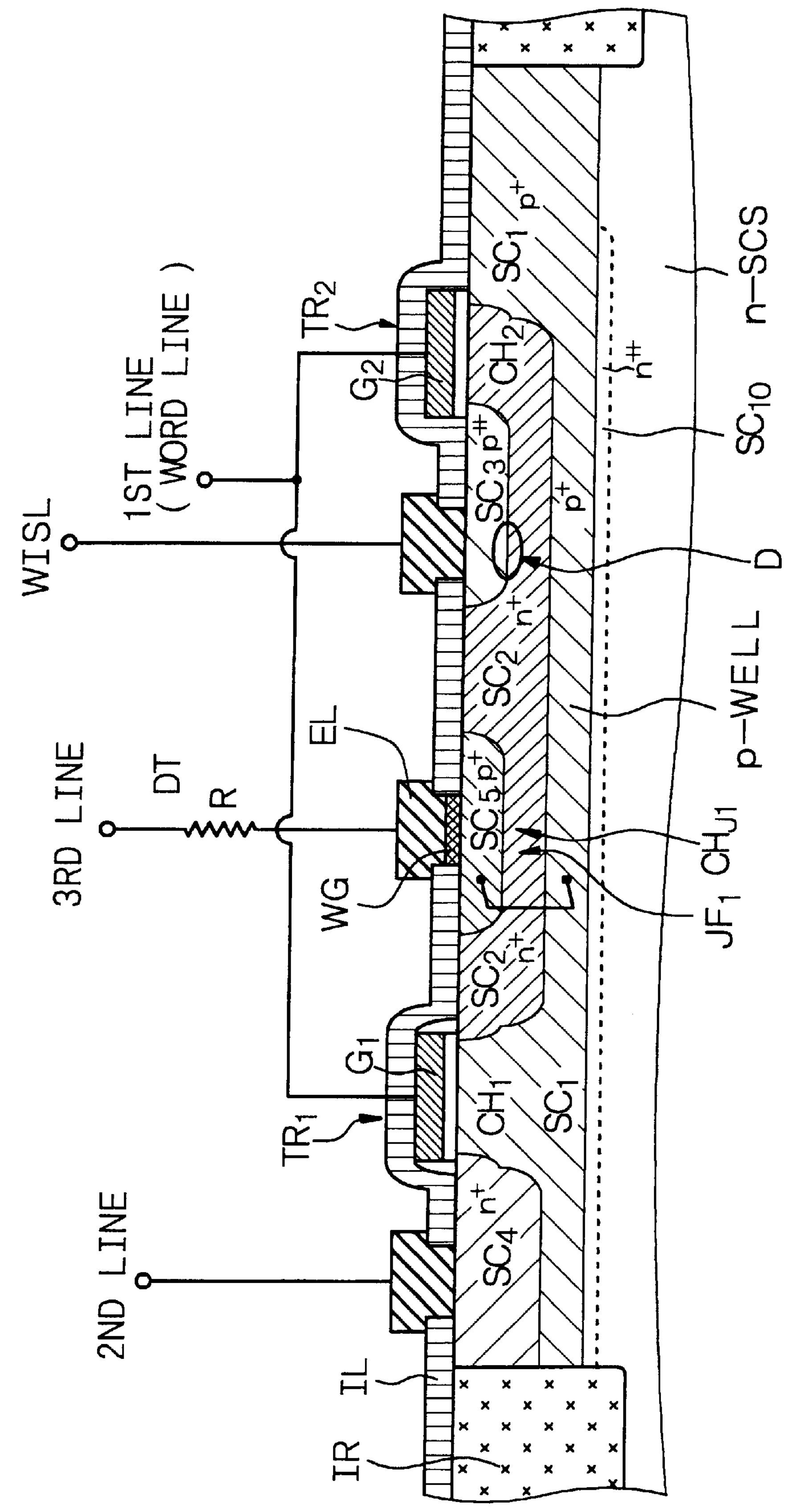
FIG. 63 shows a schematic partial cross-sectional view of a semiconductor memory cell of Example 6.

That is, as is shown in the schematic partial cross-sectional view of FIG. 63, the semiconductor memory cell of Example 6 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information, and the semiconductor memory cell has;

(a) a semi-conductive first region $SC_1$ having a second conductivity type (for example, $p^+$-type), (b) a semi-conductive second region $SC_2$ which is formed in a surface region of the first region $SC_1$ and has a first conductivity type (for example, $n^+$-type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$-type) or which is formed of a silicide, a metal or a metal compound and is conductive, (d) a fourth region $SC_4$ which is formed in a surface region of the first region $SC_1$ to be spaced from the second region $SC_2$ and is in contact with the first region $SC_1$ so as to form a rectifier junction together with the first region $SC_1$, the fourth region $SC_4$ being a region which is semi-conductive and has the first conductivity type (for example, $n^+$-type) or which is formed of a silicide, a metal or a metal compound and is conductive, and (e) a semi-conductive fifth region $SC_5$ which is formed in a surface region of the second region $SC_2$ to be spaced from the third region $SC_3$ and has the second conductivity type (for example, $p^{++}$-type).

Concerning the first transistor $TR_1$, (A-1) one source/drain region is formed of a portion of a surface region of the second region $SC_2$, (A-2) the other source/drain region is formed of the fourth region $SC_4$, (A-3) the channel forming region $CH_1$ is formed of a portion of a surface region of the first region $SC_1$ which portion is interposed between said portion of the surface region of the second region $SC_2$ and the fourth region $SC_4$, and (A-4) the gate $G_1$ is formed on the channel forming region $CH_1$ of the first transistor $TR_1$ through an insulation layer.

Concerning the second transistor $TR_2$, (B-1) one source/drain region is formed of other portion of the surface region of the first region $SC_1$, (B-2) the other source/drain region is formed of the third region $SC_3$, (B-3) the channel forming region $CH_2$ is formed of other portion of the surface region of the second region $SC_2$ which other portion is interposed between said other portion of the surface region of the first region $SC_1$ and the third region $SC_3$, and (B-4) the gate $G_2$ is formed on the channel forming region $CH_2$ of the second transistor through an insulation layer.

Further, concerning the junction-field-effect transistor $JF_1$, (C-1) the gate regions are formed of the fifth region $SC_5$ and part of the first region $SC_1$ which part is opposed to the fifth region $SC_5$, (C-2) the channel region $CH_{J1}$ is formed of part of the second region $SC_2$ which part is interposed between the fifth region $SC_5$ and said portion of the first region $SC_1$, (C-3) one source/drain region is formed of said portion of the surface region of the second region $SC_2$ which portion extends from one end of the channel region $CH_{J1}$ of the junction-field-effect transistor $JF_1$ and constitutes one source/drain region of the first transistor $TR_1$, and (C-4) the other source/drain region is formed of a portion of the second region $SC_2$ which portion extends from the other end of the channel region $CH_{J1}$ of the junction-field-effect transistor $JF_1$.

Concerning the MIS type diode DT, further, (D-1) one end thereof is formed of the fifth region $SC_5$, and (D-2) an electrode constituting the other end thereof is formed to be opposed to the fifth region $SC_5$ constituting one end of the MIS type diode DT, through a wide gap thin film WG.

The wide gap thin film WG can be composed of a material in which the tunnel transition of carriers is caused depending upon a potential difference between the potential in the fifth region $SC_5$ (corresponding to the extending portion of the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element are integrally formed and are composed of a polysilicon thin layer containing an impurity having the first conductivity type.

In the above semiconductor memory cell, further, (E) the gate $G_1$ of the first transistor $TR_1$ and the gate $G_1$ of the second transistor $TR_2$ are connected to a first line (for example, word line) for memory cell selection, (F) the third region $SC_3$ is connected to a write-in information setting line WISL, (G) the fourth region $SC_4$ is connected to a second line, (H) the fifth region $SC_5$ is connected to the first region $SC_1$, and (I) the electrode EL constituting the other end of the MIS type diode DT is connected to a third line having a predetermined potential.

In the semiconductor memory cell of Example 6, the second region $SC_2$ and the third region $SC_3$ constitute a pn junction diode D, and the second region $SC_2$ is connected to the write-in information setting line WISL through the third region $SC_3$. The above pn junction diode can be formed by adjusting the impurity concentrations of the second region $SC_2$ and the third region $SC_3$ to proper values. It is preferred to employ a constitution in which the second line is used as a bit line, or a constitution in which the write-in information setting line WISL is used as a bit line as well and a second predetermined potential is applied to the second line.

The junction-field-effect transistor $JF_1$ is formed by (X) optimizing the distance between the facing gate regions (the fifth region $SC_5$ and the part of the first region $SC_1$ which part is opposed to the fifth region $SC_5$), that is, thickness of the channel region $CH_{J1}$, and (Y) optimizing the impurity concentration of each of the facing gate regions (the fifth region $SC_5$ and the part of the first region $SC_1$ which part is opposed to the fifth region $SC_5$) and the impurity concentration of the channel region $CH_{J1}$.

In Example 6, the semiconductor memory cell (specifically, the first region $SC_1$) is formed in a well structure which is formed, for example, in an n-type semiconductor substrate and has the second conductivity type (for example, p-type).

In the semiconductor memory cell of Example 6, when a first high-concentration-impurity-containing layer $SC_{10}$ having the first conductivity type (for example, $n^{++}$-type) is formed below the first region $SC_1$, the potential or charge to be stored in the channel forming region $CH_1$ of the first transistor $TR_1$ for readout can be increased.

Figure 61:
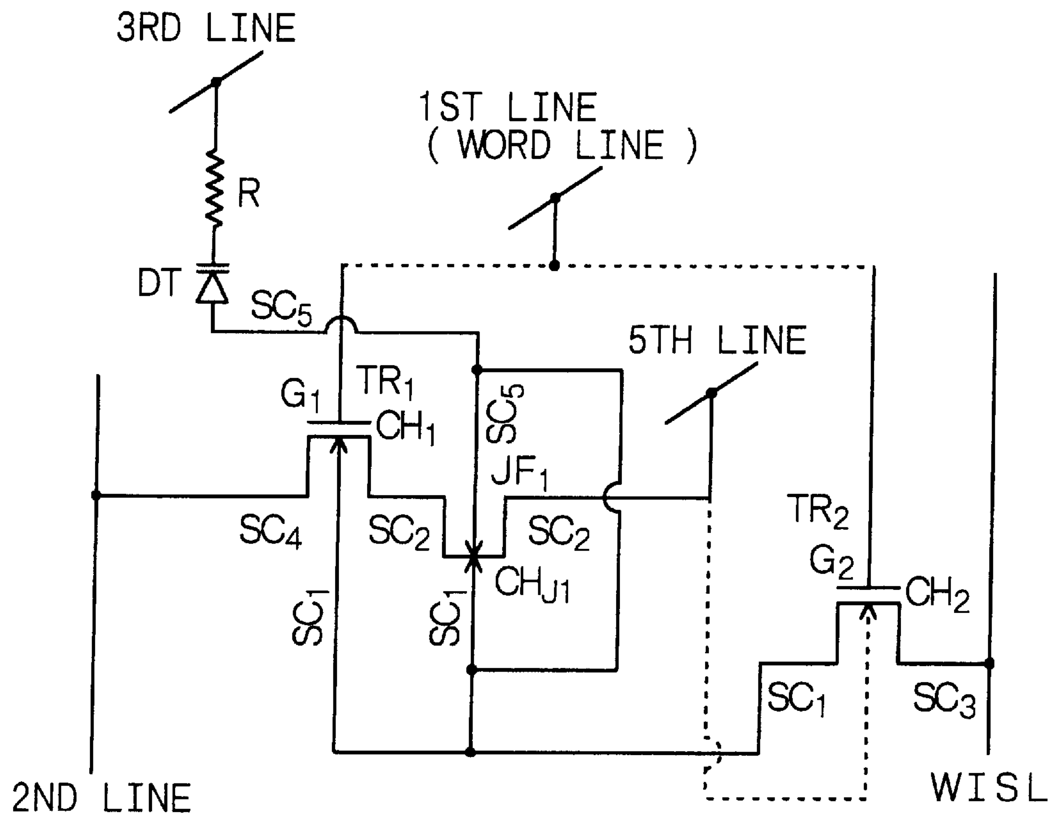
FIG. 61 shows the principle of a variant of the semiconductor memory cell according to the fifth aspect of the present invention.

In the semiconductor memory cell shown in FIG. 63, as is shown in the principle drawing of FIG. 61, there may be employed an embodiment in which the formation of the pn junction diode D is omitted and the second region $SC_2$ corresponding to one source/drain region of the first transistor $TR_1$ is connected to a fifth line (not shown in FIG. 63). In the above embodiment, it is preferred to employ a constitution in which the second line is used as a bit line and a second predetermined potential is applied to the fifth line, or a constitution in which the fifth line is used as a bit line and a second predetermined potential is applied to the second line.

Figure 62B:
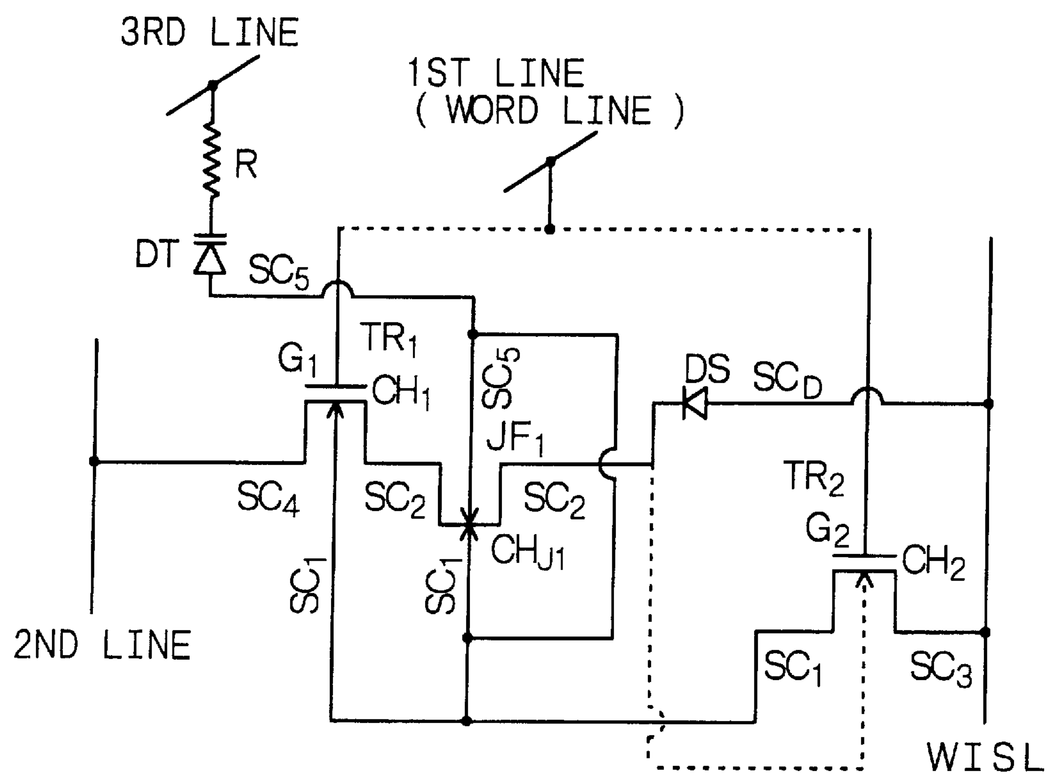
Figure 64:
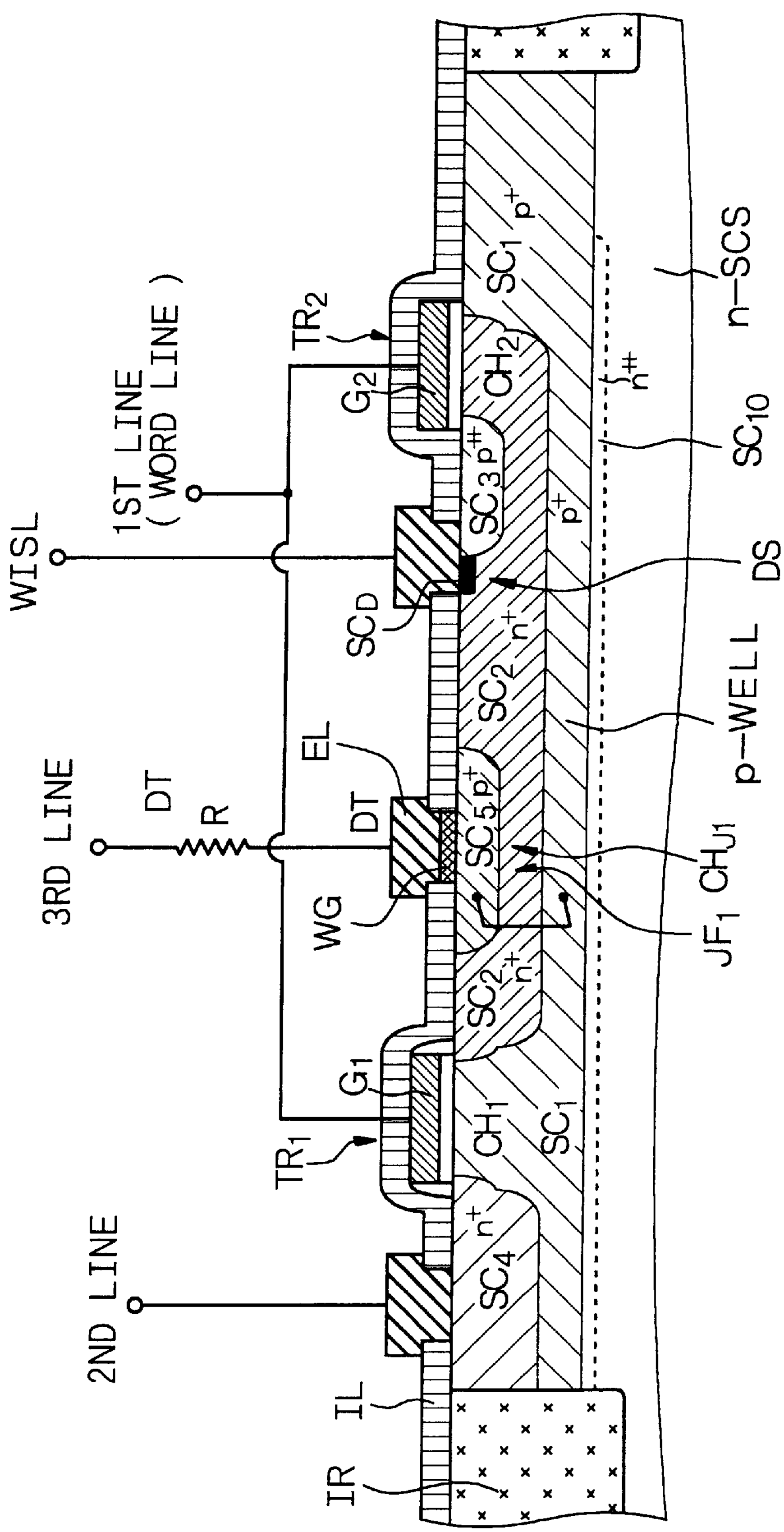
FIG. 64 shows a schematic partial cross-sectional view of a variant of the semiconductor memory cell of Example 6.

The semiconductor memory cell shown in the principle drawing of FIG. 62B and the schematic partial cross-sectional view of FIG. 64 further has a diode-constituting region $SC_D$ which is formed in a surface region of the second region $SC_2$ and is in contact with the second region $SC_2$ to form a rectifier junction together with the second region $SC_2$, and the diode-constituting region $SC_D$ and the second region $SC_2$ constitute a majority carrier diode DS of a Schottky junction type. One source/drain region of the first transistor $TR_1$ is connected to the write-in information setting line WISL through the junction-field-effect transistor $JF_1$ and the majority carrier diode DS of a Schottky junction type in place of being connected to the fifth line through the junction-field-effect transistor $JF_1$. That is, the second region $SC_2$ is connected to the write-in information setting line WISL through the diode-constituting region $SC_D$. In the semiconductor memory cell shown in FIG. 64, the diode-constituting region $SC_D$ is formed adjacently to the third region $SC_3$, while the position of the diode-constituting region $SC_D$ shall not be limited thereto.

EXAMPLE 7

Figure 65:
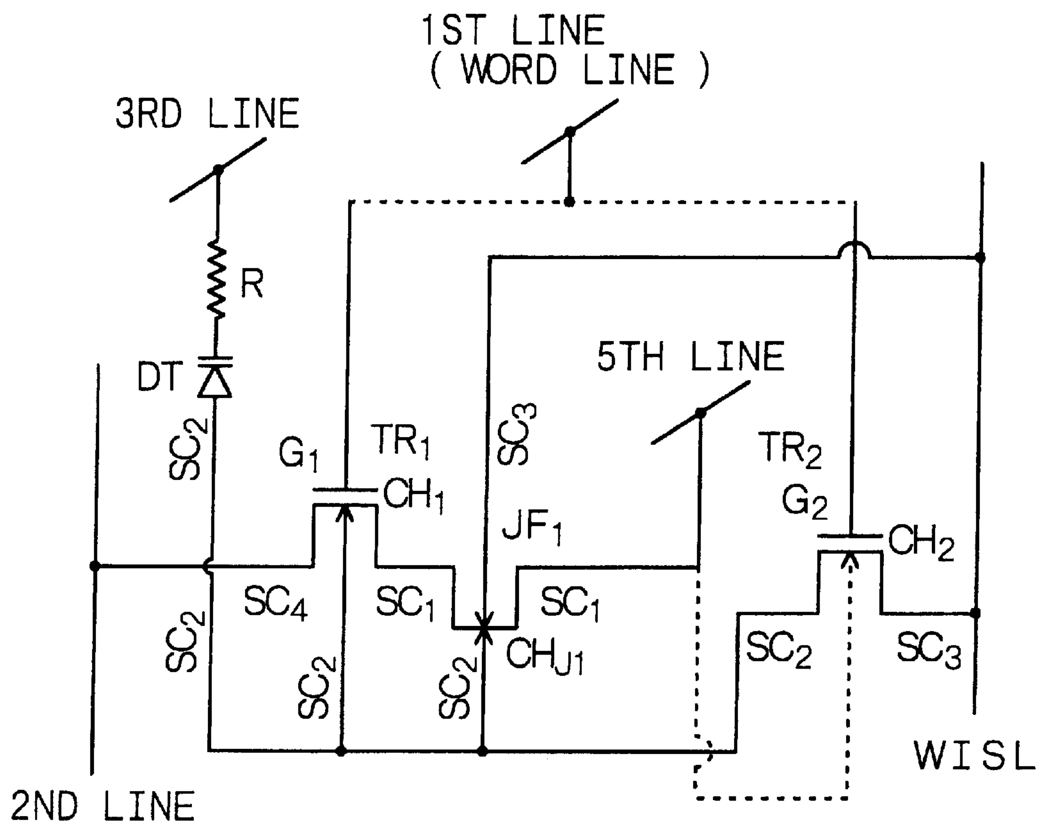
FIG. 65 shows the principle of a variant of the semiconductor memory cell according to the fifth aspect of the present invention.

Example 7 is concerned with the semiconductor memory cell according to the seventh and fourteenth aspects of the present invention. FIG. 65 shows the principle of the semiconductor memory cell of Example 7. In the semiconductor memory cell of Example 7, the other gate region of the junction-field-effect transistor $JF_1$ is connected to the write-in information setting line WISL in place of being connected to the fourth line.

Figure 69A:
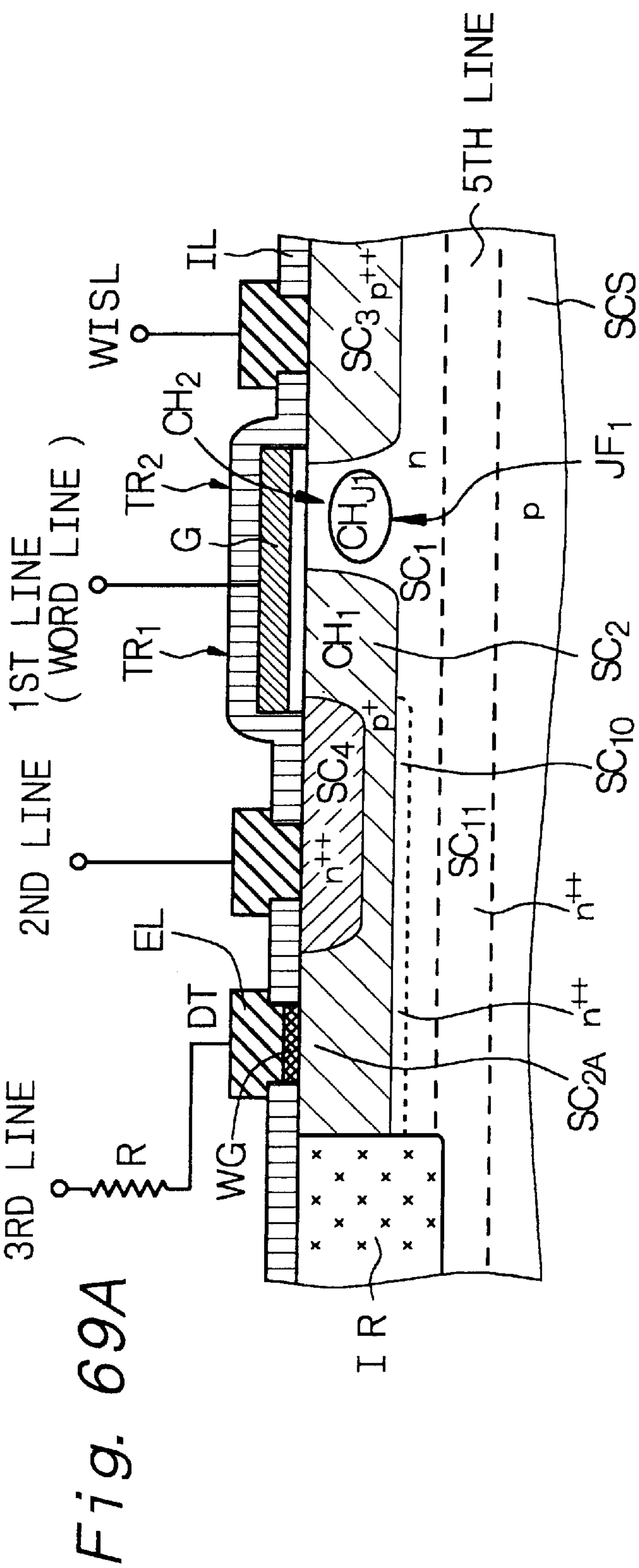
FIG. 69A shows a schematic partial cross-sectional view of a semiconductor memory cell of Example 7.
Figure 69B:
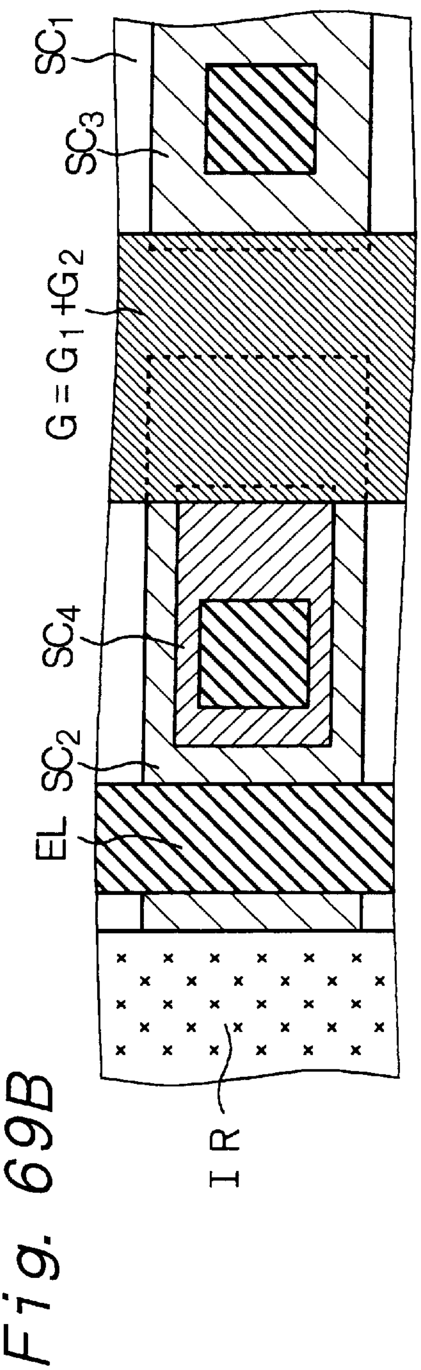
FIG. 69B shows a schematic plan view of layout of regions thereof.

Further, as shown in the schematic partial cross-sectional view of FIG. 69A and the schematic layout of regions in FIG. 69B, the semiconductor memory cell of Example 7 differs from the semiconductor memory cell of Example 5 in that the fifth region $SC_5$ is omitted and that the first transistor $TR_1$ and the second transistor $TR_2$ share a gate. That is, the semiconductor memory cell of Example 7 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and the gate G capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information, and the semiconductor memory cell has;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^{++}$-type) or which is formed of a silicide, a metal or a metal compound and is conductive, (d) a fourth region $SC_4$ which is formed in a surface region of the second region $SC_2$ and is in contact with the second region $SC_2$ so as to form a rectifier junction together with the second region $SC_2$, the fourth region $SC_4$ being a region which is semi-conductive and has the first conductivity type (for example, $n^{++}$-type) or which is formed of a silicide, a metal or a metal compound and is conductive, and (e) the gate G which is formed, through an insulation layer, so as to bridge the first region $SC_1$ and the fourth region $SC_4$ and so as to bridge the second region $SC_2$ and the third region $SC_3$ and is shared by the first transistor $TR_1$ and the second transistor $TR_2$.

The first region $SC_1$ and the second region $SC_2$ are in contact with each other. In the semiconductor memory cell shown in FIG. 69, specifically, the second region $SC_2$ is formed in a surface region of the first region $SC_1$.

Concerning the first transistor $TR_1$, (A-1) one source/drain region is formed of a surface region of the first region $SC_1$, (A-2) the other source/drain region is formed of the fourth region $SC_4$, and (A-3) the channel forming region $CH_1$ is formed of a surface region of the second region $SC_2$ which surface region is interposed between the surface region of the first region $SC_1$ and the fourth region $SC_4$.

Concerning the second transistor $TR_2$, (B-1) one source/drain region is formed of the surface region of the second region $SC_2$ which surface region constitutes the channel forming region $CH_1$ of the first transistor $TR_1$, (B-2) the other source/drain region is formed of the third region $SC_3$, and (B-3) the channel forming region $CH_2$ is formed of the surface region of the first region $SC_1$ which surface region constitutes one source/drain region of the first transistor $TR_1$.

Further, concerning the junction-field-effect transistor $JF_1$, (C-1) the gate regions are formed of the third region $SC_3$ and part of the second region $SC_2$ which part is opposed to the third region $SC_3$, (C-2) the channel region $CH_{J1}$ is formed of part of the first region $SC_1$ which part is interposed between the third region $SC_3$ and said part of the second region $SC_2$, (C-3) one source/drain region is formed of the surface region of the first region $SC_1$ which surface region extends from one end of the channel region $CH_{J1}$ of the junction-field-effect transistor $JF_1$ and constitutes one source/drain region of the first transistor $TR_1$, and (C-4) the other source/drain region is formed of a portion of the first region $SC_1$ which portion extends from the other end of the channel region $CH_{J1}$ of the junction-field-effect transistor $JF_1$.

Concerning the MIS type diode DT, (D-1) one end thereof is formed of part $SC_{2A}$ of the second region $SC_2$, and (D-2) an electrode constituting the other end thereof is formed to be opposed to said part $SC_{2A}$ of the second region $SC_2$ which part constitutes one end of the MIS type diode DT, through a wide gap thin film WG.

The wide gap thin film WG can be composed of a material in which the tunnel transition of carriers is caused depending upon a potential difference between the potential in the second region $SC_2$ (the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element are integrally formed and are composed of a polysilicon thin layer containing an impurity having the first conductivity type.

In the above semiconductor memory cell, further, (E) the gate G is connected to a first line (for example, word line) for memory cell selection, (F) the third region $SC_3$ is connected to a write-in information setting line WISL, (G) the fourth region $SC_4$ is connected to a second line, and (H) the electrode EL constituting the other end of the MIS type diode DT is connected to a third line having a predetermined potential.

It is preferred to employ a constitution in which the first region $SC_1$ is connected to a fifth line, the second line is used as a bit line and a second predetermined potential is applied to the fifth line, or a constitution in which the first region $SC_1$ is connected to a fifth line, the fifth line is used as a bit line and a second predetermined potential is applied to the second line.

In Example 7, the semiconductor memory cell (specifically, the first region $SC_1$) is formed in a well structure which is formed, for example, in an p-type semiconductor substrate and has the first conductivity type (for example, n-type).

In the semiconductor memory cell of Example 7, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased. Further, a second high-concentration-impurity-containing layer $SC_{11}$ which works as the fifth line and has the first conductivity type (for example, $n^{++}$-type) is formed below the first region $SC_1$.

The junction-field-effect transistor $JF_1$ is formed by (X) optimizing the distance between the facing gate regions (the third region $SC_3$ and the part of the second region $SC_2$ which part is opposed to the third region $SC_3$), that is, the thickness of the channel region $CH_{J1}$, and (Y) optimizing the impurity concentration of each of the facing gate regions (the third region $SC_3$ and the part of the second region $SC_2$ which part is opposed to the third region $SC_3$) and the impurity concentration of the channel region $CH_{J1}$.

FIGS. 70 to 91 show schematic partial cross-sectional views of variants of the semiconductor memory cell of Example 7.

Figure 70:
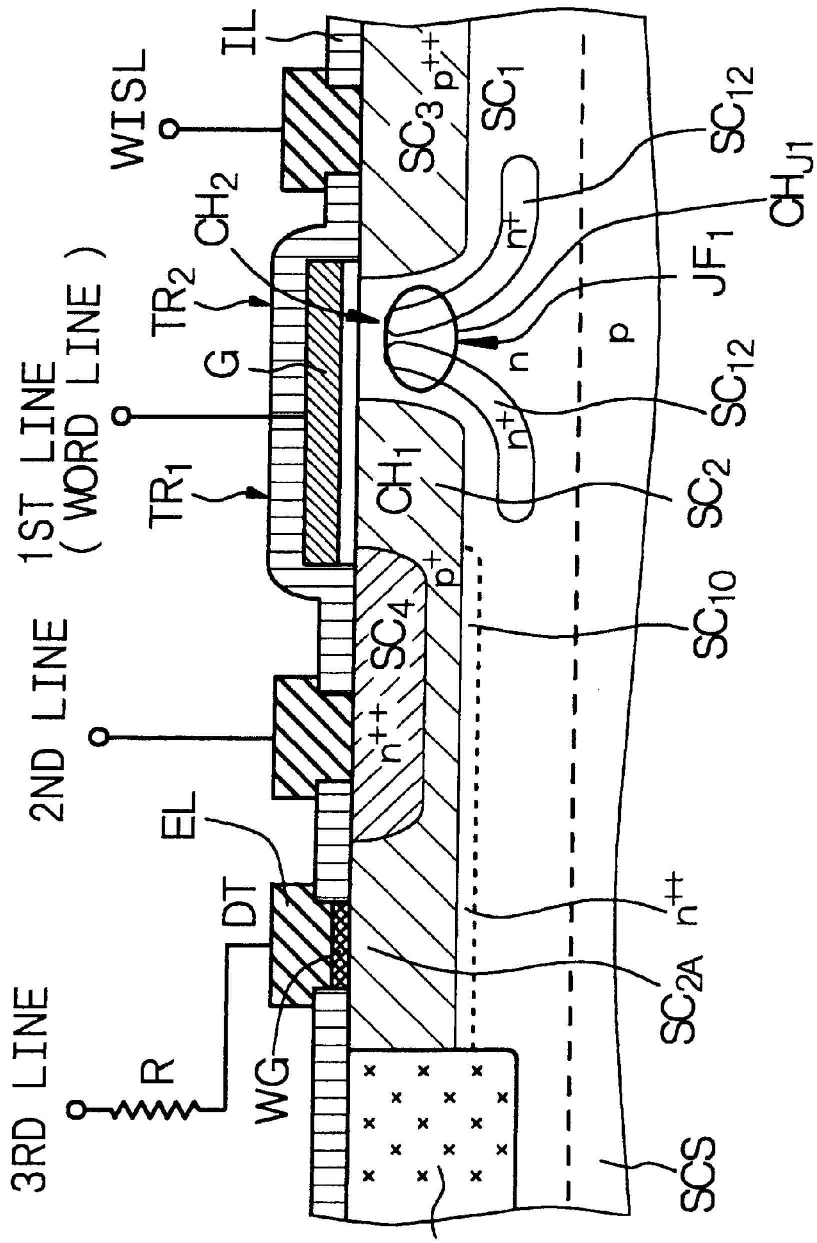
FIG. 70 shows a schematic partial cross-sectional view of a variant of the semiconductor memory cell of Example 7.

In the semiconductor memory cell shown in FIG. 70, a first conductivity type region $SC_{12}$ is formed by ion-implanting an impurity having the first conductivity type to the channel region $CH_{J1}$ of the junction-field-effect transistor $JF_1$ by an oblique ion-implanting method. In this manner, the impurity concentration of the channel region $CH_{J1}$ can be controlled, and the performance of the junction-field-effect transistor $JF_1$ can be stabilized. A constitution including the formation of the first conductivity type region $SC_{12}$ can be applied to various semiconductor memory cells of the present invention although it differs depending upon the layout of the first region $SC_1$, the second region $SC_2$ and the third region $SC_3$.

Figure 66A:
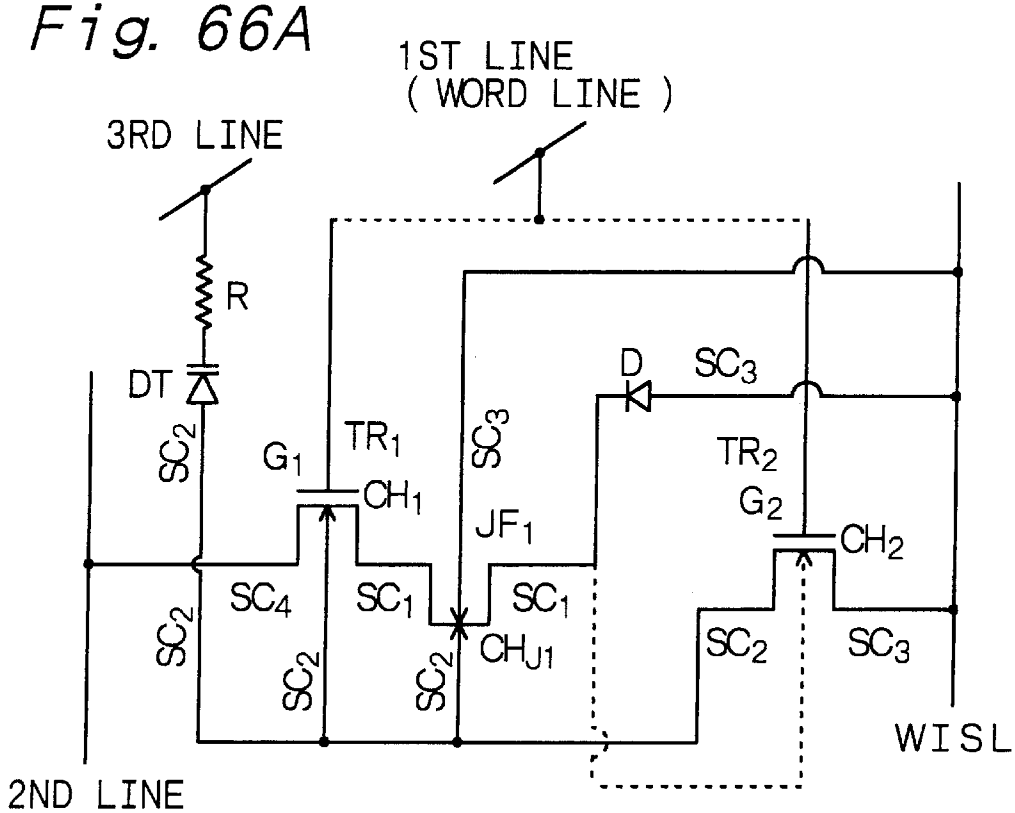
FIGS. 66A and 66B show the principle of variants of the semiconductor memory cell according to the fifth aspect of the present invention.
Figure 66B:
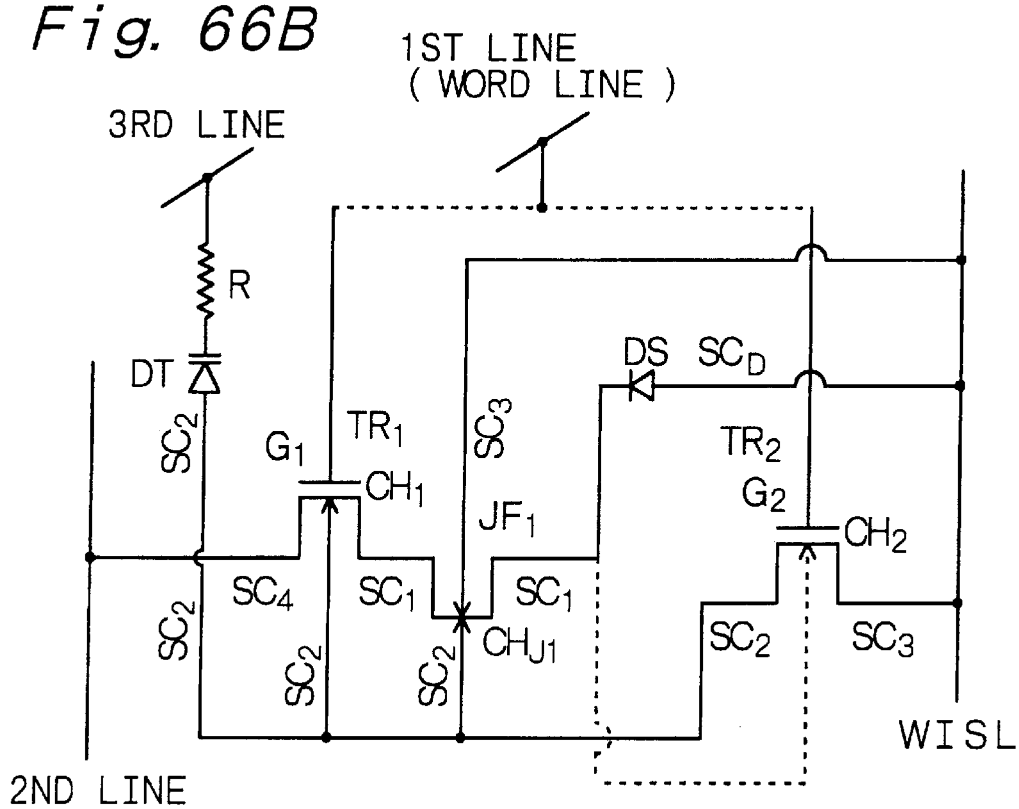
Figure 71:
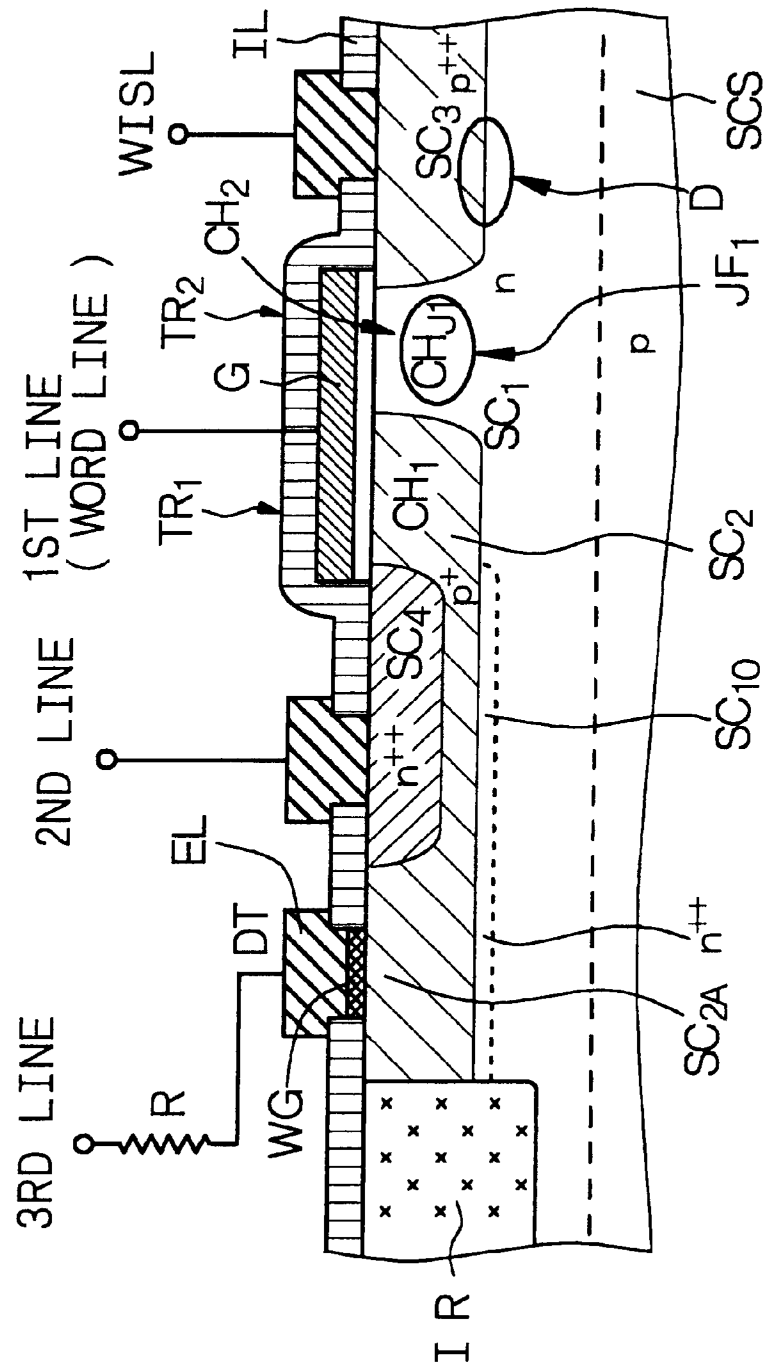
FIG. 71 shows a schematic partial cross-sectional view of a variant of the semiconductor memory cell of Example 7.

In the semiconductor memory cell shown in the drawing of the principle of FIG. 66A and the schematic partial cross-sectional view of FIG. 71, the first region $SC_1$ and the third region $SC_3$ constitute a pn junction diode D, and the first region $SC_1$ is connected to the write-in information setting line WISL through the third region $SC_3$. The above pn junction diode D can be formed by adjusting the impurity concentrations of the first region $SC_1$ and the third region $SC_3$ to proper values. Further, in the semiconductor memory cell shown in the drawing of the principle of FIG. 66B, the schematic partial cross-sectional view of FIG. 72A and the schematic layout of FIG. 72A, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In these cases, it is preferred to employ a constitution in which the second line is used as a bit line, or a constitution in which the write-in information setting line WISL is used as a bit line as well and a second predetermined potential is applied to the second line.

Figure 72A:
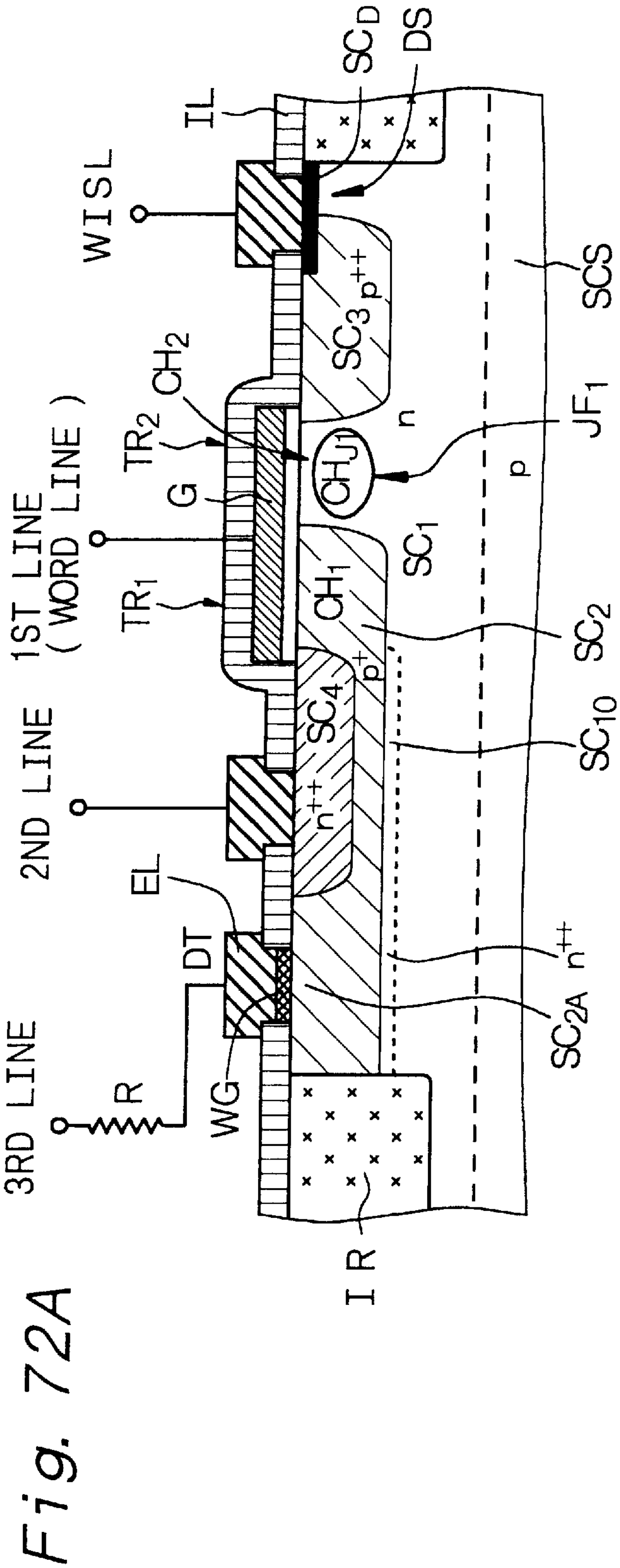
FIG. 72A shows a schematic partial cross-sectional view of a variant of the semiconductor memory cell of Example 7.
Figure 72B:
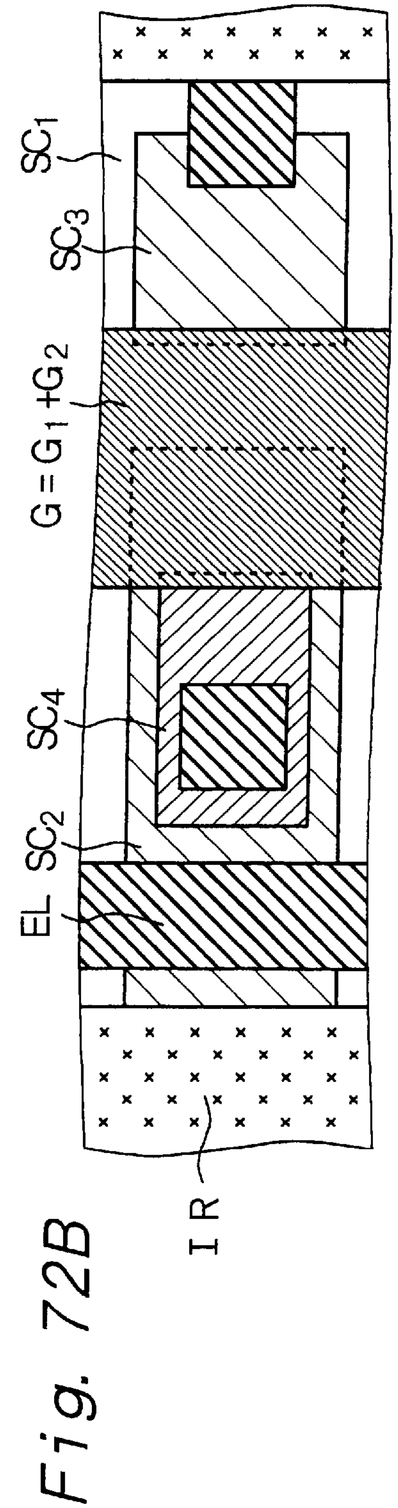
FIG. 72B shows a schematic plan view of layout of regions thereof.
Figure 73A:
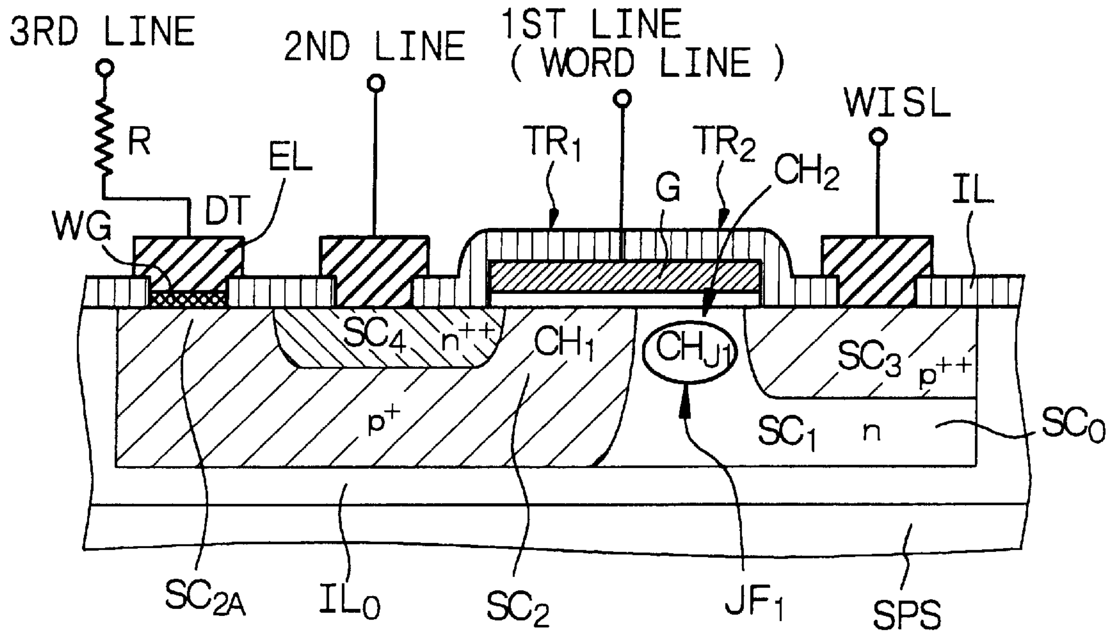
FIGS. 73A and 73B show schematic partial cross-sectional views of variants of the semiconductor memory cell of Example 7.
Figure 73B:
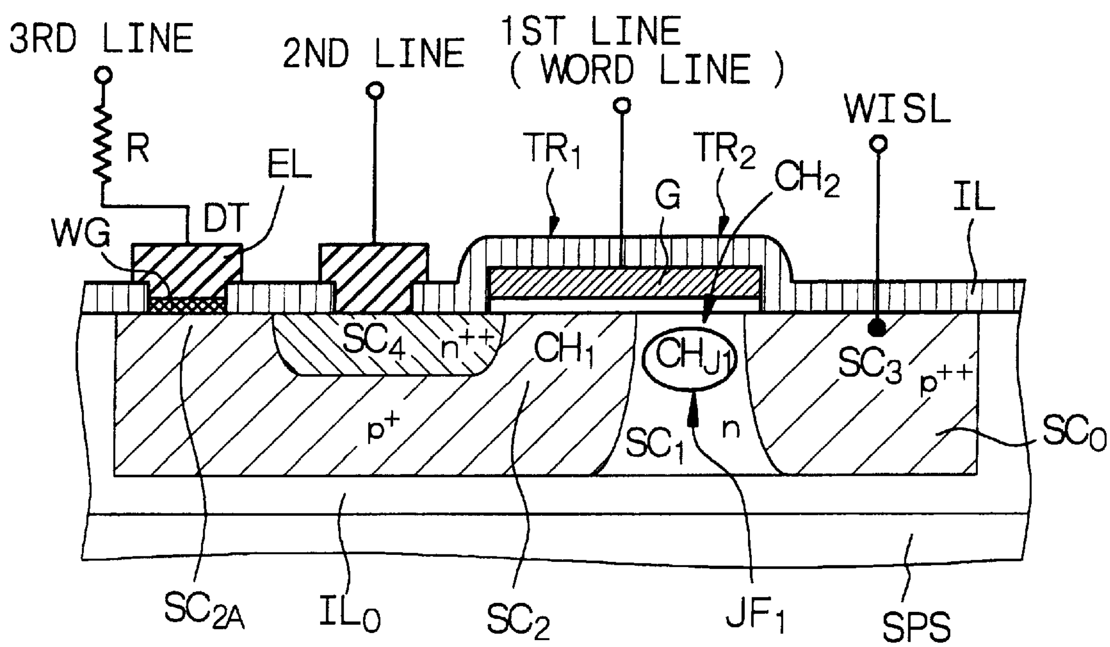
Figure 74:
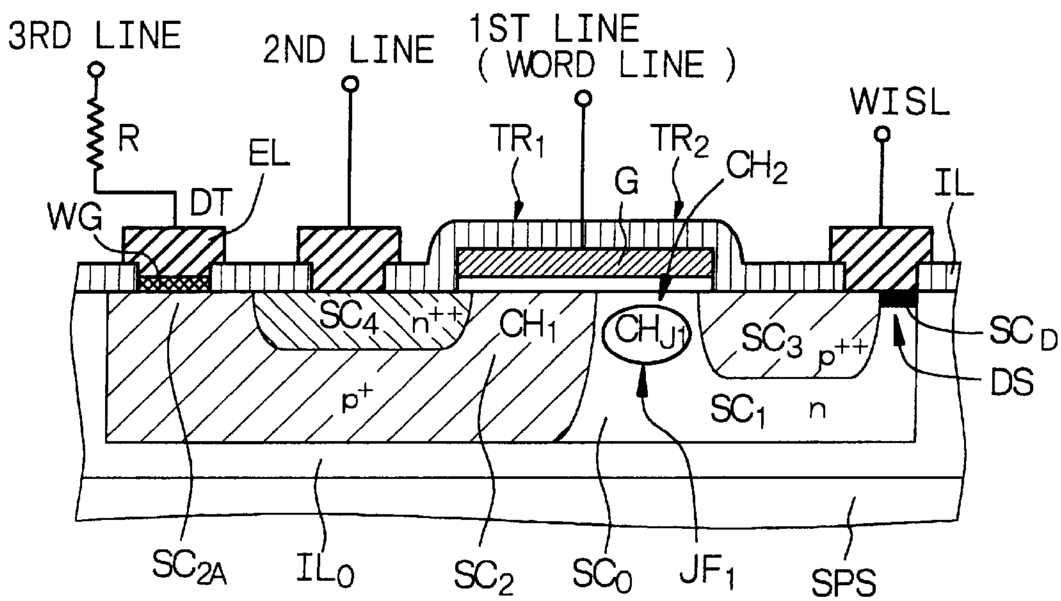
FIG. 74 shows a schematic partial cross-sectional view of a variant of the semiconductor memory cell of Example 7.

In the variants shown in FIGS. 73A and 73B, the semiconductor memory cell structured as shown in FIG. 69 is formed in a semiconductor layer $SC_0$ surrounded by an insulation material layer $IL_0$ on a supporting substrate SPS. The difference between the semiconductor memory cell shown in FIG. 73A and the semiconductor memory cell shown in FIG. 73B is how far the third region $SC_3$ extends downwardly. When the semiconductor memory cell structured as shown in FIG. 73B is employed, an electrode from a side of the third region $SC_3$ to the write-in information setting line WISL can be taken out. These semiconductor memory cells are substantially structurally the same as the semiconductor memory cell shown in FIG. 69 in other points. In the variant shown in FIG. 74, the semiconductor memory cell structured as shown in FIGS. 72A and 72B is formed in a semiconductor layer $SC_0$ surrounded by an insulation material layer $IL_0$ on a supporting substrate SPS. The semiconductor memory cell shown in FIG. 74 is substantially structurally the same as the semiconductor memory cell shown in FIG. 72 in other points. The semiconductor memory cells having the above structures can be manufactured according to the already explained method of manufacturing an SOI structure or a TFT structure.

Figure 75A:
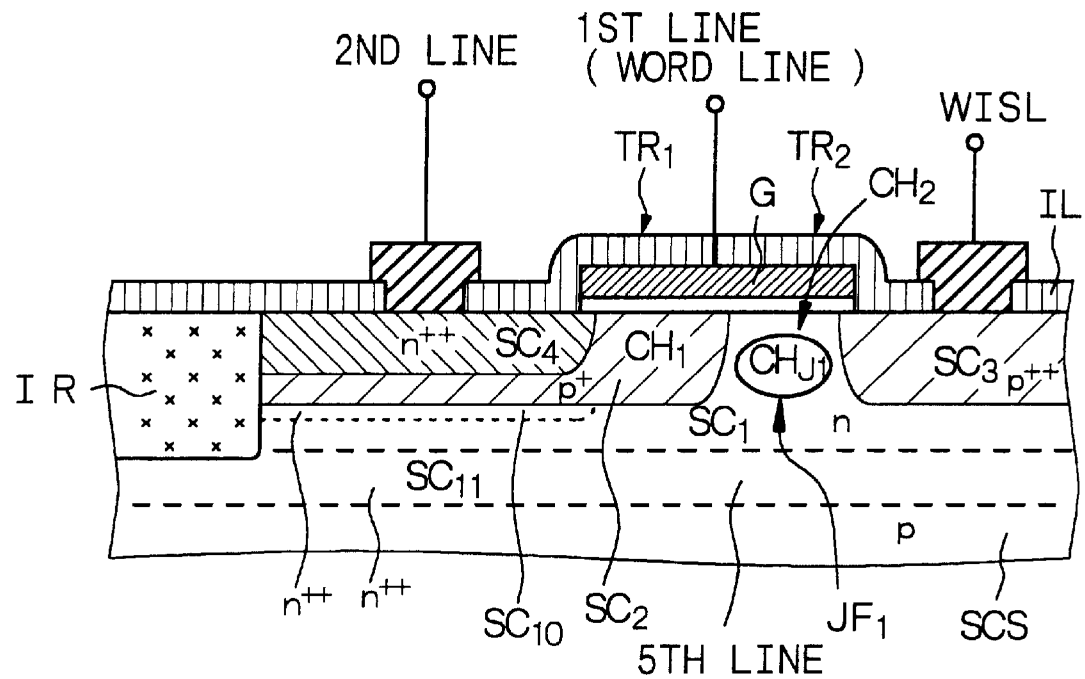
FIG. 75A shows a schematic partial cross-sectional view of a variant of the semiconductor memory cell of Example 7.
Figure 75B:
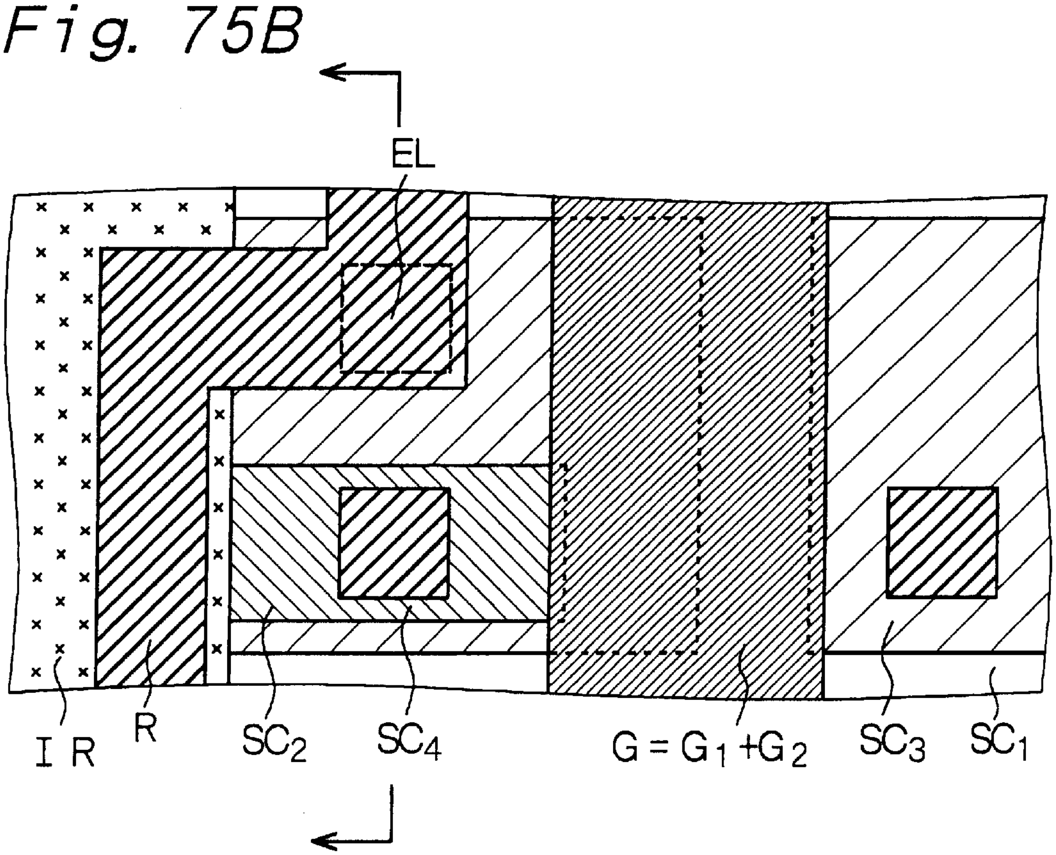
FIG. 75B shows a schematic plan view of layout of regions thereof.
Figure 76:
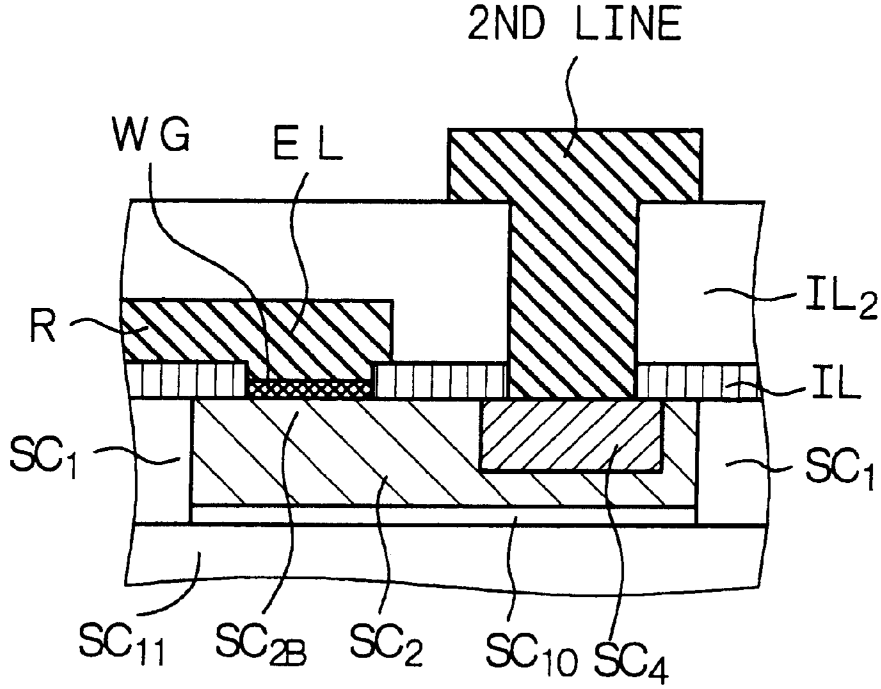
FIG. 76 shows another schematic partial cross-sectional view of the variant shown in FIGS. 75A and 75B, prepared by cutting the variant with a different plane.

The semiconductor memory cell of Example 7 shown in FIGS. 69A and 69B can be modified as shown in FIGS. 75A, 75B and 76. FIG. 75A shows a schematic partial cross-sectional view of the semiconductor memory cell, FIG. 75B shows a schematic layout of regions, and FIG. 76 shows a schematic partial cross-sectional view taken along arrows in FIG. 75B. In the above semiconductor memory cell, a portion $SC_{2B}$ of the second region $SC_2$ extends up to a surface of the semiconductor substrate beside the fourth region $SC_4$. The extending portion $SC_{2B}$ of the second region $SC_2$ corresponds to one end of the MIS type diode DT. The electrode EL constituting the other end of the MIS type diode DT is formed on the extending portion $SC_{2B}$ of the second region $SC_2$ through the wide gap thin film WG. The high-resistance element R integrally extends from the electrode EL. The electrode EL and the high-resistance element R are composed of a polysilicon thin layer containing an impurity having the first conductivity type (for example, n-type). The second line (for example, bit line) is formed on a second insulating interlayer $IL_2$ and extends in the direction perpendicular to the paper surface of FIG. 76. The second region $SC_2$ structure shown in FIGS. 75A, 75B and 76 can be applied to various variants of the semiconductor memory cell of the present invention.

Figure 67:
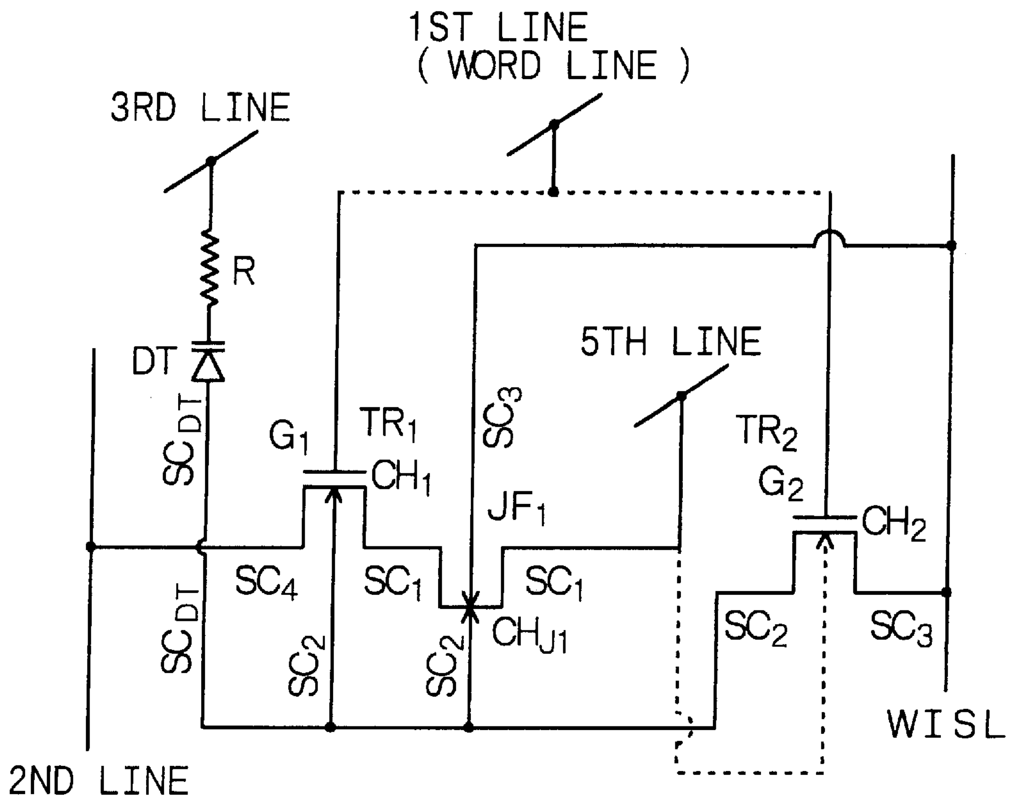
FIG. 67 shows the principle of a variant of the semiconductor memory cell according to the fifth aspect of the present invention.
Figures 77A, 77B, 77C:
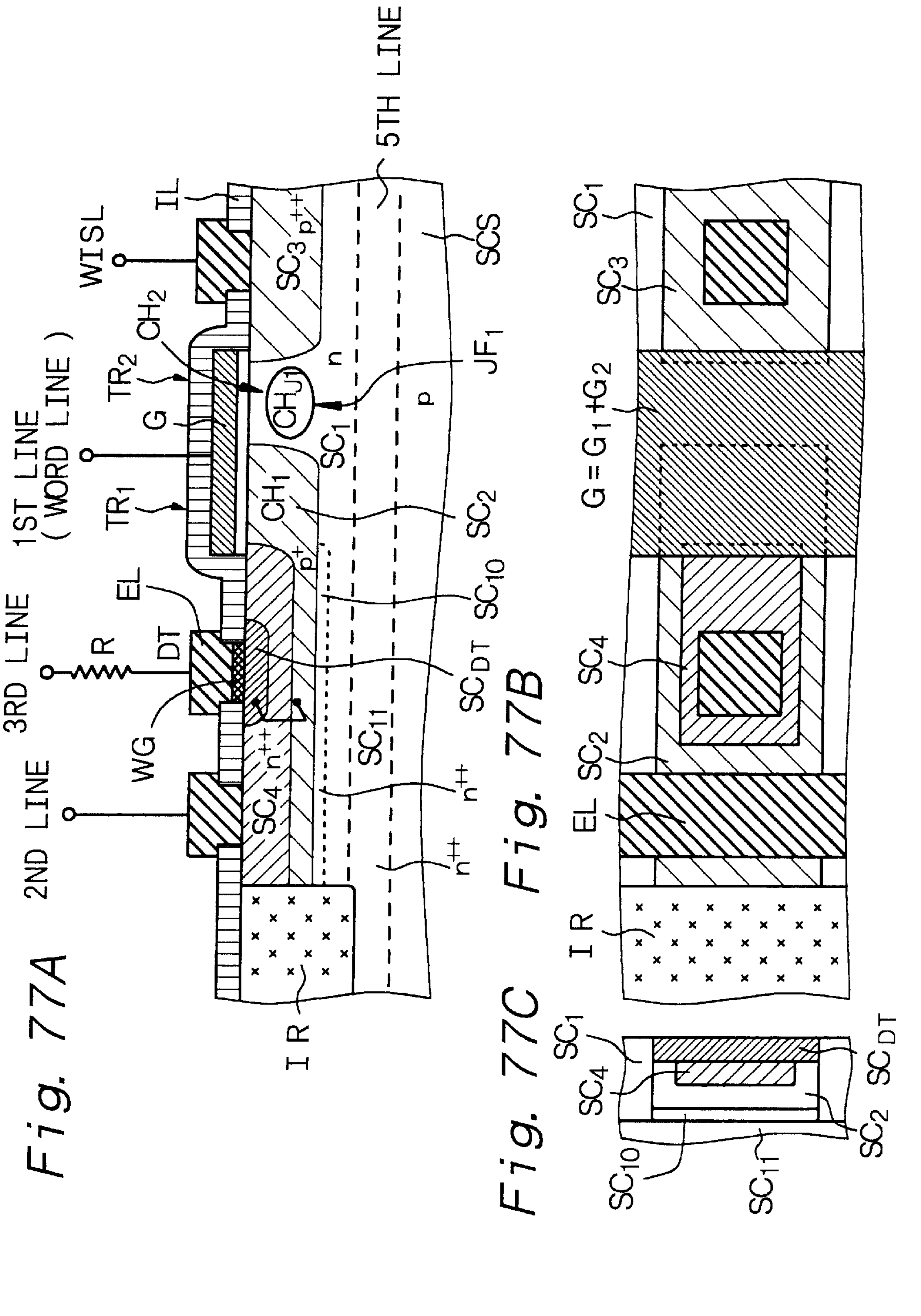
FIG. 77A shows a schematic partial cross-sectional view of a variant of the semiconductor memory cell of Example 7.
FIG. 77B shows a schematic plan view of layout of regions thereof.
FIG. 77C shows another schematic partial cross-sectional view of the regions thereof taken along some plane perpendicular to the cross section shown in FIG. 77A.

As is shown in the principle drawing of FIG. 67, the schematic partial cross-sectional view of FIG. 77A and the schematic layout of FIG. 77B, there may be employed a constitution in which a semi-conductive MIS-type-diode constituting region $SC_{DT}$ having the second conductivity type (for example, $p^+$-type) is formed in a surface region of the fourth region $SC_4$ and the MIS-type-diode constituting region $SC_{DT}$ and the second region $SC_2$ are connected to each other. In the MIS type diode DT, one end thereof is formed of the MIS-type-diode constituting region $SC_{DT}$ which corresponds to an extending portion of the channel forming region $CH_1$ of the first transistor $TR_1$ or an extending portion of the second region $SC_2$, and an electrode EL constituting the other end thereof is formed so as to be opposed to the MIS-type-diode constituting region $SC_{DT}$ constituting one end of the MIS type diode DT through the wide gap thin film and is composed of a conductive material.

The MIS-type-diode constituting region $SC_{DT}$ and the second region $SC_2$ can be connected to each other, for example, by forming a structure in which a portion of the second region $SC_2$ is extended to a vicinity of the surface of the semiconductor substrate so that the MIS-type-diode constituting region $SC_{DT}$ and the extending portion of the second region $SC_2$ are in contact with each other outside the fourth region $SC_4$, as is shown in the schematic partial cross-sectional view of FIG. 77C. The above MIS-type-diode constituting region $SC_{DT}$ corresponds to the extending portion of the channel forming region $CH_1$ of the first transistor $TR_1$ or the extending portion of the second region $SC_2$. When the semiconductor memory cell is structured as described above, the wiring structure of the semiconductor memory cell can be simplified.

Figure 78:
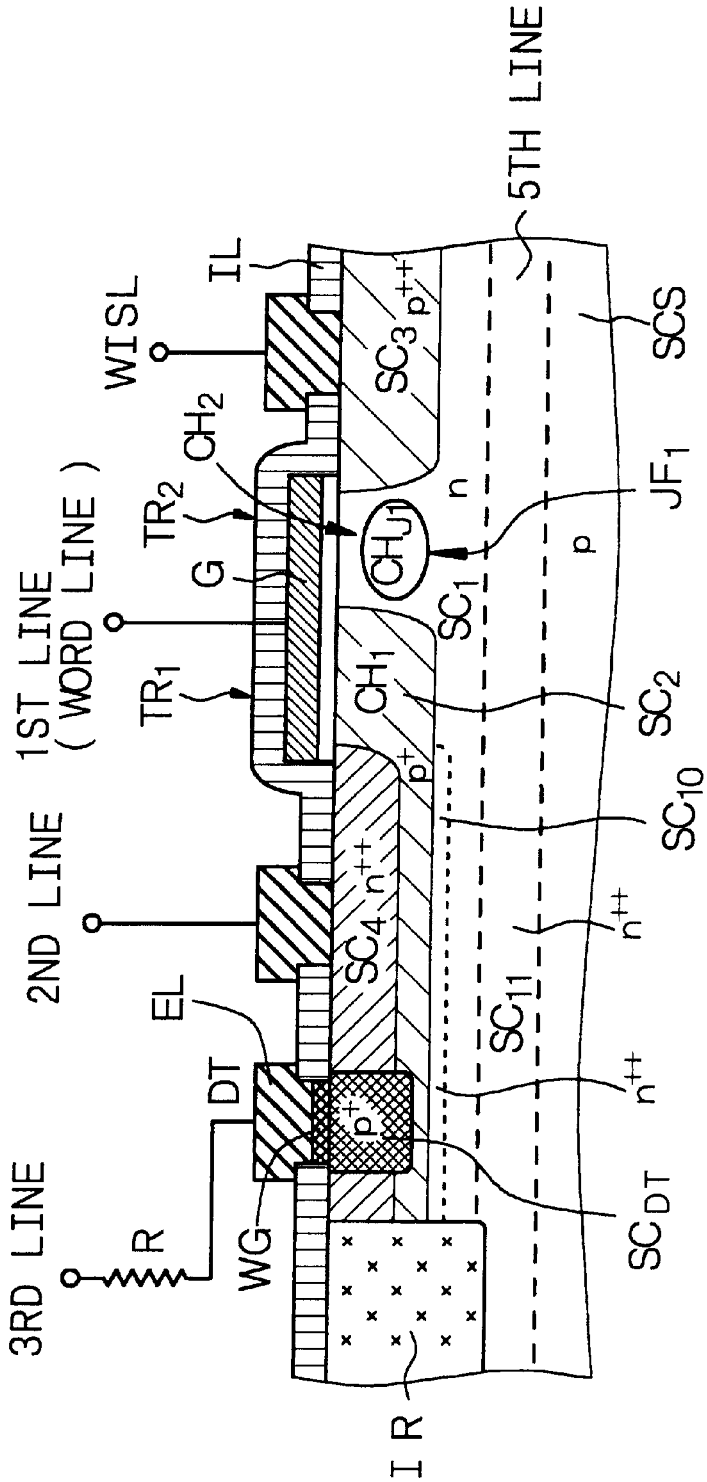
FIG. 78 shows a schematic partial cross-sectional view of a variant of the semiconductor memory cell of Example 7.

In a semiconductor memory cell shown in the schematic partial cross-sectional view of FIG. 78, a MIS-type-diode constituting region $SC_{DT}$ having the second conductivity type (for example, $p^+$-type) is formed in a buried plug form, and the MIS-type-diode constituting region $SC_{DT}$ through the fourth region $SC_4$ until it reaches the second region $SC_2$. The above MIS-type-diode constituting region $SC_{DT}$ corresponds to the extending portion of channel forming region $CH_1$ of the first transistor $TR_1$ or the extending portion of the second region $SC_2$. In the above structure, the MIS-type-diode constituting region $SC_{DT}$ and the second region $SC_2$ can be connected to each other as well. The semiconductor memory cell shown in FIG. 78 can be substantially structurally the same as the semiconductor memory cell shown in FIG. 69 except for the above point.

Figure 68A:
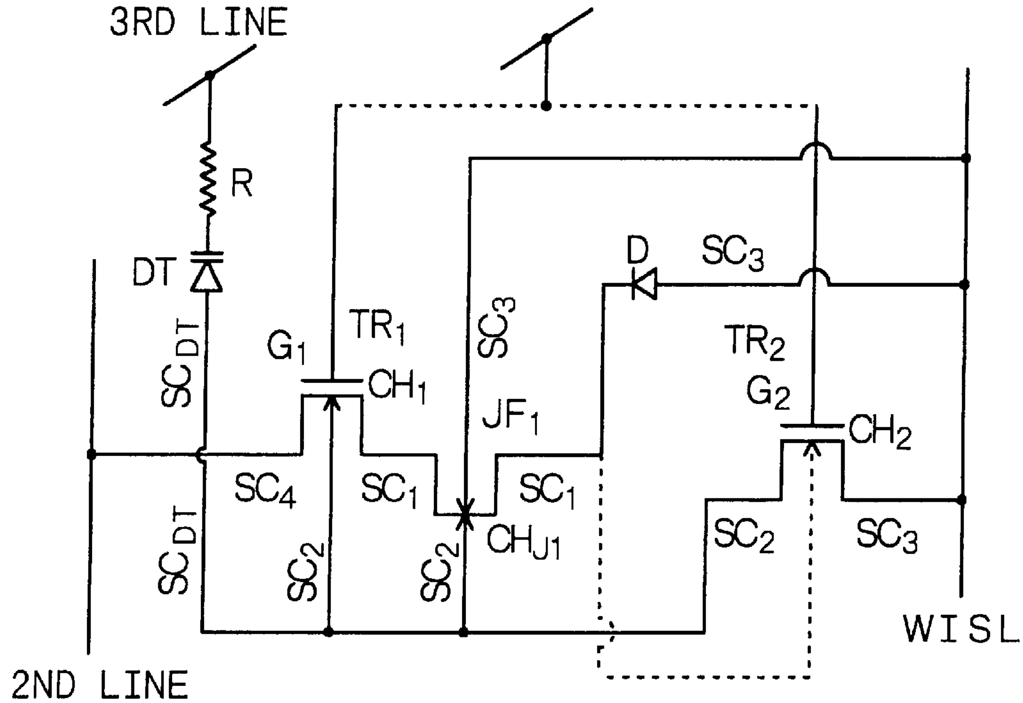
FIGS. 68A and 68B show the principle of variants of the semiconductor memory cell according to the fifth aspect of the present invention.
Figure 68B:
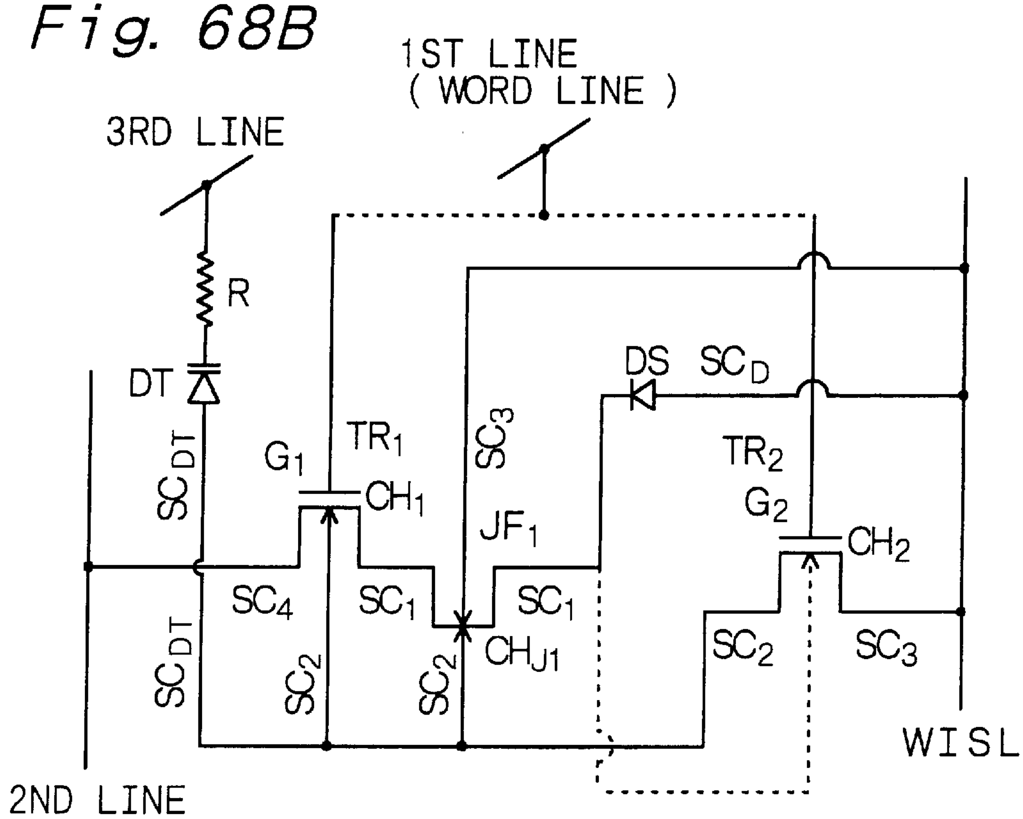
Figure 79:
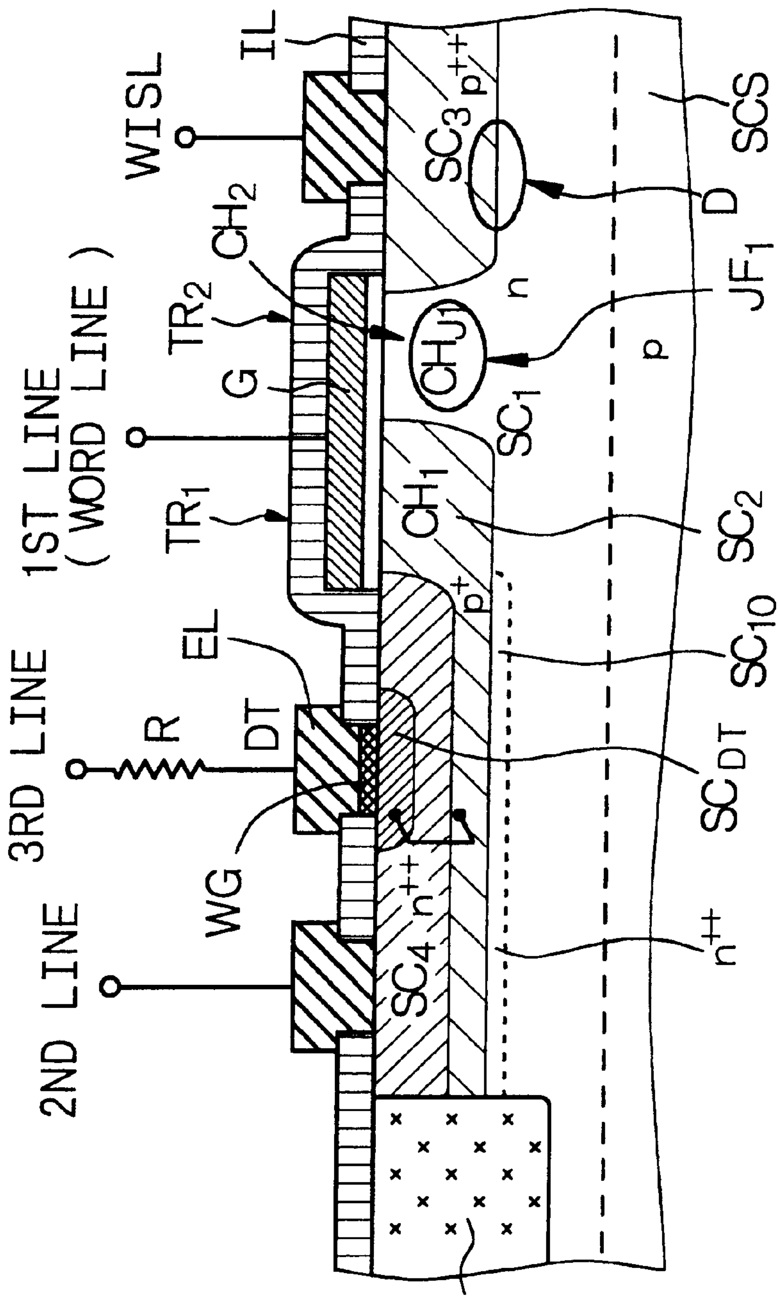
FIG. 79 shows a schematic partial cross-sectional view of a variant of the semiconductor memory cell of Example 7.
Figure 80:
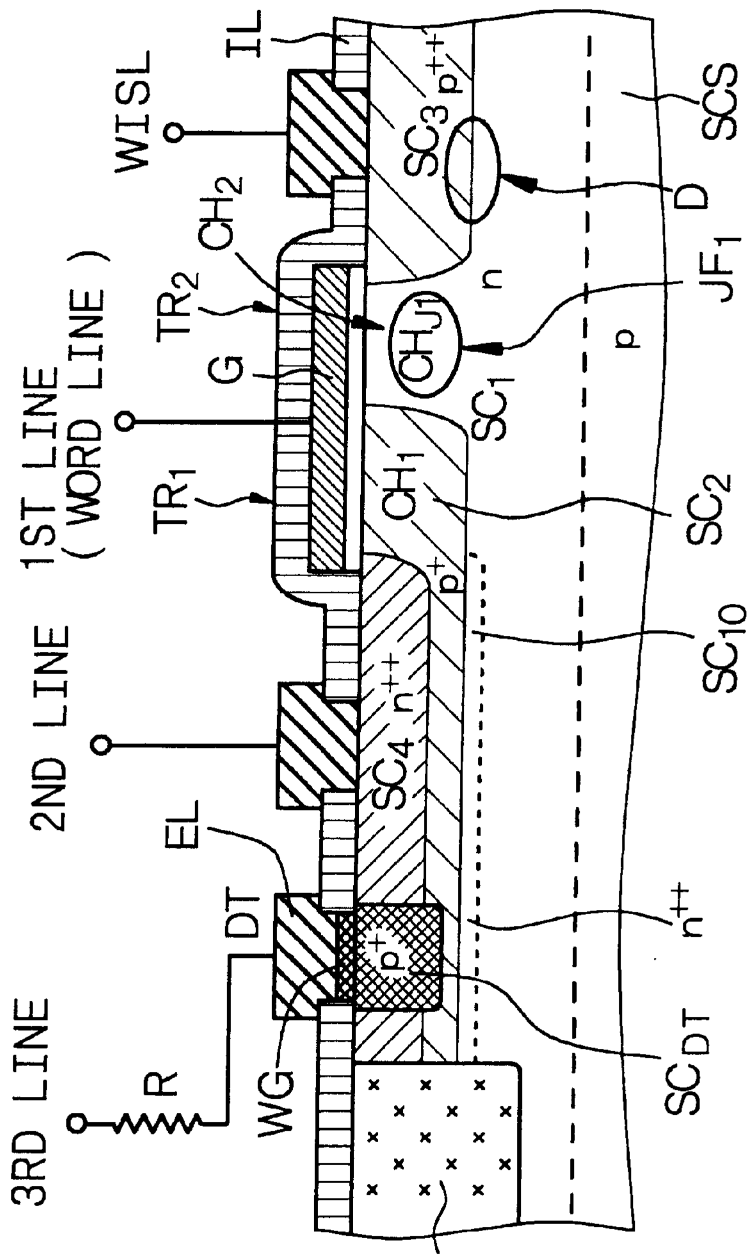
FIG. 80 shows a schematic partial cross-sectional view of a variant of the semiconductor memory cell of Example 7.
Figure 81:
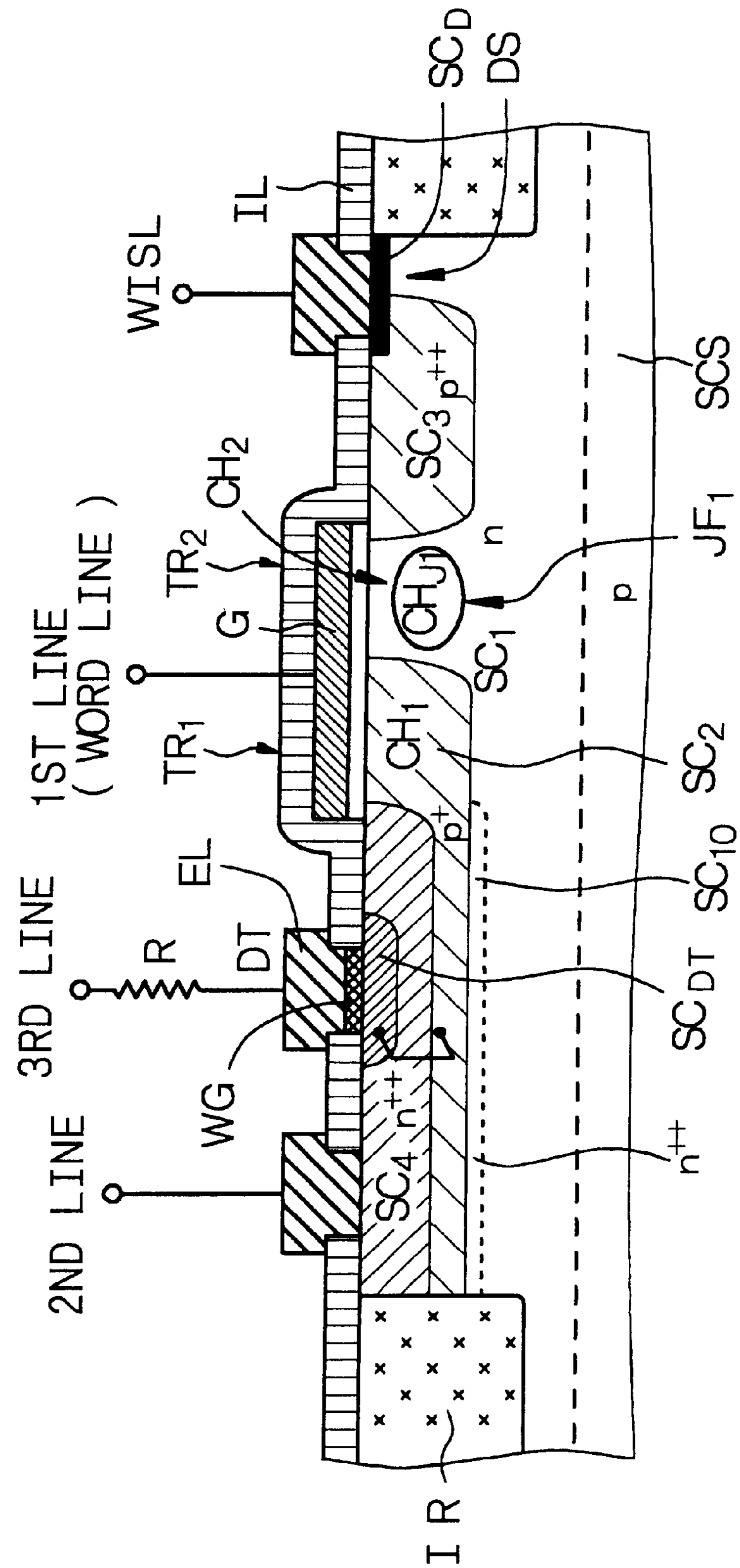
FIG. 81 shows a schematic partial cross-sectional view of a variant of the semiconductor memory cell of Example 7.
Figure 82:
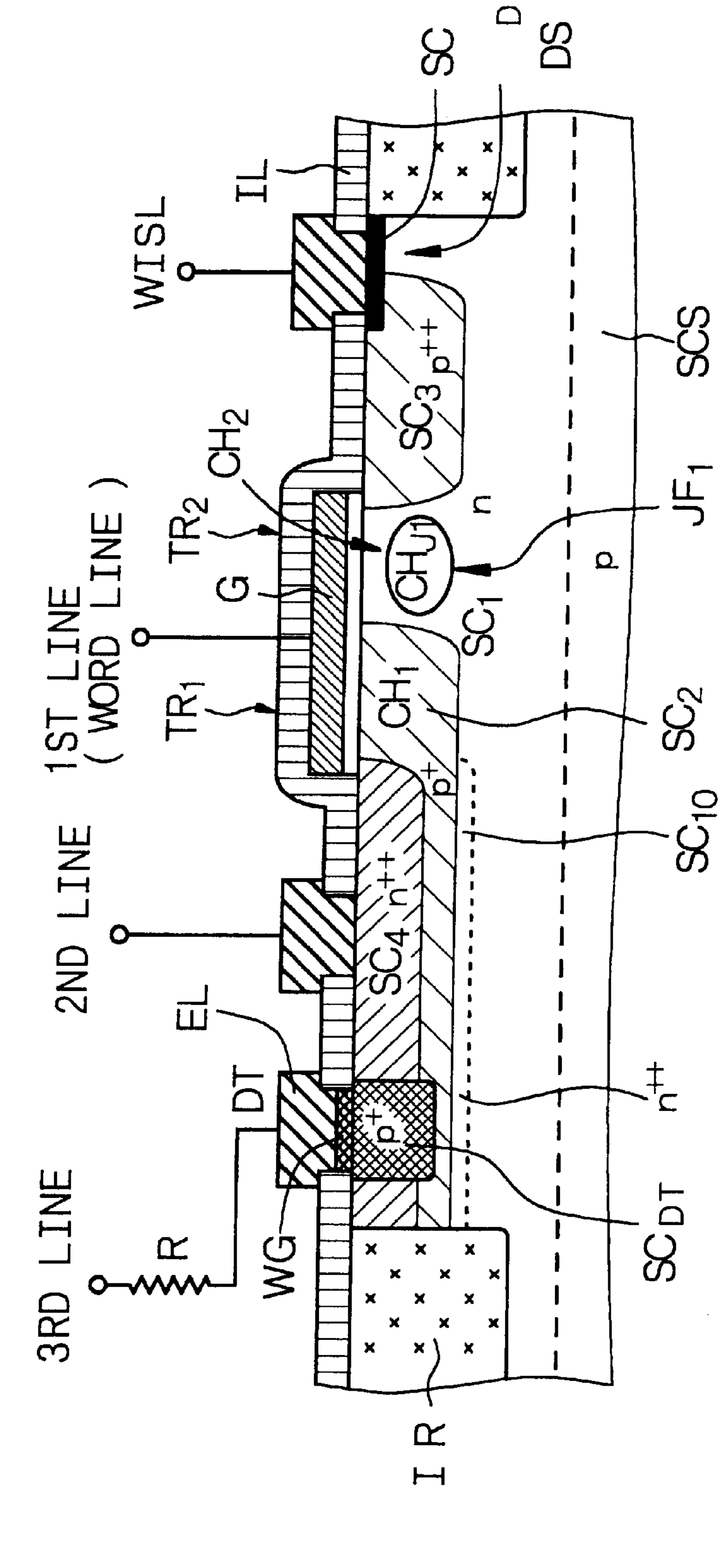
FIG. 82 shows a schematic partial cross-sectional view of a variant of the semiconductor memory cell of Example 7.
Figure 83A:
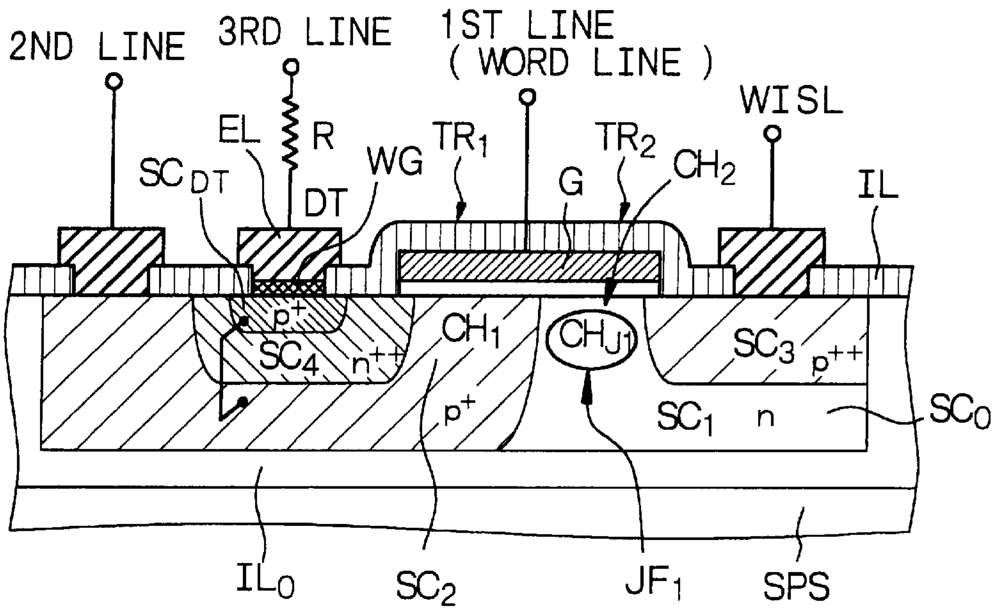
FIGS. 83A and 83B show schematic partial cross-sectional views of variants of the semiconductor memory cell of Example 7.
Figure 83B:
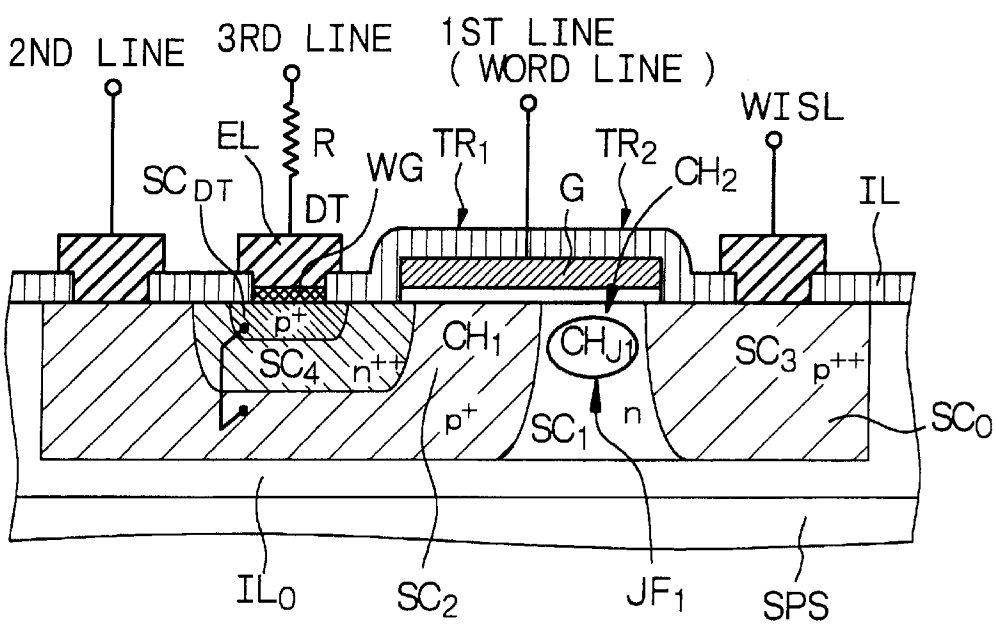
Figure 84A:
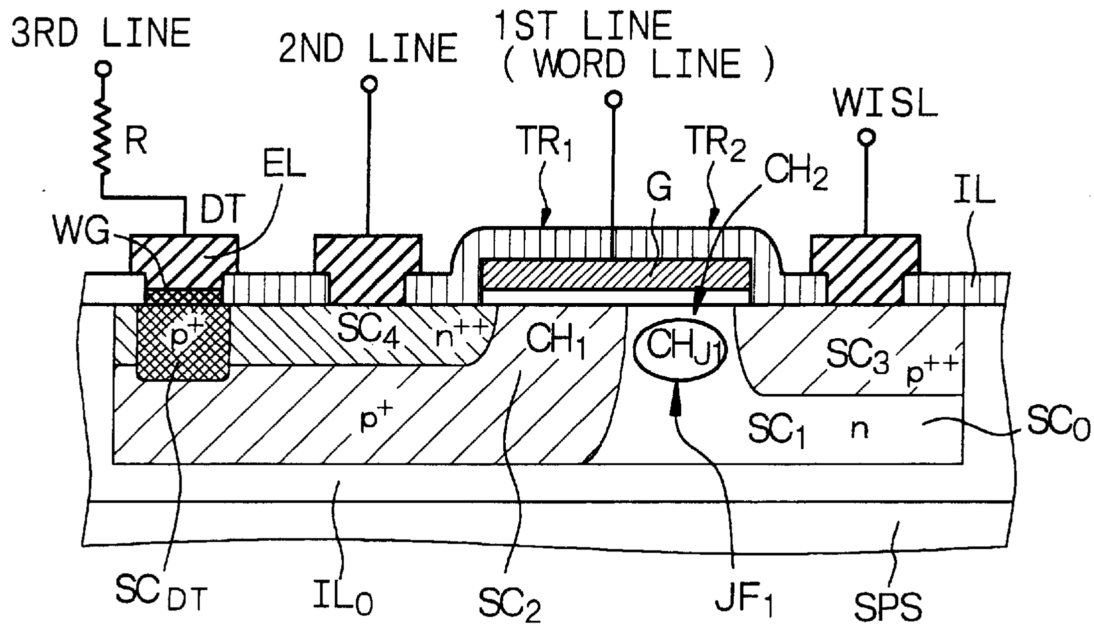
FIGS. 84A and 84B show schematic partial cross-sectional views of variants of the semiconductor memory cell of Example 7.
Figure 84B:
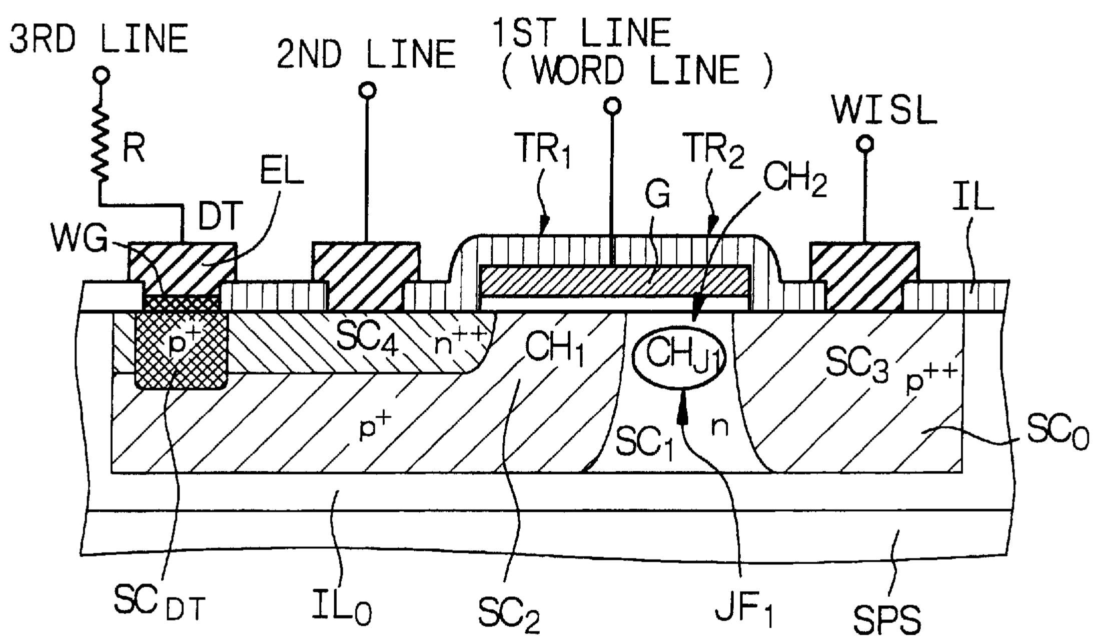
Figure 85A:
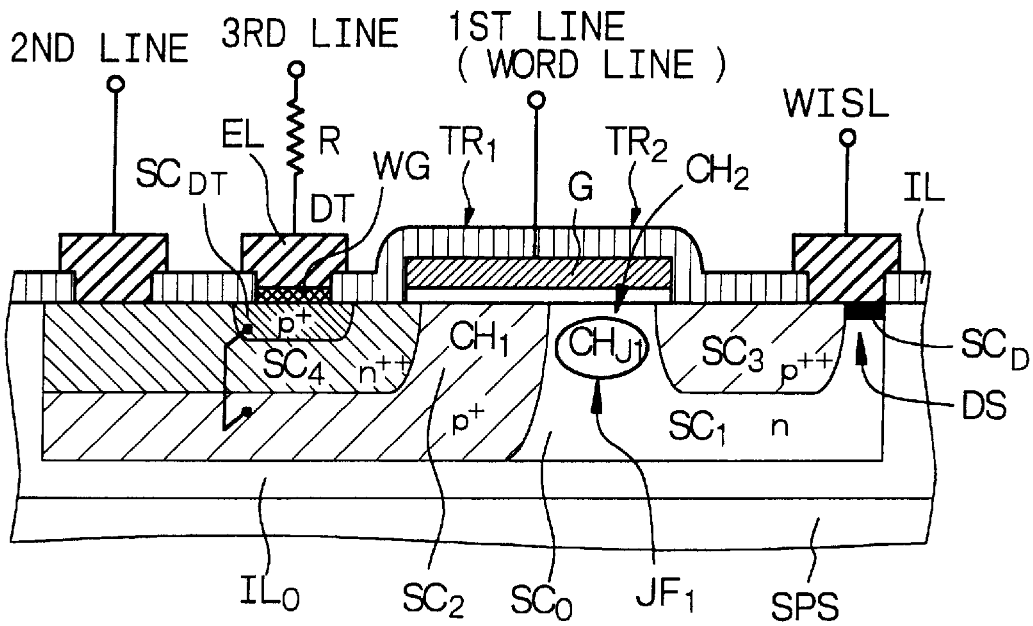
FIGS. 85A and 85B show schematic partial cross-sectional views of variants of the semiconductor memory cell of Example 7.
Figure 85B:
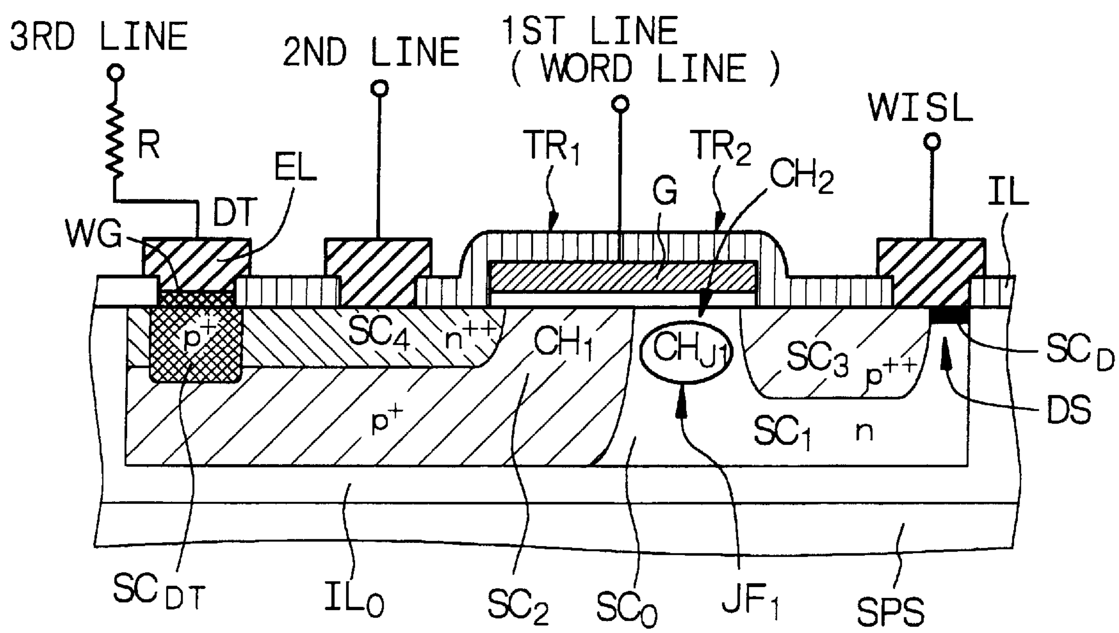

Semiconductor memory cells shown in schematic partial cross-sectional views of FIGS. 79 and 80 (see FIGS. 68A and 68B for their principle, respectively) are the variants of the semiconductor memory cell of Example 7 shown in FIG. 77 or 78, and have a constitution in which the first region $SC_1$ and the third region $SC_3$ constitute a pn junction D and the first region $SC_1$ is connected to the write-in information setting line WISL through the third region $SC_3$. Further, semiconductor memory cells shown in schematic partial cross-sectional views of FIGS. 81 and 82 are the variants of the semiconductor memory cell of Example 7 shown in FIGS. 77 and 78, and have a constitution in which further provided is a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. Further, semiconductor memory cells shown in the schematic partial cross-sectional views of FIGS. 83A and 83B are the variants of the semiconductor memory cell of Example 7 shown in FIGS. 73A and 73B, and have a constitution in which further provided is a semi-conductive MIS-type-diode constituting region $SC_{DT}$ having the second conductivity type (for example, $p^+$-type) in a surface region of the fourth region $SC_4$, and the MIS-type-diode constituting region $SC_{DT}$ is connected to the second region $SC_2$. Further, semiconductor memory cells shown in schematic partial cross-sectional views of FIGS. 84A and 84B are the variants of the semiconductor memory cell of Example 7 shown in FIGS. 73A and 73B, and have a constitution in which a MIS-type-diode constituting region $SC_{DT}$ having the second conductivity type (for example, $p^+$-type) is formed in a buried plug form and the MIS-type-diode constituting region $SC_{DT}$ penetrates through the fourth region $SC_4$ until it reaches the second region $SC_2$. Further, a semiconductor memory cell shown in the schematic partial cross-sectional view of FIG. 85A is the variant of the semiconductor memory cell of Example 7 shown in FIG. 74, and has a constitution in which further provided is a MIS-type-diode constituting region $SC_{DT}$ having the second conductivity type (for example, $p^+$-type) in a surface region of the fourth region $SC_4$ and the MIS-type-diode constituting region $SC_{DT}$ is connected to the second region $SC_2$. Further, a semiconductor memory cell shown in the schematic partial cross-sectional view of FIG. 85B is the variant of the semiconductor memory cell of Example 7, shown in FIG. 74, and has a constitution in which a MIS-type-diode constituting region $SC_{DT}$ having the second conductivity type (for example, $p^+$-type) is formed in a buried plug form and the MIS-type-diode constituting region $SC_{DT}$ penetrates through the fourth region $SC_4$ until it reaches the second region $SC_2$.

Figure 86:
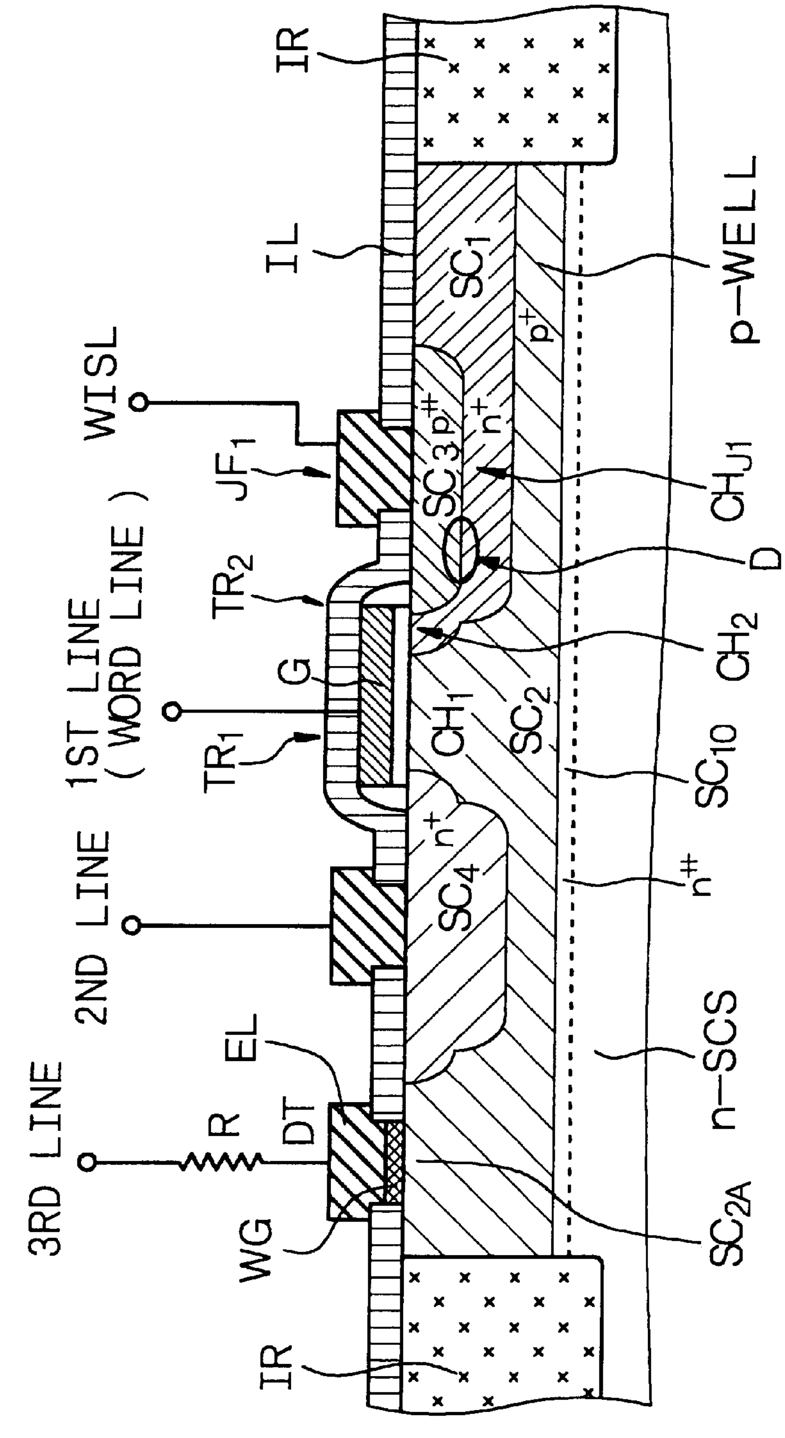
FIG. 86 shows a schematic partial cross-sectional view of a variant of the semiconductor memory cell of Example 7.

In a variant of the semiconductor memory cell shown in FIG. 86, the first region $SC_1$ and the second region $SC_2$ are in contact with each other. Specifically, the variant shown in FIG. 86 has a constitution in which the first region $SC_1$ is formed in a surface region of the second region $SC_2$, the first region $SC_1$ and the third region $SC_3$ constitute a pn junction diode D, and the first region $SC_1$ is connected to the write-in information setting line WISL through the third region $SC_3$.

Figure 87:
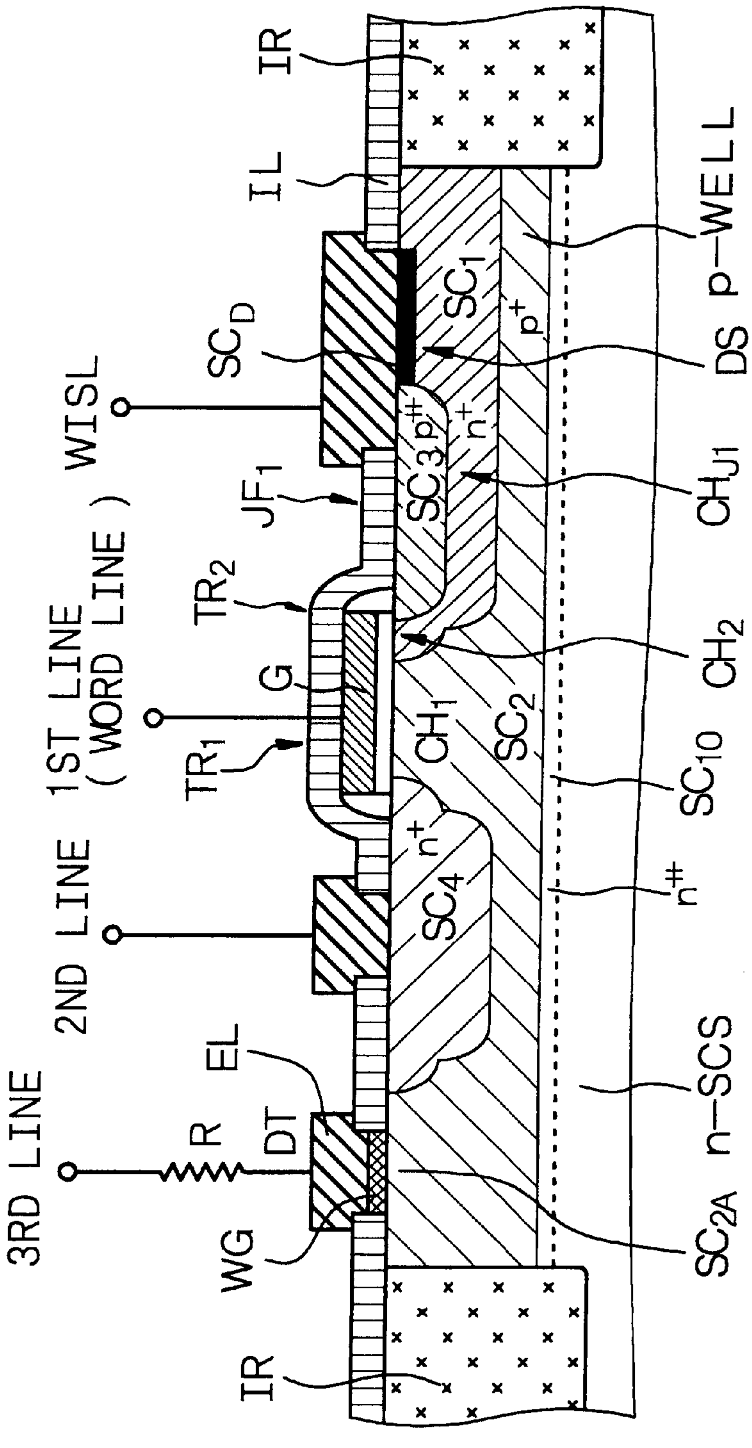
FIG. 87 shows a schematic partial cross-sectional view of a variant of the semiconductor memory cell of Example 7.

A variant of the semiconductor memory cell shown in FIG. 87 has a constitution in which the first region $SC_1$ is formed in a surface region of the second region $SC_2$, further, there is provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ form a majority carrier diode DS, and the first region $SC_1$ is connected to the write-in information setting line WISL through the diode-constituting region $SC_D$.

Figure 88:
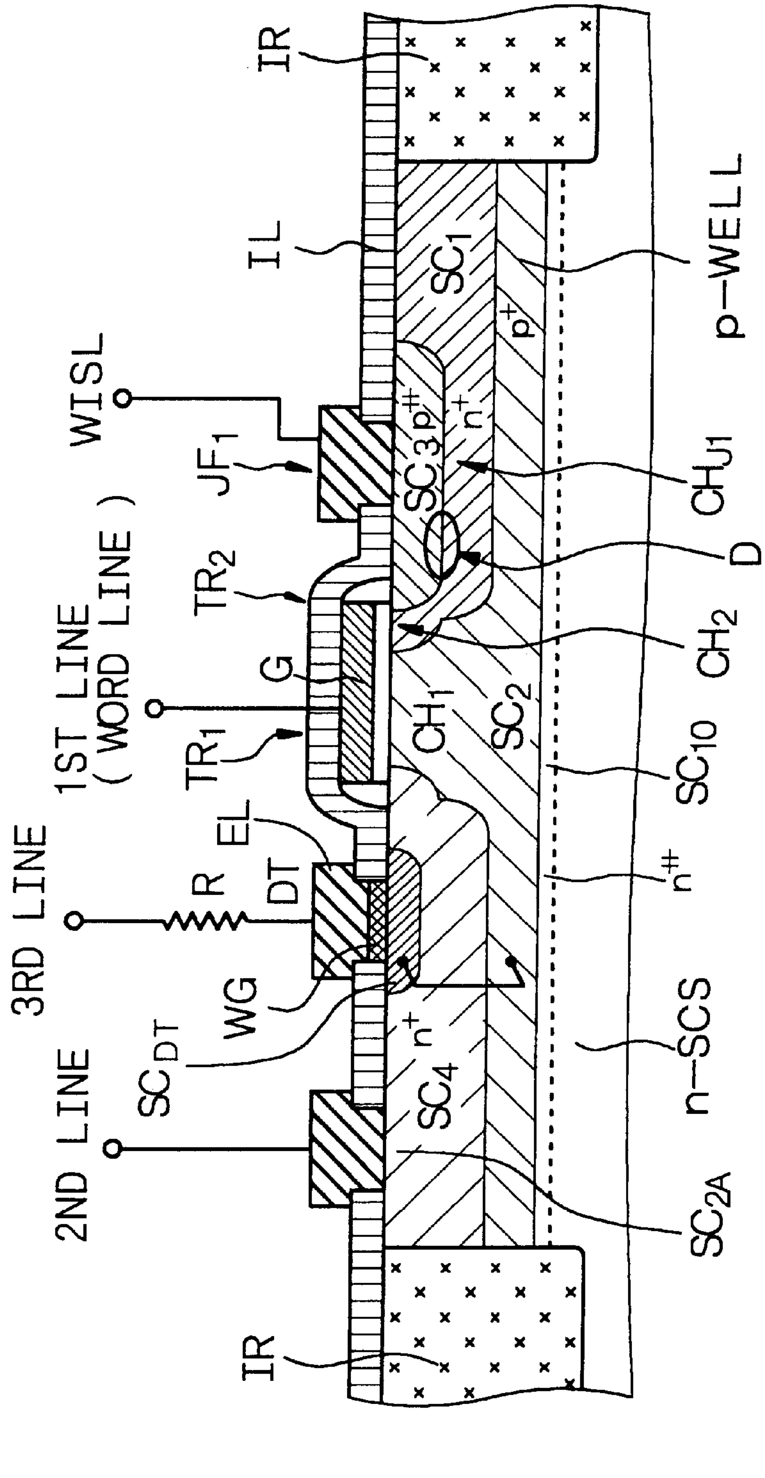
FIG. 88 shows a schematic partial cross-sectional view of a variant of the semiconductor memory cell of Example 7.
Figure 89:
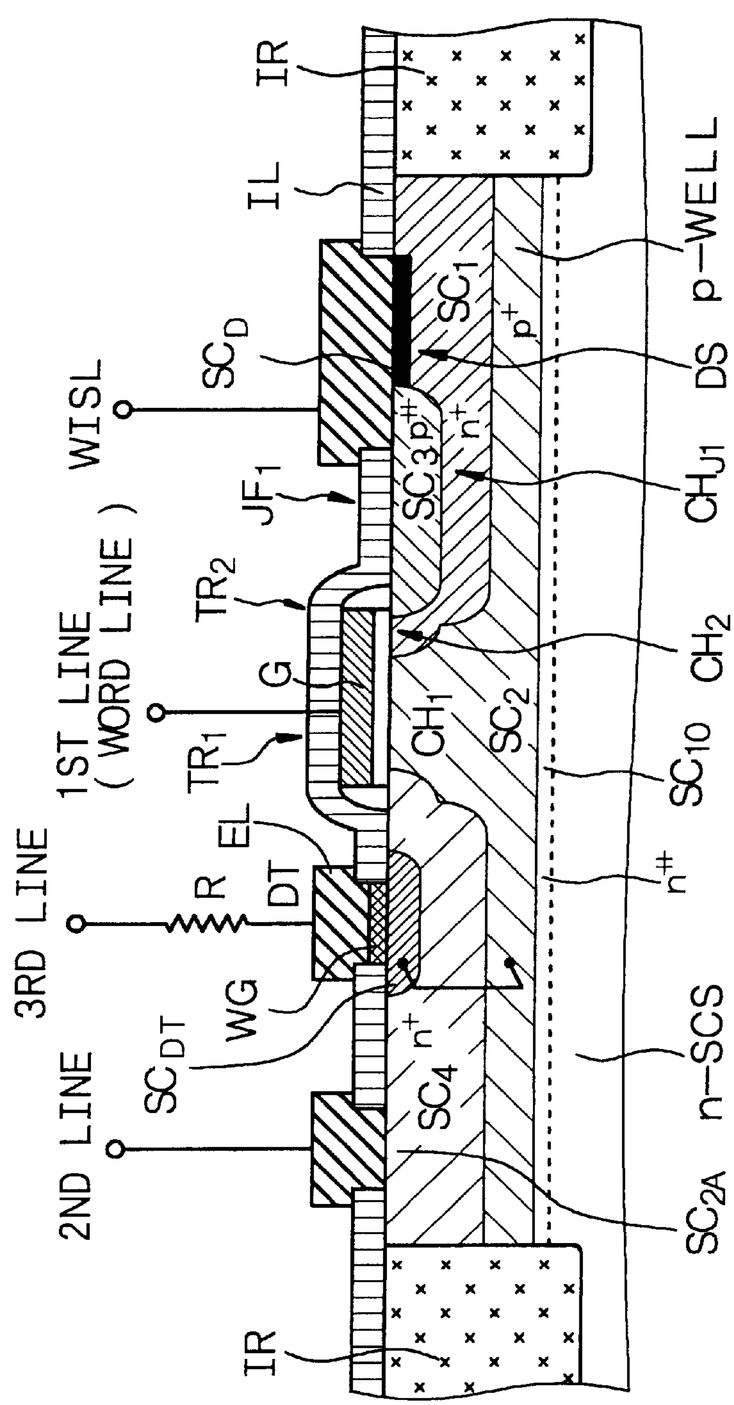
FIG. 89 shows a schematic partial cross-sectional view of a variant of the semiconductor memory cell of Example 7.

Semiconductor memory cells shown in FIGS. 88 and 89 have a constitution in which the first region $SC_1$ is formed in a surface region of the second region $SC_2$, a semi-conductive MIS-type-diode constituting region $SC_{DT}$ having a second conductivity type (for example, $p^+$ -type) is formed in a surface region of the fourth region $SC_4$, and the MIS-type-diode constituting region $SC_{DT}$ is connected to the second region $SC_2$. That is, the MIS-type-diode constituting region $SC_{DT}$ corresponds to the extending portion of the channel forming region $CH_1$ of the first transistor $TR_1$ or the extending portion of the second region $SC_2$. The semiconductor memory cell shown in FIG. 88 has a constitution in which the first region $SC_1$ and the third region $SC_3$ constitute a pn junction diode D, and the first region $SC_1$ is connected to the write-in information setting line WISL through the third region $SC_3$. The semiconductor memory cell shown in FIG. 89 has a constitution in which there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$.

Figure 90:
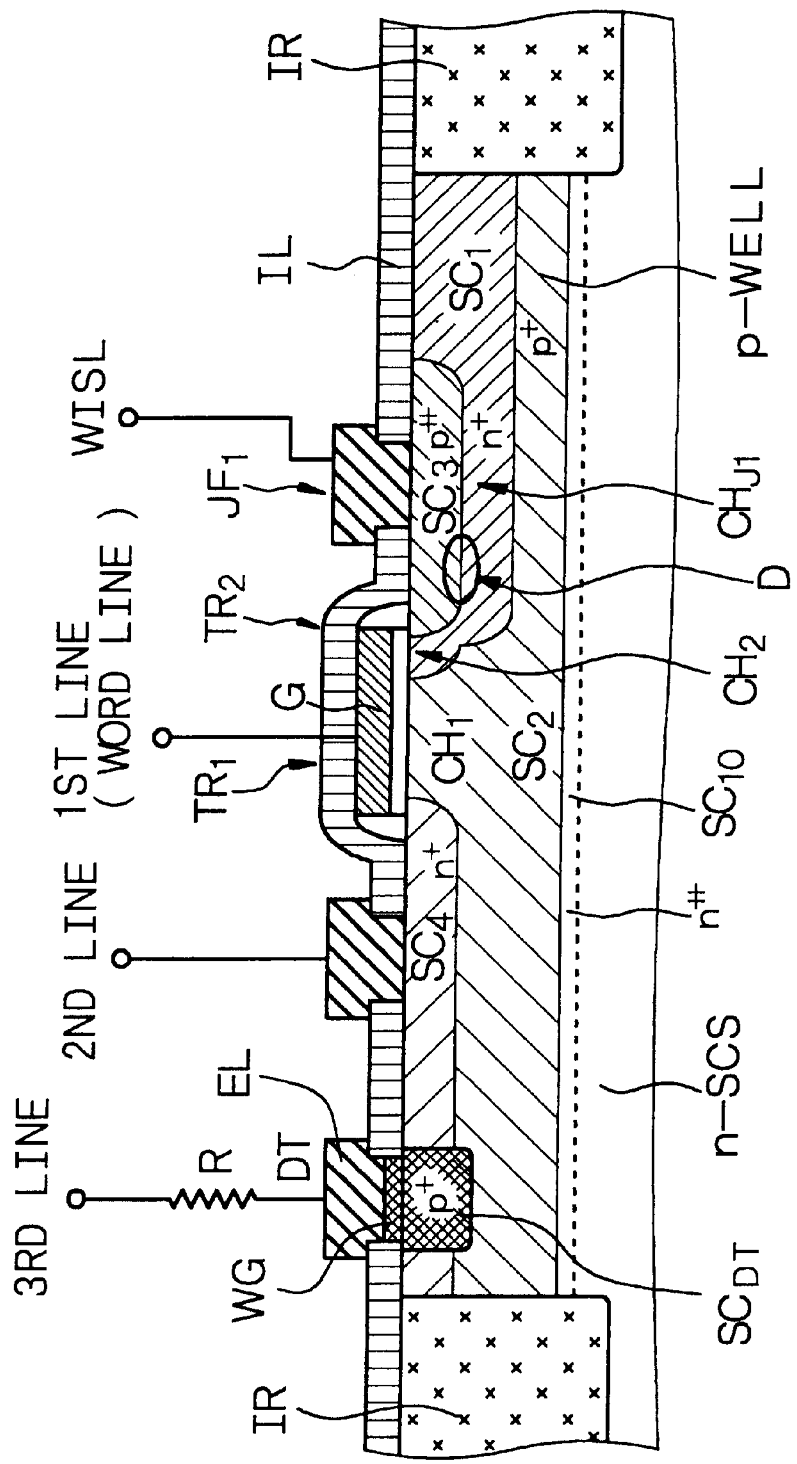
FIG. 90 shows a schematic partial cross-sectional view of a variant of the semiconductor memory cell of Example 7.
Figure 91:
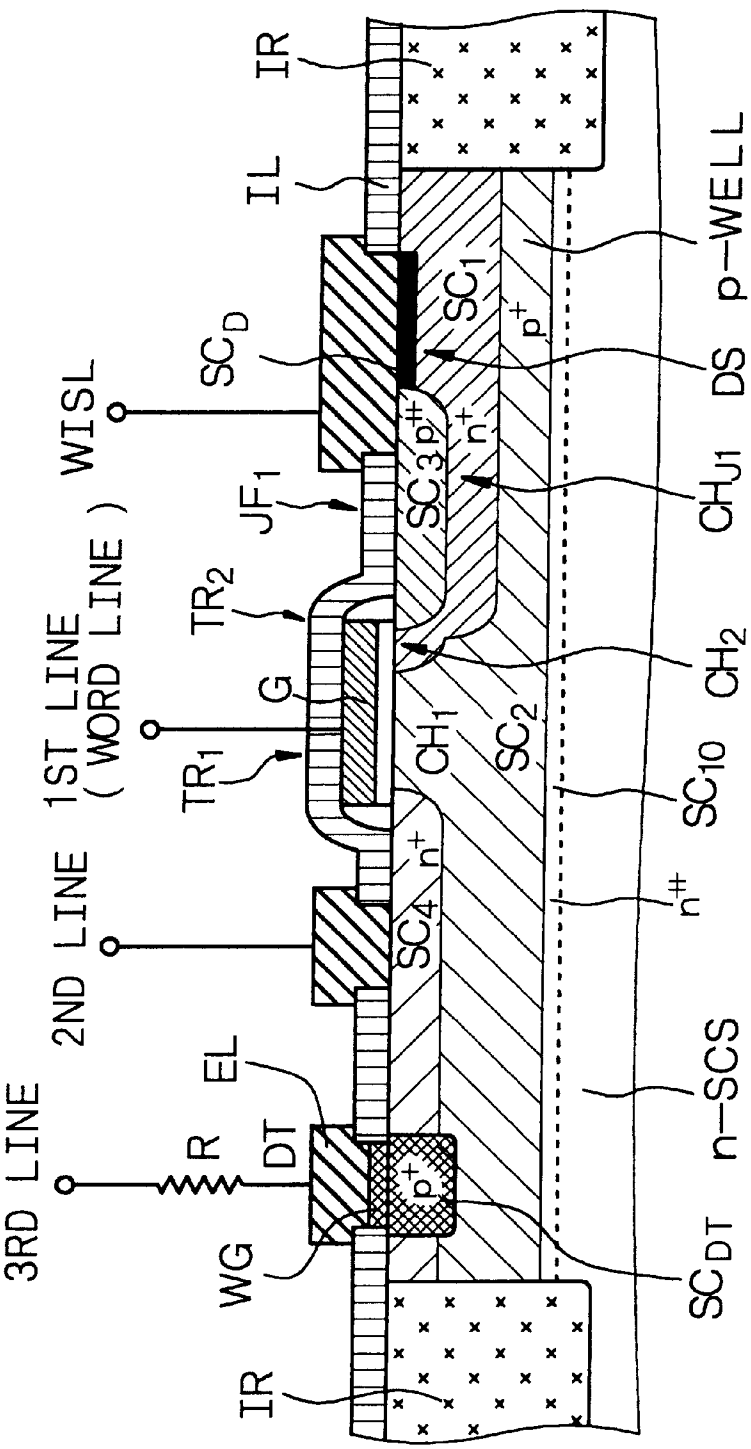
FIG. 91 shows a schematic partial cross-sectional view of a variant of the semiconductor memory cell of Example 7.

Semiconductor memory cells shown in FIGS. 90 and 91 have a constitution in which the first region $SC_1$ is formed in a surface region of the second region $SC_2$, a MIS-type-diode constituting region $SC_{DT}$ having the second conductivity type (for example, $p^+$-type) is formed in a buried plug form, and the MIS-type-diode constituting region $SC_{DT}$ penetrates through the fourth region $SC_4$ until it reaches the second region $SC_2$. That is, the above MIS-type-diode constituting region $SC_{DT}$ corresponds to the extending portion of channel forming region $CH_1$ of the first transistor $TR_1$ or the extending portion of the second region $SC_2$ as well. The semiconductor memory cell shown in FIG. 90 also has a constitution in which the first region $SC_1$ and the third region $SC_3$ constitute a pn junction diode D, and the first region $SC_1$ is connected to the write-in information setting line WISL through the third region $SC_3$. The semiconductor memory cell shown in FIG. 91 has a constitution in which there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$.

EXAMPLE 8

Figure 93A:
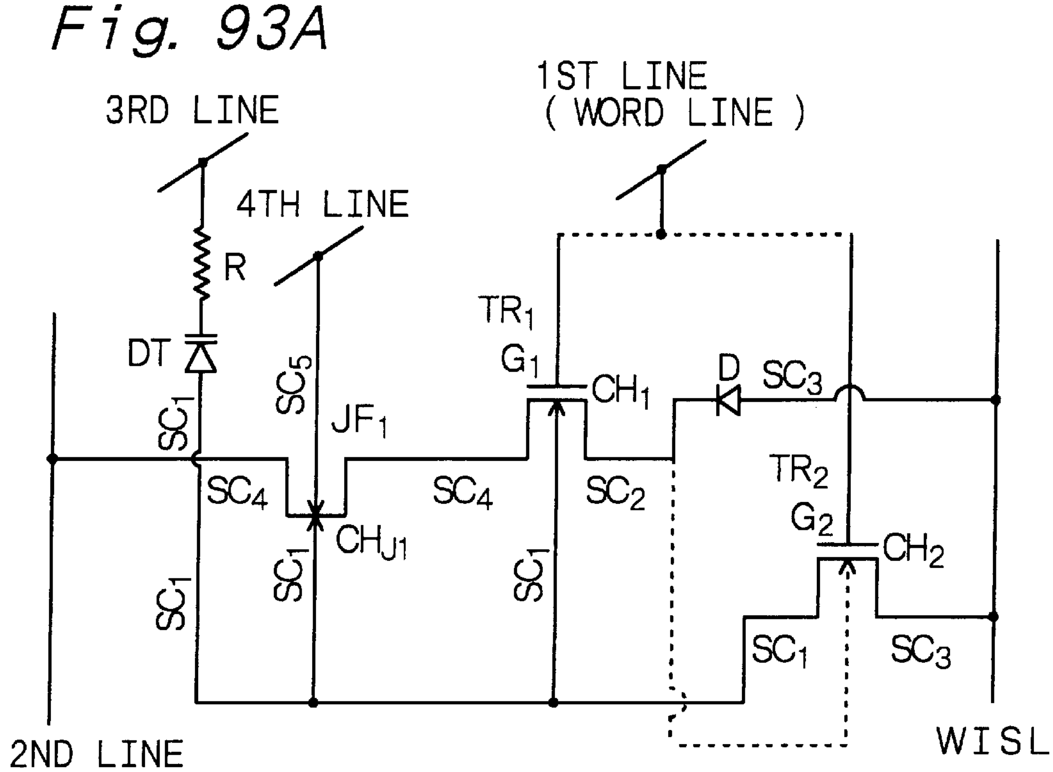
FIGS. 93A and 93B show the principles of variants of the semiconductor memory cell according to the sixth aspect of the present invention.

Example 8 is concerned with the semiconductor according to the sixth and fifteenth aspects of the present invention. As is shown in the principle drawing of FIG. 93A, the semiconductor memory cell of Example 8 comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information.

In the above semiconductor memory cell, one source/drain region of the first transistor $TR_1$ corresponds to the channel forming region $CH_2$ of the second transistor $TR_2$, the other source/drain region of the first transistor $TR_1$ corresponds to one source/drain region of the junction-field-effect transistor $JF_1$, one source/drain region of the second transistor $TR_2$ corresponds to the channel forming region $CH_1$ of the first transistor $TR_1$ and also corresponds to one gate region of the junction-field-effect transistor $JF_1$, one end of the MIS type diode DT is formed of an extending portion of the channel forming region $CH_1$ of the first transistor $TR_1$, and the other end of the MIS type diode DT is formed of an electrode EL composed of a conductive material and is connected to the line (third line) having a predetermined potential. In Example 8, the first transistor $TR_1$ and the second transistor $TR_2$ are constituted of substantially separate transistors, respectively.

Further, the gate $G_1$ of the first transistor $TR_1$ and the gate $G_2$ of the second transistor $TR_2$ are connected to a first line (for example, word line) for memory cell selection, the other source/drain region of the first transistor $TR_1$ is connected to a second line through the junction-field-effect transistor $JF_1$, the other gate region of the junction-field-effect transistor $JF_1$ is connected to a fourth line, one source/drain region of the first transistor $TR_1$ is connected to a write-in information setting line WISL through a diode D, the other source/drain region of the second transistor $TR_2$ is connected to the write-in information setting line WISL, and the other end of the MIS type diode DT is connected to a third line (corresponding to the above line) having a predetermined potential through a high-resistance element R. It is preferred to employ a constitution in which the second line is used as a bit line, or a constitution in which the write-in information setting line WISL is used as a bit line as well and a second predetermined potential is applied to the second line.

Figure 98:
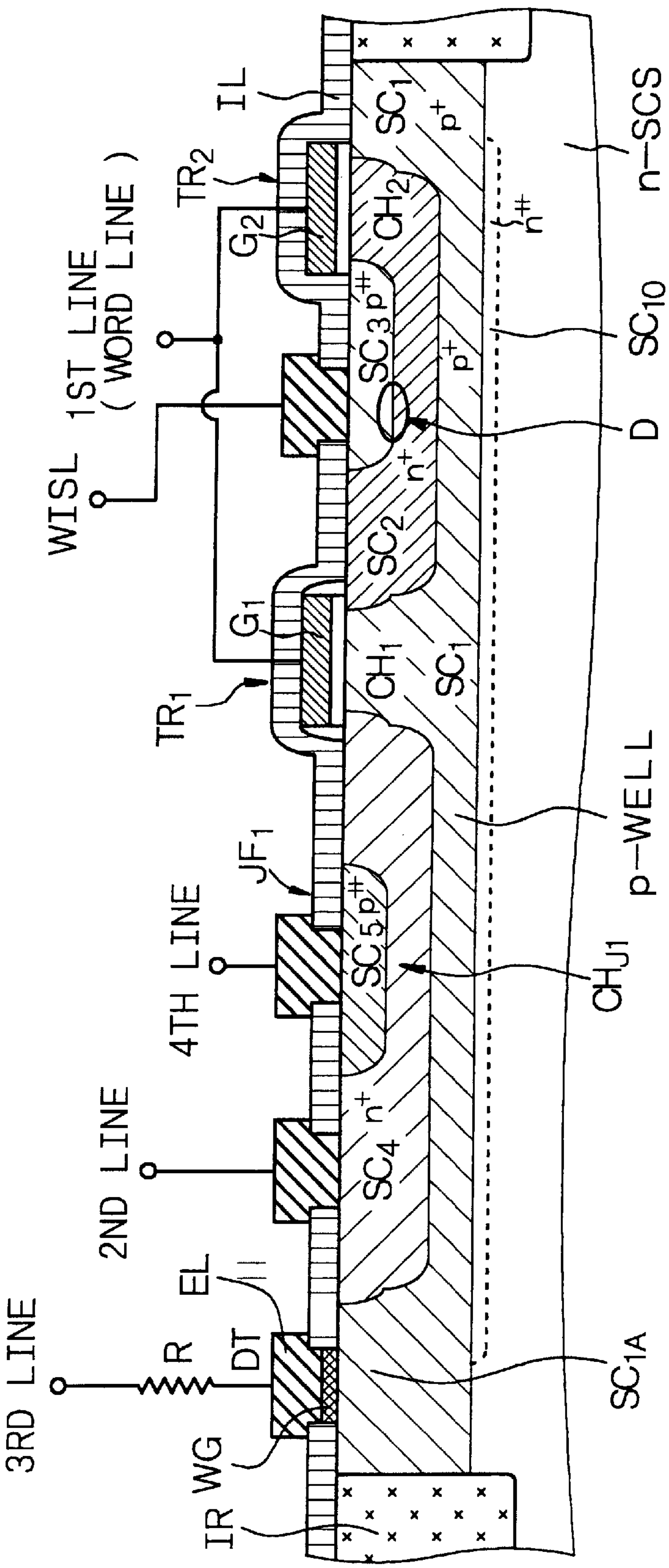
FIG. 98 shows a schematic partial cross-sectional view of a semiconductor memory cell of Example 8.

As shown in the schematic partial cross-sectional view of FIG. 98, the semiconductor memory cell of Example 8 differs from the semiconductor memory cell of Example 5 in a position where the junction-field-effect transistor $JF_1$ is formed. That is, the semiconductor memory cell of Example 8 comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type) and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information.

The semiconductor memory cell has;

(a) a semi-conductive first region $SC_1$ having a second conductivity type (for example, $p^+$-type), (b) a semi-conductive second region $SC_2$ which is formed in a surface region of the first region $SC_1$ and has a first conductivity type (for example, $n^+$-type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$-type) or which is formed of a silicide, a metal or a metal compound and is conductive, (d) a semi-conductive fourth region $SC_4$ which is formed in a surface region of the first region $SC_1$ to be spaced from the second region $SC_2$ and has the first conductivity type (for example, $n^+$-type), and (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^{++}$-type) or which is formed of a silicide, a metal or a metal compound and is conductive.

Concerning the first transistor $TR_1$, (A-1) one source/drain region is formed of a portion of a surface region of the second region $SC_2$, (A-2) the other source/drain region is formed of a surface region of the fourth region $SC_4$, (A-3) the channel forming region $CH_1$ is formed of a portion of a surface region of the first region $SC_1$ which portion is interposed between said portion of the surface region of the second region $SC_2$ and the surface region of the fourth region $SC_4$, and (A-4) the gate $G_1$ is formed on the channel forming region $CH_1$ of the first transistor $TR_1$ through an insulation layer.

Concerning the second transistor $TR_2$, (B-1) one source/drain region is formed of other portion of the surface region of the first region $SC_1$, (B-2) the other source/drain region is formed of the third region $SC_3$, (B-3) the channel forming region $CH_2$ is formed of other portion of the surface region of the second region $SC_2$ which other portion is interposed between said other portion of the surface region of the first region $SC_1$ and the third region $SC_3$, and (B-4) the gate $G_2$ is formed on the channel forming region $CH_2$ of the second transistor $TR_2$ through an insulation layer.

Further, concerning the junction-field-effect transistor $JF_1$, (C-1) the gate regions are formed of the fifth region $SC_5$ and part of the first region $SC_1$ which part is opposed to the fifth region $SC_5$, (C-2) the channel region $CH_{J1}$ is formed of part of the fourth region $SC_4$ which part is interposed between the fifth region $SC_5$ and said part of the first region $SC_1$, (C-3) one source/drain region is formed of the surface region of the fourth region $SC_4$ which surface region extends from one end of the channel region $CH_{J1}$ of the junction-field-effect transistor $JF_1$ and constitutes the other source/drain region of the first transistor $TR_1$, and (C-4) the other source/drain region is formed of a portion of the fourth region $SC_4$ which portion extends from the other end of the channel region $CH_{J1}$ of the junction-field-effect transistor $JF_1$.

Concerning the MIS type diode DT, (D-1) one end thereof is formed of part $SC_{1A}$ of the first region $SC_1$, and (D-2) an electrode constituting the other end thereof is formed to be opposed to said part $SC_{1A}$ of the first region $SC_1$ which part constitutes one end of the MIS type diode DT, through a wide gap thin film WG.

The wide gap thin film WG can be composed of a material in which the tunnel transition of carriers is caused depending upon a potential difference between the potential in the first region $SC_1$ (the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through the high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (E) the gate $G_1$ of the first transistor $TR_1$ and the gate $G_2$ of the second transistor $TR_2$ are connected to a first line (for example, word line) for memory cell selection, (F) the third region $SC_3$ is connected to a write-in information setting line WISL, (G) the portion of the fourth region $SC_4$ which portion constitutes the other source/drain region of the junction-field-effect transistor $JF_1$ is connected to a second line, (H) the electrode EL constituting the other end of the MIS type diode DT is connected to a third line having a predetermined potential, and (I) the fifth region $SC_5$ is connected to a fourth line.

In the semiconductor memory cell of Example 8, the second region $SC_2$ and the third region $SC_3$ constitute a pn junction diode D, and the second region $SC_2$ is connected to the write-in information setting line WISL through the third region $SC_3$. The above pn junction diode D can be formed by adjusting the impurity concentrations of the second region $SC_2$ and the third region $SC_3$ to proper values. It is preferred to employ a constitution in which the second line is used as a bit line, or a constitution in which the write-in information setting line WISL is used as a bit line as well and a second predetermined potential is applied to the second line.

The junction-field-effect transistor $JF_1$ is formed by (X) optimizing the distance between the facing gate regions (the fifth region $SC_5$ and the part of the first region $SC_1$ which part is opposed to the fifth region $SC_5$),that is, the thickness of the channel region $CH_{J1}$, and (Y) optimizing the impurity concentration of each of the facing gate regions (the fifth region $SC_5$ and the part of the first region $SC_1$ which part is opposed to the fifth region $SC_5$) and the impurity concentration of the channel region $CH_{J1}$.

In Example 8, the semiconductor memory cell (specifically, the first region $SC_1$) is formed in a well structure which is formed, for example, in an n-type semiconductor substrate and has the second conductivity type (for example, p-type).

In the semiconductor memory cell of Example 8, when a first high-concentration-impurity-containing layer $SC_{10}$ having the first conductivity type (for example, $n^{++}$-type) is formed below the first region $SC_1$, the potential or charge to be stored in the channel forming region $CH_1$ of the first transistor $TR_1$ for readout can be increased.

Figure 92:
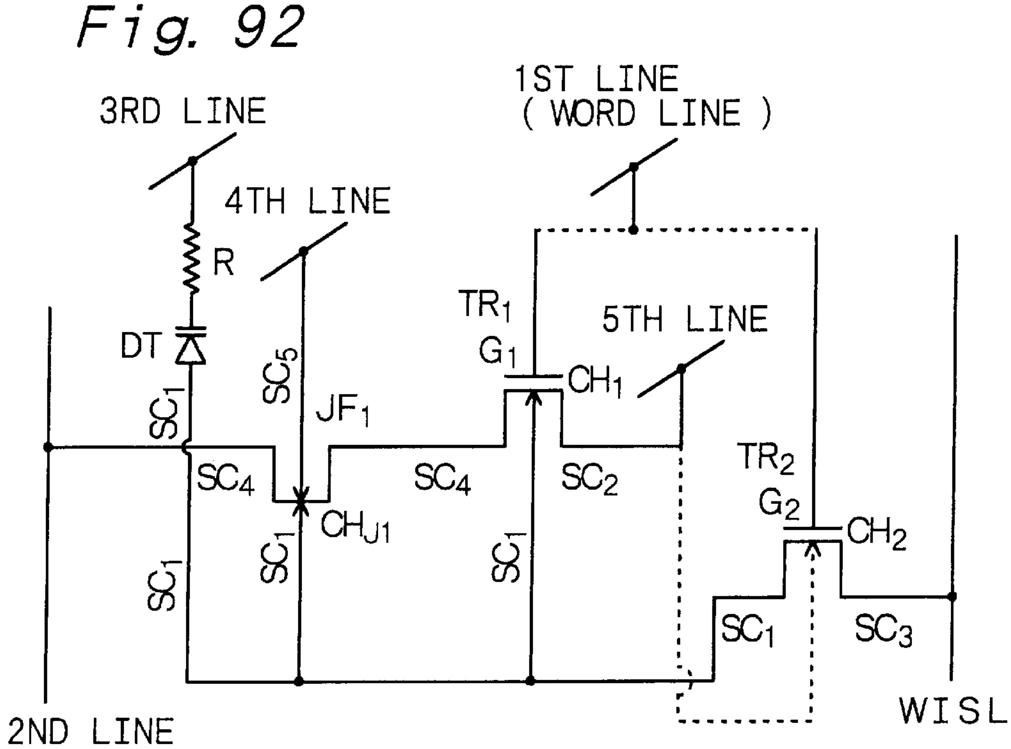
FIG. 92 shows the principle of the semiconductor memory cell according to the sixth aspect of the present invention.

In the semiconductor memory cell shown in FIG. 98, as is shown in the principle drawing of FIG. 92, there may be employed an embodiment in which the formation of the pn junction diode D is omitted and the second region $SC_2$ corresponding to one source/drain region of the first transistor $TR_1$ is connected to a fifth line (not shown in FIG. 98). In this case, it is preferred to employ a constitution in which the second line is used as a bit line and a second predetermined potential is applied to the fifth line, or a constitution in which the fifth line is used as a bit line and a second predetermined potential is applied to the second line.

FIGS. 99 to 103 show variants of the semiconductor memory cell shown in FIG. 98.

Figure 93B:
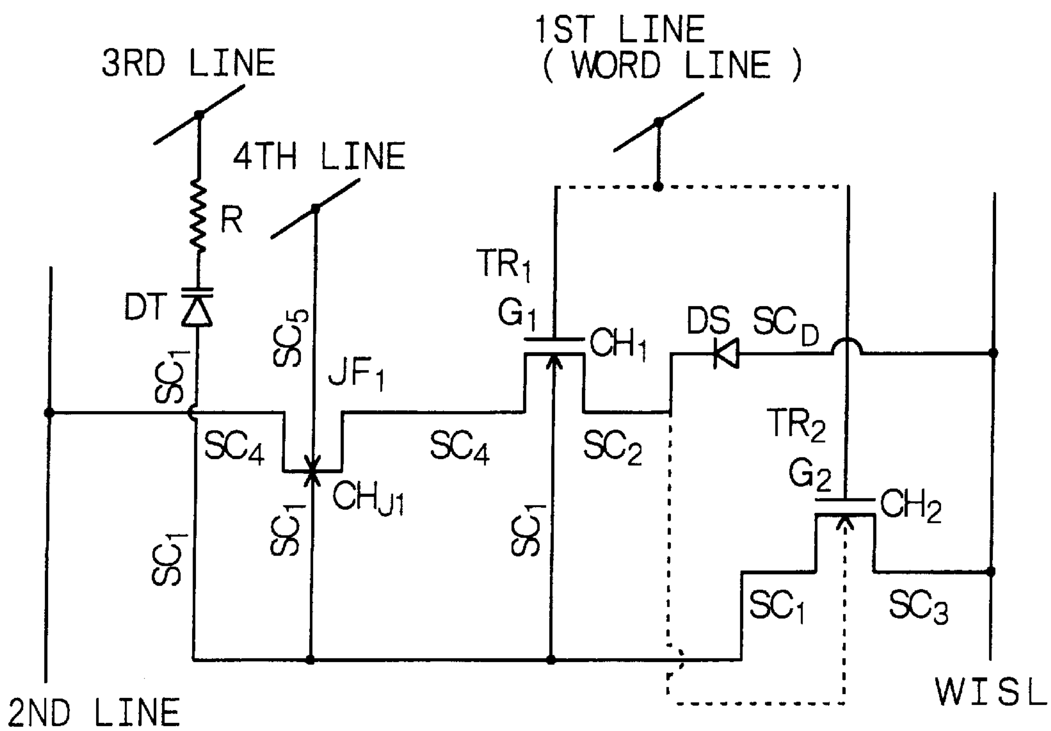
Figure 99:
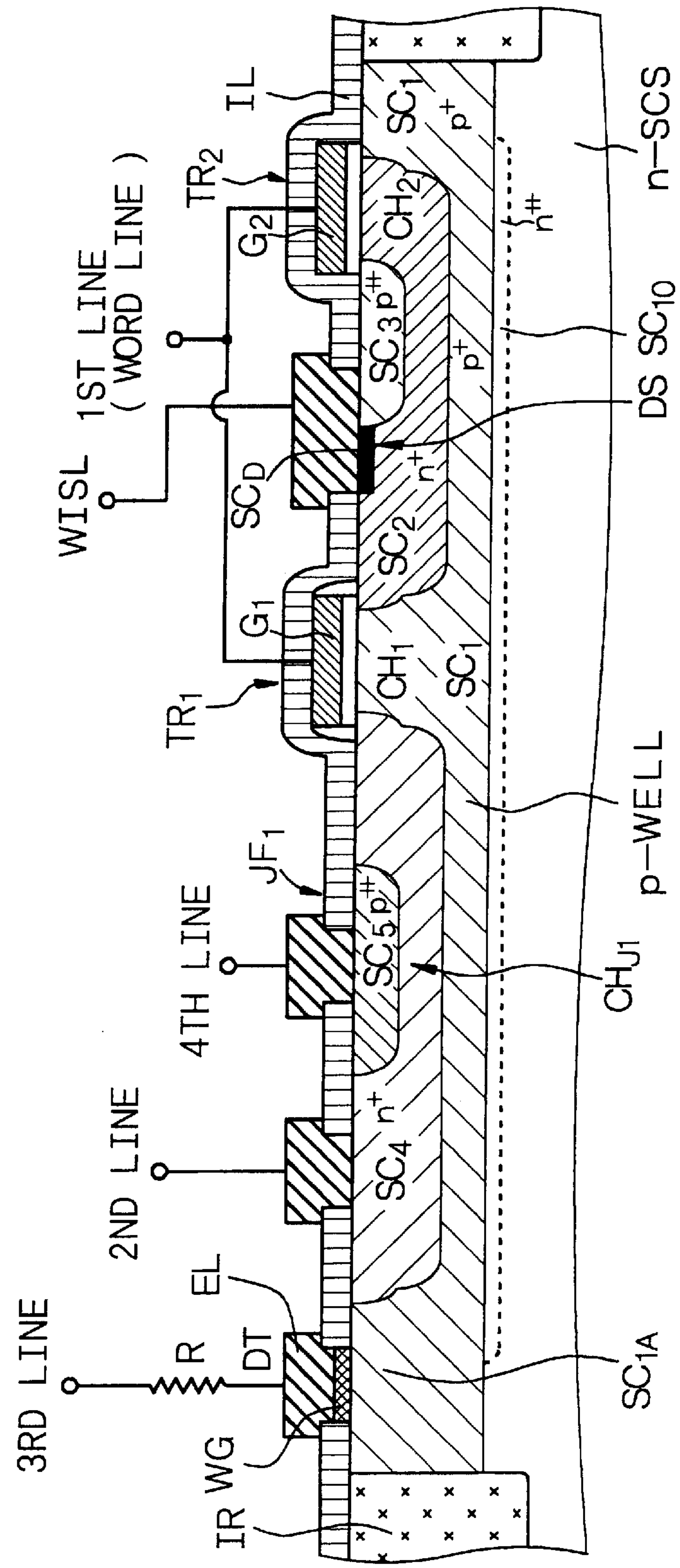
FIG. 99 shows a schematic partial cross-sectional view of a variant of the semiconductor memory cell of Example 8.

In the semiconductor memory cell shown in the principle drawing of FIG. 93B and the schematic partial cross-sectional view of FIG. 99, there is further provided a diode-constituting region $SC_D$ which is formed in a surface region of the second region $SC_2$ and is in contact with the second region $SC_2$ to form a rectifier junction together with the second region $SC_2$, and the diode-constituting region $SC_D$ and the second region $SC_2$ constitute a majority carrier diode DS of a Schottky junction type. One source/drain region of the first transistor $TR_1$ is connected to the write-in information setting line WISL through the majority carrier diode DS of a Schottky junction type in place of being connected to the fifth line. That is, the second region $SC_2$ is connected to the write-in information setting line WISL through the diode-constituting region $SC_D$. In the semiconductor memory cell shown in FIG. 99, the diode-constituting region $SC_D$ is formed adjacently to the third region $SC_3$, while the position of the diode-constituting region $SC_D$ shall not be limited thereto. It is preferred to employ a constitution in which the second line is used as a bit line, or a constitution in which the write-in information setting line WISL is used as a bit line as well and a second predetermined potential is applied to the second line.

Figure 95A:
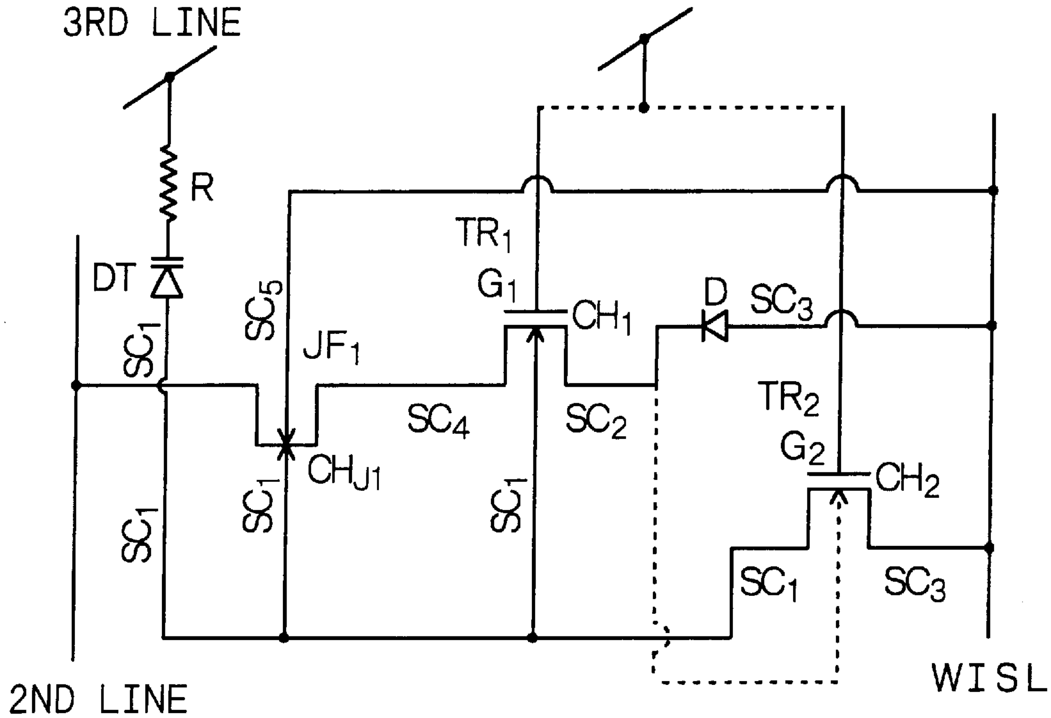
FIGS. 95A and 95B show the principles of variants of the semiconductor memory cell according to the sixth aspect of the present invention.
Figure 95B:
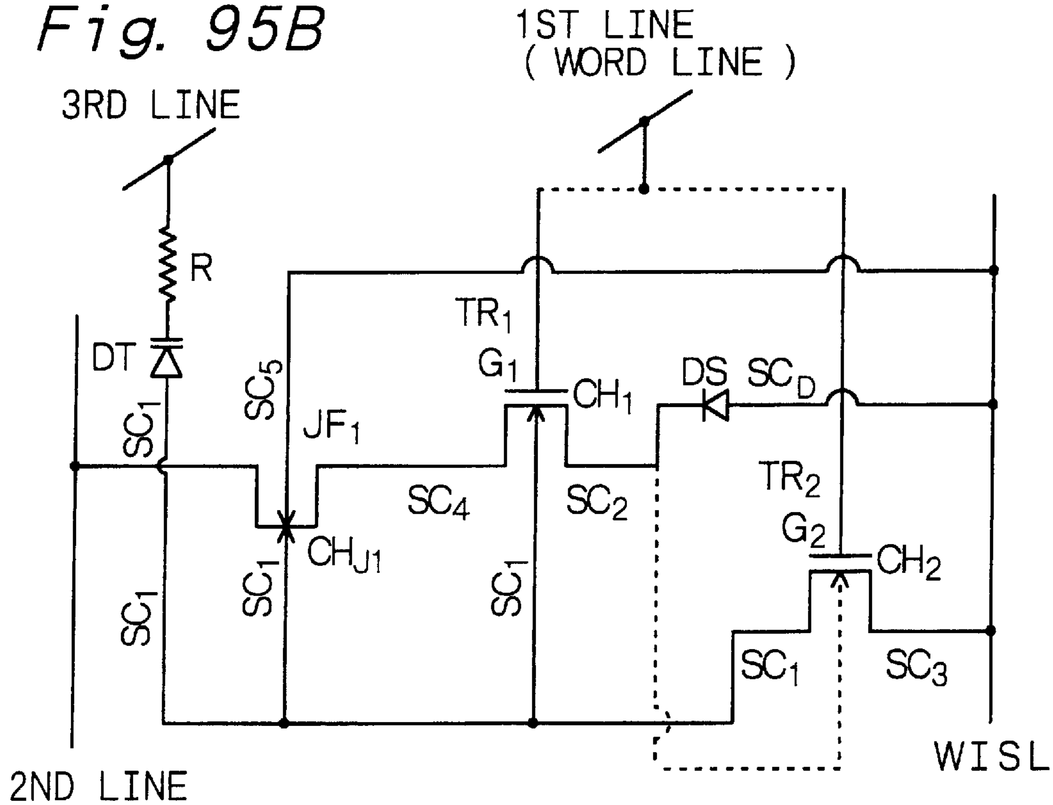

As is shown in the principle drawings of FIGS. 95A and 95B, the other gate region of the junction-field-effect transistor $JF_1$ may be connected to the write-in information setting line WISL in place of being connected to the fourth line. That is, as is shown in the schematic partial cross-sectional views of FIGS. 100 and 101, the fifth region $SC_5$ may be connected to the write-in information setting line WISL in place of being connected to the fourth line. The semiconductor memory cell shown in FIG. 10 is a variant of the semiconductor memory cell shown in FIG. 98, and the semiconductor memory cell shown in FIG. 101 is a variant of the semiconductor memory cell shown in FIG. 99.

Figure 94:
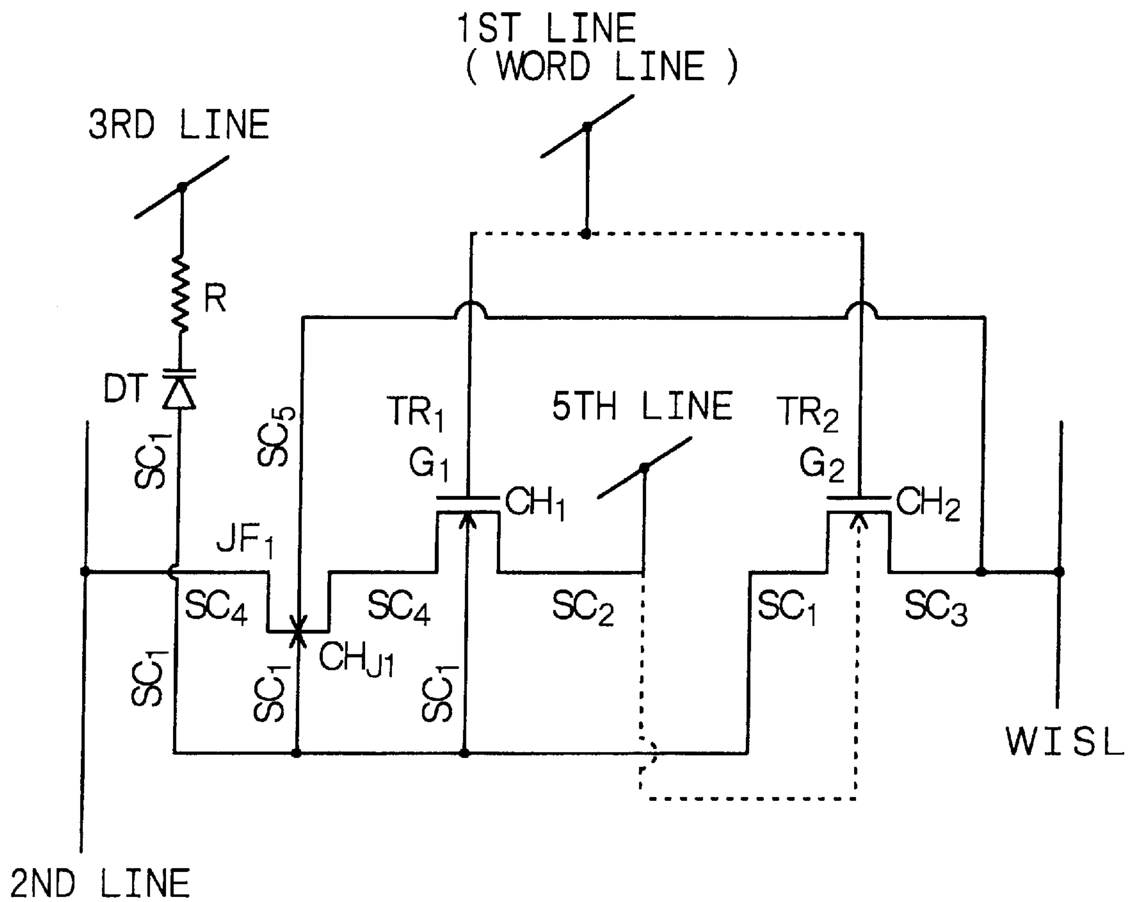
FIG. 94 shows the principle of a variant of the semiconductor memory cell according to the sixth aspect of the present invention.
Figure 100:
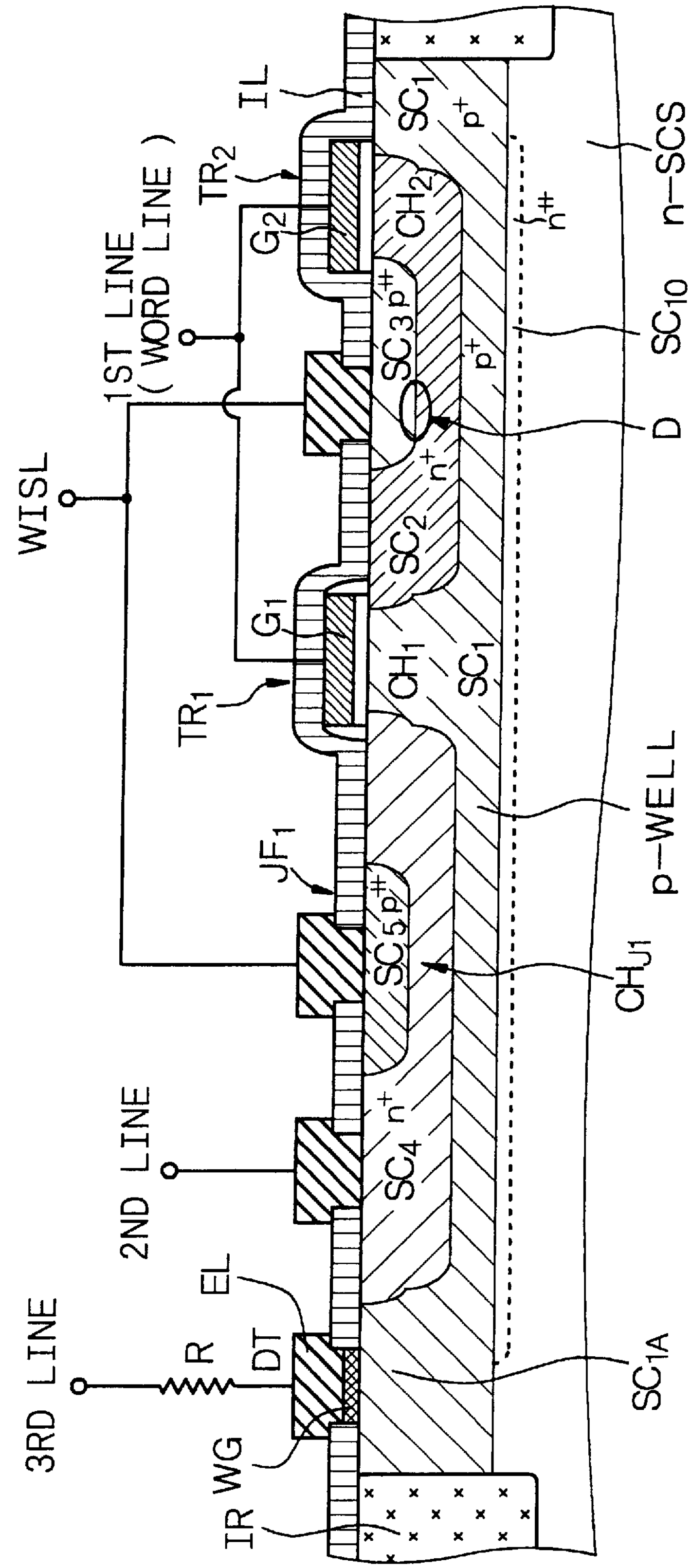
FIG. 100 shows a schematic partial cross-sectional view of a variant of the semiconductor memory cell of Example 8.
Figure 101:
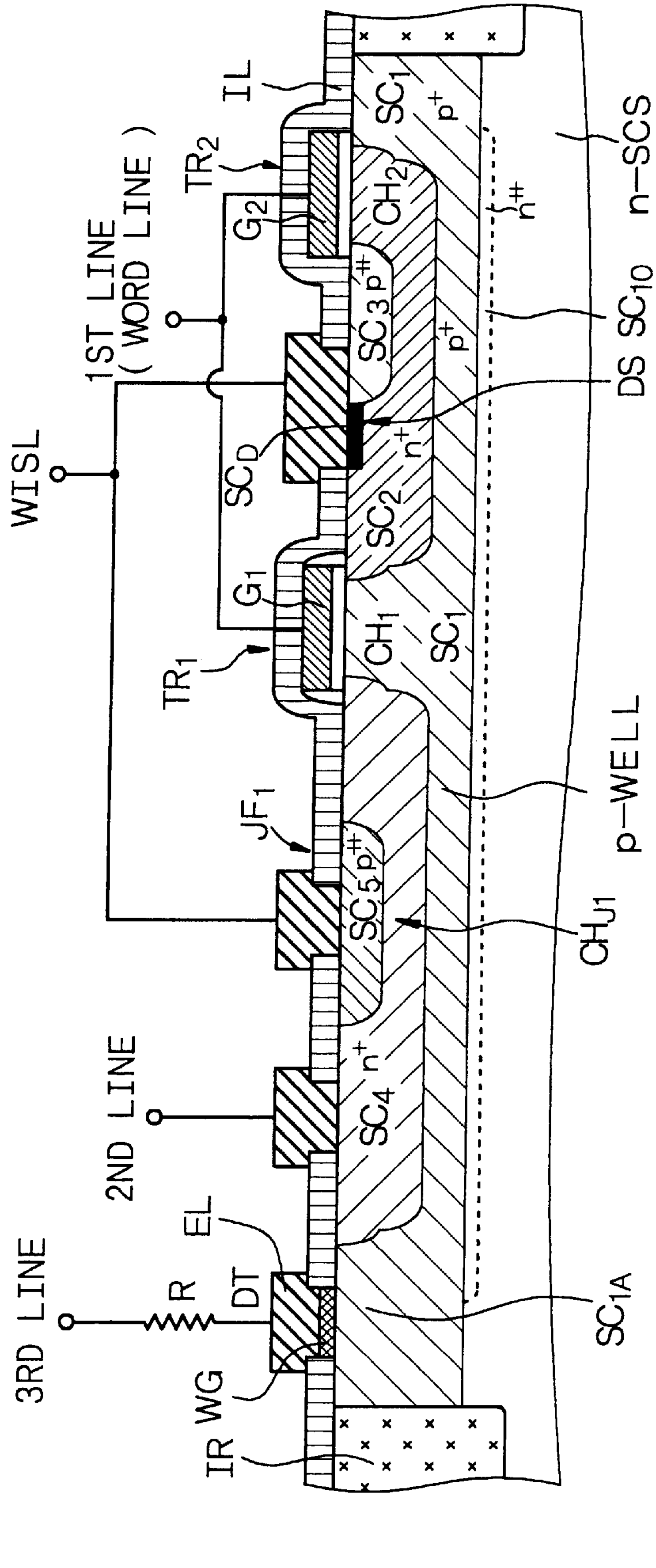
FIG. 101 shows a schematic partial cross-sectional view of a variant of the semiconductor memory cell of Example 8.

As is shown in the principle drawing of FIG. 94, there may be employed a constitution in which the formation of the pn junction diode D is omitted and the second region $SC_2$ corresponding to one source/drain region of the first transistor $TR_1$ is connected to a fifth line (not shown in FIG. 100). In this case, it is preferred to employ a constitution in which the second line is used as a bit line and a second predetermined potential is applied to the fifth line, or a constitution in which the fifth line is used as a bit line and a second predetermined potential is applied to the second line.

Figure 97A:
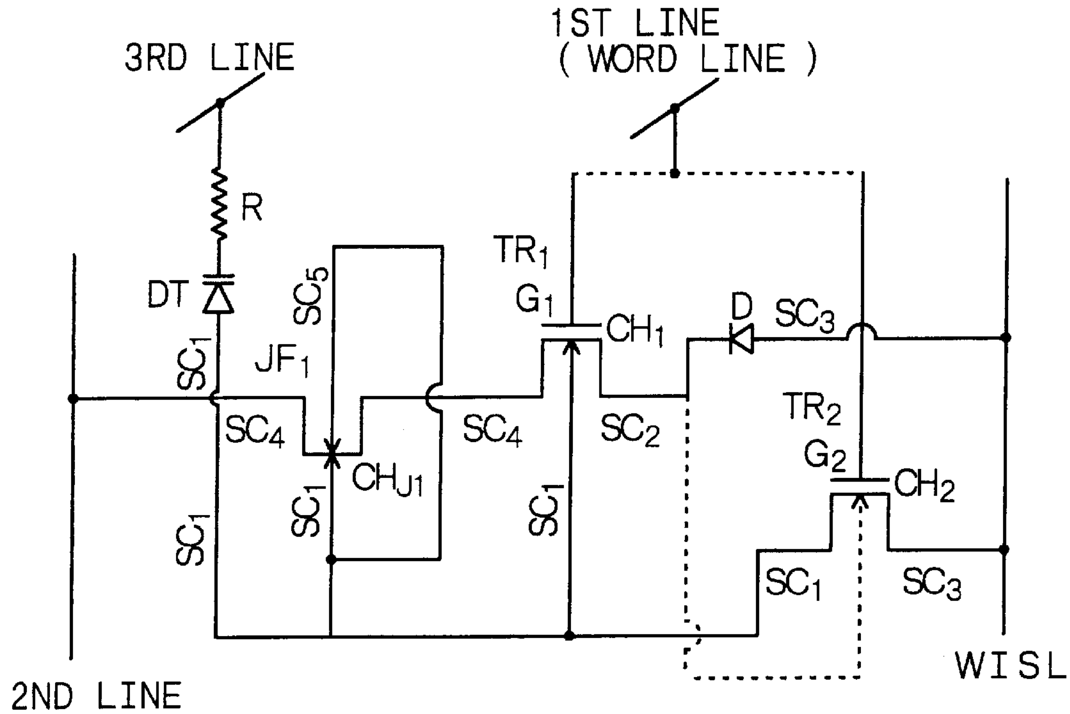
FIGS. 97A and 97B show the principles of variants of the semiconductor memory cell according to the sixth aspect of the present invention.
Figure 97B:
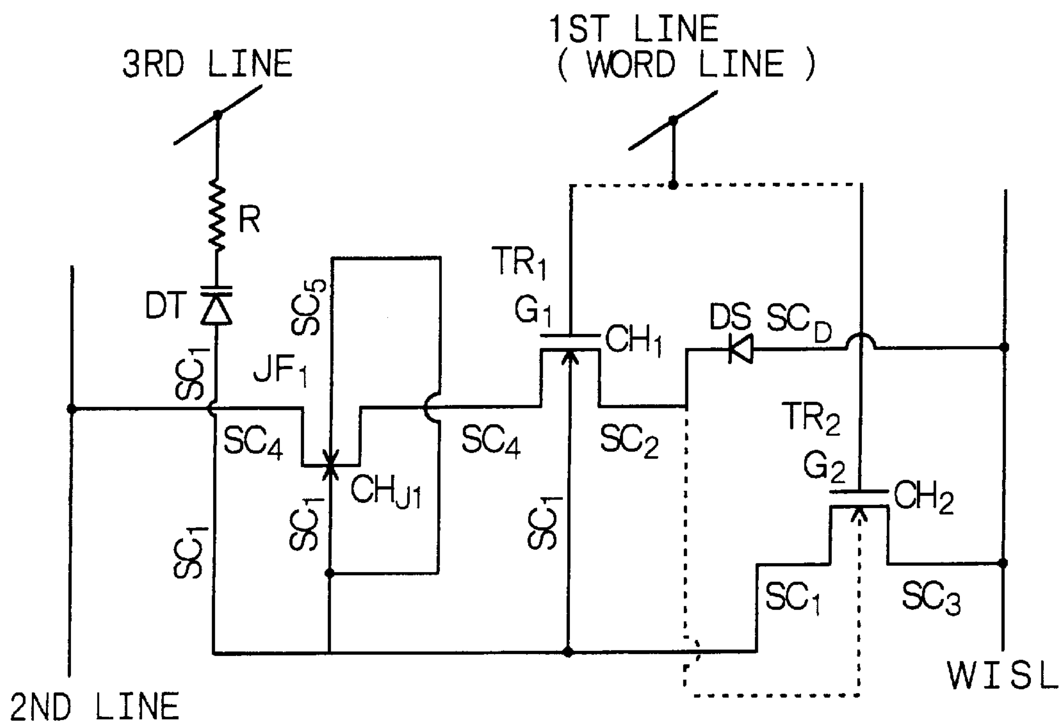
Figure 102:
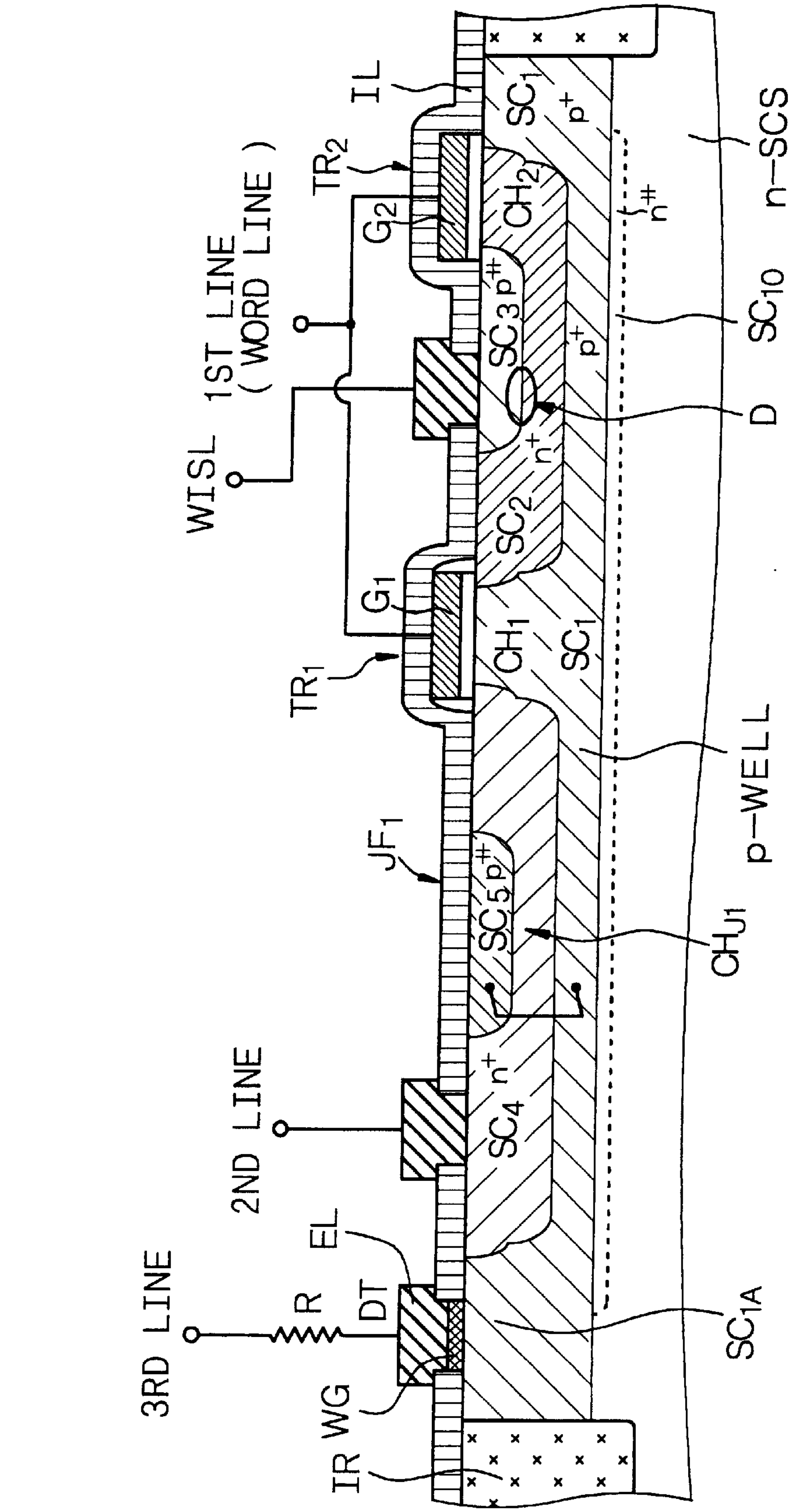
FIG. 102 shows a schematic partial cross-sectional view of a variant of the semiconductor memory cell of Example 8.
Figure 103:
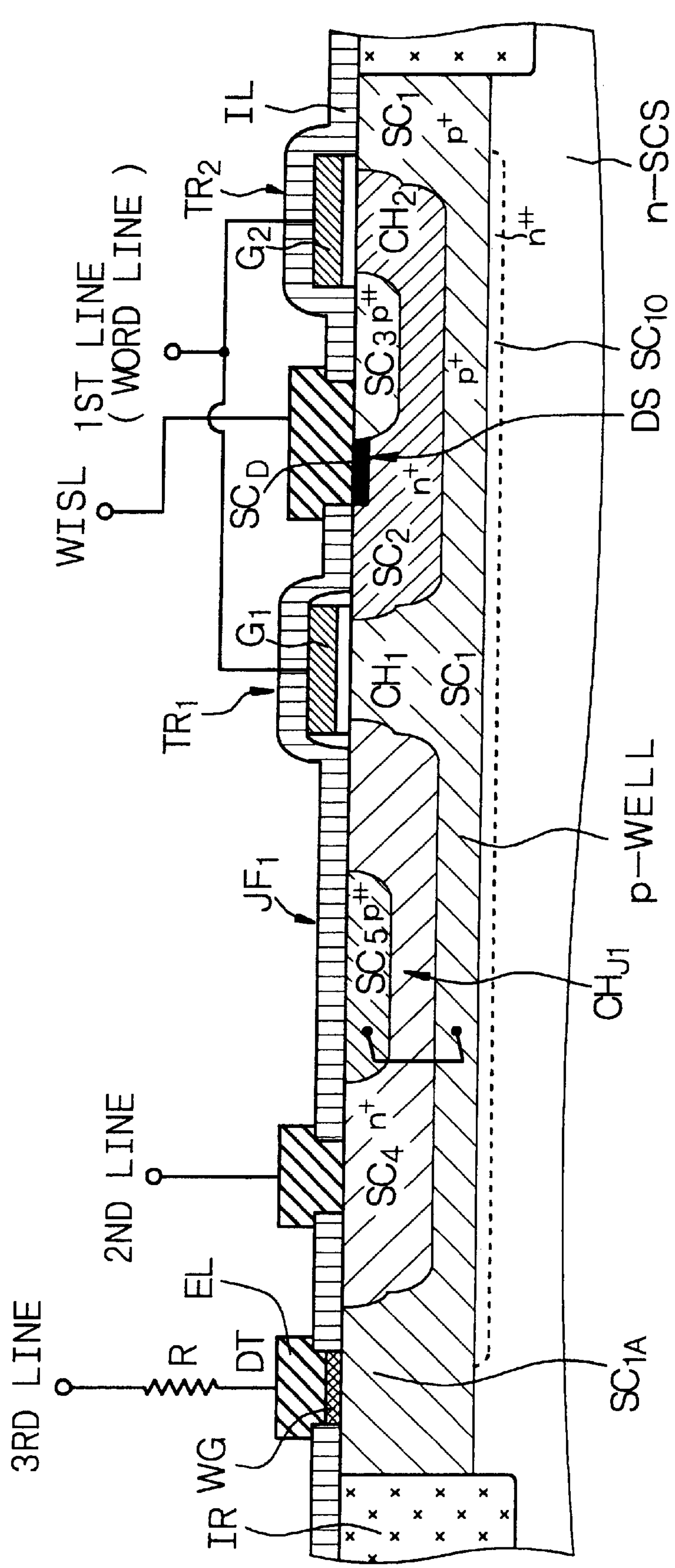
FIG. 103 shows a schematic partial cross-sectional view of a variant of the semiconductor memory cell of Example 8.

In semiconductor memory cells shown in the principle drawings of FIGS. 97A and 97B and the schematic partial cross-sectional views of FIGS. 102 and 103, the fifth region $SC_5$ is connected to the first region $SC_1$ in place of being connected to the fourth line. That is, the other gate region of the junction-field-effect transistor $JF_1$ is connected to one gate region of the junction-field-effect transistor $JF_1$ in place of being connected to the fourth line. Further, in the semiconductor memory cell shown in the schematic partial cross-sectional view of FIG. 102, the second region $SC_2$ and the third region $SC_3$ constitute a pn junction diode D, and the second region $SC_2$ is connected to the write-in information setting line WISL through the third region $SC_3$. In the semiconductor memory cell shown in the schematic partial cross-sectional view of FIG. 103, there is further provided a diode-constituting region $SC_D$ which is formed in a surface region of the second region $SC_2$ and is in contact with the second region $SC_2$ to form a rectifier junction together with the second region $SC_2$, the diode-constituting region $SC_D$ and the second region $SC_2$ constitute a majority carrier diode DS of a Schottky junction type, and the second region $SC_2$ is connected to the write-in information setting line WISL through the diode-constituting region $SC_D$. In the above embodiments in which the diode or the majority carrier diode is provided, it is preferred to employ a constitution in which the second line is used as a bit line, or a constitution in which the write-in information setting line WISL is used as a bit line as well and a second predetermined potential is applied to the second line.

Figure 96:
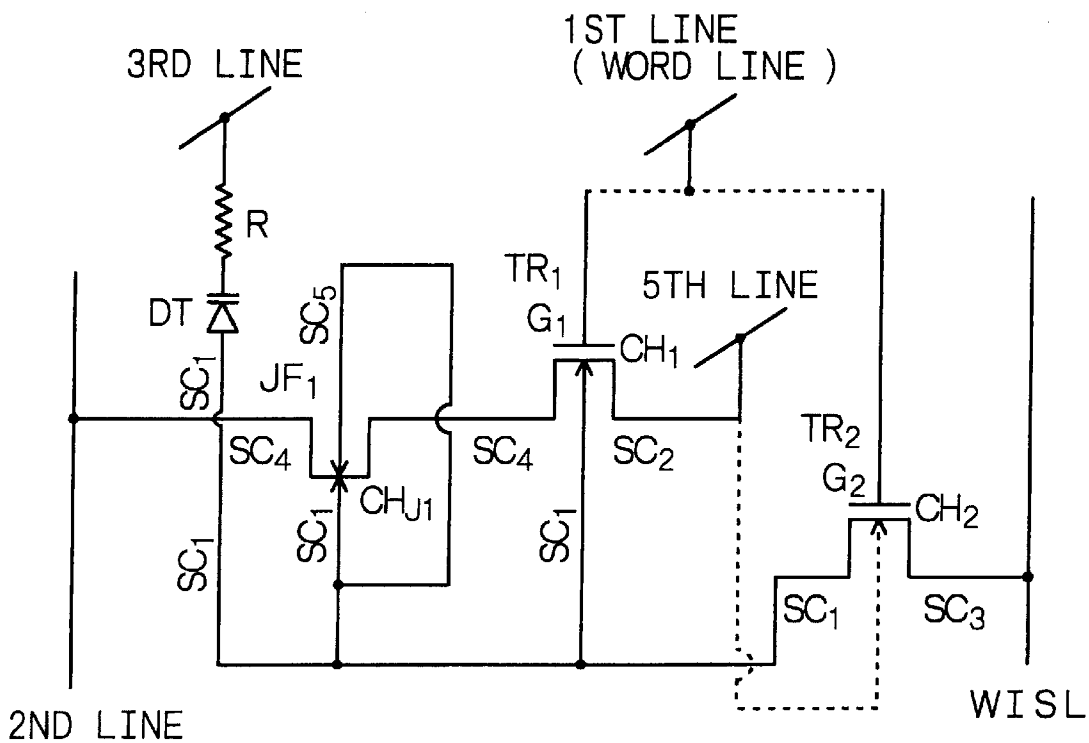
FIG. 96 shows the principle of a variant of the semiconductor memory cell according to the sixth aspect of the present invention.

As is shown in the principle drawing of FIG. 96, there may be employed a constitution in which the formation of the pn junction diode D is omitted and the second region $SC_2$ corresponding to one source/drain region of the first transistor $TR_1$ is connected to a fifth line (not shown in FIG. 102). In this case, it is preferred to employ a constitution in which the second line is used as a bit line and a second predetermined potential is applied to the fifth line, or a constitution in which the fifth line is used as a bit line and a second predetermined potential is applied to the second line.

EXAMPLE 9

Example 9 is concerned with the semiconductor memory cell according to the sixth and sixteenth aspects of the present invention. In the semiconductor memory cell of Example 9, the other gate region of the junction-field-effect transistor $JF_1$ is connected to one gate region of the junction-field-effect transistor $JF_1$ in place of being connected to the fourth line. More specifically, one end of the MIS type diode DT and the other gate region of the junction-field-effect transistor $JF_1$ are formed as a common region. Further, the fifth region $SC_5$ constituting the other gate region of the junction-field-effect transistor $JF_1$ corresponds to an extending portion of the channel forming region $CH_1$ of the first transistor $TR_1$.

Figure 105A:
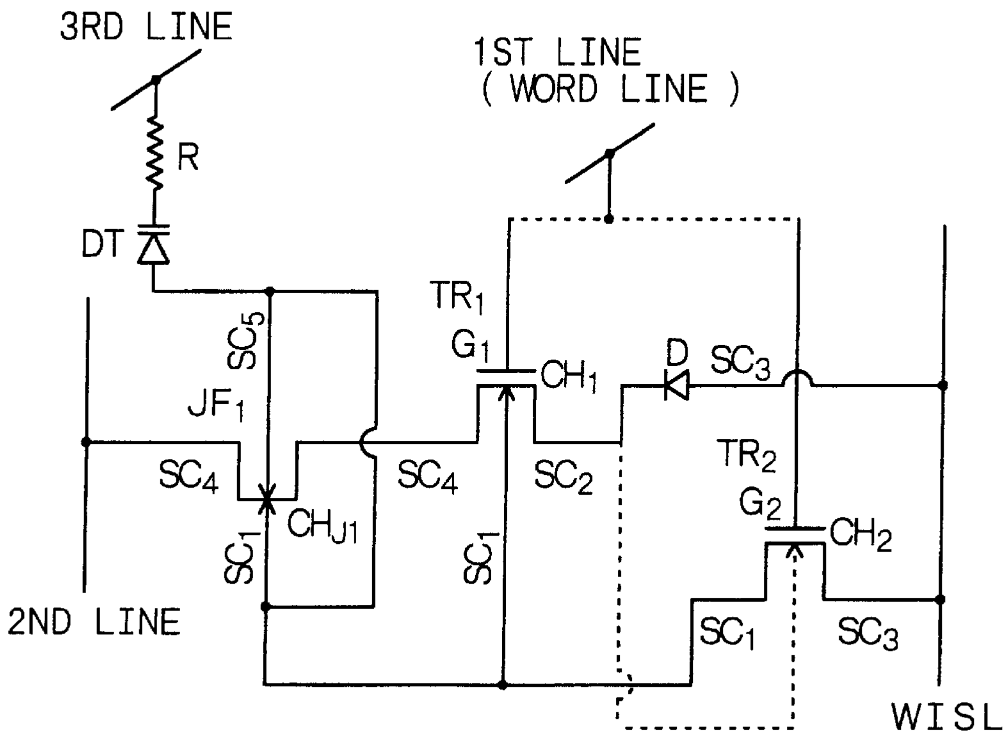
FIGS. 105A and 105B show the principles of variants of the semiconductor memory cell according to the sixth aspect of the present invention.
Figure 106:
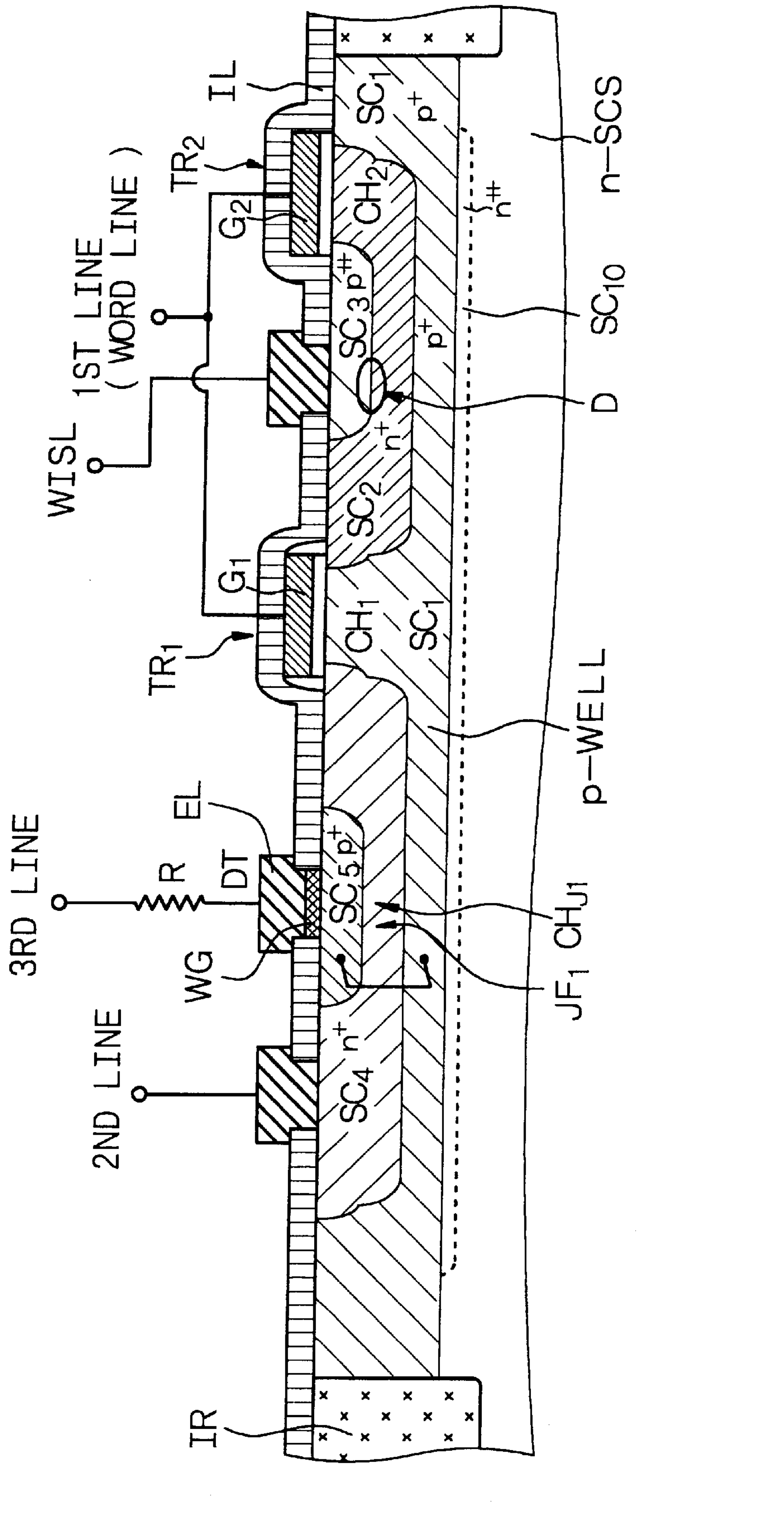
FIG. 106 shows a schematic partial cross-sectional view of a semiconductor memory cell of Example 9.

That is, as is shown in the schematic partial cross-sectional view of FIG. 106 and the principle drawing of FIG. 105A, the semiconductor memory cell of Example 9 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information, the semiconductor memory cell having;

(a) a semi-conductive first region $SC_1$ having a second conductivity type (for example, $p^+$-type), (b) a semi-conductive second region $SC_2$ which is formed in a surface region of the first region $SC_1$ and has a first conductivity type (for example, $n^+$-type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$-type) or which is conductive and is composed of a silicide, a metal or a metal compound, (d) a semi-conductive fourth region $SC_4$ which is formed in a surface region of the first region $SC_1$ to be spaced from the second region $SC_2$ and has the first conductivity type (for example, $n^+$-type), and (e) a semi-conductive fifth region $SC_5$ which is formed in a surface region of the fourth region $SC_4$ and has the second conductivity type (for example, $p^{++}$-type).

Concerning the first transistor $TR_1$, (A-1) one source/drain region is formed of a portion of a surface region of the second region $SC_2$, (A-2) the other source/drain region is formed of a surface region of the fourth region $SC_4$, (A-3) the channel forming region $CH_1$ is formed of a portion of a surface region of the first region $SC_1$ which portion is interposed between said portion of the surface region of the second region $SC_2$ and the surface region of the fourth region $SC_4$, and (A-4) the gate $G_1$ is formed on the channel forming region $CH_1$ through an insulation layer.

Concerning the second transistor $TR_2$, (B-1) one source/drain region is formed of other portion of the surface region of the first region $SC_1$, (B-2) the other source/drain region is formed of the third region $SC_3$, (B-3) the channel forming region $CH_2$ is formed of other portion of the surface region of the second region $SC_2$ which other portion is interposed between said other portion of the surface region of the first region $SC_1$ and the third region $SC_3$, and (B-4) the gate $G_2$ is formed on the channel forming region $CH_2$ through an insulation layer.

Concerning the junction-field-effect transistor $JF_1$, (C-1) the gate regions are formed of the fifth region $SC_5$ and part of the first region $SC_1$ which part is opposed to the fifth region $SC_5$, (C-2) the channel region $CH_{J1}$ is formed of part of the fourth region $SC_4$ which part is interposed between the fifth region $SC_5$ and said part of the first region $SC_1$, (C-3) one source/drain region is formed of the surface region of the fourth region $SC_4$ which surface region extends from one end of the channel region $CH_{J1}$ of the junction-field-effect transistor $JF_1$ and constitutes the other source/drain region of the first transistor $TR_1$, and (C-4) the other source/drain region is formed of a portion of the fourth region $SC_4$ which portion extends from the other end of the channel region $CH_{J1}$ of the junction-field-effect transistor $JF_1$.

Concerning the MIS type diode DT, (D-1) one end thereof is formed of the fifth region $SC_5$, and (D-2) an electrode constituting the other end thereof is formed to be opposed to the fifth region $SC_5$ which constitutes one end of the MIS type diode DT, through a wide gap thin film WG.

The wide gap thin film WG can be composed of a material in which the tunnel transition of carriers is caused depending upon a potential difference between the potential in the fifth region $SC_5$ (corresponding to the extending portion of the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (E) the gate $G_1$ of the first transistor $TR_1$ and the gate $G_2$ of the second transistor $TR_2$ are connected to a first line (for example, word line) for memory cell selection, (F) the third region $SC_3$ is connected to a write-in information setting line WISL, (G) the portion of the fourth region $SC_4$ which portion constitutes the other source/drain region of the junction-field-effect transistor $JF_1$ is connected to a second line, (H) the fifth region $SC_5$ is connected to the first region $SC_1$, and (I) the electrode EL constituting the other end of the MIS type diode DT is connected to a third line having a predetermined potential.

In the semiconductor memory cell of Example 9, the second region $SC_2$ and the third region $SC_3$ constitute a pn junction diode D, and the second region $SC_2$ is connected to the write-in information setting line WISL through the third region $SC_3$. The above pn junction diode D can be formed by adjusting the impurity concentrations of the second region $SC_2$ and the third region $SC_3$ to proper values. It is preferred to employ a constitution in which the second line is used as a bit line, or a constitution in which the write-in information setting line WISL is used as a bit line as well and a second predetermined potential is applied to the second line.

The junction-field-effect transistor $JF_1$ is formed by (X) optimizing the distance between the facing gate regions (the fifth region $SC_5$ and the part of the first region $SC_1$ which part is opposed to the fifth region $SC_5$), that is, the thickness of the channel region $CH_{J1}$), and (Y) optimizing the impurity concentration of each of the facing gate regions (the fifth region $SC_5$ and the part of the first region $SC_1$ which part is opposed to the fifth region $SC_5$) and the impurity concentration of the channel region $CH_{J1}$.

In Example 9, the semiconductor memory cell (specifically, the first region $SC_1$) is formed in a well structure which is formed, for example, in an n-type semiconductor substrate and has the second conductivity type (for example, p-type).

In the semiconductor memory cell of Example 9, when a first high-concentration-impurity-containing layer $SC_{10}$ having the first conductivity type (for example, $n^{++}$-type) is formed below the first region $SC_1$, the potential or charge to be stored in the channel forming region $CH_1$ of the first transistor $TR_1$ for readout can be increased.

Figure 104:
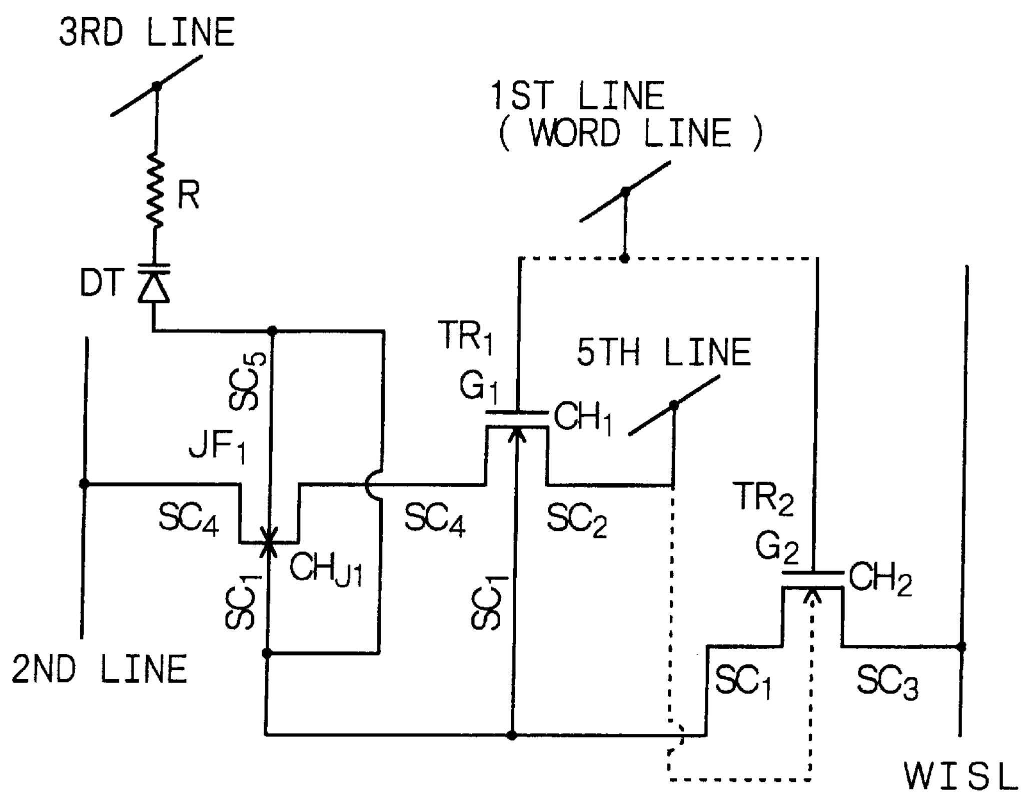
FIG. 104 shows the principle of a variant of the semiconductor memory cell according to the sixth aspect of the present invention.

In the semiconductor memory cell shown in FIG. 106, as is shown in the principle drawing of FIG. 104, there may be employed an embodiment in which the formation of the pn junction diode D is omitted and the second region $SC_2$ corresponding to one source/drain region of the first transistor $TR_1$ is connected to a fifth line (not shown in FIG. 106). In this case, it is preferred to employ a constitution in which the second line is used as a bit line and a second predetermined potential is applied to the fifth line, or a constitution in which the fifth line is used as a bit line and a second predetermined potential is applied to the second line.

Figure 105B:
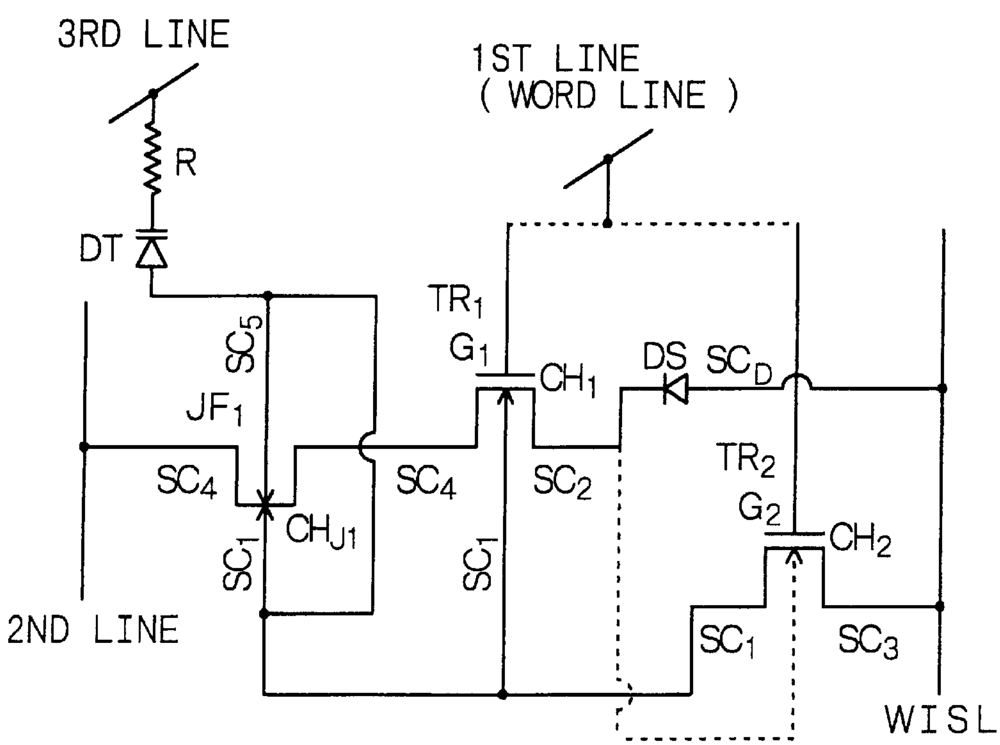
Figure 107:
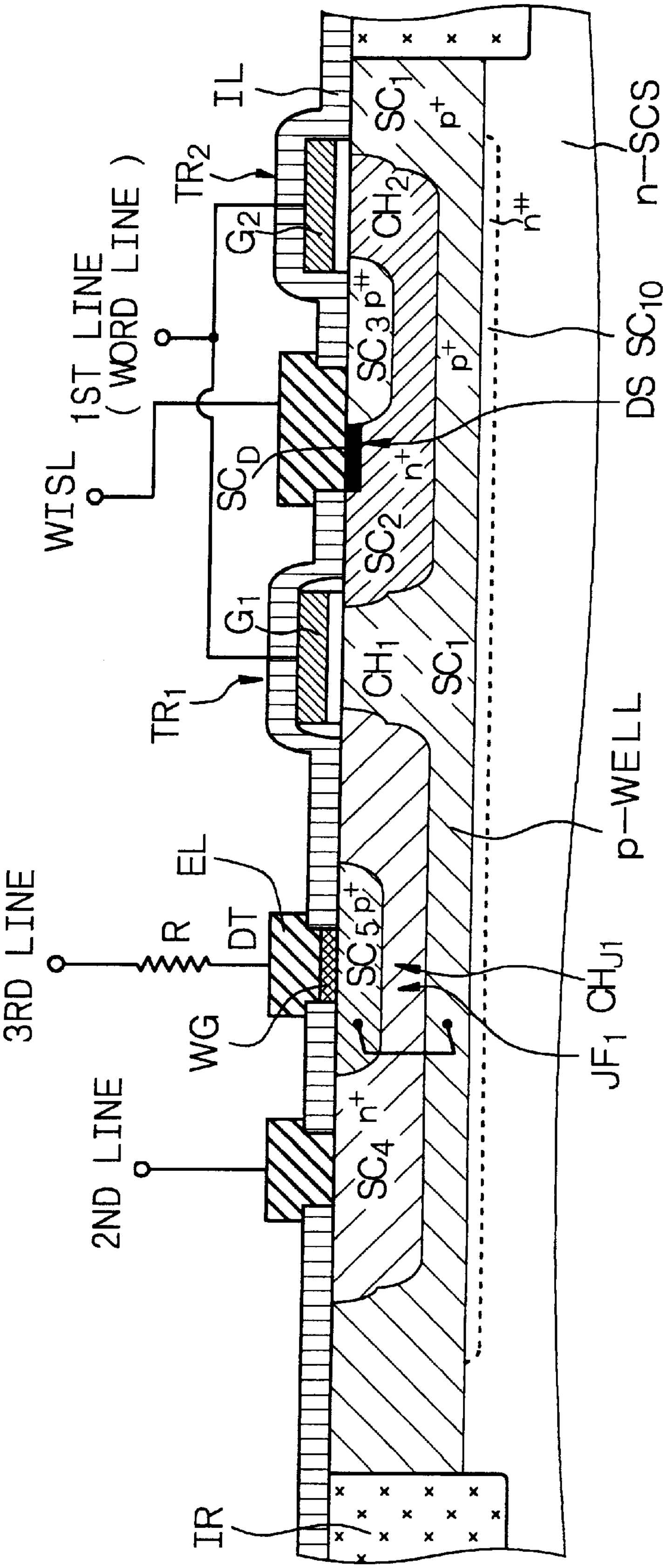
FIG. 107 shows a schematic partial cross-sectional view of a variant of the semiconductor memory cell of Example 9.

In a semiconductor memory cell shown in the principle drawing of FIG. 105B and the schematic partial cross-sectional view of FIG. 107, there is further provided a diode-constituting region $SC_D$ which is formed in a surface region of the second region $SC_2$ and is in contact with the second region $SC_2$ to form a rectifier junction together with the second region $SC_2$, and the diode-constituting region $SC_D$ and the second region $SC_2$ constitute a majority carrier diode DS of a Schottky junction type. One source/drain region of the first transistor $TR_1$ is connected to the write-in information setting line WISL through the majority carrier diode DS of a Schottky junction type in place of being connected to the fifth line. That is, the second region $SC_2$ is connected to the write-in information setting line WISL through the diode-constituting region $SC_D$. In the semiconductor memory cell shown in FIG. 107, the diode-constituting region $SC_D$ is formed adjacently to the third region $SC_3$, while the position of the diode-constituting region $SC_D$ shall not be limited thereto. It is preferred to employ a constitution in which the second line is used as a bit line, or a constitution in which the write-in information setting line WISL is used as a bit line as well and a second predetermined potential is applied to the second line.

EXAMPLE 10

Example 10 is concerned with the semiconductor memory cell according to the sixth and seventeenth aspects of the present invention. The semiconductor memory cell of Example 10 differs from the semiconductor memory cell of Example 8 in that the gate is shared by the first transistor $TR_1$ and the second transistor $TR_2$. That is, as is shown in the schematic partial cross-sectional view of FIGS. 114 or 120 and the principle drawing of FIG. 109A, the semiconductor memory cell of Example 10 comprises;

(1) a first transistor $TR_1$ for readout, having a first conductivity type (for example, n-channel type) and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information, the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and composed of a silicide, a metal or a metal compound, (d) a semi-conductive fourth region $SC_4$ which is formed in a surface region of the second region $SC_2$ and has the first conductivity type (for example, $n^+$-type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^+$-type) or which is conductive and composed of a silicide, a metal or a metal compound, and (f) the gate G which is formed, through an insulation layer, so as to bridge the first region $SC_1$ and the fourth region $SC_4$ and so as to bridge the second region $SC_2$ and the third region $SC_3$, and is shared by the first transistor $TR_1$ and the second transistor $TR_2$.

Figure 114:
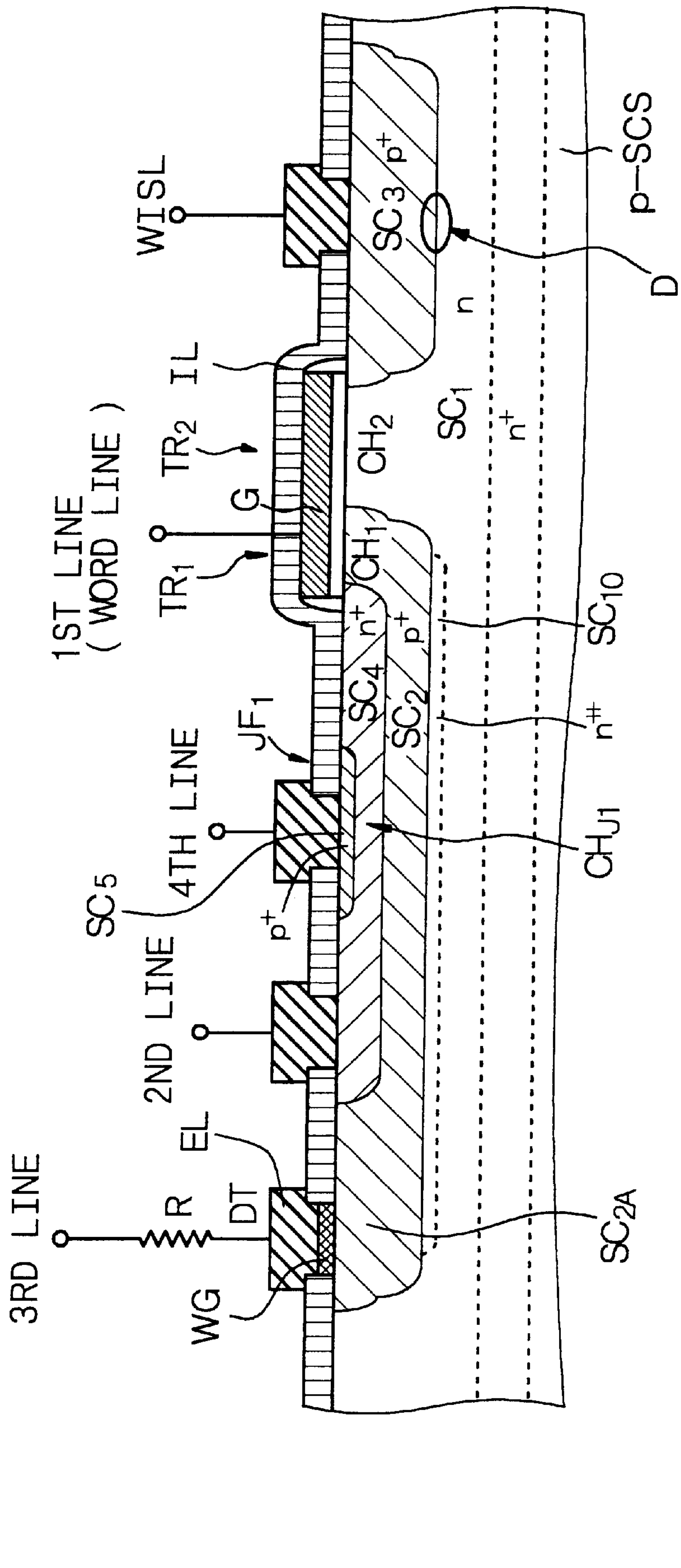
FIG. 114 shows a schematic partial cross-sectional view of a semiconductor memory cell of Example 10.

In the semiconductor memory cell shown in FIG. 114, the first region $SC_1$ and the second region $SC_2$ are in contact with each other, while, specifically, the second region $SC_2$ is formed in a surface region of the first region $SC_1$. In the semiconductor memory cell shown in FIG. 120, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the second transistor $TR_2$, (B-1) one source/drain region is formed of the surface region of the second region $SC_2$ which surface region constitutes the channel forming region $CH_1$ of the first transistor $TR_1$, (B-2) the other source/drain region is formed of the third region $SC_3$, and (B-3) the channel forming region $CH_2$ is formed of the surface region of the first region $SC_1$ which surface region constitutes one source/drain region of the first transistor $TR_1$.

Concerning the junction-field-effect transistor $JF_1$, (C-1) the gate regions are formed of the fifth region $SC_5$ and part of the second region $SC_2$ which part is opposed to the fifth region $SC_5$, (C-2) the channel region $CH_{J1}$ is formed of part of the fourth region $SC_4$ which part is interposed between the fifth region $SC_5$ and said part of the second region $SC_2$, (C-3) one source/drain region is formed of the surface region of the fourth region $SC_4$ which surface region extends from one end of the channel region $CH_{J1}$ of the junction-field-effect transistor $JF_1$ and constitutes the other source/drain region of the first transistor $TR_1$, and (C-4) the other source/drain region is formed of a portion of the fourth region $SC_4$ which portion extends from the other end of the channel region $CH_{J1}$ of the junction-field-effect transistor $JF_1$.

Concerning the MIS type diode DT, (D-1) one end thereof is formed of part $SC_{2A}$ of the second region $SC_2$, and (D-2) an electrode constituting the other end thereof is formed to be opposed to said part $SC_{2A}$ of the second region $SC_2$ which part $SC_{2A}$ constitutes one end of the MIS type diode DT, through a wide gap thin film WG.

The wide gap thin film WG can be composed of a material in which the tunnel transition of carriers is caused depending upon a potential difference between the potential in the second region $SC_2$ (the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (E) the gate G is connected to a first line (for example, word line) for memory cell selection, (F) the third region $SC_3$ is connected to a write-in information setting line WISL, (G) the portion of the fourth region $SC_4$ which portion constitutes the other source/drain region of the junction-field-effect transistor $JF_1$ is connected to a second line, (H) the electrode EL constituting the other end of the MIS type diode DT is connected to a third line having a predetermined potential, and (I) the fifth region $SC_5$ is connected to a fourth line.

The first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

The semiconductor memory cell (specifically, the first region $SC_1$) shown in FIG. 114 is formed in a well structure which is formed, for example, in a p-type semiconductor substrate and has the first conductivity type (for example, n-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

Figure 120:
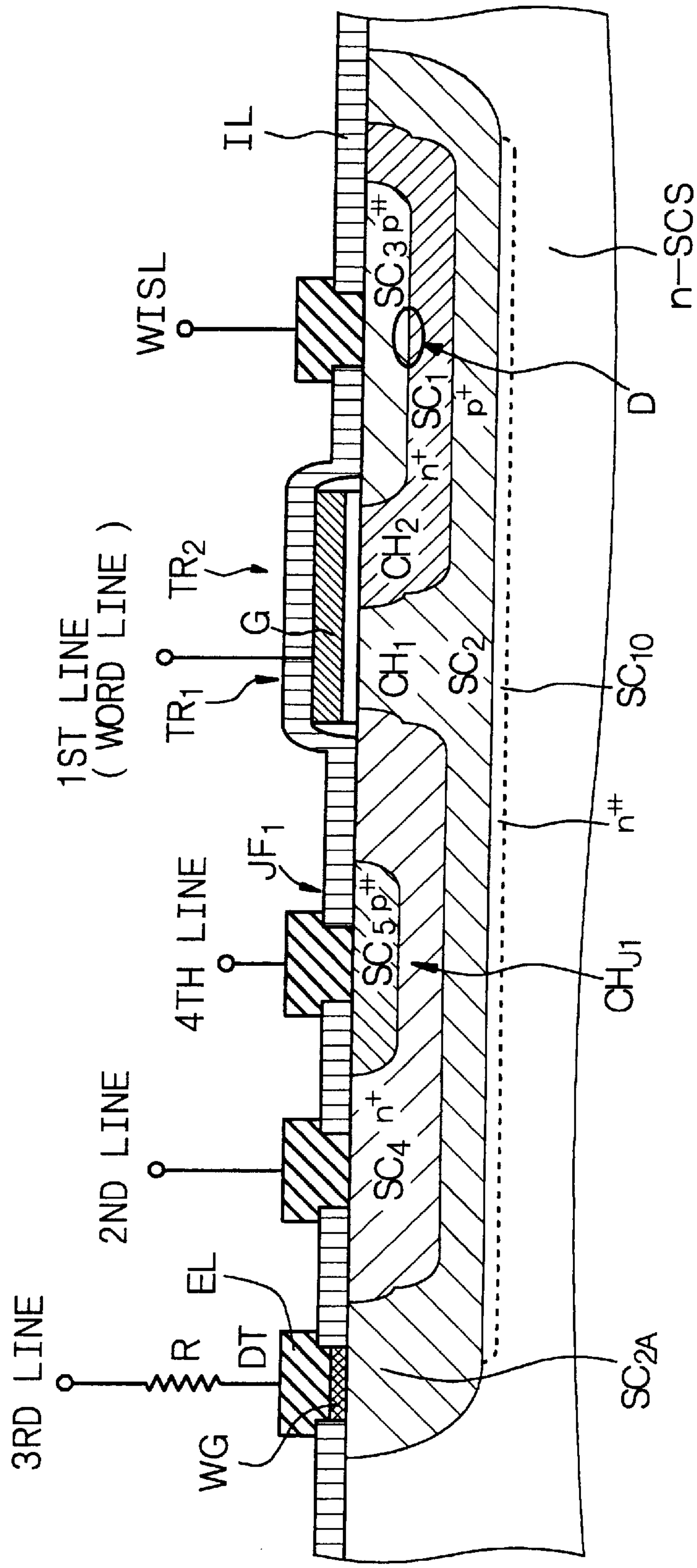

The semiconductor memory cell (specifically, the second region $SC_2$) shown in FIG. 120 is formed in a well structure which is formed, for example, in an n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

The junction-field-effect transistor $JF_1$ is formed by (X) optimizing the distance between the facing gate regions (the fifth region $SC_5$ and the part of the second region $SC_2$ which part is opposed to the fifth region $SC_5$), that is, the thickness of the channel region $CH_{J1}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J1}$.

Figure 108:
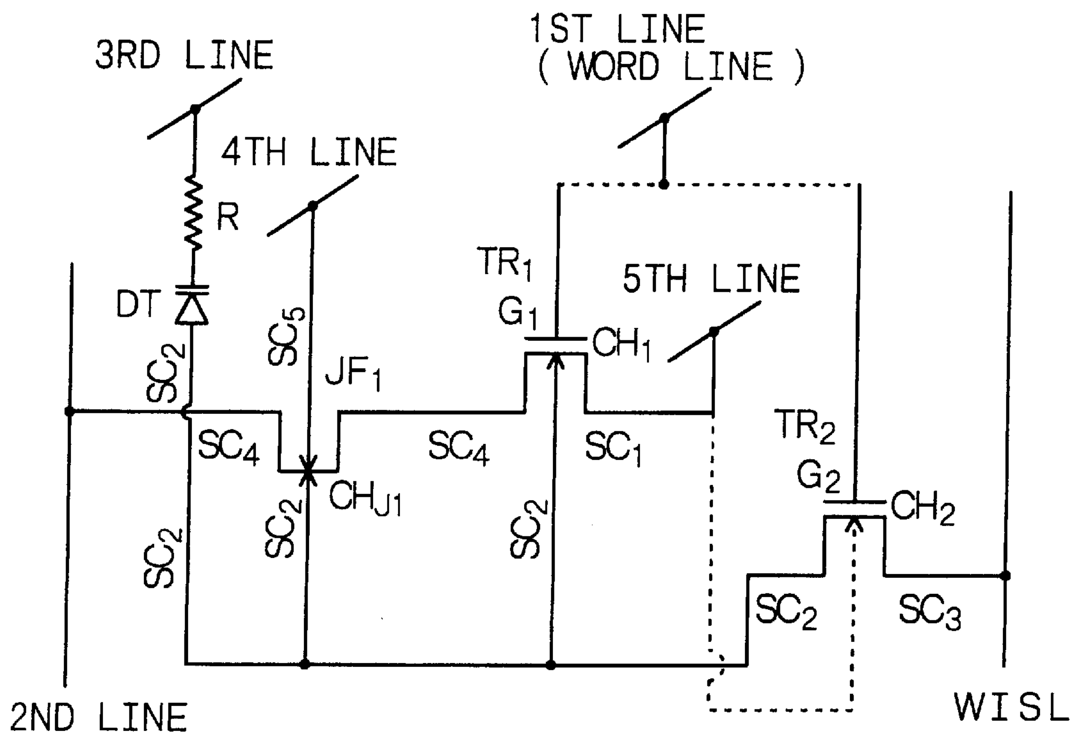
FIG. 108 shows the principle of a variant of the semiconductor memory cell according to the sixth aspect of the present invention.

In the semiconductor memory cell shown in FIG. 114, there may be employed an embodiment in which the formation of the pn junction diode D is omitted and a second high-concentration-impurity-containing layer (not shown) which has the first conductivity type (for example, $n^{++}$-type) and works as a fifth line is formed below the first region $SC_1$. In the semiconductor memory cell shown in FIG. 120, there may be employed an embodiment in which the formation of the pn junction diode D is omitted and the first region $SC_1$ is connected to a fifth line (not shown). FIG. 108 shows the principle of these semiconductor memory cells. In these cases, it is preferred to employ a constitution in which the second line is used as a bit line and a second predetermined potential is applied to the fifth line, or a constitution in which the fifth line is used as a bit line and a second predetermined potential is applied to the second line.

FIGS. 115 to 119 and FIGS. 121 to 125 show schematic partial cross-sectional views of variants of the semiconductor memory cell of Example 10. In the semiconductor memory cells shown in FIGS. 115 to 119, the first region $SC_1$ and the second region $SC_2$ are in contact, and specifically, the second region $SC_2$ is formed in a surface region of the first region $SC_1$. In the semiconductor memory cells shown in FIGS. 121 to 125, the first region $SC_1$ is formed in a surface region of the second region $SC_2$.

Figure 109A:
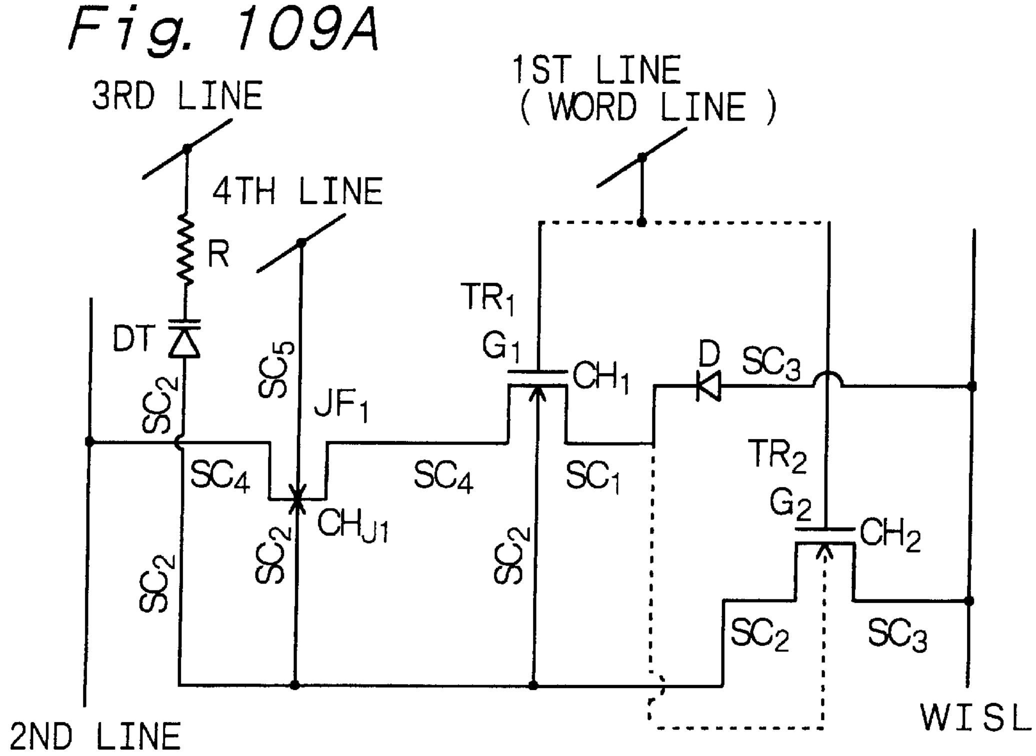
FIGS. 109A and 109B show the principles of variants of the semiconductor memory cell according to the sixth aspect of the present invention.
Figure 109B:
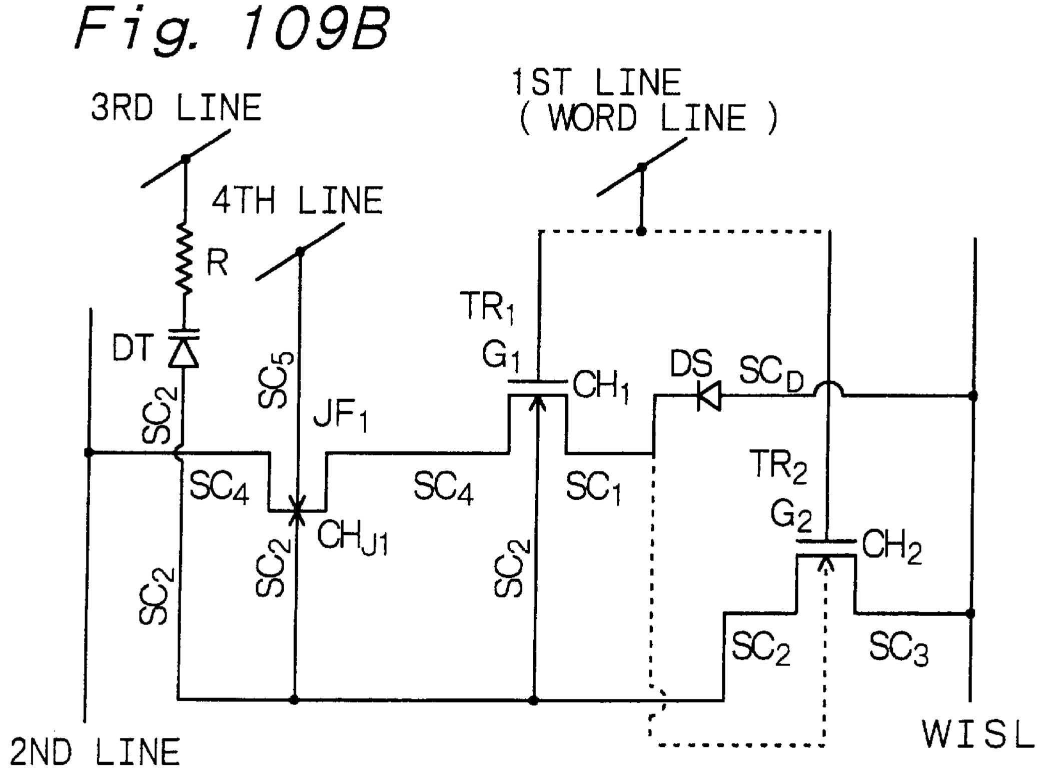
Figure 115:
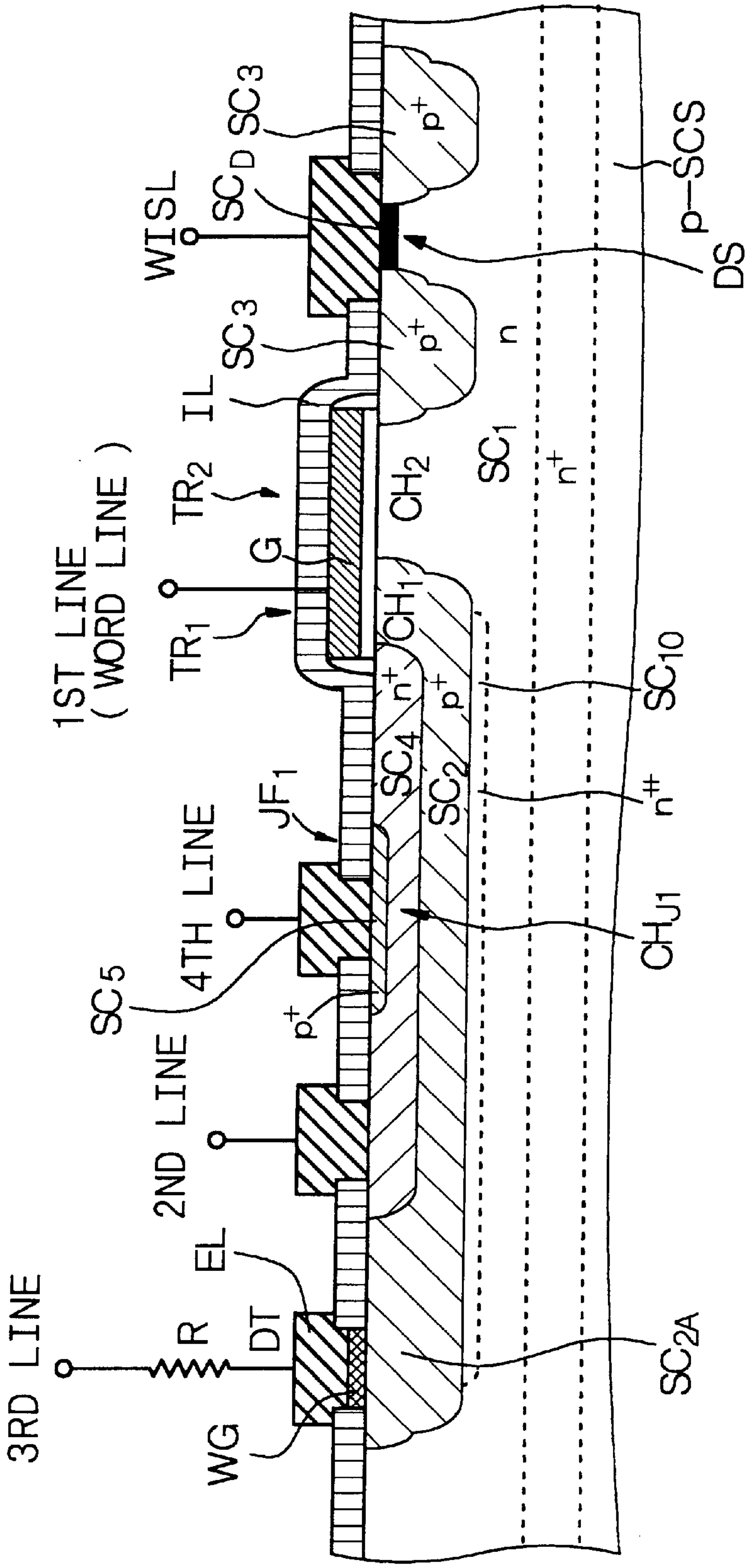
FIG. 115 shows a schematic partial cross-sectional view of a variant of the semiconductor memory cell of Example 10.
Figure 121:
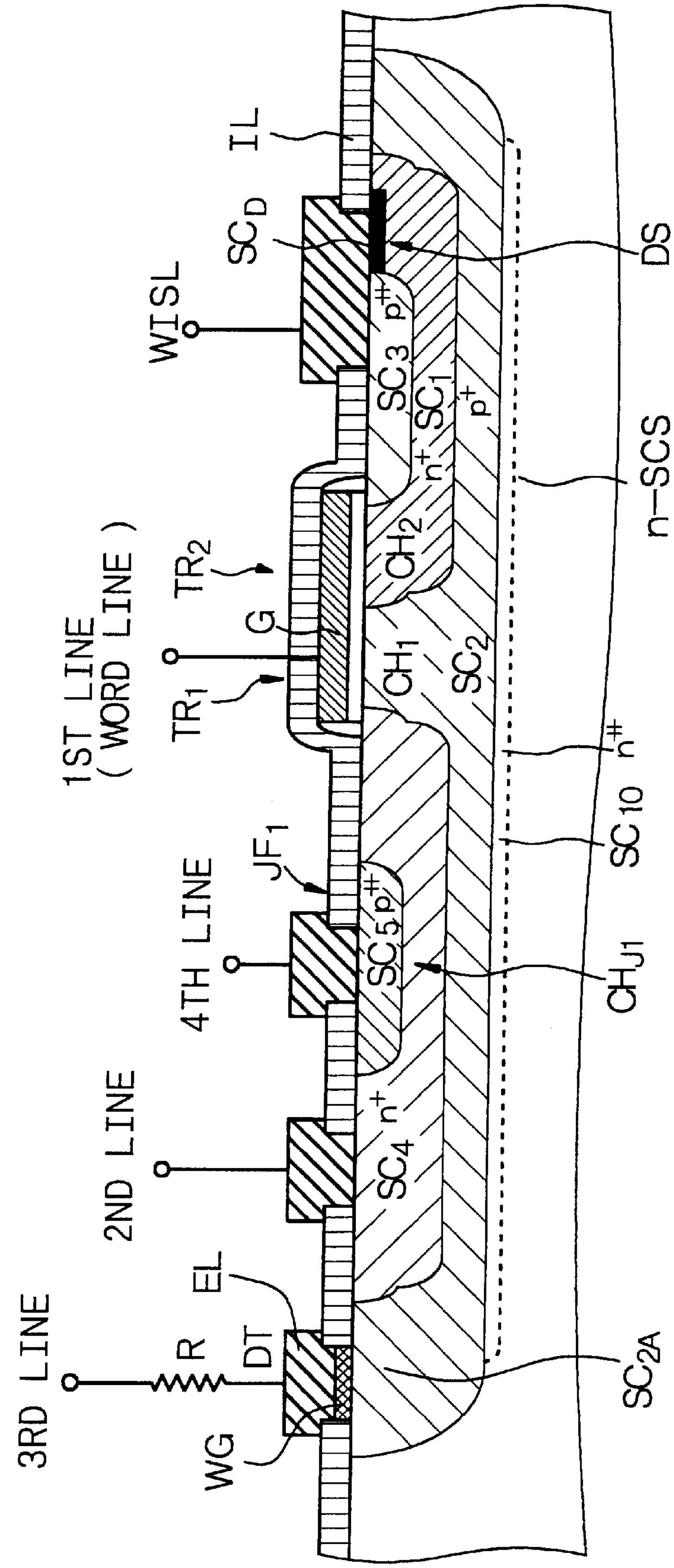

In the semiconductor memory cells shown in the principle drawing of FIG. 109A and the schematic partial cross-sectional views of FIGS. 115 and 121, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the majority carrier diode DS. In this case, it is preferred to employ a constitution in which the second line is used as a bit line, or a constitution in which the write-in information setting line WISL is used as a bit line as well and a second predetermined potential is applied to the second line. In FIG. 115, the diode-constituting region $SC_D$ is formed in the center of the third region $SC_3$ and is surrounded by the third region $SC_3$, while the position of the diode-constituting region $SC_D$ shall not be limited thereto.

Figure 110:
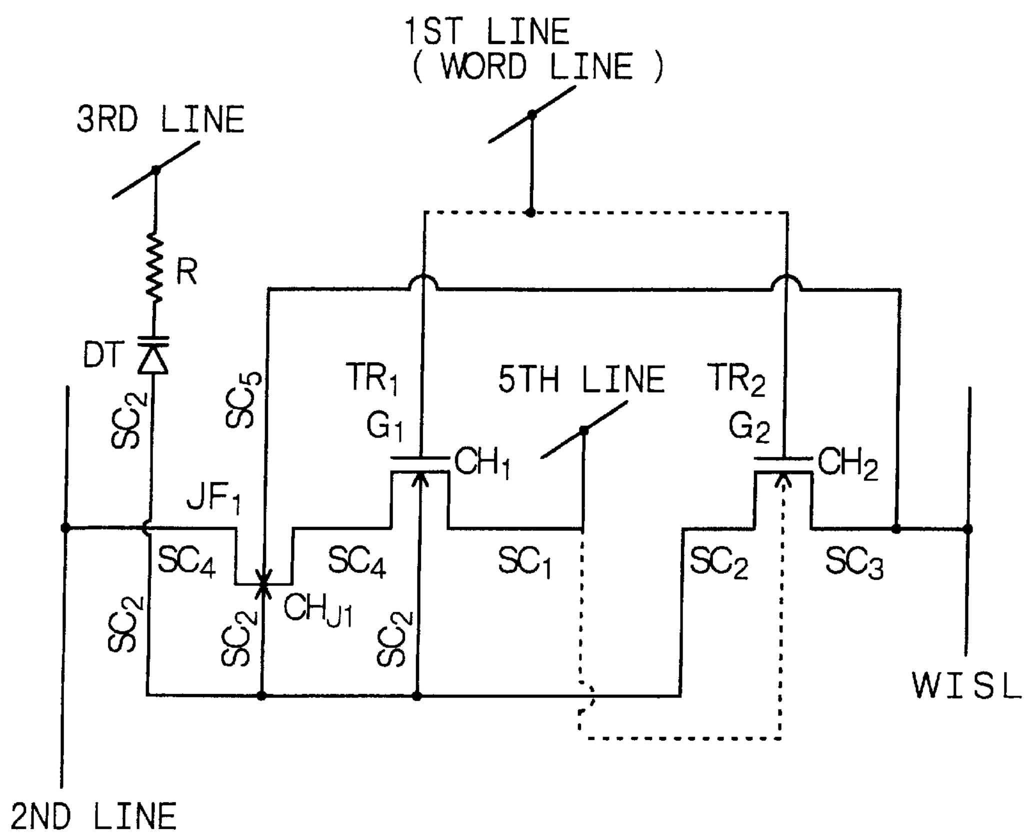
FIG. 110 shows the principle of a variant of the semiconductor memory cell according to the sixth aspect of the present invention.
Figure 111A:
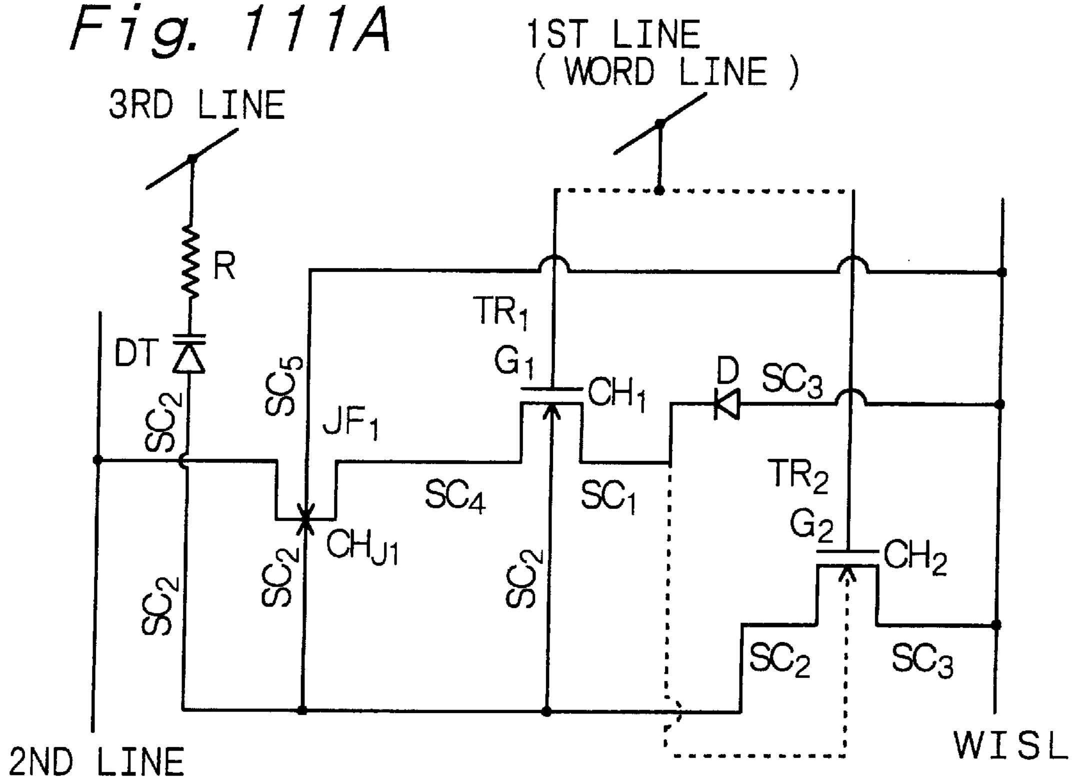
FIGS. 111A and 111B show the principles of variants of the semiconductor memory cell according to the sixth aspect of the present invention.
Figure 111B:
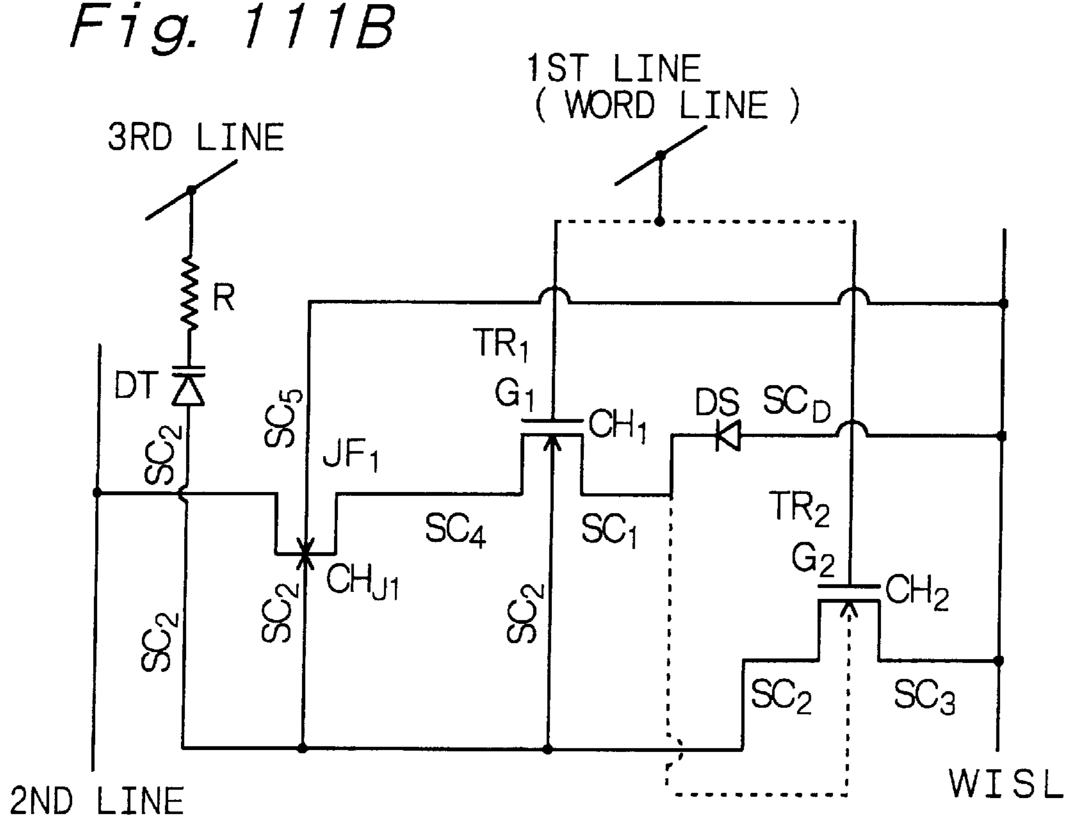
Figure 116:
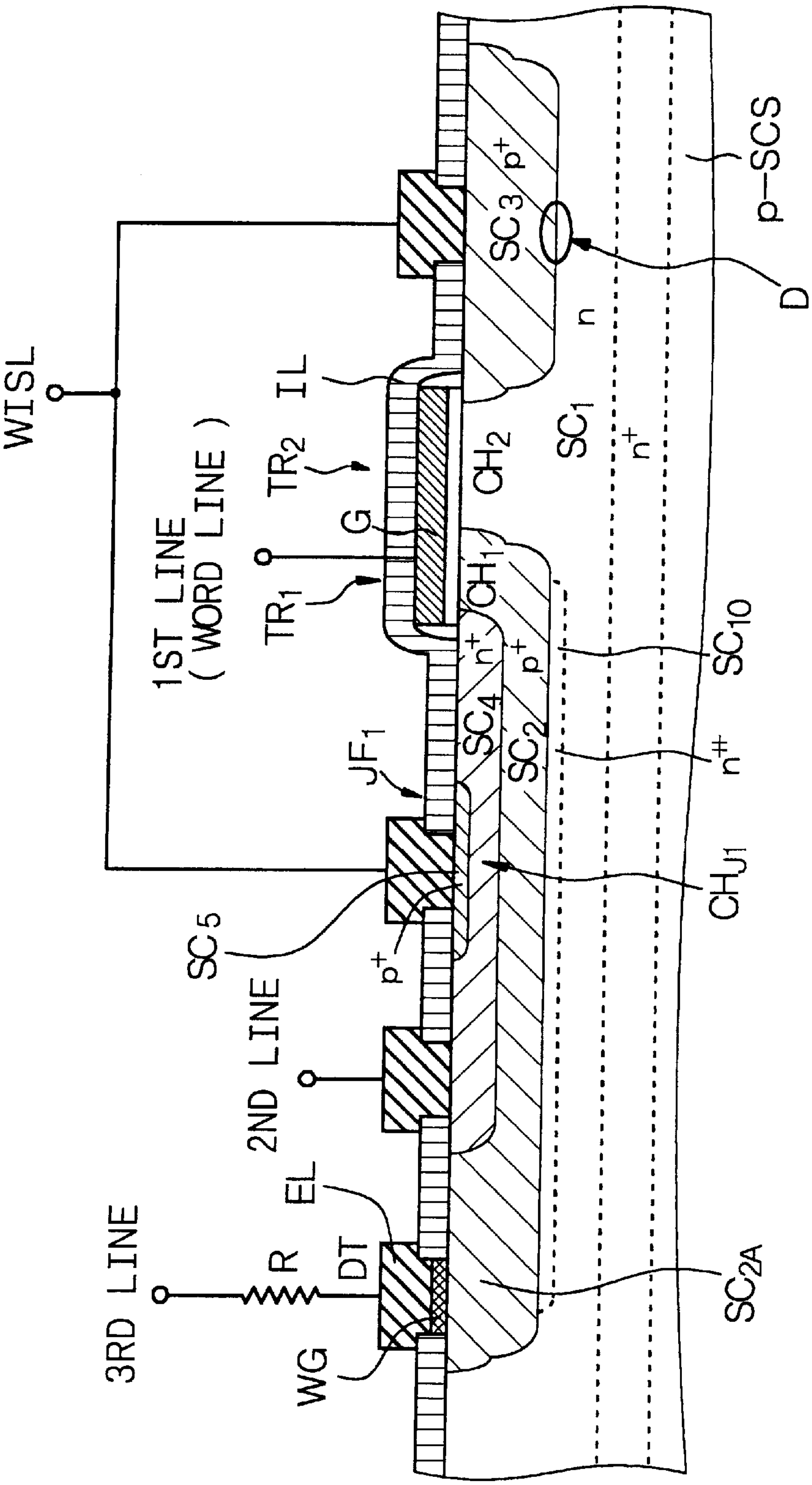
FIG. 116 shows a schematic partial cross-sectional view of a variant of the semiconductor memory cell of Example 10.
Figure 117:
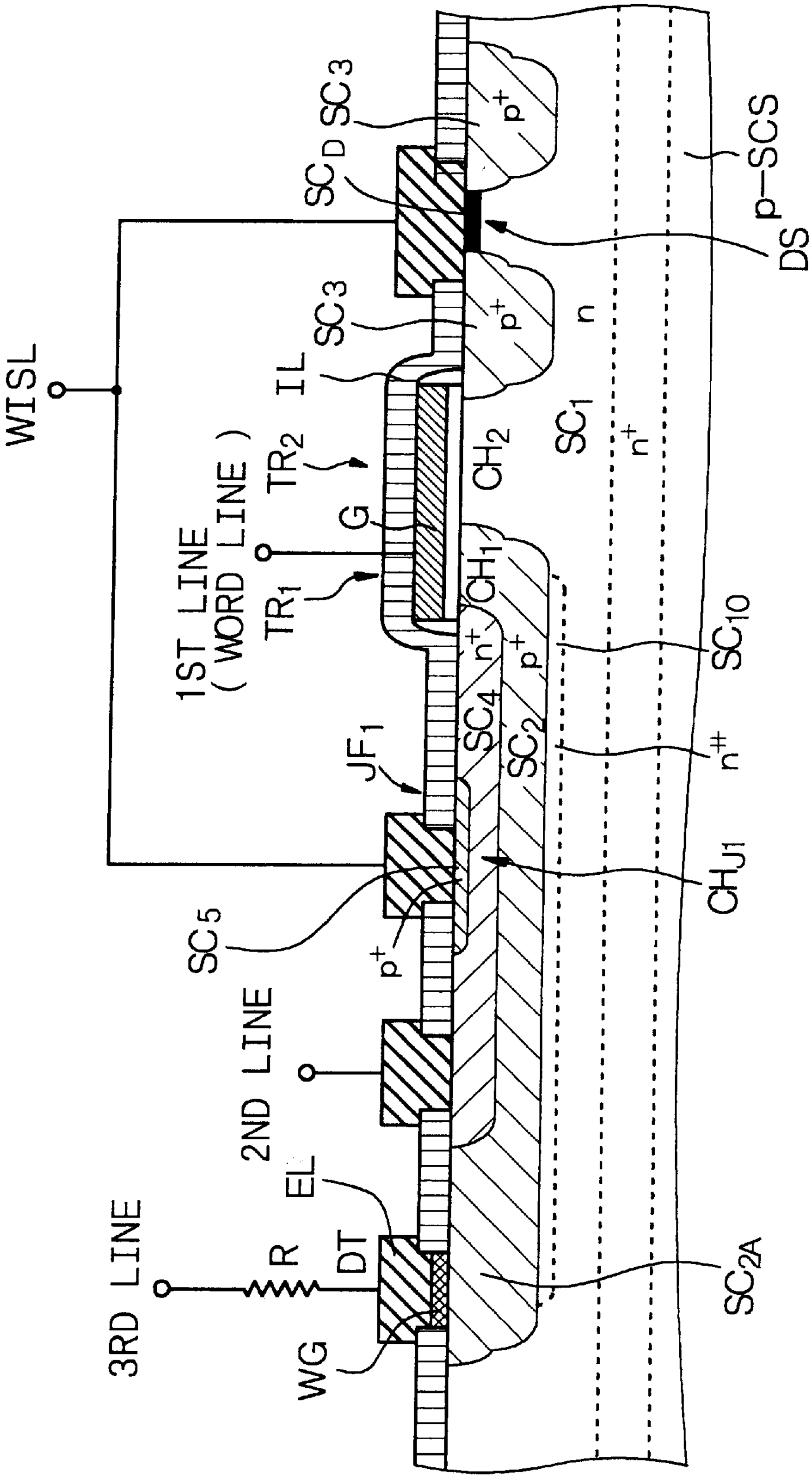
FIG. 117 shows a schematic partial cross-sectional view of a variant of the semiconductor memory cell of Example 10.
Figure 118:
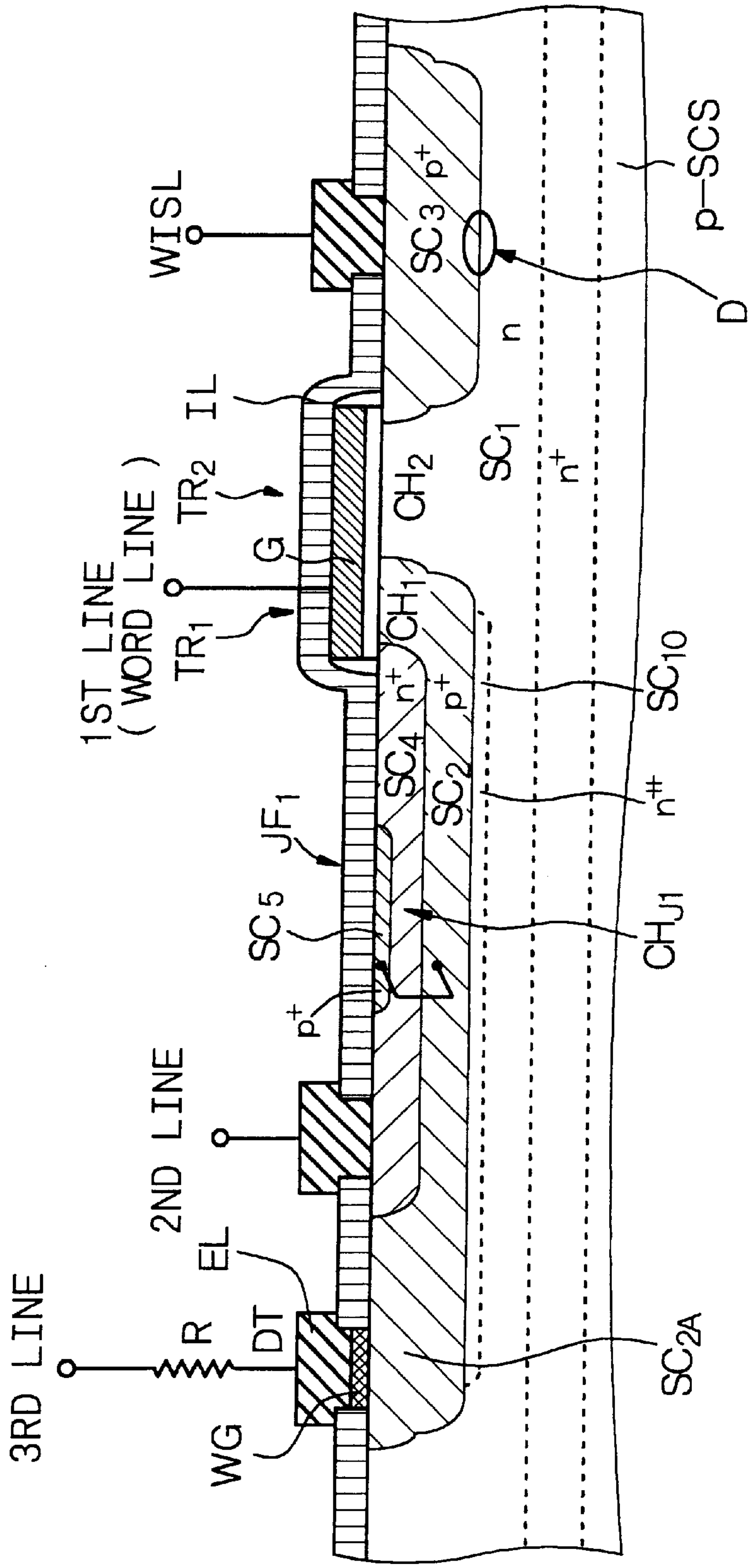
FIG. 118 shows a schematic partial cross-sectional view of a variant of the semiconductor memory cell of Example 10.
Figure 119:
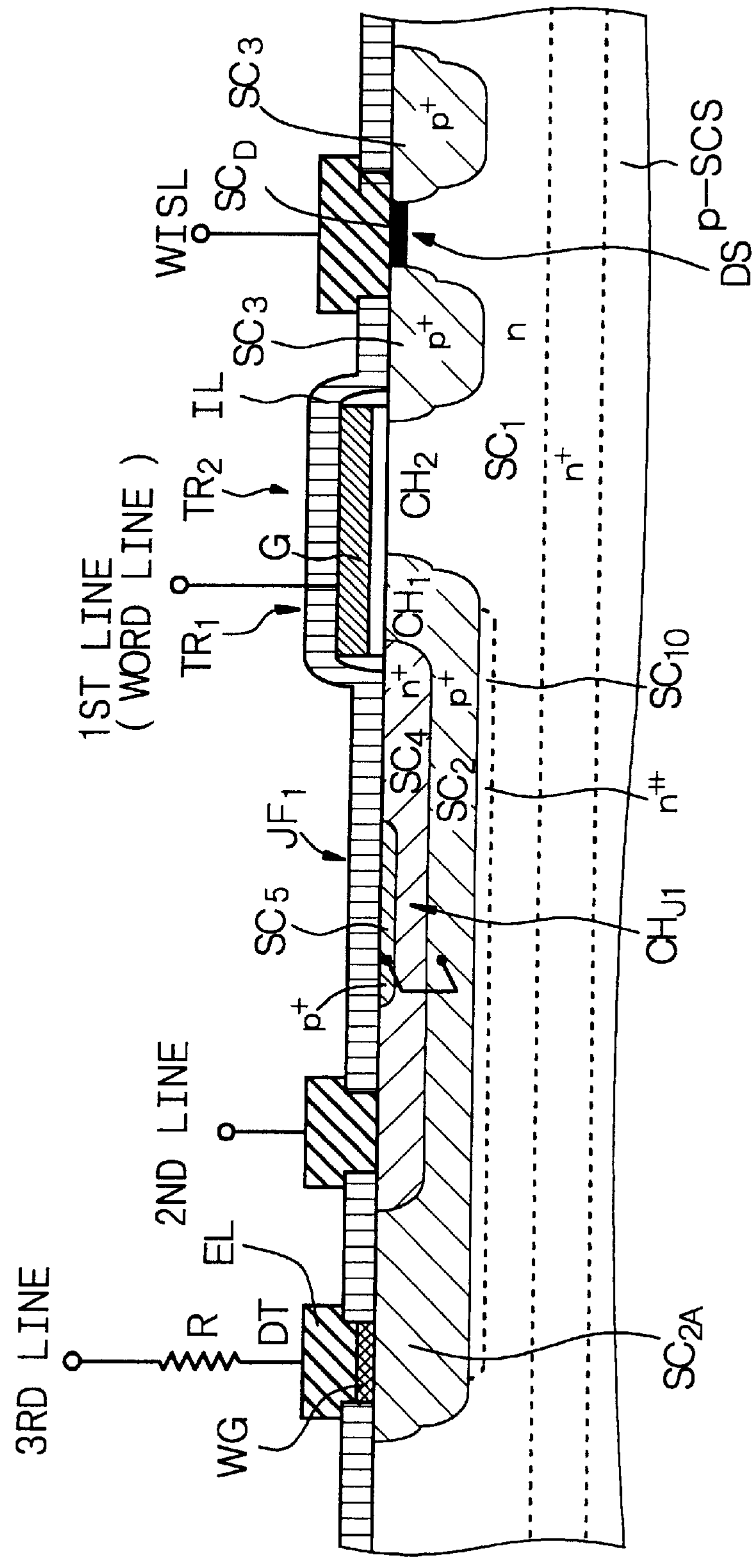
FIG. 119 shows a schematic partial cross-sectional view of a variant of the semiconductor memory cell of Example 10.
Figure 122:
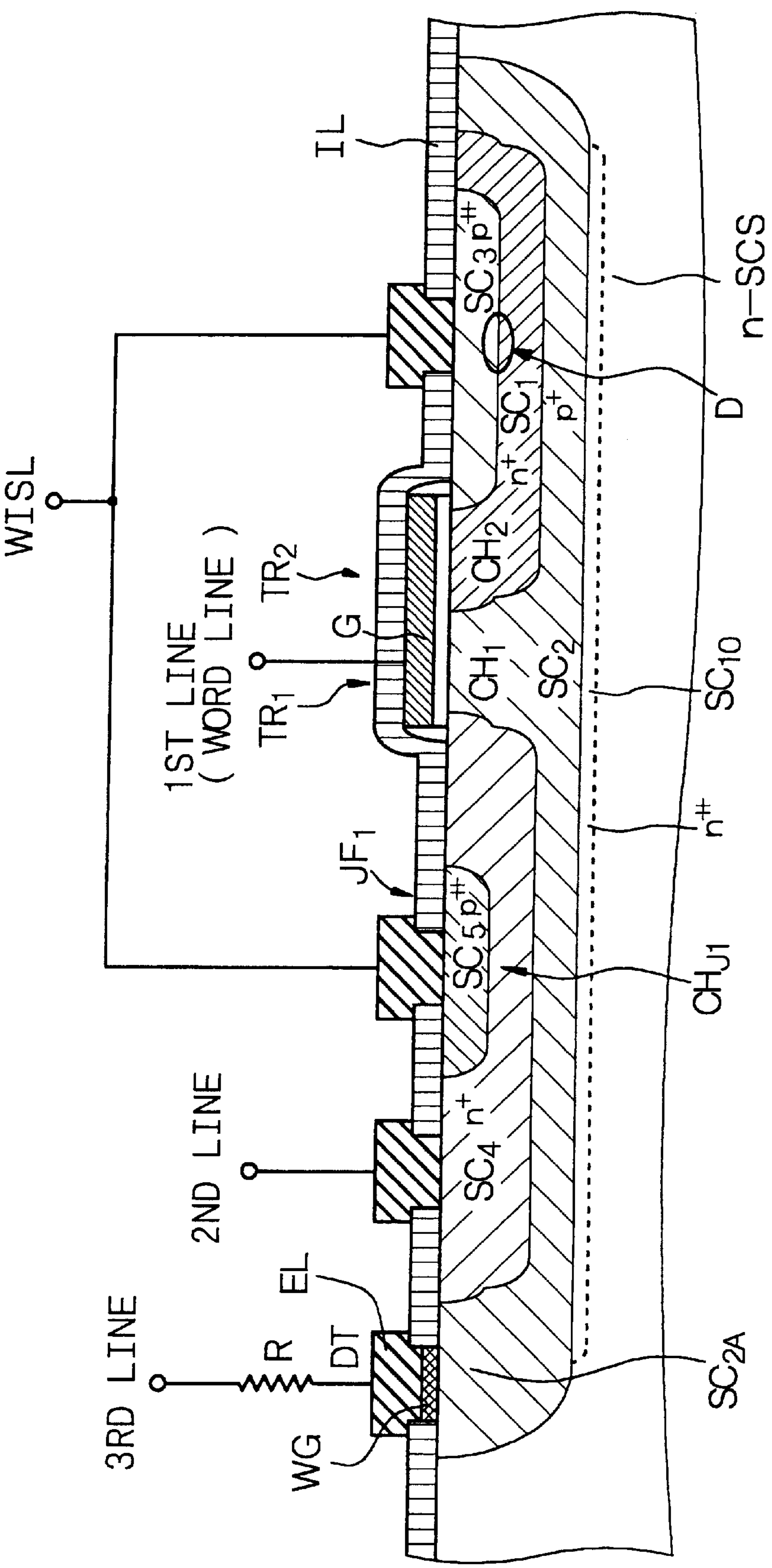
Figure 123:
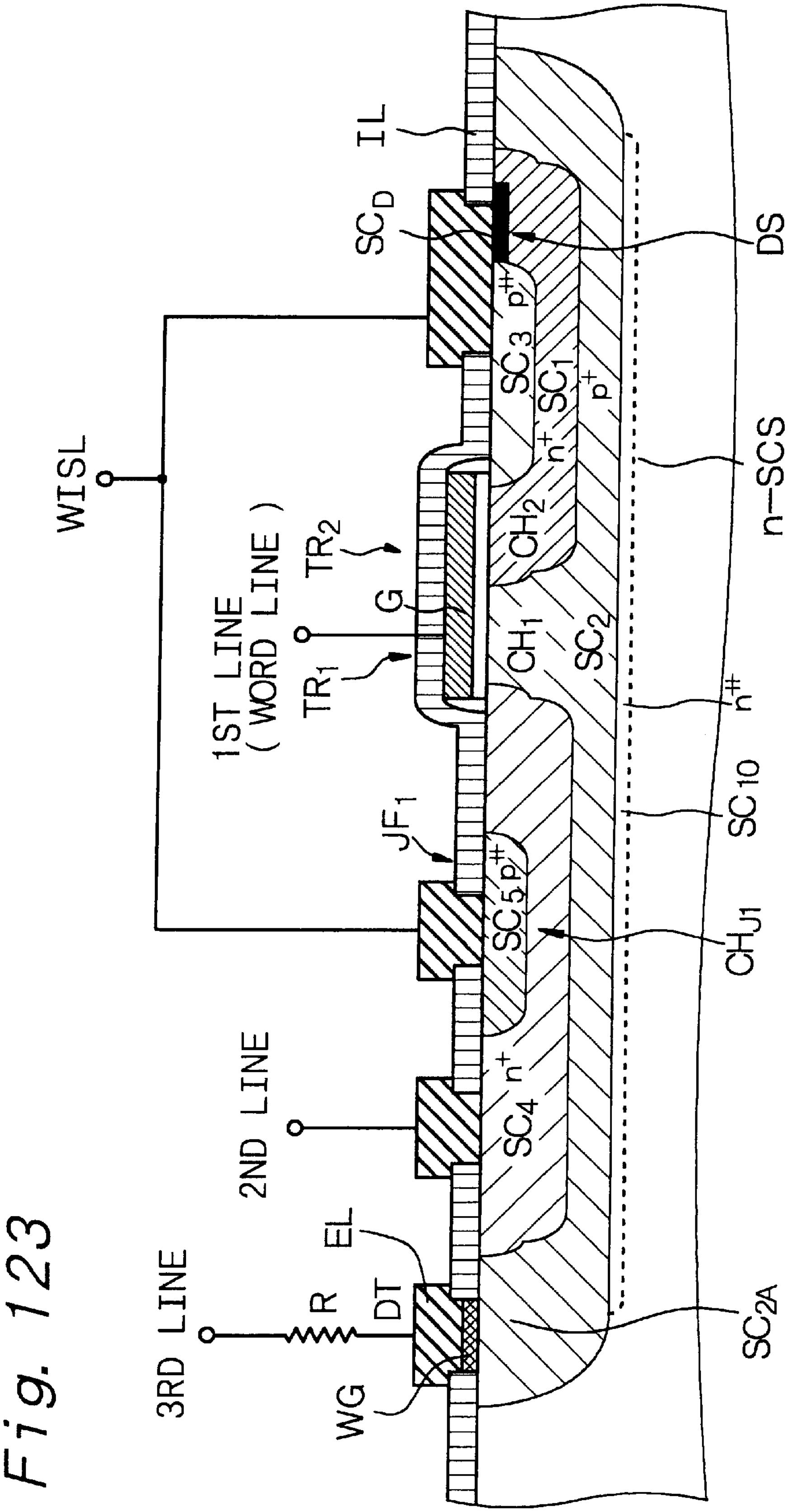
Figure 124:
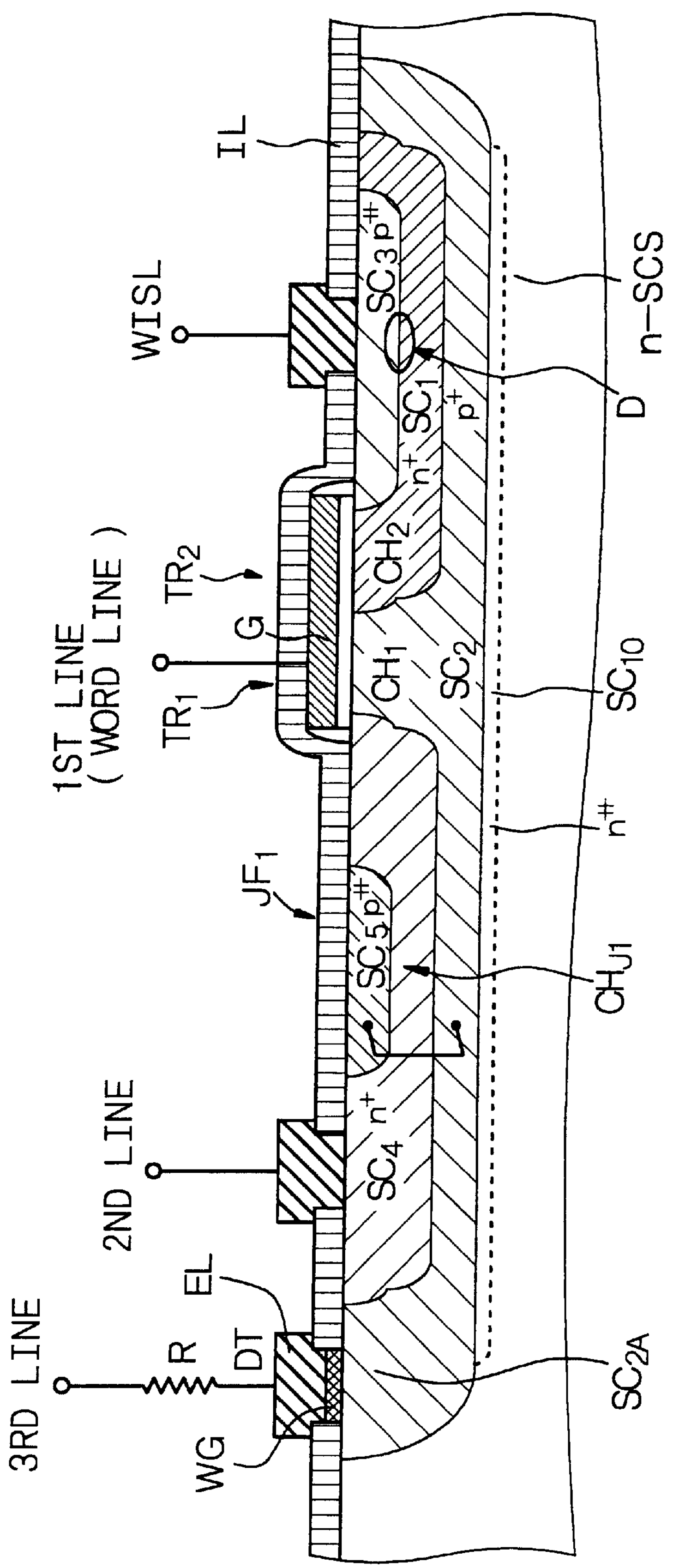
Figure 125:
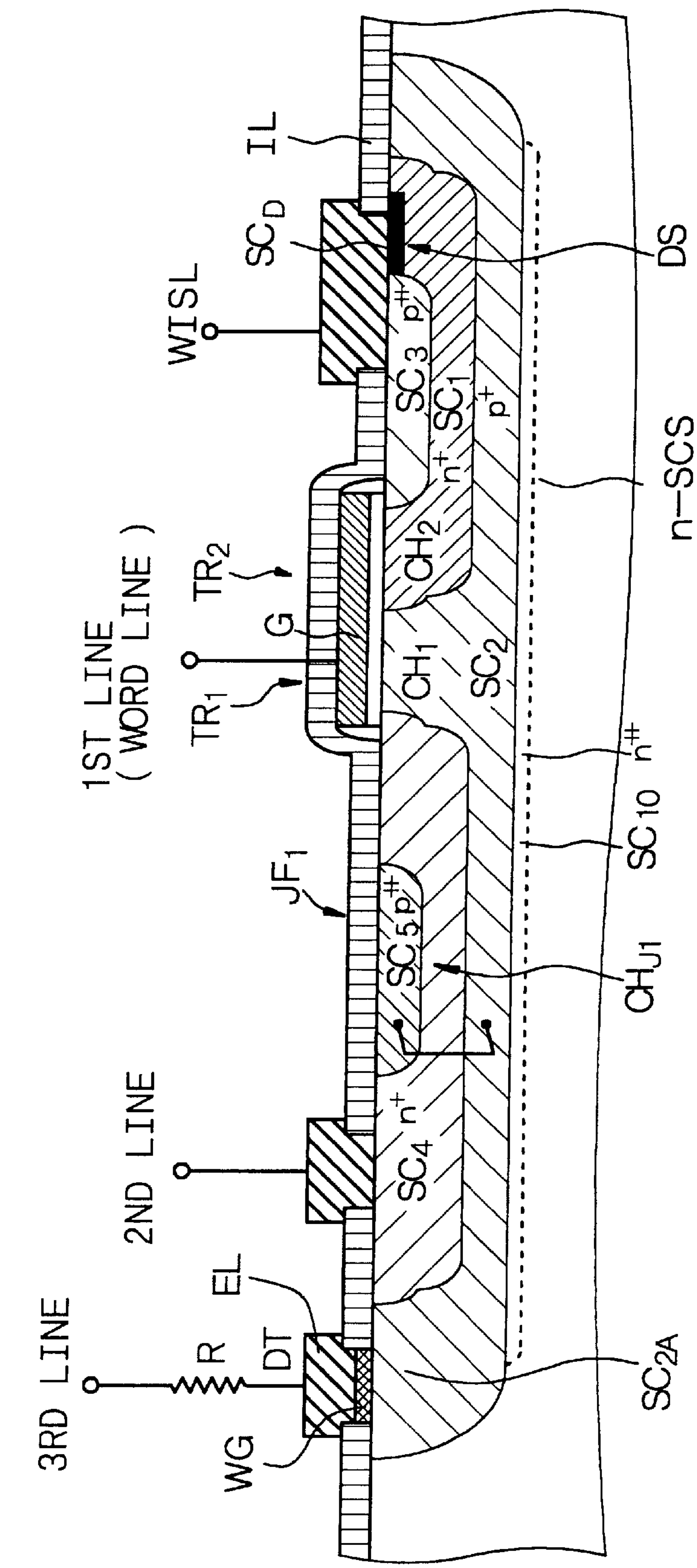

Further, as is shown in the principle drawings of FIG. 110 and FIGS. 111A and 111B and the schematic partial cross-sectional views of FIGS. 116, 117, 122 and 123, there may be employed a constitution in which the fifth region $SC_5$ is connected to the write-in information setting line WISL in place of being connected to the fourth line. Further, as is shown in the principle drawings of FIG. 112 and FIGS. 113A and 113B and the schematic partial cross-sectional views of FIGS. 118, 119, 124 and 125, there may be employed a constitution in which the fifth region $SC_5$ is connected to the second region $SC_2$ in place of being connected to the fourth line. In these cases, as is shown in FIGS. 116, 118, 122 and

124, there may be employed a constitution in which the first region $SC_1$ and the third region $SC_3$ constitute a pn junction diode D, and the first region $SC_1$ is connected to the write-in information setting line WISL through the third region $SC_3$. Otherwise, as is shown in FIGS. 117, 119, 123 and 125, there may be employed a constitution in which there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In these cases where the diode or the majority carrier diode DS is formed, it is preferred to employ a constitution in which the second line is used as a bit line, or a constitution in which the write-in information setting line WISL is used as a bit line as well and a second predetermined potential is applied to the second line.

EXAMPLE 11

Example 11 is concerned with the semiconductor memory cell according to the sixth and eighteenth aspects of the present invention. In the semiconductor memory cell of Example 11, the other gate region of the junction-field-effect transistor $JF_1$ is connected to one gate region of the junction-field-effect transistor $JF_1$ in place of being connected to the fourth line. More specifically, one end of the MIS type diode DT and the other gate region of the junction-field-effect transistor $JF_1$ are formed as a common region. Further, the fifth region $SC_5$ constituting the other gate region of the junction-field-effect transistor $JF_1$ corresponds to an extending region of the channel forming region $CH_1$ of the first transistor $TR_1$.

Figure 127A:
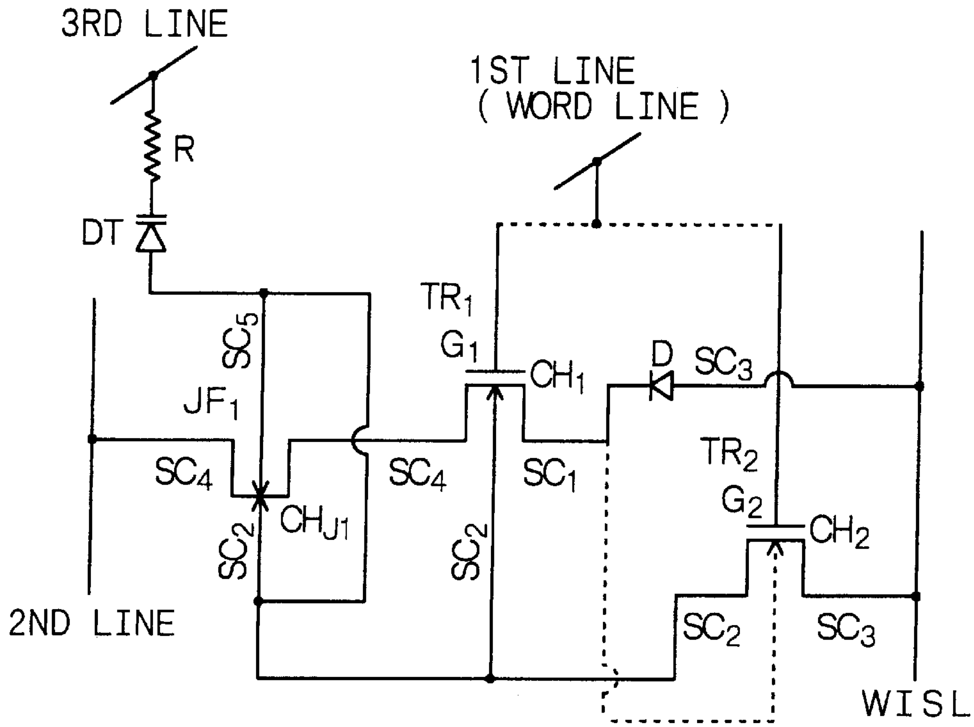
Figure 128:
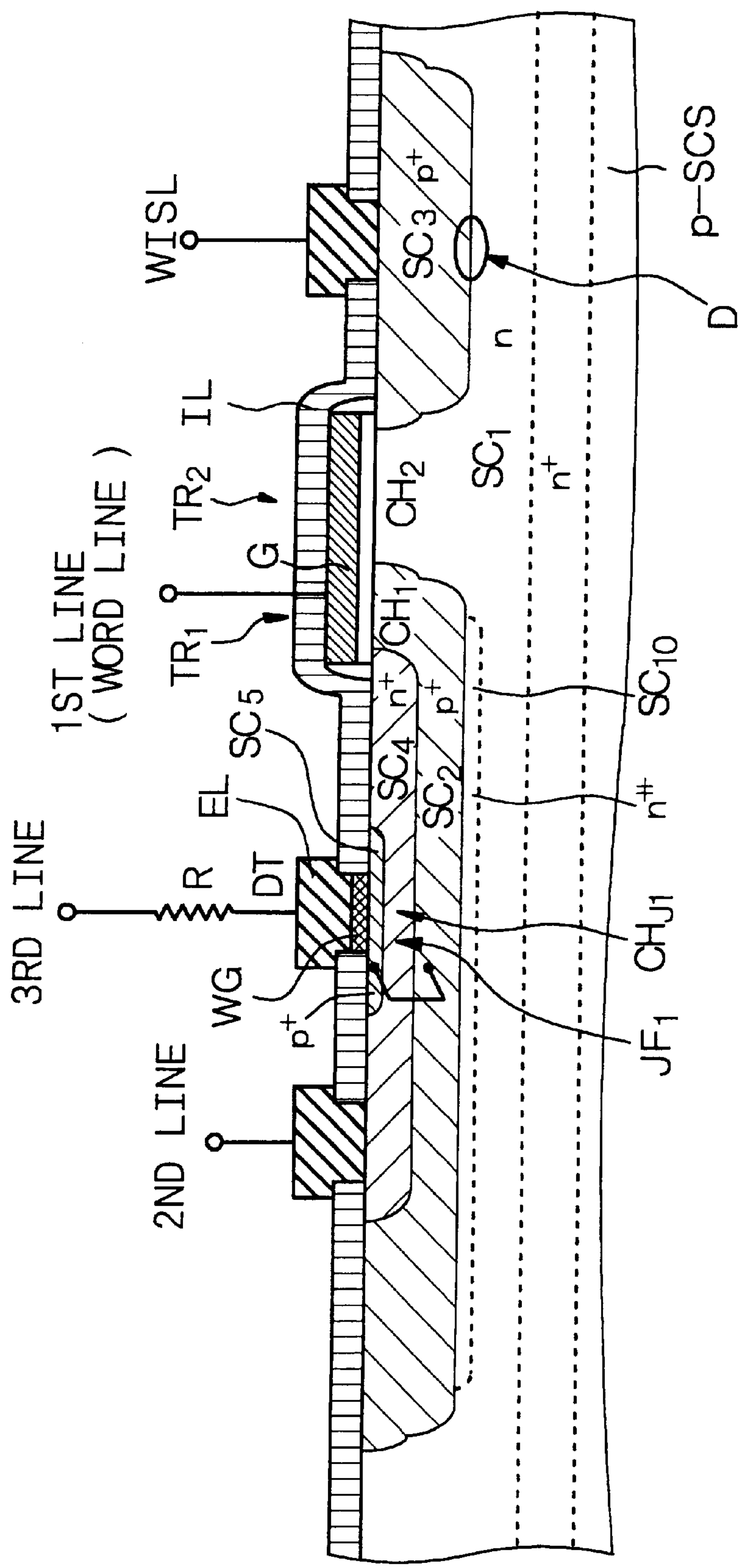
Figure 130:
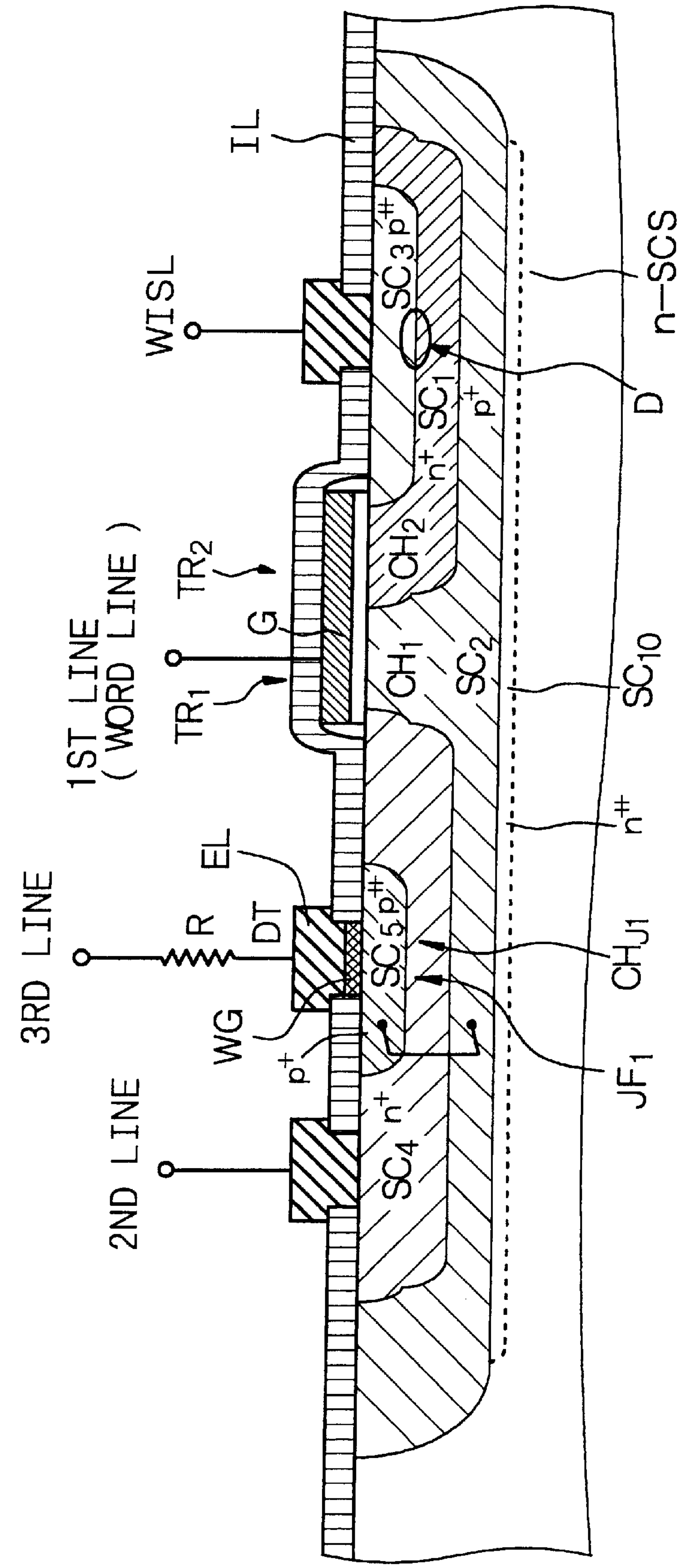

That is, as is shown in the principle drawing of FIG. 127A and the schematic partial cross-sectional views of FIGS. 128 and 130, the semiconductor memory cell of Example 11 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information, the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a semi-conductive fourth region $SC_4$ which is formed in a surface region of the second region $SC_2$ and has the first conductivity type (for example, $n^+$-type), (e) a semi-conductive fifth region $SC_5$ which is formed in a surface region of the fourth region $SC_4$ and has the second conductivity type (for example, $p^+$-type), and (f) the gate G which is formed, through an insulation layer, so as to bridge the first region $SC_1$ and the fourth region $SC_4$ and so as to bridge the second region $SC_2$ and the third region $SC_3$, and is shared by the first transistor $TR_1$ and the second transistor $TR_2$.

In the semiconductor memory cell shown in FIG. 128 and a semiconductor memory cell to be explained later with reference to FIG. 129, the first region $SC_1$ and the second region $SC_2$ are in contact with each other, and specifically, the second region $SC_2$ is formed in a surface region of the first region $SC_1$. In the semiconductor memory cell shown in FIG. 130 and a semiconductor memory cell to be explained later with reference to FIG. 131, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the junction-field-effect transistor $JF_1$, (C-1) the gate regions are formed of the fifth region $SC_5$ and part of the second region $SC_2$ which part is opposed to the fifth region $SC_5$, (C-2) the channel region $CH_{J1}$ is formed of part of the fourth region $SC_4$ which part is interposed between the fifth region $SC_5$ and said part of the second region $SC_2$, (C-3) one source/drain region is formed of the surface region of the fourth region $SC_4$ which surface region extends from one end of the channel region $CH_{J1}$ of the junction-field-effect transistor $JF_1$ and constitutes the other source/drain region of the first transistor $TR_1$, and (C-4) the other source/drain region is formed of a portion of the fourth region $SC_4$ which portion extends from the other end of the channel region $CH_{J1}$ of the junction-field-effect transistor $JF_1$.

Concerning the MIS type diode DT, (D-1) one end thereof is formed of the fifth region $SC_5$, and (D-2) an electrode constituting the other end thereof is formed to be opposed to the fifth region $SC_5$ which constitutes one end of the MIS type diode DT, through a wide gap thin film WG.

The wide gap thin film WG can be composed of a material in which the tunnel transition of carriers is caused depending upon a potential difference between the potential in the fifth region $SC_5$ (corresponding to the extending portion of the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (E) the gate G is connected to a first line (for example, word line) for memory cell selection, (F) the third region $SC_3$ is connected to a write-in information setting line WISL, (G) the portion of the fourth region $SC_4$ which portion constitutes the other source/drain region of the junction-field-effect transistor $JF_1$ is connected to a second line, (H) the fifth region $SC_5$ is connected to the second region $SC_2$, and (I) the electrode EL constituting the other end of the MIS type diode DT is connected to a third line having a predetermined potential.

The first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

Figure 129:
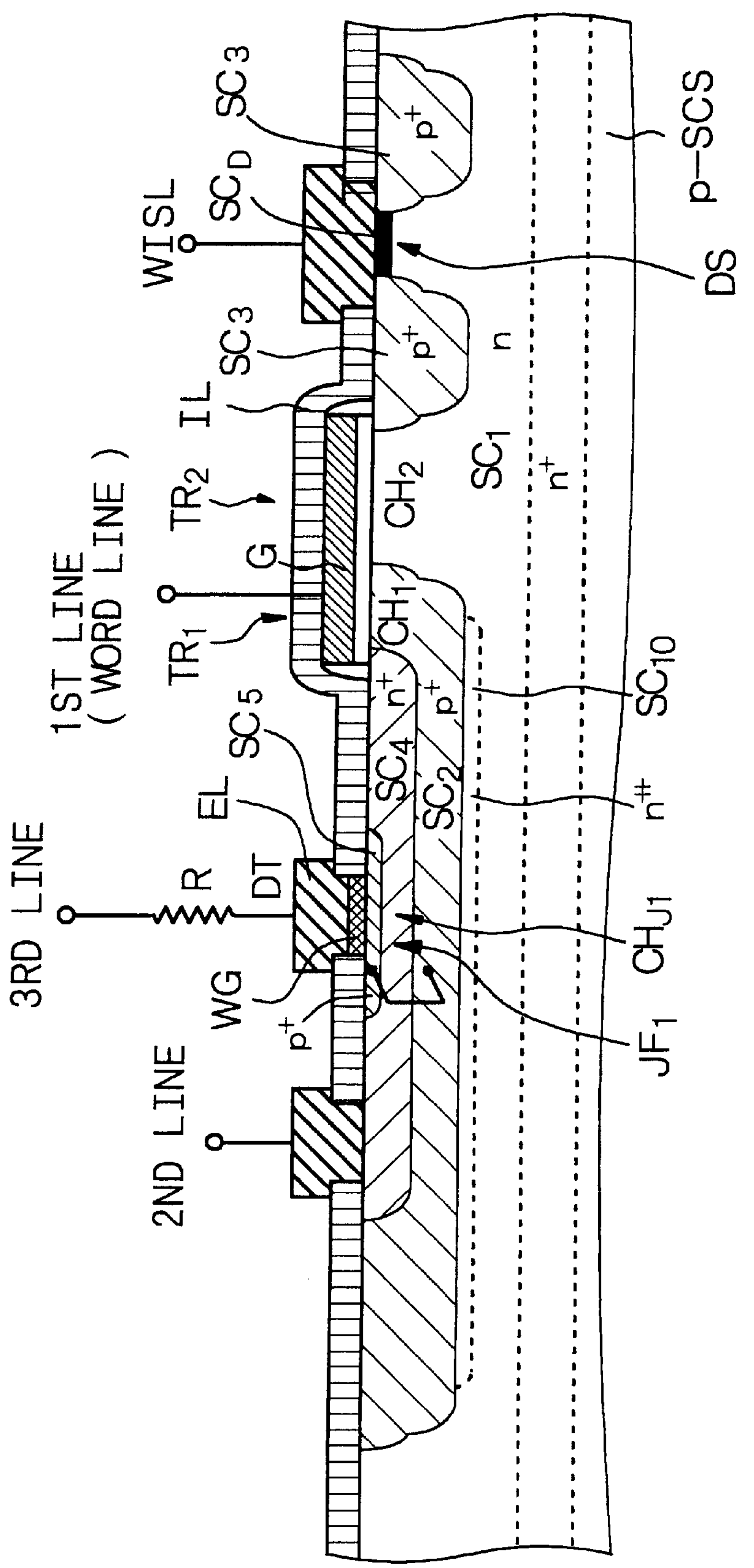

The semiconductor memory cell (specifically, the first region $SC_1$) shown in FIG. 128 or shown in FIG. 129 is formed in a well structure which is formed, for example, in a p-type semiconductor substrate and has the first conductivity type (for example, n-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

Figure 131:
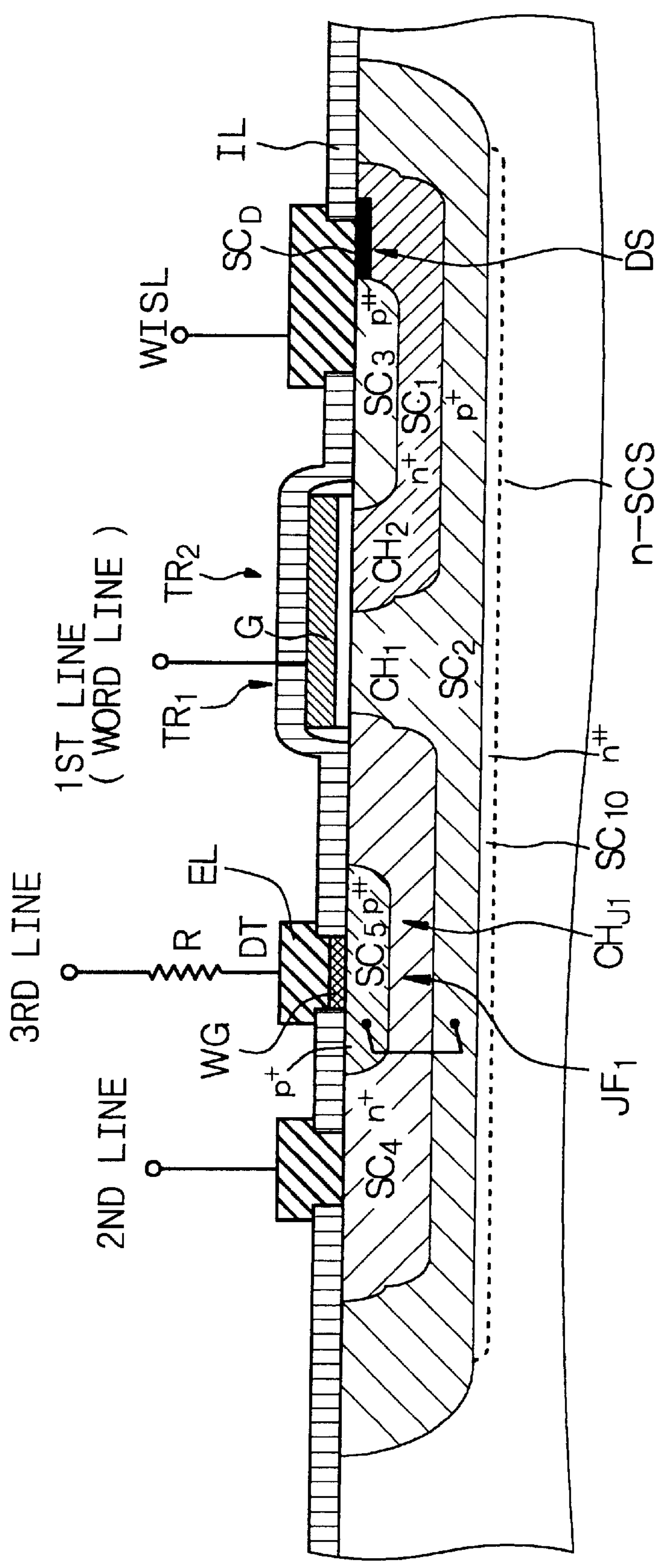

The semiconductor memory cell (specifically, the second region $SC_2$) shown in FIG. 130 or shown in FIG. 131 is formed in a well structure which is formed, for example, in a n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

The junction-field-effect transistor $JF_1$ is formed by (X) optimizing the distance between the facing gate regions (the fifth region $SC_5$ and the part of the second region $SC_2$ which part is opposed to the fifth region $SC_5$), that is, the thickness of the channel region $CH_{J1}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J1}$.

Figure 126:
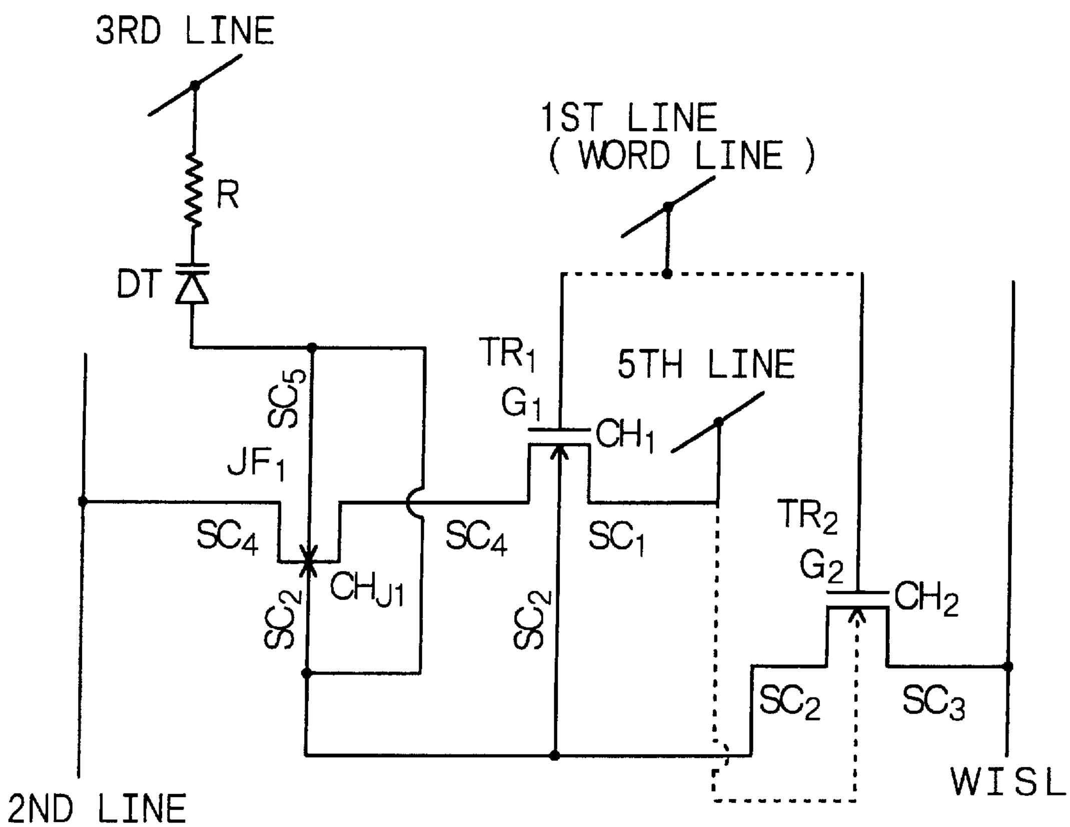

In the semiconductor memory cell shown in FIG. 128, there may be employed an embodiment in which the formation of the pn junction diode D is omitted and a second high-concentration-impurity-containing layer (not shown) which has the first conductivity type (for example, $n^{++}$-type) and works as a fifth line is formed below the first region $SC_1$. In the semiconductor memory cell shown in FIG. 130, there may be employed an embodiment in which the formation of the pn junction diode D is omitted and the first region $SC_1$ is connected to a fifth line (not shown). FIG. 126 shows the principle of these semiconductor memory cells. In these cases, it is preferred to employ a constitution in which the second line is used as a bit line and a second predetermined potential is applied to the fifth line, or a constitution in which the fifth line is used as a bit line and a second predetermined potential is applied to the second line.

Figure 127B:
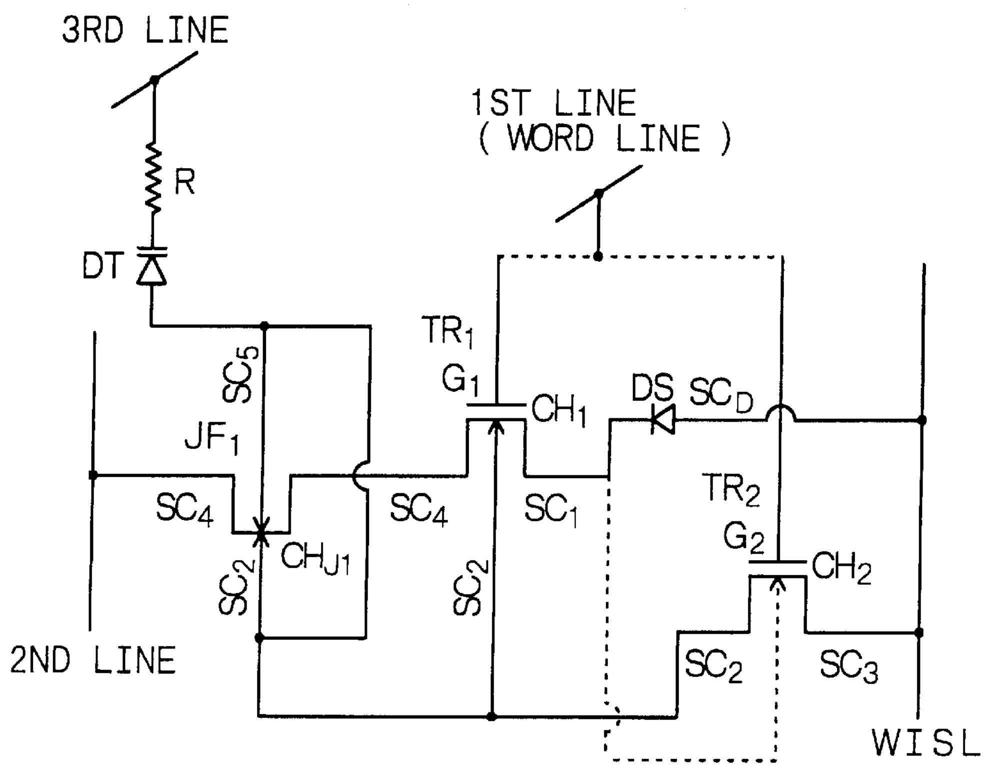

In the semiconductor memory cells shown in the principle drawing of FIG. 127B and the schematic partial cross-sectional views of FIGS. 129 and 131, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line. In FIG. 129, the diode-constituting region $SC_D$ is formed in the center of the third region $SC_3$ and is surrounded by the third region $SC_3$, while the position of the diode-constituting region $SC_D$ shall not be limited thereto.

EXAMPLE 12

Example 12 is concerned with the semiconductor memory cell according to the seventh and nineteenth aspects of the present invention. The semiconductor memory cell of Example 12 differs from the semiconductor memory cell of Example 10 in that a third transistor $TR_3$ for current control is formed. That is, as is shown in the principle drawing of FIG. 133A, the semiconductor memory cell of Example 12 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate G capacitively coupled with the channel forming region $CH_3$, (4) a junction-field-effect transistor $JF_1$ for current control, having source/drain regions, a channel region $CH_{J1}$ and gate regions, and (5) an MIS type diode DT for retaining information.

In the semiconductor memory cell of Example 12, one source/drain region of the first transistor $TR_1$ corresponds to the channel forming region $CH_2$ of the second transistor $TR_2$, the other source/drain region of the first transistor $TR_1$ corresponds to one source/drain region of the junction-field-effect transistor $JF_1$, one source/drain region of the second transistor $TR_2$ corresponds to the channel forming region $CH_1$ of the first transistor $TR_1$, corresponds to one gate region of the junction-field-effect transistor $JF_1$ and corresponds to one source/drain region of the third transistor $TR_3$, the other source/drain region of the third transistor $TR_3$ corresponds to the other gate region of the junction-field-effect transistor $JF_1$, and one end of the MIS type diode DT is formed of an extending portion of the channel forming region $CH_1$ of the first transistor $TR_1$, the other end of the MIS type diode DT is formed of an electrode EL composed of a conductive material, and the electrode EL is connected to a line (third line) having a predetermined potential.

Further, the gate G of the first transistor $TR_1$, the gate G of the second transistor $TR_2$ and the gate G of the third transistor $TR_3$ are connected to a first line (for example, word line) for memory cell selection, the other source/drain regions of the first transistor $TR_1$ is connected to a second line through the junction-field-effect transistor $JF_1$, one source/drain region of the first transistor $TR_1$ is connected to a write-in information setting line WISL through a diode D, the other source/drain region of the second transistor $TR_2$ is connected to the write-in information setting line WISL, and the other end of the MIS type diode DT is connected to a third line (corresponding to the above line) having a predetermined potential through a high-resistance element R. It is preferred to employ a constitution in which the second line is used as a bit line, or a constitution in which the write-in information setting line WISL is used as a bit line as well and a second predetermined potential is applied to the second line.

As shown in the schematic partial cross-sectional views of FIGS. 134 and 136, the semiconductor memory cell of Example 12 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate G capacitively coupled with the channel forming region $CH_3$, (4) a junction-field-effect transistor $JF_1$ for current control, having source/drain regions, a channel region $CH_{J1}$ and gate regions, and (5) an MIS type diode DT for retaining information. the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a semi-conductive fourth region $SC_4$ which is formed in a surface region of the second region $SC_2$ and has the first conductivity type (for example, $n^+$-type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^+$-type) or which is conductive and is composed of a silicide, a metal or a metal compound, and (f) the gate G which is formed, through an insulation layer, so as to bridge the first region $SC_1$ and the fourth region $SC_4$, so as to bridge the second region $SC_2$ and the third region $SC_3$ and so as to bridge the second region $SC_2$ and the fifth region $SC_5$, and is shared by the first transistor $TR_1$, the second transistor $TR_2$ and the third transistor $TR_3$.

In the semiconductor memory cell shown in FIG. 134 and a semiconductor memory cell to be explained later with reference to FIG. 135, the first region $SC_1$ and the second region $SC_2$ are in contact with each other, and specifically, the second region $SC_2$ is formed in a surface region of the first region $SC_1$. In the semiconductor memory cell shown in FIG. 136 and a semiconductor memory cell to be explained later with reference to FIG. 137, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the second transistor $TR_2$, (B-1) one source/drain region is formed of the surface region of the second region $SC_2$, (B-2) the other source/drain region is formed of the third region $SC_3$, and (B-3) the channel forming region $CH_2$ is formed of the surface region of the first region $SC_1$.

Concerning the third transistor $TR_3$, (C-1) one source/drain region is formed of the surface region of the second region $SC_2$, (C-2) the other source/drain region is formed of the fifth region $SC_5$, and (C-3) the channel forming region $CH_3$ is formed of the surface region of the fourth region $SC_4$.

Concerning the junction-field-effect transistor $JF_1$, (D-1) the gate regions are formed of the fifth region $SC_5$ and part of the second region $SC_2$ which part is opposed to the fifth region $SC_5$, (D-2) the channel region $CH_{J1}$ is formed of part of the fourth region $SC_4$ which part is interposed between the fifth region $SC_5$ and said part of the second region $SC_2$, (D-3) one source/drain region is formed of the surface region of the fourth region $SC_4$ which surface region extends from one end of the channel region $CH_{J1}$ of the junction-field-effect transistor $JF_1$ and constitutes the other source/drain region of the first transistor $TR_1$ and the channel forming region $CH_3$ of the third transistor $TR_3$, and (D-4) the other source/drain region is formed of a portion of the fourth region $SC_4$ which portion extends from the other end of the channel region $CH_{J1}$ of the junction-field-effect transistor $JF_1$.

Concerning the MIS type diode DT, (E-1) one end thereof is formed of part $SC_{2A}$ of the second region $SC_2$, and (E-2) an electrode constituting the other end thereof is formed to be opposed to said part $SC_{2A}$ of the second region $SC_2$ which part $SC_{2A}$ constitutes one end of the MIS type diode DT, through a wide gap thin film WG.

The wide gap thin film WG can be composed of a material in which the tunnel transition of carriers is caused depending upon a potential difference between the potential in the second region $SC_2$ (the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (F) the gate G is connected to a first line (for example, word line) for memory cell selection, (G) the third region $SC_3$ is connected to a write-in information setting line WISL, (H) the portion of the fourth region $SC_4$ which portion constitutes the other source/drain region of the junction-field-effect transistor $JF_1$ is connected to a second line, and (I) the electrode EL constituting the other end of the MIS type diode DT is connected to a third line having a predetermined potential.

The first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

The junction-field-effect transistor $JF_1$ is formed by (X) optimizing the distance between the facing gate regions (the fifth region $SC_5$ and the part of the second region $SC_2$ which part is opposed to the fifth region $SC_5$), that is, the thickness of the channel region $CH_{J1}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J1}$.

The semiconductor memory cell (specifically, the first region $SC_1$) shown in FIG. 134 is formed in a well structure which is formed, for example, in an p-type semiconductor substrate and has the first conductivity type (for example, n-type). Further, when a first high-concentration-impurity-containing layer $SC_{10}$ having the first conductivity type (for example, n++-type) is formed below the second region $SC_2$, the potential or charge to be stored in the channel forming region $CH_1$ of the first transistor $TR_1$ for readout can be increased. The semiconductor memory cell (specifically, the second region $SC_2$) shown in FIG. 136 is formed in a well structure which is formed, for example, in an n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

In the semiconductor memory cell shown in FIG. 134 or FIG. 136, as is shown in the principle drawing of FIG. 132, there may be employed an embodiment in which the formation of the pn junction diode D is omitted and the first region $SC_1$ corresponding to one source/drain region of the first transistor $TR_1$ is connected to a fourth line (not shown in FIG. 134 or 136). That is, for example, in the semiconductor memory cell shown in FIG. 134, a second high-concentration-impurity-containing layer $SC_{11}$ which has a first conductivity type (for example, $n^{++}$-type) and works as the fourth line can be formed below the first region $SC_1$. In these cases, it is preferred to employ a constitution in which the second line is used as a bit line and a second predetermined potential is applied to the fourth line, or a constitution in which the fourth line is used as a bit line and a second predetermined potential is applied to the second line.

In the semiconductor memory cell shown in the schematic partial cross-sectional view of FIG. 135 or FIG. 137 and the principle drawing of FIG. 133B, there may be employed a constitution in which there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

EXAMPLE 13

The Example 13 is concerned with the semiconductor memory cell according to the eighth and twentieth aspects of the present invention. The semiconductor memory cell of Example 13 differs from the semiconductor memory cell of Example 12 in that one end of the MIS type diode DT and the other gate region of the junction-field-effect transistor $JF_1$ are formed as a common region.

That is, as is shown in the principle drawing of FIG. 139A, the semiconductor memory cell of Example 13 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate G capacitively coupled with the channel forming region $CH_3$, (4) a junction-field-effect transistor $JF_1$ for current control, having source/drain regions, a channel region $CH_{J1}$ and gate regions, and (5) an MIS type diode DT for retaining information.

In the semiconductor memory cell of Example 13, one source/drain region of the first transistor $TR_1$ corresponds to the channel forming region $CH_2$ of the second transistor $TR_2$, the other source/drain region of the first transistor $TR_1$ corresponds to one source/drain region of the junction-field-effect transistor $JF_1$, one source/drain region of the second transistor $TR_2$ corresponds to the channel forming region $CH_1$ of the first transistor $TR_1$, corresponds to one gate region of the junction-field-effect transistor $JF_1$ and corresponds to one source/drain region of the third transistor $TR_3$, the other source/drain region of the third transistor $TR_3$ corresponds to the other gate region of the junction-field-effect transistor $JF_1$, and one end of the MIS type diode DT corresponds to the other source/drain region of the third transistor $TR_3$, the other end of the MIS type diode DT is formed of an electrode EL composed of a conductive material, and the electrode EL is connected to a line (third line) having a predetermined potential.

Further, the gate G of the first transistor $TR_1$, the gate G of the second transistor $TR_2$ and the gate of the third transistor $TR_3$ are connected to a first line (for example, word line) for memory cell selection, the other source/drain regions of the first transistor $TR_1$ is connected to a second line through the junction-field-effect transistor $JF_1$, one source/drain region of the first transistor $TR_1$ is connected to a write-in information setting line WISL through a diode D, the other source/drain region of the second transistor $TR_2$ is connected to the write-in information setting line WISL, and the other end of the MIS type diode DT is connected to a third line (corresponding to the above line) having a predetermined potential through a high-resistance element R. It is preferred to employ a constitution in which the second line is used as a bit line, or a constitution in which the write-in information setting line WISL is used as a bit line as well and a second predetermined potential is applied to the second line.

In another embodiment, as shown in the schematic partial cross-sectional views of FIGS. 140 and 142, the semiconductor memory cell of Example 13 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate G capacitively coupled with the channel forming region $CH_3$, (4) a junction-field-effect transistor $JF_1$ for current control, having source/drain regions, a channel region $CH_{J1}$ and gate regions, and (5) an MIS type diode DT for retaining information, the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a semi-conductive fourth region $SC_4$ which is formed in a surface region of the second region $SC_2$ and has the first conductivity type (for example, $n^+$-type), (e) a semi-conductive fifth region $SC_5$ which is formed in a surface region of the fourth region $SC_4$ and has the second conductivity type (for example, $p^+$-type), and (f) the gate G which is formed, through an insulation layer, so as to bridge the first region $SC_1$ and the fourth region $SC_4$, so as to bridge the second region $SC_2$ and the third region $SC_3$ and so as to bridge the second region $SC_2$ and the fifth region $SC_5$, and is shared by the first transistor $TR_1$, the second transistor $TR_2$ and the third transistor $TR_3$.

In the semiconductor memory cell shown in FIG. 140 and a semiconductor memory cell to be explained later with reference to FIG. 141, the first region $SC_1$ and the second region $SC_2$ are in contact with each other, and specifically, the second region $SC_2$ is formed in a surface region of the first region $SC_1$. In the semiconductor memory cell shown in FIG. 142 and a semiconductor memory cell to be explained later with reference to FIG. 143, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the second transistor $TR_2$, (B-1) one source/drain region is formed of the surface region of the second region $SC_2$, (B-2) the other source/drain region of the second transistor $TR_2$ is formed of the third region $SC_3$, and (B-3) the channel forming region $CH_2$ is formed of the surface region of the first region $SC_1$.

Concerning the third transistor $TR_3$, (C-1) one source/drain region is formed of the surface region of the second region $SC_2$, (C-2) the other source/drain region of the third transistor $TR_3$ is formed of the fifth region $SC_5$, and (C-3) the channel forming region $CH_3$ is formed of the surface region of the fourth region $SC_4$.

Concerning the junction-field-effect transistor $JF_1$, (D-1) the gate regions are formed of the fifth region $SC_5$ and part of the second region $SC_2$ which part is opposed to the fifth region $SC_5$, (D-2) the channel region $CH_{J1}$ is formed of part of the fourth region $SC_4$ which part is interposed between the fifth region $SC_5$ and said part of the second region $SC_2$, (D-3) one source/drain region is formed of the surface region of the fourth region $SC_4$ which surface region extends from one end of the channel region $CH_{J1}$ of the junction-field-effect transistor $JF_1$ and constitutes the other source/drain region of the first transistor $TR_1$ and the channel forming region $CH_3$ of the third transistor $TR_3$, and (D-4) the other source/drain region is formed of a portion of the fourth region $SC_4$ which portion extends from the other end of the channel region $CH_{J1}$ of the junction-field-effect transistor $JF_1$.

Further, concerning the MIS type diode DT, (E-1) one end thereof is formed of the fifth region $SC_5$, and (E-2) an electrode constituting the other end thereof is formed to be opposed to the fifth region $SC_5$ which constitutes one end of the MIS type diode DT, through a wide gap thin film WG.

The wide gap thin film WG can be composed of a material in which the tunnel transition of carriers is caused depending upon a potential difference between the potential in the fifth region $SC_5$ (the other source/drain region of the third transistor $TR_3$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the semiconductor memory cell, further, (F) the gate G is connected to a first line (for example, word line) for memory cell selection, (G) the third region $SC_3$ is connected to a write-in information setting line WISL, (H) the portion of the fourth region $SC_4$ which portion constitutes the other source/drain region of the junction-field-effect transistor $JF_1$ is connected to a second line, and (I) the electrode EL constituting the other end of the MIS type diode DT is connected to a third line having a predetermined potential.

In the semiconductor memory cell of Example 13, an impurity-containing layer $SC_{4A}$ having the second conductivity type (for example, $p^+$-type) is formed in the surface region of the fourth region $SC_4$ which surface region constitutes the channel forming region $CH_3$ of the third transistor $TR_3$. Therefore, while information is retained, and, for example, if the potential in the first line is turned to 0 volt, the third transistor $TR_3$ is brought into an on-state, and the MIS type diode DT and the channel forming region $CH_1$ of the first transistor $TR_1$ are put in a continuity. The impurity concentration of the impurity-containing layer $SC_{4A}$ is adjusted such that the third transistor $TR_3$ is brought into an off-state by the potential in the first line applied during the reading of information.

In the semiconductor memory cells shown in FIGS. 140 and 142, the first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

The junction-field-effect transistor $JF_1$ is formed by (X) optimizing the distance between the facing gate regions (the fifth region $SC_5$ and the part of the second region $SC_2$ which part is opposed to the fifth region $SC_5$), that is, the thickness of the channel region $CH_{J1}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J1}$.

The semiconductor memory cell (specifically, the first region $SC_1$) shown in FIG. 140 is formed in a well structure which is formed, for example, in an p-type semiconductor substrate and has the first conductivity type (for example, n-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased. The semiconductor memory cell (specifically, the second region $SC_2$) shown in FIG. 142 is formed in a well structure which is formed, for example, in an n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

In the semiconductor memory cell shown in FIG. 140 or FIG. 142, as is shown in the principle drawing of FIG. 138, there may be employed an embodiment in which the formation of the pn junction diode D is omitted and the first region $SC_1$ corresponding to one source/drain region of the first transistor $TR_1$ is connected to the fourth line (not shown in FIGS. 140 or 142). That is, for example, in the semiconductor memory cell shown in FIG. 140, a second high-concentration-impurity-containing layer $SC_{11}$ which has the first conductivity type (for example, $n^{++}$-type) and works as the fourth line can be formed below the first region $SC_1$. In these cases, it is preferred to employ a constitution in which the second line is used as a bit line and a second predetermined potential is applied to the fourth line, or a constitution in which the fourth line is used as a bit line and a second predetermined potential is applied to the second line.

In the semiconductor memory cells shown in the schematic partial cross-sectional views of FIGS. 141 and FIG. 143 and the principle drawing of FIG. 139B, there may be employed a constitution in which there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

EXAMPLE 14

Example 14 is concerned with the semiconductor memory cell according to the ninth and twenty-first aspects of the present invention. The semiconductor memory cell of Example 14 differs from the semiconductor memory cell of Example 7 in that a second junction-field-effect transistor $JF_2$ is provided. That is, as is shown in the principle drawing of FIG. 145A, the semiconductor memory cell of Example 14 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a first junction-field-effect transistor $JF_1$ for current control, having source/drain regions, a channel region $CH_{J1}$ and gate regions, (4) a second junction-field-effect transistor $JF_2$ for current control, having source/drain regions, a channel region $CH_{J2}$ and gate regions, and (5) an MIS type diode DT for retaining information.

In the semiconductor memory cell of Example 14, one source/drain region of the first transistor $TR_1$ corresponds to the channel forming region $CH_2$ of the second transistor $TR_2$ and corresponds to one source/drain region of the first junction-field-effect transistor $JF_1$, the other source/drain region of the first transistor $TR_1$ corresponds to one source/drain region of the second junction-field-effect transistor $JF_2$, one source/drain region of the second transistor $TR_2$ corresponds to the channel forming region $CH_1$ of the first transistor $TR_1$, corresponds to one gate region of the first junction-field-effect transistor $JF_1$ and corresponds to one gate region of the second junction-field-effect transistor $JF_2$, and one end of the MIS type diode DT is formed of an extending portion of the channel forming region $CH_1$ of the first transistor $TR_1$, the other end of the MIS type diode DT is formed of an electrode EL composed of a conductive material, and the electrode EL is connected to a line (third line) having a predetermined potential.

In the semiconductor memory cell of Example 14, the gate of the first transistor $TR_1$ and the gate of the second transistor $TR_2$ are connected to a first line (for example, word line) for memory cell selection, the other source/drain region of the first transistor $TR_1$ is connected to a second line through the second junction-field-effect transistor $JF_2$, the other gate region of the second junction-field-effect transistor $JF_2$ is connected to a fourth line, one source/drain region of the first transistor $TR_1$ is connected to a write-in information setting line WISL through the first junction-field-effect transistor $JF_1$ and a diode D, the other source/drain region of the second transistor $TR_2$ is connected to the write-in information setting line WISL, the other end of the MIS type diode DT is connected to a third line (corresponding to the above line) having a predetermined potential through a high-resistance element R. It is preferred to employ a constitution in which the second line is used as a bit line, or a constitution in which the write-in information setting line WISL is used as a bit line as well and a second predetermined potential is applied to the second line.

As shown in the schematic partial cross-sectional view of FIG. 148 or FIG. 152, the semiconductor memory cell of Example 14 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a first junction-field-effect transistor $JF_1$ for current control, having source/drain regions, a channel region $CH_{J1}$ and gate regions, (4) a second junction-field-effect transistor $JF_2$ for current control, having source/drain regions, a channel region $CH_{J2}$ and gate regions, and (5) an MIS type diode DT for retaining information, the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a semi-conductive fourth region $SC_4$ which is formed in a surface region of the second region $SC_2$ and has the first conductivity type (for example, $n^+$-type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^+$-type) or which is conductive and is composed of a silicide, a metal or a metal compound, and (f) the gate G which is formed, through an insulation layer, so as to bridge the first region $SC_1$ and the fourth region $SC_4$ and so as to bridge the second region $SC_2$ and the third region $SC_3$, and is shared by the first transistor $TR_1$ and the second transistor $TR_2$.

The first region $SC_1$ and the second region $SC_2$ are in contact with each other, and in the semiconductor memory cell shown in FIG. 148 and semiconductor memory cells to be explained later with reference to FIGS. 149 to 151, specifically, the second region $SC_2$ is formed in a surface region of the first region $SC_1$. In the semiconductor memory cell shown in FIG. 152 and semiconductor memory cells to be explained later with reference to FIGS. 153 to 155, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the second transistor $TR_2$, (B-1) one source/drain region is formed of the surface region of the second region $SC_2$, (B-2) the other source/drain region is formed of the third region $SC_3$, and (B-3) the channel forming region $CH_2$ is formed of the surface region of the first region $SC_1$.

Concerning the first junction-field-effect transistor $JF_1$, (C-1) the gate regions are formed of the third region $SC_3$ and part of the second region $SC_2$ which part is opposed to the third region $SC_3$, (C-2) the channel region $CH_{J1}$ is formed of part of the first region $SC_1$ which part is interposed between the third region $SC_3$ and said part of the second region $SC_2$, (C-3) one source/drain region is formed of the surface region of the first region $SC_1$ which surface region extends from one end of the channel region $CH_{J1}$ of the first junction-field-effect transistor $JF_1$ and constitutes one source/drain region of the first transistor $TR_1$, and (C-4) the other source/drain region is formed of a portion of the first region $SC_1$ which portion extends from the other end of the channel region $CH_{J1}$ of the first junction-field-effect transistor $JF_1$.

Concerning the second junction-field-effect transistor $JF_2$, (D-1) the gate regions are formed of the fifth region $SC_5$ and part of the second region $SC_2$ which part is opposed to the fifth region $SC_5$, (D-2) the channel region $CH_{J2}$ is formed of part of the fourth region $SC_4$ which part is interposed between the fifth region $SC_5$ and said part of the second region $SC_2$, (D-3) one source/drain region is formed of the surface region of the fourth region $SC_4$ which surface region extends from one end of the channel region $CH_{J2}$ of the second junction-field-effect transistor $JF_2$ and constitutes the other source/drain region of the first transistor $TR_1$, and (D-4) the other source/drain region is formed of a portion of the fourth region $SC_4$ which portion extends from the other end of the channel region $CH_{J2}$ of the second junction-field-effect transistor $JF_2$.

Further, concerning the MIS type diode DT, (E-1) one end thereof is formed of part $SC_{2A}$ of the second region $SC_2$, and (E-2) an electrode constituting the other end thereof is formed to be opposed to said part $SC_{2A}$ of the second region $SC_2$ which part $SC_{2A}$ constitutes one end of the MIS type diode DT, through a wide gap thin film WG.

The wide gap thin film WG can be composed of a material in which the tunnel transition of carriers is caused depending upon a potential difference between the potential in the second region $SC_2$ (the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (F) the gate G is connected to a first line (for example, word line) for memory cell selection, (G) the third region $SC_3$ is connected to a write-in information setting line WISL, (H) the portion of the fourth region $SC_4$ constituting the other source/drain region of the second junction-field-effect transistor $JF_2$ is connected to a second line, (I) the electrode EL constituting the other end of the MIS type diode DT is connected to a third line having a predetermined potential, and (J) the fifth region $SC_5$ is connected to a fourth line.

Further, the first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

The semiconductor memory cell (specifically, the first region $SC_1$) shown in FIG. 148 is formed in a well structure which is formed, for example, in an p-type semiconductor substrate and has the first conductivity type (for example, n-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased. The semiconductor memory cell (specifically, the second region $SC_2$) shown in FIG. 152 is formed in a well structure which is formed, for example, in an n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

The first junction-field-effect transistor $JF_1$ is formed by (X) optimizing the distance between the facing gate regions (the third region $SC_3$ and the part of the second region $SC_2$ which part is opposed to the third region $SC_3$), that is, the thickness of the channel region $CH_{J1}$, and (Y) optimizing the impurity concentration of each of the facing gate regions (the third region $SC_3$ and the part of the second region $SC_2$ which part is opposed to the third region $SC_3$) and the impurity concentration of the channel region $CH_{J1}$.

Further, the second junction-field-effect transistor $JF_2$ is formed by (X) optimizing the distance between the facing gate regions (the fifth region $SC_5$ and part of the second region $SC_2$ which part is opposed to the fifth region $SC_5$), that is, the thickness of the channel region $CH_{J2}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J2}$.

In the semiconductor memory cells shown in FIG. 148 and FIG. 152, as is shown in the principle drawing of FIG. 144, there may be employed an embodiment in which the formation of the pn junction diode D is omitted and the first region $SC_1$ corresponding to one source/drain region of the first transistor $TR_1$ is connected to a fifth line (not shown in FIG. 148 and FIG. 152). In these cases, it is preferred to employ a constitution in which the second line is used as a bit line and a second predetermined potential is applied to the fifth line, or a constitution in which the fifth line is used as a bit line and a second predetermined potential is applied to the second line. In the semiconductor memory cell shown in FIG. 148, a second high-concentration-impurity-containing layer (not shown) which has the first conductivity type (for example, n++-type) and works as the fifth line can be formed below the first region $SC_1$.

In the semiconductor memory cells shown in the principle drawing of FIG. 145B and the schematic partial cross-sectional views of FIG. 149 and FIG. 153, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

In semiconductor memory cells shown in the principle drawing of FIG. 147A and the schematic partial cross-sectional views of FIGS. 150 and 154, the fifth region $SC_5$ corresponding to the other gate region of the second junction-field-effect transistor $JF_2$ is connected to the second region $SC_2$ corresponding to one gate region of the second junction-field-effect transistor $JF_2$ in place of being connected to the fourth line.

In the semiconductor memory cells shown in FIG. 150 and FIG. 154, as is shown in the principle drawing of FIG. 146, there may be employed an embodiment in which the formation of the pn junction diode D is omitted and the first region $SC_1$ corresponding to one source/drain region of the first transistor $TR_1$ is connected to a fifth line (not shown in FIG. 150 and FIG. 154). In these cases, it is preferred to employ a constitution in which the second line is used as a bit line and a second predetermined potential is applied to the fifth line, or a constitution in which the fifth line is used as a bit line and a second predetermined potential is applied to the second line. In the semiconductor memory cell shown in FIG. 150, the wiring structure of the semiconductor memory cell can be simplified by forming a second high-concentration-impurity-containing layer (not shown) which has the first conductivity type (for example, $n^{++}$-type) and works as the fifth line, below the first region $SC_1$.

In the semiconductor memory cells shown in the principle drawing of FIG. 147B and the schematic partial cross-sectional views of FIG. 151 and FIG. 155, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

EXAMPLE 15

Example 15 is concerned with the semiconductor memory cell according to the ninth and twenty-second aspects of the present invention. The semiconductor memory cell of Example 15 differs from the semiconductor memory cell of Example 14 in that one end of the MIS type diode DT and the other gate region of the second junction-field-effect transistor $JF_2$ are formed as a common region. Further, the fifth region $SC_5$ constituting the other gate region of the second junction-field-effect transistor $JF_2$ corresponds to an extending portion of the channel forming region $CH_1$ of the first transistor $TR_1$.

That is, the semiconductor memory cell of Example 15 shown in the principle drawing of FIG. 157A and the schematic partial cross-sectional views of FIG. 158 and FIG. 160 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a first junction-field-effect transistor $JF_1$ for current control, having source/drain regions, a channel region $CH_{J1}$ and gate regions, (4) a second junction-field-effect transistor $JF_2$ for current control, having source/drain regions, a channel region $CH_{J2}$ and gate regions, and (5) an MIS type diode DT for retaining information, the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a semi-conductive fourth region $SC_4$ which is formed in a surface region of the second region $SC_2$ and has the first conductivity type (for example, $n^+$-type), (e) a semi-conductive fifth region $SC_5$ which is formed in a surface region of the fourth region $SC_4$ and has the second conductivity type (for example, $p^+$-type), and (f) the gate G which is formed, through an insulation layer, so as to bridge the first region $SC_1$ and the fourth region $SC_4$ and so as to bridge the second region $SC_2$ and the third region $SC_3$, and is shared by the first transistor $TR_1$ and the second transistor $TR_2$.

While the first region $SC_1$ and the second region $SC_2$ are in contact with each other, specifically, in the semiconductor memory cell shown in FIG. 158 or a semiconductor memory cell to be explained later with reference to FIG. 159, the second region $SC_2$ is formed in a surface region of the first region $SC_1$. In the semiconductor memory cell shown in FIG. 160 or a semiconductor memory cell to be explained later with reference to FIG. 161, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the second transistor $TR_2$, (B-1) one source/drain region is formed of the surface region of the second region $SC_2$, (B-2) the other source/drain region is formed of the third region $SC_3$, and (B-3) the channel forming region $CH_2$ is formed of the surface region of the first region $SC_1$.

Concerning the first junction-field-effect transistor $JF_1$, (C-1) the gate regions are formed of the third region $SC_3$ and part of the second region $SC_2$ which part is opposed to the third region $SC_3$, (C-2) the channel region $CH_{J1}$ is formed of part of the first region $SC_1$ which part is interposed between the third region $SC_3$ and said part of the second region $SC_2$, (C-3) one source/drain region is formed of the surface region of the first region $SC_1$ which surface region extends from one end of the channel region $CH_{J1}$ of the first junction-field-effect transistor $JF_1$ and constitutes one source/drain region of the first transistor $TR_1$, and (C-4) the other source/drain region is formed of a portion of the first region $SC_1$ which portion extends from the other end of the channel region $CH_{J1}$ of the first junction-field-effect transistor $JF_1$.

Concerning the second junction-field-effect transistor $JF_2$, (D-1) the gate regions are formed of the fifth region $SC_5$ and part of the second region $SC_2$ which part is opposed to the fifth region $SC_5$, (D-2) the channel region $CH_{J2}$ is formed of part of the fourth region $SC_4$ which part is interposed between the fifth region $SC_5$ and said part of the second region $SC_2$, (D-3) one source/drain region is formed of the surface region of the fourth region $SC_4$ which surface region extends from one end of the channel region $CH_{J2}$ of the second junction-field-effect transistor $JF_2$ and constitutes the other source/drain region of the first transistor $TR_1$, and (D-4) the other source/drain region is formed of a portion of the fourth region $SC_4$ which portion extends from the other end of the channel region $CH_{J2}$ of the second junction-field-effect transistor $JF_2$.

Further, concerning the MIS type diode DT, (E-1) one end thereof is formed of the fifth region $SC_5$, and (E-2) an electrode constituting the other end thereof is formed to be opposed to the fifth region $SC_5$ which constitutes one end of the MIS type diode DT, through a wide gap thin film WG.

The wide gap thin film WG can be composed of a material in which the tunnel transition of carriers is caused depending upon a potential difference between the potential in the fifth region $SC_5$ (corresponding to the extending portion of the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}$ Ω. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (F) the gate G is connected to a first line (for example, word line) for memory cell selection, (G) the third region $SC_3$ is connected to a write-in information setting line WISL, (H) the portion of the fourth region $SC_4$ constituting the other source/drain region of the second junction-field-effect transistor $JF_2$ is connected to a second line, (I) the fifth region $SC_5$ is connected to the second region $SC_2$, and (J) the electrode EL constituting the other end of the MIS type diode DT is connected to a third line having a predetermined potential.

Further, the first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

The semiconductor memory cell (specifically, the first region $SC_1$) shown in FIG. 158 is formed in a well structure which is formed, for example, in an p-type semiconductor substrate and has the first conductivity type (for example, n-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased. The semiconductor memory cell (specifically, the second region $SC_2$) shown in FIG. 160 is formed in a well structure which is formed, for example, in an n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

The first junction-field-effect transistor $JF_1$ is formed by (X) optimizing the distance between the facing gate regions (the third region $SC_3$ and the part of the second region $SC_2$ which part is opposed to the third region $SC_3$), that is, the thickness of the channel region $CH_{J1}$ , and (Y) optimizing the impurity concentration of each of the facing gate regions (the third region $SC_3$ and the part of the second region $SC_2$ which part is opposed to the third region $SC_3$) and the impurity concentration of the channel region $CH_{J1}$.

Further, the second junction-field-effect transistor $JF_2$ is formed by (X) optimizing the distance between the facing gate regions (the fifth region $SC_5$ and the part of the second region $SC_2$ which part is opposed to the fifth region $SC_5$), that is, the thickness of the channel region $CH_{J2}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J2}$.

In the semiconductor memory cells shown in FIG. 158 and FIG. 160, as is shown in the principle drawing of FIG. 156, there may be employed an embodiment in which the formation of the pn junction diode D is omitted and the first region $SC_1$ corresponding to one source/drain region of the first transistor $TR_1$ is connected to a fifth line (not shown in FIG. 158 and FIG. 160). In these cases, it is preferred to employ a constitution in which the second line is used as a bit line and a second predetermined potential is applied to the fifth line, or a constitution in which the fifth line is used as a bit line and a second predetermined potential is applied to the second line. In the semiconductor memory cell shown in FIG. 158, a second high-concentration-impurity-containing layer (not shown) which has the first conductivity type (for example, $n^{++}$-type) and works as the fifth line can be formed below the first region $SC_1$.

In the semiconductor memory cells shown in the principle drawing of FIG. 157B and the schematic partial cross-sectional views of FIG. 159 and FIG. 161, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

EXAMPLE 16

Example 16 is concerned with the semiconductor memory cell according to the tenth and twenty-third aspects of the present invention. The semiconductor memory cell of Example 16 differs from the semiconductor memory cell of Example 14 in that a third transistor $TR_3$ for current control is provided. That is, as is shown in the principle drawing of FIG. 163, the semiconductor memory cell of Example 16 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate G capacitively coupled with the channel forming region $CH_3$, (4) a first junction-field-effect transistor $JF_1$ for current control, having source/drain regions, a channel region $CH_{J1}$ and gate regions, (5) a second junction-field-effect transistor $JF_2$ for current control, having source/drain regions, a channel region $CH_{J2}$ and gate regions, and (6) an MIS type diode DT for retaining information, wherein:

one source/drain region of the first transistor $TR_1$ corresponds to the channel forming region $CH_2$ of the second transistor $TR_2$ and corresponds to one source/drain region of the first junction-field-effect transistor $JF_1$, the other source/drain region of the first transistor $TR_1$ corresponds to one source/drain region of the second junction-field-effect transistor $JF_2$, one source/drain region of the second transistor $TR_2$ corresponds to the channel forming region $CH_1$ of the first transistor $TR_1$, corresponds to one gate region of the first junction-field-effect transistor $JF_1$, corresponds to one gate region of the second junction-field-effect transistor $JF_2$ and corresponds to one source/drain region of the third transistor $TR_3$, the other source/drain region of the third transistor $TR_3$ corresponds to the other gate region of the second junction-field-effect transistor $JF_2$, and one end of the MIS type diode DT is formed of an extending portion of the channel forming region $CH_1$ of the first transistor $TR_1$, the other end of the MIS type diode DT is formed of an electrode EL composed of a conductive material, and the electrode EL is connected to a line (third line) having a predetermined potential.

Further, the gate of the first transistor $TR_1$, the gate of the second transistor $TR_2$ and the gate of the third transistor $TR_3$ are connected to a first line (for example, word line) for memory cell selection, the other source/drain region of the first transistor $TR_1$ is connected to a second line through the second junction-field-effect transistor $JF_2$, one source/drain region of the first transistor $TR_1$ is connected to a write-in information setting line WISL through the first junction-field-effect transistor $JF_1$ and a diode D, the other source/drain region of the second transistor $TR_2$ is connected to the write-in information setting line WISL, the other gate region of the first junction-field-effect transistor $JF_1$ is connected to the write-in information setting line WISL, and the other end of the MIS type diode DT is connected to the above line (third line) having a predetermined potential through a high-resistance element R. It is preferred to employ a constitution in which the second line is used as a bit line, or a constitution in which the write-in information setting line WISL is used as a bit line as well and a second predetermined potential is applied to the second line.

As is shown in the schematic partial cross-sectional views of FIGS. 165 and 167, the semiconductor memory cell of Example 16 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate G capacitively coupled with the channel forming region $CH_3$, (4) a first junction-field-effect transistor $JF_1$ for current control, having source/drain regions, a channel region $CH_{J1}$ and gate regions, (5) a second junction-field-effect transistor $JF_2$ for current control, having source/drain regions, a channel region $CH_{J1}$ and gate regions, and (6) an MIS type diode DT for retaining information, the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^+$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a semi-conductive fourth region $SC_4$ which is formed in a surface region of the second region $SC_2$ and has the first conductivity type (for example, $n^+$-type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^+$-type) or which is conductive and is composed of a silicide, a metal or a metal compound, and (f) the gate G which is formed, through an insulation layer, so as to bridge the first region $SC_1$ and the fourth region $SC_4$, so as to bridge the second region $SC_2$ and the third region $SC_3$ and so as to bridge the second region $SC_2$ and the fifth region $SC_5$, and is shared by the first transistor $TR_1$, the second transistor $TR_2$ and the third transistor $TR_3$.

While the first region $SC_1$ and the second region $SC_2$ are in contact with each other, specifically, in the semiconductor memory cell shown in FIG. 165 or a semiconductor memory cell to be explained later with reference to FIG. 166, the second region $SC_2$ is formed in a surface region of the first region $SC_1$. In the semiconductor memory cell shown in FIG. 167 or a semiconductor memory cell to be explained later with reference to FIG. 168, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the second transistor $TR_2$, (B-1) one source/drain region is formed of the surface region of the second region $SC_2$, (B-2) the other source/drain region is formed of the third region $SC_3$, and (B-3) the channel forming region $CH_2$ is formed of the surface region of the first region $SC_1$.

Concerning the third transistor $TR_3$, (C-1) one source/drain region is formed of the surface region of the second region $SC_2$, (C-2) the other source/drain region is formed of the fifth region $SC_5$, and (C-3) the channel forming region $CH_3$ is formed of the surface region of the fourth region $SC_4$.

Concerning the first junction-field-effect transistor $JF_1$, (D-1) the gate regions are formed of the third region $SC_3$ and part of the second region $SC_2$ which part is opposed to the third region $SC_3$, (D-2) the channel region $CH_{J1}$ is formed of part of the first region $SC_1$ which part is interposed between the third region $SC_3$ and said part of the second region $SC_2$, (D-3) one source/drain region is formed of the surface region of the first region $SC_1$ which surface region extends from one end of the channel region $CH_{J1}$ of the first junction-field-effect transistor $JF_1$ and constitutes one source/drain region of the first transistor $TR_1$, and (D-4) the other source/drain region is formed of a portion of the first region $SC_1$ which portion extends from the other end of the channel region $CH_{J1}$ of the first junction-field-effect transistor $JF_1$.

Concerning the second junction-field-effect transistor $JF_2$, (E-1) the gate regions are formed of the fifth region $SC_5$ and part of the second region $SC_2$ which part is opposed to the fifth region $SC_5$, (E-2) the channel region $CH_{J2}$ is formed of part of the fourth region $SC_4$ which part is interposed between the fifth region $SC_5$ and said part of the second region $SC_2$, (E-3) one source/drain region is formed of the surface region of the fourth region $SC_4$ which surface region extends from one end of the channel region $CH_{J2}$ of the second junction-field-effect transistor $JF_2$ and constitutes the other source/drain region of the first transistor $TR_1$ and the channel forming region $CH_3$ of the third transistor $TR_3$, and (E-4) the other source/drain region is formed of a portion of the fourth region $SC_4$ which portion extends from the other end of the channel region $CH_{J2}$ of the second junction-field-effect transistor $JF_2$.

Further, concerning the MIS type diode DT, (F-1) one end thereof is formed of part $SC_{2A}$ of the second region $SC_2$, and (F-2) an electrode constituting the other end thereof is formed to be opposed to said part $SC_{2A}$ of the second region $SC_2$ which part constitutes one end of the MIS type diode DT, through a wide gap thin film WG.

The wide gap thin film WG can be composed of a material in which the tunnel transition of carriers is caused depending upon a potential difference between the potential in the second region $SC_2$ (the channel forming region $CH_1$ of the first transistor $TR_1$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}\Omega$. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (G) the gate G is connected to a first line (for example, word line) for memory cell selection, (H) the third region $SC_3$ is connected to a write-in information setting line WISL, (I) the portion of the fourth region $SC_4$ constituting the other source/drain region of the second junction-field-effect transistor $JF_2$ is connected to a second line, and (J) the electrode EL constituting the other end of the MIS type diode DT is connected to a third line having a predetermined potential.

Further, the first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

The semiconductor memory cell (specifically, the first region $SC_1$) shown in FIG. 165 is formed in a well structure which is formed, for example, in an p-type semiconductor substrate and has the first conductivity type (for example, n-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased. The semiconductor memory cell (specifically, the second region $SC_2$) shown in FIG. 167 is formed in a well structure which is formed, for example, in an n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

The first junction-field-effect transistor $JF_1$ is formed by (X) optimizing the distance between the facing gate regions (the third region $SC_3$ and the part of the second region $SC_2$ which part is opposed to the third region $SC_3$), that is, the thickness of the channel region $CH_{J1}$, and (Y) optimizing the impurity concentration of each of the facing gate regions (the third region $SC_3$ and the part of the second region $SC_2$ which part is opposed to the third region $SC_3$) and the impurity concentration of the channel region $CH_{J1}$.

Further, the second junction-field-effect transistor $JF_2$ is formed by (X) optimizing the distance between the facing gate regions (the fifth region $SC_5$ and the part of the second region $SC_2$ which part is opposed to the fifth region $SC_5$), that is, the thickness of the channel region $CH_{J2}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J2}$.

In the semiconductor memory cells shown in FIG. 165 and FIG. 167, as is shown in the principle drawing of FIG. 162, there may be employed an embodiment in which the formation of the pn junction diode D is omitted and the first region $SC_1$ corresponding to one source/drain region of the first transistor $TR_1$ is connected to a fourth line (not shown in FIG. 165 and FIG. 167). In these cases, it is preferred to employ a constitution in which the second line is used as a bit line and a second predetermined potential is applied to the fourth line, or a constitution in which the fourth line is used as a bit line and a second predetermined potential is applied to the second line. In the semiconductor memory cell shown in FIG. 165, the wiring structure thereof can be simplified by forming a second high-concentration-impurity-containing layer (not shown) which has the first conductivity type (for example, $n^{++}$-type) and works as the fourth line, below the first region $SC_1$.

In semiconductor memory cells shown in the principle drawing of FIG. 164 and the schematic partial cross-sectional views of FIG. 166 and FIG. 168, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

EXAMPLE 17

Example 17 is concerned with the semiconductor memory cell according to the eleventh and twenty-fourth aspects of the present invention. The semiconductor memory cell of Example 17 differs from the semiconductor memory cell of Example 16 in that one end of the MIS type diode DT and the other gate region of the second junction-field-effect transistor $JF_2$ are formed as a common region.

That is, as is shown in the principle drawing of FIG. 170, the semiconductor memory cell of Example 17 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate G capacitively coupled with the channel forming region $CH_3$, (4) a first junction-field-effect transistor $JF_1$ for current control, having source/drain regions, a channel region $CH_{J1}$ and gate regions, (5) a second junction-field-effect transistor $JF_2$ for current control, having source/drain regions, a channel region $CH_{J2}$ and gate regions, and (6) an MIS type diode DT for retaining information, wherein:

one source/drain region of the first transistor $TR_1$ corresponds to the channel forming region $CH_2$ of the second transistor $TR_2$ and corresponds to one source/drain region of the first junction-field-effect transistor $JF_1$, the other source/drain region of the first transistor $TR_1$ corresponds to one source/drain region of the second junction-field-effect transistor $JF_2$, one source/drain region of the second transistor $TR_2$ corresponds to channel forming region $CH_1$ of the first transistor $TR_1$, corresponds to one gate region of the first junction-field-effect transistor $JF_1$, corresponds to one gate region of the second junction-field-effect transistor $JF_2$ and corresponds to one source/drain region of the third transistor $TR_3$, the other source/drain region of the third transistor $TR_3$ corresponds to the other gate region of the second junction-field-effect transistor $JF_2$, and one end of the MIS type diode DT corresponds to the other source/drain region of the third transistor $TR_3$, the other end of the MIS type diode DT is formed of an electrode EL composed of a conductive material, and the electrode EL is connected to a line (third line) having a predetermined potential.

Further, the gate of the first transistor $TR_1$, the gate of the second transistor $TR_2$ and the gate of third transistor $TR_3$ are connected to a first line (for example, word line) for memory cell selection, the other source/drain region of the first transistor $TR_1$ is connected to a second line through the second junction-field-effect transistor $JF_2$, one source/drain region of the first transistor $TR_1$ is connected to a write-in information setting line WISL through the first junction-field-effect transistor $JF_1$ and a diode D, the other source/drain region of the second transistor $TR_2$ is connected to the write-in information setting line WISL, the other gate region of the first junction-field-effect transistor $JF_1$ is connected to the write-in information setting line WISL, and the other end of the MIS type diode DT is connected to the above line (third line) having a predetermined potential through a high-resistance element R. It is preferred to employ a constitution in which the second line is used as a bit line, or a constitution in which the write-in information setting line WISL is used as a bit line as well and a second predetermined potential is applied to the second line.

As is shown in the schematic partial cross-sectional views of FIGS. 172 and 174, the semiconductor memory cell of Example 17 comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate G capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate G capacitively coupled with the channel forming region $CH_2$, (3) a third transistor $TR_3$ for current control, having the second conductivity type (for example, p-channel type), and having source/drain regions, a semiconductive channel forming region $CH_3$ which is in contact with the source/drain regions and spaces out the source/drain regions, and a gate G capacitively coupled with the channel forming region $CH_3$, (4) a first junction-field-effect transistor $JF_1$ for current control, having source/drain regions, a channel region $CH_{J1}$ and gate regions, (5) a second junction-field-effect transistor $JF_2$ for current control, having source/drain regions, a channel region $CH_{J2}$ and gate regions, and (6) an MIS type diode DT for retaining information, the semiconductor memory cell having;

(a) a semi-conductive first region $SC_1$ having a first conductivity type (for example, n-type), (b) a semi-conductive second region $SC_2$ which is in contact with the first region $SC_1$ and has a second conductivity type (for example, $p^{+}$-type), (c) a third region $SC_3$ which is formed in a surface region of the first region $SC_1$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a semi-conductive fourth region $SC_4$ which is formed in a surface region of the second region $SC_2$ and has the first conductivity type (for example, $n^+$-type), (e) a semi-conductive fifth region $SC_5$ which is formed in a surface region of the fourth region $SC_4$ and has the second conductivity type (for example, $p^+$-type), and (f) the gate G which is formed, through an insulation layer, so as to bridge the first region $SC_1$ and the fourth region $SC_4$, so as to bridge the second region $SC_2$ and the third region $SC_3$ and so as to bridge the second region $SC_2$ and the fifth region $SC_5$, and is shared by the first transistor $TR_1$, the second transistor $TR_2$ and the third transistor $TR_3$.

While the first region $SC_1$ and the second region $SC_2$ are in contact with each other, specifically, in the semiconductor memory cell shown in FIG. 172 or a semiconductor memory cell to be explained later with reference to FIG. 173, the second region $SC_2$ is formed in a surface region of the first region $SC_1$. In the semiconductor memory cell shown in FIG. 174 or a semiconductor memory cell to be explained later with reference to FIG. 175, the first region $SC_1$ is formed in a surface region of the second region $SC_2$.

Concerning the first transistor $TR_1$, (A-1) one source/drain region is formed of a surface region of the first region $SC_1$, (A-2) the other source/drain region is formed of a surface region of the fourth region $SC_4$, and (A-3) the channel forming region $CH_1$ is formed of a surface region of the second region $SC_2$ which surface region is interposed between the surface region of the first region $SC_1$ and the surface region of the fourth region $SC_4$.

Concerning the second transistor $TR_2$, (B-1) one source/drain region is formed of the surface region of the second region $SC_2$, (B-2) the other source/drain region is formed of the third region $SC_3$, and (B-3) the channel forming region $CH_2$ is formed of the surface region of the first region $SC_1$.

Concerning the third transistor $TR_3$, (C-1) one source/drain region is formed of the surface region of the second region $SC_2$, (C-2) the other source/drain region is formed of the fifth region $SC_5$, and (C-3) the channel forming region $CH_3$ is formed of the surface region of the fourth region $SC_4$.

Concerning the first junction-field-effect transistor $JF_1$, (D-1) the gate regions are formed of the third region $SC_3$ and part of the second region $SC_2$ which part is opposed to the third region $SC_3$, (D-2) the channel region $CH_{J1}$ is formed of part of the first region $SC_1$ which part is interposed between the third region $SC_3$ and said part of the second region $SC_2$, (D-3) one source/drain region is formed of the surface region of the first region $SC_1$ which surface region extends from one end of the channel region $CH_{J1}$ of the first junction-field-effect transistor $JF_1$ and constitutes one source/drain region of the first transistor $TR_1$, and (D-4) the other source/drain region is formed of a portion of the first region $SC_1$ which portion extends from the other end of the channel region $CH_{J1}$ of the first junction-field-effect transistor $JF_1$.

Concerning the second junction-field-effect transistor $JF_2$, (E-1) the gate regions are formed of the fifth region $SC_5$ and part of the second region $SC_2$ which part is opposed to the fifth region $SC_5$, (E-2) the channel region $CH_{J2}$ is formed of part of the fourth region $SC_4$ which part is interposed between the fifth region $SC_5$ and said part of the second region $SC_2$, (E-3) one source/drain region is formed of the surface region of the fourth region $SC_4$ which surface region extends from one end of the channel region $CH_{J2}$ of the second junction-field-effect transistor $JF_2$ and constitutes the other source/drain region of the first transistor $TR_1$ and the channel forming region $CH_3$ of the third transistor $TR_3$, and (E-4) the other source/drain region is formed of a portion of the fourth region $SC_4$ which portion extends from the other end of the channel region $CH_{J2}$ of the second junction-field-effect transistor $JF_2$.

Further, concerning the MIS type diode DT, (E-1) one end thereof is formed of the fifth region $SC_5$, and (E-2) an electrode constituting the other end thereof is formed to be opposed to the fifth region $SC_5$ which constitutes one end of the MIS type diode DT, through a wide gap thin film WG.

The wide gap thin film WG can be composed of a material in which the tunnel transition of carriers is caused depending upon a potential difference between the potential in the fifth region $SC_5$ (the other source/drain region of the third transistor $TR_3$) and the potential in the other end (electrode EL) of the MIS type diode DT. Specifically, it can be composed, for example, of an $SiO_2$ or SiON film having a thickness of 5 nm or smaller, or an SiN film having a thickness of 9 nm or smaller.

The electrode EL constituting the other end of the MIS type diode DT is connected to the line (third line) through a high-resistance element R having a resistance of approximately $10^9$ to $10^{12}\Omega$. Specifically, the electrode EL constituting the other end of the MIS type diode DT and the high-resistance element R are integrally formed and are composed of a polysilicon thin layer containing an impurity having the first conductivity type.

In the above semiconductor memory cell, further, (G) the gate G is connected to a first line (for example, word line) for memory cell selection, (H) the third region $SC_3$ is connected to a write-in information setting line WISL, (I) the portion of the fourth region $SC_4$ constituting the other source/drain region of the second junction-field-effect transistor $JF_2$ is connected to a second line, (J) the fifth region $SC_5$ is connected to the second region $SC_2$, and (K) the electrode EL constituting the other end of the MIS type diode DT is connected to a third line having a predetermined potential.

In the semiconductor memory cell of Example 17, an impurity-containing layer $SC_{4A}$ having the second conductivity type (for example, $p^{++}$-type) is formed in the surface region of the fourth region $SC_4$ which surface region constitutes the channel forming region $CH_3$ of the third transistor $TR_3$. Therefore, while information is retained, and, for example, if the potential in the first line is turned to 0 volt, the third transistor $TR_3$ is brought into an on-state, and the MIS type diode DT and the channel forming region $CH_1$ of the first transistor $TR_1$ are put in a continuity. The impurity concentration of the impurity-containing layer $SC_{4A}$ is adjusted such that the third transistor $TR_3$ is brought into an off-state by the potential in the first line applied during the reading of information.

Further, the first region $SC_1$ and the third region $SC_3$ constitute a pn junction diode D, and the first region $SC_1$ is connected to the write-in information setting line WISL through the third region $SC_3$. In this case, it is preferred to employ a constitution in which the second line is used as a bit line, or a constitution in which the write-in information setting line WISL is used as a bit line as well and a second predetermined potential is applied to the second line.

The semiconductor memory cell (specifically, the first region $SC_1$) shown in FIG. 172 is formed in a well structure which is formed, for example, in an p-type semiconductor substrate and has the first conductivity type (for example, n-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased. The semiconductor memory cell (specifically, the second region $SC_2$) shown in FIG. 174 is formed in a well structure which is formed, for example, in an n-type semiconductor substrate and has the second conductivity type (for example, p-type). Further, when a first high-concentration-impurity-containing layer $SC_{10}$ having the first conductivity type (for example, $n^{++}$-type) is formed below the second region $SC_2$, the potential or charge to be stored in the channel forming region $CH_1$ of the first transistor $TR_1$ for readout can be increased.

The first junction-field-effect transistor $JF_1$ is formed by (X) optimizing the distance between the facing gate regions (the third region $SC_3$ and the part of the second region $SC_2$ which part is opposed to the third region $SC_3$), that is, the thickness of the channel region $CH_{J1}$, and (Y) optimizing the impurity concentration of each of the facing gate regions (the third region $SC_3$ and the part of the second region $SC_2$ which part is opposed to the third region $SC_3$) and the impurity concentration of the channel region $CH_{J1}$.

Further, the second junction-field-effect transistor $JF_2$ is formed by (X) optimizing the distance between the facing gate regions (the fifth region $SC_5$ and the part of the second region $SC_2$ which part is opposed to the fifth region $SC_5$), that is, the thickness of the channel region $CH_2$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J2}$.

In the semiconductor memory cells shown in FIG. 172 and FIG. 174, as is shown in the principle drawing of FIG. 169, there may be employed an embodiment in which the formation of the pn junction diode D is omitted and the first region $SC_1$ corresponding to one source/drain region of the first transistor $TR_1$ is connected to a fourth line (not shown in FIG. 172 and FIG. 174). In these cases, it is preferred to employ a constitution in which the second line is used as a bit line and a second predetermined potential is applied to the fourth line, or a constitution in which the fourth line is used as a bit line and a second predetermined potential is applied to the second line. In the semiconductor memory cell shown in FIG. 172, the wiring structure thereof can be simplified by forming a second high-concentration-impurity-containing layer (not shown) which has the first conductivity type (for example, $n^{++}$-type) and works as the fourth line, below the first region $SC_1$.

In semiconductor memory cells shown in the principle drawing of FIG. 171 and the schematic partial cross-sectional views of FIG. 173 and FIG. 175, there is further provided a diode-constituting region $SC_D$ which is formed in a surface region of the first region $SC_1$ and is in contact with the first region $SC_1$ to form a rectifier junction together with the first region $SC_1$, the diode-constituting region $SC_D$ and the first region $SC_1$ constitute a majority carrier diode DS, and the first region $SC_1$ is connected to the write-in information setting line WISL through the diode-constituting region $SC_D$. In this case, it is preferred to employ a constitution in which the second line is used as a bit line, or a constitution in which the write-in information setting line WISL is used as a bit line as well and a second predetermined potential is applied to the second line.

As an example of the process for manufacturing the semiconductor memory cell of the present invention, the process for manufacturing the semiconductor memory cell of Example 7 shown in FIG. 69 will be explained with reference to FIGS. 176A, 176B, 177A, 177B, 178A and 178B hereinafter.

[Step-300]

First, a device separation region (not shown), the well of the first conductivity type (for example, n-type well), the semi-conductive first region $SC_1$ of the first conductivity type (for example, $n^{++}$-type), the first high-concentration-impurity-containing layer $SC_{10}$ of the first conductivity type (for example, $n^{++}$-type) (not shown) and a gate insulation layer 12 corresponding to the insulation layer are formed in a p-type silicon semiconductor substrate 10 according to known methods. Then, gate G ($G_1$+$G_2$) is formed, for example, from a polysilicon containing an impurity or a polyside or polymetal structure. In this manner, a structure shown in FIG. 176A can be obtained. The n-type first region $SC_1$ had an impurity concentration of $1.0\times10^{17}/cm^3$, and the gate G ($G_1$+$G_2$) had a length of 0.28 μm.

[Step-310]

Then, an ion-implanting mask 20 is formed from a resist material, and an impurity having the second conductivity type (for example, p-type) is ion-implanted to form the semi-conductive third region $SC_3$ which is formed in a surface region of the first region $SC_1$ and has the second conductivity type (see FIG. 176B). The ion implantation can be carried out, for example, under the same conditions as those shown in Table 1.

[Step-320]

Then, the ion-implanting mask 20 is removed, an ion-implanting mask 21 is formed from a resist material, and an impurity having the second conductivity type (for example, p-type) is ion-implanted by an oblique ion implanting method, to form the semi-conductive second region $SC_2$ which is in contact with the first region $SC_1$ (specifically, formed in a surface region of the first region $SC_1$), is spaced from the third region $SC_3$ and has the second conductivity type (for example, $p^+$-type). Since the ion implantation is carried out by the oblique ion implanting method, the second region $SC_2$ is formed below the gates ($G_1$+$G_2$) as well (see FIG. 177A). The ion implantation is carried out twice under the same conditions as those shown in Table 2, and the ion incidence angle during one ion-implantation is arranged to differ from that during the other ion-implantation. Particularly, when the ion incidence angle during the first ion-implantation is set at 60 degrees, the impurity concentration of the semi-conductive second region $SC_2$ below the gate G ($G_1$+$G_2$) can be highly accurately controlled.

[Step-330]

Then, an impurity having the first conductivity type (for example, n-type) is ion-implanted to form the fourth region $SC_4$ which is formed in a surface region of the second region $SC_2$ and is in contact with the second region $SC_2$ to form a rectifier junction together with the second region $SC_2$ (see FIG. 177B). The ion-implantation can be carried out under the same conditions as those shown in Table 3.

[Step-340]

Then, the ion-implanting mask 21 is removed, an $SiO_2$ layer is formed on the entire surface by a CVD method, and the $SiO_2$ layer is etched back to form a side-wall 30 on the side wall of the gate G ($G_1$+$G_2$).

[Step-350]

Then, an ion-implanting mask 22 is formed from a resist material, and an impurity having the first conductivity type (for example, n-type) is ion-implanted to increase the impurity concentration of the fourth region $SC_4$ up to approximately $10^{18}$ to $10^{20}$ $cm^{-3}$, whereby the resistance of the fourth region $SC_4$ is decreased (see FIG. 178A). The ion implantation can be carried out under the same conditions as those shown in Table 4.

[Step-360]

Then, the ion-implanting mask 22 is removed, an ion-implanting mask 23 is formed from a resist material, and an impurity having the second conductivity type (for example, p-type) is ion-implanted to increase the impurity concentration of the third region $SC_3$ up to approximately $10^{18}$ to $10^{20}$ $cm^{-3}$, whereby the resistance of the third region $SC_3$ is decreased (see FIG. 178B). The ion implantation can be carried out under the same conditions as those shown in Table 5.

Under the above ion-implanting conditions, the gate regions (second region $SC_2$ and third region $SC_3$) of the junction-field-effect transistor $JF_1$ and the channel region $CH_{J1}$ had impurity concentrations shown in the following Table 7. Further, the channel region $CH_{J1}$ of the junction-field-effect transistor $JF_1$ had a thickness of 0.1 μm.

TABLE 7

| | |
|---|---|
| Second region $SC_2$ | $1.5 \times 10^{18}$ $cm^{-3}$ |
| Third region $SC_3$ | $2.1 \times 10^{19}$ $cm^{-3}$ |
| Channel reqion $CH_{J1}$ | $5.0 \times 10^{17}$ $cm^{-3}$ |

[Step-370]

Then, an insulating interlayer is formed on the entire surface, and the insulating interlayer is patterned using a patterned resist layer as a mask, to expose part of the second region $SC_2$. A silicon oxide layer ($SiO_2$ layer) as a wide gap thin film WG is formed on the exposed surface of the second region $SC_2$. Then, a polysilicon thin layer containing an impurity having the first conductivity type (for example, n-type) is formed on the entire surface, and the polysilicon thin layer is patterned to form the electrode EL constituting the other end of a MIS type diode DT connected to the wide gap thin film WG and also to form the high-resistance element R extending from the above electrode EL.

[Step-380]

Then, the write-in information setting line, the second line (bit line), the fourth line, etc., are formed according to known methods.

The steps of manufacturing the semiconductor memory cell shall not be limited to the above process. For example, [Step-310] may be omitted. [Step-320], [Step-330] and [Step-350] may be carried out in any order. The formation of the gate and the formation of the device separation region may be carried out after [Step-370]. The above-described ion-implantation conditions are given for explanation purposes and may be modified as required.

When the MIS-type-diode constituting region $SC_{DT}$ having the second conductivity type (for example, $p^+$-type) is formed in the form of a buried plug, it can be formed in [Step-370] by a method in which an insulating interlayer is formed, then, the MIS-type-diode constituting region $SC_{DT}$ is formed by ion implantation using a patterned resist material as a mask, and then the MIS type diode DT is formed.

EXAMPLE 18

Example 18 is concerned with the semiconductor memory cell according to the fifth and twenty-fifth aspects of the present invention. As is shown in the principle drawing of FIG. 179A and the schematic partial cross-sectional view of FIG. 180A, the semiconductor memory cell of Example 18 has a semiconductor layer having two main surfaces opposed to each other, the main surfaces being a first main surface $A_1$ and a second main surface $A_2$, and the semiconductor memory cell comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information.

In the semiconductor memory cell of Example 18 shown in FIG. 180A, the gate $G_1$ of the first transistor $TR_1$ and the gate $G_2$ of the second transistor $TR_2$ are respectively formed on the first main surface $A_1$ and the second main surface $A_2$ so as to be opposite to each other thorough the semiconductor layer, and positions of these gates are deviated to some extent with regard to the perpendicular direction. Further, the semiconductor memory cell has a so-called SOI structure in which it is surrounded by an insulation material layer $IL_0$ formed on a supporting substrate SPS. In the semiconductor memory cell of Example 18 shown in FIG. 180A, the supporting substrate SPS, an insulating interlayer $IL_1$, the gate $G_2$ of the second transistor $TR_2$ and the gate $G_1$ of the first transistor $TR_1$ are arranged in this order from below.

The semiconductor memory cell of Example 18 has;

(a) a semi-conductive first region $SC_1$ which is formed in the semiconductor layer to extend over from the first main surface $A_1$ to the second main surface $A_2$ and has a first conductivity type (for example, n-type), (b) a semi-conductive second region $SC_2$ which is formed in the semiconductor layer to extend over from the first main surface $A_1$ to the second main surface $A_2$, is in contact with the first region $SC_1$ and has a second conductivity type (for example, $p^+$-type), (c) a third region $SC_3$ which is formed in a surface region including the second main surface $A_2$ of the first region $SC_1$ to be spaced from the second region $SC_2$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a fourth region $SC_4$ which is formed in a surface region including the first main surface $A_1$ of the second region $SC_2$ to be spaced from the first region $SC_1$ and is in contact with the second region $SC_2$ so as to form a rectifier junction together with the second region $SC_2$, the fourth region $SC_4$ being a region which is semi-conductive and has the second conductivity type (for example, $n^+$-type) or which is conductive and is composed of a silicide, a metal or a metal compound, (e) a fifth region $SC_5$ which is formed in a surface region including the first main surface $A_1$ of the first region $SC_1$ to be spaced from the second region $SC_2$ and is in contact with the first region $SC_1$ so as to form a rectifier junction together with the first region $SC_1$, the fifth region $SC_5$ being a region which is semi-conductive and has the second conductivity type (for example, $p^+$-type) or which is conductive and is composed of a silicide, a metal or a metal compound, (f) the gate $G_1$ of the first transistor $TR_1$ formed on a first insulation layer formed on the first main surface $A_1$ so as to bridge the first region $SC_1$ and the fourth region $SC_4$, and (g) the gate $G_2$ of the second transistor $TR_2$ formed on a second insulation layer formed on the second main surface $A_2$ so as to bridge the second region $SC_2$ and the third region $SC_3$.

Concerning the first transistor $TR_1$, (A-1) one source/drain region is formed of a surface region including the first main surface $A_1$ of the first region $SC_1$, (A-2) the other source/drain region is formed of the fourth region $SC_4$, and (A-3) the channel forming region $CH_1$ is formed of a surface region including the first main surface $A_1$ of the second region $SC_2$ which surface region is interposed between the surface region including the first main surface $A_1$ of the first region $SC_1$ and the fourth region $SC_4$.

Concerning the second transistor $TR_2$, (B-1) one source/drain region is formed of a surface region including the second main surface $A_2$ of the second region $SC_2$, (B-2) the other source/drain region is formed of the third region $SC_3$, and (B-3) the channel forming region $CH_2$ is formed of a surface region including the second main surface $A_2$ of the first region $SC_1$ which surface region is interposed between the surface region including the second main surface $A_2$ of the second region $SC_2$ and the third region $SC_3$.

Concerning the junction-field-effect transistor $JF_1$, (C-1) the gate regions of are formed of the fifth region $SC_5$ and the third region $SC_3$ which is opposed to the fifth region $SC_5$, (C-2) the channel region $CH_{J1}$ is formed of part of the first region $SC_1$ which part is interposed between the fifth region $SC_5$ and the third region $SC_3$, (C-3) one source/drain region is formed of a portion of the first region $SC_1$ which portion extends from one end of the channel region $CH_{J1}$ of the junction-field-effect transistor $JF_1$ and constitutes one source/drain region of the first transistor $TR_1$ and the channel forming region $CH_2$ of the second transistor $TR_2$, and (C-4) the other source/drain region is formed of a portion of the first region $SC_1$ which portion extends from the other end of the channel region $CH_{J1}$ of the junction-field-effect transistor $JF_1$.

Concerning the MIS type diode DT, (D-1) one end thereof is formed of part of the second region $SC_2$, and (D-2) an electrode EL constituting the other end thereof is formed to be opposed to said part of the second region $SC_2$ constituting one end of the MIS type diode DT, through a wide gap thin film.

The junction-field-effect transistor $JF_1$ is formed by (X) optimizing the distance between the facing gate regions (the fifth region $SC_5$ and the third region $SC_3$ which is opposed to the fifth region $SC_5$), that is, the thickness of the channel region $CH_{J1}$, and (Y) optimizing the impurity concentration of each of the facing gate regions (the fifth region $SC_5$ and the third region $SC_3$ which is opposed to the fifth region $SC_5$) and the impurity concentration of the channel region $CH_{J1}$ (specifically, the first region $SC_1$).

The gate $G_1$ of the first transistor $TR_1$ and the gate $G_2$ of the second transistor $TR_2$ are connected to a first line (word line) for memory cell selection, and the third region $SC_3$ is connected to the write-in information setting line WISL. Further, the fourth region $SC_4$ is connected to a second line, the electrode EL constituting the other end of the MIS type diode DT is connected to a third line having a predetermined potential, the fifth region $SC_5$ is connected to a fourth line, and the portion of the first region $SC_1$ which portion constitutes the other source/drain region of the junction-field-effect transistor $JF_1$ is connected to a fifth line. The electrode EL constituting the other end of the MIS type diode DT is connected to the third line through a high-resistance element R having a resistance of approximately $10^9$ to $10^{12}\Omega$. In this case, there may be employed an embodiment in which the second line to which the fourth region $SC_4$ is connected is used as a bit line and a second predetermined potential is applied to the fifth line to which the first region $SC_1$ is connected, or an embodiment in which a second predetermined potential is applied to the second line and the fifth line is used as a bit line.

FIGS. 180B, 181A and 181B show schematic partial cross-sectional views of variants of the semiconductor memory cell of Example 18. In the variant shown in FIG. 180B, positions of the gate $G_1$ of the first transistor $TR_1$ and the gate $G_2$ of the second transistor $TR_2$ are nearly aligned with regard to the perpendicular direction, differing from their positional relationship in FIG. 180A. Forming such a structure serves to decrease the area of the semiconductor memory cell. In the variants shown in FIGS. 181A and 181B, the supporting substrate SPS, the insulating interlayer $IL_1$, the gate $G_1$ of the first transistor $TR_1$ and the gate $G_2$ of the second transistor $TR_2$ are arranged in this order from below. The positional relationship of these regions with regard to the perpendicular direction is reverse to the positional relationship of the regions of the semiconductor memory cells shown in FIGS. 180A and 180B. In the variant shown in FIG. 181B, positions of the gate $G_1$ of the first transistor $TR_1$ and the gate $G_2$ of the second transistor $TR_2$ are nearly aligned with regard to the perpendicular direction, differing from their positional relationship in FIG. 181A.

Further, FIGS. 182A, 182B, 183A, 183B, 184A, 184B, 185A and 185B show schematic partial cross-sectional views of variants of the semiconductor memory cell of Example 18. The principle drawing of the semiconductor memory cells shown in these Figures is as shown in FIG. 179B. The semiconductor memory cells shown in FIGS. 182A, 182B 184A and 184B are variants of the semiconductor memory cells shown in FIGS. 180A and 180B, and the semiconductor memory cells shown in FIGS. 183A, 183B, 185A and 185B are variants of the semiconductor memory cells shown in FIGS. 181A and 181B.

In these semiconductor memory cells, the fifth region $SC_5$ is connected to the write-in information setting line WISL in place of being connected to the fourth line. Being connected to the write-in information setting line WISL is equivalent to being connected to the third region $SC_3$. Specifically, the fifth region $SC_5$ and the third region $SC_3$ can be connected to each other, for example, by forming a structure in which a portion of the third region $SC_3$ is extended up to the first main surface $A_1$ of the semiconductor layer and the fifth region $SC_5$ and the extending portion of the third region $SC_3$ are in contact with each other outside the first region $SC_1$. The wiring structure of the semiconductor memory cell can be simplified by structuring the semiconductor memory cell as described above. In these cases, it is preferred to employ a constitution in which the second line is used as a bit line, or a constitution in which the write-in information setting line WISL is used as a bit line as well and a second predetermined potential is applied to the second line.

The semiconductor memory cell of Example 18 can be manufactured substantially by the same process as that explained in Example 3, so that the detailed explanation thereof is omitted. The junction-field-effect transistor $JF_1$ can be formed by optimizing the distance between the fifth region $SC_5$ and the third region $SC_3$ which is opposed to the fifth region $SC_5$, that is, the thickness of the channel region $CH_{J1}$, and by optimizing the impurity concentration of each of the fifth region $SC_5$ and the third region $SC_3$ which is opposed to the fifth region $SC_5$ and the impurity concentration of the first region $SC_1$ (corresponding to the channel region $CH_{J1}$). Further, the process for manufacturing semiconductor memory cells of Examples to be explained hereinafter can be also manufactured substantially by the same process as that explained in Example 3 except for differences, for example, in the formation of the fifth region $SC_5$ and/or the sixth region $SC_6$ and the formation of a common gate $(G_1+G_3)$, so that the detailed explanations thereof will be omitted.

When each of the semiconductor memory cells of Example 18 and Examples 19 to 22 to be explained later is produced, the order of the formation of gate $G_1$ of the first transistor $TR_1$ and formation of gate $G_2$ of the second transistor $TR_2$ can be determined depending upon structures of the semiconductor memory cells to be manufactured. Further, the gate $G_1$ of the first transistor $TR_1$, the gate $G_2$ of the second transistor $TR_2$, the facing gate regions of the junction-field-effect transistor $JF_1$, and the channel region $CH_{J1}$ can be formed in an order required depending upon structures of semiconductor memory cells to be manufactured.

EXAMPLE 19

Example 19 is concerned with the semiconductor memory cell according to the sixth and twenty-sixth aspects of the present invention. As is shown in the principle drawing of FIG. 108, the schematic partial cross-sectional view of FIG. 186A and a schematic layout of gates and regions in FIG. 189A, the semiconductor memory cell of Example 19 has a semiconductor layer having two main surfaces opposed to each other, the main surfaces being a first main surface $A_1$ and a second main surface $A_2$, and the semiconductor memory cell comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate $G_2$ capacitively coupled with the channel forming region $CH_2$, (3) a junction-field-effect transistor $JF_1$ for current control, having source/drain regions, a channel region $CH_{J1}$ and gate regions, and (4) an MIS type diode DT for retaining information.

In the semiconductor memory cell of Example 19 shown in FIG. 186A, the gate $G_1$ of the first transistor $TR_1$ and the gate $G_2$ of the second transistor $TR_2$ are respectively formed on the first main surface $A_1$ and the second main surface $A_2$ so as to be opposite to each other thorough the semiconductor layer, and positions of these gates are deviated to some extent with regard to the perpendicular direction. Further, the semiconductor memory cell has a so-called SOI structure in which it is surrounded by an insulation material layer $IL_0$ formed on a supporting substrate SPS. In the semiconductor memory cell of Example 19 shown in FIG. 186A, the supporting substrate SPS, an insulating interlayer $IL_1$, the gate $G_2$ of the second transistor $TR_2$ and the gate $G_1$ of the first transistor $TR_1$ are arranged in this order from below. In FIG. 189A, showing of the gate $G_2$ and the third region $SC_3$ is omitted.

The semiconductor memory cell of Example 19 has;

(a) a semi-conductive first region $SC_1$ which is formed in the semiconductor layer to extend over from the first main surface $A_1$ to the second main surface $A_2$ and has a first conductivity type (for example, n-type), (b) a semi-conductive second region $SC_2$ which is formed in the semiconductor layer to extend over from the first main surface $A_1$ to the second main surface $A_2$, is in contact with the first region $SC_1$ and has a second conductivity type (for example, $p^+$-type), (c) a third region $SC_3$ which is formed in a surface region including the second main surface $A_2$ of the first region $SC_1$ to be spaced from the second region $SC_2$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a fourth region $SC_4$ which is formed in a surface region including the first main surface $A_1$ of the second region $SC_2$ to be spaced from the first region $SC_1$ and is in contact with the second region $SC_2$ so as to form a rectifier junction together with the second region $SC_2$, the fourth region $SC_4$ being a region which is semi-conductive and has the second conductivity type (for example, $n^+$-type) or which is conductive and is composed of a silicide, a metal or a metal compound, (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^+$-type) or which is conductive and is composed of a silicide, a metal or a metal compound, (f) the gate $G_1$ of the first transistor $TR_1$ formed on a first insulation layer formed on the first main surface $A_1$ so as to bridge the first region $SC_1$ and the fourth region $SC_4$, and (g) the gate $G_2$ of the second transistor $TR_2$ formed on a second insulation layer formed on the second main surface $A_2$ so as to bridge the second region $SC_2$ and the third region $SC_3$.

Concerning the first transistor $TR_1$, (A-1) one source/drain region is formed of a surface region including the first main surface $A_1$ of the first region $SC_1$, (A-2) the other source/drain region is formed of the fourth region $SC_4$, and (A-3) the channel forming region $CH_1$ is formed of a surface region including the first main surface $A_1$ of the second region $SC_2$ which surface region is interposed between the surface region including the first main surface $A_1$ of the first region $SC_1$ and the fourth region $SC_4$.

Concerning the second transistor $TR_2$, (B-1) one source/drain region is formed of a surface region including the second main surface $A_2$ of the second region $SC_2$, (B-2) the other source/drain region is formed of the third region $SC_3$, and (B-3) the channel forming region $CH_2$ is formed of a surface region including the second main surface $A_2$ of the first region $SC_1$ which surface region is interposed between the surface region including the second main surface $A_2$ of the second region $SC_2$ and the third region $C_3$.

Concerning the junction-field-effect transistor $JF_1$, (C-1) the gate regions are formed of the fifth region $SC_5$ and part of the second region $SC_2$ which part is opposed to the fifth region $SC_5$, (C-2) the channel region $CH_{J1}$ is formed of part of the fourth region $SC_4$ which part is interposed between the fifth region $SC_5$ and said part of the second region $SC_2$, (C-3) one source/drain region is formed of a portion of the fourth region $SC_4$ which portion extends from one end of the channel region $CH_{J1}$ of the junction-field-effect transistor $JF_1$ and constitutes the other source/drain region of the first transistor $TR_1$, and (C-4) the other source/drain region is formed of a portion of the fourth region $SC_4$ which portion extends from the other end of the channel region $CH_{J1}$ of the junction-field-effect transistor $JF_1$.

The junction-field-effect transistor $JF_1$ is formed by (X) optimizing the distance between the facing gate regions (the fifth region $SC_5$ and the part of the second region $SC_2$ which part is opposed to the fifth region $SC_5$), that is, the thickness of the channel region $CH_{J1}$, and (Y) optimizing the impurity concentration of each of the facing gate regions (the fifth region $SC_5$ and the part of the second region $SC_2$ which part is opposed to the fifth region $SC_5$) and the impurity concentration of the channel region $CH_{J1}$ (fourth region $SC_4$).

Concerning the MIS type diode DT, (D-1) one end thereof is formed of part of the second region $SC_2$, and (D-2) an electrode EL constituting the other end thereof is formed to be opposed to said part of the second region $SC_2$ constituting one end of the MIS type diode DT, through a wide gap thin film.

The gate $G_1$ of the first transistor $TR_1$ and the gate $G_2$ of the second transistor $TR_2$ are connected to a first line (word line) for memory cell selection, and the portion of the fourth region $SC_4$ which portion constitutes the other source/drain region of the junction-field-effect transistor $JF_1$ is connected to a second line, the electrode EL constituting the other end of the MIS type diode DT is connected to a third line having a predetermined potential, and the third region $SC_3$ is connected to the write-in information setting line WISL. Further, the fifth region $SC_5$ is connected to a fourth line, and the first region $SC_1$ is connected to a fifth line. The electrode EL constituting the other end of the MIS type diode DT is connected to the third line through a high-resistance element R having a resistance of approximately $10^9$ to $10^{12}\Omega$. In this case, there may be employed an embodiment in which the second line to which the fourth region $SC_4$ is connected is used as a bit line and a second predetermined potential is applied to the fifth line to which the first region $SC_1$ is connected, or an embodiment in which a second predetermined potential is applied to the second line to which the fourth region $SC_4$ is connected and the fifth line to which the first region $SC_1$ is connected is used as a bit line.

FIGS. 186B, 187A and 187B show schematic partial cross-sectional views of variants of the semiconductor memory cell of Example 19. In the variant shown in FIG. 186B, positions of the gate $G_1$ of the first transistor $TR_1$ and the gate $G_2$ of the second transistor $TR_2$ are nearly aligned with regard to the perpendicular direction, differing from their positional relationship in FIG. 186A. Forming such a structure serves to decrease the area of the semiconductor memory cell. In the variants shown in FIGS. 187A and 187B, the supporting substrate SPS, the insulating interlayer $IL_1$, the gate $G_1$ of the first transistor $TR_1$ and the gate $G_2$ of the second transistor $TR_2$ are arranged in this order from below. The positional relationship of these regions with regard to the perpendicular direction is reverse to the positional relationship of the regions of the semiconductor memory cells shown in FIGS. 186A and 186B. In the variant shown in FIG. 187B, positions of the gate $G_1$ of the first transistor $TR_1$ and the gate $G_2$ of the second transistor $TR_2$ are nearly aligned with regard to the perpendicular direction, differing from their positional relationship in FIG. 187A.

Figure 112:
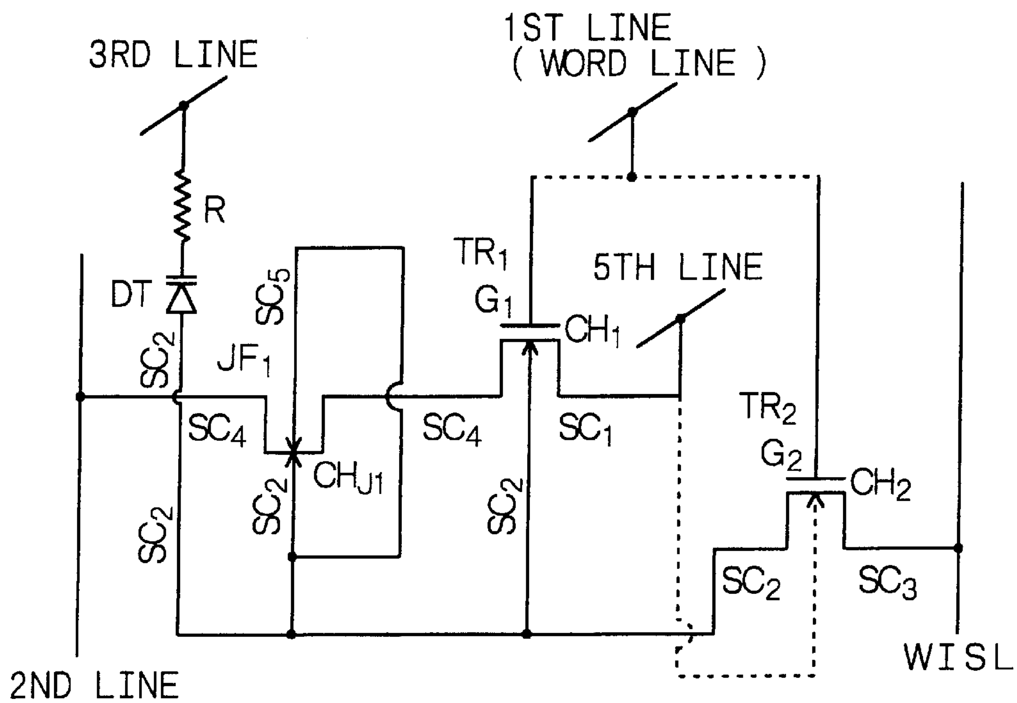
FIG. 112 shows the principle of a variant of the semiconductor memory cell according to the sixth aspect of the present invention.
Figure 113A:
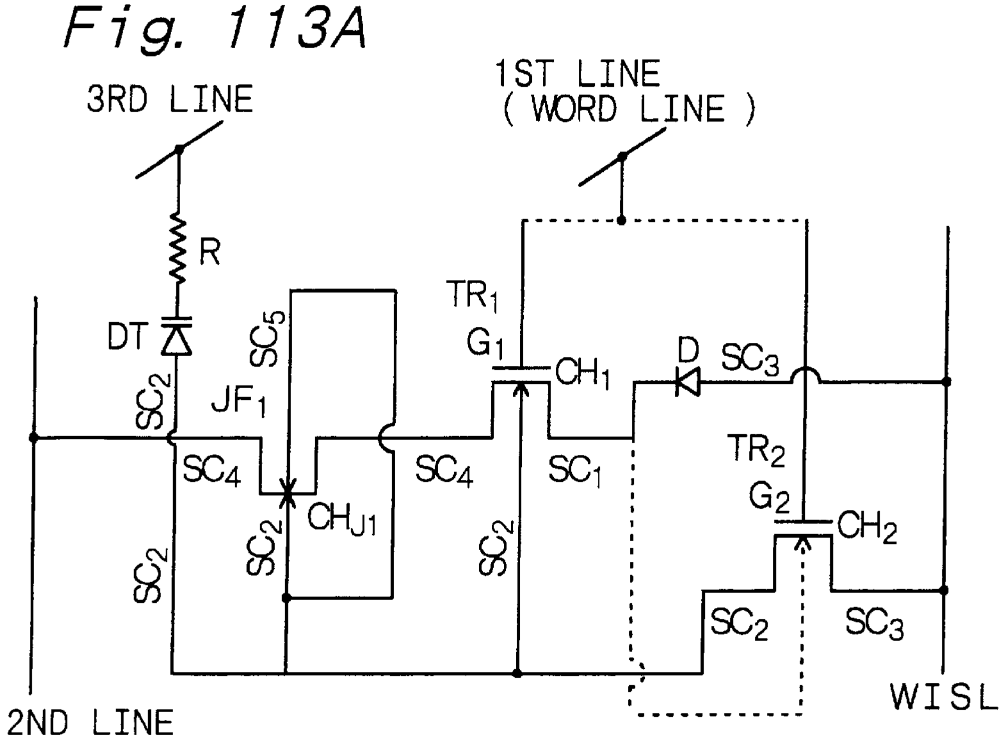
FIGS. 113A and 113B show the principles of variants of the semiconductor memory cell according to the sixth aspect of the present invention.
Figure 113B:
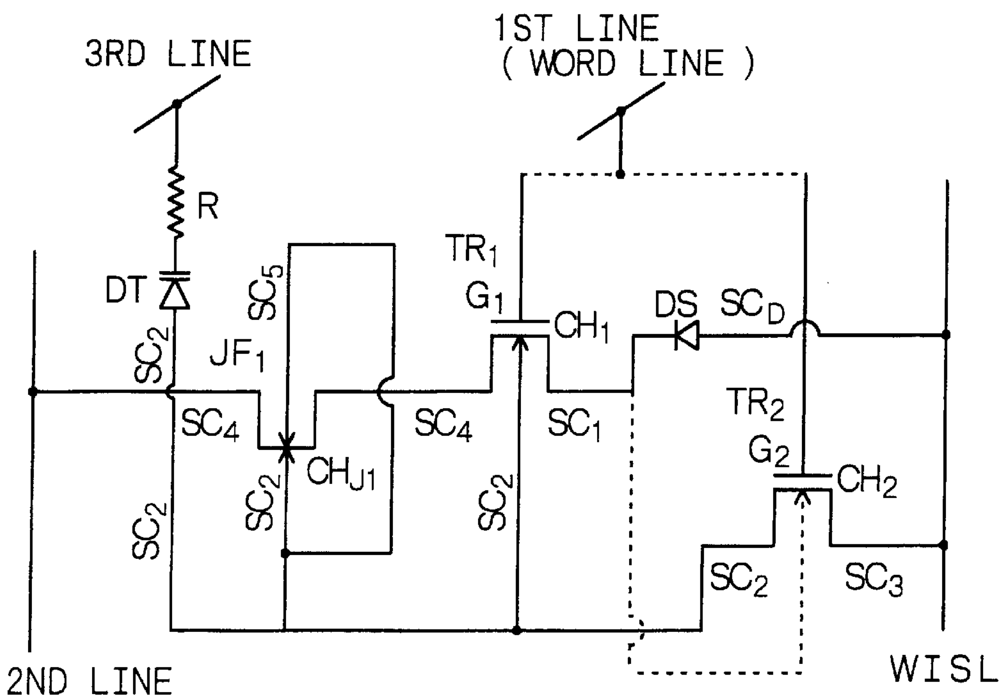

Further, FIGS. 188A, 188B, 190A and 190B show schematic partial cross-sectional views of variants of the semiconductor memory cell of Example 19. FIG. 189B shows a schematic layout of gates and regions in the semiconductor memory cell shown in FIG. 188A. In FIG. 189B, showing of the gate $G_2$ and the third region $SC_3$ is omitted. The principle drawing of the semiconductor memory cells shown in these Figures is as shown in FIG. 112. That is, in these semiconductor memory cells, the fifth region $SC_5$ is connected to the second region $SC_2$ in place of being connected to the fourth line. Specifically, the fifth region $SC_5$ and the second region $SC_2$ can be connected to each other, for example, by forming a structure in which a portion of the second region $SC_2$ is extended up to the first main surface $A_1$ of the semiconductor layer and the fifth region $SC_5$ and the extending portion of the second region $SC_2$ are in contact with each other outside the fourth region $SC_4$. The wiring structure of the semiconductor memory cell can be simplified by structuring the semiconductor memory cell as described above. The semiconductor memory cells shown in FIGS. 188A and 188B are variants of the semiconductor memory cells shown in FIGS. 186A and 186B, and the semiconductor memory cells shown in FIGS. 190A and 190B are variants of the semiconductor memory cells shown in FIGS. 187A and 187B. In these cases, it is preferred to employ a constitution in which the second line is used as a bit line, or a constitution in which the write-in information setting line WISL is used as a bit line as well and a second predetermined potential is applied to the second line.

EXAMPLE 20

Example 20 is concerned with the semiconductor memory cell according to the twenty-seventh aspect of the present invention. As is shown in the principle drawing of FIG. 191 and the schematic partial cross-sectional view of FIG. 192A, the semiconductor memory cell of Example 20 has a semiconductor layer having two main surfaces opposed to each other, the main surfaces being a first main surface $A_1$ and a second main surface $A_2$, and the semiconductor memory cell comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate $G_2$ capacitively coupled with the channel forming region $CH_2$, (3) a first junction-field-effect transistor $JF_1$ for current control, having source/drain regions, a channel region $CH_{J1}$ and gate regions, (4) a second junction-field-effect transistor $JF_2$ for current control, having source/drain regions, a channel region $CH_{J2}$ and gate regions, and (5) an MIS type diode DT for retaining information.

That is, the semiconductor memory cell of Example 20 has a structure in which the structure of the semiconductor memory cell according to the twenty-sixth aspect of the present invention, explained in Example 19, is modified by forming a semi-conductive or conductive sixth region $SC_6$ and adding a second junction-field-effect transistor $JF_2$ for current control. Specifically, in Example 20, there is provided the semi-conductive or conductive sixth region $SC_6$ which is formed in the surface region of the fourth region $SC_4$ and is in contact with the fourth region $SC_4$ to form a rectifier junction together with the fourth region $SC_4$.

In the semiconductor memory cell shown in FIG. 192A, positions of the gate $G_1$ of the first transistor $TR_1$ and the gate $G_2$ of the second transistor $TR_2$ are deviated to some extent with regard to the perpendicular direction. Further, the semiconductor memory cell has a so-called SOI structure in which it is surrounded by an insulation material layer $IL_0$ formed on a supporting substrate SPS. In the semiconductor memory cell of Example 20 shown in FIG. 192A, the supporting substrate SPS, an insulating interlayer $IL_1$, the gate $G_2$ of the second transistor $TR_2$ and the gate $G_1$ of the first transistor $TR_1$ are arranged in this order from below.

The semiconductor memory cell of Example 20 has;

(a) a semi-conductive first region $SC_1$ which is formed in the semiconductor layer to extend over from the first main surface $A_1$ to the second main surface $A_2$ and has a first conductivity type (for example, n-type), (b) a semi-conductive second region $SC_2$ which is formed in the semiconductor layer to extend over from the first main surface $A_1$ to the second main surface $A_2$, is in contact with the first region $SC_1$ and has a second conductivity type (for example, $p^+$-type), (c) a third region $SC_3$ which is formed in a surface region including the second main surface $A_2$ of the first region $SC_1$ to be spaced from the second region $SC_2$ and is in contact with the first region $SC_1$ so as to form a rectifier junction together with the first region $SC_1$, the third region $SC_3$ being a region which is semi-conductive and has the second conductivity type (for example, $p^+$-type) or which is conductive and is composed of a silicide, a metal or a metal compound, (d) a fourth region $SC_4$ which is formed in a surface region including the first main surface $A_1$ of the second region $SC_2$ to be spaced from the first region $SC_1$ and is in contact with the second region $SC_2$ so as to form a rectifier junction together with the second region $SC_2$, the fourth region $SC_4$ being a region which is semi-conductive and has the second conductivity type (for example, $n^+$-type) or which is conductive and is composed of a silicide, a metal or a metal compound, (e) a fifth region $SC_5$ which is formed in a surface region including the first main surface $A_1$ of the first region $SC_1$ to be spaced from the second region $SC_2$ and is in contact with the first region $SC_1$ so as to form a rectifier junction together with the first region $SC_1$, the fifth region $SC_5$ being a region which is semi-conductive and has the second conductivity type (for example, $p^+$-type) or which is conductive and is composed of a silicide, a metal or a metal compound, (f) a sixth region $SC_6$ which is formed in a surface region of the fourth region $SC_4$ and is in contact with the fourth region $SC_4$ so as to form a rectifier junction together with the fourth region $SC_4$, the sixth region $SC_6$ being a region which is semi-conductive and has the second conductivity type (for example, $p^+$-type) or which is conductive and is composed of a silicide, a metal or a metal compound, (g) the gate $G_1$ of the first transistor $TR_1$ formed on a first insulation layer formed on the first main surface $A_1$ so as to bridge the first region $SC_1$ and the fourth region $SC_4$, and (h) the gate $G_2$ of the second transistor $TR_2$ formed on a second insulation layer formed on the second main surface $A_2$ so as to bridge the second region $SC_2$ and the third region $SC_3$.

Concerning the first transistor $TR_1$, (A-1) one source/drain region is formed of a surface region including the first main surface $A_1$ of the first region $SC_1$, (A-2) the other source/drain region is formed of the fourth region $SC_4$, and (A-3) the channel forming region $CH_1$ is formed of a surface region including the first main surface $A_1$ of the second region $SC_2$ which surface region is interposed between the surface region including the first main surface $A_1$ of the first region $SC_1$ and the fourth region $SC_4$.

Concerning the second transistor $TR_2$, (B-i) one source/drain region is formed of a surface region including the second main surface $A_2$ of the second region $SC_2$, (B-2) the other source/drain region is formed of the third region $SC_3$, and (B-3) the channel forming region $CH_2$ is formed of a surface region including the second main surface $A_2$ of the first region $SC_1$ which surface region is interposed between the surface region including the second main surface $A_2$ of the second region $SC_2$ and the third region $SC_3$.

Concerning the first junction-field-effect transistor $JF_1$, (C-1) the gate regions are formed of the fifth region $SC_5$ and the third region $SC_3$ which is opposed to the fifth region $SC_5$, (C-2) the channel region $CH_{J1}$ is formed of part of the first region $SC_1$ which part is interposed between the fifth region $SC_5$ and the third region $SC_3$, (C-3) one source/drain region is formed of a portion of the first region $SC_1$ which portion extends from one end of the channel $CH_{J1}$ region of the first junction-field-effect transistor $JF_1$ and constitutes one source/drain region of the first transistor $TR_1$ and the channel forming region $CH_2$ of the second transistor $TR_2$, and (C-4) the other source/drain region is formed of a portion of the first region $SC_1$ which portion extends from the other end of the channel region $CH_{J1}$ of the first junction-field-effect transistor $JF_1$.

Concerning the second junction-field-effect transistor $JF_2$, (D-1) the gate regions are formed of the sixth region $SC_6$ and part of the second region $SC_2$ which part is opposed to the sixth region $SC_6$, (D-2) the channel region $CH_{J2}$ is formed of part of the fourth region $SC_4$ which part is interposed between the sixth region $SC_6$ and said part of the second region $SC_2$, (D-3) one source/drain region is formed of a portion of the fourth region $SC_4$ which portion extends from one end of the channel region $CH_{J2}$ of the second junction-field-effect transistor $JF_2$ and constitutes the other source/drain region of the first transistor $TR_1$, and (D-4) the other source/drain region is formed of a portion of the fourth region $SC_4$ which portion extends from the other end of the channel region $CH_{J2}$ of the second junction-field-effect transistor $JF_2$.

The junction-field-effect transistors $JF_1$ and $JF_2$ are formed by (X) optimizing the distance between the facing gate regions (the fifth region $SC_5$ and the third region $SC_3$ which is opposed to the fifth region $SC_5$, that is, the thickness of the channel region $CH_{J1}$, and optimizing the distance between the sixth region $SC_6$ and the part of the second region $SC_2$ which part is opposed to the sixth region $SC_6$, that is, the thickness of the channel region $CH_2$, and (Y) optimizing the impurity concentration of each of the facing gate regions (the fifth region $SC_5$ and the third region $SC_3$ which is opposed to the fifth region $SC_5$, and the sixth region $SC_6$ and the part of the second region $SC_2$ which part is opposed to the sixth region $SC_6$) and the impurity concentrations of the channel regions $CH_{J1}$ and $CH_{J2}$ (first region $SC_1$ and fourth region $SC_4$).

Concerning the MIS type diode DT, (E-1) one end thereof is formed of part of the second region $SC_2$, and (E-2) an electrode EL constituting the other end thereof is formed to be opposed to said part of the second region $SC_2$ constituting one end of the MIS type diode DT, through a wide gap thin film.

The gate $G_1$ of the first transistor $TR_1$ and the gate $G_2$ of the second transistor $TR_2$ are connected to a first line (word line) for memory cell selection, and the third region $SC_3$ is connected to a write-in information setting line WISL. Further, the portion of the fourth region $SC_4$ which portion constitutes the other source/drain region of the second junction-field-effect transistor $JF_2$ is connected to a second line, the electrode EL constituting the other end of the MIS type diode DT is connected to a third line having a predetermined potential, the fifth region $SC_5$ and the sixth region $SC_6$ are connected to a fifth line, and the portion of the first region $SC_1$ which constitutes the other source/drain region of the first junction-field-effect transistor $JF_1$ is connected to a fifth line. The electrode EL constituting the other end of the MIS type diode DT is connected to the third line through a high-resistance element R having a resistance of approximately $10^9$ to $10^{12}\Omega$. In this case, there may be employed an embodiment in which the second line to which the fourth region $SC_4$ is connected is used as a bit line and a second predetermined potential is applied to the second line to which the fourth region $SC_4$ is connected, or an embodiment in which a second predetermined potential is applied to the second line to which the fourth region $SC_4$ is connected and the fifth line to which the first region $SC_1$ is connected is used as a bit line.

FIGS. 192B, 193A and 193B show schematic partial cross-sectional views of variants of the semiconductor memory cell of Example 20. In the variant shown in FIG. 192B, positions of the gate $G_1$ of the first transistor $TR_1$ and the gate $G_2$ of the second transistor $TR_2$ are nearly aligned with regard to the perpendicular direction, differing from their positional relationship in FIG. 192A. Forming such a structure serves to decrease the area of the semiconductor memory cell. In the variants shown in FIGS. 193A and 193B, the supporting substrate SPS, the insulating interlayer $IL_1$, the gate $G_1$ of the first transistor $TR_1$ and the gate $G_2$ of the second transistor $TR_2$ are arranged in this order from below. The positional relationship of these regions with regard to the perpendicular direction is reverse to the positional relationship of the regions of the semiconductor memory cells shown in FIGS. 192A and 192B. In the variant shown in FIG. 193B, positions of the gate $G_1$ of the first transistor $TR_1$ and the gate $G_2$ of the second transistor $TR_2$ are nearly aligned with regard to the perpendicular direction, differing from their positional relationship in FIG. 193A.

FIGS. 195A, 195B, 196A, 196B, 197A, 197B, 198A and 198B show schematic partial cross-sectional views of variants of the semiconductor memory cell of Example 20, and FIG. 194 shows the principle of these semiconductor memory cells. In these semiconductor memory cells, the fifth region $SC_5$ is connected to the write-in information setting line WISL in place of being connected to the fourth line, and the sixth region $SC_6$ is connected to the second region $SC_2$ in place of being connected to the fourth line. Being connected to the write-in information setting line WISL is equivalent to being connected to the third region $SC_3$. The fifth region $SC_5$ and the write-in information setting line WISL can be connected (the fifth region $SC_5$ and the third region $SC_3$ can be connected) to each other according to the method explained in Example 18. Further, the sixth region $SC_6$ and the second region $SC_2$ can be connected to each other in the same manner as in the connection of the fifth region $SC_5$ and the second region $SC_2$ explained in Example 19. The semiconductor memory cells shown in FIGS. 195A, 195B, 196A and 196B are, in principle, structurally the same as the semiconductor memory cells shown in FIGS. 192A and 192B, and the semiconductor memory cells shown in FIGS. 197A, 197B, 198A and 198B are, in principle, structurally the same as the semiconductor memory cells shown in FIGS. 193A and 193B, so that detailed explanations thereof are omitted. There may be employed an embodiment in which the second line to which the fourth region $SC_4$ is connected is used as a bit line and a second predetermined potential is applied to the fifth line to which the first region $SC_1$ is connected, or an embodiment in which the a second predetermined potential is applied to the second line to which the fourth region $SC_4$ is connected and the fifth line to which the first region $SC_1$ is connected is used as a bit line.

EXAMPLE 21

Example 21 is concerned with the semiconductor memory cell according to the twenty-eighth aspect of the present invention. FIG. 132 shows the principle, FIG. 199A shows a partial schematic cross-sectional view of one example of the semiconductor memory cell of Example 21, and FIG. 199B shows a schematic layout of regions thereof. The semiconductor memory cell of Example 21 has a semiconductor layer having two main surfaces opposed to each other, the main surfaces being a first main surface $A_1$ and a second main surface $A_2$, and comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate $G_2$ capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate $G_3$ capacitively coupled with the channel forming region $CH_3$, (4) a junction-field-effect transistor $JF_1$ for current control, having source/drain regions, a channel region $CH_{J1}$ and gate regions, and (5) an MIS type diode DT for retaining information.

That is, the semiconductor memory cell of Example 21 has a structure similar to the semiconductor memory cell according to the twenty-sixth aspect of the present invention explained in Example 19 in which the third transistor $TR_3$ for current control having the second conductivity type is added. In FIG. 199B, the gate $G_2$ and the third region $SC_3$ are omitted.

In the semiconductor memory cell of Example 21 shown in FIG. 199A, positions of the gate $(G_1+G_3)$ common to the first transistor $TR_1$ and the third transistor $TR_3$ (to be sometimes referred to as "common gate $(G_1+G_3)$" hereinafter) and the gate $G_2$ of the second transistor $TR_2$ are deviated to some extent with regard to the perpendicular direction. Further, the semiconductor memory cell has a so-called SOI structure in which it is surrounded by an insulation material layer $IL_0$ formed on a supporting substrate SPS. In the semiconductor memory cell of Example 21 shown in FIG. 199A, the supporting substrate SPS, an insulating interlayer $IL_1$, the gate $G_2$ of the second transistor $TR_2$ and the common gate $(G_1+G_3)$ are arranged in this order from below.

In a semiconductor memory cell of Example 21, the layout of the first region $SC_1$, the second region $SC_2$, the third region $SC_3$, the fourth region $SC_4$ and the fifth region $SC_5$ is the same as that of the semiconductor memory cell of Example 19.

The structures of the first transistor $TR_1$, the second transistor $TR_2$ and the junction-field-effect transistor $JF_1$ are the same as those of the semiconductor memory cell of Example 19. The semiconductor memory cell of Example 21 differs from the semiconductor memory cell of Example 19 in that the common gate $(G_1+G_3)$ is formed on the first insulation layer formed on the first main surface $A_1$ so as to bridge the first region $SC_1$ and the fourth region $SC_4$ and so as to bridge the second region $SC_2$ and the fifth region $SC_5$ and is shared by the first transistor $TR_1$ and the third transistor $TR_3$. The semiconductor memory cell of Example 21 has a constitution in which the common gate $(G_1+G_3)$ extends to an end portion of the surface region of the fourth region $SC_4$. In the semiconductor memory cell of Example 21, the fifth region $SC_5$ can be formed in a self-aligned manner.

Concerning the third transistor $TR_3$, one source/drain region constitutes the channel forming region $CH_1$ of the first transistor $TR_1$, the other source/drain region is formed of the fifth region $SC_5$, and the channel forming region $CH_3$ constitutes the other source/drain region of the first transistor $TR_1$.

The junction-field-effect transistor $JF_1$ is formed by:

(X) optimizing the distance between the facing gate regions (the fifth region $SC_5$ and the part of the second region $SC_2$ which part is opposed to the fifth region $SC_5$), that is, the thickness of the channel region $CH_{J1}$, and (Y) optimizing impurity concentrations of the facing gate regions (the fifth region $SC_5$ and the part of the second region $SC_2$ which part is opposed to the fifth region $SC_5$) and the channel region $CH_{J1}$ (the fourth region $SC_4$).

The common gate ($G_1$+$G_3$) and the gate $G_2$ of the second transistor $TR_2$ are connected to a first line (word line) for memory cell selection. The third region $SC_3$ is connected to a write-in information setting line WISL, the portion of the fourth region $SC_4$ constituting the other source/drain region of the junction-field-effect transistor $JF_{J1}$ is connected to a second line, the electrode constituting the other end of the MIS type diode is connected to a third line having a predetermined potential, and the first region $SC_1$ is connected to a fourth line. The electrode EL constituting the other end of the MIS type diode DT is connected to the third line through a high-resistance element R having a resistance of approximately $10^9$ to $10^{12}\Omega$. There may be employed an embodiment in which the second line to which the fourth region $SC_4$ is connected is used as a bit line and a second predetermined potential is applied to the fourth line to which the first region $SC_1$ is connected, or an embodiment in which the a second predetermined potential is applied to the second line to which the fourth region $SC_4$ is connected and the fourth line to which the first region $SC_1$ is connected is used as a bit line.

FIGS. 200, 201A and 201B show schematic partial cross-sectional views of variants of the semiconductor memory cell of Example 21. In the variant shown in FIG. 200, positions of the common gate ($G_1$+$G_3$) and the gate $G_2$ of the second transistor $TR_2$ are nearly aligned with regard to the perpendicular direction, differing from their positional relationship in FIG. 199A. Forming such a structure serves to decrease the area of the semiconductor memory cell. In the variants shown in FIGS. 201A and 201B, the supporting substrate SPS, the insulating interlayer $IL_1$, the common gate ($G_1$+$G_3$) and the gate $G_2$ of the second transistor $TR_2$ are arranged in this order from below. The positional relationship of these regions with regard to the perpendicular direction is reverse to the positional relationship of the regions of the semiconductor memory cells shown in FIGS. 199A and FIG. 200. In the variant shown in FIG. 201B, positions of the common gate ($G_1$+$G_3$) and the gate $G_2$ of the second transistor $TR_2$ are nearly aligned with regard to the perpendicular direction, differing from their positional relationship in FIG. 201A.

EXAMPLE 22

Example 22 is concerned with the semiconductor memory cell according to the twenty-ninth aspect of the present invention. FIG. 202 shows the principle, and FIG. 203A shows a partial schematic cross-sectional view of one example of the semiconductor memory cell of Example 22. The semiconductor memory cell of Example 22 has a semiconductor layer having two main surfaces opposed to each other, the main surfaces being a first main surface $A_1$ and a second main surface $A_2$, and comprises;

(1) a first transistor $TR_1$ for readout, having a first conductivity type (for example, n-channel type), and having source/drain regions, a semi-conductive channel forming region $CH_1$ which is in contact with the source/drain regions and spaces out the source/drain regions, and a gate $G_1$ capacitively coupled with the channel forming region $CH_1$, (2) a second transistor $TR_2$ for switching, having a second conductivity type (for example, p-channel type), and having source/drain regions, a semi-conductive channel forming region $CH_2$ which is in contact with the source/drain regions and spaces out the source/drain regions, and a gate $G_2$ capacitively coupled with the channel forming region $CH_2$, (3) a third transistor $TR_3$ for current control, having the second conductivity type (for example, p-channel type), and having source/drain regions, a semi-conductive channel forming region $CH_3$ which is in contact with the source/drain regions and spaces out the source/drain regions, and a gate $G_3$ capacitively coupled with the channel forming region $CH_3$, (4) a first junction-field-effect transistor $JF_{J1}$ for current control, having source/drain regions, a channel region $CH_{J1}$ and gate regions, (5) a second junction-field-effect transistor $JF_{J2}$ for current control, having source/drain regions, a channel region $CH_{J2}$ and gate regions, and (6) an MIS type diode for retaining information.

The semiconductor memory cell of Example 22 has such a structure that the structure of the semiconductor memory cell according to the twenty-seventh aspect of the present invention explained in Example 20 is combined with the structure of the semiconductor memory cell according to the twenty-eighth aspect of the present invention explained in Example 21. That is, the semiconductor memory cell of Example 22 has a structure in which a semi-conductive or conductive sixth region $SC_6$ is further formed, a second junction-field-effect transistor $JF_{J2}$ for current control is added and a third transistor $TR_3$ for current control, having the second conductivity type is further added into the structure of the semiconductor memory cell according to the twenty-sixth aspect of the present invention.

In the semiconductor memory cell of Example 22 shown in FIG. 203A, positions of the common gate ($G_1$+$G_3$) and the gate $G_2$ of the second transistor $TR_2$ are deviated to some extent with regard to the perpendicular direction. Further, the semiconductor memory cell has a so-called SOI structure in which it is surrounded by an insulation material layer $IL_0$ formed on a supporting substrate SPS. In the semiconductor memory cell of Example 22 shown in FIG. 203A, the supporting substrate SPS, an insulating interlayer $IL_1$, the gate $G_2$ of the second transistor $TR_2$ and the common gate ($G_1$+$G_3$) are arranged in this order from below.

In a semiconductor memory cell of Example 22, the layout of the first region $SC_1$, the second region $SC_2$, the third region $SC_3$, the fourth region $SC_4$, the fifth region $SC_5$ and the sixth region $SC_6$ is the same as that of the semiconductor memory cell of Example 20.

Further, the structures of the first transistor $TR_1$, the second transistor $TR_2$, the first junction-field-effect transistor $JF_1$ and the second junction-field-effect transistor $JF_2$ are the same as those of the semiconductor memory cell of Example 20. The semiconductor memory cell of Example 22 differs from the semiconductor memory cell of Example 20 in that the common gate ($G_1$+$G_3$) is formed on the first insulation layer formed on the first main surface $A_1$ so as to bridge the first region $SC_1$ and the fourth region $SC_4$ and so as to bridge the second region $SC_2$ and the fifth region $SC_5$ and is shared by the first transistor $TR_1$ and the third transistor $TR_3$, and in that the sixth region $SC_6$ is not connected to the fourth line.

The third transistor $TR_3$ has a similar structure to the semiconductor memory cell of Example 21. That is, one source/drain region constitutes the channel forming region $CH_1$ of the first transistor $TR_1$, the other source/drain region is formed of the sixth region $SC_6$, and the channel forming region $CH_3$ constitutes the other source/drain region of the first transistor $TR_1$.

The junction-field-effect transistors $JF_1$ and $JF_{J2}$ are formed by:

(X) optimizing the distance between the facing gate regions (the fifth region $SC_5$ and the third region $SC_3$ which is opposed to the fifth region $SC_5$), that is, the thickness of the channel region $CH_{J1}$, and optimizing the distance between the facing gate regions (the sixth region $SC_6$ and the part of the second region $SC_2$ which part is opposed to the sixth region $SC_6$), that is, the thickness of the channel region $CH_{J2}$, and (Y) optimizing impurity concentrations of the facing gate regions (the fifth region $SC_5$ and the third region $SC_3$ which is opposed to the fifth region $SC_5$, and the sixth region $SC_6$ and the part of the second region $SC_2$ which part is opposed to the sixth region $SC_6$) and the channel regions $CH_{J1}$ and $CH_{J2}$ (the first region $SC_1$ and the fourth region $SC_4$).

The common gate ($G_1$+$G_3$) and the gate $G_2$ f the second transistor $TR_2$ are connected to a first line (word line) for memory cell selection. The third region $SC_3$ is connected to a write-in information setting line WISL, the portion of the fourth region $SC_4$ constituting the other source/drain region of the second junction-field-effect transistor $JF_{J2}$ is connected to a second line, the electrode constituting the other end of the MIS type diode is connected to a third line having a predetermined potential, and the fifth region $SC_5$ is connected to a fourth line. The electrode EL constituting the other end of the MIS type diode DT is connected to the third line through a high-resistance element R having a resistance of approximately $10^9$ to $10^{12}\Omega$. There may be employed an embodiment in which the second line to which the fourth region $SC_4$ is connected is used as a bit line and a second predetermined potential is applied to the fifth line to which the first region $SC_1$ is connected, or an embodiment in which the a second predetermined potential is applied to the second line to which the fourth region $SC_4$ is connected and the fifth line to which the first region $SC_1$ is connected is used as a bit line.

FIGS. 203B, 204A and 204B show schematic partial cross-sectional views of variants of the semiconductor memory cell of Example 22. In the variant shown in FIG. 203B, positions of the common gate ($G_1$+$G_3$) and the gate $G_2$ of the second transistor $TR_2$ are nearly aligned with regard to the perpendicular direction, differing from their positional relationship in FIG. 203A. Forming such a structure serves to decrease the area of the semiconductor memory cell. In the variants shown in FIGS. 204A and 204B, the supporting substrate SPS, the insulating interlayer $IL_1$, the common gate ($G_1$+$G_3$) and the gate $G_2$ of the second transistor $TR_2$ are arranged in this order from below. The positional relationship of these regions with regard to the perpendicular direction is reverse to the positional relationship of the regions of the semiconductor memory cell shown in FIGS. 203A and 203B. In the variant shown in FIG. 204B, positions of the common gate ($G_1$+$G_3$) and the gate $G_2$ of the second transistor $TR_2$ are nearly aligned with regard to the perpendicular direction, differing from their positional relationship in FIG. 204A.

FIGS. 206A, 206B, 207A, 207B, 208A, 208B, 209A and 209B show partial schematic cross-sectional views of other variants of the semiconductor memory cell of Example 22, and FIG. 205 shows the principle thereof. In these semiconductor memory cells, the fifth region $SC_5$ is connected to the write-in information setting line WISL in place of being connected to the fourth line. Being connected to the write-in information setting line WISL is equivalent being connected to the third region $SC_3$. The structures of the semiconductor memory cells shown in FIGS. 206A, 206B, 207A and 207B are substantially the same as those of the semiconductor memory cells shown in FIGS. 203A and 203B, respectively, and the detailed description thereof is therefore omitted. Further, the structures of the semiconductor memory cells shown in FIGS. 208A, 208B, 209A and 209B are substantially the same as those of the semiconductor memory cells shown in FIGS. 204A and 204B, respectively, and the detailed description thereof is therefore omitted. In these cases, it is preferred that the second line is used as a bit line and a second predetermined potential is applied to the fifth line, or that a second predetermined potential is applied to the second line and the fifth line is used as a bit line.

In the semiconductor memory cell of Example 22, when an impurity containing layer having the second conductivity type (for example, $p^+$-type) is formed in the surface region of the fourth region $SC_4$ which surface region constitutes the channel forming region $CH_3$ of the third transistor $TR_3$, the third transistor $TR_3$ is brought into on-state on information retaining period in which the first line is set at, for example, 0 volt. As a result, the MIS type diode DT and the channel forming region $SC_1$ of the first transistor $TR_1$ are brought into conducted state. The impurity concentration of the impurity-containing layer is adjusted such that the third transistor $TR_3$ is brought into an off-state by the potential in the first line applied during the reading of information.

The operation of the semiconductor memory cell of Example 5 will be explained below. It should be noted that the principles of operation of the semiconductor memory cells of other Examples are substantially same. When the write-in information setting line also serves as the second line (for example, bit line), the term "the write-in information setting line" in the following paragraphs is literally convertible to "the second line (for example, bit line)".

In write-in operation, potentials at portions of the semiconductor memory cell are set as shown in the following Table 8.

TABLE 8

| | |
|---|---|
| First line for memory cell selection | : $V_W$ |
| Write-in information setting line | |
| when writing "0" (first information) | : $V_0$ (first potential) |
| when writing "1" (second information) | : $V_1$ (second potential) |

In read-out operation, potentials at portions of the semiconductor memory cell are set as shown in the following Table 9. When the write-in information setting line is provided separately from the second line, the predetermined potential including 0 volt is applied to the write-in information setting line.

TABLE 9

| | |
|---|---|
| First line for memory cell selection (for example, word line) | : $V_R$ |
| Second line (for example, bit line) | : $V_2$ |

Further, the electrode EL constituting the other end of the MIS type diode DT is connected to the line (third line) having a predetermined potential, and the predetermined potential is set at $V_{DD}$. When the first conductivity type is n-type and the second conductivity type is p-type, $V_{DD}$ is a negative value.

A threshold voltage of the first transistor $TR_1$ seen from the gate $G_1$ is given as shown in the following Table 10.

Further, the relationship among potentials in the first transistor $TR_1$ is set as shown in Table 10. A potential in the channel forming region $CH_1$ of the first transistor $TR_1$ when information "0" (the first information) is read out is different from that when information "1" (the second information) is read out. As a result, the threshold voltage of the first transistor $TR_1$ seen from the gate $G_1$ changes, depending upon whether the stored information is "0" or "1". When the ratio of an on-state current to an off-state current of the junction-field-effect transistor $JF_1$ for current control is large, the information can be read out without any error even if $|V_R| \geqq |V_{TH\_11}|$.

TABLE 10

When "0" (first information) is read out: $V_{TH\_10}$
When "1" (second information) is read out: $V_{TH\_11}$ $$|V_{TH\_11}|>|V_R|>|V_{TH\_10}|$$

[Operation to Write Information]

In operation to write "0" (the first information, and the potential in the write-in information setting line: $V_0$) or write "1" (the second information, and the potential in the write-in information setting line: $V_1$), the potential in the first line is set at $V_W$ (<0). As a result, the potential in the gate $G_2$ of the second transistor $TR_2$ is set at $V_W$ (<0) as well, and the second transistor $TR_2$ is brought into an on-state. Therefore, the potential in the channel forming region $CH_1$ of the first transistor $TR_1$ is $V_0$ (the first potential) when information "0" is written in, or $V_1$ (the second potential) when information "1" is written in. As a result, the potential in one end of the MIS type diode DT is $V_0$ (the first potential) when information "0" is written in, or $V_1$ (the second potential) when information "1" is written in.

Meanwhile, if a current flowing in the wide gap thin film WG is greater than a reverse bias junction leak current between the second region $SC_2$ and the first region $SC_1$, the first region $SC_1$ is in a steady state in which the first region $SC_1$ is pulled up toward the other end of the MIS type diode DT. When the wide gap thin film WG is composed of an $SiO_2$ or SiON layer having a thickness of approximately 3 nm, and if the absolute value of a difference between $V_{DD}$ and the potential in the first region $SC_1$ is 2 volts or greater (at least 2.5 volts for the necessity of carrier multiplication to be explained below), the above state is materialized.

When the potential in one end of the MIS type diode DT is at the level of $V_0$ (the case of information of "0") which is the first potential, and when the value of $|V_{DD}-V_0|$ is, for example, 2.5 volts or greater, electrons flow in the wide gap thin film WG from the electrode EL constituting the other end of the MIS type diode DT due to a tunnel effect (direct-tunnel phenomenon or Fowler-Nordheim tunnel phenomenon), i.e., a tunnel current flows, and the electrons are injected into the surface of the first region $SC_1$. When the injected electrons have an energy which is higher than an energy gap equivalent of the first region $SC_1$ when viewed from the conduction band of the first region $SC_1$, carrier multiplication takes place, and electron-hole pairs are generated. In Example 5, the first region $SC_1$ has a p-type conductivity, so that holes are stored or accumulated in a portion of the first region $SC_1$ (extending portion of the channel forming region $CH_1$ of the first transistor $TR_1$), and even after the second transistor $TR_2$ comes to be off, the first region $SC_1$ is retained at the level of $V_0$ which is the first potential or a potential close thereto. And, the injection of electrons from the electrode EL constituting the MIS type diode DT is continued, and as a result, the carrier multiplication continues. That is, the potential in the channel forming region $CH_1$ of the first transistor $TR_1$ is retained on nearly at the first potential ($\approx V_0$). When the first region $SC_1$ is formed of a silicon containing a p-type impurity, and when the electrode EL of the MIS type diode DT is composed of a polysilicon thin layer containing an n-type impurity, the above phenomenon takes place when the value of $|V_{DD}-V_0|$ is 2.5 volts or greater. When the storing or accumulating of holes proceeds, the potential in the channel forming region $CH_1$ of the first transistor $TR_1$ sometimes comes to be higher than $V_0$ by approximately 0.1 to 0.2 volt when the conductivity type of the first transistor $TR_1$ is an n-type.

When the potential in one end of the MIS type diode DT is at the level of $V_1$ (the case of information of "1") which is the second potential, and when the value of $|V_{DD}-V_0|$ is equivalent to, or smaller than, the band gap of a material constituting the first region $SC_1$, the carrier multiplication does not take place. Actually, even if the value of $|V_{DD}-V_0|$ equals approximately the band gap of a material constituting the first region $SC_1$+0.5 volt, no carrier multiplication takes place. As a result, the junction leak current between the second region $SC_2$ and the first region $SC_1$ is compensated by the transition of majority carriers (holes) in the extending portion of the channel forming region $CH_1$ of the first transistor $TR_1$ to the electrode EL through the wide gap thin film WG according to the tunnel transition, and the potential in the first region $SC_1$ is retained at the level of $V_1$ which is the second potential. That is, the channel forming region $CH_1$ of the first transistor $TR_1$ is retained on at the level of the second potential ($V_1$).

In operation to write information, the potential in the gate $G_1$ of the first transistor $TR_1$ is also set at $V_W$ (<0). As a result, the first transistor $TR_1$ is in an off-state. In this state, the potential in the channel forming region $CH_1$ of the first transistor $TR_1$ is $V_0$ when information "0" is written in, or, $V_1$ when information "1" is written in. This state is maintained until operation of reading out information.

In an information maintaining state after the information has been written in and before the information is read out, potentials in portions in the first transistor $TR_1$ and the second transistor $TR_2$ should be set at such values that these transistors do not conduct. For this purpose, typically, the potential in the first line is set at 0 volt and the potential in the write-in information setting line is set at $V_1$.

[Operation to Read out Information]

In operation to read out the information "0" or "1", the potential in the first line is set at $V_R$ (>0). Therefore, the potential in the gate $G_2$ of the second transistor $TR_2$ is also set at $V_R$ (>0). As a result, the second transistor $TR_2$ is brought into an off-state.

The potential in the gate $G_1$ of the first transistor $TR_1$ is set at $V_R$ (>0) as well. The threshold voltage of the first transistor $TR_1$ seen from the gate $G_1$ is $V_{TH\_10}$ or $V_{TH\_11}$ for stored information of "0" or "1", respectively. The threshold voltage of the first transistor $TR_1$ depends upon the state of the potential in the channel forming region $CH_1$. The relationship among the potentials and the threshold voltages is as follows.

$$|V_{TH\_11}|>|V_R|>|V_{TH\_10}|$$

Therefore, when the stored information is "0", the first transistor $TR_1$ is brought into an on-state. When the stored information is "1", on the other hand, the first transistor $TR_1$ is brought into an off-state. However, when the ratio of an on-state current to an off-state current of the junction-field-effect transistor $JF_1$ is large, the information can be read out without any error even if $|V_R| \geqq |V_{TH\_11}|$.

Further, the first transistor $TR_1$ for readout is controlled by the junction-field-effect transistor $JF_1$ on the basis of the bias conditions of the gate regions of the junction-field-effect transistor $JF_1$ which are constituted of the fifth region $SC_5$ and the first region SC. That is, when the stored information is "0", the junction-field-effect transistor $JF_1$ is brought into an on-state. When the stored information is "1", on the other hand, the junction-field-effect transistor $JF_1$ is brought into an off-state.

In the above manner, the first transistor $TR_1$ can be brought into an on-state or an off-state with a high degree of reliability depending upon the stored information. Since the fourth region $SC_4$ is connected to the second line (for example, bit line), a current flows or does not flow in the first transistor $TR_1$ depending upon whether the stored information is "0" or "1". As a result, the stored information can be read out by the first transistor $TR_1$.

The operating states of the first transistor $TR_1$ for readout and the second transistor $TR_2$ for switching described above are summarized in Table 11. It should be noted that the values of potentials shown in Table 11 are no more than typical values, which can be any values as long as the conditions described above are satisfied.

TABLE 11

| Write-in operation | Write-in of "0" | | Write-in of "1" | |
|---|---|---|---|---|
| Potential in first line | $V_W$ | −1.5 | $V_W$ | −1.5 |
| Potential in write-in information setting line | $V_0$ | 0 | $V_1$ | −1.5 |
| Potential in gate | $V_W$ | −1.5 | $V_W$ | −1.5 |
| State of $TR_2$ | ON | | ON | |
| Potential in channel forming region $CH_1$ | $V_0$ | ≈0 | $V_1$ | −1.5 |
| State of $TR_1$ | OFF | | OFF | |
| Potential in the other end of MIS type diode DT | | −2.5 | | |

| Read-out operation | Read-out of "0" | | Read-out of "1" | |
|---|---|---|---|---|
| Potential in first line | $V_R$ | 0.8 | $V_R$ | 0.8 |
| Potential in gate | $V_R$ | 0.8 | $V_R$ | 0.8 |
| State of $TR_2$ | OFF | | OFF | |
| Potential in channel forming region $CH_1$ | $V_0$ | 0 | $V_1$ | −1.5 |
| Threshold voltage of $TR_1$ seen from gate | $V_{TH1\_0}$ | 0.25 | $V_{TH1\_1}$ | 1.3 |
| State of $TR_1$ | ON | | OFF | |
| Potential in second line | $V_2$ | 0 | $V_2$ | 0 |

unit : volt

The semiconductor memory cell of the present invention has been explained with reference to preferred embodiments hereinabove, while the present invention shall not be limited to those embodiments. The structures of the semiconductor memory cells, and voltages, potentials, etc., in the semiconductor memory cells explained as embodiments are examples, and may be changed as required. For example, in the semiconductor memory cells explained as embodiments, the first transistor for readout and the junction-field-effect transistor(s) $JF_1$, $JF_2$ may be p-type transistors, and the second transistor for switching and the third transistor for current control may be n-type transistors. In this case, further, it is sufficient to reverse the relationship of holes and electrons and the polarity of $V_{DD}$ (predetermined potential in the line (third line) to which the electrode constituting the other end of the MIS type diode is connected) with regard to the MIS type diode DT. The layout of elements in each transistor is an example, and may be changed as required. The SOI structure shown in FIGS. 52 and 73 and so on and the TFT structure can be applied to the semiconductor memory cell of the present invention. An impurity may be introduced into each region not only by an ion-implanting method but also by a solid-phase diffusion method. Further, the present invention can be applied not only to a semiconductor memory cell composed of a silicon semiconductor but also to a semiconductor memory cell composed of a compound semiconductor, for example, of a GaAs system. Moreover, the semiconductor memory cell of the present invention can be applied to a semiconductor memory cell having an MES FET structure.

In the present invention, the MIS type diode for retaining information is provided, and the potential in the channel forming region of the first transistor can be retained on during writing the information into the semiconductor memory cell, so that the refreshing operation required in a conventional DRAM is no longer required.

Further, an extremely large capacitor required in a conventional DRAM is no longer required. Further, the semiconductor memory cell having the MIS type diode for retaining information, provided by the present invention, an be integrated into only two transistor regions. The semiconductor memory cell of the present invention can be manufactured by a CMOS logic circuit manufacturing process with increasing a few steps alone.

Further, when the junction-field-effect transistor for current control is provided, the junction-field-effect transistor for current control is controlled to turn on/off during the reading of information, so that the margin of a current to flow between the second region and the third region can be remarkably broadened. As a result, the number of semiconductor memory cells which are connected to a bit line is less limited, and the time period for retaining information in the semiconductor memory cell (retention time) can be increased. Further, when the third transistor is provided, the gate is structured so as to extend up to an end of the surface region of the fourth region, and, for example, the sixth region can be formed in a self-alignment manner, so that the area of the semiconductor memory cell can be further decreased.

What is claimed is:

1. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, wherein:

one source/drain region of the first transistor corresponds to the channel forming region of the second transistor, one source/drain region of the second transistor corresponds to the channel forming region of the first transistor, and one end of the MIS type diode is formed of an extending portion of the channel forming region of the first transistor, the other end of the MIS type diode is formed of an electrode composed of an electrically conductive material, and the electrode is connected to a line having a predetermined potential.

2. The semi-conductor memory cell according to claim 1, wherein a material is interposed between one end and the other end of the MIS diode, in which material the tunnel transition of carriers is caused depending upon a potential difference between the potential in the channel forming region of the first transistor and the potential in the other end of the MIS type diode.

3. The semi-conductor memory cell according to claim 2, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

4. The semi-conductor memory cell according to claim 1, wherein the gate of the first transistor and the gate of the second transistor are connected to a word line, the other source/drain region of the first transistor is connected to a bit line, the other source/drain region of the second transistor is connected to a write-in information setting line, and the other end of the MIS type diode is connected to the line having a predetermined potential through a high-resistance element.

5. The semi-conductor memory cell according to claim 1, wherein the gate of the first transistor and the gate of the second transistor are connected to a word line, one source/drain region of the first transistor is connected to a bit line, the other source/drain region of the second transistor is connected to a write-in information setting line, and the other end of the MIS type diode is connected to the line having a predetermined potential through a high-resistance element.

6. The semi-conductor memory cell according to claim 1, wherein a diode is further provided, the gate of the first transistor and the gate of the second transistor are connected to a word line, one source/drain region of the first transistor is connected to a write-in information setting line through the diode, the other source/drain region of the first transistor is connected to a bit line, the other source/drain region of the second transistor is connected to the write-in information setting line, and the other end of the MIS type diode is connected to the line having a predetermined potential through a high-resistance element.

7. The semi-conductor memory cell according to claim 1, wherein a diode is further provided, a write-in information setting line functions as a bit line, the gate of the first transistor and the gate of the second transistor are connected to a word line, one source/drain region of the first transistor is connected to the write-in information setting line through the diode, the other source/drain region of the second transistor is connected to the write-in information setting line, and the other end of the MIS type diode is connected to the line having a predetermined potential through a high-resistance element.

8. The semiconductor memory cell according to claim 1, wherein the first transistor and the second transistor have a common gate.

9. The semiconductor memory cell according to claim 1, wherein a wide gap thin film is formed between the extending portion of channel forming region of the first transistor constituting the MIS type diode and the electrode.

10. A semiconductor memory cell comprising:

(1) a first transistor for readout, having a second conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, the semiconductor memory cell having;

(a) a semi-conductive first region having a first conductivity type, (b) a semi-conductive second region being in contact with the first region and having a second conductivity type, (c) a third region which is formed in a surface region of the first region to be spaced from the second region and is in contact with the first region so as to form a rectifier junction together with the first region, and (d) a fourth region which is formed in a surface region of the second region to be spaced from the first region and is in contact with the second region so as to form a rectifier junction together with the second region, wherein:

(A-1) one source/drain region of the first transistor is formed of a surface region of the first region which surface region is interposed between the second region and the third region, (A-2) the other source/drain region of the first transistor is formed of the fourth region, (A-3) the channel forming region of the first transistor is formed of a surface region of the second region which surface region is interposed between the surface region of the first region and the fourth region, (A-4) the gate of the first transistor is formed on the channel forming region of the first transistor through an insulation layer, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (B-4) the gate of the second transistor is formed on the channel forming region of the second transistor through an insulation layer, (C-1) one end of the MIS type diode is formed of part of the second region, (C-2) an electrode constituting the other end of the MIS type diode is formed to be opposed to said part of the second region constituting one end of the MIS type diode, through a wide gap thin film, (D) the gate of the first transistor and the gate of the second transistor are connected to a first line for memory cell selection, (E) the third region is connected to a write-in information setting line, (F) the fourth region is connected to a second line, (G) the electrode constituting the other end of the MIS type diode is connected to a third line having a predetermined potential, and (H) the first region is connected to a fourth line.

11. The semiconductor memory cell according to claim 10, wherein the electrode is connected to the third line through a high-resistance element.

12. The semiconductor memory cell according to claim 11, wherein the electrode and the high-resistance element are integrally formed and are composed of a silicon thin layer.

13. The semiconductor memory cell according to claim 10, wherein the gate of the first transistor and the gate of the second transistor are formed so as to bridge the first region and the fourth region and so as to bridge the second region and third region through the insulation layer, and are shared by the first transistor and the second transistor.

14. The semiconductor memory cell according to claim 10, wherein the first region and the third region constitute a diode, and the first region is connected to the write-in information setting line through the third region in place of being connected to the fourth line.

15. The semiconductor memory cell according to claim 10, wherein a majority carrier-diode comprising the first region and a diode-constituting region provided in a surface region of the first region is further provided, and the first region is connected to the write-in information setting line through the diode-constituting region in place of being connected to the fourth line.

16. The semiconductor memory cell according to claim 10, wherein the second region is formed in a surface region of the first region.

17. The semiconductor memory cell according to claim 10, wherein the wide gap thin film is composed of a material in which the tunnel transition of carriers is caused depending upon a potential difference between the potential in the channel forming region of the first transistor and the potential in the other end of the MIS type diode.

18. The semi-conductor memory cell according to claim 17, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

19. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, the semiconductor memory cell having;

(a) a semi-conductive first region having a first conductivity type, (b) a semi-conductive second region being in contact with the first region and having a second conductivity type, (c) a third region which is formed in a surface region of the first region to be spaced from the second region and is in contact with the first region so as to form a rectifier junction together with the first region, (d) a semi-conductive fourth region which is formed in a surface region of the second region to be spaced from the first region and has the first conductivity type, and (e) a semi-conductive MIS-type-diode constituting region which is formed in a surface region of the fourth region and has the second conductivity type, wherein:

(A-1) one source/drain region of the first transistor is formed of a surface region of the first region which surface region is interposed between the second region and the third region, (A-2) the other source/drain region of the first transistor is formed of the fourth region, (A-3) the channel forming region of the first transistor is formed of a surface region of the second region which surface region is interposed between the surface region of the first region and the fourth region, (A-4) the gate of the first transistor is formed on the channel forming region of the first transistor through an insulation layer, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (B-4) the gate of the second transistor is formed on the channel forming region of the second transistor through an insulation layer, (C-1) one end of the MIS type diode is formed of the MIS-type-diode-constituting region, (C-2) an electrode constituting the other end of the MIS type diode is formed to be opposed to the MIS-type-diode-constituting region constituting one end of the MIS type diode, through a wide gap thin film, (D) the gate of the first transistor and the gate of the second transistor are connected to a first line for memory cell selection, (E) the second region is connected to the MIS-type-diode-constituting region, (F) the third region is connected to a write-in information setting line, (G) the fourth region is connected to a second line, (H) the electrode constituting the other end of the MIS type diode is connected to a third line having a predetermined potential, and (I) the first region is connected to a fourth line.

20. The semi-conductor memory cell according to claim 19, wherein the electrode is connected to the third line through a high-resistance element.

21. The semi-conductor memory cell according to claim 20, wherein the electrode and the high-resistance element are integrally formed and are composed of a silicon thin layer.

22. The semi-conductor memory cell according to claim 19, wherein the gate of the first transistor and the gate of the second transistor are formed so as to bridge the first region and the fourth region and so as to bridge the second region and third region through the insulation layer, and are shared by the first transistor and the second transistor.

23. The semi-conductor memory cell according to claim 19, wherein the first region and the third region constitute a diode, and the first region is connected to the write-in information setting line through the third region in place of being connected to the fourth line.

24. The semi-conductor memory cell according to claim 19, wherein a majority carrier-diode comprising the first region and a diode-constituting region provided in a surface region of the first region is further provided, and the first region is connected to the write-in information setting line through the diode-constituting region in place of being connected to the fourth line.

25. The semi-conductor memory cell according to claim 19, wherein the second region is formed in a surface region of the first region.

26. The semi-conductor memory cell according to claim 19, wherein the wide gap thin film is composed of a material in which the tunnel transition of carriers is caused depending upon a potential difference between the potential in the channel forming region of the first transistor and the potential in the other end of the MIS type diode.

27. The semi-conductor memory cell according to claim 26, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

28. A semiconductor memory cell having a semiconductor layer having two main surfaces opposed to each other, the main surfaces being a first main surface and a second main surface, the semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, and (3) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) the gate of the first transistor formed on a first insulation layer formed on the first main surface so as to bridge the first region and the fourth region, and (f) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) one end of the MIS type diode is formed of part of the second region, (C-2) an electrode constituting the other end of the MIS type diode is formed to be opposed to said part of the second region constituting one end of the MIS type diode, through a wide gap thin film, (D) the gate of the first transistor and the gate of the second transistor are connected to a first line for memory cell selection, (E) the third region is connected to a write-in information setting line, (F) the fourth region is connected to a second line, (G) the electrode constituting the other end of the MIS type diode is connected to a third line having a predetermined potential, and (H) the first region is connected to a fourth line.

29. The semi-conductor memory cell according to claim 28, wherein the first region and the third region constitute a diode, and the first region is connected to the write-in information setting line through the third region in place of being connected to the fourth line.

30. The semi-conductor memory cell according to claim 28, wherein the electrode is connected to the third line through a high-resistance element.

31. The semi-conductor memory cell according to claim 30, wherein the electrode and the high-resistance element are integrally formed and are composed of a silicon thin layer.

32. The semi-conductor memory cell according to claim 28, wherein the wide gap thin film is composed of a material in which the tunnel transition of carriers is caused depending upon a potential difference between the potential in the channel forming region of the first transistor and the potential in the other end of the MIS type diode.

33. The semi-conductor memory cell according to claim 32, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

34. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, wherein:

one source/drain region of the first transistor corresponds to the channel forming region of the second transistor and corresponds to one source/drain region of the junction-field-effect transistor, one source/drain region of the second transistor corresponds to the channel forming region of the first transistor and corresponds to one gate region of the junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

35. The semi-conductor memory cell according to claim 34, wherein a material is interposed between one end and the other end of the MIS diode, in which material the tunnel transition of carriers is caused depending upon a potential difference between the potential in the channel forming region of the first transistor and the potential in the other end of the MIS type diode.

36. The semiconductor memory cell according to claim 35, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the extending portion of the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

37. The semiconductor memory cell according to claim 34, wherein the gate of the first transistor and the gate of the second transistor are connected to a first line for memory cell selection, the other source/drain region of the first transistor is connected to a second line, the other end of the MIS type diode is connected to a third line corresponding to said line having a predetermined potential through a high-resistance element, the other gate region of the junction-field-effect transistor is connected to a fourth line, one source/drain region of the first transistor is connected to a fifth line through the junction-field-effect transistor, and the other source/drain region of the second transistor is connected to a write-in information setting line.

38. The semiconductor memory cell according to claim 37, wherein one source/drain region of the first transistor is connected to the write-in information setting line through the junction-field-effect transistor and a diode in place of being connected to the fifth line through the junction-field-effect transistor.

39. The semiconductor memory cell according to claim 37, wherein the other gate region of the junction-field-effect transistor is connected to the write-in information setting line in place of being connected to the fourth line.

40. The semi-conductor memory cell according to claim 39, wherein one source/drain region of the first transistor is connected to the write-in information setting line through the junction-field-effect transistor and a diode in place of being connected to the fifth line through the junction-field-effect transistor.

41. The semiconductor memory cell according to claim 37, wherein one source/drain region of the first transistor is connected to the fourth line through the junction-field-effect transistor and a diode in place of being connected to the fifth line through the junction-field-effect transistor.

42. The semiconductor memory cell according to claim 37, wherein the other gate region of the junction-field-effect transistor is connected to one gate region of the junction-field-effect transistor in place of being connected to the fourth line.

43. The semi-conductor memory cell according to claim 42, wherein one source/drain region of the first transistor is connected to the write-in information setting line through the junction-field-effect transistor and a diode in place of being connected to the fifth line through the junction-field-effect transistor.

44. The semi-conductor memory cell according to claim 34, wherein the first transistor and the second transistor have a common gate.

45. The semi-conductor memory cell according to claim 34, wherein a wide gap thin film is formed between the extending portion of channel forming region of the first transistor constituting the MIS type diode and the electrode.

46. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, wherein:

one source/drain region of the first transistor corresponds to the channel forming region of the second transistor, the other source/drain region of the first transistor corresponds to one source/drain region of the junction-field-effect transistor, one source/drain region of the second transistor corresponds to the channel forming region of the first transistor and corresponds to one gate region of the junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

47. The semi-conductor memory cell according to claim 46, wherein a material is interposed between one end and the other end of the MIS diode, in which material the tunnel transition of carriers is caused depending upon a potential difference between the potential in the channel forming region of the first transistor and the potential in the other end of the MIS type diode.

48. The semi-conductor memory cell according to claim 47, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the extending portion of the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

49. The semiconductor memory cell according to claim 46, wherein the gate of the first transistor and the gate of the second transistor are connected to a first line for memory cell selection, the other source/drain region of the first transistor is connected to a second line through the junction-field-effect transistor, the other end of the MIS type diode is connected to a third line corresponding to said line having a predetermined potential through a high-resistance element, the other gate region of the junction-field-effect transistor is connected to a fourth line, one source/drain region of the first transistor is connected to a fifth line, and the other source/drain region of the second transistor is connected to a write-in information setting line.

50. The semiconductor memory cell according to claim 49, wherein one source/drain region of the first transistor is connected to the write-in information setting line through a diode in place of being connected to the fifth line.

51. The semi-conductor memory cell according to claim 49, wherein the other gate region of the junction-field-effect transistor is connected to the write-in information setting line in place of being connected to the fourth line.

52. The semi-conductor memory cell according to claim 51, wherein one source/drain region of the first transistor is connected to the write-in information setting line through a diode in place of being connected to the fifth line.

53. The semi-conductor memory cell according to claim 49, wherein the other gate region of the junction-field-effect transistor is connected to one gate region of the junction-field-effect transistor in place of being connected to the fourth line.

54. The semi-conductor memory cell according to claim 53, wherein one source/drain region of the first transistor is connected to the write-in information setting line through a diode in place of being connected to the fifth line.

55. The semi-conductor memory cell according to claim 46, wherein the first transistor and the second transistor have a common gate.

56. The semi-conductor memory cell according to claim 46, wherein a wide gap thin film is formed between the extending portion of channel forming region of the first transistor constituting the MIS type diode and the electrode.

57. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, wherein:

one source/drain region of the first transistor corresponds to the channel forming region of the second transistor, the other source/drain region of the first transistor corresponds to one source/drain region of the junction-field-effect transistor, one source/drain region of the second transistor corresponds to the channel forming region of the first transistor, corresponds to one gate region of the junction-field-effect transistor and corresponds to one source/drain region of the third transistor, the other source/drain region of the third transistor corresponds to the other gate region of the junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

58. The semi-conductor memory cell according to claim 57, wherein a material is interposed between one end and the other end of the MIS diode, in which material the tunnel transition of carriers is caused depending upon a potential difference between the potential in the channel forming region of the first transistor and the potential in the other end of the MIS type diode.

59. The semi-conductor memory cell according to claim 58, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the extending portion of the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

60. The semi-conductor memory cell according to claim 57, wherein the gate of the first transistor, the gate of the second transistor and the gate of the third transistor are connected to a first line for memory cell selection, the other source/drain region of the first transistor is connected to a second line through the junction-field-effect transistor, the other end of the MIS type diode is connected to a third line corresponding to said line having a predetermined potential through a high-resistance element, one source/drain region of the first transistor is connected to a fourth line, and the other source/drain region of the second transistor is connected to a write-in information setting line.

61. The semi-conductor memory cell according to claim 60, wherein one source/drain region of the first transistor is connected to the write-in information setting line through a diode in place of being connected to the fourth line.

62. The semi-conductor memory cell according to claim 57, wherein the first transistor, the second transistor and the third transistor have a common gate.

63. The semi-conductor memory cell according to claim 57, wherein a wide gap thin film is formed between the extending portion of channel forming region of the first transistor constituting the MIS type diode and the electrode.

64. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, wherein:

one source/drain region of the first transistor corresponds to the channel forming region of the second transistor, the other source/drain region of the first transistor corresponds to one source/drain region of the junction-field-effect transistor, one source/drain region of the second transistor corresponds to the channel forming region of the first transistor, corresponds to one gate region of the junction-field-effect transistor and corresponds to one source/drain region of the third transistor, the other source/drain region of the third transistor corresponds to the other gate region of the junction-field-effect transistor, and one end of the MIS type diode corresponds to the other source/drain region of the third transistor, the other end of the MIS type diode is formed of an electrode composed of a conductive material, and the electrode is connected to a line having a predetermined potential.

65. The semi-conductor memory cell according to claim 64, wherein a material is interposed between one end and the other end of the MIS type diode, in which material the tunnel transition of carriers is caused depending upon a potential difference between the potential in the other source/drain region of the third transistor and the potential in the other end of the MIS type diode.

66. The semiconductor memory cell according to claim 65, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the other source/drain region of the third transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

67. The semi-conductor memory cell according to claim 64, wherein the gate of the first transistor, the gate of the second transistor and the gate of the third transistor are connected to a first line for memory cell selection, the other source/drain region of the first transistor is connected to a second line through the junction-field-effect transistor, the other end of the MIS type diode is connected to a third line corresponding to said line having a predetermined potential through a high-resistance element, one source/drain region of the first transistor is connected to a fourth line, and the other source/drain region of the second transistor is connected to a write-in information setting line.

68. The semi-conductor memory cell according to claim 67, wherein one source/drain region of the first transistor is connected to the write-in information setting line through a diode in place of being connected to the fourth line.

69. The semi-conductor memory cell according to claim 64, wherein the first transistor, the second transistor and the third transistor have a common gate.

70. The semi-conductor memory cell according to claim 64, wherein a wide gap thin film is formed between the other source/drain region of the third transistor constituting the MIS type diode and the electrode.

71. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, wherein:

one source/drain region of the first transistor corresponds to the channel forming region of the second transistor and corresponds to one source/drain region of the first junction-field-effect transistor, the other source/drain region of the first transistor corresponds to one source/drain region of the second junction-field-effect transistor, one source/drain region of the second transistor corresponds to the channel forming region of the first transistor, corresponds to one gate region of the first junction-field-effect transistor and corresponds to one gate region of the second junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

72. The semi-conductor memory cell according to claim 71, wherein a material is interposed between one end and the other end of the MIS diode, in which material the tunnel transition of carriers is caused depending upon a potential difference between the potential in the channel forming region of the first transistor and the potential in the other end of the MIS type diode.

73. The semi-conductor memory cell according to claim 72, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the extending portion of the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

74. The semi-conductor memory cell according to claim 71, wherein the gate of the first transistor and the gate of the second transistor are connected to a first line for memory cell selection, the other source/drain region of the first transistor is connected to a second line through the second junction-field-effect transistor, the other end of the MIS type diode is connected to a third line corresponding to said line having a predetermined potential through a high-resistance element, the other gate region of the second junction-field-effect transistor is connected to a fourth line, one source/drain region of the first transistor is connected to a fifth line through the first junction-field-effect transistor, the other gate region of the first junction-field-effect transistor is connected to a write-in information setting line, and the other source/drain region of the second transistor is connected to the write-in information setting line.

75. The semi-conductor memory cell according to claim 74, wherein one source/drain region of the first transistor is connected to the write-in information setting line through the first junction-field-effect transistor and a diode in place of being connected to the fifth line through the first junction-field-effect transistor.

76. The semi-conductor memory cell according to claim 74, wherein the other gate region of the second junction-field-effect transistor is connected to one gate region of the second junction-field-effect transistor in place of being connected to the fourth line.

77. The semi-conductor memory cell according to claim 76, wherein one source/drain region of the first transistor is connected to the write-in information setting line through the first junction-field-effect transistor and a diode in place of being connected to the fifth line through the first junction-field-effect transistor.

78. The semi-conductor memory cell according to claim 71, wherein the first transistor and the second transistor have a common gate.

79. The semi-conductor memory cell according to claim 71, wherein a wide gap thin film is formed between the extending portion of channel forming region of the first transistor constituting the MIS type diode and the electrode.

80. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, wherein:

one source/drain region of the first transistor corresponds to the channel forming region of the second transistor and corresponds to one source/drain region of the first junction-field-effect transistor, the other source/drain region of the first transistor corresponds to one source/drain region of the second junction-field-effect transistor, one source/drain region of the second transistor corresponds to the channel forming region of the first transistor, corresponds to one gate region of the first junction-field-effect transistor, corresponds to one gate region of the second junction-field-effect transistor and corresponds to one source/drain region of the third transistor, the other source/drain region of the third transistor corresponds to the other gate region of the second junction-field-effect transistor, and one end of the MIS type diode is formed of an extending portion of the channel forming region of the first transistor, the other end of the MIS type diode is formed of an electrode composed of a conductive material, and the electrode is connected to a line having a predetermined potential.

81. The semi-conductor memory cell according to claim 80, wherein a material is interposed between one end and the other end of the MIS diode, in which material the tunnel transition of carriers is caused depending upon a potential difference between the potential in the channel forming region of the first transistor and the potential in the other end of the MIS type diode.

82. The semi-conductor memory cell according to claim 81, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the extending portion of the channel forming region of the first transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

83. The semi-conductor memory cell according to claim 80, wherein the first transistor, the second transistor and the third transistor have a common gate.

84. The semi-conductor memory cell according to claim 80, wherein a wide gap thin film is formed between the extending portion of channel forming region of the first transistor constituting the MIS type diode and the electrode.

85. The semi-conductor memory cell according to claim 80, wherein the gate of the first transistor, the gate of the second transistor and the gate of the third transistor are connected to a first line for memory cell selection, the other source/drain region of the first transistor is connected to a second line through the second junction-field-effect transistor, the other end of the MIS type diode is connected to a third line corresponding to said line having a predetermined potential through a high-resistance element, one source/drain region of the first transistor is connected to a fourth line through the first junction-field-effect transistor, the other source/drain region of the second transistor is connected to a write-in information setting line, and the other gate region of the first junction-field-effect transistor is connected to the write-in information setting line.

86. The semi-conductor memory cell according to claim 85, wherein one source/drain region of the first transistor is connected to the write-in information setting line through the first junction-field-effect transistor and a diode in place of being connected to the fourth line through the first junction-field-effect transistor.

87. A semi-conductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, wherein:

one source/drain region of the first transistor corresponds to the channel forming region of the second transistor and corresponds to one source/drain region of the first junction-field-effect transistor, the other source/drain region of the first transistor corresponds to one source/drain region of the second junction-field-effect transistor, one source/drain region of the second transistor corresponds to channel forming region of the first transistor, corresponds to one gate region of the first junction-field-effect transistor, corresponds to one gate region of the second junction-field-effect transistor and corresponds to one source/drain region of the third transistor, the other source/drain region of the third transistor corresponds to the other gate region of the second junction-field-effect transistor, and one end of the MIS type diode corresponds to the other source/drain region of the third transistor, the other end of the MIS type diode is formed of an electrode composed of a conductive material, and the electrode is connected to a line having a predetermined potential.

88. The semi-conductor memory cell according to claim 87, wherein a material is interposed between one end and the other end of the MIS type diode, in which material the tunnel transition of carriers is caused depending upon a potential difference between the potential in the other source/drain region of the third transistor and the potential in the other end of the MIS type diode.

89. The semi-conductor memory cell according to claim 88, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the other source/drain region of the third transistor depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

90. The semi-conductor memory cell according to claim 87, wherein the first transistor, the second transistor and the third transistor have a common gate.

91. The semi-conductor memory cell according to claim 87, wherein a wide gap thin film is formed between the other source/drain region of the third transistor constituting the MIS type diode and the electrode.

92. The semi-conductor memory cell according to claim 87, wherein the gate of the first transistor, the gate of the second transistor and the gate of the third transistor are connected to a first line for memory cell selection, the other source/drain region of the first transistor is connected to a second line through the second junction-field-effect transistor, the other end of the MIS type diode is connected to a third line corresponding to said line having a predetermined potential through a high-resistance element, one source/drain region of the first transistor is connected to a fourth line through the first junction-field-effect transistor, the other source/drain region of the second transistor is connected to a write-in information setting line, and the other gate region of the first junction-field-effect transistor is connected to the write-in information setting line.

93. The semi-conductor memory cell according to claim 92, wherein one source/drain region of the first transistor is connected to the write-in information setting line through the first junction-field-effect transistor and a diode in place of being connected to the fourth line through the first junction-field-effect transistor.

94. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a fourth region which is formed in a surface region of the first region to be spaced from the second region and is in contact with the first region so as to form a rectifier junction together with the first region, and (e) a fifth region which is formed in a surface region of the second region to be spaced from the third region and is in contact with the second region so as to form a rectifier junction together with the second region, wherein:

(A-1) one source/drain region of the first transistor is formed of a portion of a surface region of the second region, (A-2) the other source/drain region of the first transistor is formed of the fourth region, (A-3) the channel forming region of the first transistor is formed of a portion of a surface region of the first region which portion is interposed between said portion of the surface region of the second region and the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the second region which part is interposed between the fifth region and said part of the first region, (C-3) one source/drain region of the junction-field-effect transistor is formed of said portion of the surface region of the second region which portion extends from one end of the channel region of the junction-field-effect transistor and constitutes one source/drain region of the first transistor, (C-4) the other source/drain region of the junction-field-effect transistor is formed of a portion of the second region which portion extends from the other end of the channel region of the junction-field-effect transistor, (D-1) one end of the MIS type diode is formed of part of the first region, (D-2) an electrode constituting the other end of the MIS type diode is formed to be opposed to said part of the first region constituting one end of the MIS type diode, through a wide gap thin film, (E) the gate of the first transistor and the gate of the second transistor are connected to a first line for memory cell selection, (F) the third region is connected to a write-in information setting line, (G) the fourth region is connected to a second line, (H) the electrode constituting the other end of the MIS type diode is connected to a third line having a predetermined potential, and (I) the fifth region is connected to a fourth line.

95. The semi-conductor memory cell according to claim 94, wherein the electrode is connected to the third line having a predetermined potential through a high-resistance element.

96. The semi-conductor memory cell according to claim 95, wherein the electrode and the high-resistance element are integrally formed and are composed of a silicon thin layer.

97. The semi-conductor memory cell according to claim 94, wherein the second region and the third region constitute a diode, and the second region is connected to the write-in information setting line through the third region.

98. The semi-conductor memory cell according to claim 94, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

99. The semi-conductor memory cell according to claim 94, wherein further provided is a diode-constituting region which is formed in a surface region of the second region and is in contact with the second region so as to form a rectifier junction together with the second region, a diode comprises the diode-constituting region and the second region, and the second region is connected to the fourth line through the diode-constituting region.

100. The semi-conductor memory cell according to claim 94, wherein the fifth region is connected to the first region in place of being connected to the fourth region.

101. The semi-conductor memory cell according to claim 100, wherein the second region and the third region constitute a diode, and the second region is connected to the write-in information setting line through the third region.

102. The semi-conductor memory cell according to claim 100, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

103. The semi-conductor memory cell according to claim 94, wherein the fifth region is connected to the first region in place of being connected to the fourth region.

104. The semi-conductor memory cell according to claim 103, wherein the second region and the third region constitute a diode, and the second region is connected to the write-in information setting line through the third region.

105. The semi-conductor memory cell according to claim 103, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

106. The semi-conductor memory cell according to claim 94, wherein the wide gap thin film is composed of a material in which the tunnel transition of carriers is caused depending upon a potential difference between the potential in the first region and the potential in the other end of the MIS type diode.

107. The semiconductor memory cell according to claim 106, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the portion of the first region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

108. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a fourth region which is formed in a surface region of the first region to be spaced from the second region and is in contact with the first region so as to form a rectifier junction together with the first region, and (e) a semi-conductive fifth region which is formed in a surface region of the second region to be spaced from the third region and has the second conductivity type, wherein:

(A-1) one source/drain region of the first transistor is formed of a portion of a surface region of the second region, (A-2) the other source/drain region of the first transistor is formed of the fourth region, (A-3) the channel forming region of the first transistor is formed of a portion of a surface region of the first region which portion is interposed between said portion of the surface region of the second region and the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the second region which part is interposed between the fifth region and said part of the first region, (C-3) one source/drain region of the junction-field-effect transistor is formed of said portion of the surface region of the second region which portion extends from one end of the channel region of the junction-field-effect transistor and constitutes one source/drain region of the first transistor, (C-4) the other source/drain region of the junction-field-effect transistor is formed of a portion of the second region which portion extends from the other end of the channel region of the junction-field-effect transistor, (D-1) one end of the MIS type diode is formed of the fifth region, (D-2) an electrode constituting the other end of the MIS type diode is formed to be opposed to the fifth region constituting one end of the MIS type diode, through a wide gap thin film, (E) the gate of the first transistor and the gate of the second transistor are connected to a first line for memory cell selection, (F) the third region is connected to a write-in information setting line, (G) the fourth region is connected to a second line, (H) the fifth region is connected to the first region, and (I) the electrode constituting the other end of the MIS type diode is connected to a third line having a predetermined potential.

109. The semi-conductor memory cell according to claim 108, wherein the electrode is connected to the third line having a predetermined potential through a high-resistance element.

110. The semi-conductor memory cell according to claim 109, wherein the electrode and the high-resistance element are integrally formed and are composed of a silicon thin layer.

111. The semi-conductor memory cell according to claim 108, wherein the second region and the third region constitute a diode, and the second region is connected to the write-in information setting line through the third region.

112. The semi-conductor memory cell according to claim 108, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

113. The semi-conductor memory cell according to claim 108, wherein the wide gap thin film is composed of a material in which the tunnel transition of carriers is caused depending upon a potential difference between the potential in the fifth region and the potential in the other end of the MIS type diode.

114. The semiconductor memory cell according to claim 113, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the fifth region depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

115. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a fourth region which is formed in a surface region of the second region and is in contact with the second region so as to form a rectifier junction together with the second region, and (e) the gate which is formed, through an insulation layer, so as to bridge the first region and the fourth region and so as to bridge the second region and the third region and is shared by the first transistor and the second transistor, wherein:

(A-1) one source/drain region of the first transistor is formed of a surface region of the first region, (A-2) the other source/drain region of the first transistor is formed of the fourth region, (A-3) the channel forming region of the first transistor is formed of a surface region of the second region which surface region is interposed between the surface region of the first region and the fourth region, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (C-1) the gate regions of the junction-field-effect transistor are formed of the third region and part of the second region which part is opposed to the third region, (C-2) the channel region of the junction-field-effect transistor is formed of part of the first region which part is interposed between the third region and said part of the second region, (C-3) one source/drain region of the junction-field-effect transistor is formed of the surface region of the first region which surface region extends from one end of the channel region of the junction-field-effect transistor and constitutes one source/drain region of the first transistor, (C-4) the other source/drain region of the junction-field-effect transistor is formed of a portion of the first region which portion extends from the other end of the channel region of the junction-field-effect transistor, (D-1) one end of the MIS type diode is formed of part of the second region or an extending portion of the second region, (D-2) an electrode constituting the other end of the MIS type diode is formed to be opposed to said part of the second region or said extending portion of the second region which constitutes one end of the MIS type diode, through a wide gap thin film, (E) the gate is connected to a first line for memory cell selection, (F) the third region is connected to a write-in information setting line, (G) the fourth region is connected to a second line, and (H) the electrode constituting the other end of the MIS type diode is connected to a third line having a predetermined potential.

116. The semi-conductor memory cell according to claim 115, wherein the electrode is connected to the third line having a predetermined potential through a high-resistance element.

117. The semi-conductor memory cell according to claim 116, wherein the electrode and the high-resistance element are integrally formed and are composed of a silicon thin layer.

118. The semi-conductor memory cell according to claim 115, wherein the first region and the third region constitute a diode, and the first region is connected to the write-in information setting line through the third region.

119. The semi-conductor memory cell according to claim 115, wherein further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

120. The semi-conductor memory cell according to claim 115, wherein the wide gap thin film is composed of a material in which the tunnel transition of carriers is caused depending upon a potential difference between the potential in said part of the second region or the extending region of the second region constituting one end of the MIS type diode and the potential in the other end of the MIS type diode.

121. The semiconductor memory cell according to claim 120, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said part of the second region or the extending portion of the second region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

122. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a semi-conductive fourth region which is formed in a surface region of the first region to be spaced from the second region and has the first conductivity type, and (e) a fifth region which is formed in a surface region of the fourth region and is in contact with the fourth region so as to form a rectifier junction together with the fourth region, wherein:

(A-1) one source/drain region of the first transistor is formed of a portion of a surface region of the second region, (A-2) the other source/drain region of the first transistor is formed of a surface region of the fourth region, (A-3) the channel forming region of the first transistor is formed of a portion of a surface region of the first region which portion is interposed between said portion of the surface region of the second region and the surface region of the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the fourth region which part is interposed between the fifth region and said part of the first region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of part of the first region, (D-2) an electrode constituting the other end of the MIS type diode is formed to be opposed to said part of the first region which part constitutes one end of the MIS type diode, through a wide gap thin film, (E) the gate of the first transistor and the gate of the second transistor are connected to a first line for memory cell selection, (F) the third region is connected to a write-in information setting line, (G) said portion of the fourth region which portion constitutes the other source/drain region of the junction-field-effect transistor is connected to a second line, (H) the electrode constituting the other end of the MIS type diode is connected to a third line having a predetermined potential, and (I) the fifth region is connected to a fourth line.

123. The semi-conductor memory cell according to claim 122, wherein the electrode is connected to the third line having a predetermined potential through a high-resistance element.

124. The semi-conductor memory cell according to claim 123, wherein the electrode and the high-resistance element are integrally formed and are composed of a silicon thin layer.

125. The semi-conductor memory cell according to claim 122, wherein the second region and the third region constitute a diode, and the second region is connected to the write-in information setting line through the third region.

126. The semi-conductor memory cell according to claim 122, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

127. The semi-conductor memory cell according to claim 122, wherein the fifth region is connected to the write-in information setting line in place of being connected to the fourth line.

128. The semi-conductor memory cell according to claim 127, wherein the second region and the third region constitute a diode, and the second region is connected to the write-in information setting line through the third region.

129. The semi-conductor memory cell according to claim 127, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

130. The semi-conductor memory cell according to claim 122, wherein the fifth region is connected to the write-in information setting line in place of being connected to the fourth line.

131. The semi-conductor memory cell according to claim 130, wherein the second region and the third region constitute a diode, and the second region is connected to the write-in information setting line through the third region.

132. The semi-conductor memory cell according to claim 130, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

133. The semi-conductor memory cell according to claim 122, wherein the wide gap thin film is composed of a material in which the tunnel transition of carriers is caused depending upon a potential difference between the potential in the first region and the potential in the other end of the MIS type diode.

134. The semiconductor memory cell according to claim 133, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said portion of the first region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

135. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a semi-conductive fourth region which is formed in a surface region of the first region to be spaced from the second region and has the first conductivity type, and (e) a semi-conductive fifth region which is formed in a surface region of the fourth region and has the second conductivity type, wherein:

(A-1) one source/drain region of the first transistor is formed of a portion of a surface region of the second region, (A-2) the other source/drain region of the first transistor is formed of a surface region of the fourth region, (A-3) the channel forming region of the first transistor is formed of a portion of a surface region of the first region which portion is interposed between said portion of the surface region of the second region and the surface region of the fourth region, (A-4) the gate of the first transistor is formed on the channel forming region of the first transistor through an insulation layer, (B-1) one source/drain region of the second transistor is formed of other portion of the surface region of the first region, (B-2) the other source/drain region of the second transistor is formed of the third region, (B-3) the channel forming region of the second transistor is formed of other portion of the surface region of the second region which other portion is interposed between said other portion of the surface region of the first region and the third region, (B-4) the gate of the second transistor is formed on the channel forming region of the second transistor through an insulation layer, (C-1) the gate regions of the junction-field-effect transistor are formed of the fifth region and part of the first region which part is opposed to the fifth region, (C-2) the channel region of the junction-field-effect transistor is formed of part of the fourth region which part is interposed between the fifth region and said part of the first region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of the fifth region, (D-2) an electrode constituting the other end of the MIS type diode is formed to be opposed to the fifth region constituting one end of the MIS type diode, through a wide gap thin film, (E) the gate of the first transistor and the gate of the second transistor are connected to a first line for memory cell selection, (F) the third region is connected to a write-in information setting line, (G) said portion of the fourth region which portion constitutes the other source/drain region of the junction-field-effect transistor is connected to a second line, (H) the fifth region is connected to the first region, and (I) the electrode constituting the other end of the MIS type diode is connected to a third line having a predetermined potential.

136. The semi-conductor memory cell according to claim 135, wherein the electrode is connected to the third line having a predetermined potential through a high-resistance element.

137. The semi-conductor memory cell according to claim 136, wherein the electrode and the high-resistance element are integrally formed and are composed of a silicon thin layer.

138. The semi-conductor memory cell according to claim 135, wherein the second region and the third region constitute a diode, and the second region is connected to the write-in information setting line through the third region.

139. The semi-conductor memory cell according to claim 135, wherein further provided is a diode-constituting-region which is formed in a surface region of the second region and is in contact with the second region so as to form a rectifier junction together with the second region, a majority carrier diode comprises the diode-constituting-region and the second region, and the second region is connected to the write-in information setting line through the diode-constituting region.

140. The semi-conductor memory cell according to claim 135, wherein the wide gap thin film is composed of a material in which the tunnel transition of carriers is caused depending upon a potential difference between the potential in the fifth region and the potential in the other end of the MIS type diode.

141. The semi-conductor memory cell according to claim 140, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the fifth region depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

142. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region and so as to bridge the second region and the third region and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (C-1) the gate regions of the junction-field-effect transistor are formed of the fifth region and part of the second region which part is opposed to the fifth region, (C-2) the channel region of the junction-field-effect transistor is formed of part of the fourth region which part is interposed between the fifth region and said part of the second region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of part of the second region, (D-2) an electrode constituting the other end of the MIS type diode is formed to be opposed to said part of the second region which part constitutes one end of the MIS type diode, through a wide gap thin film, (E) the gate is connected to a first line for memory cell selection, (F) the third region is connected to a write-in information setting line, (G) said portion of the fourth region which portion constitutes the other source/drain region of the junction-field-effect transistor is connected to a second line, (H) the electrode constituting the other end of the MIS type diode is connected to a third line having a predetermined potential, and (I) the fifth region is connected to a fourth line.

143. The semi-conductor memory cell according to claim 142, wherein the electrode is connected to the third line having a predetermined potential through a high-resistance element.

144. The semi-conductor memory cell according to claim 143, wherein the electrode and the high-resistance element are integrally formed and are composed of a silicon thin layer.

145. The semi-conductor memory cell according to claim 142, wherein the first region and the third region constitute a diode, and the first region is connected to the write-in information setting line through the third region.

146. The semi-conductor memory cell according to claim 142, wherein further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

147. The semi-conductor memory cell according to claim 142, wherein the fifth region is connected to the write-in information setting line in place of being connected to the fourth line.

148. The semi-conductor memory cell according to claim 147, wherein the first region and the third region constitute a diode, and the first region is connected to the write-in information setting line through the third region.

149. The semi-conductor memory cell according to claim 147, wherein further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

150. The semi-conductor memory cell according to claim 142, wherein the fifth region is connected to the second region in place of being connected to the fourth line.

151. The semi-conductor memory cell according to claim 150, wherein the first region and the third region constitute a diode, and the first region is connected to the write-in information setting line through the third region.

152. The semi-conductor memory cell according to claim 150, wherein further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

153. The semi-conductor memory cell according to claim 142, wherein the wide gap thin film is composed of a material in which the tunnel transition of carriers is caused depending upon a potential difference between the potential in the second region and the potential in the other end of the MIS type diode.

154. The semiconductor memory cell according to claim 153, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said part of the second region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

155. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region and so as to bridge the second region and the third region and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region which surface region constitutes the channel forming region of the first transistor, (B-2) the other source/drain region of the second transistor is formed of the third region, (B-3) the channel forming region of the second transistor is formed of the surface region of the first region which surface region constitutes one source/drain region of the first transistor, (C-1) the gate regions of the junction-field-effect transistor are formed of the fifth region and part of the second region which part is opposed to the fifth region, (C-2) the channel region of the junction-field-effect transistor is formed of part of the fourth region which part is interposed between the fifth region and said part of the second region, (C-3) one source/drain region of the junction-field-effect transistor is formed of the surface region of the fourth region which surface region extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of the fifth region, (D-2) an electrode constituting the other end of the MIS type diode is formed to be opposed to the fifth region which constitutes one end of the MIS type diode, through a wide gap thin film, (E) the gate is connected to a first line for memory cell selection, (F) the third region is connected to a write-in information setting line, (G) said portion of the fourth region which portion constitutes the other source/drain region of the junction-field-effect transistor is connected to a second line, (H) the fifth region is connected to the second region, and (I) the electrode constituting the other end of the MIS type diode is connected to a third line having a predetermined potential.

156. The semi-conductor memory cell according to claim 155, wherein the electrode is connected to the third line having a predetermined potential through a high-resistance element.

157. The semi-conductor memory cell according to claim 156, wherein the electrode and the high-resistance element are integrally formed and are composed of a silicon thin layer.

158. The semi-conductor memory cell according to claim 155, wherein the first region and the third region constitute a diode, and the first region is connected to the write-in information setting line through the third region.

159. The semi-conductor memory cell according to claim 155, wherein further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

160. The semi-conductor memory cell according to claim 155, wherein the wide gap thin film is composed of a material in which the tunnel transition of carriers is caused depending upon a potential difference between the potential in the fifth region and the potential in the other end of the MIS type diode.

161. The semi-conductor memory cell according to claim 160, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the fifth region depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

162. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region, so as to bridge the second region and the third region and so as to bridge the second region and the fifth region and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the junction-field-effect transistor are formed of the fifth region and part of the second region which part is opposed to the fifth region, (D-2) the channel region of the junction-field-effect transistor is formed of part of the fourth region which part is interposed between the fifth region and said part of the second region, (D-3) one source/drain region of the junction-field-effect transistor is formed of the surface region of the fourth region which surface region extends from one end of the channel region of the junction-field-effect transistor and constitutes the other source/drain region of the first transistor and the channel forming region of the third transistor, (D-4) the other source/drain region of the junction-field-effect transistor is formed of a portion of the fourth region which portion extends from the other end of the channel region of the junction-field-effect transistor, (E-1) one end of the MIS type diode is formed of part of the second region, (E-2) an electrode constituting the other end of the MIS type diode is formed to be opposed to said part of the second region which part constitutes one end of the MIS type diode, through a wide gap thin film, (F) the gate is connected to a first line for memory cell selection, (G) the third region is connected to a write-in information setting line, (H) said portion of the fourth region which portion constitutes the other source/drain region of the junction-field-effect transistor is connected to a second line, and (I) the electrode constituting the other end of the MIS type diode is connected to a third line having a predetermined potential.

163. The semi-conductor memory cell according to claim 162, wherein the electrode is connected to the third line having a predetermined potential through a high-resistance element.

164. The semi-conductor memory cell according to claim 163, wherein the electrode and the high-resistance element are integrally formed and are composed of a silicon thin layer.

165. The semi-conductor memory cell according to claim 162, wherein the first region and the third region constitute a diode, and the first region is connected to the write-in information setting line through the third region.

166. The semi-conductor memory cell according to claim 162, wherein further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

167. The semi-conductor memory cell according to claim 162, wherein the wide gap thin film is composed of a material in which the tunnel transition of carriers is caused depending upon a potential difference between the potential in the second region and the potential in the other end of the MIS type diode.

168. The semi-conductor memory cell according to claim 167, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said part of the second region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

169. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region, so as to bridge the second region and the third region and so as to bridge the second region and the fifth region and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the junction-field-effect transistor are formed of the fifth region and part of the second region which part is opposed to the fifth region, (D-2) the channel region of the junction-field-effect transistor is formed of part of the fourth region which part is interposed between the fifth region and said part of the second region, (D-3) one source/drain region of the junction-field-effect transistor is formed of the surface region of the fourth region which surface region extends from one end of the channel region of the junction-field-effect transistor and constitutes the other source/drain region of the first transistor and the channel forming region of the third transistor, (D-4) the other source/drain region of the junction-field-effect transistor is formed of a portion of the fourth region which portion extends from the other end of the channel region of the junction-field-effect transistor, (E-1) one end of the MIS type diode is formed of the fifth region, (E-2) an electrode constituting the other end of the MIS type diode is formed to be opposed to the fifth region which constitutes one end of the MIS type diode, through a wide gap thin film, (F) the gate is connected to a first line for memory cell selection, (G) the third region is connected to a write-in information setting line, (H) said portion of the fourth region which portion constitutes the other source/drain region of the junction-field-effect transistor is connected to a second line, and (I) the electrode constituting the other end of the MIS type diode is connected to a third line having a predetermined potential.

170. The semi-conductor memory cell according to claim 169, wherein the electrode is connected to the third line having a predetermined potential through a high-resistance element.

171. The semi-conductor memory cell according to claim 170, wherein the electrode and the high-resistance element are integrally formed and are composed of a silicon thin layer.

172. The semi-conductor memory cell according to claim 169, wherein a high-concentration-impurity-containing layer having the second conductivity type is formed in the surface region of the fourth region which surface region constitutes the channel forming region of the third transistor.

173. The semi-conductor memory cell according to claim 169, wherein the first region and the third region constitute a diode, and the first region is connected to the write-in information setting line through the third region.

174. The semi-conductor memory cell according to claim 169, wherein further provided is a diode-constituting region which is formed in a surface region of the first region and is in contact with the first region so as to form a rectifier junction together with the first region, a majority carrier diode comprises the diode-constituting region and the first region, and the first region is connected to the write-in information setting line through the diode-constituting region.

175. The semi-conductor memory cell according to claim 169, wherein the wide gap thin film is composed of a material in which the tunnel transition of carriers is caused depending upon a potential difference between the potential in the fifth region and the potential in the other end of the MIS type diode.

176. The semi-conductor memory cell according to claim 175, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the fifth region depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

177. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region and so as to bridge the second region and the third region and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) the gate regions of the first junction-field-effect transistor are formed of the third region and part of the second region which part is opposed to the third region, (C-2) the channel region of the first junction-field-effect transistor is formed of part of the first region which part is interposed between the third region and said part of the second region, (C-3) one source/drain region of the first junction-field-effect transistor is formed of the surface region of the first region which surface region extends from one end of the channel region of the first junction-field-effect transistor and constitutes one source/drain region of the first transistor, (C-4) the other source/drain region of the first junction-field-effect transistor is formed of a portion of the first region which portion extends from the other end of the channel region of the first junction-field-effect transistor, (D-1) the gate regions of the second junction-field-effect transistor are formed of the fifth region and part of the second region which part is opposed to the fifth region, (D-2) the channel region of the second junction-field-effect transistor is formed of part of the fourth region which part is interposed between the fifth region and said part of the second region, (D-3) one source/drain region of the second junction-field-effect transistor is formed of the surface region of the fourth region which surface region extends from one end of the channel region of the second junction-field-effect transistor and constitutes the other source/drain region of the first transistor, (D-4) the other source/drain region of the second junction-field-effect transistor is formed of a portion of the fourth region which portion extends from the other end of the channel region of the second junction-field-effect transistor, (E-1) one end of the MIS type diode is formed of part of the second region, (E-2) an electrode constituting the other end of the MIS type diode is formed to be opposed to said part of the second region which part constitutes one end of the MIS type diode, through a wide gap thin film, (F) the gate is connected to a first line for memory cell selection, (G) the third region is connected to a write-in information setting line, (H) said portion of the fourth region constituting the other source/drain region of the second junction-field-effect transistor is connected to a second line, (I) the electrode constituting the other end of the MIS type diode is connected to a third line having a predetermined potential, and (J) the fifth region is connected to a fourth line.

178. The semi-conductor memory cell according to claim 177, wherein the electrode is connected to the third line having a predetermined potential through a high-resistance element.

179. The semi-conductor memory cell according to claim 178, wherein the electrode and the high-resistance element are integrally formed and are composed of a silicon thin layer.

180. The semi-conductor memory cell according to claim 177, wherein the wide gap thin film is composed of a material in which the tunnel transition of carriers is caused depending upon a potential difference between the potential in the second region and the potential in the other end of the MIS type diode.

181. The semi-conductor memory cell according to claim 180, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said part of the second region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

182. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region and so as to bridge the second region and the third region and is shared by the first transistor and the second transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) the gate regions of the first junction-field-effect transistor are formed of the third region and part of the second region which part is opposed to the third region, (C-2) the channel region of the first junction-field-effect transistor is formed of part of the first region which part is interposed between the third region and said part of the second region, (C-3) one source/drain region of the first junction-field-effect transistor is formed of the surface region of the first region which surface region extends from one end of the channel region of the first junction-field-effect transistor and constitutes one source/drain region of the first transistor, (C-4) the other source/drain region of the first junction-field-effect transistor is formed of a portion of the first region which portion extends from the other end of the channel region of the first junction-field-effect transistor, (D-1) the gate regions of the second junction-field-effect transistor are formed of the fifth region and part of the second region which part is opposed to the fifth region, (D-2) the channel region of the second junction-field-effect transistor is formed of part of the fourth region which part is interposed between the fifth region and said part of the second region, (D-3) one source/drain region of the second junction-field-effect transistor is formed of the surface region of the fourth region which surface region extends from one end of the channel region of the second junction-field-effect transistor and constitutes the other source/drain region of the first transistor, (D-4) the other source/drain region of the second junction-field-effect transistor is formed of a portion of the fourth region which portion extends from the other end of the channel region of the second junction-field-effect transistor, (E-1) one end of the MIS type diode is formed of the fifth region, (E-2) an electrode constituting the other end of the MIS type diode is formed to be opposed to the fifth region which constitutes one end of the MIS type diode, through a wide gap thin film, (F) the gate is connected to a first line for memory cell selection, (G) the third region is connected to a write-in information setting line, (H) said portion of the fourth region constituting the other source/drain region of the second junction-field-effect transistor is connected to a second line, (I) the fifth region is connected to the second region, and (J) the electrode constituting the other end of the MIS type diode is connected to a third line having a predetermined potential.

183. The semi-conductor memory cell according to claim 182, wherein the electrode is connected to the third line having a predetermined potential through a high-resistance element.

184. The semi-conductor memory cell according to claim 183, wherein the electrode and the high-resistance element are integrally formed and are composed of a silicon thin layer.

185. The semi-conductor memory cell according to claim 182, wherein the wide gap thin film is composed of a material in which the tunnel transition of carriers is caused depending upon a potential difference between the potential in the fifth region and the potential in the other end of the MIS type diode.

186. The semi-conductor memory cell according to claim 185, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the fifth region depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

187. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a fifth region which is formed in a surface region of the fourth region and is in contact with the fourth region so as to form a rectifier junction together with the fourth region, and (f) the gate which is formed, through an insulation layer, so as to bridge the first region and the fourth region, so as to bridge the second region and the third region and so as to bridge the second region and the fifth region and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the first junction-field-effect transistor are formed of the third region and part of the second region which part is opposed to the third region, (D-2) the channel region of the first junction-field-effect transistor is formed of part of the first region which part is interposed between the third region and said part of the second region, (D-3) one source/drain region of the first junction-field-effect transistor is formed of the surface region of the first region which surface region extends from one end of the channel region of the first junction-field-effect transistor and constitutes one source/drain region of the first transistor, (D-4) the other source/drain region of the first junction-field-effect transistor is formed of a portion of the first region which portion extends from the other end of the channel region of the first junction-field-effect transistor, (E-1) the gate regions of the second junction-field-effect transistor are formed of the fifth region and part of the second region which part is opposed to the fifth region, (E-2) the channel region of the second junction-field-effect transistor is formed of part of the fourth region which part is interposed between the fifth region and said part of the second region, (E-3) one source/drain region of the second junction-field-effect transistor is formed of the surface region of the fourth region which surface region extends from one end of the channel region of the second junction-field-effect transistor and constitutes the other source/drain region of the first transistor and the channel forming region of the third transistor, (E-4) the other source/drain region of the second junction-field-effect transistor is formed of a portion of the fourth region which portion extends from the other end of the channel region of the second junction-field-effect transistor, (F-1) one end of the MIS type diode is formed of part of the second region, (F-2) an electrode constituting the other end of the MIS type diode is formed to be opposed to said part of the second region which part constitutes one end of the MIS type diode, through a wide gap thin film, (G) the gate is connected to a first line for memory cell selection, (H) the third region is connected to a write-in information setting line, (I) said portion of the fourth region constituting the other source/drain region of the second junction-field-effect transistor is connected to a second line, and (J) the electrode constituting the other end of the MIS type diode is connected to a third line having a predetermined potential.

188. The semi-conductor memory cell according to claim 187, wherein the electrode is connected to the third line having a predetermined potential through a high-resistance element.

189. The semi-conductor memory cell according to claim 188, wherein the electrode and the high-resistance element are integrally formed and are composed of a silicon thin layer.

190. The semi-conductor memory cell according to claim 187, wherein the wide gap thin film is composed of a material in which the tunnel transition of carriers is caused depending upon a potential difference between the potential in the second region and the potential in the other end of the MIS type diode.

191. The semi-conductor memory cell according to claim 190, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said part of the second region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

192. A semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, the semiconductor memory cell having;

(a) a semi-conductive first region having a first conductivity type, (b) a semi-conductive second region which is in contact with the first region and has a second conductivity type, (c) a third region which is formed in a surface region of the first region and is in contact with the first region so as to form a rectifier junction together with the first region, (d) a semi-conductive fourth region which is formed in a surface region of the second region and has the first conductivity type, (e) a semi-conductive fifth region which is formed in a surface region of the fourth region and has the second conductivity type, and (f) the gate which is formed, through an insulation layer, so as to bridge the first region and the fourth region, so as to bridge the second region and the third region and so as to bridge the second region and the fifth region and is shared by the first transistor, the second transistor and the third transistor, wherein:

(A-1) one source/drain region of the first transistor is formed of a surface region of the first region, (A-2) the other source/drain region of the first transistor is formed of a surface region of the fourth region, (A-3) the channel forming region of the first transistor is formed of a surface region of the second region which surface region is interposed between the surface region of the first region and the surface region of the fourth region, (B-1) one source/drain region of the second transistor is formed of the surface region of the second region, (B-2) the other source/drain region of the second transistor is formed of the third region, (B-3) the channel forming region of the second transistor is formed of the surface region of the first region, (C-1) one source/drain region of the third transistor is formed of the surface region of the second region, (C-2) the other source/drain region of the third transistor is formed of the fifth region, (C-3) the channel forming region of the third transistor is formed of the surface region of the fourth region, (D-1) the gate regions of the first junction-field-effect transistor are formed of the third region and part of the second region which part is opposed to the third region, (D-2) the channel region of the first junction-field-effect transistor is formed of part of the first region which part is interposed between the third region and said part of the second region, (D-3) one source/drain region of the first junction-field-effect transistor is formed of the surface region of the first region which surface region extends from one end of the channel region of the first junction-field-effect transistor and constitutes one source/drain region of the first transistor, (D-4) the other source/drain region of the first junction-field-effect transistor is formed of a portion of the first region which portion extends from the other end of the channel region of the first junction-field-effect transistor, (E-1) the gate regions of the second junction-field-effect transistor are formed of the fifth region and part of the second region which part is opposed to the fifth region, (E-2) the channel region of the second junction-field-effect transistor is formed of part of the fourth region which part is interposed between the fifth region and said part of the second region, (E-3) one source/drain region of the second junction-field-effect transistor is formed of the surface region of the fourth region which surface region extends from one end of the channel region of the second junction-field-effect transistor and constitutes the other source/drain region of the first transistor and the channel forming region of the third transistor, (E-4) the other source/drain region of the second junction-field-effect transistor is formed of a portion of the fourth region which portion extends from the other end of the channel region of the second junction-field-effect transistor, (F-1) one end of the MIS type diode is formed of the fifth region, (F-2) an electrode constituting the other end of the MIS type diode is formed to be opposed to the fifth region which constitutes one end of the MIS type diode, through a wide gap thin film, (G) the gate is connected to a first line for memory cell selection, (H) the third region is connected to a write-in information setting line, (I) said portion of the fourth region constituting the other source/drain region of the second junction-field-effect transistor is connected to a second line, (J) the fifth region is connected to the second region, and (K) the electrode constituting the other end of the MIS type diode is connected to a third line having a predetermined potential.

193. The semi-conductor memory cell according to claim 192, wherein the electrode is connected to the third line having a predetermined potential through a high-resistance element.

194. The semi-conductor memory cell according to claim 193, wherein the electrode and the high-resistance element are integrally formed and are composed of a silicon thin layer.

195. The semi-conductor memory cell according to claim 192, wherein a high-concentration-impurity-containing layer having the second conductivity type is formed in the surface region of the fourth region which surface region constitutes the channel forming region of the third transistor.

196. The semi-conductor memory cell according to claim 192, wherein the wide gap thin film is composed of a material in which the tunnel transition of carriers is caused depending upon a potential difference between the potential in the fifth region and the potential in the other end of the MIS type diode.

197. The semi-conductor memory cell according to claim 196, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in the fifth region depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

198. A semiconductor memory cell having a semiconductor layer having two main surfaces opposed to each other, the main surfaces being a first main surface and a second main surface, the semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region including the first main surface of the first region to be spaced from the second region and is in contact with the first region so as to form a rectifier junction together with the first region, (f) the gate of the first transistor formed on a first insulation layer formed on the first main surface so as to bridge the first region and the fourth region, and (g) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) the gate regions of the junction-field-effect transistor are formed of the fifth region and the third region which is opposed to the fifth region, (C-2) the channel region of the junction-field-effect transistor is formed of part of the first region which part is interposed between the fifth region and the third region, (C-3) one source/drain region of the junction-field-effect transistor is formed of a portion of the first region which portion extends from one end of the channel region of the junction-field-effect transistor and constitutes one source/drain region of the first transistor and the channel forming region of the second transistor, (C-4) the other source/drain region of the junction-field-effect transistor is formed of a portion of the first region which portion extends from the other end of the channel region of the junction-field-effect transistor, (D-1) one end of the MIS type diode is formed of part of the second region, (D-2) an electrode constituting the other end of the MIS type diode is formed to be opposed to said part of the second region constituting one end of the MIS type diode, through a wide gap thin film, (E) the gate of the first transistor and the gate of the second transistor are connected to a first line for memory cell selection, (F) the third region is connected to a write-in information setting line, (G) the fourth region is connected to a second line, (H) the electrode constituting the other end of the MIS type diode is connected to a third line having a predetermined potential, (I) the fifth region is connected to a fourth line, and (J) said portion of the first region which portion constitutes the other source/drain region of the junction-field-effect transistor is connected to a fifth line.

199. The semi-conductor memory cell according to claim 198, wherein the fifth region is connected to the write-in information setting line in place of being connected to the fourth line.

200. The semi-conductor memory cell according to claim 198, wherein the electrode is connected to the third line having a predetermined potential through a high-resistance element.

201. The semi-conductor memory cell according to claim 200, wherein the electrode and the high-resistance element are integrally formed and are composed of a silicon thin layer.

202. The semi-conductor memory cell according to claim 198, wherein the wide gap thin film is composed of a material in which the tunnel transition of carriers is caused depending upon a potential difference between the potential in the first region and the potential in the other end of the MIS type diode.

203. The semiconductor memory cell according to claim 202, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said portion of the first region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

204. A semiconductor memory cell having a semiconductor layer having two main surfaces opposed to each other, the main surfaces being a first main surface and a second main surface, the semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a junction-field-effect transistor for current control, having source/drain regions, a channel region and gate regions, and (4) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region of the fourth region and is in contact with the fourth region so as to form a rectifier junction together with the fourth region, (f) the gate of the first transistor formed on a first insulation layer formed on the first main surface so as to bridge the first region and the fourth region, and (g) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) the gate regions of the junction-field-effect transistor are formed of the fifth region and part of the second region which part is opposed to the fifth region, (C-2) the channel region of the junction-field-effect transistor is formed of part of the fourth region which part is interposed between the fifth region and said part of the second region, (C-3) one source/drain region of the junction-field-effect transistor is formed of a portion of the fourth region which portion extends from one end of the channel region of the junction-field-effect transistor and constitutes the other source/drain region of the first transistor, (C-4) the other source/drain region of the junction-field-effect transistor is formed of a portion of the fourth region which portion extends from the other end of the channel region of the junction-field-effect transistor, (D-1) one end of the MIS type diode is formed of part of the second region, (D-2) an electrode constituting the other end of the MIS type diode is formed to be opposed to said part of the second region constituting one end of the MIS type diode, through a wide gap thin film, (E) the gate of the first transistor and the gate of the second transistor are connected to a first line for memory cell selection, (F) said portion of the fourth region constituting the other source/drain region of the junction-field-effect transistor is connected to a second line, (G) the electrode constituting the other end of the MIS type diode is connected to a third line having a predetermined potential, (H) the third region is connected to a write-in information setting line, (I) the fifth region is connected to a fourth line, and (J) the first region is connected to a fifth line.

205. The semi-conductor memory cell according to claim 204, wherein the fifth region is connected to the second region in place of being connected to the fourth line.

206. The semi-conductor memory cell according to claim 204, wherein the electrode is connected to the third line having a predetermined potential through a high-resistance element.

207. The semi-conductor memory cell according to claim 206, wherein the electrode and the high-resistance element are integrally formed and are composed of a silicon thin layer.

208. The semi-conductor memory cell according to claim 204, wherein the wide gap thin film is composed of a material in which the tunnel transition of carriers is caused depending upon a potential difference between the potential in the first region and the potential in the other end of the MIS type diode.

209. The semiconductor memory cell according to claim 208, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said portion of the first region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

210. A semiconductor memory cell having a semiconductor layer having two main surfaces opposed to each other, the main surfaces being a first main surface and a second main surface, the semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a first junction-field-effect transistor for current control, having source/drain regions, a channel region and gate regions, (4) a second junction-field-effect transistor for current control, having source/drain regions, a channel region and gate regions, and (5) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region including the first main surface of the first region to be spaced from the second region and is in contact with the first region so as to form a rectifier junction together with the first region, (f) a sixth region which is formed in a surface region of the fourth region and is in contact with the fourth region so as to form a rectifier junction together with the fourth region, (g) the gate of the first transistor formed on a first insulation layer formed on the first main surface so as to bridge the first region and the fourth region, and (h) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) the gate regions of the first junction-field-effect transistor are formed of the fifth region and the third region which is opposed to the fifth region, (C-2) the channel region of the first junction-field-effect transistor is formed of part of the first region which part is interposed between the fifth region and the third region, (C-3) one source/drain region of the first junction-field-effect transistor is formed of a portion of the first region which portion extends from one end of the channel region of the first junction-field-effect transistor and constitutes one source/drain region of the first transistor and the channel forming region of the second transistor, (C-4) the other source/drain region of the first junction-field-effect transistor is formed of a portion of the first region which portion extends from the other end of the channel region of the first junction-field-effect transistor, (D-1) the gate regions of the second junction-field-effect transistor are formed of the sixth region and part of the second region which part is opposed to the sixth region, (D-2) the channel region of the second junction-field-effect transistor is formed of part of the fourth region which part is interposed between the sixth region and said part of the second region, (D-3) one source/drain region of the second junction-field-effect transistor is formed of a portion of the fourth region which portion extends from one end of the channel region of the second junction-field-effect transistor and constitutes the other source/drain region of the first transistor, (D-4) the other source/drain region of the second junction-field-effect transistor is formed of a portion of the fourth region which portion extends from the other end of the channel region of the second junction-field-effect transistor, (E-1) one end of the MIS type diode is formed of part of the second region, (E-2) an electrode constituting the other end of the MIS type diode is formed to be opposed to said part of the second region constituting one end of the MIS type diode, through a wide gap thin film, (F) the gate of the first transistor and the gate of the second transistor are connected to a first line for memory cell selection, (G) the third region is connected to a write-in information setting line, (H) said portion of the fourth region constituting the other source/drain region of the second junction-field-effect transistor is connected to a second line, (I) the electrode constituting the other end of the MIS type diode is connected to a third line having a predetermined potential, (J) the fifth region and the sixth region are connected to a fourth line, and (K) said portion of the first region constituting the other source/drain region of the first junction-field-effect transistor is connected to a fifth line.

211. The semi-conductor memory cell according to claim 210, wherein the fifth region is connected to the write-in information setting line in place of being connected to the fourth line, and the sixth region is connected to the second region in place of being connected to the fourth line.

212. The semi-conductor memory cell according to claim 210, wherein the electrode is connected to the third line having a predetermined potential through a high-resistance element.

213. The semi-conductor memory cell according to claim 212, wherein the electrode and the high-resistance element are integrally formed and are composed of a silicon thin layer.

214. The semi-conductor memory cell according to claim 210, wherein the wide gap thin film is composed of a material in which the tunnel transition of carriers is caused depending upon a potential difference between the potential in the first region and the potential in the other end of the MIS type diode.

215. The semiconductor memory cell according to claim 214, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said portion of the first region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

216. A semiconductor memory cell having a semiconductor layer having two main surfaces opposed to each other, the main surfaces being a first main surface and a second main surface, the semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a junction-field-effect transistor for current control, having source/drain regions, a channel region and gate regions, and (5) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region of the fourth region and is in contact with the fourth region so as to form a rectifier junction together with the fourth region, (f) the gate formed on a first insulation layer formed on the first main surface so as to bridge the first region and the fourth region and so as to bridge the second region and the fifth region, and is shared by the first transistor and the third transistor, and (g) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) one source/drain region of the third transistor constitutes the channel forming region of the first transistor, (C-2) the other source/drain region of the third transistor is formed of the fifth region, (C-3) the channel forming region of the third transistor constitutes the other source/drain region of the first transistor, (D-1) the gate regions of the junction-field-effect transistor are formed of the fifth region and part of the second region which part is opposed to the fifth region, (D-2) the channel region of the junction-field-effect transistor is formed of part of the fourth region which part is interposed between the fifth region and said part of the second region, (D-3) one source/drain region of the junction-field-effect transistor is formed of a portion of the fourth region which portion extends from one end of the channel region of the junction-field-effect transistor and constitutes the other source/drain region of the first transistor, (D-4) the other source/drain region of the junction-field-effect transistor is formed of a portion of the fourth region which portion extends from the other end of the channel region of the junction-field-effect transistor, (E-1) one end of the MIS type diode is formed of part of the second region, (E-2) an electrode constituting the other end of the MIS type diode is formed to be opposed to said part of the second region constituting one end of the MIS type diode, through a wide gap thin film, (F) the gate shared by of the first transistor and the third transistor and the gate of the second transistor are connected to a first line for memory cell selection, (G) the third region is connected to a write-in information setting line, (H) said portion of the fourth region constituting the other source/drain region of the junction-field-effect transistor is connected to a second line, (I) the electrode constituting the other end of the MIS type diode is connected to a third line having a predetermined potential, and (J) the first region is connected to a fourth line.

217. The semi-conductor memory cell according to claim 216, wherein the electrode is connected to the third line having a predetermined potential through a high-resistance element.

218. The semi-conductor memory cell according to claim 217, wherein the electrode and the high-resistance element are integrally formed and are composed of a silicon thin layer.

219. The semi-conductor memory cell according to claim 216, wherein the wide gap thin film is composed of a material in which the tunnel transition of carriers is caused depending upon a potential difference between the potential in the first region and the potential in the other end of the MIS type diode.

220. The semiconductor memory cell according to claim 219, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said portion of the first region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

221. A semiconductor memory cell having a semiconductor layer having two main surfaces opposed to each other, the main surfaces being a first main surface and a second main surface, the semiconductor memory cell comprising:

(1) a first transistor for readout, having a first conductivity type, and having source/drain regions, a semi-conductive channel forming region which is in contact with the source/drain regions and spaces out the source/drain regions, and a gate capacitively coupled with the channel forming region, (2) a second transistor for switching, having a second conductivity type, and having source/drain regions, a semi-conductive channel forming region which is in contact with the source/drain regions and spaces out the source/drain regions, and a gate capacitively coupled with the channel forming region, (3) a third transistor for current control, having the second conductivity type, and having source/drain regions, a semi-conductive channel forming region which is in contact with the source/drain regions and spaces out the source/drain regions, and a gate capacitively coupled with the channel forming region, (4) a first junction-field-effect transistor for current control, having source/drain regions, a channel region and gate regions, (5) a second junction-field-effect transistor for current control, having source/drain regions, a channel region and gate regions, and (6) an MIS type diode for retaining information, the semiconductor memory cell further having;

(a) a semi-conductive first region which is formed in the semiconductor layer to extend over from the first main surface to the second main surface and has a first conductivity type, (b) a semi-conductive second region which is formed in the semiconductor layer to extend over from the first main surface to the second main surface, is in contact with the first region and has a second conductivity type, (c) a third region which is formed in a surface region including the second main surface of the first region to be spaced from the second region and is in contact with the first region so as to form a rectifier junction together with the first region, (d) a fourth region which is formed in a surface region including the first main surface of the second region to be spaced from the first region and is in contact with the second region so as to form a rectifier junction together with the second region, (e) a fifth region which is formed in a surface region including the first main surface of the first region to be spaced from the second region and is in contact with the first region so as to form a rectifier junction together with the first region, (f) a sixth region which is formed in a surface region of the fourth region and is in contact with the fourth region so as to form a rectifier junction together with the fourth region, (g) the gate formed on a first insulation layer formed on the first main surface so as to bridge the first region and the fourth region and so as to bridge the second region and the fifth region, and is shared by the first transistor and the third transistor, and (h) the gate of the second transistor formed on a second insulation layer formed on the second main surface so as to bridge the second region and the third region, wherein:

(A-1) one source/drain region of the first transistor is formed of a surface region including the first main surface of the first region, (A-2) the other source/drain region of the first transistor is formed of the fourth region, (A-3) the channel forming region of the first transistor is formed of a surface region including the first main surface of the second region which surface region is interposed between the surface region including the first main surface of the first region and the fourth region, (B-1) one source/drain region of the second transistor is formed of a surface region including the second main surface of the second region, (B-2) the other source/drain region of the second transistor is formed of the third region, (B-3) the channel forming region of the second transistor is formed of a surface region including the second main surface of the first region which surface region is interposed between the surface region including the second main surface of the second region and the third region, (C-1) one source/drain region of the third transistor constitutes the channel forming region of the first transistor, (C-2) the other source/drain region of the third transistor is formed of the sixth region, (C-3) the channel forming region of the third transistor constitutes the other source/drain region of the first transistor, (D-1) the gate regions of the first junction-field-effect transistor are formed of the fifth region and the third region which is opposed to the fifth region, (D-2) the channel region of the first junction-field-effect transistor is formed of part of the first region which part is interposed between the fifth region and the third region, (D-3) one source/drain region of the first junction-field-effect transistor is formed of a portion of the first region which portion extends from one end of the channel region of the first junction-field-effect transistor and constitutes one source/drain region of the first transistor and the channel forming region of the second transistor, (D-4) the other source/drain region of the first junction-field-effect transistor is formed of a portion of the first region which portion extends from the other end of the channel region of the first junction-field-effect transistor, (E-1) the gate regions of the second junction-field-effect transistor are formed of the sixth region and part of the second region which part is opposed to the sixth region, (E-2) the channel region of the second junction-field-effect transistor is formed of part of the fourth region which part is interposed between the sixth region and said part of the second region, (E-3) one source/drain region of the second junction-field-effect transistor is formed of a portion of the fourth region which portion extends from one end of the channel region of the second junction-field-effect transistor and constitutes the other source/drain region of the first transistor, (E-4) the other source/drain region of the second junction-field-effect transistor is formed of a portion of the fourth region which portion extends from the other end of the channel region of the second junction-field-effect transistor, (F-1) one end of the MIS type diode is formed of part of the second region, (F-2) an electrode constituting the other end of the MIS type diode is formed to be opposed to said part of the second region constituting one end of the MIS type diode, through a wide gap thin film, (G) the gate shared by of the first transistor and the third transistor and the gate of the second transistor are connected to a first line for memory cell selection, (H) the third region is connected to a write-in information setting line, (I) said portion of the fourth region constituting the other source/drain region of the second junction-field-effect transistor is connected to a second line, (J) the electrode constituting the other end of the MIS type diode is connected to a third line having a predetermined potential, and (K) the fifth region is connected to a fourth line.

222. The semi-conductor memory cell according to claim 221, wherein the fifth region is connected to the write-in information setting line in place of being connected to the fourth line.

223. The semi-conductor memory cell according to claim 221, wherein the electrode is connected to the third line having a predetermined potential through a high-resistance element.

224. The semi-conductor memory cell according to claim 223, wherein the electrode and the high-resistance element are integrally formed and are composed of a silicon thin layer.

225. The semi-conductor memory cell according to claim 221, wherein the wide gap thin film is composed of a material in which the tunnel transition of carriers is caused depending upon a potential difference between the potential in the first region and the potential in the other end of the MIS type diode.

226. The semiconductor memory cell according to claim 225, wherein binary information of first information or second information is stored in the semiconductor memory cell, the first information to be stored in the semiconductor memory cell corresponds to a first potential in the channel forming region of the first transistor, and the second information to be stored in the semiconductor memory cell corresponds to a second potential in the channel forming region of the first transistor, (i) when the potential in the channel forming region of the first transistor is the first potential, the tunnel transition of carriers is caused from the other end to one end of the MIS type diode, whereby carrier multiplication takes place, holes or electrons are stored in said portion of the first region constituting one end of the MIS type diode depending upon the conductivity type of one end of the MIS type diode, and the potential in the channel forming region of the first transistor is held nearly at the first potential, and (ii) when the potential in the channel forming region of the first transistor is the second potential, carriers having the polarity opposite to that of the above carriers transit from one end to the other end of the MIS type diode, whereby the potential in the channel forming region of the first transistor is held at the second potential.

* * * * *